US010158086B2

(12) United States Patent
Cho et al.

(10) Patent No.: US 10,158,086 B2
(45) Date of Patent: Dec. 18, 2018

(54) ORGANIC LIGHT-EMITTING DEVICE

(71) Applicant: SAMSUNG DISPLAY CO., LTD., Yongin, Gyeonggi-Do (KR)

(72) Inventors: Hwan-Hee Cho, Yongin (KR); Mi-Kyung Kim, Yongin (KR); Se-Hun Kim, Yongin (KR); Dong-Hyun Kim, Yongin (KR); Chang-Woong Chu, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 555 days.

(21) Appl. No.: 14/252,092

(22) Filed: Apr. 14, 2014

(65) Prior Publication Data

US 2014/0374711 A1 Dec. 25, 2014

(30) Foreign Application Priority Data

Jun. 14, 2013 (KR) ........................ 10-2013-0068641

(51) Int. Cl.
*H01L 51/54* (2006.01)
*C09K 11/06* (2006.01)
*H01L 51/00* (2006.01)
*H01L 51/50* (2006.01)

(52) U.S. Cl.
CPC .......... *H01L 51/0072* (2013.01); *C09K 11/06* (2013.01); *H01L 51/0067* (2013.01); *H01L 51/006* (2013.01); *H01L 51/0054* (2013.01); *H01L 51/0061* (2013.01); *H01L 51/0071* (2013.01); *H01L 51/0077* (2013.01); *H01L 51/0085* (2013.01); *H01L 51/5012* (2013.01); *H01L 51/5016* (2013.01); *H01L 51/5056* (2013.01); *H01L 2251/308* (2013.01)

(58) Field of Classification Search
CPC .. C07D 209/82; C07D 209/86; C07D 209/88; C07D 251/00; C07D 251/02; C07D 401/00; C07D 401/14; C07D 403/00; C07D 403/02; C07D 403/10; C07D 405/00; C07D 405/02; C07D 405/10; C07D 409/00; C07D 409/021; C07D 417/00; C07D 417/02; C07D 417/10; C07D 487/00; C07D 487/02; C07D 487/12; C07D 487/04; C07D 487/06; C09K 11/06; C09K 2211/00; C09K 2211/1018; C09K 2211/10; C09K 2211/1011; C09K 2211/1014; C09K 2211/1022; C09K 2211/1029; C09K 2211/1033; C09K 2211/1037; C09K 2211/1044; C09K 2211/1059; H01L 51/0032; H01L 51/005; H01L 51/0052; H01L 51/0059; H01L 51/006; H01L 51/0061; H01L 51/0054; H01L 51/0067; H01L 51/0071; H01L 51/0072; H01L 51/0077; H01L 51/0085; H01L 51/50; H01L 51/5012; H01L 51/5016; H01L 51/5056; H01L 2251/00; H01L 2251/30; H01L 2251/308
USPC ................ 427/58, 66; 313/500–512; 257/40, 257/88–104, E51.001–E51.052; 252/301.16–301.35; 428/690, 691, 917, 428/411.4, 336
See application file for complete search history.

(56) References Cited

U.S. PATENT DOCUMENTS

| | | | |
|---|---|---|---|
| 2005/0221124 A1 | 10/2005 | Hwang et al. | |
| 2009/0295276 A1 | 12/2009 | Asari et al. | |
| 2011/0037062 A1 | 2/2011 | Fukumatsu et al. | |
| 2011/0193074 A1 | 8/2011 | Lee et al. | |
| 2012/0146014 A1 | 6/2012 | Kato | |
| 2012/0305903 A1* | 12/2012 | Kai | C07D 487/04 257/40 |
| 2014/0374722 A1* | 12/2014 | Kim | C07D 209/08 257/40 |

FOREIGN PATENT DOCUMENTS

| | | | |
|---|---|---|---|
| JP | WO 2011099374 A1 * | 8/2011 | C07D 487/04 |
| KR | 10-2005-0097670 A | 10/2005 | |
| KR | 10-2008-0085000 A | 9/2008 | |
| KR | 10-2010-0039815 A | 4/2010 | |
| KR | 10-2010-0105099 A | 9/2010 | |
| KR | 10-2011-0007124 A | 1/2011 | |
| KR | 20110111968 A * | 10/2011 | |
| KR | 10-2012-0042633 A | 5/2012 | |
| KR | 10-2012-0052993 A | 5/2012 | |
| WO | WO 2012-026780 A1 | 3/2012 | |
| WO | WO 2013109027 A1 * | 7/2013 | H05B 33/14 |

OTHER PUBLICATIONS

Machine translation of KR2011-011968. Date of publication: Oct. 12, 2011.*

* cited by examiner

*Primary Examiner* — Andrew K Bohaty
(74) *Attorney, Agent, or Firm* — Lee & Morse, P.C.

(57) ABSTRACT

Provided is an organic light-emitting device including a first electrode; a second electrode disposed opposite to the first electrode; an emission layer disposed between the first electrode and the second electrode, the emission layer including at least one specific light-emitting material; and a hole-transporting region disposed between the first electrode and the emission layer, the hole-transporting region including at least one specific hole-transporting material.

18 Claims, 3 Drawing Sheets

ORGANIC LIGHT-EMITTING DEVICE

CROSS-REFERENCE TO RELATED APPLICATION

Korean Patent Application No. 10-2013-0068641, filed on Jun. 14, 2013, in the Korean Intellectual Property Office, and entitled: "Organic Light-Emitting Device," is incorporated by reference herein in its entirety.

BACKGROUND

1. Field

Provided is an organic light-emitting device.

2. Description of the Related Art

Organic light-emitting devices (OLEDs) are self-emitting devices that may have wide viewing angles, excellent contrast, quick response times, and excellent brightness, driving voltage, and response speed characteristics, and can provide multicolored images.

SUMMARY

Embodiments are directed to an organic light-emitting device including a first electrode; a second electrode disposed opposite to the first electrode; an emission layer disposed between the first electrode and the second electrode; and a hole-transporting region disposed between the first electrode and the emission layer. The emission layer includes at least one light-emitting material represented by any one of Formulae 1A to 1E:

<Formula 1A>

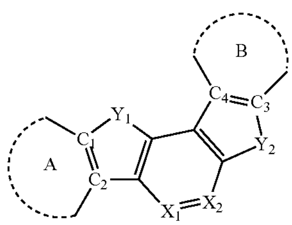

<Formula 1B>

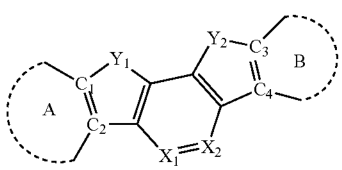

<Formula 1C>

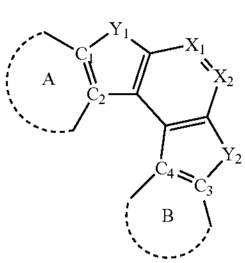

<Formula 1D>

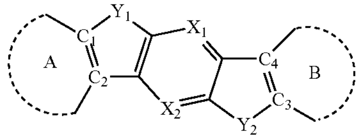

-continued

<Formula 1E>

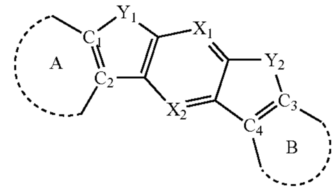

wherein, in Formulae 1A to 1E, ring A and ring B are each independently selected from i) a $C_6$-$C_{20}$ aromatic ring and a $C_2$-$C_{20}$ heteroaromatic ring; and ii) a $C_6$-$C_{20}$ aromatic ring and a $C_2$-$C_{20}$ heteroaromatic ring each substituted with at least one selected from deuterium, a halogen atom, a $C_1$-$C_{60}$ alkyl group, a $C_6$-$C_{60}$ aryl group, a $C_2$-$C_{60}$ heteroaryl group, and —$N(Q_1)(Q_2)$ (wherein, $Q_1$ and $Q_2$ are each independently a $C_1$-$C_{60}$ alkyl group, a $C_6$-$C_{60}$ aryl group, or a $C_2$-$C_{60}$ heteroaryl group);

$C_1$ to $C_4$ each independently represent carbon atoms forming the ring A or the ring B;

$X_1$ is $CR_1$ or N; $X_2$ is $CR_2$ or N;

$R_1$ and $R_2$ are each independently selected from hydrogen, deuterium, a halogen atom, a $C_1$-$C_{60}$ alkyl group, a $C_6$-$C_{60}$ aryl group, a $C_2$-$C_{60}$ heteroaryl group, and —$N(Q_1)(Q_2)$ (wherein, $Q_1$ and $Q_2$ are each independently a $C_1$-$C_{60}$ alkyl group, a $C_6$-$C_{60}$ aryl group, or a $C_2$-$C_{60}$ heteroaryl group), wherein $R_1$ and $R_2$ may connect to each other to selectively form a $C_6$-$C_{20}$ saturated ring or a $C_6$-$C_{20}$ unsaturated ring;

$Y_1$ is $N$-$(L_1)_{n1}$-$Ar_{11}$;

$Y_2$ is $N$-$(L_2)_{n2}$-$Ar_{12}$, O, S, $C(R_{31})(R_{32})$, or $Si(R_{33})(R_{34})$;

$L_1$ and $L_2$ are each independently selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted $C_2$-$C_{10}$ heterocycloalkylene group, a substituted or unsubstituted $C_2$-$C_{10}$ heterocycloalkenylene group, and a substituted or unsubstituted $C_2$-$C_{60}$ heteroarylene group;

n1 and n2 are each independently an integer of 0 to 3;

$Ar_{11}$ and $Ar_{12}$ are each independently selected from i) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and ii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

$R_{31}$ to $R_{34}$ are each independently selected from i) a $C_1$-$C_{60}$ alkyl group, a $C_2$-$C_{60}$ alkenyl group, a $C_2$-$C_{60}$ alkynyl group, and a $C_1$-$C_{60}$ alkoxy group;

ii) a $C_1$-$C_{60}$ alkyl group, a $C_2$-$C_{60}$ alkenyl group, a $C_2$-$C_{60}$ alkynyl group, and a $C_1$-$C_{60}$ alkoxy group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group each substituted with at least selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

The hole-transporting region includes at least one hole-transporting material represented by any one of Formulae 2(1) and 2(2):

<Formula 2(1)>

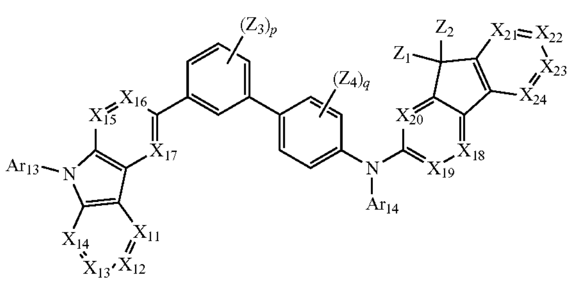

<Formula 2(2)>

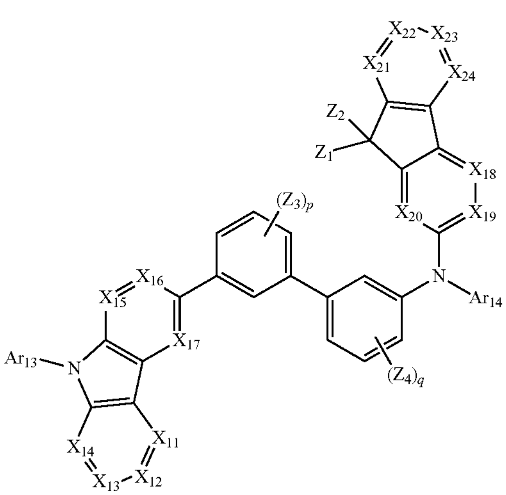

wherein, in Formula 2(1) or Formula 2(2), $X_{11}$ is $CR_{11}$ or N; $X_{12}$ is $CR_{12}$ or N; $X_{13}$ is $CR_{13}$ or N; $X_{14}$ is $CR_{14}$ or N; $X_{15}$ is $CR_{15}$ or N; $X_{16}$ is $CR_{16}$ or N; $X_{17}$ is $CR_{17}$ or N; $X_{18}$ is $CR_{18}$ or N; $X_{19}$ is $CR_{19}$ or N; $X_{20}$ is $CR_{20}$ or N; $X_{21}$ is $CR_{21}$ or N; $X_{22}$ is $CR_{22}$ or N; $X_{23}$ is $CR_{23}$ or N; $X_{24}$ is $CR_{24}$ or N;

$Z_3$, $Z_4$, and $R_{11}$ to $R_{24}$ are each independently selected from i) hydrogen, deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

ii) a $C_1$-$C_{60}$ alkyl group, a $C_2$-$C_{60}$ alkenyl group, a $C_2$-$C_{60}$ alkynyl group, and a $C_1$-$C_{60}$ alkoxy group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group;

iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and v) —$N(Q_{11})(Q_{12})$, —$Si(Q_{13})(Q_{14})(Q_{15})$, and —$B(Q_{16})(Q_{17})$ (wherein, $Q_{11}$ to $Q_{17}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group);

$Ar_{13}$ and $Ar_{14}$ are each independently selected from i) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and ii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

$Z_1$ and $Z_2$ are each independently selected from i) a $C_1$-$C_{60}$ alkyl group, a $C_2$-$C_{60}$ alkenyl group, a $C_2$-$C_{60}$ alkynyl group, and a $C_1$-$C_{60}$ alkoxy group;

ii) a $C_1$-$C_{60}$ alkyl group, a $C_2$-$C_{60}$ alkenyl group, a $C_2$-$C_{60}$ alkynyl group and a $C_1$-$C_{60}$ alkoxy group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and p and q are each independently an integer of 1 to 4.

In an embodiment, the ring A and the ring B may each independently be selected from i) a $C_6$-$C_{20}$ aromatic ring and a $C_2$-$C_{20}$ heteroaromatic ring; and ii) a $C_6$-$C_{20}$ aromatic ring and a $C_2$-$C_{20}$ heteroaromatic ring each substituted with at least one selected from deuterium, a halogen atom, a $C_1$-$C_{10}$ alkyl group, a $C_6$-$C_{20}$ aryl group, a $C_2$-$C_{20}$ heteroaryl group, and —N($Q_1$)($Q_2$) (wherein, $Q_1$ and $Q_2$ are each independently a $C_6$-$C_{10}$ aryl group).

In an embodiment, the ring A and the ring B may each independently be selected from i) benzene, naphthalene, anthracene, pyridine, pyrimidine, pyrazine, quinoline, and isoquinoline; and ii) benzene, naphthalene, anthracene, pyridine, pyrimidine, pyrazine, quinoline, and isoquinoline each substituted with at least one selected from deuterium, a methyl group, an ethyl group, a t-butyl group, an octyl group, a phenyl group, a naphthyl group, a pyridyl group, a pyrimidyl group, and —N(Ph)$_2$.

In an embodiment, at least one of n1 and n2 may each nonzero, and $L_1$ and $L_2$ may each independently be selected from i) a phenylene group, a pyridylene group, a pyrimidylene group, a triazinylene group, and a quinazolinylene group;

ii) a phenylene group, a pyridylene group, a pyrimidylene group, a triazinylene group, and a quinazolinylene group each substituted with at least one selected from a phenyl group, a naphthyl group, and a pyridyl group;

iii) a phenylene group, a pyridylene group, a pyrimidylene group, a triazinylene group, and a quinazolinylene group each substituted with at least one selected from deuterium, a methyl group, an ethyl group, an n-octyl group, a methoxy group, an ethoxy group, a phenyl group, a naphthyl group, a pyridyl group, and a carbazole group.

In an embodiment, $Ar_{11}$ and $Ar_{12}$ may each independently be selected from i) a $C_6$-$C_{60}$ aryl group and a $C_2$-$C_{60}$ heteroaryl group; and ii) a $C_6$-$C_{60}$ aryl group and a $C_2$-$C_{60}$ heteroaryl group each substituted with at least one selected from a $C_1$-$C_{60}$ alkyl group, a $C_6$-$C_{60}$ aryl group, and a $C_2$-$C_{60}$ heteroaryl group.

In an embodiment, $Ar_{11}$ and $Ar_{12}$ may each independently be a compound represented by any one of Formulae H1 to H81:

H1

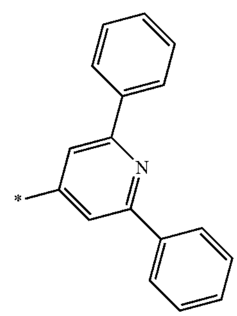

H2

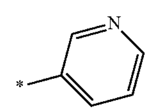

H3

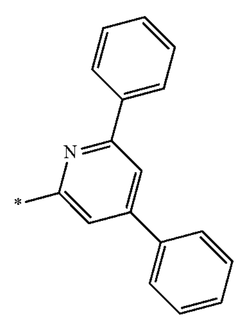

H4

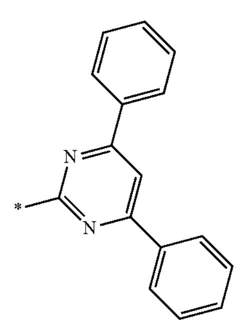

-continued
H5
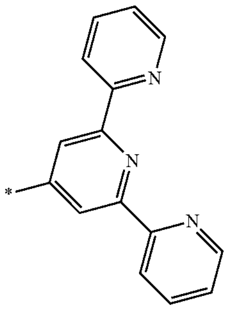
H6
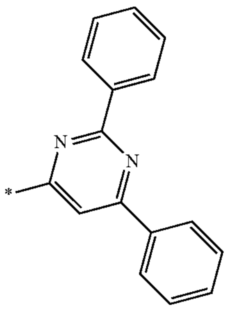
H7
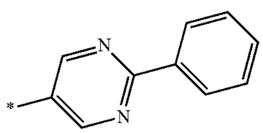
H8
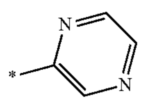
H9
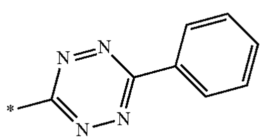
H10
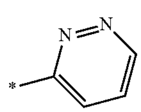
H11
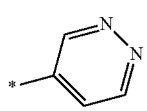
H12
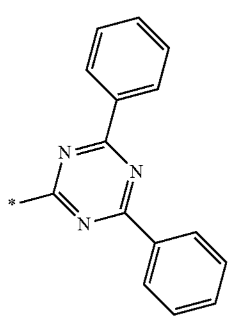
-continued
H13
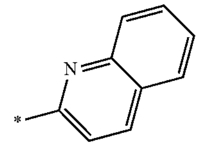
H14
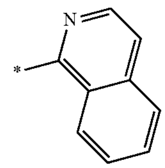
H15
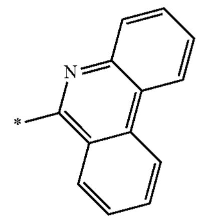
H16
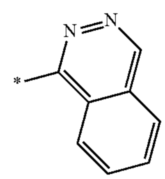
H17
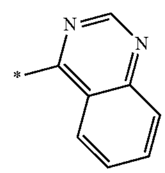
H18
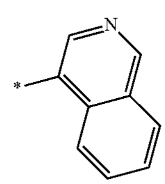
H19
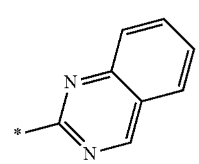
H20
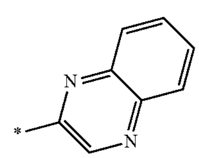
H21
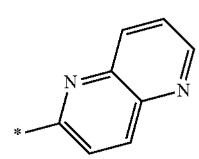

-continued
H22
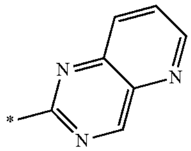
H23
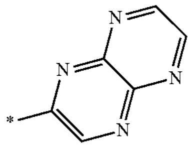
H24
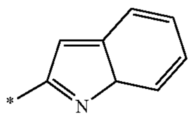
H25
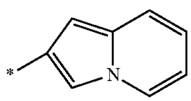
H26
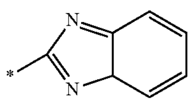
H27
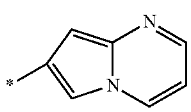
H28
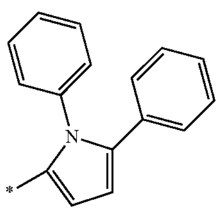
H29
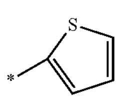
H30
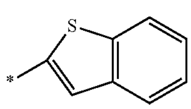
H31
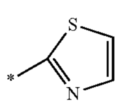
H32
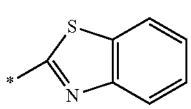
H33
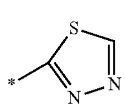
H34
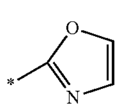
-continued
H35
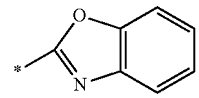
H36
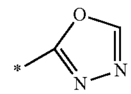
H37
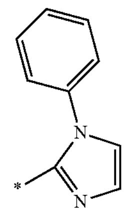
H38
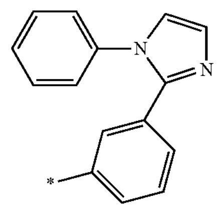
H39
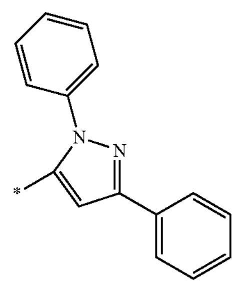
H40
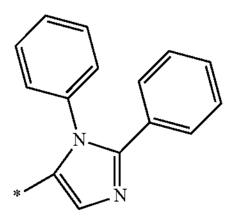
H41
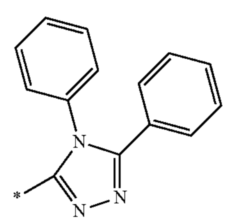
H42
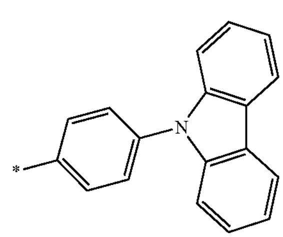

-continued
H43
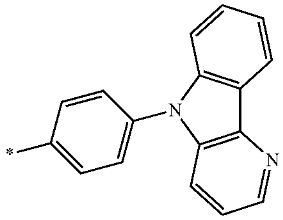
H44
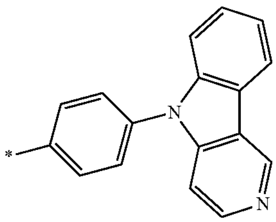
H45
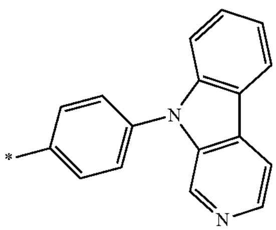
H46
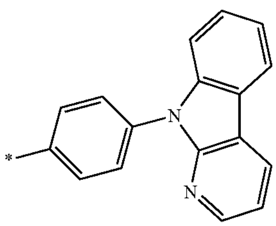
H47
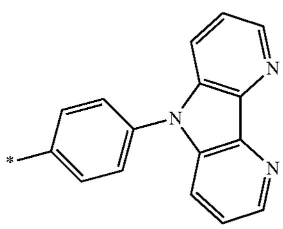
H48
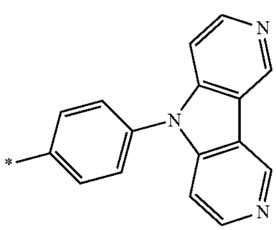
H49
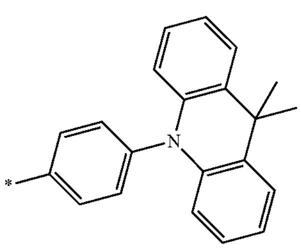
-continued
H50
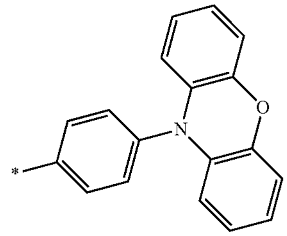
H51
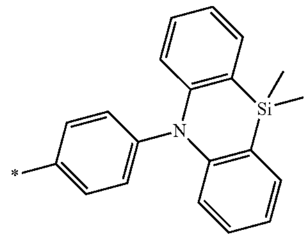
H52
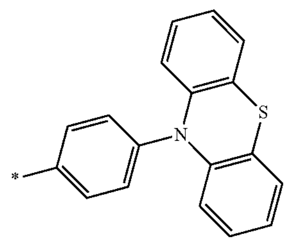
H53
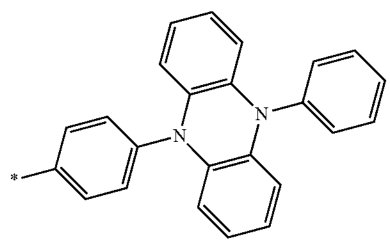
H54
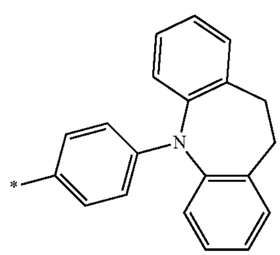
H55
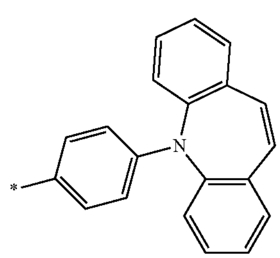

-continued
H56
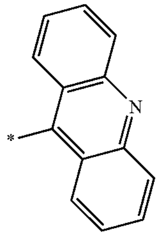
H57
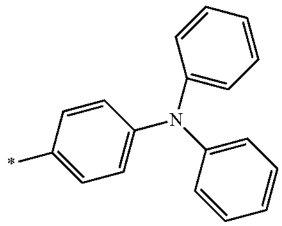
H58
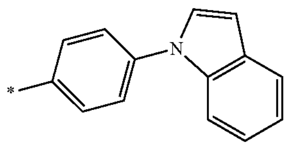
H59
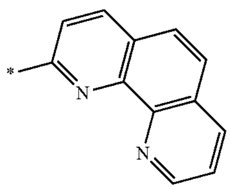
H60
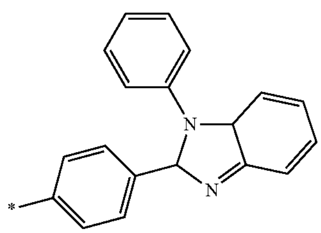
H61
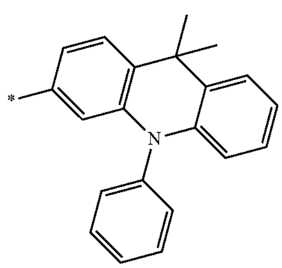
H62
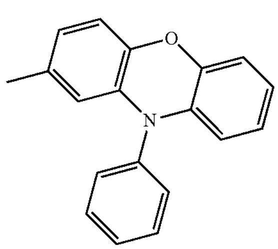
-continued
H63
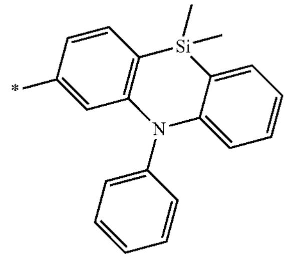
H64
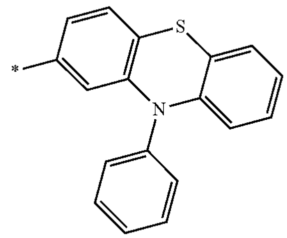
H65
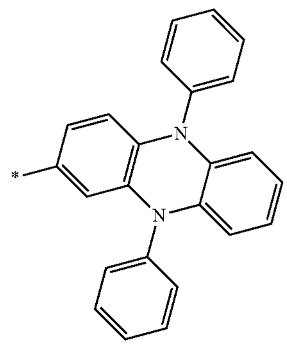
H66
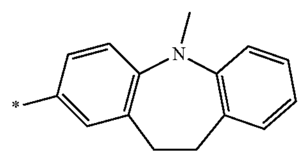
H67
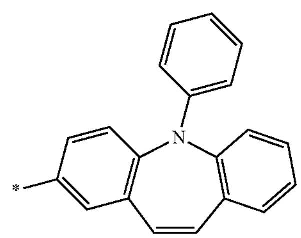
H68
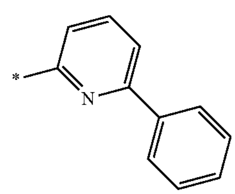
H69
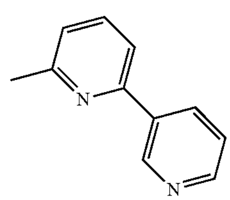

-continued

H70

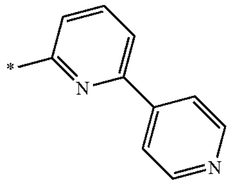

H71

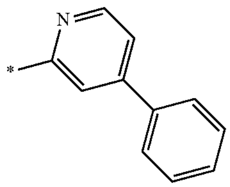

H72

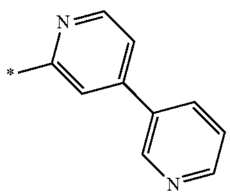

H73

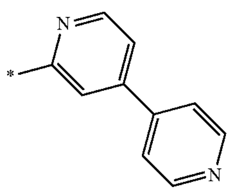

H74

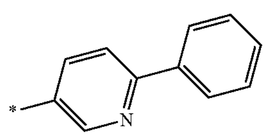

H75

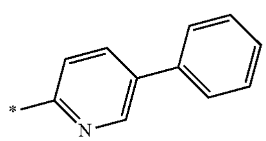

H76

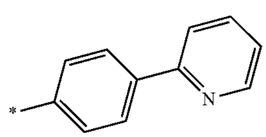

H77

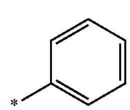

H78

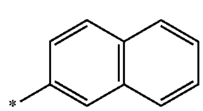

H79

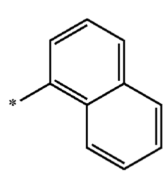

-continued

H80

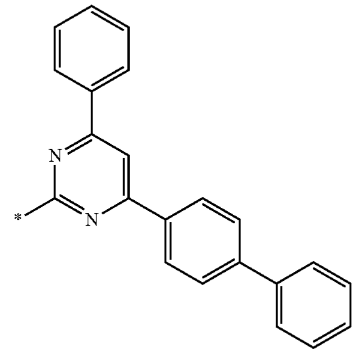

H81

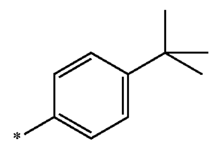

wherein, in Formulae H1 to H81, * is a bonding site to N, $L_1$, or $L_2$.

In an embodiment, $L_1$ and $L_2$ may each independently be selected from i) a phenylene group, a pyridylene group, a pyrimidylene group, a triazinylene group, and a quinazolinylene group;

ii) a phenylene group, a pyridylene group, a pyrimidylene group, a triazinylene group, and a quinazolinylene group each substituted with at least one selected from a phenyl group, a naphthyl group, and a pyridyl group; and iii) a phenylene group, a pyridylene group, a pyrimidylene group, a triazinylene group, and a quinazolinylene group each substituted with at least one selected from deuterium, a methyl group, an ethyl group, an n-octyl group, a methoxy group, an ethoxy group, a phenyl group, a naphthyl group, a pyridyl group, and a carbazole group;

n1 and n2 are each independently an integer of 0 or 1;

$Ar_{11}$ and $Ar_{12}$ are each independently a compound represented by any one of Formulae H1, H3, H4, H6, H12, and H77 to H80:

H1

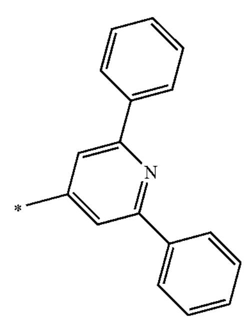

-continued
H3
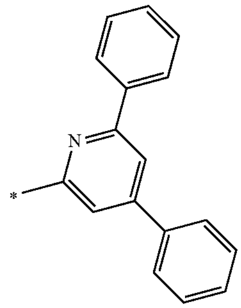
H4
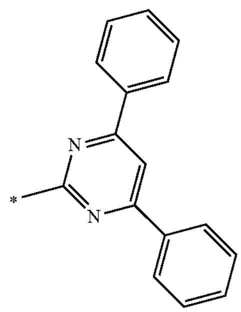
H6
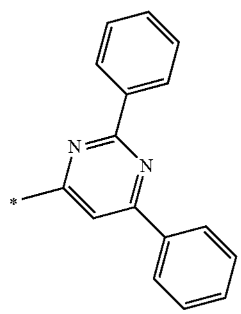
H12
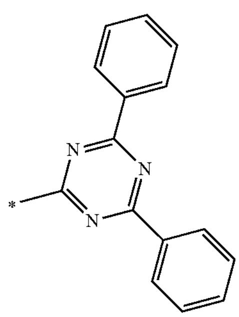
H77
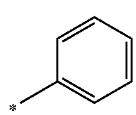
H78
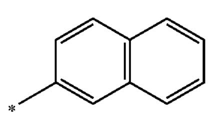
-continued
H79
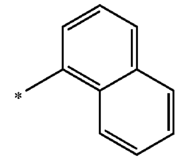
H80
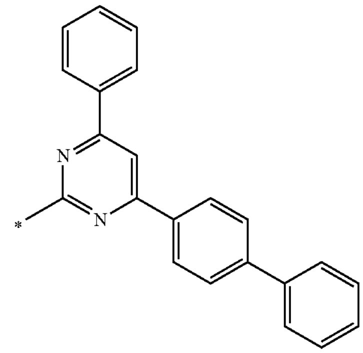
In an embodiment, the light-emitting material may be represented by any one of Formulae 1-1 to 1-28:
1-1
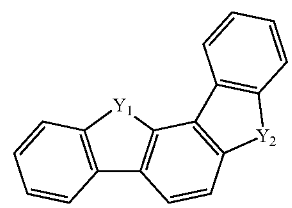
1-2
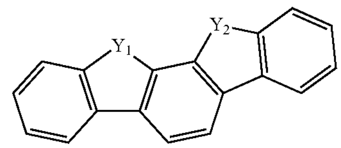
1-3
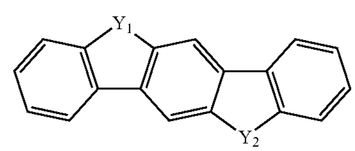
1-4
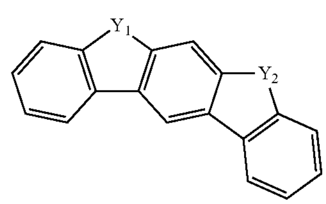
1-5
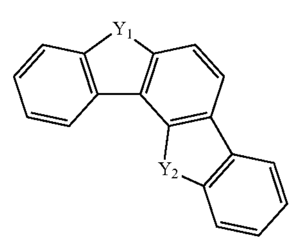

-continued
1-6
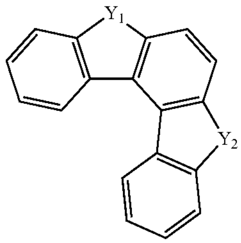
1-7
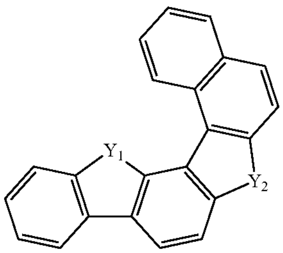
1-8
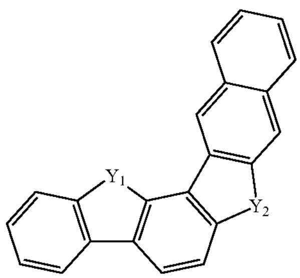
1-9
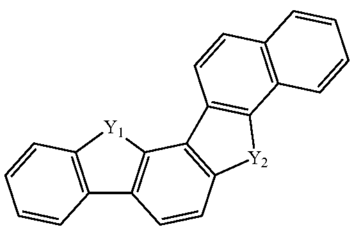
1-10
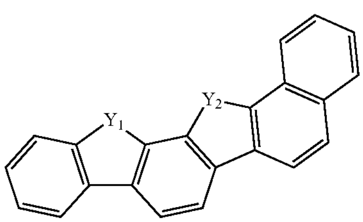
1-11
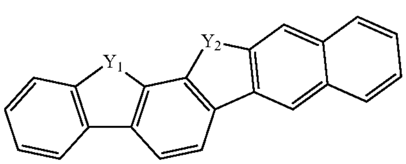
1-12
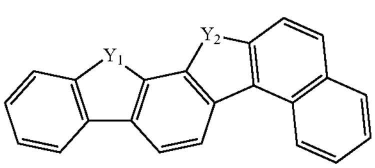
-continued
1-13
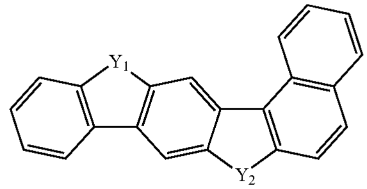
1-14
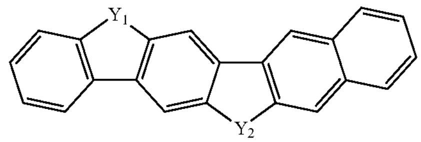
1-15
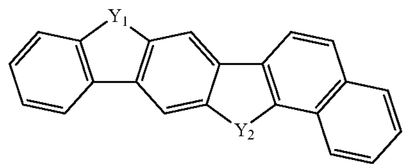
1-16
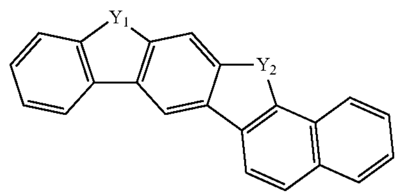
1-17
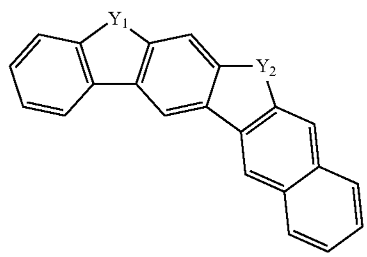
1-18
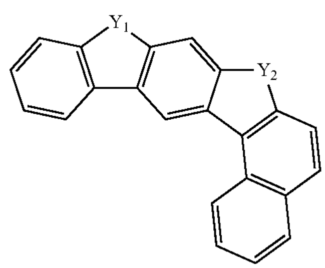
1-19
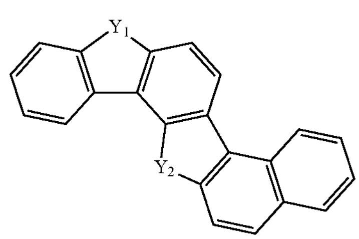

-continued 1-20

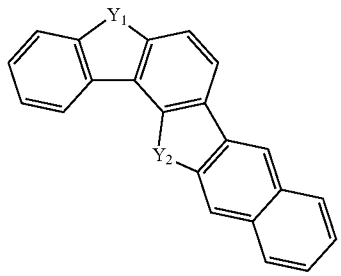

1-21

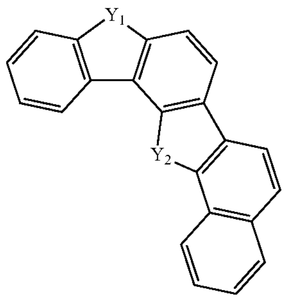

1-22

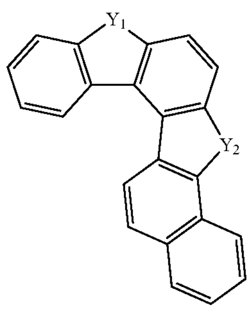

1-23

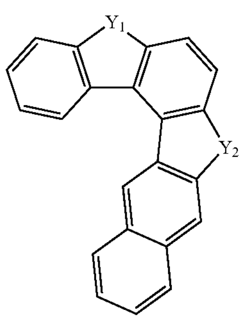

1-24

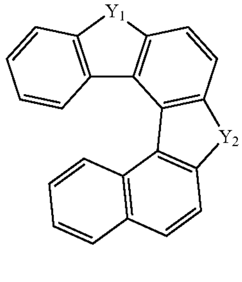

-continued 1-25

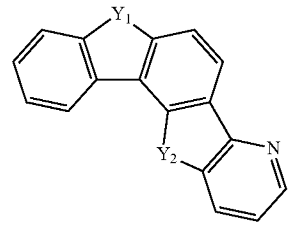

1-26

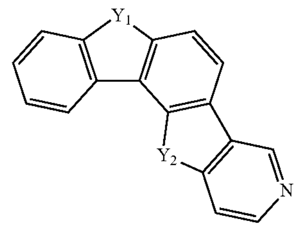

1-27

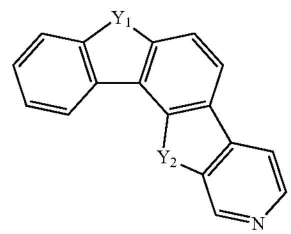

1-28

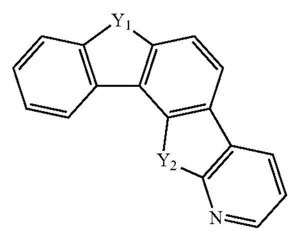

wherein, in Formulae 1-1 to 1-28, $Y_1$ is N-$(L_1)_{n1}$-$Ar_{11}$;

$Y_2$ is N-$(L_2)_{n2}$-$Ar_{12}$, O, S, C($R_{31}$)($R_{32}$), or Si($R_{33}$)($R_{34}$);

$L_1$ and $L_2$ are each independently selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted $C_2$-$C_{10}$ heterocycloalkylene group, a substituted or unsubstituted $C_2$-$C_{10}$ heterocycloalkenylene group, and a substituted or unsubstituted $C_2$-$C_{60}$ heteroarylene group;

n1 and n2 are each independently an integer of 0 to 3;

$Ar_{11}$ and $Ar_{12}$ are each independently selected from i) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and ii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

$R_{31}$ to $R_{34}$ are each independently selected from i) a $C_1$-$C_{60}$ alkyl group, a $C_2$-$C_{60}$ alkenyl group, a $C_2$-$C_{60}$ alkynyl group, and a $C_1$-$C_{60}$ alkoxy group;

ii) a $C_1$-$C_{60}$ alkyl group, a $C_2$-$C_{60}$ alkenyl group, a $C_2$-$C_{60}$ alkynyl group, and a $C_1$-$C_{60}$ alkoxy group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

In an embodiment, the light-emitting material may be represented by any one of Compounds 100 to 236:

100

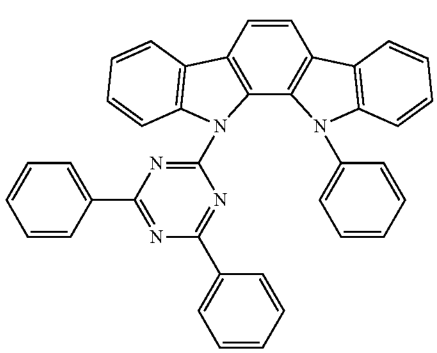

-continued

101

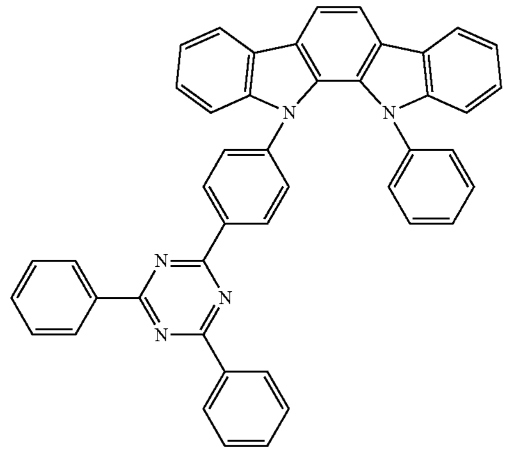

102

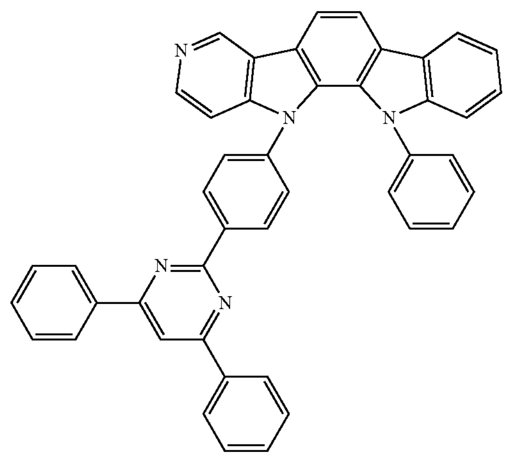

103

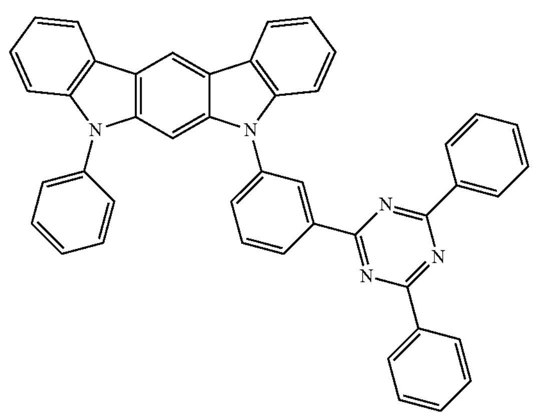

104
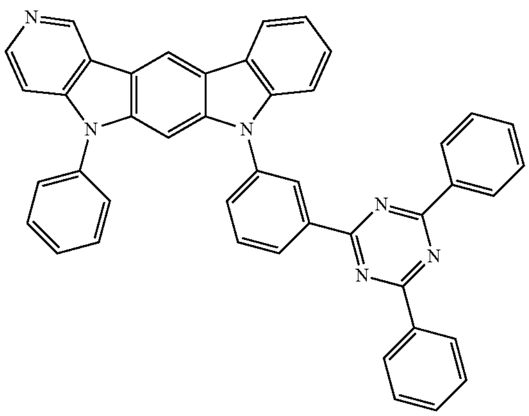
105
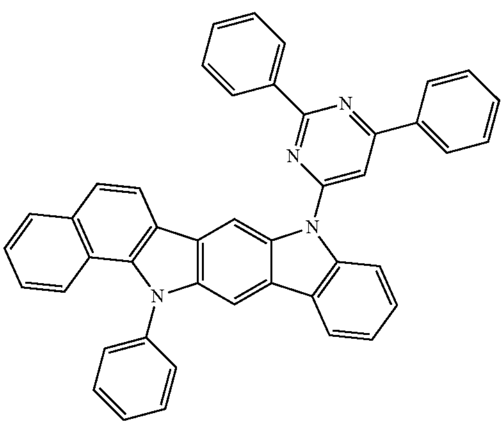
107
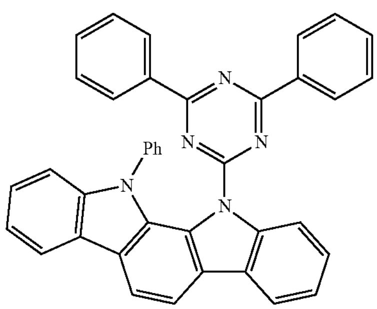
108
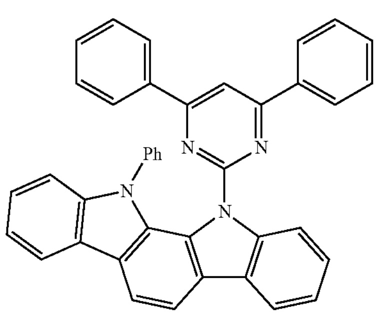
109
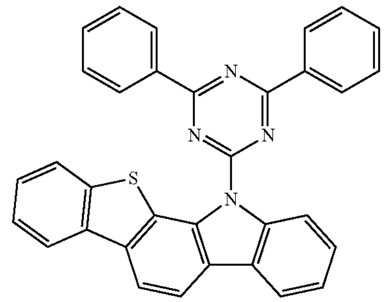
110
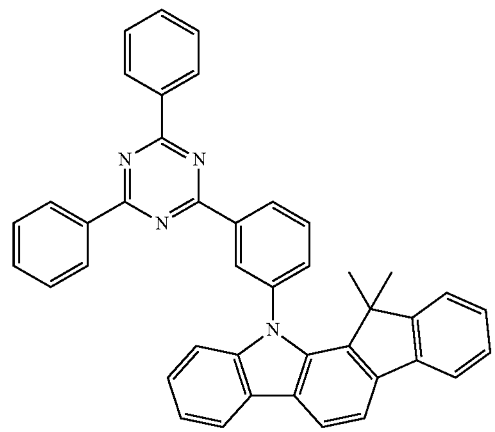
111
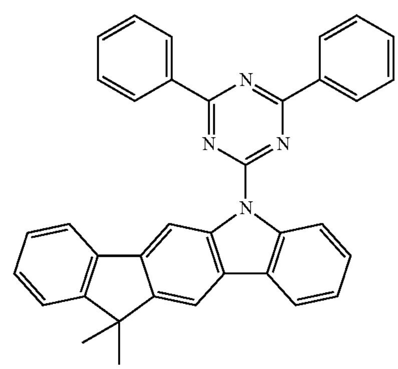
112
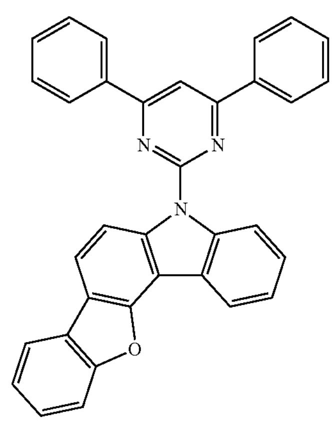

-continued
113
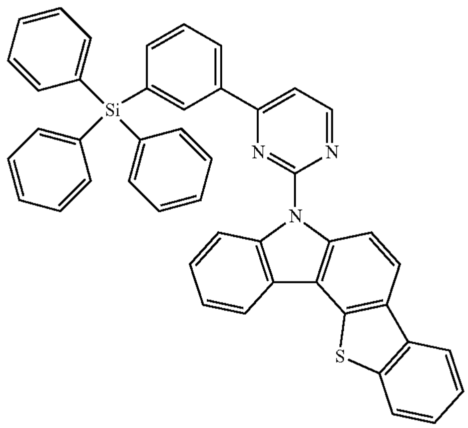
114
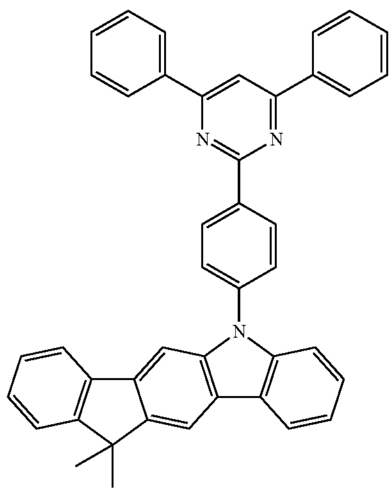
115
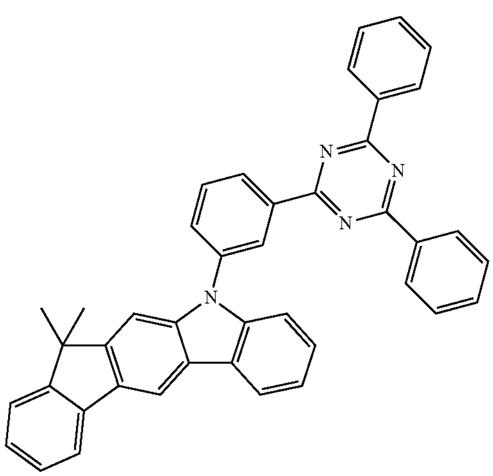
-continued
116
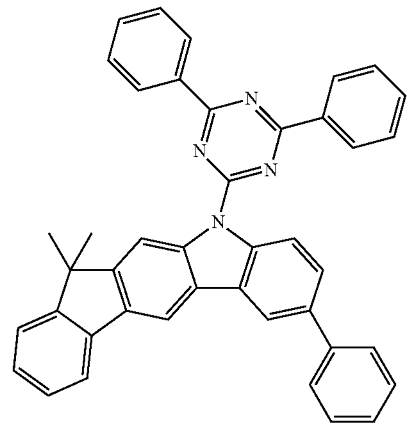
117
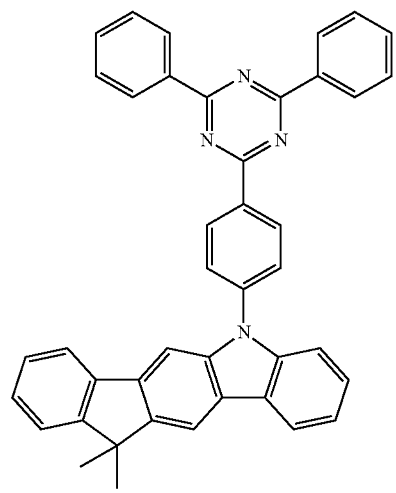
118
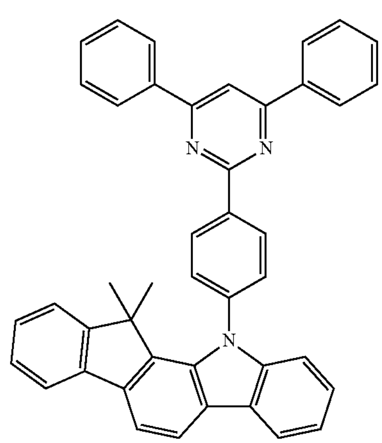

119
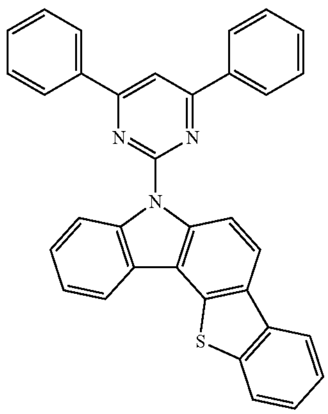
120
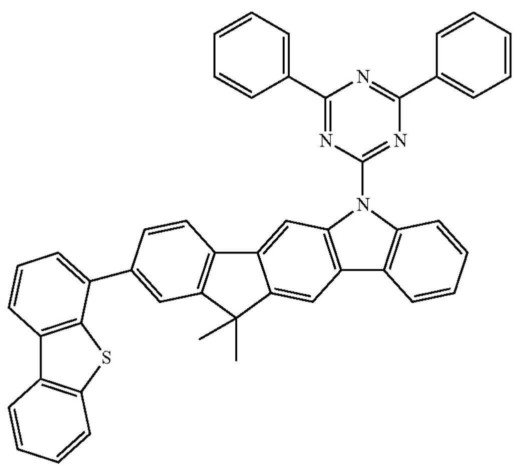
121
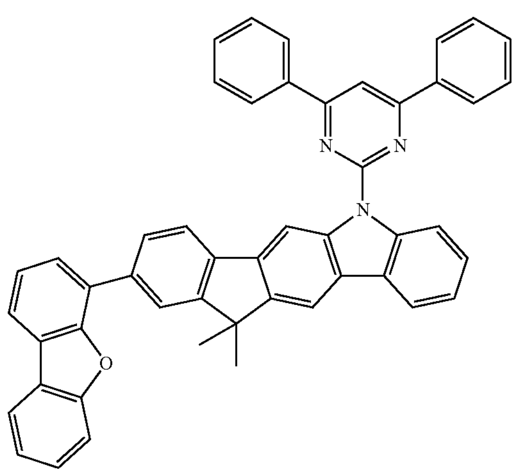
122
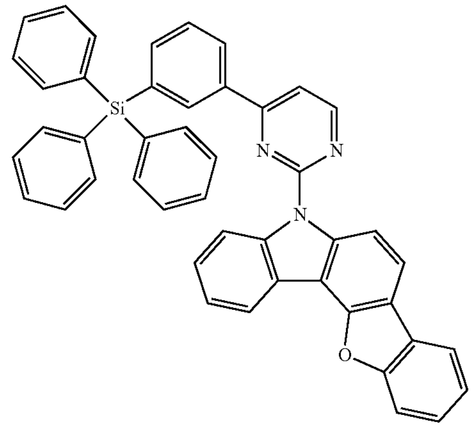
123
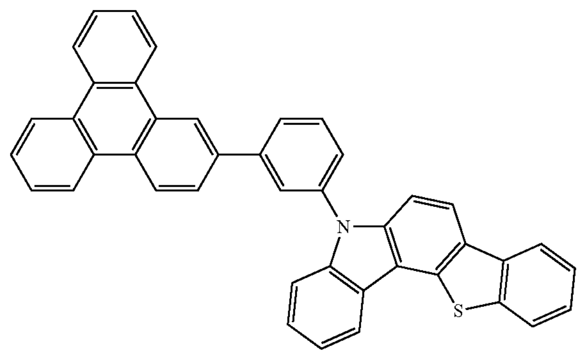
124
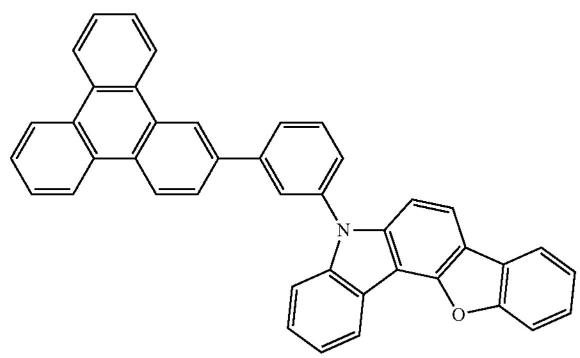
125
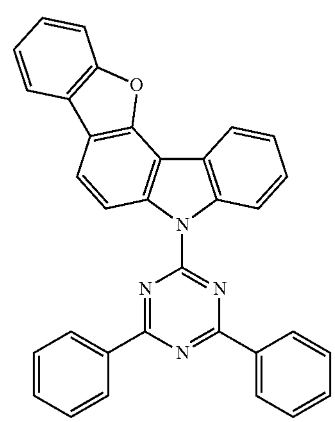

126
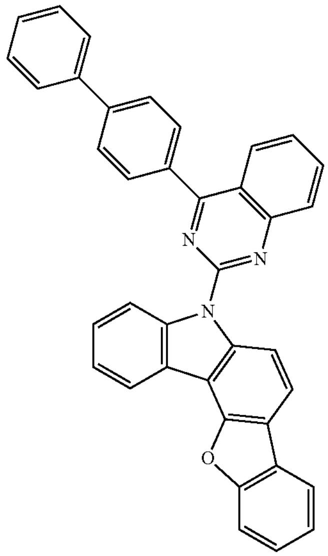
127
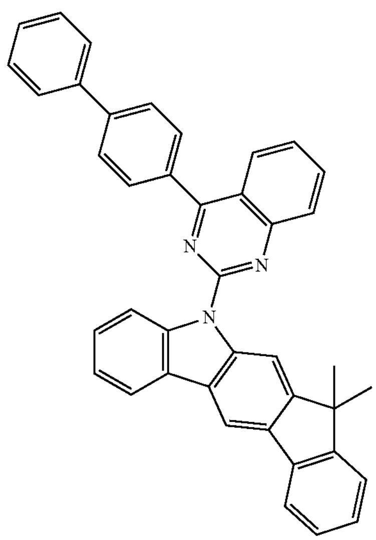
128
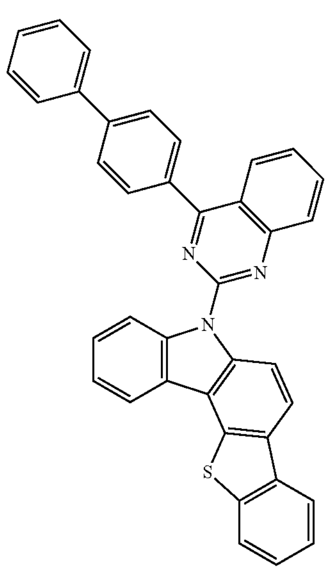
129
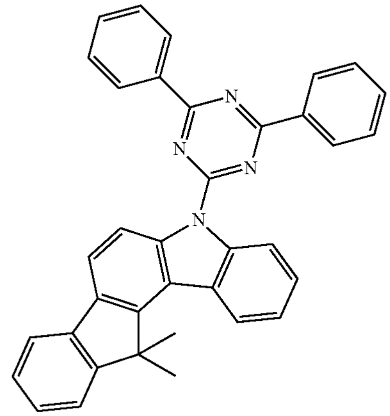
130
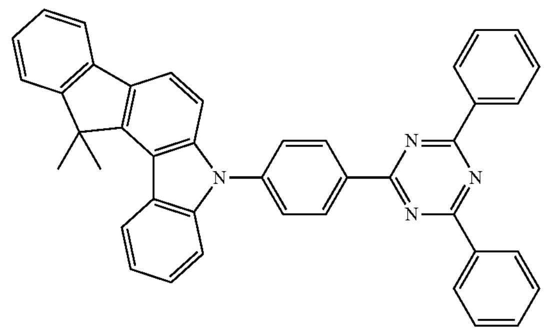
131
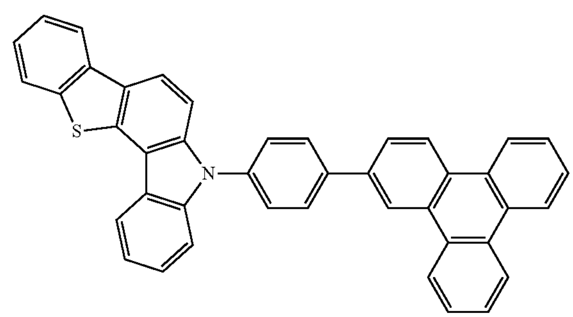
132
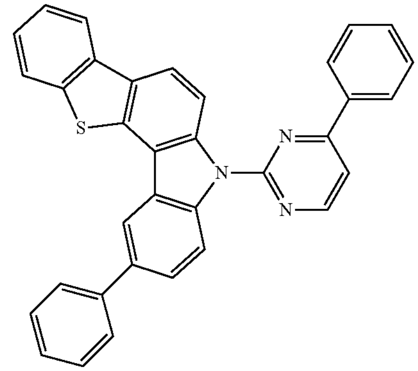

133
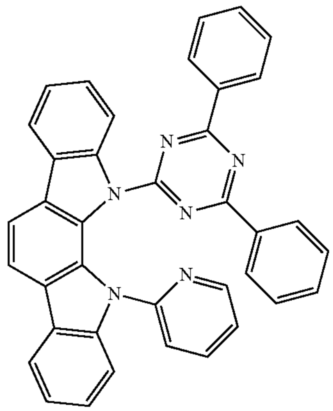
134
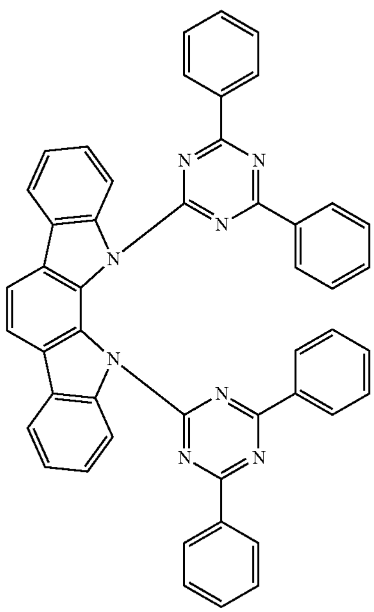
135
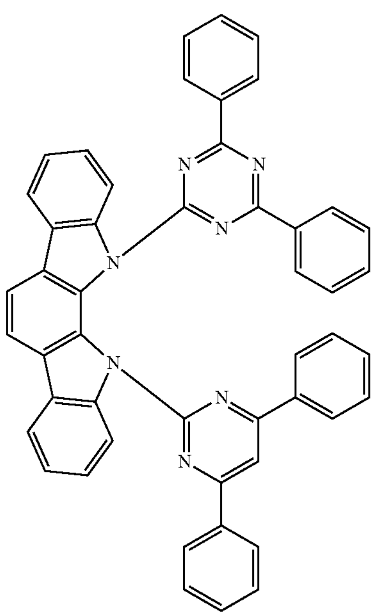
136
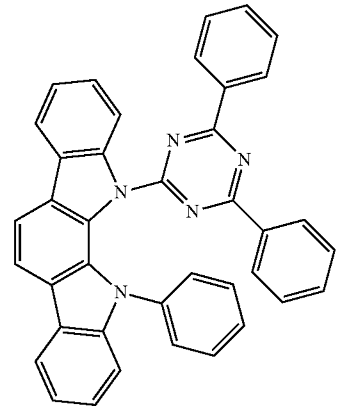
137
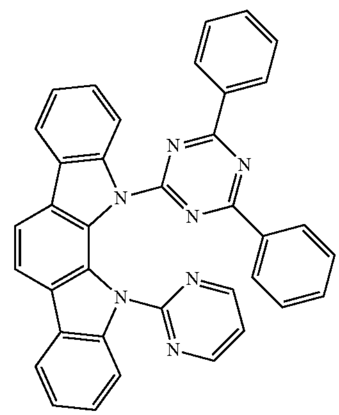
138
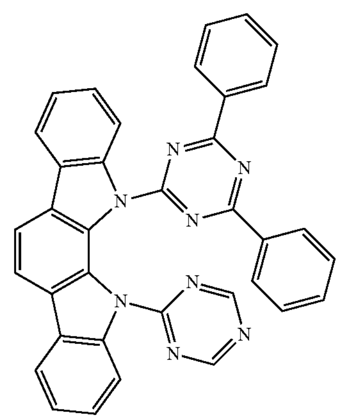
139
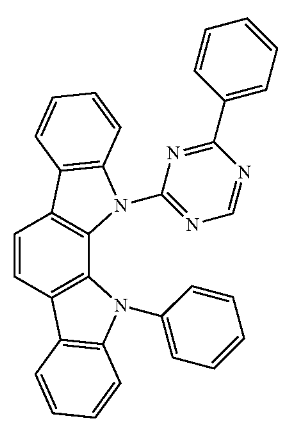

140
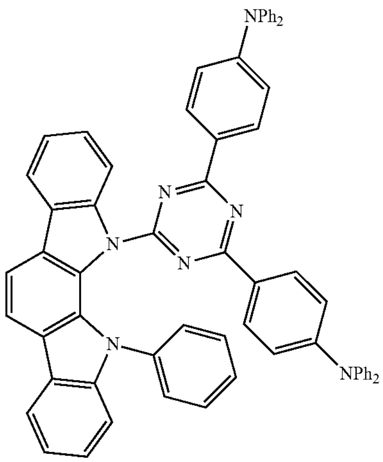
141
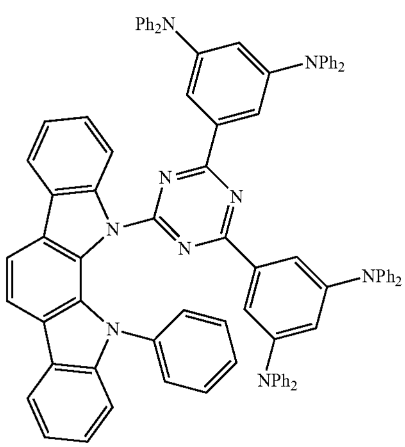
142
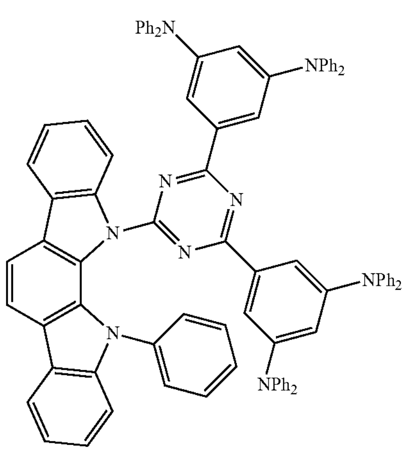
143
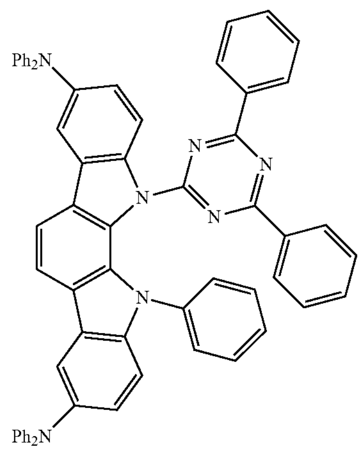
144
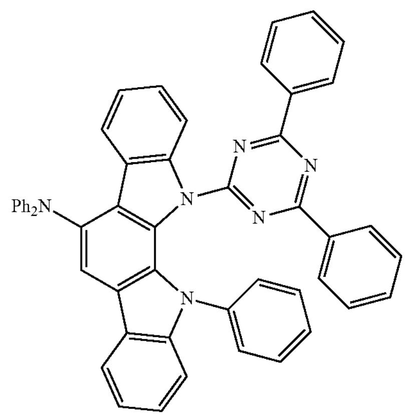
145
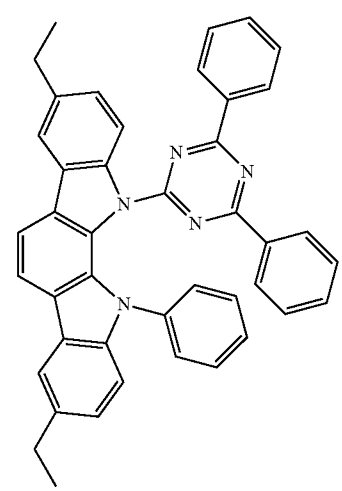

-continued
146
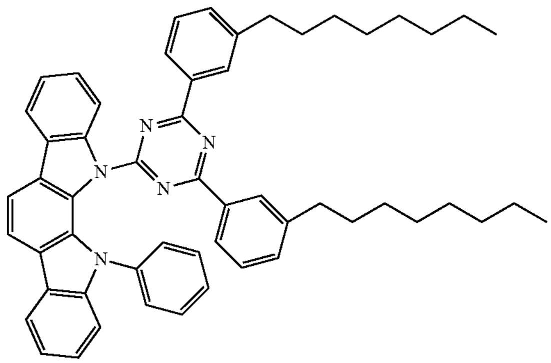
147
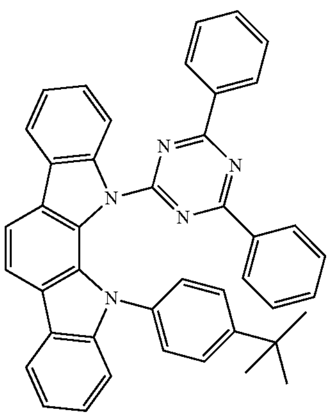
148
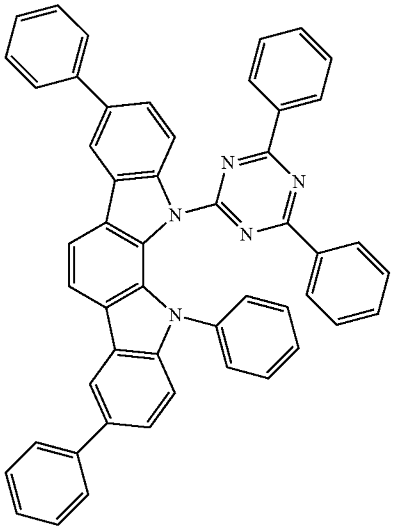
-continued
149
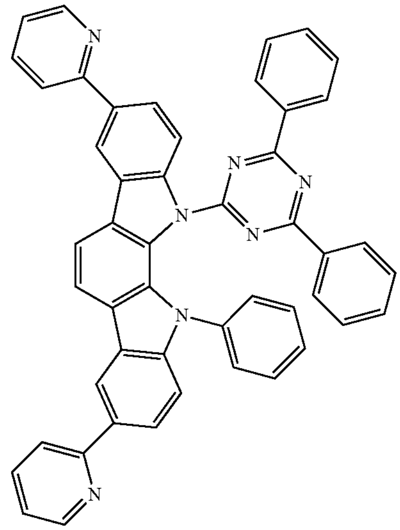
150
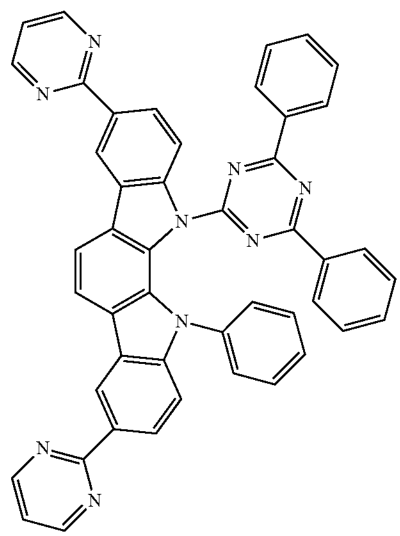
151
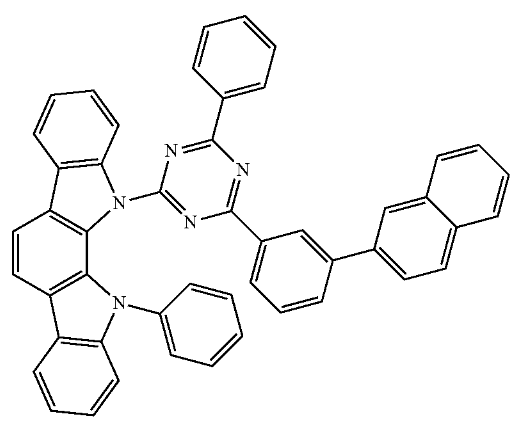

152
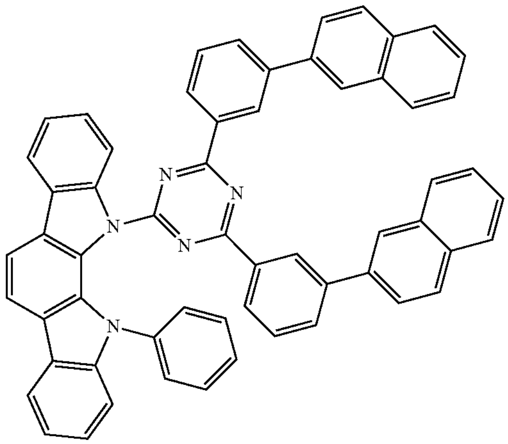
153
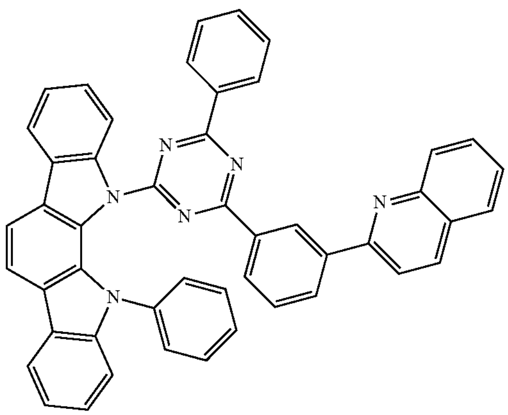
154
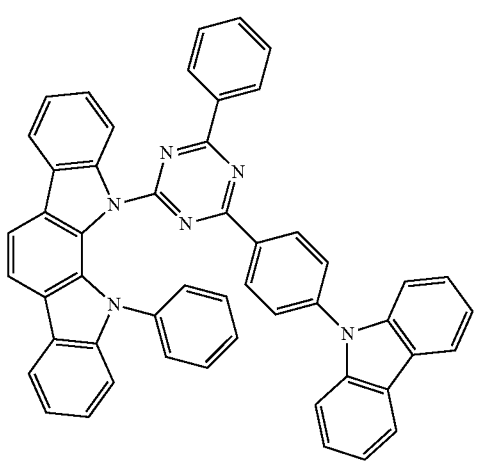
155
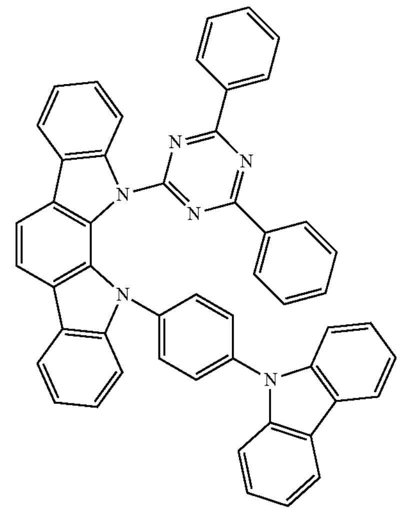
156
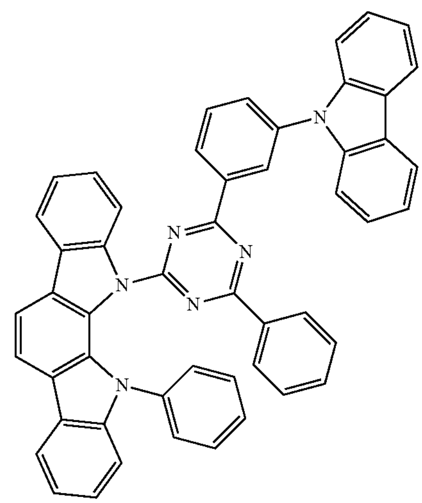
157
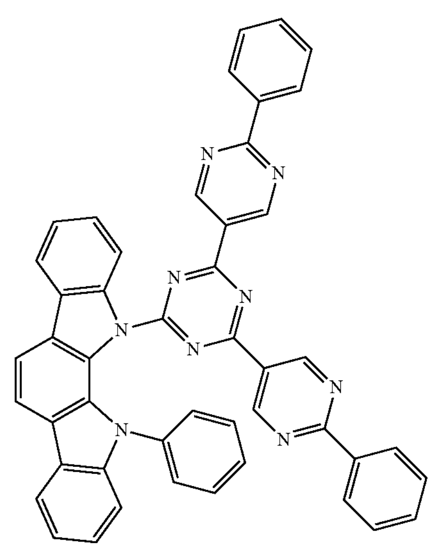

-continued
158
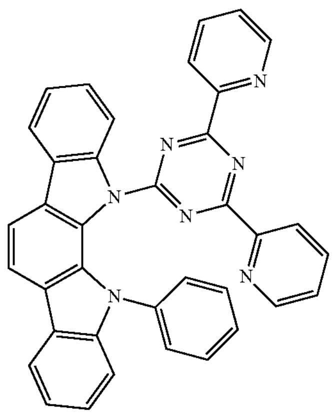
159
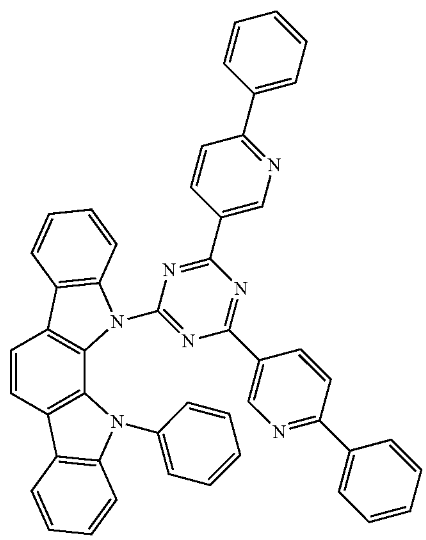
160
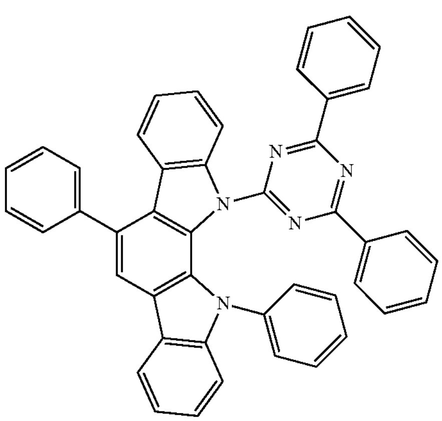
-continued
161
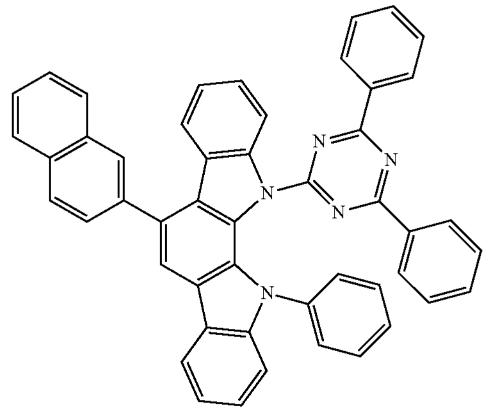
162
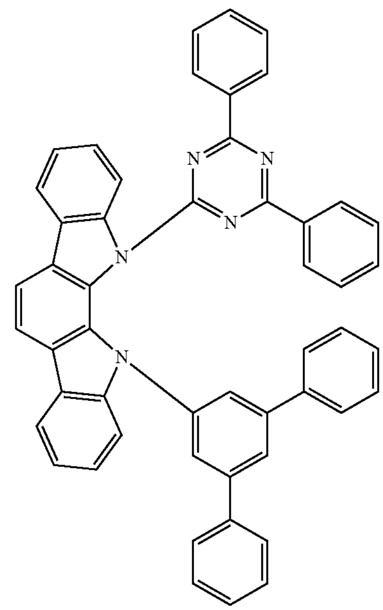
163
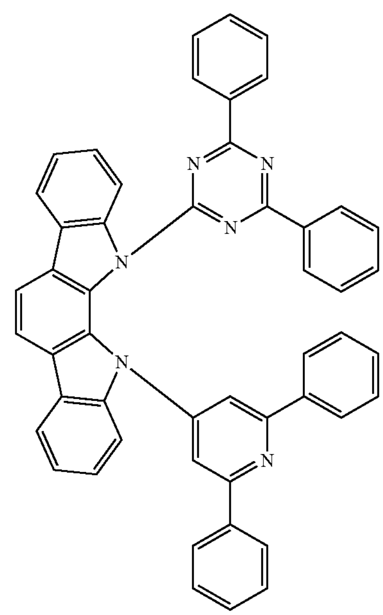

164
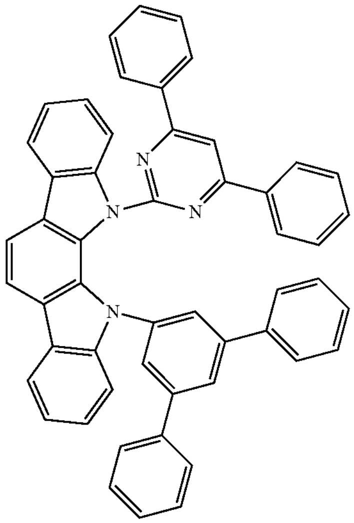
165
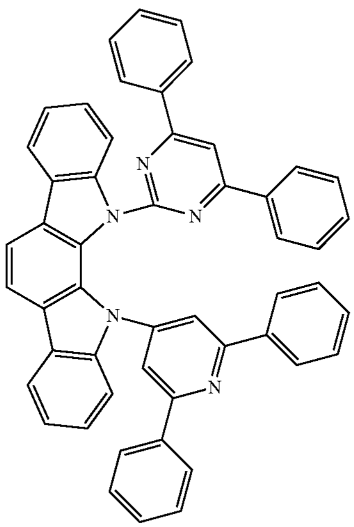
166
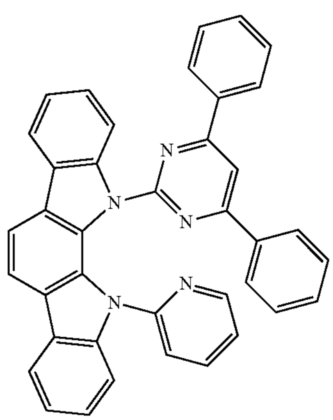
167
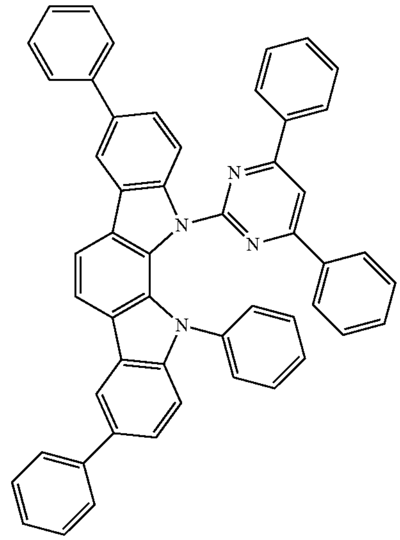
168
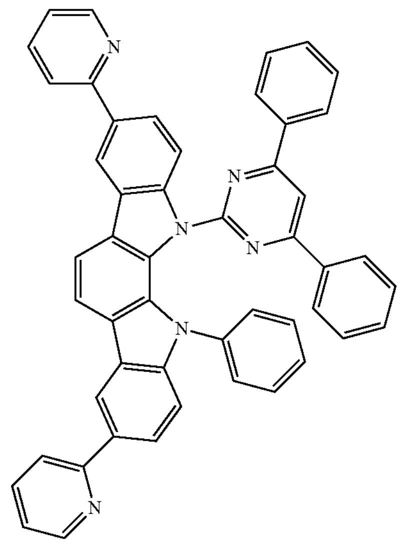
169
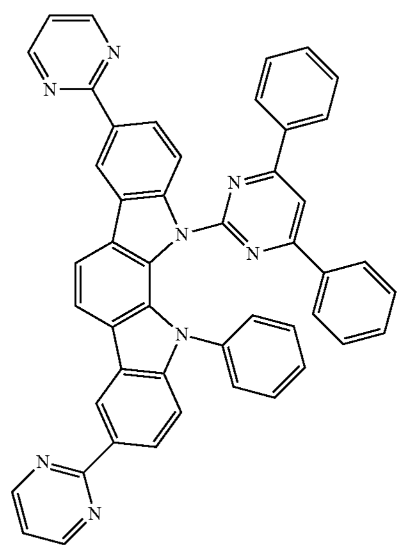

170
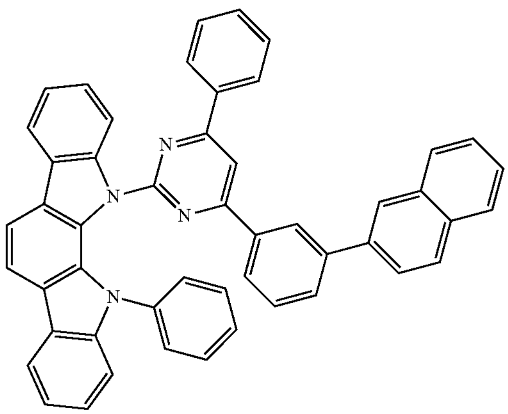
171
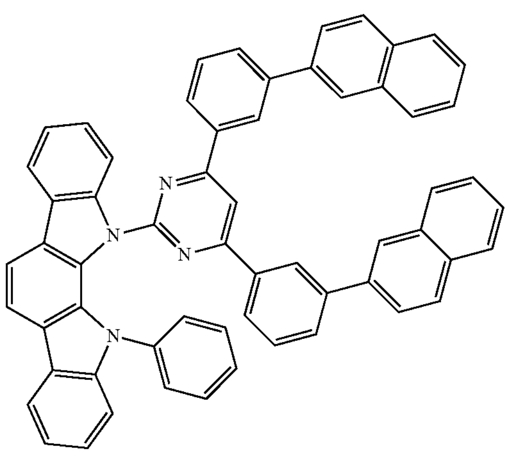
172
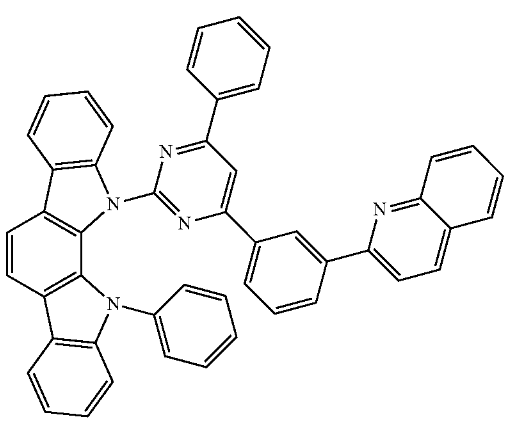
173
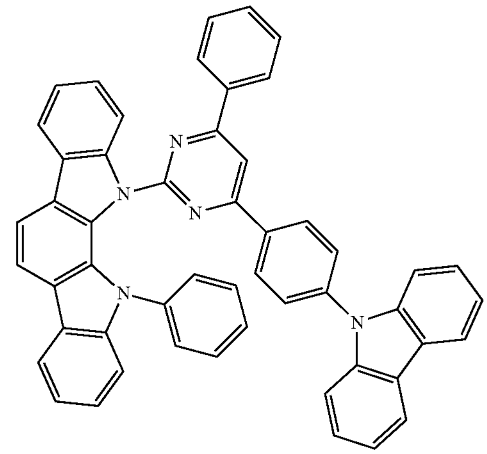
174
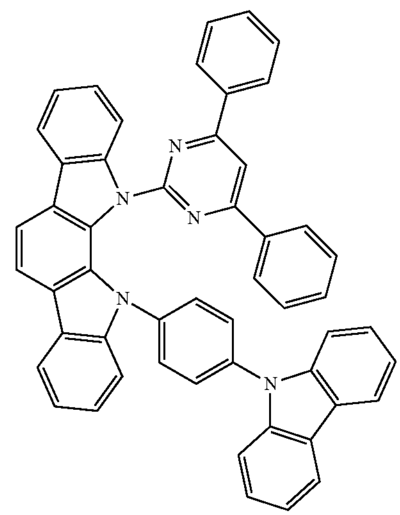
175
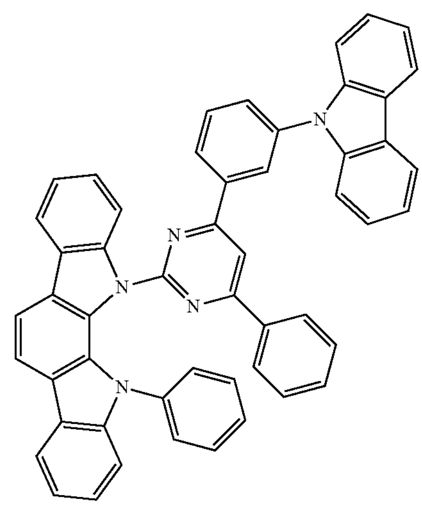

176
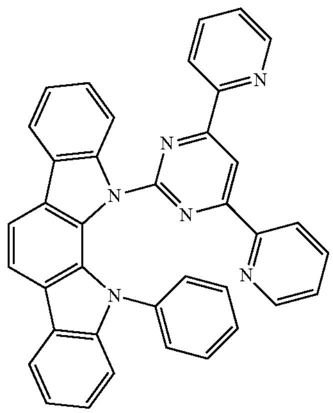
177
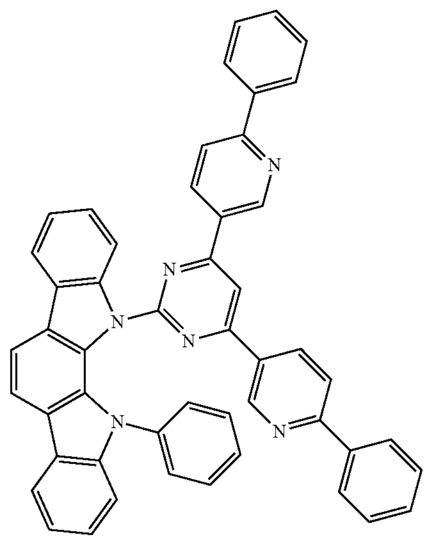
178
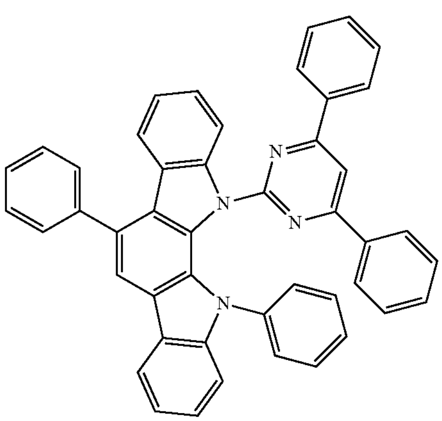
179
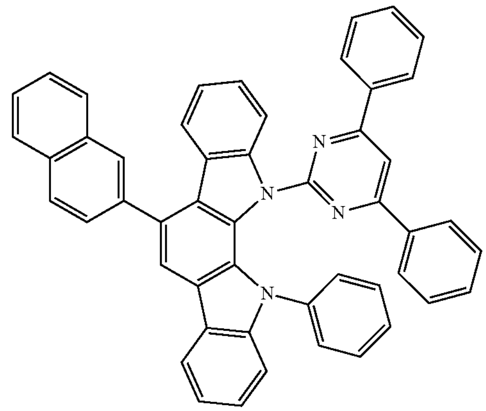
180
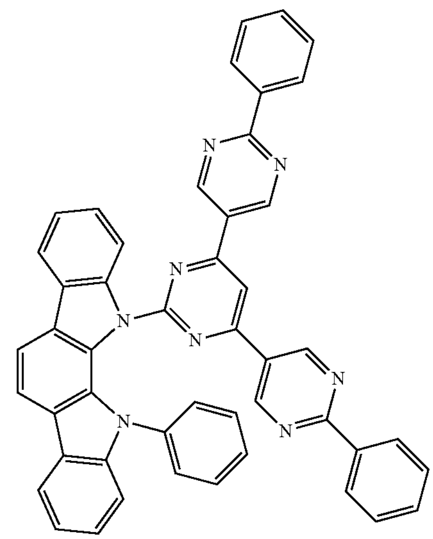
181
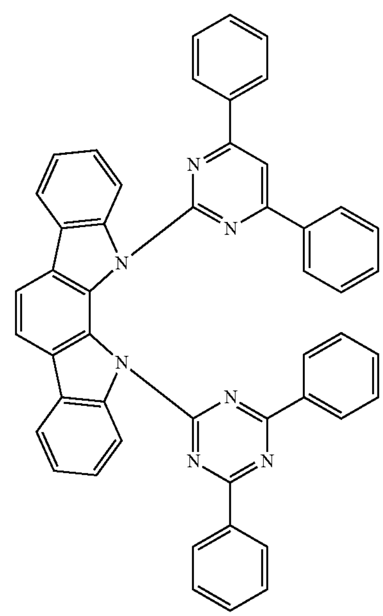

-continued
182
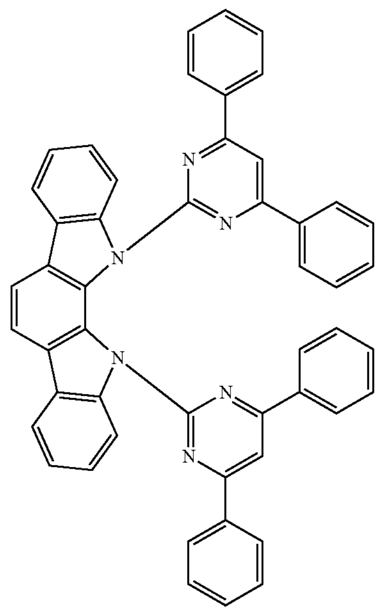
183
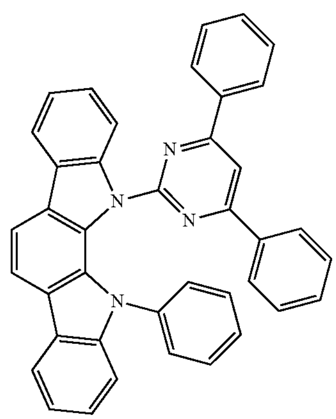
184
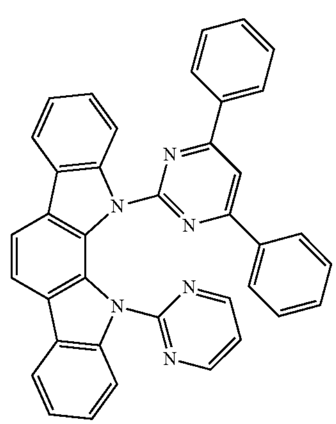
-continued
185
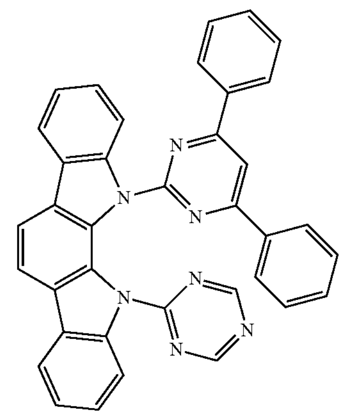
186
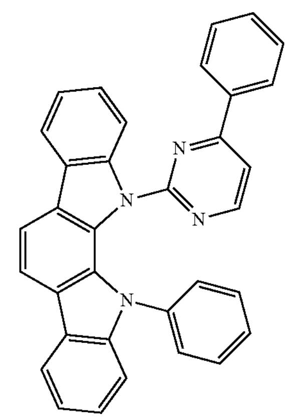
187
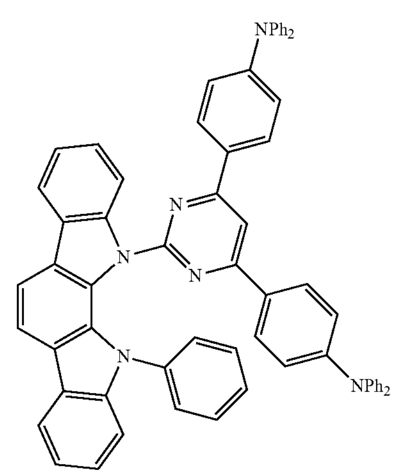

-continued
188
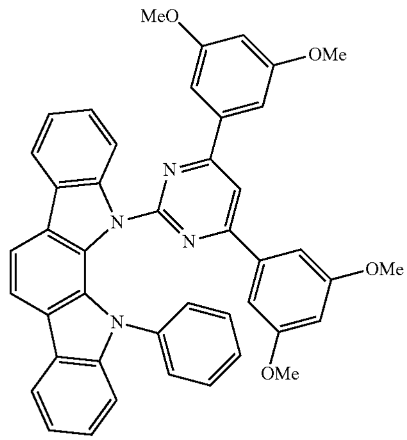
189
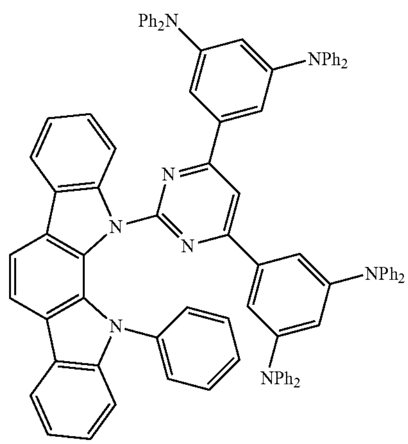
190
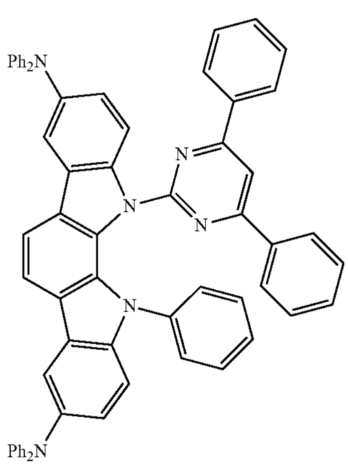
-continued
191
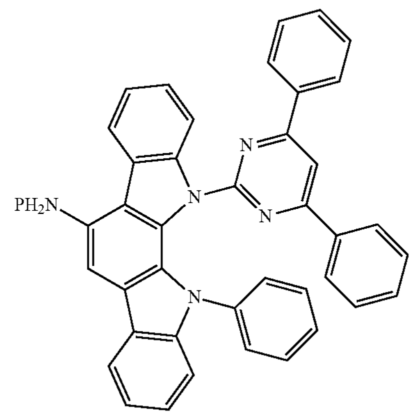
192
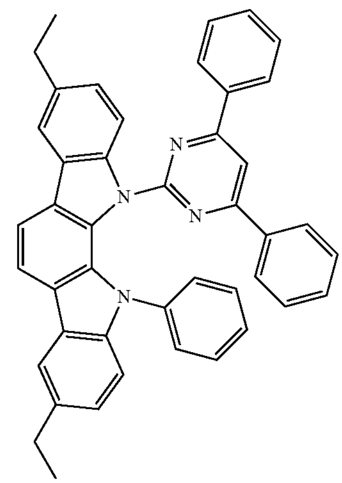
193
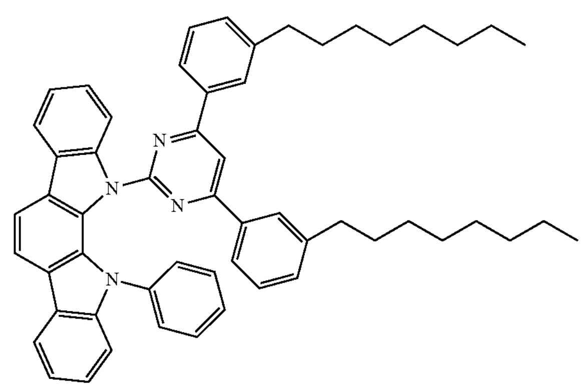

-continued
194
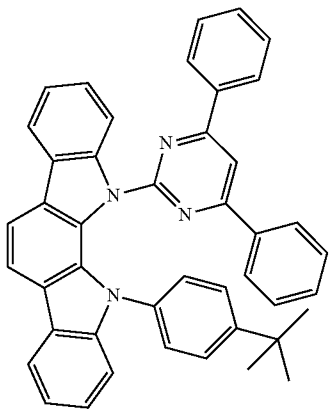
195
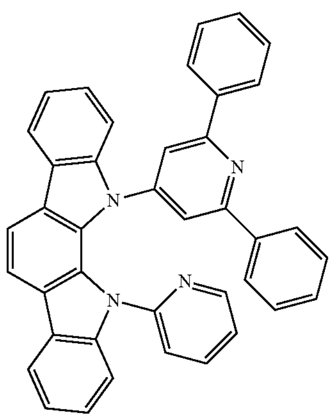
196
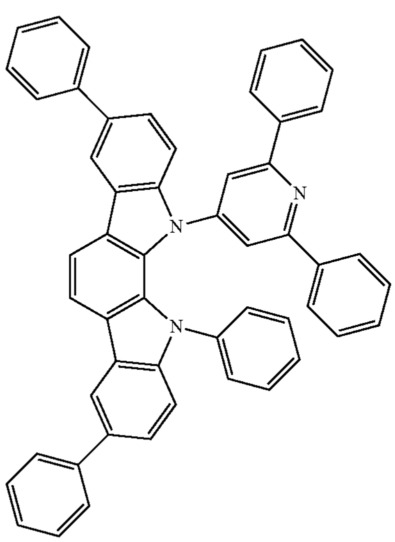
-continued
197
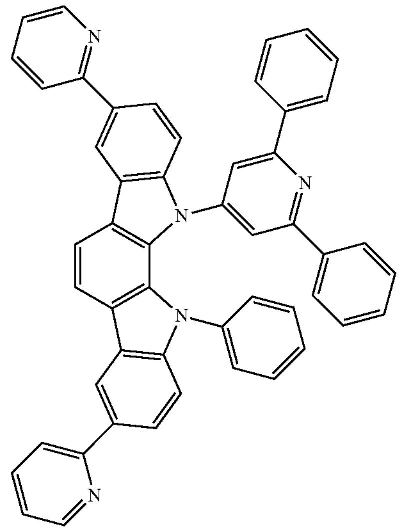
198
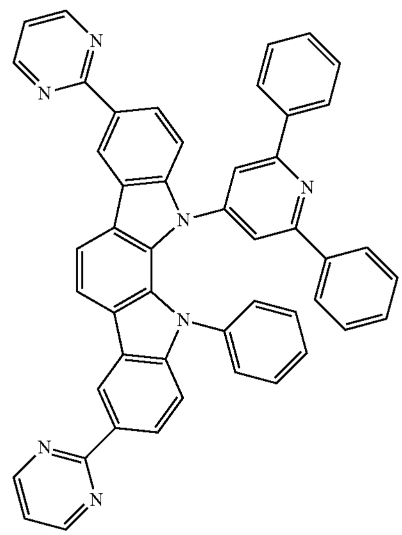
199
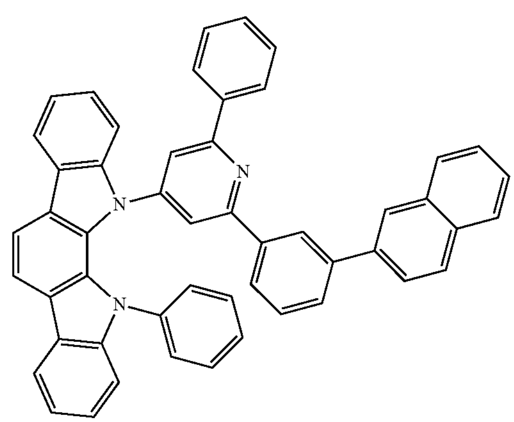

-continued
200
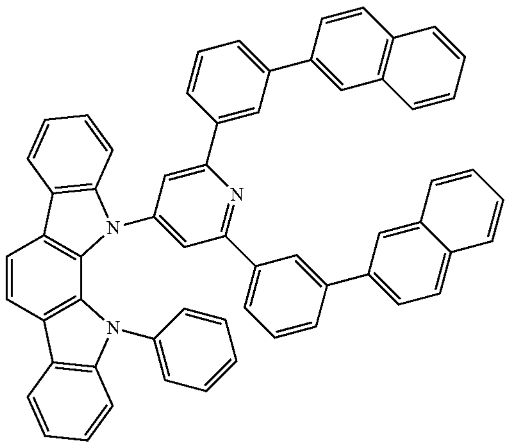
201
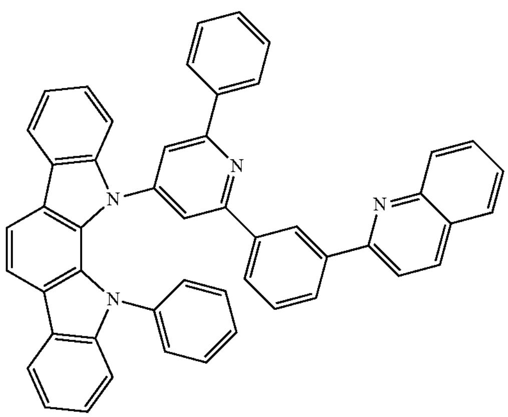
202
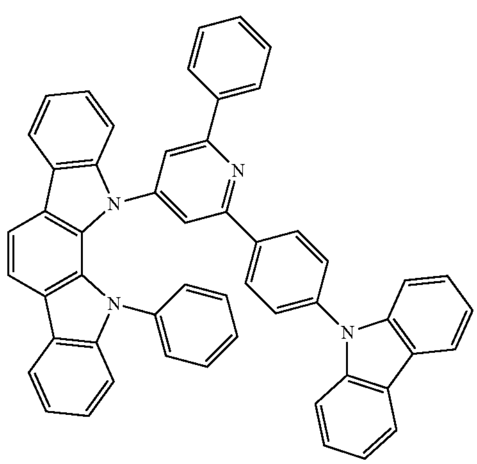
-continued
203
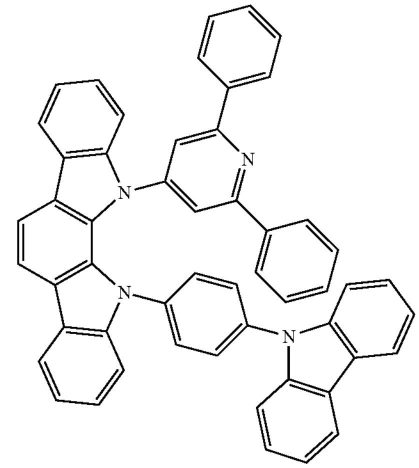
204
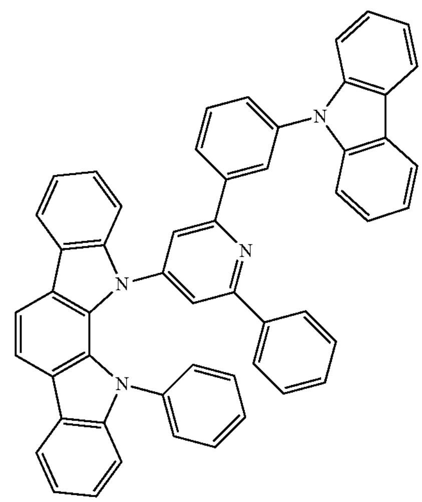
205
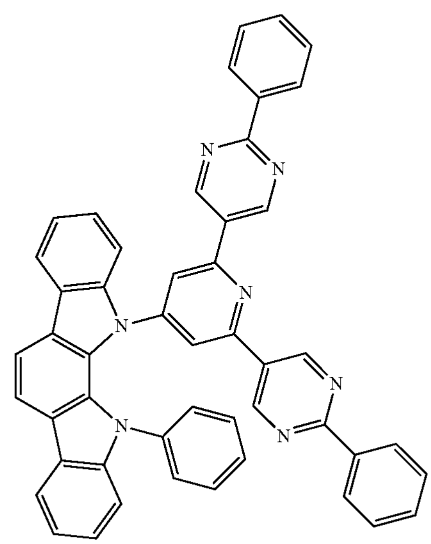

-continued
206
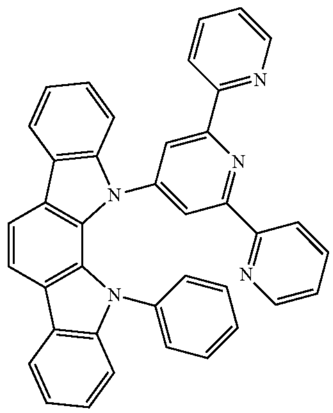
207
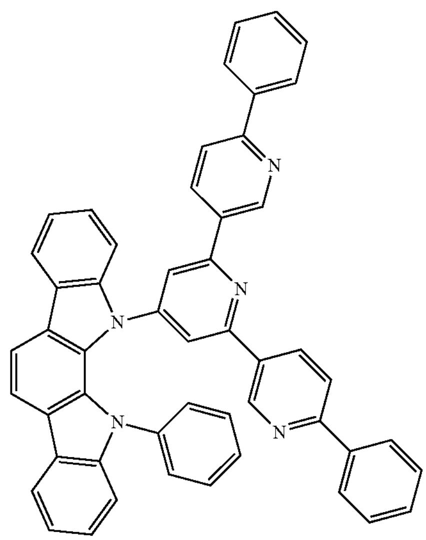
208
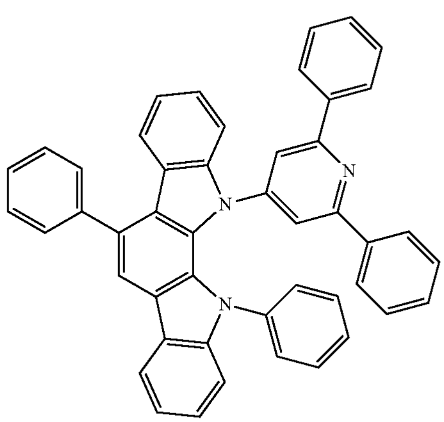
-continued
209
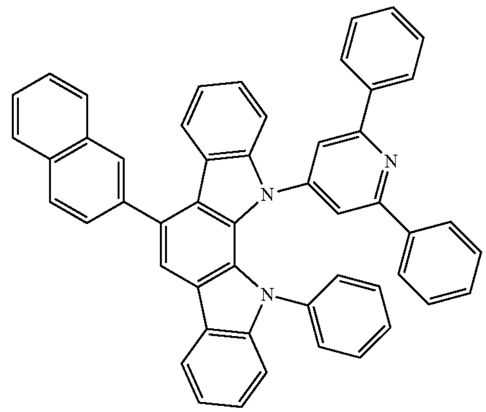
210
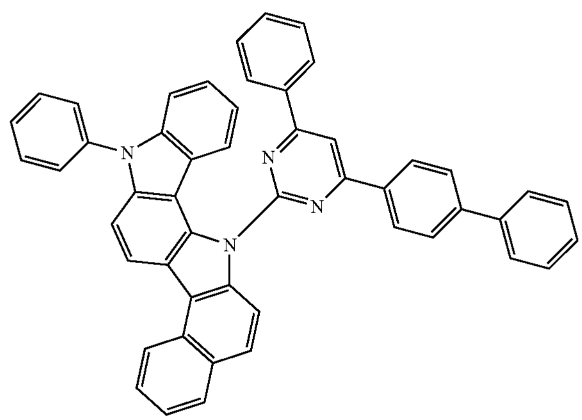
211
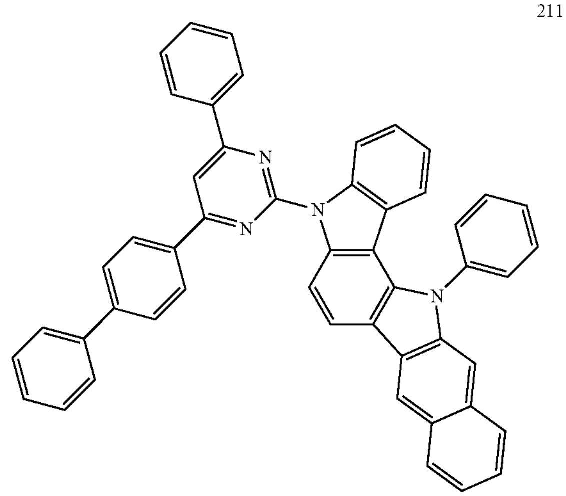

-continued
212
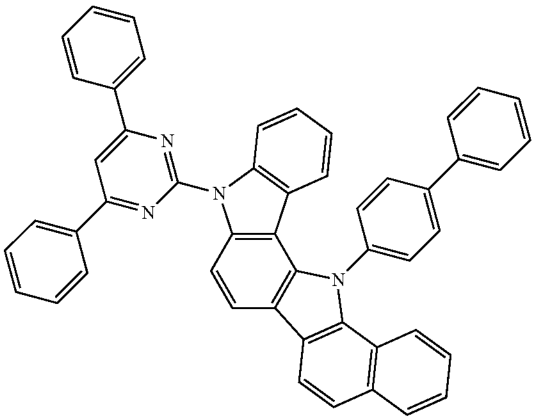
213
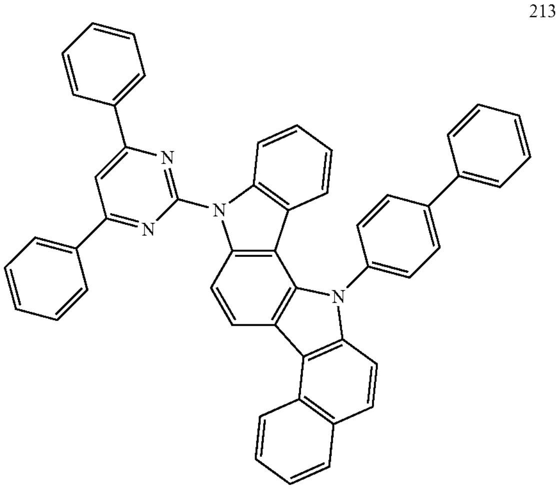
214
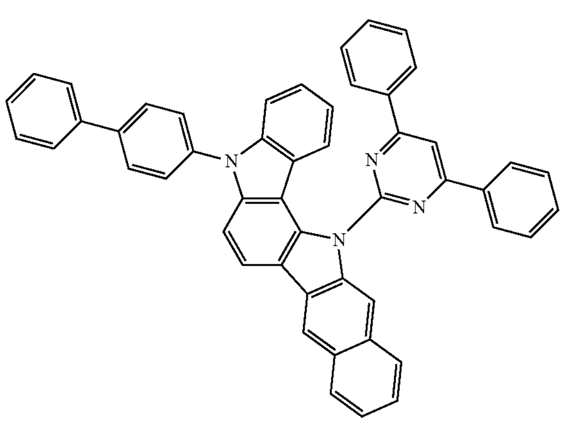
-continued
215
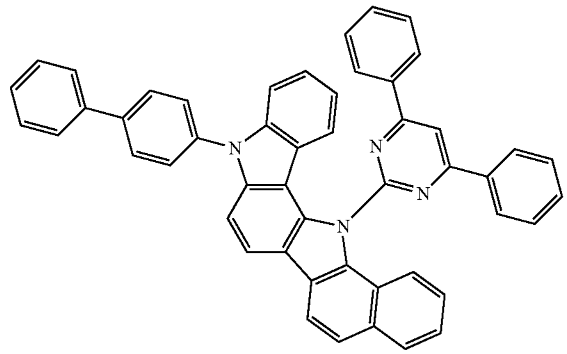
216
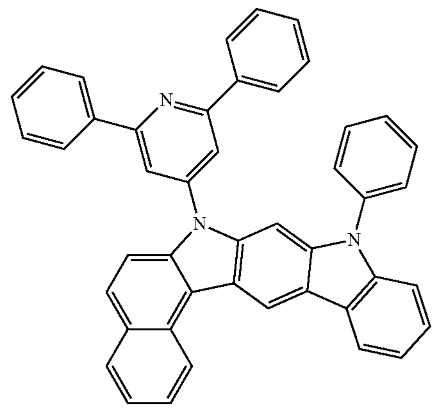
217
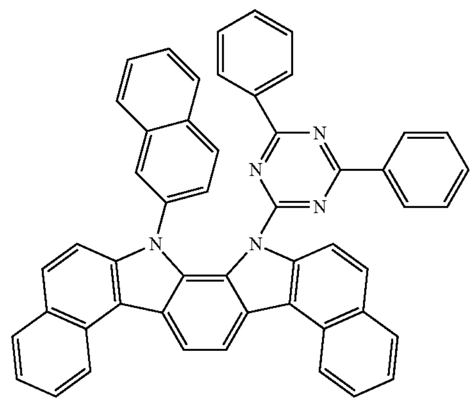
218
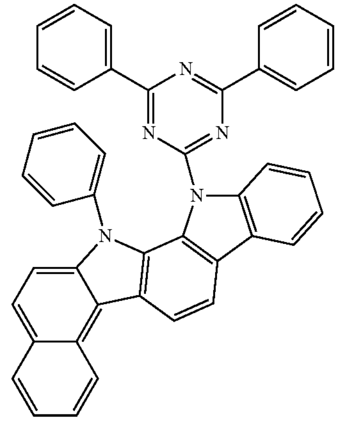

-continued
219
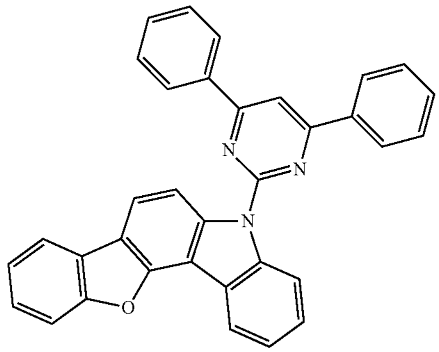
220
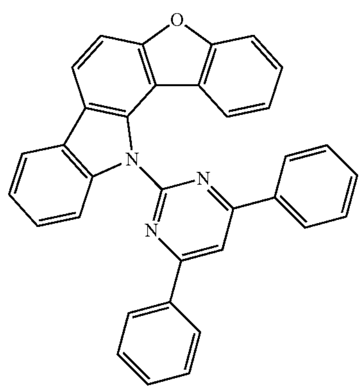
221
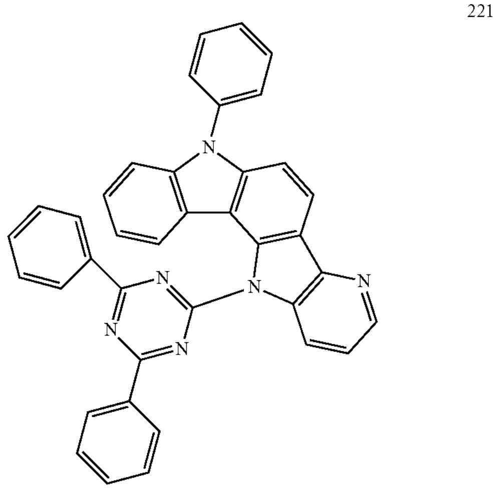
222
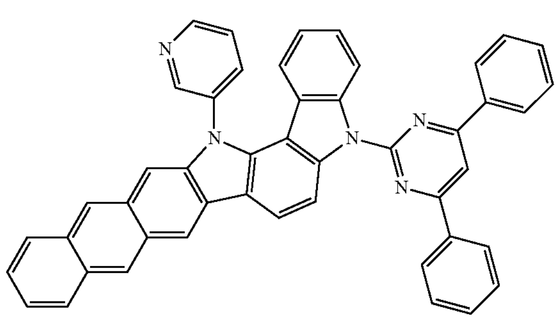
-continued
223
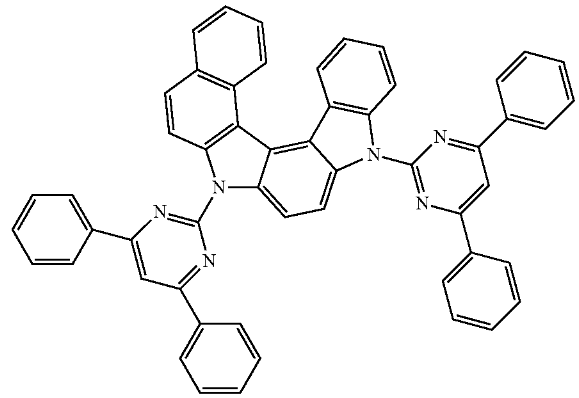
224
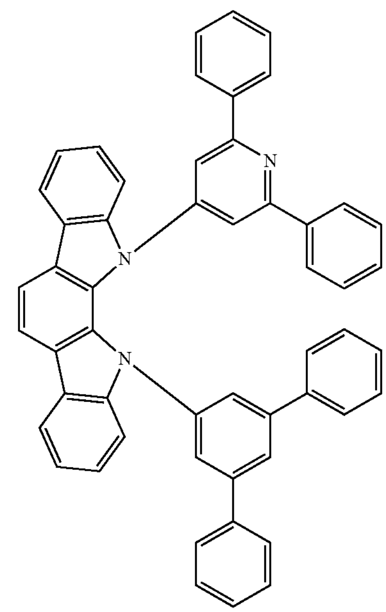
225
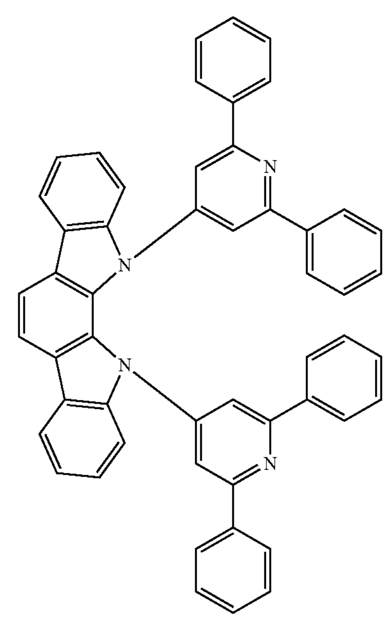

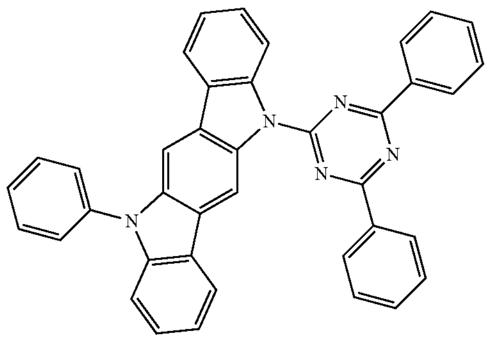
226
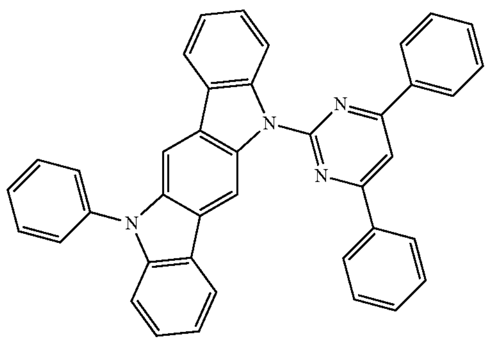
227
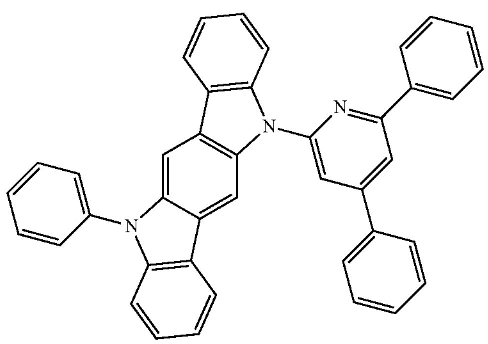
228
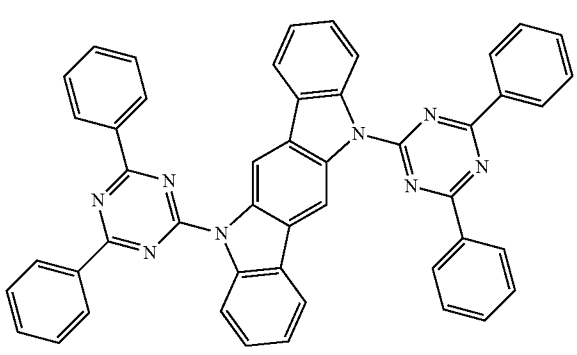
229
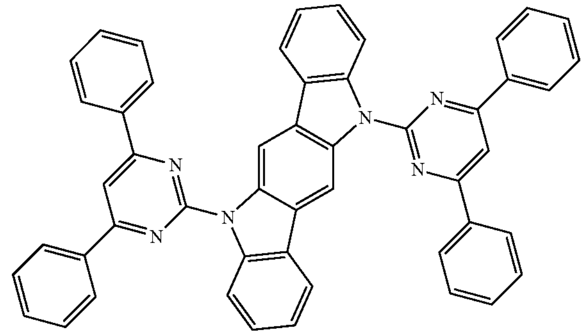
230
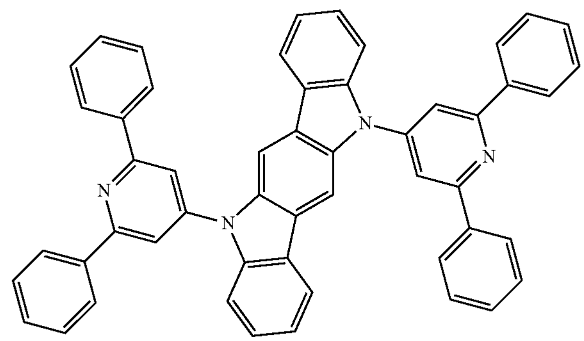
231
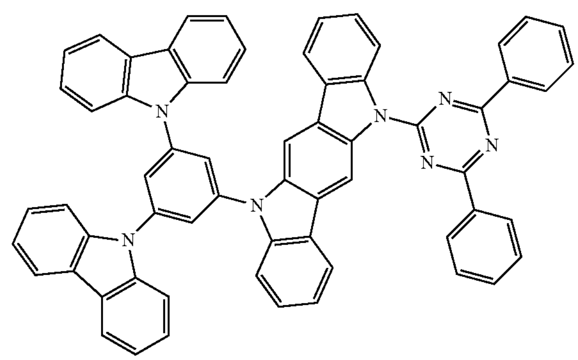
232
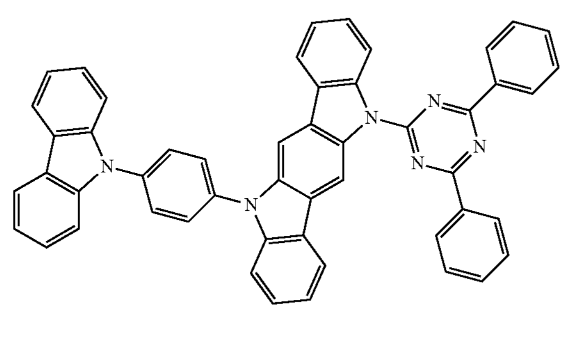
233

-continued

234

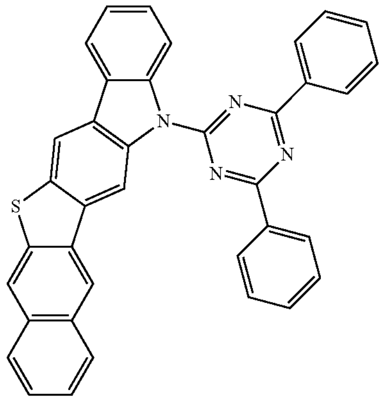

235

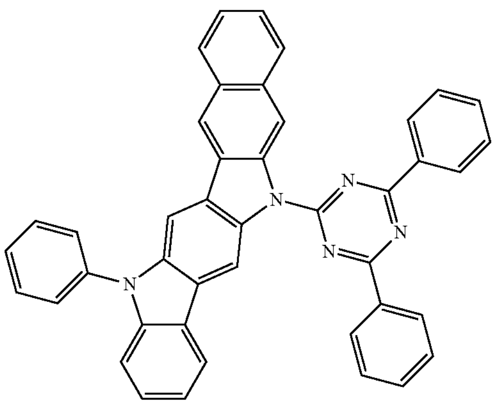

236

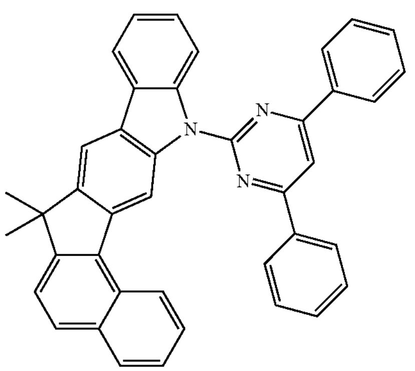

In an embodiment, $X_{11}$ may be $C(R_{11})$, $X_{12}$ may be $C(R_{12})$, $X_{13}$ may be $C(R_{13})$, $X_{14}$ may be $C(R_{14})$, $X_{15}$ may be $C(R_{15})$, $X_{16}$ may be $C(R_{16})$, $X_{17}$ may be $C(R_{17})$, $X_{18}$ may be $C(R_{18})$, $X_{19}$ may be $C(R_{19})$, $X_{20}$ may be $C(R_{20})$, $X_{21}$ may be $C(R_{21})$, $X_{22}$ may be $C(R_{22})$, $X_{23}$ may be $C(R_{23})$, and $X_{24}$ may be $C(R_{24})$.

In an embodiment, $Ar_{13}$ and $Ar_{14}$ may each independently be selected from i) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group; and ii) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group.

In an embodiment, $Ar_{13}$ and $Ar_{14}$ may each independently be represented by any one of Formulae 3-1 to 3-20:

3-1

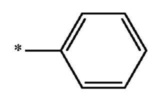

3-2

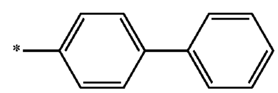

3-3

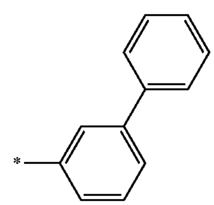

3-4

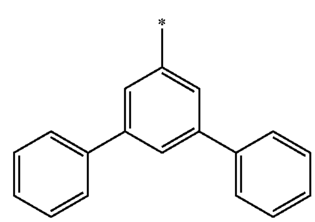

3-5

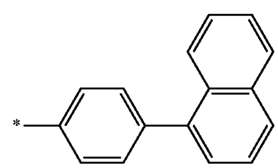

3-6

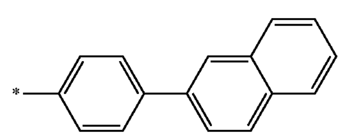

-continued
3-7
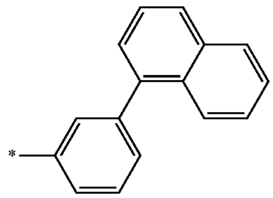
3-8
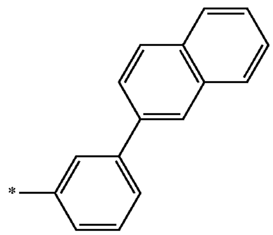
3-9
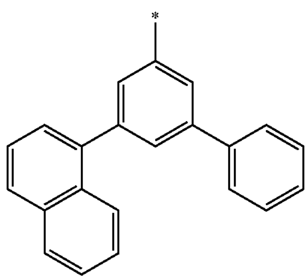
3-10
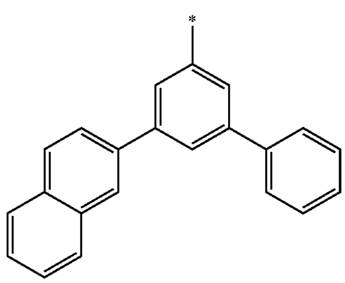
3-11
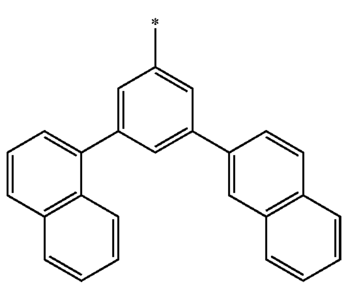
3-12
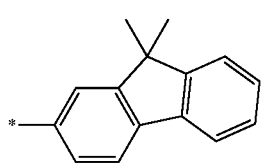
-continued
3-13
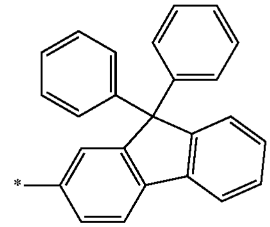
3-14
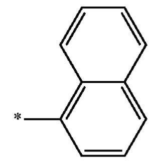
3-15
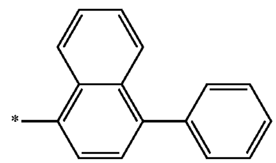
3-16
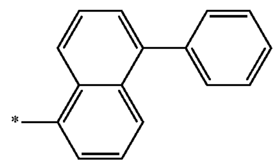
3-17
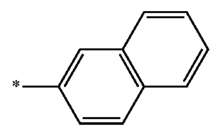
3-18
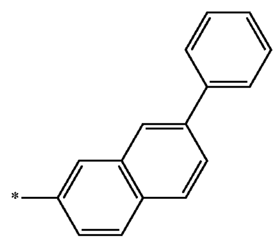
3-19
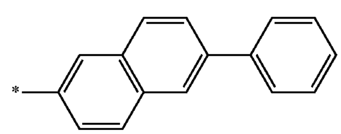
3-20
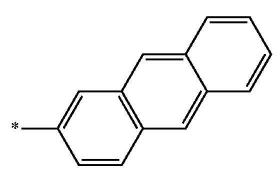
wherein, in Formulae 3-1 to 3-20, * represents a bonding site to N of Formula 2(1) or Formula 2(2).
In an embodiment, $Z_1$ and $Z_2$ may each independently be selected from
i) a $C_1$-$C_{20}$ alkyl group;
ii) a $C_1$-$C_{20}$ alkyl group substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group;

iii) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group; and iv) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group.

In an embodiment, $Z_1$ and $Z_2$ may each independently be selected from a methyl group, an ethyl group, a propyl group, a butyl group, a pentyl group, a hexyl group, a heptyl group, and a compound represented by any one of Formulae 3-1 to 3-20:

3-1

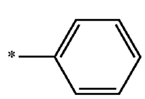

3-2

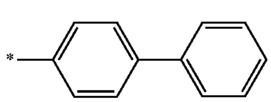

-continued 3-3

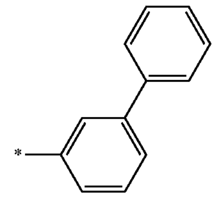

3-4

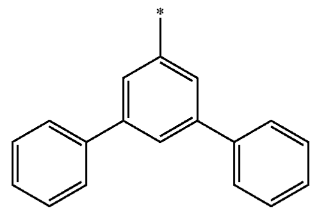

3-5

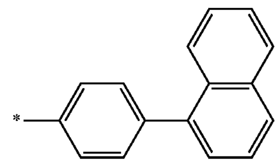

3-6

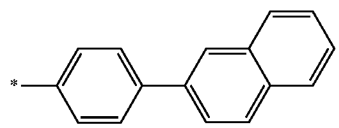

3-7

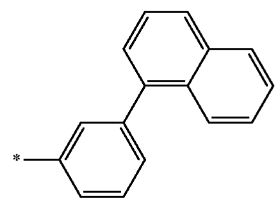

3-8

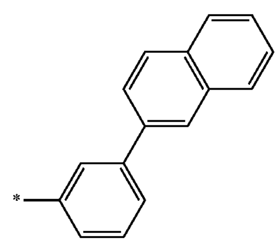

3-9

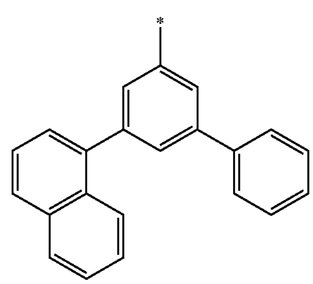

-continued 3-10

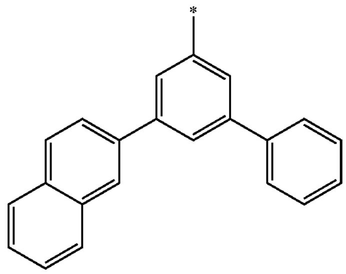

3-11

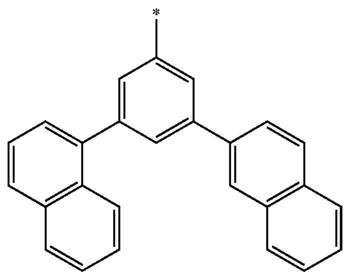

3-12

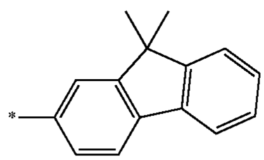

3-13

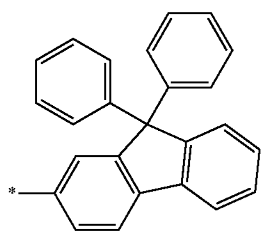

3-14

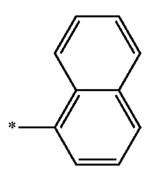

3-15

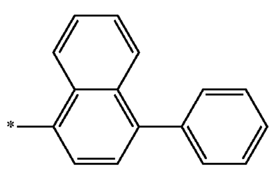

3-16

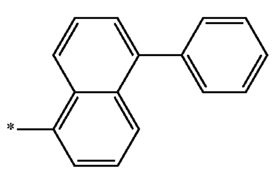

3-17

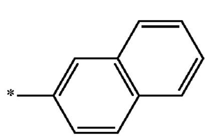

-continued 3-18

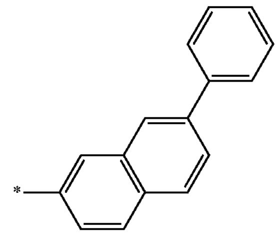

3-19

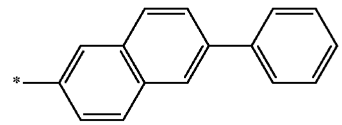

3-20

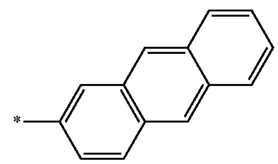

wherein, in Formulae 3-1 to 3-20, * represents a carbon atom of a fluorene ring in Formula 2(1) or Formula 2(2).

In an embodiment, $Z_3$, $Z_4$, and $R_{11}$ to $R_{24}$ may each independently be selected from hydrogen, deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, and a $C_1$-$C_{20}$ alkyl group.

In an embodiment, $Z_3$, $Z_4$, and $R_{11}$ to $R_{24}$ may each independently be selected from hydrogen, deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a methyl group, an ethyl group, a propyl group, a butyl group, a pentyl group, a hexyl group, a heptyl group, and a compound represented by any one of Formulae 3-1 to 3-20:

3-1

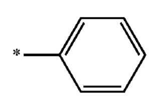

3-2

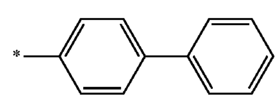

3-3

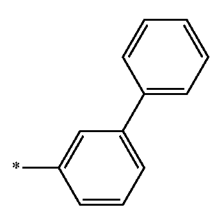

-continued
3-4
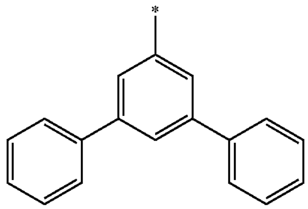
3-5
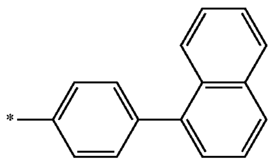
3-6
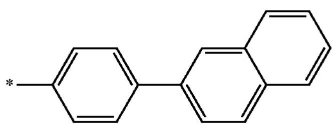
3-7
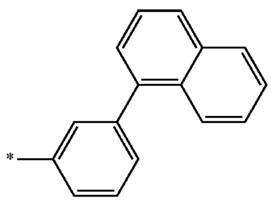
3-8
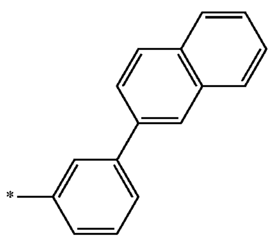
3-9
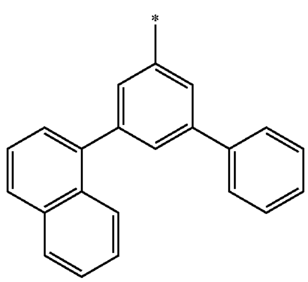
3-10
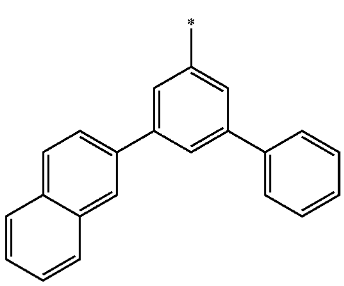
-continued
3-11
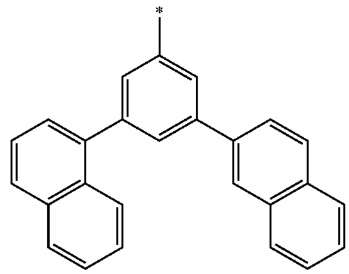
3-12
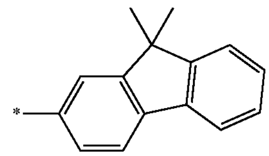
3-13
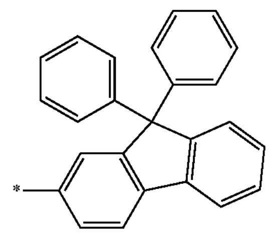
3-14
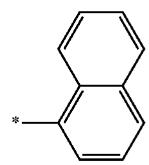
3-15
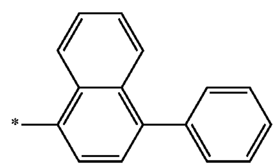
3-16
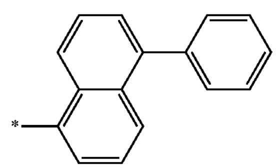
3-17
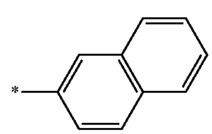
3-18
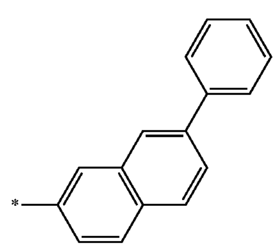

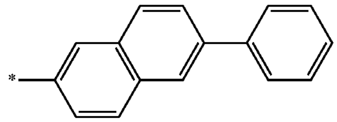
3-19
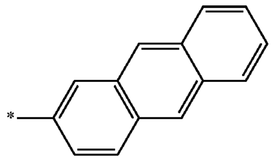
3-20
In an embodiment, the hole-transporting material may be represented by any one of Formulae 2a and 2b:
<Formula 2a>
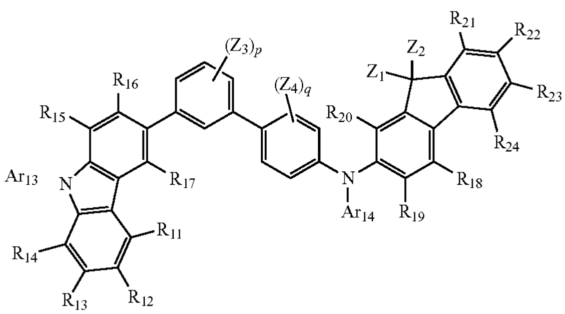
<Formula 2b>
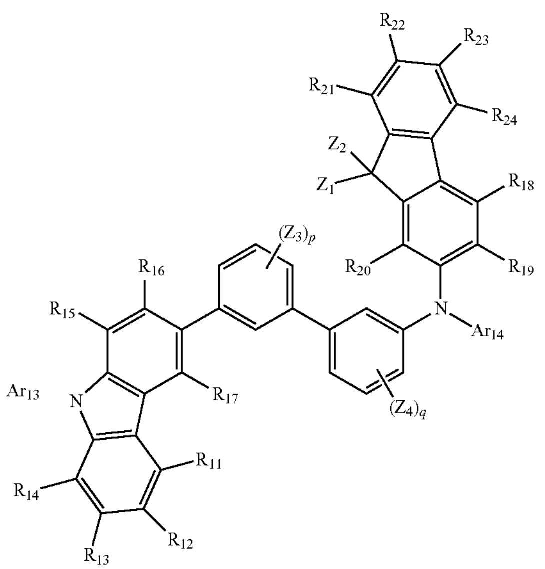
wherein, in Formula 2a or 2b,
$Ar_{13}$ and $Ar_{14}$ are each independently represented by any one of Formulae 3-1 to 3-20:
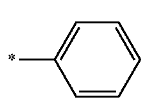
3-1
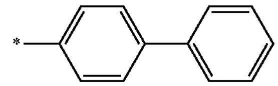
3-2
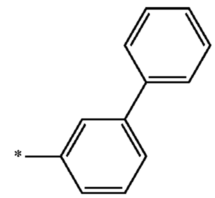
3-3
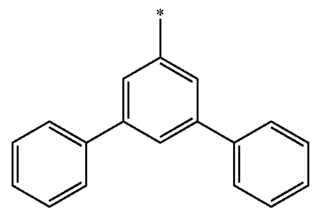
3-4
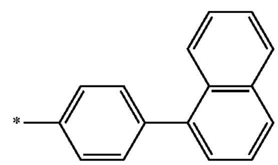
3-5
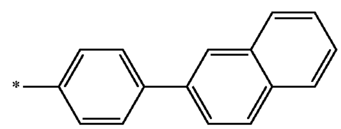
3-6
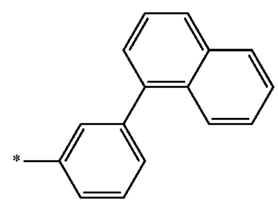
3-7
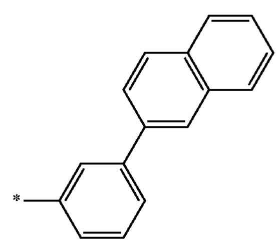
3-8
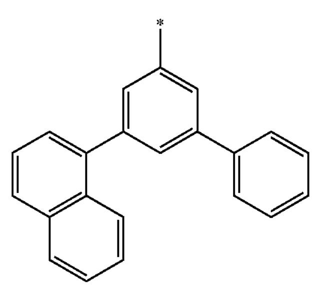
3-9

-continued 3-10

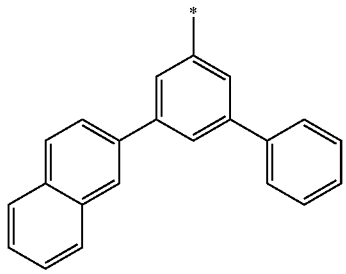

3-11

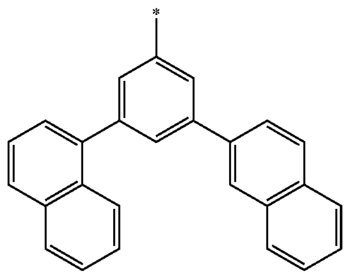

3-12

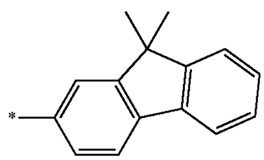

3-13

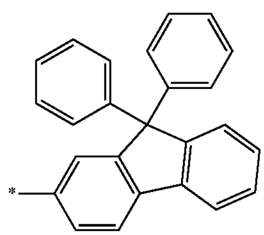

3-14

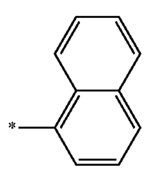

3-15

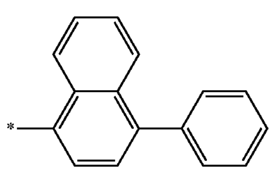

3-16

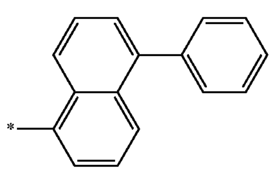

3-17

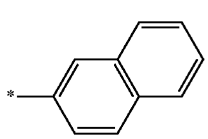

-continued 3-18

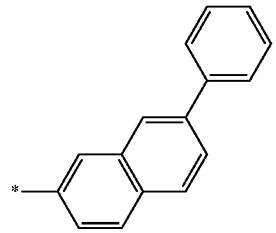

3-19

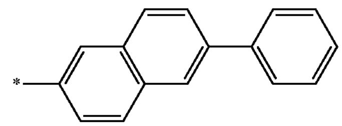

3-20

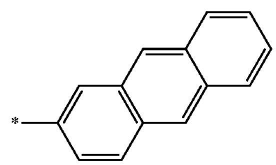

$Z_1$ and $Z_2$ are each independently represented by any one of a $C_1$-$C_{20}$ alkyl group and Formulae 3-1 to 3-20;

$Z_3$, $Z_4$, and $R_{11}$ to $R_{24}$ are each independently selected from hydrogen, deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{20}$ alkyl group, and compounds represented by any one of Formulae 3-1 to 3-20; and p and q are each independently an integer of 1 to 4.

In an embodiment, the hole-transporting material may be represented by any one of Compounds 6-1 to 6-144:

6-1

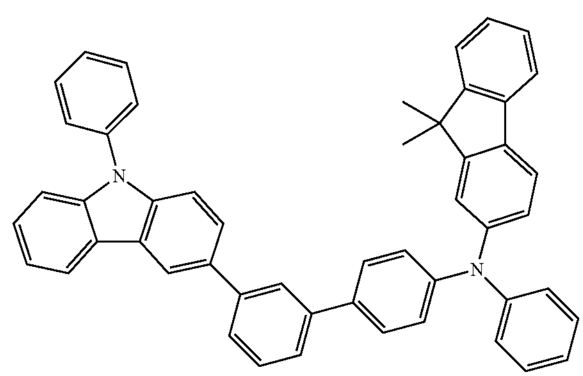

-continued
6-2
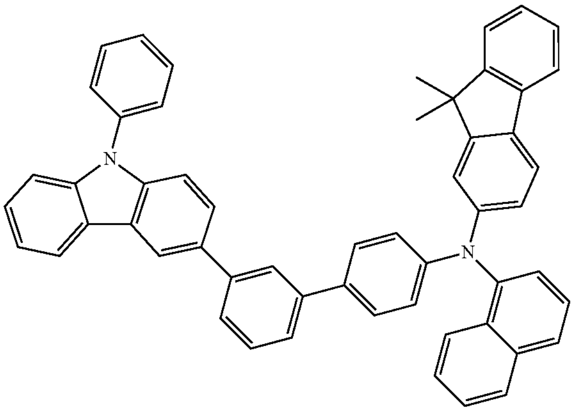
6-3
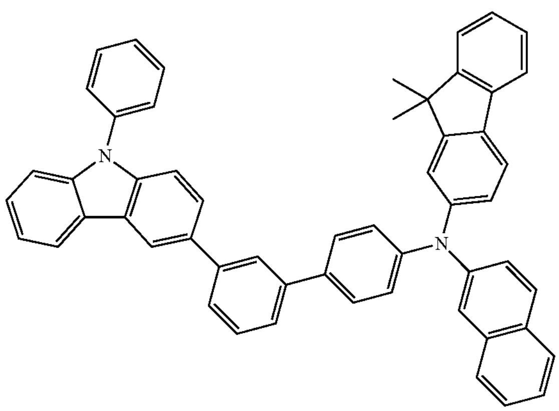
6-4
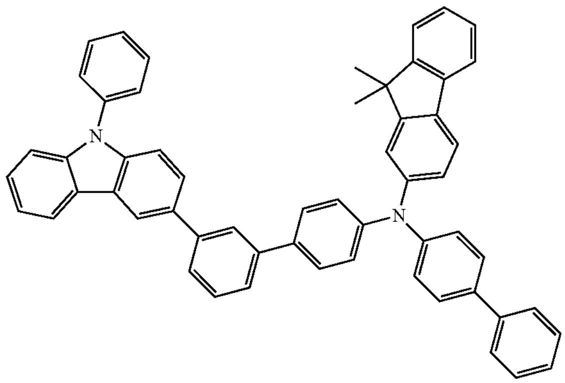
-continued
6-5
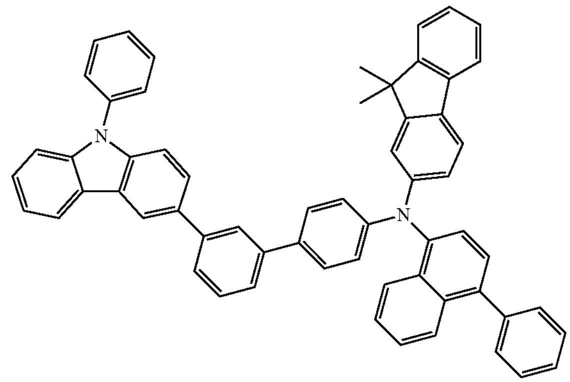
6-6
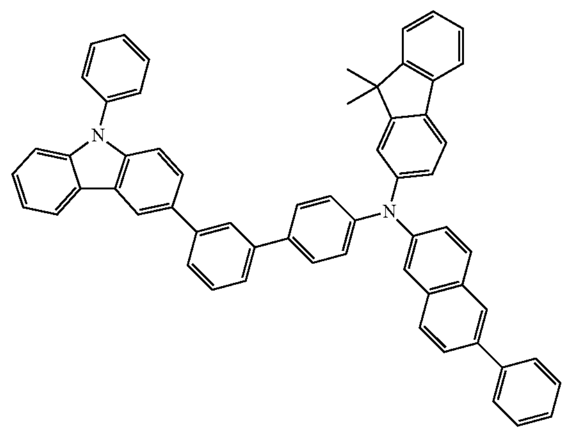
6-7
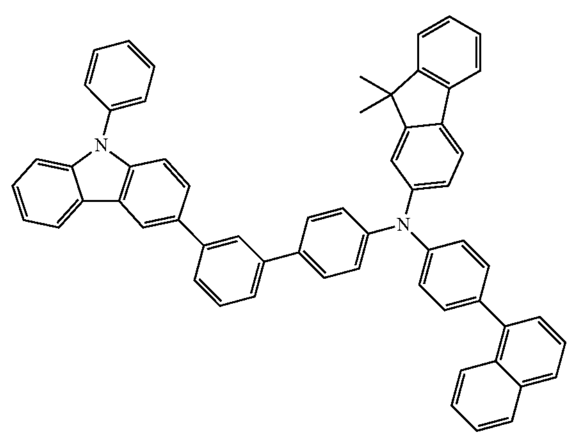

6-8
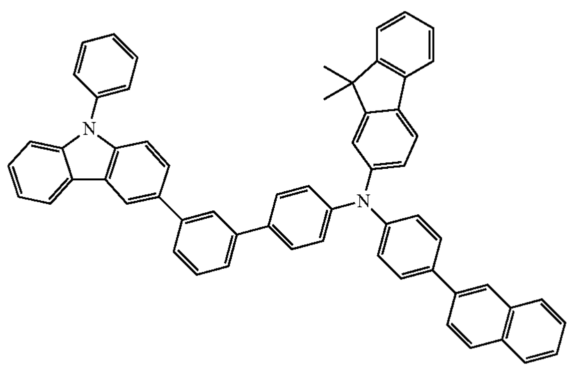
6-9
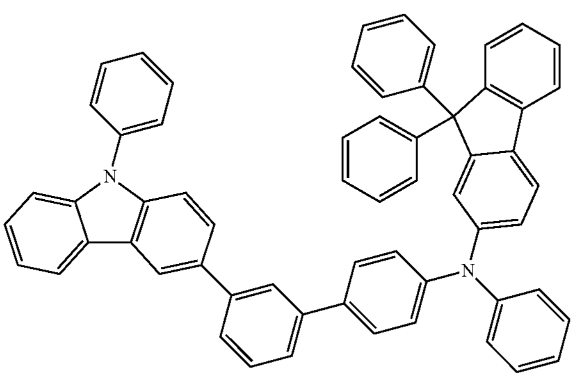
6-10
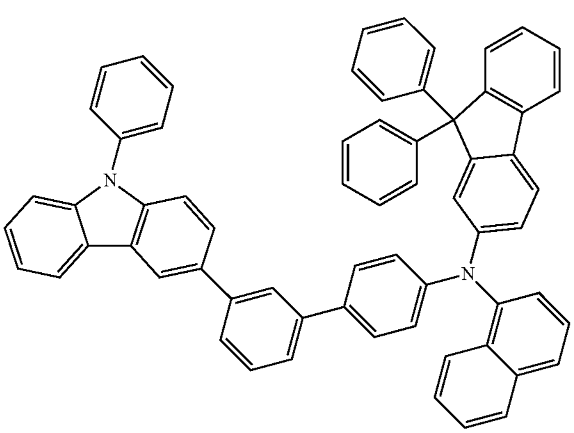
6-11
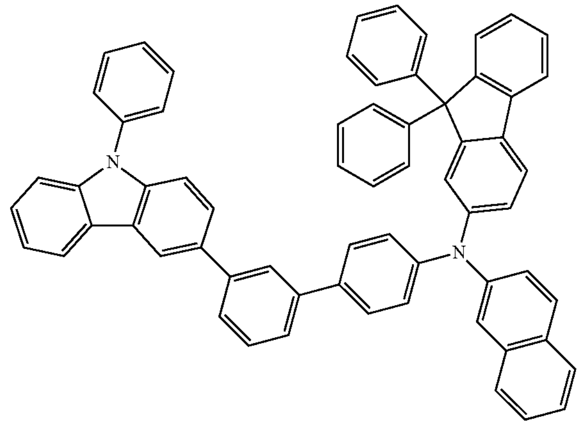
6-12
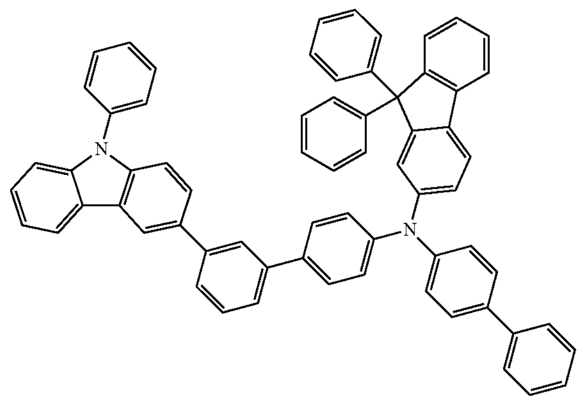
6-13
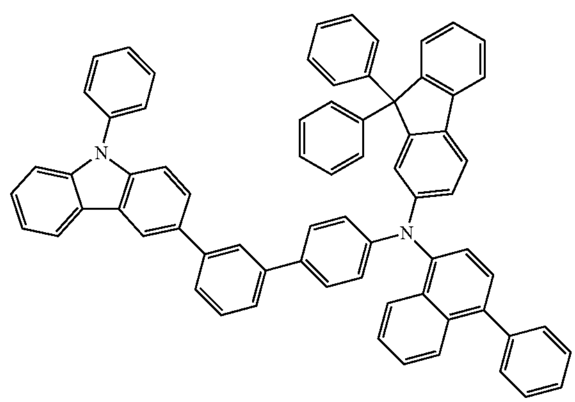

-continued
6-14
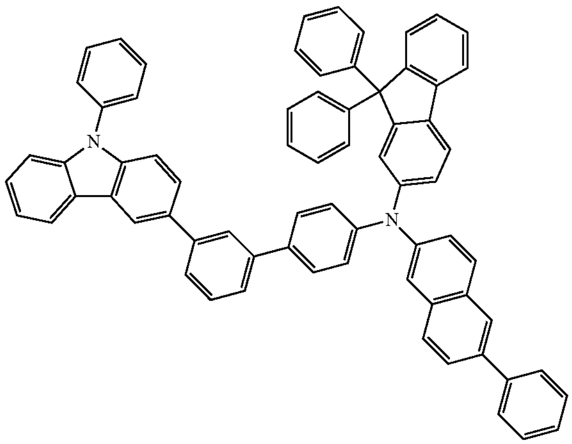
6-15
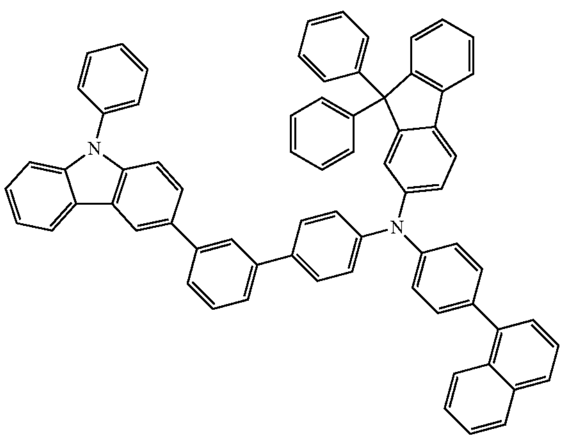
6-16
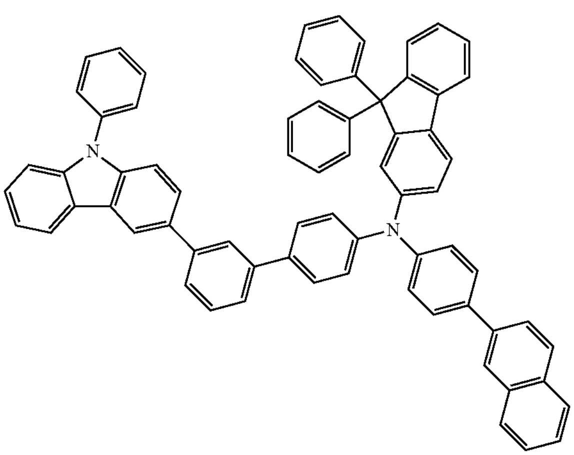
-continued
6-17
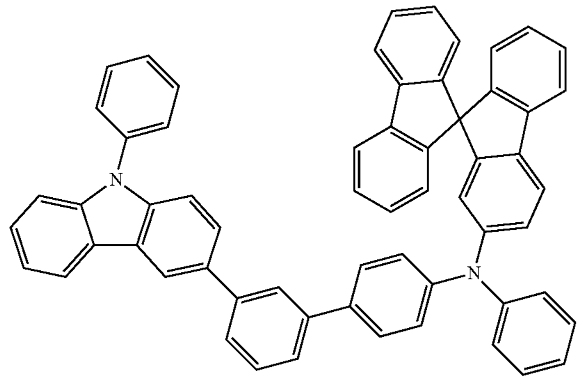
6-18
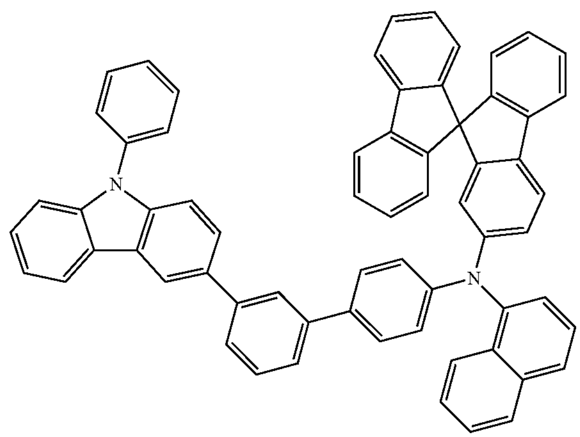
6-19
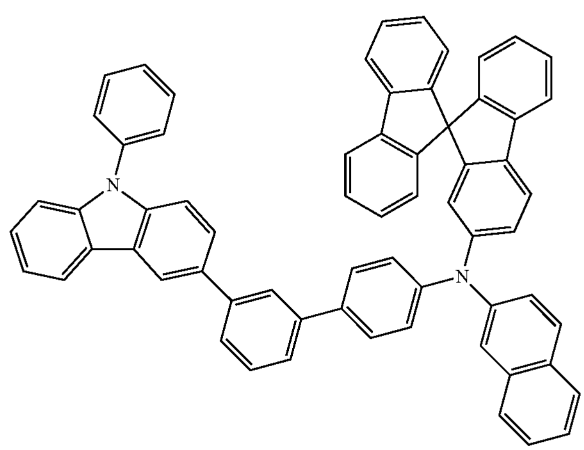

-continued
6-20
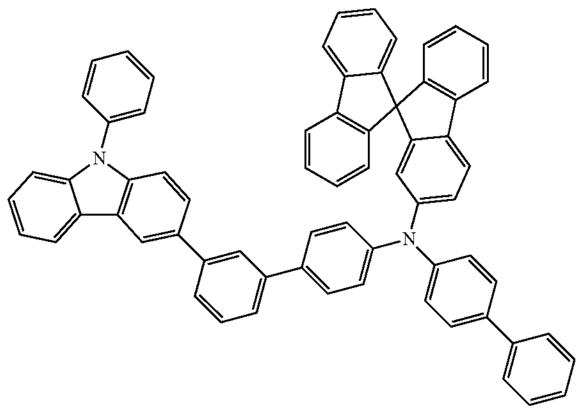
6-21
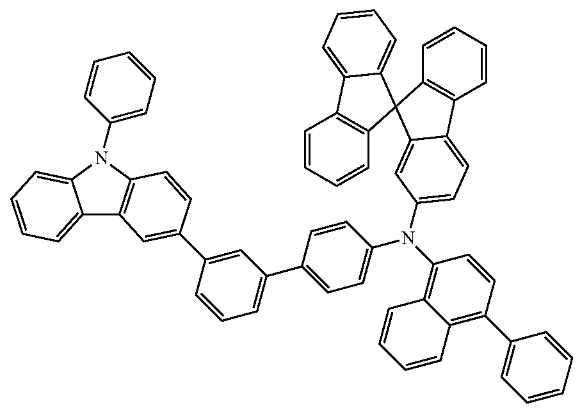
6-22
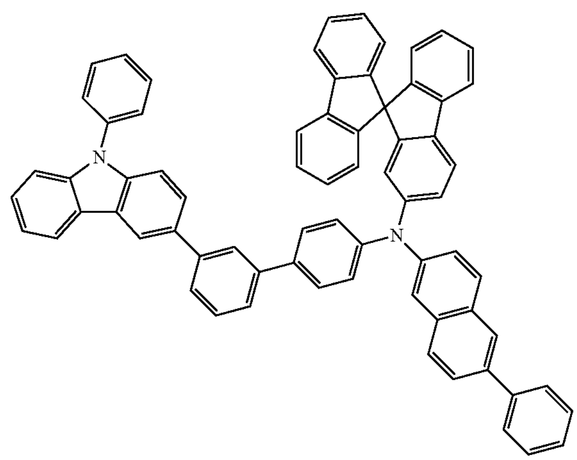
-continued
6-23
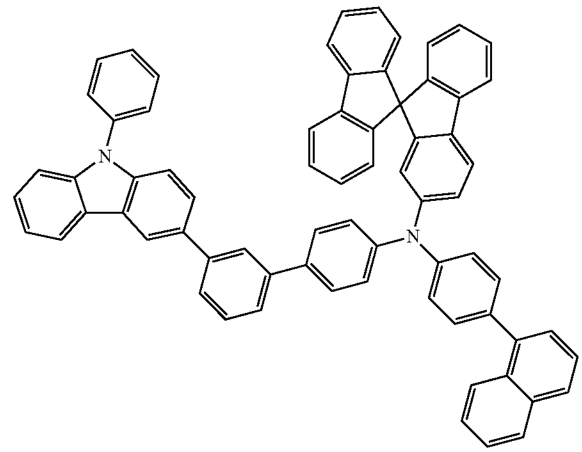
6-24
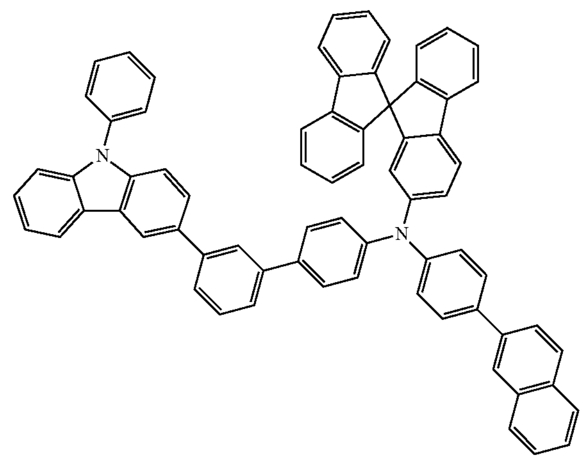
6-25
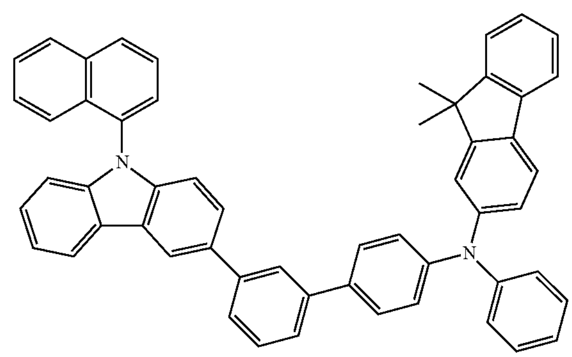

-continued
6-26
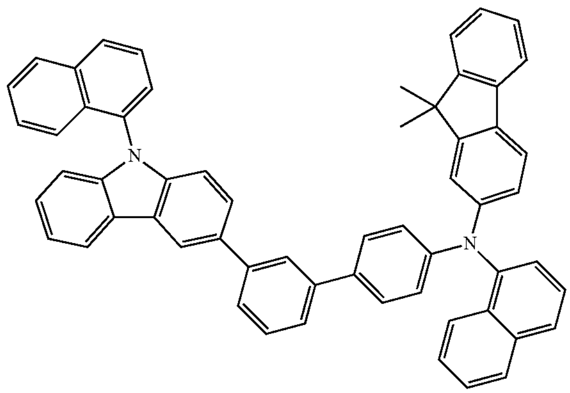
6-27
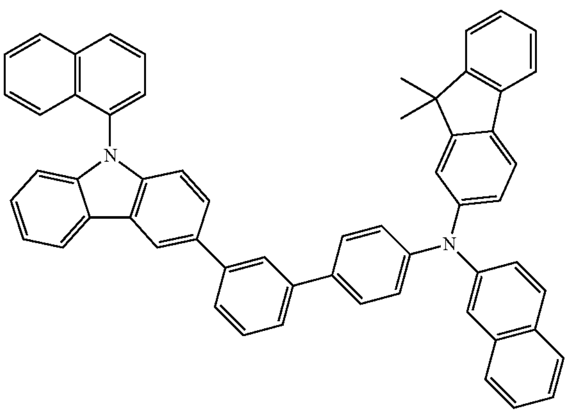
6-28
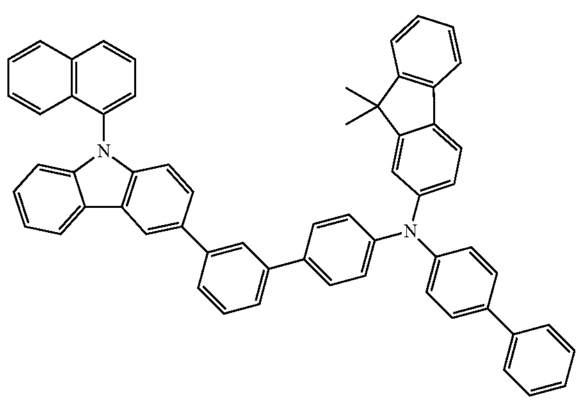
6-29
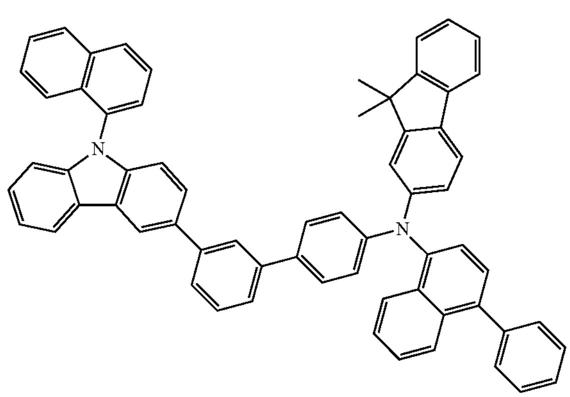
-continued
6-30
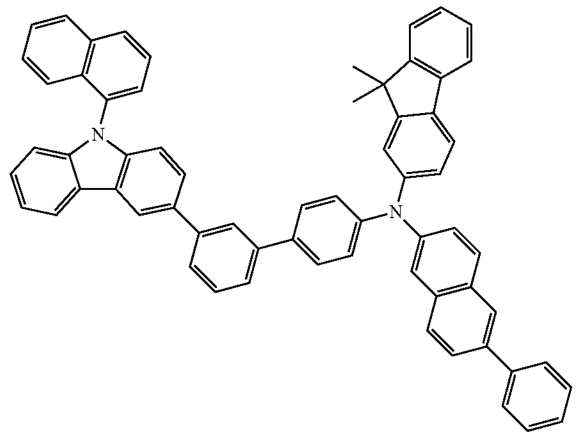
6-31
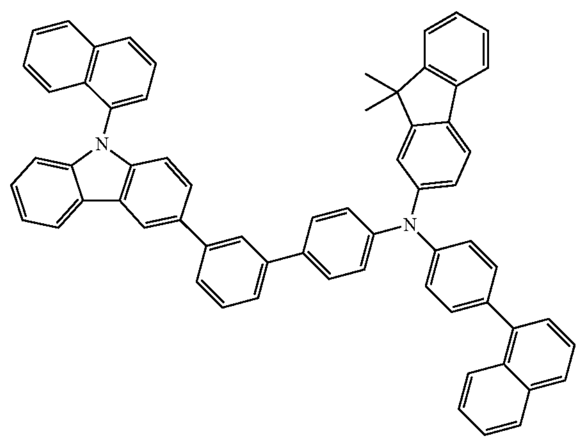
6-32
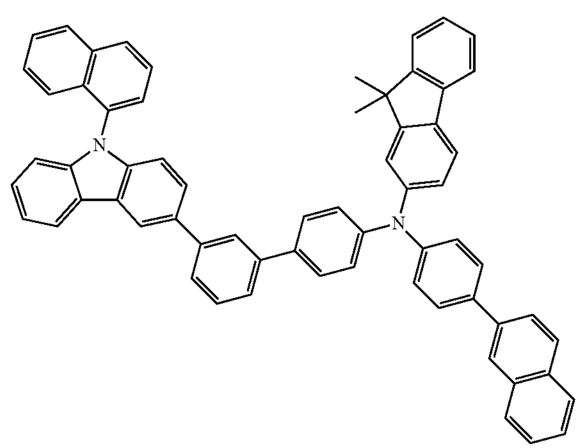

-continued
6-33
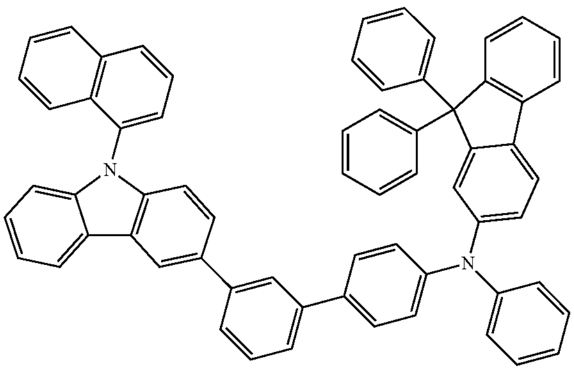
6-34
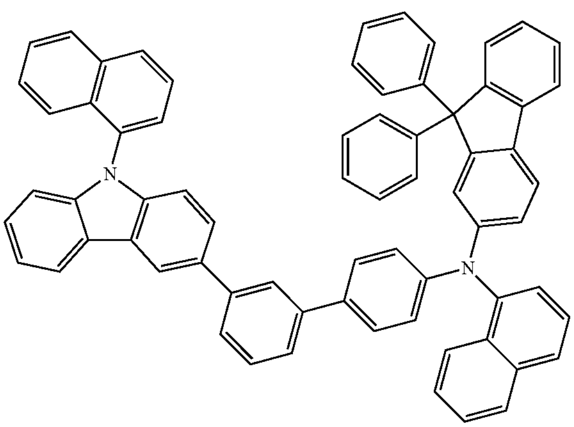
6-35
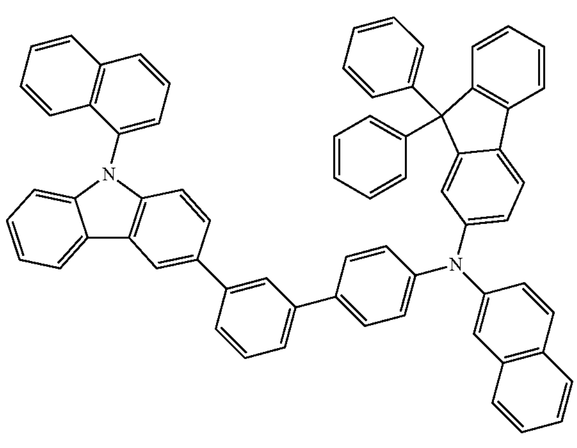
-continued
6-36
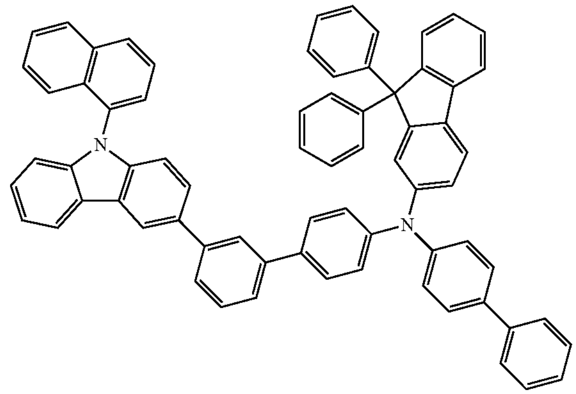
6-37
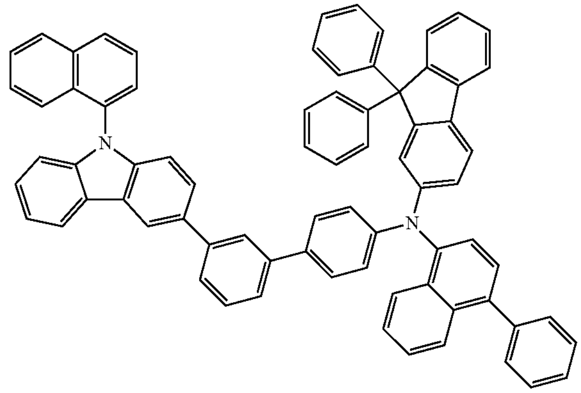
6-38
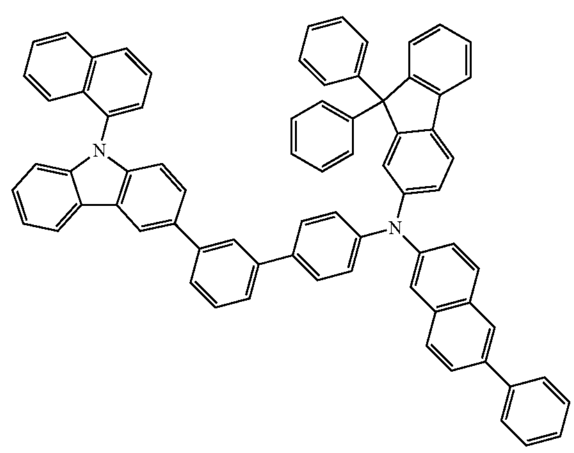

-continued
6-39
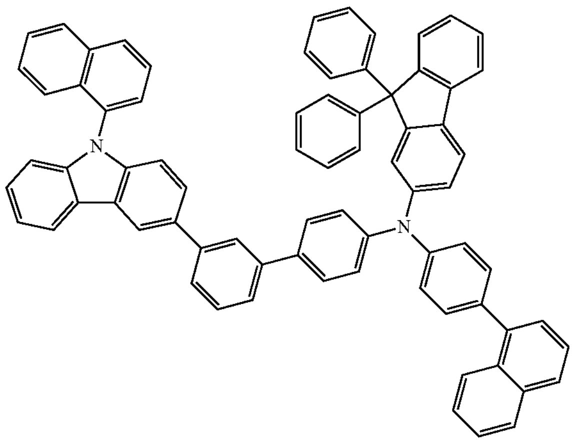
6-40
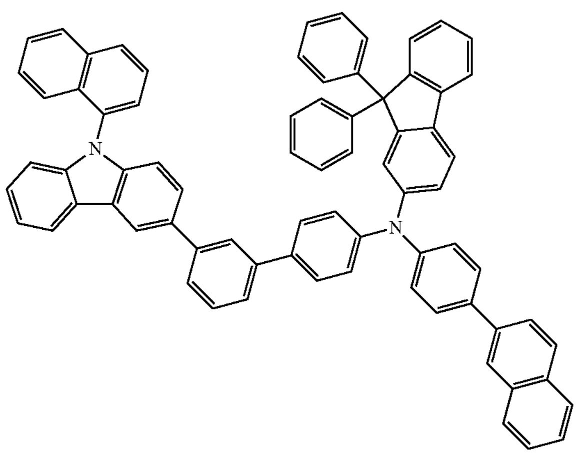
6-41
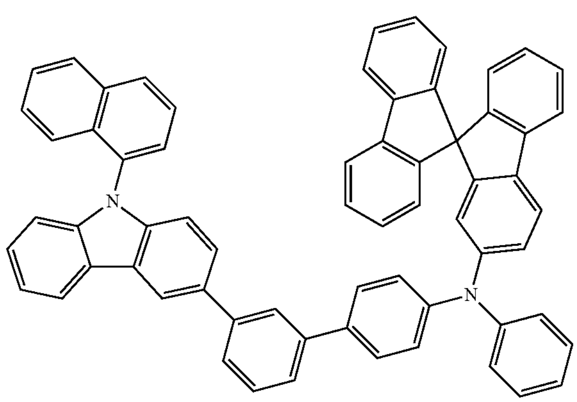
-continued
6-42
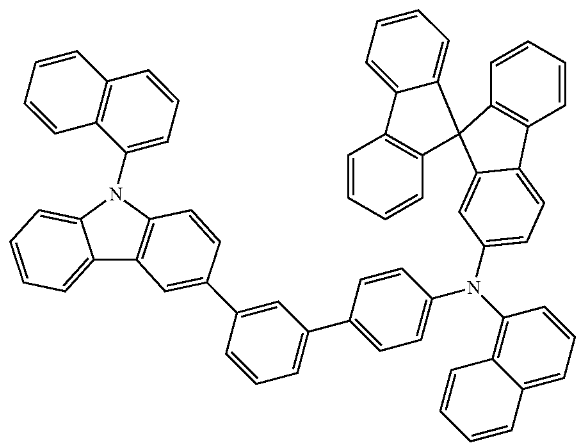
6-43
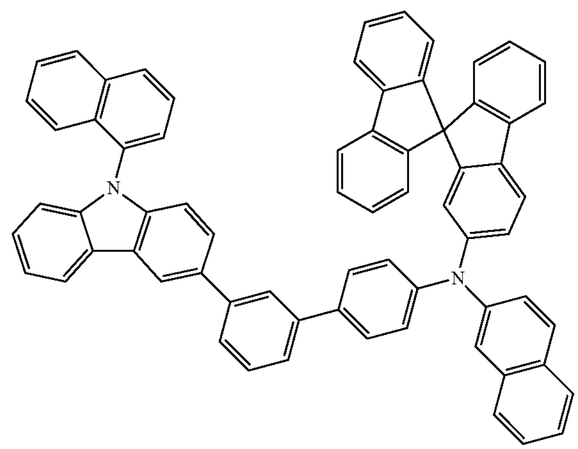
6-44
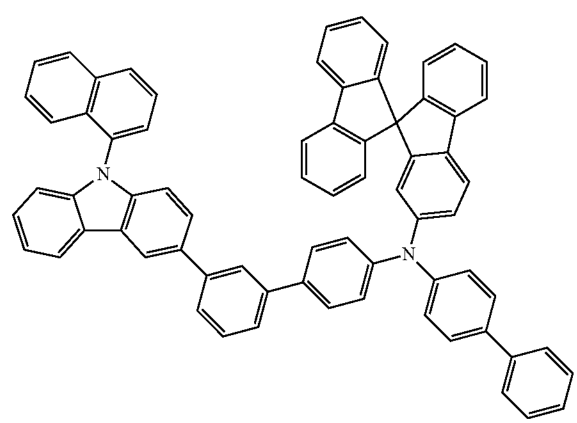

-continued
6-45
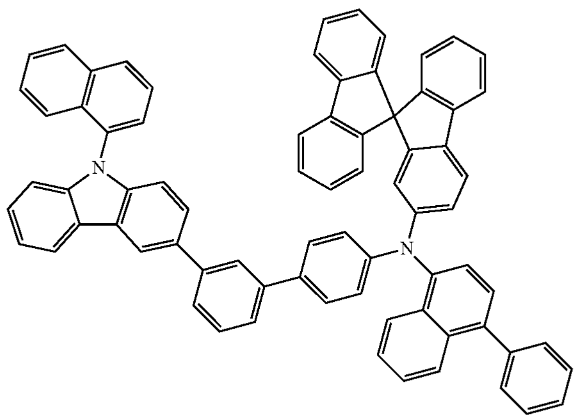
6-46
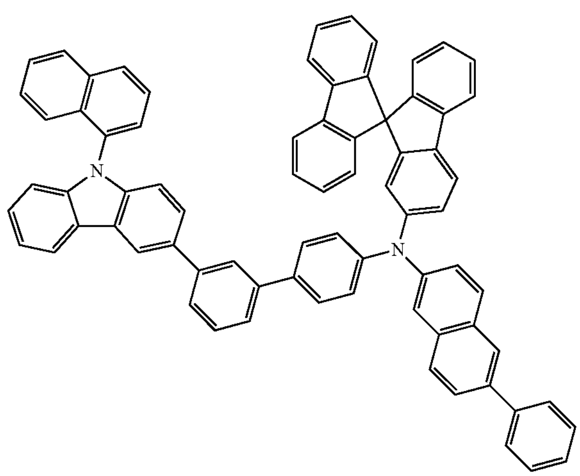
6-47
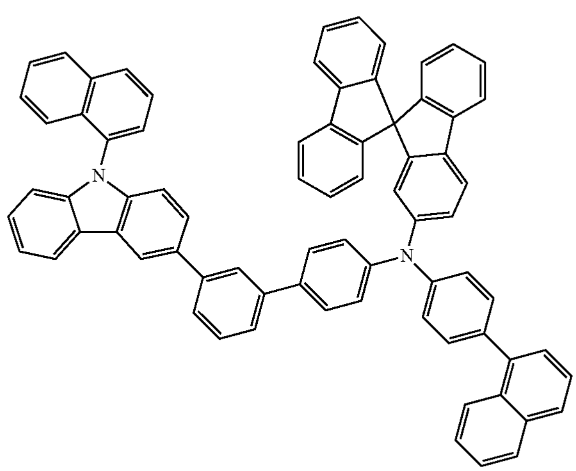
-continued
6-48
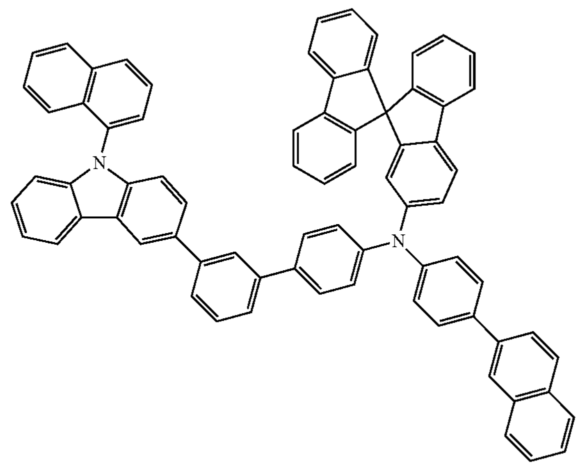
6-49
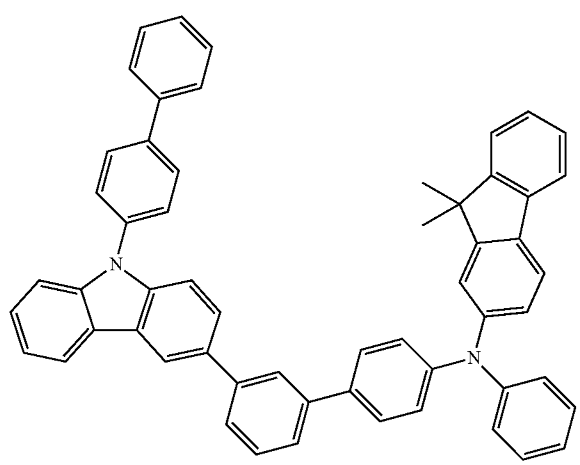
6-50
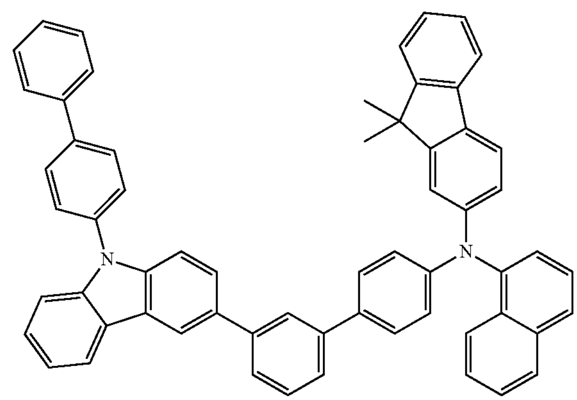

-continued
6-51
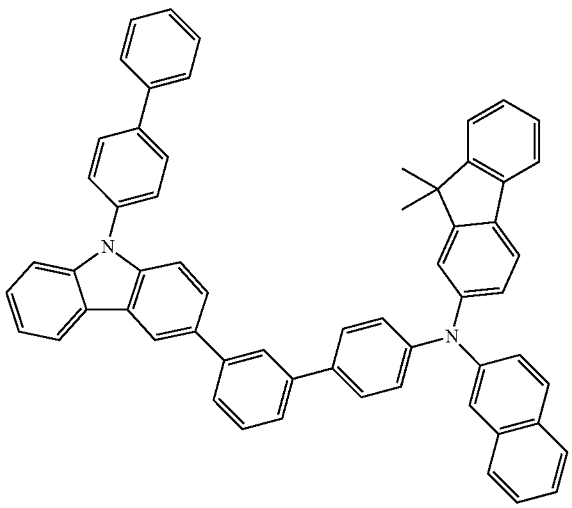
6-52
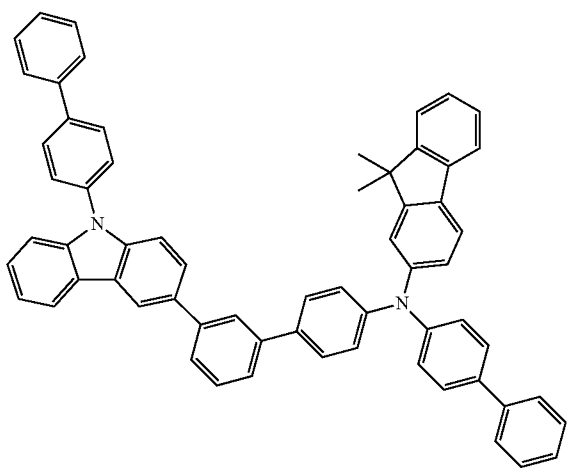
6-53
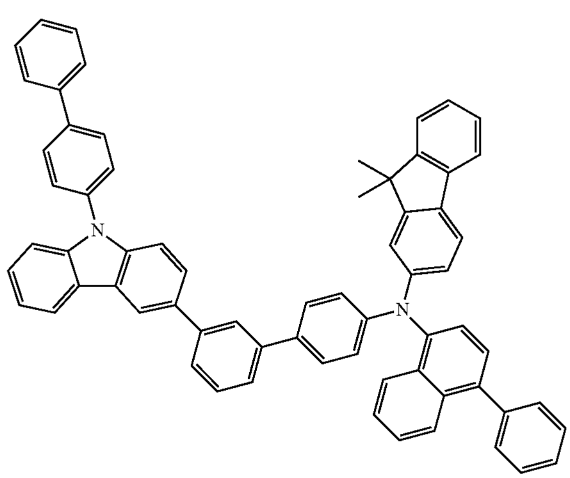
-continued
6-54
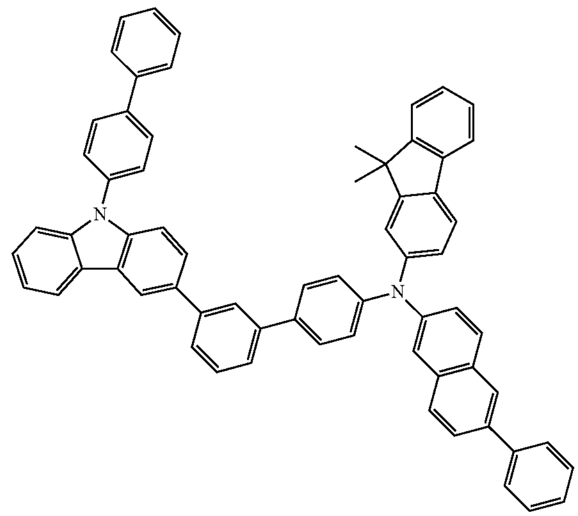
6-55
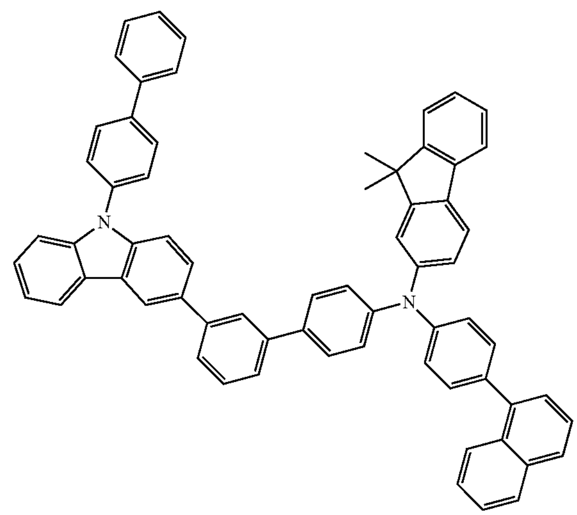
6-56
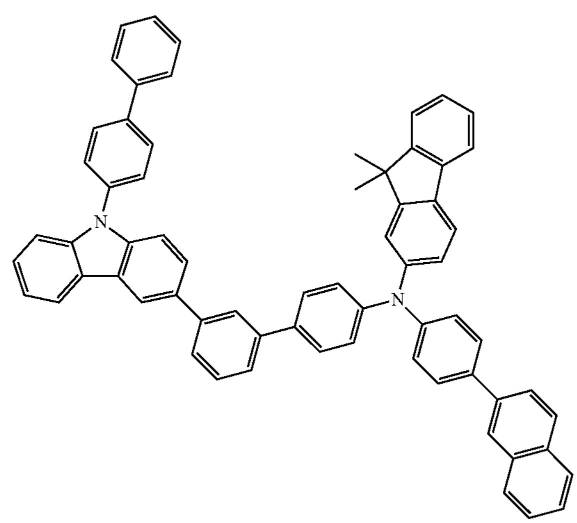

-continued
6-57
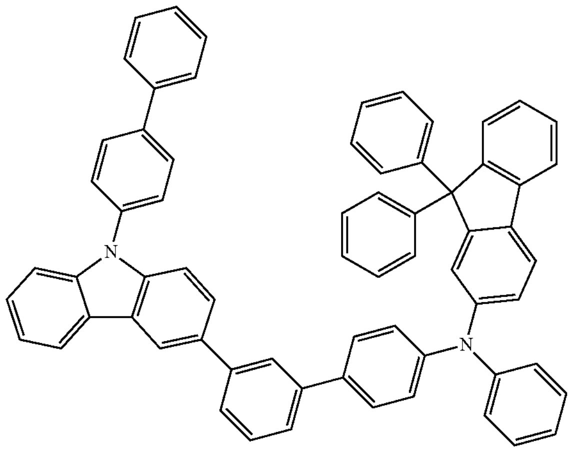
6-58
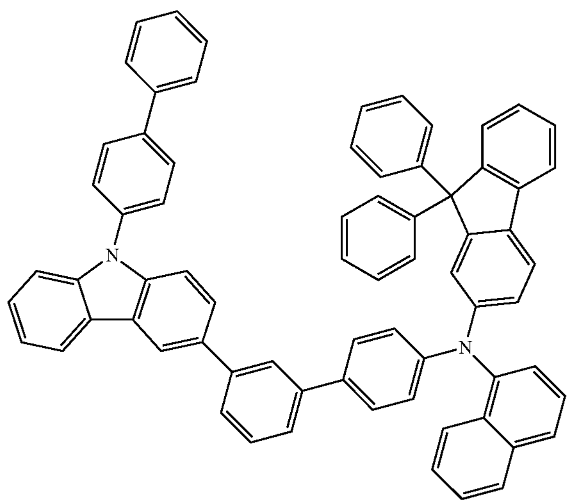
6-59
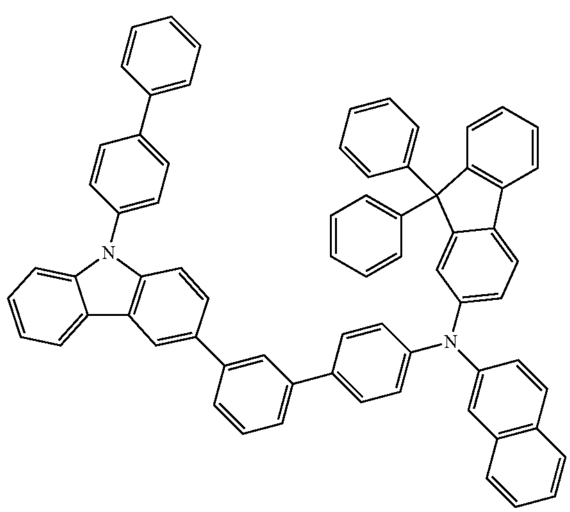
-continued
6-60
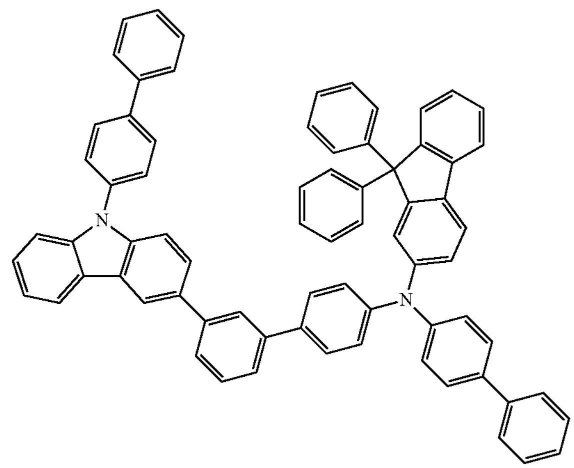
6-61
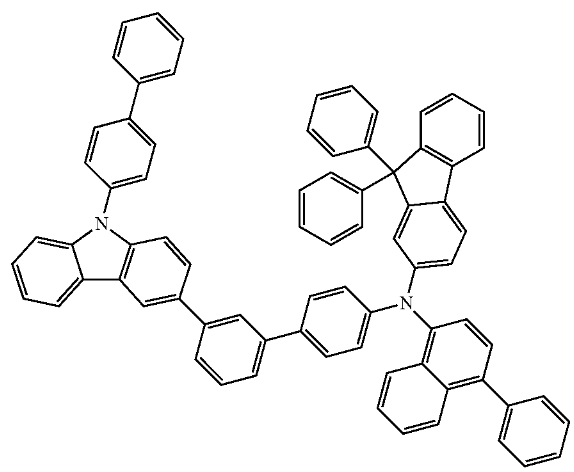
6-62
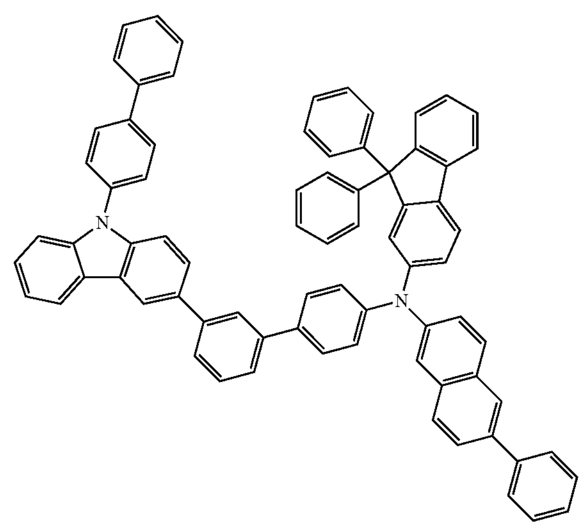

-continued
6-63
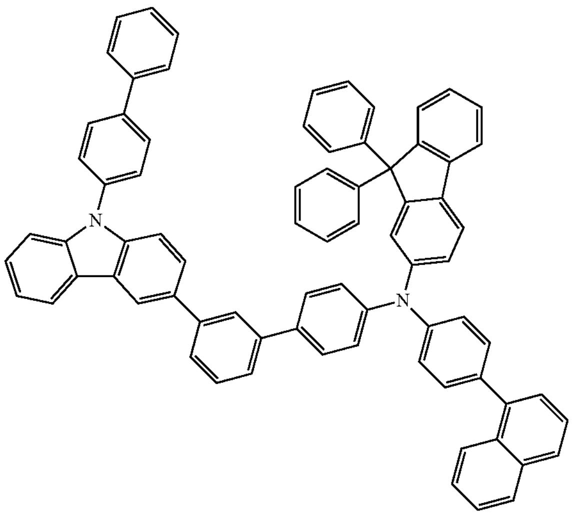
6-64
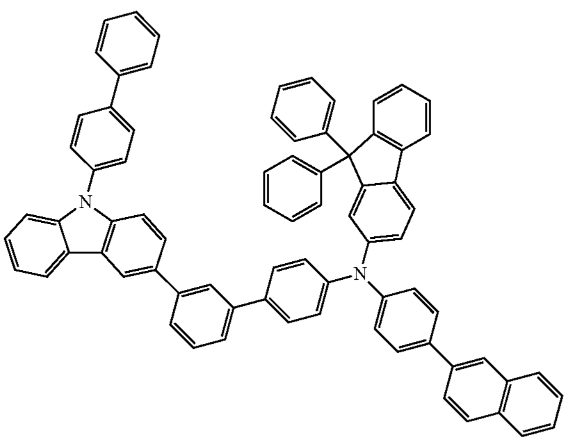
6-65
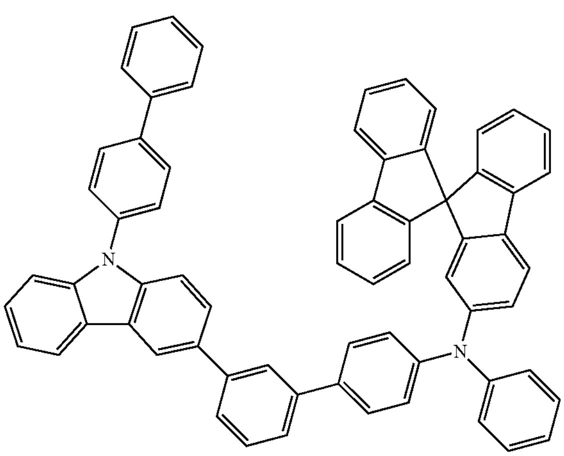
-continued
6-66
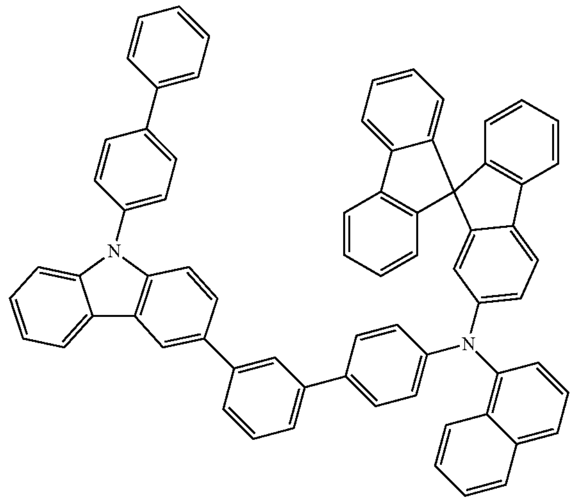
6-67
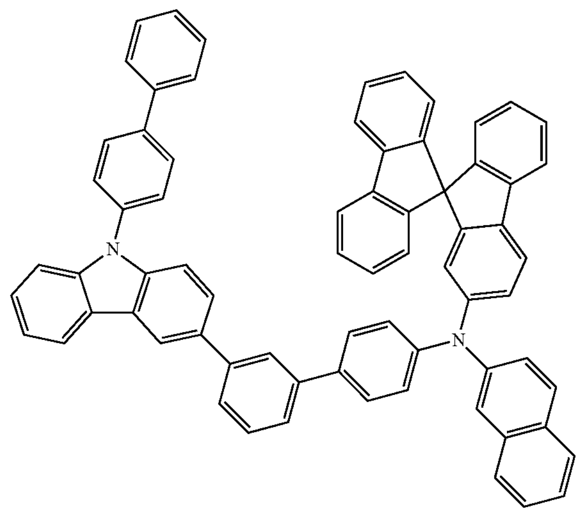
6-68
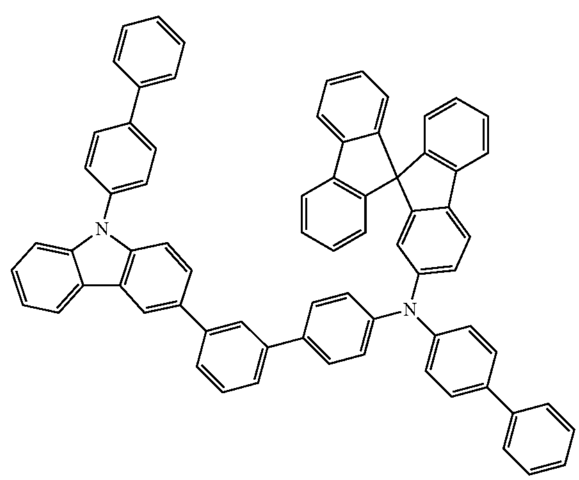

6-69
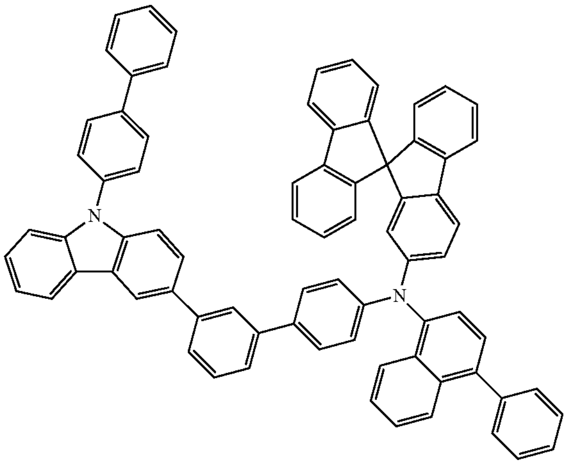
6-70
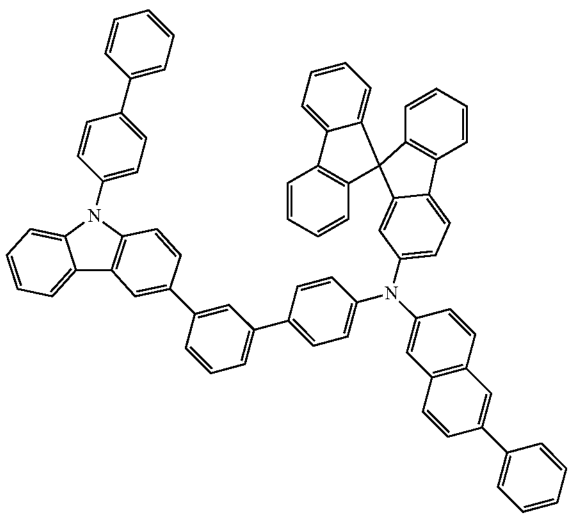
6-71
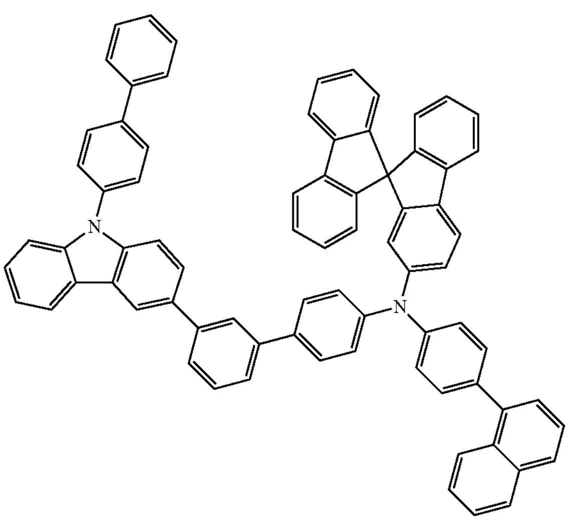
6-72
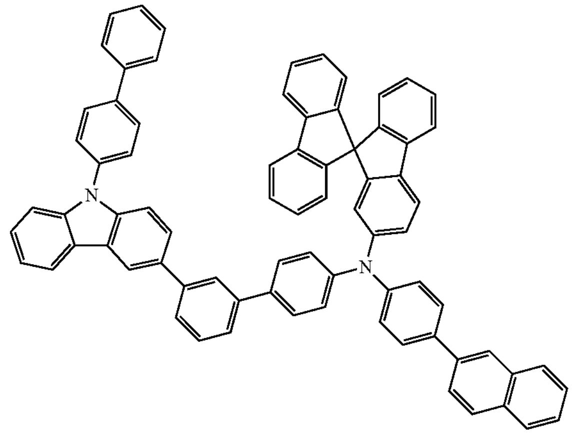
6-73
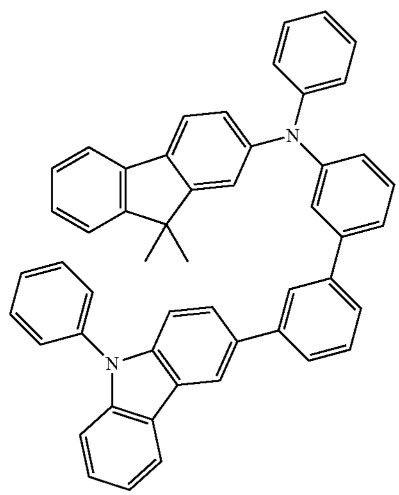
6-74
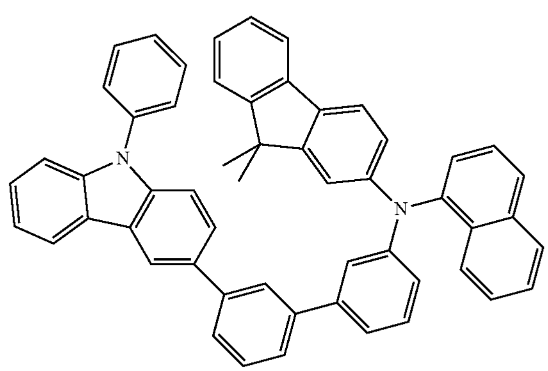

6-75
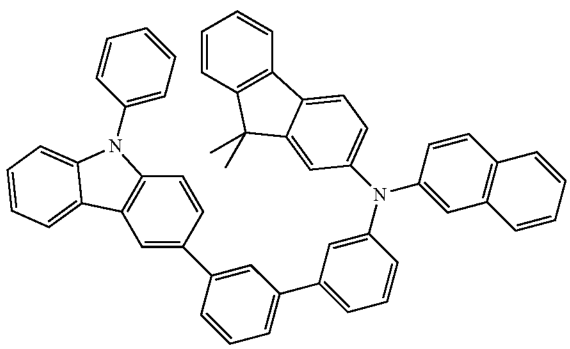
6-76
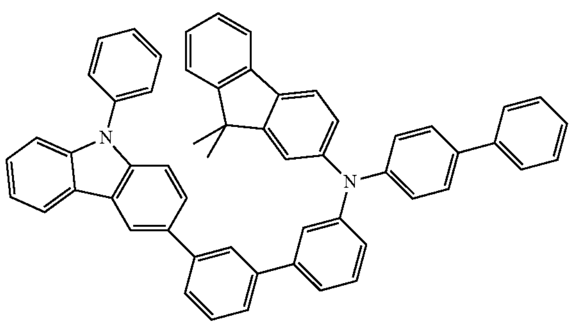
6-77
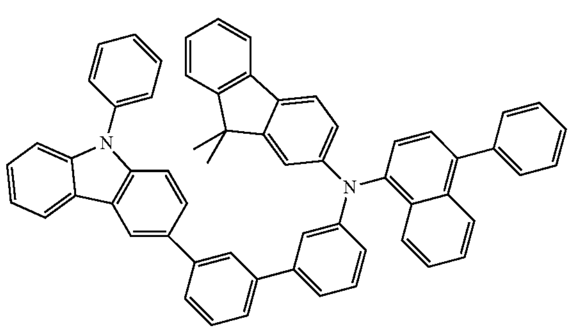
6-78
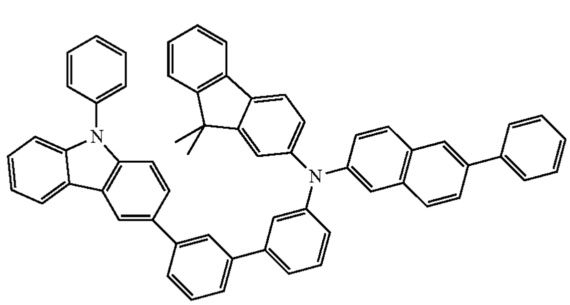
6-79
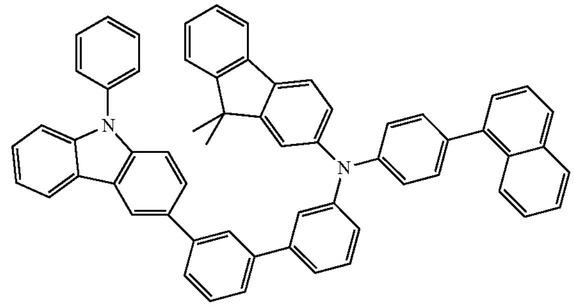
6-80
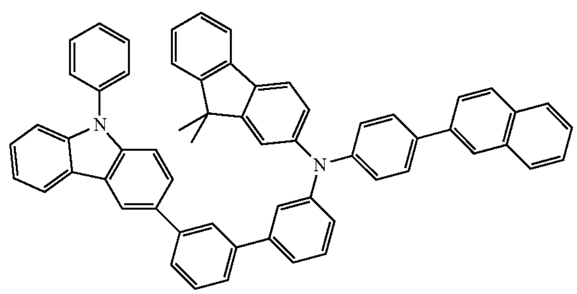
6-81
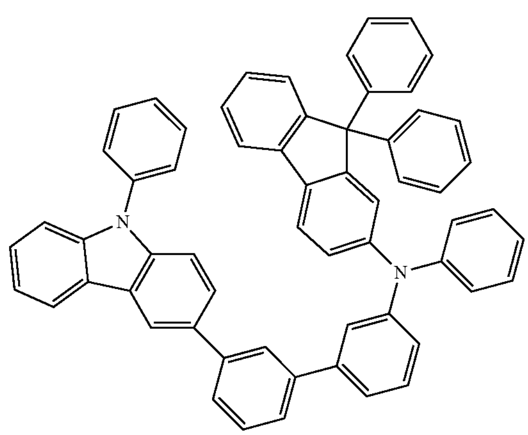
6-82
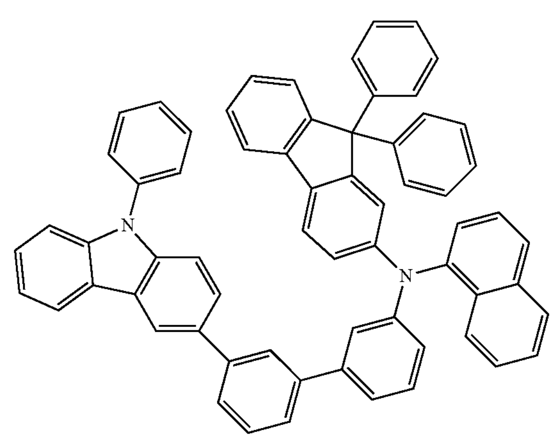

-continued
6-83
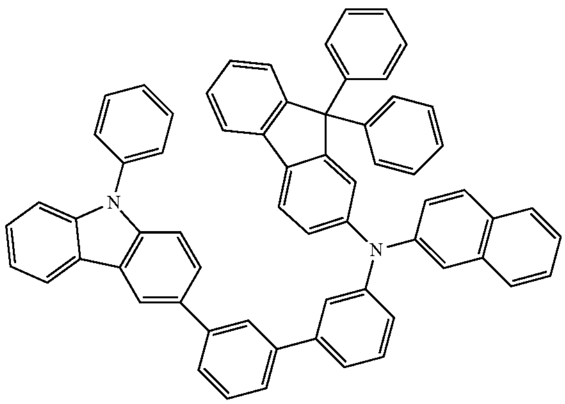
6-84
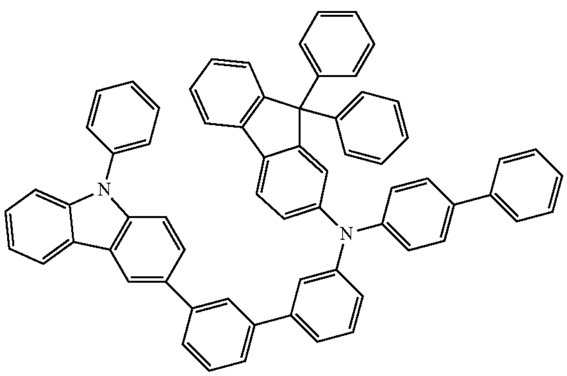
6-85
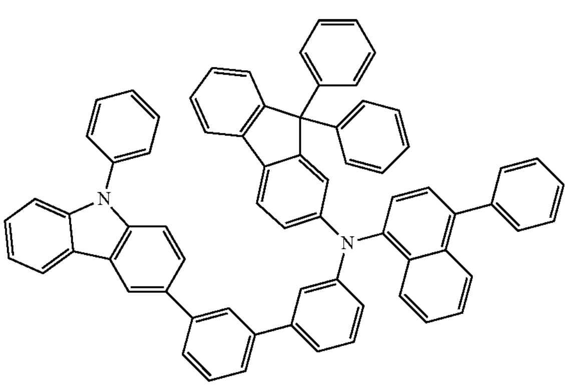
-continued
6-86
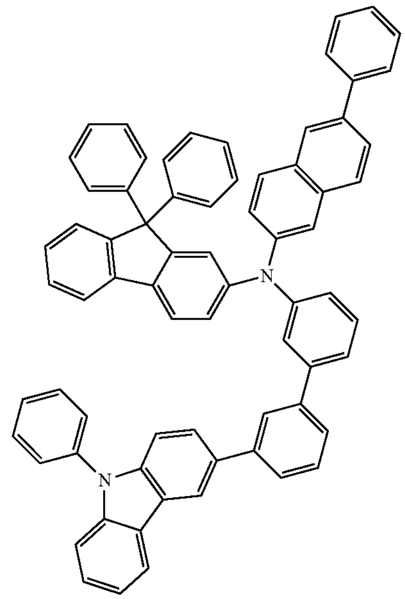
6-87
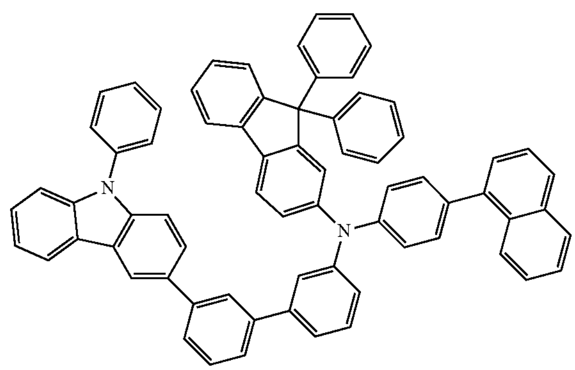
6-88
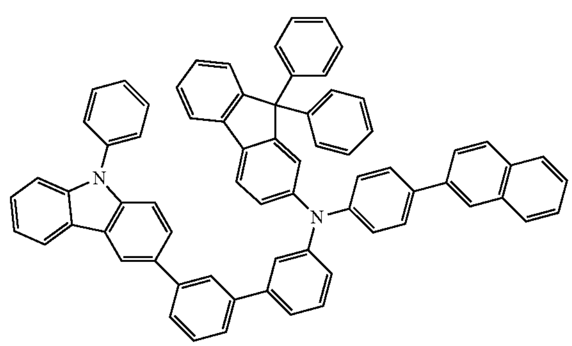

-continued
6-89
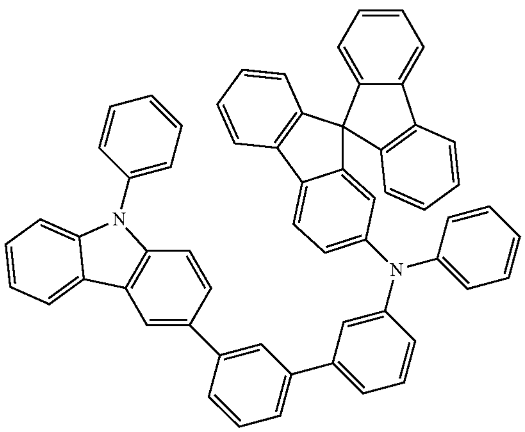
6-90
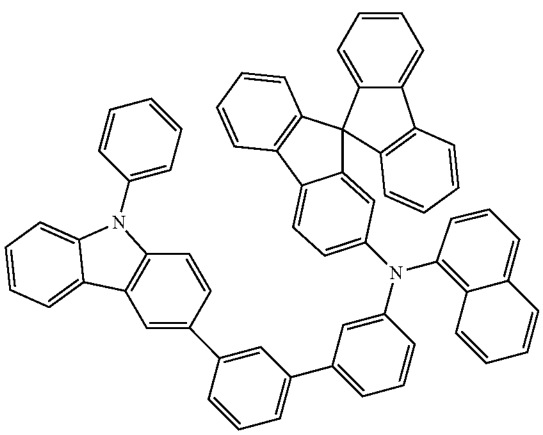
6-91
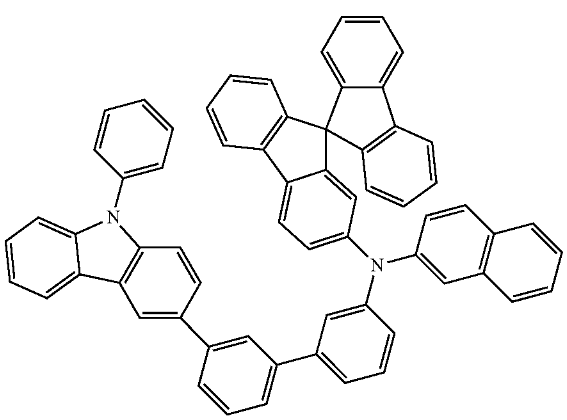
-continued
6-92
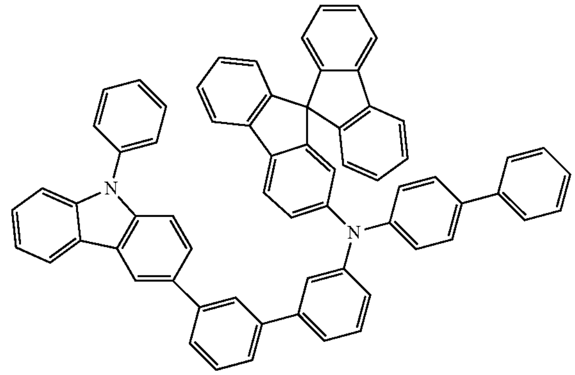
6-93
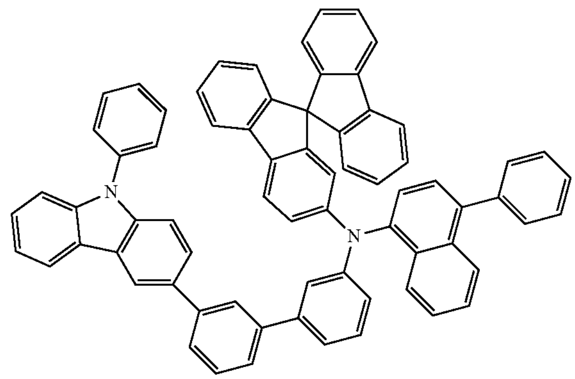
6-94
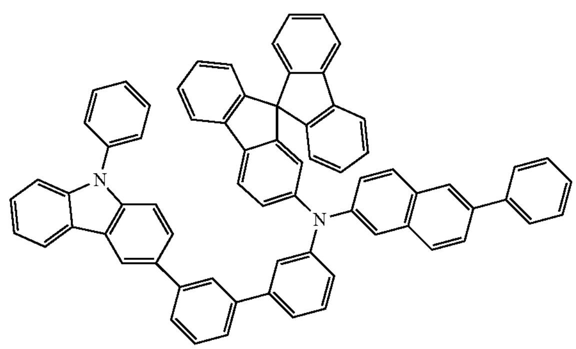
6-95
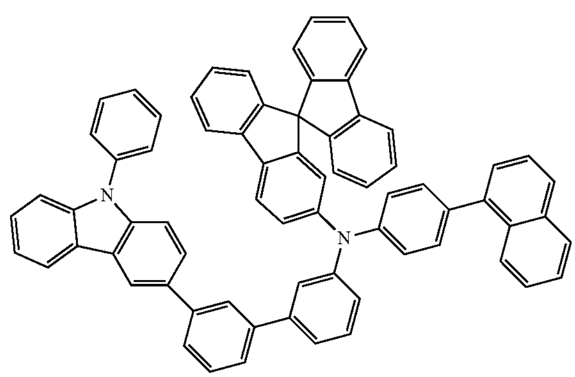

-continued
6-96
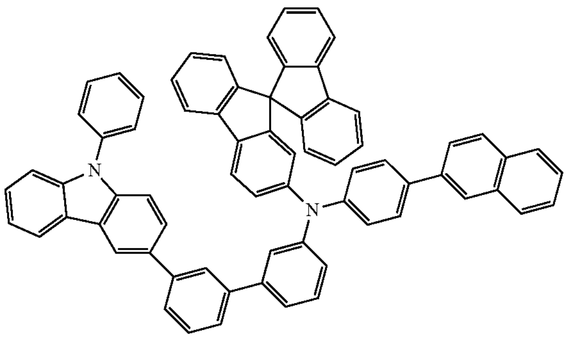
6-97
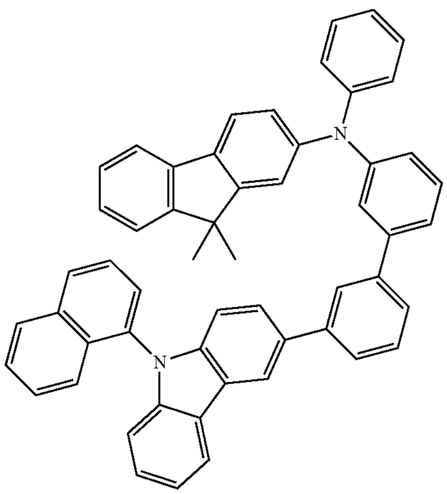
6-98
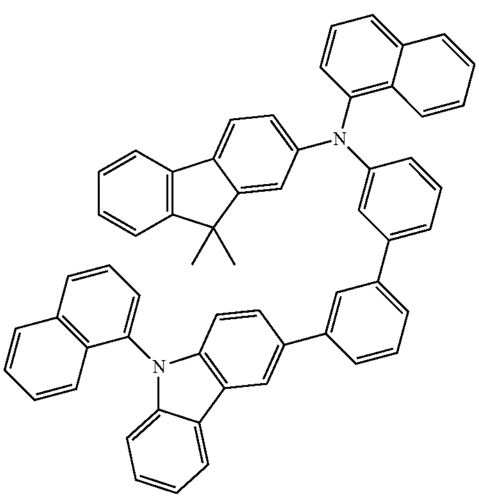
-continued
6-99
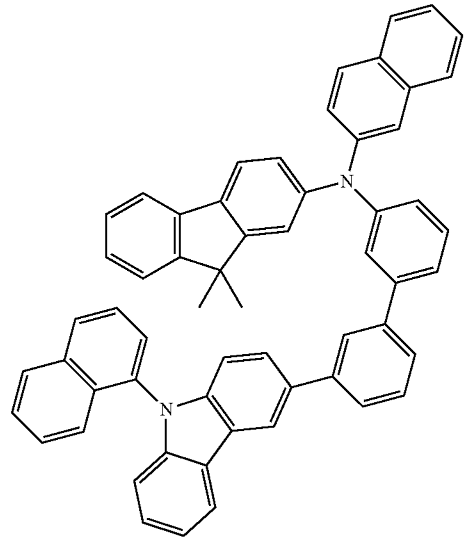
6-100
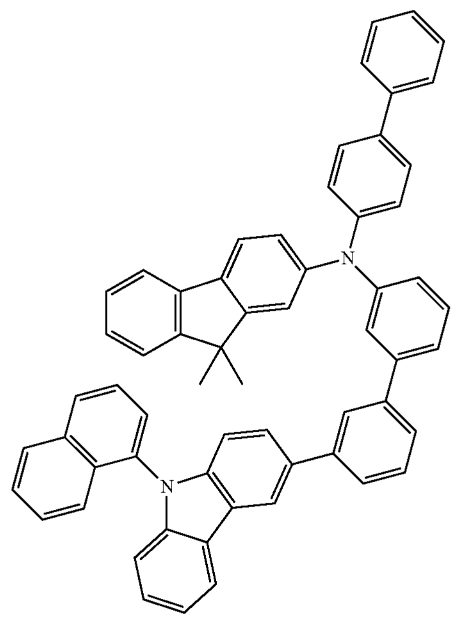
6-101
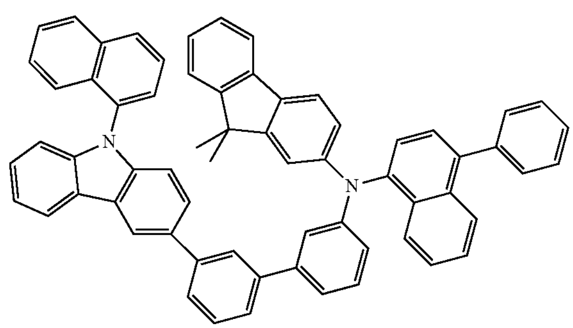

-continued
6-102
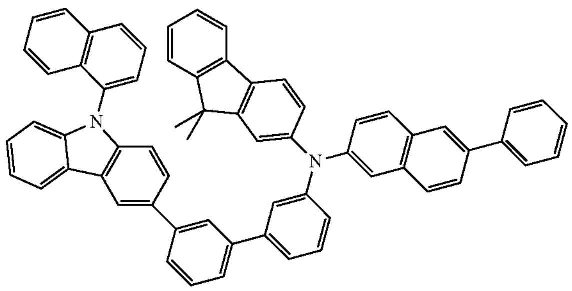
6-103
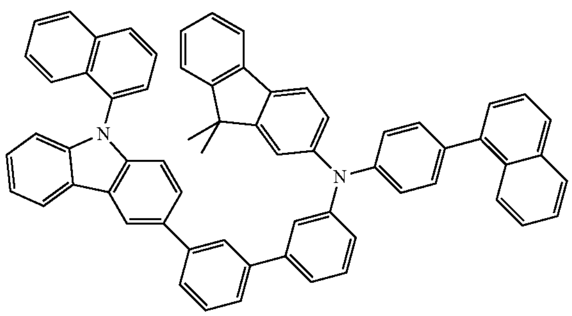
6-104
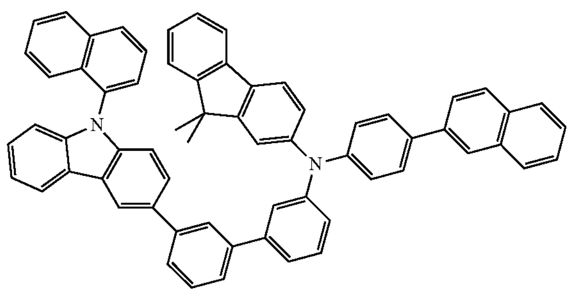
6-105
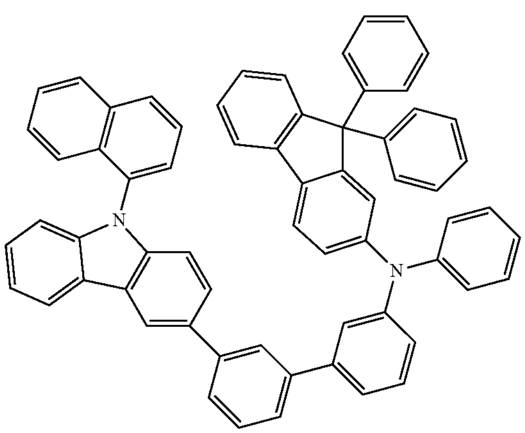
-continued
6-106
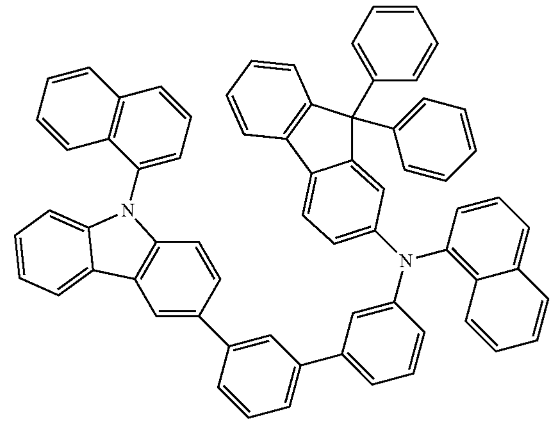
6-107
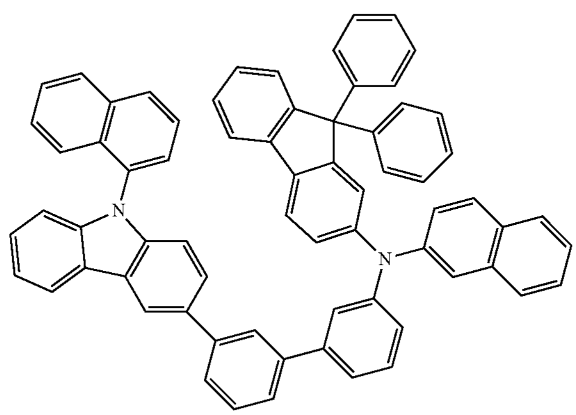
6-108
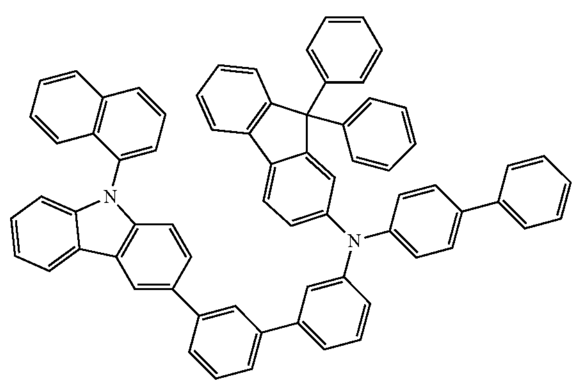

-continued
6-109
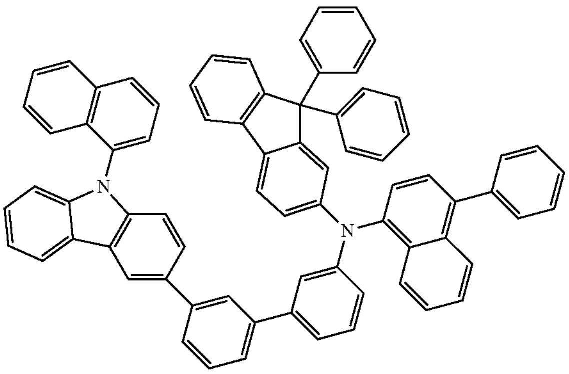
6-110
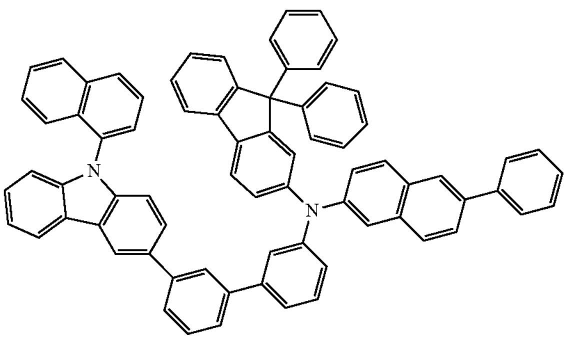
6-111
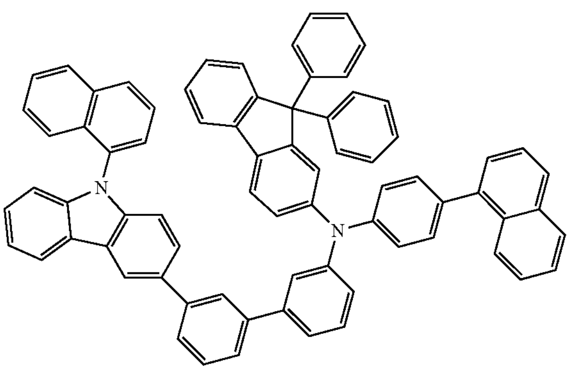
6-112
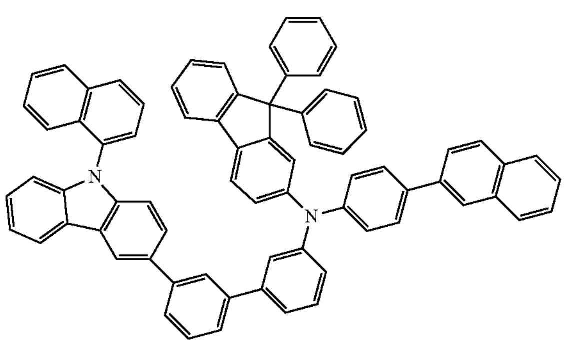
-continued
6-113
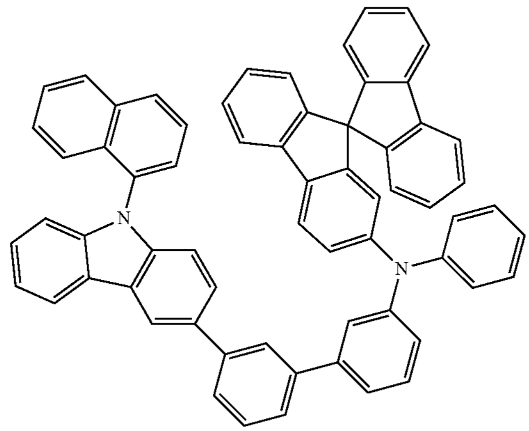
6-114
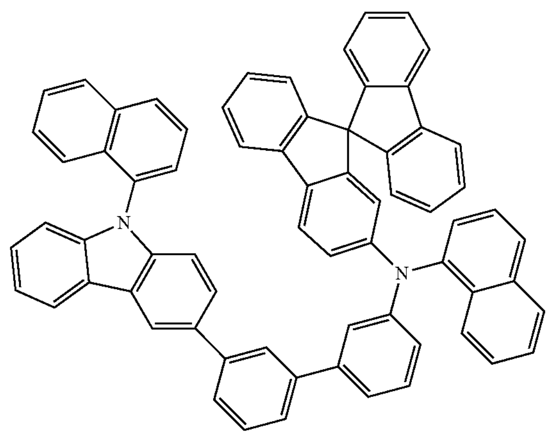
6-115
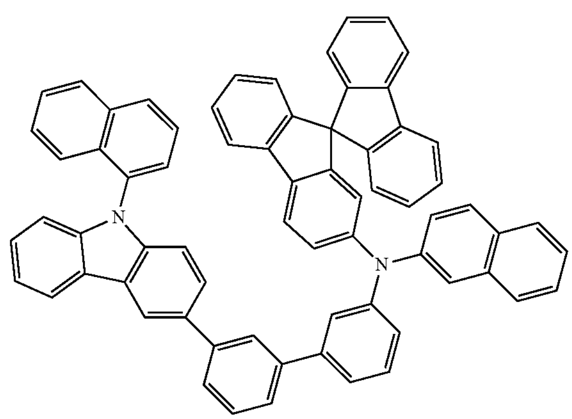

6-116
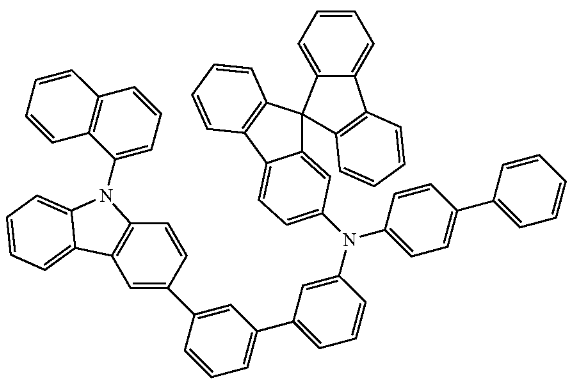
6-117
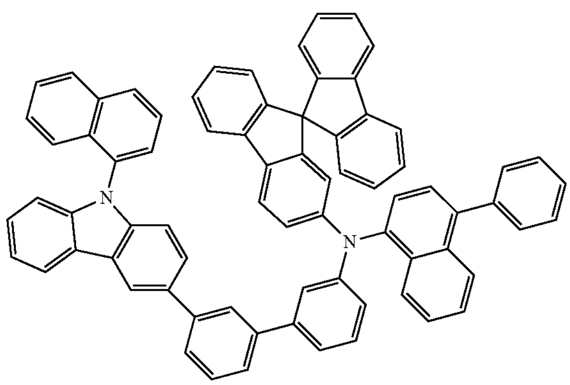
6-118
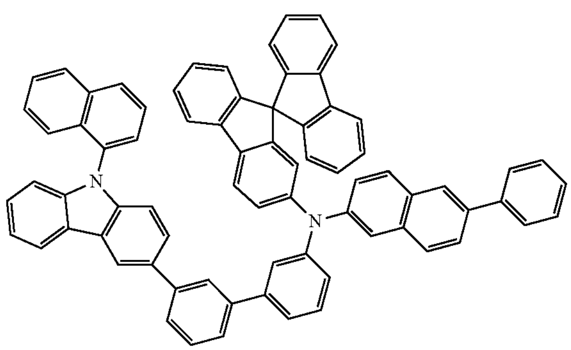
6-119
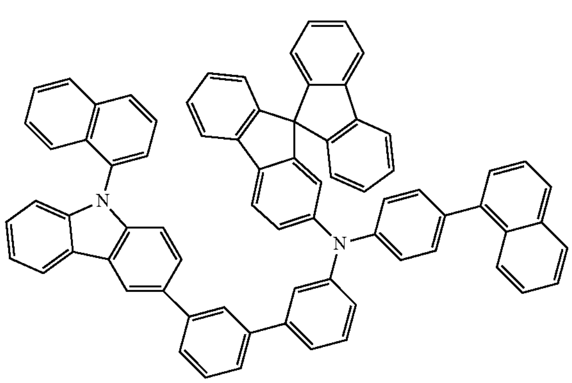
6-120
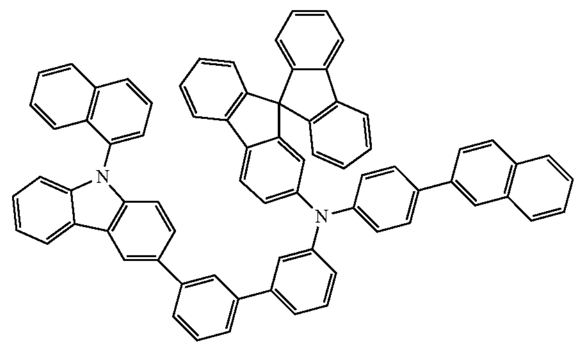
6-121
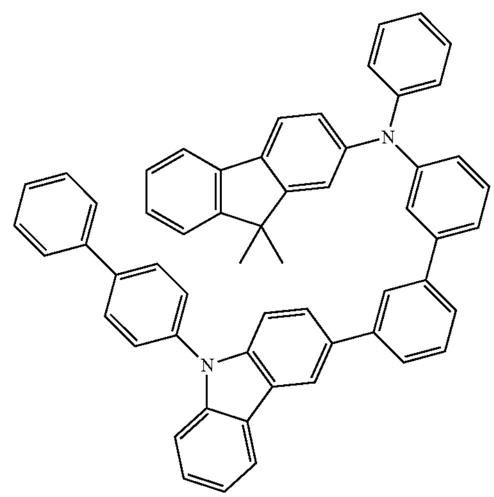
6-122
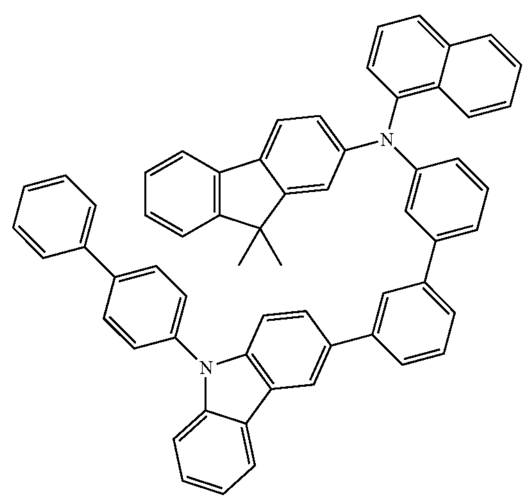

-continued
6-123
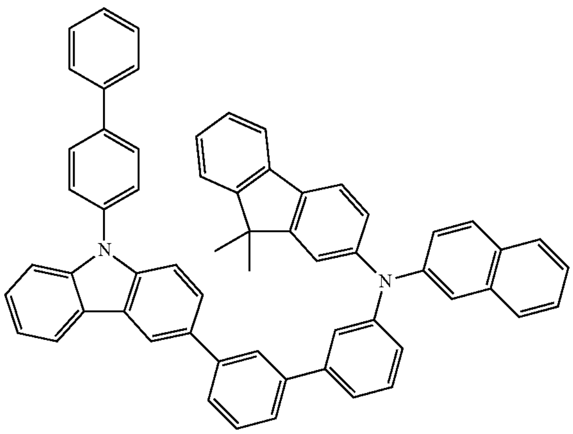
6-124
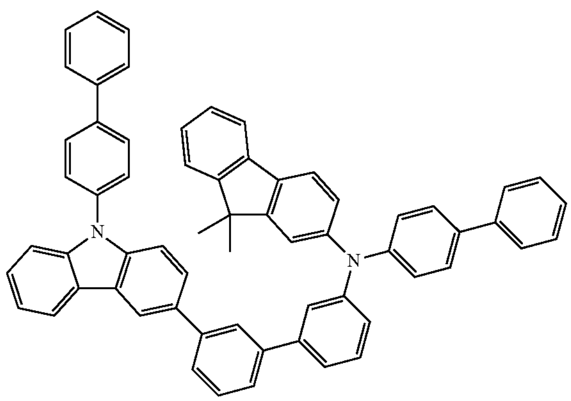
6-125
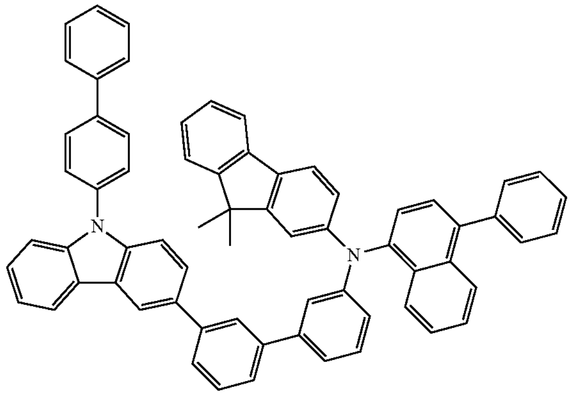
-continued
6-126
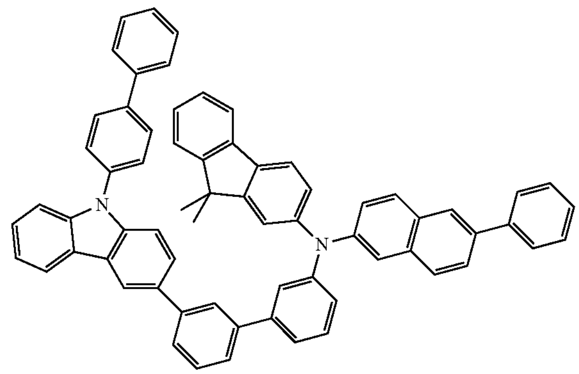
6-127
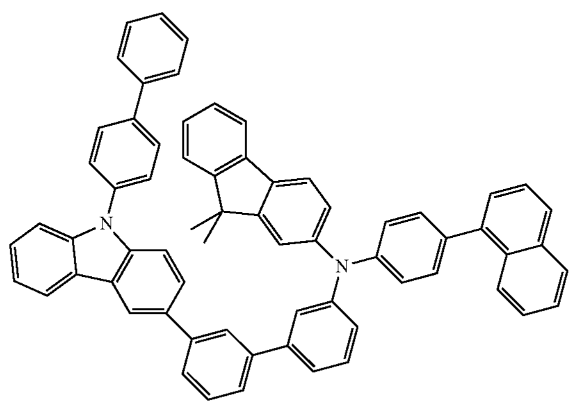
6-128
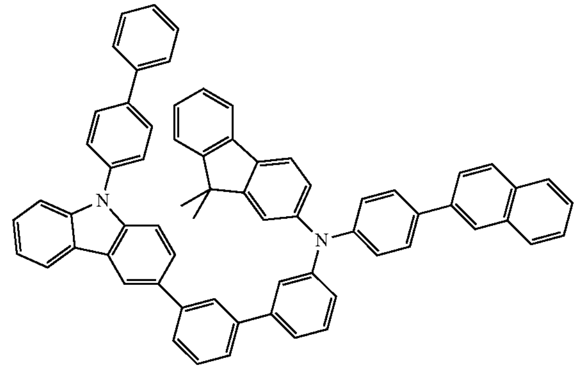

-continued
6-129
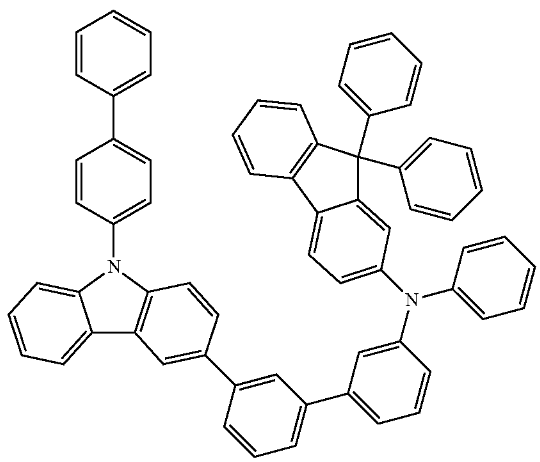
6-130
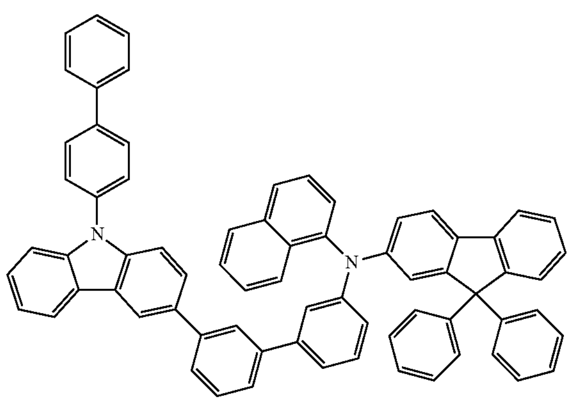
6-131
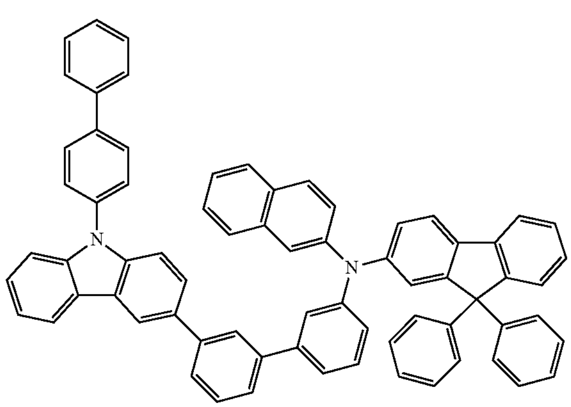
-continued
6-132
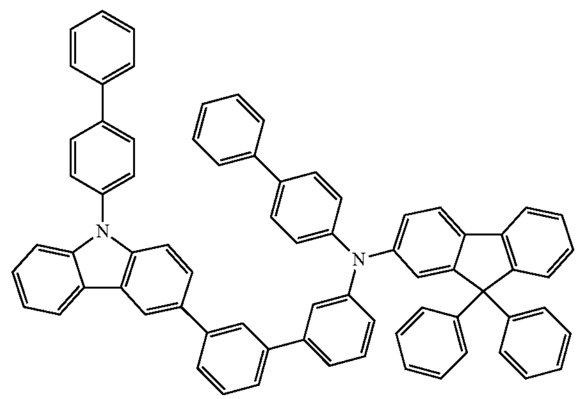
6-133
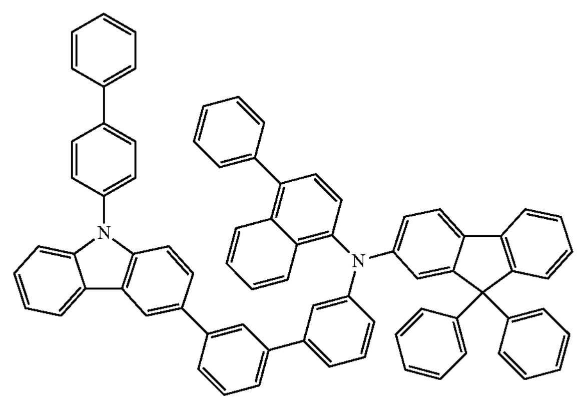
6-134
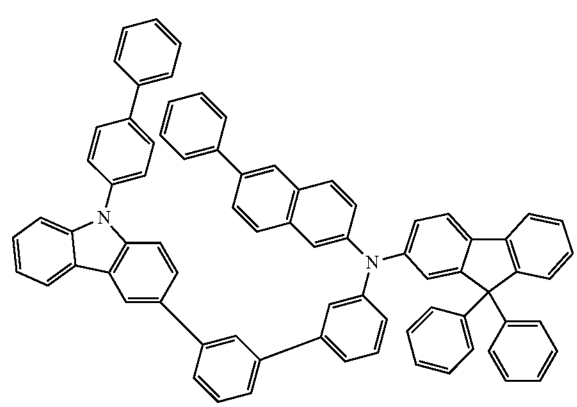

-continued
6-135
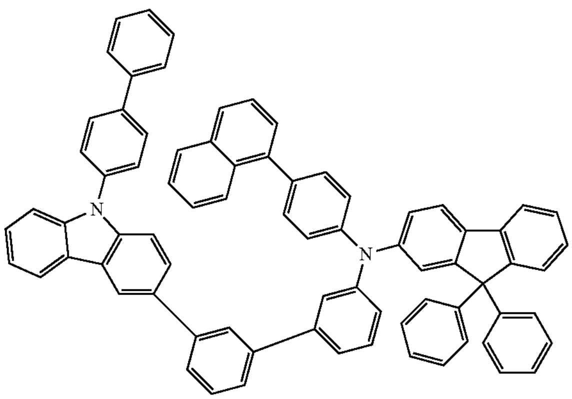
6-136
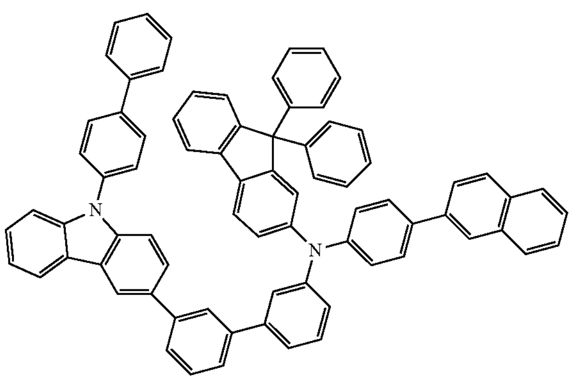
6-137
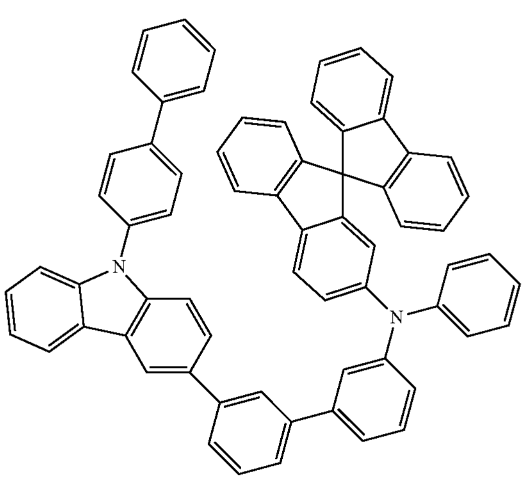
-continued
6-138
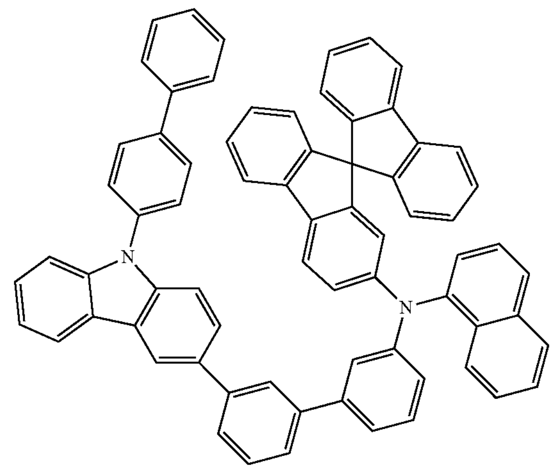
6-139
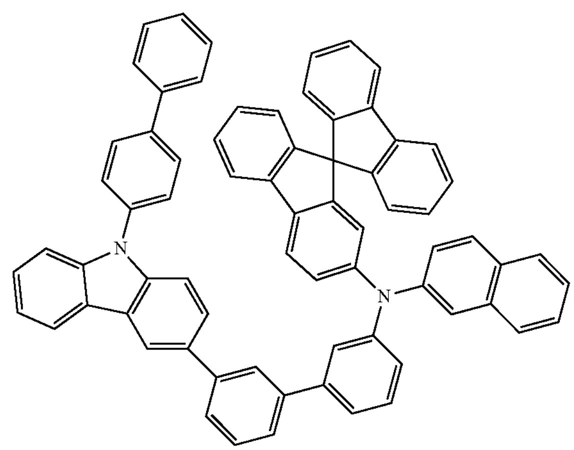
6-140
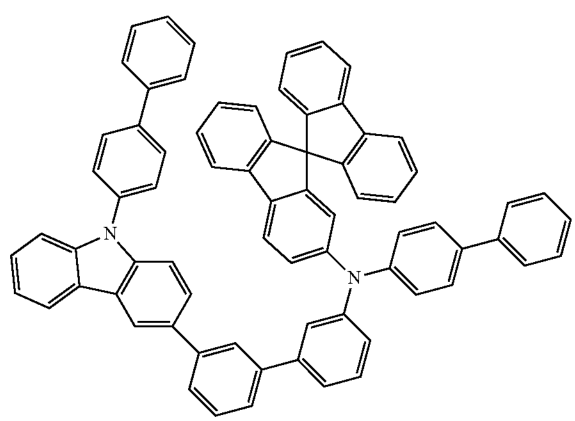

-continued 6-141

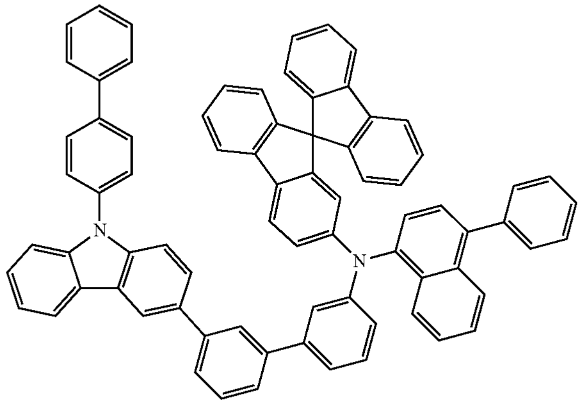

6-142

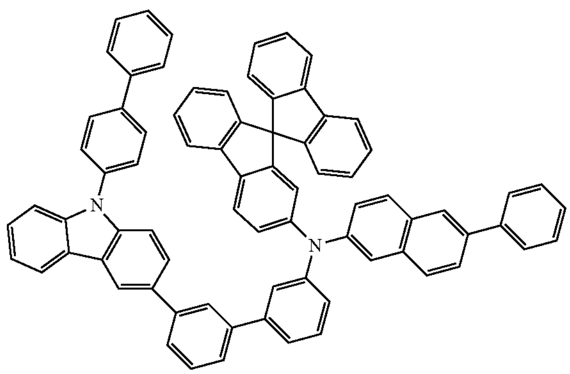

6-143

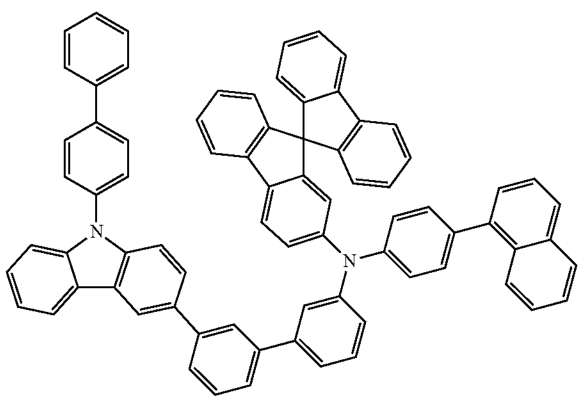

6-144

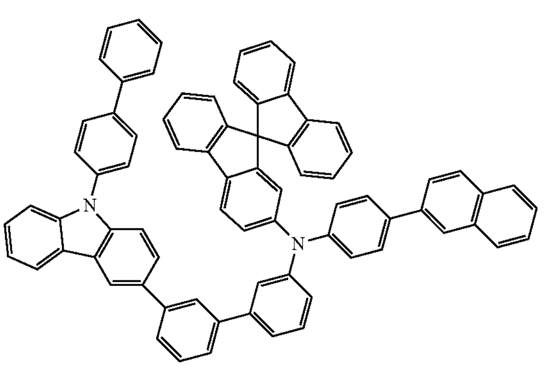

Also provided is an organic light-emitting device including a first electrode; a second electrode disposed opposite to the first electrode; an emission layer disposed between the first electrode and the second electrode; and a hole-transporting region disposed between the first electrode and the emission layer. The emission layer includes at least one light-emitting material represented by any one of Formulae 1-1 to 1-28:

1-1

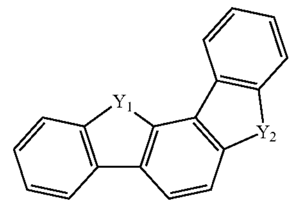

1-2

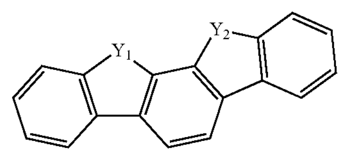

1-3

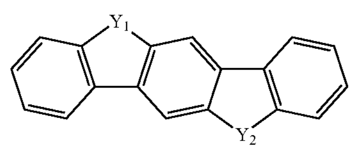

1-4

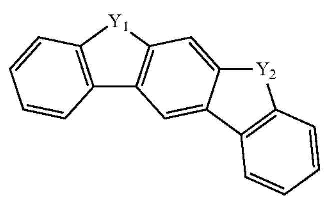

1-5

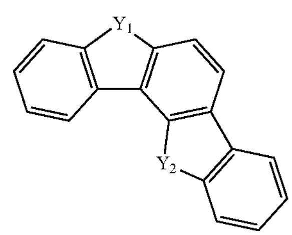

1-6

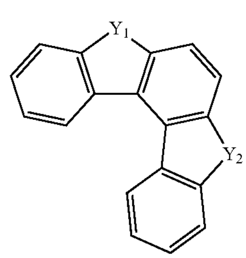

-continued
1-7
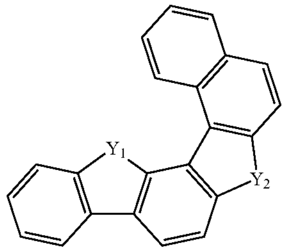
1-8
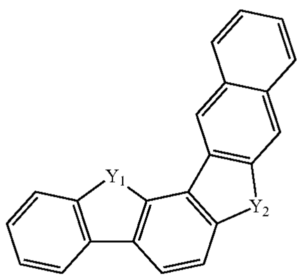
1-9
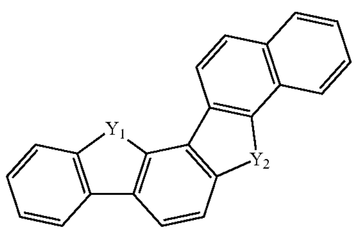
1-10
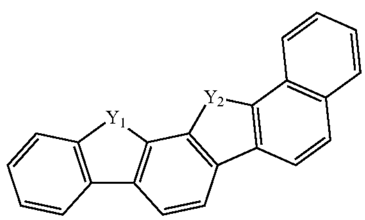
1-11
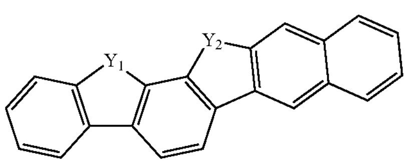
1-12
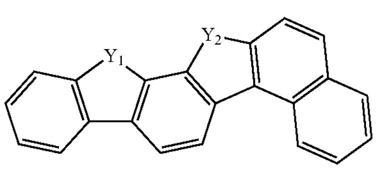
1-13
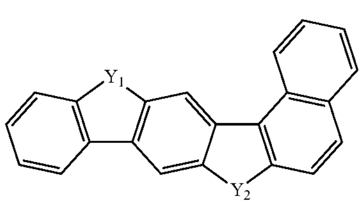
-continued
1-14
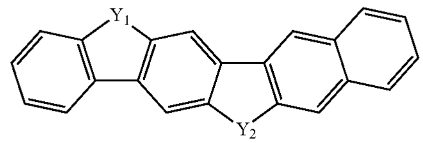
1-15
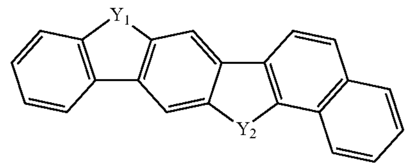
1-16
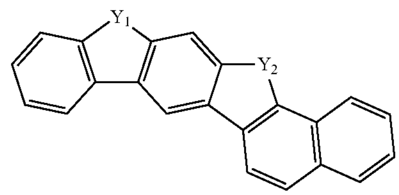
1-17
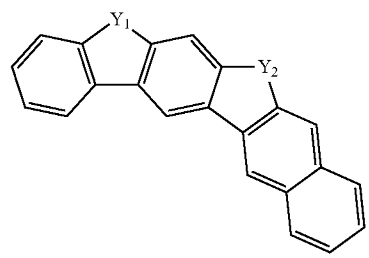
1-18
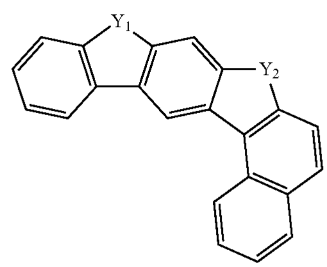
1-19
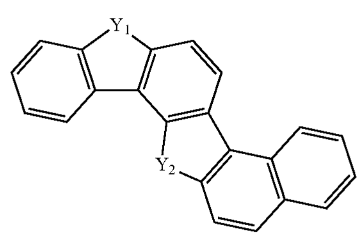
1-20
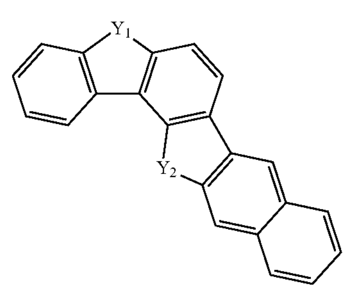

-continued 1-21

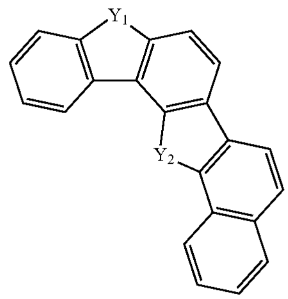

1-22

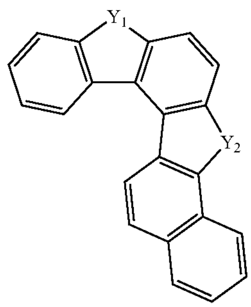

1-23

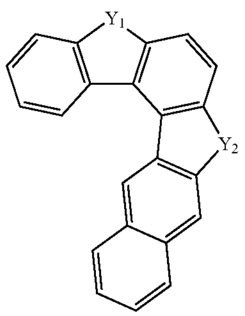

1-24

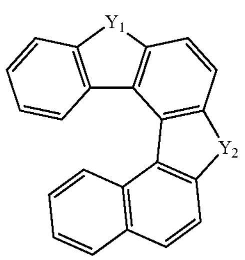

1-25

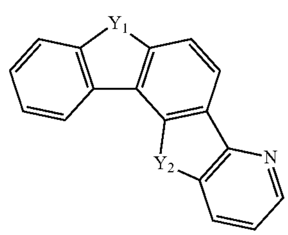

1-26

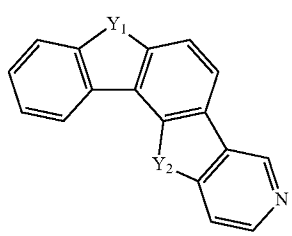

-continued 1-27

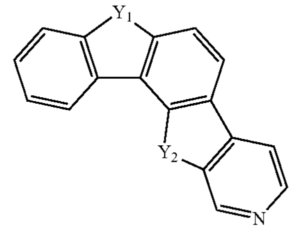

1-28

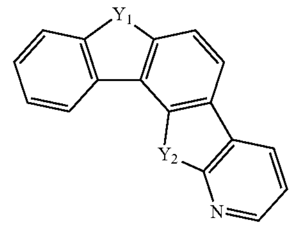

wherein, in Formulae 1-1 to 1-28, $Y_1$ is N-$(L_1)_{n1}$-$Ar_{11}$;

$Y_2$ is N-$(L_2)_{n2}$-$Ar_{12}$, O, S, C($R_{31}$)($R_{32}$), or Si($R_{33}$)($R_{34}$);

$L_1$ and $L_2$ are each independently selected from i) a phenylene group, a pyridylene group, a pyrimidylene group, a triazinylene group, and a quinazolinylene group;

ii) a phenylene group, a pyridylene group, a pyrimidylene group, a triazinylene group, and a quinazolinylene group each substituted with at least one selected from a phenyl group, a naphthyl group, and a pyridyl group;

iii) a phenylene group, a pyridylene group, a pyrimidylene group, a triazinylene group, and a quinazolinylene group each substituted with at least one of deuterium, a methyl group, an ethyl group, an n-octyl group, a methoxy group, an ethoxy group, a phenyl group, a naphthyl group, a pyridyl group, and a carbazole group;

n1 and n2 are each independently an integer of 0 to 3;

$Ar_{11}$ and $Ar_{12}$ are each independently a compound represented by any one of Formulae H1 to H81:

H1

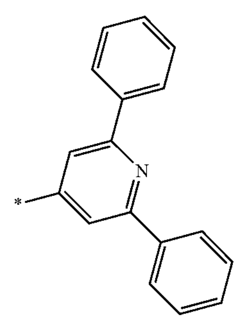

H2

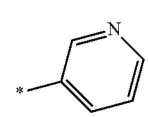

-continued
H3
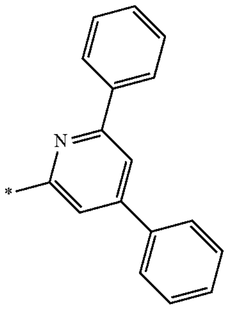
H4
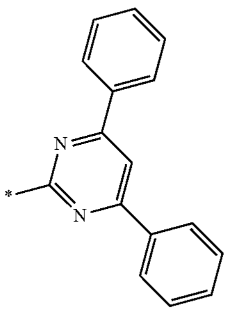
H5
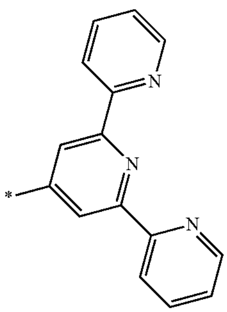
H6
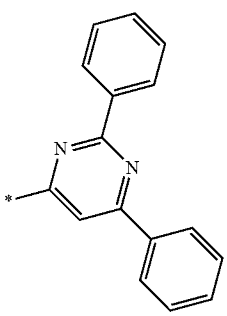
H7
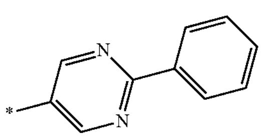
H8
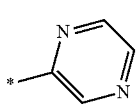
H9
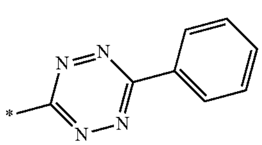
-continued
H10
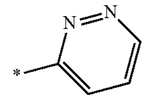
H11
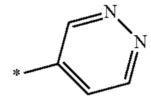
H12
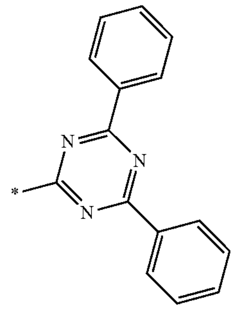
H13
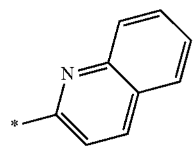
H14
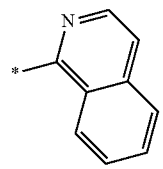
H15
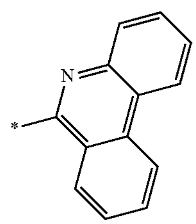
H16
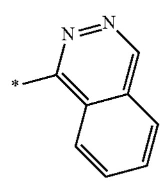
H17
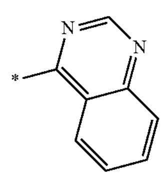
H18
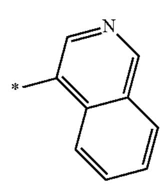

-continued
H19
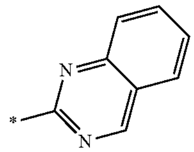
H20
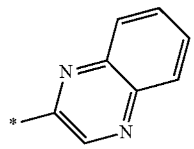
H21
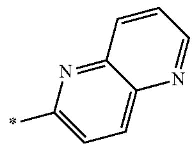
H22
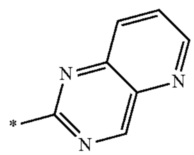
H23
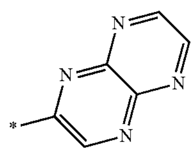
H24
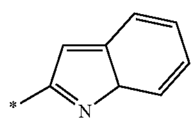
H25
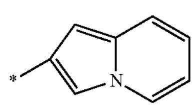
H26
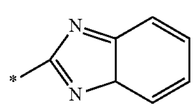
H27
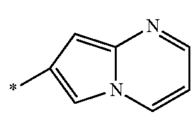
H28
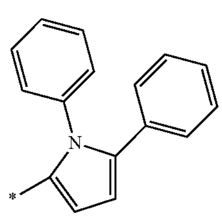
H29
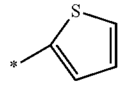
-continued
H30
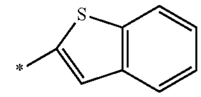
H31
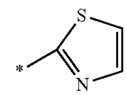
H32
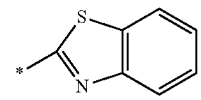
H33
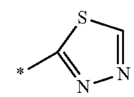
H34
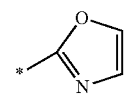
H35
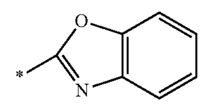
H36
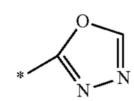
H37
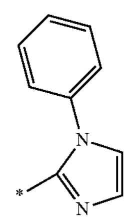
H38
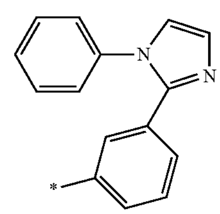
H39
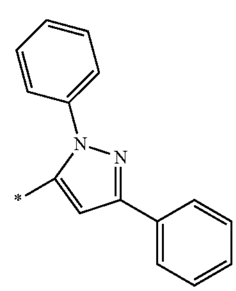

-continued
H40
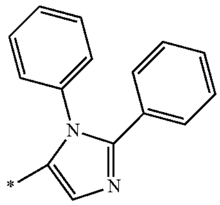
H41
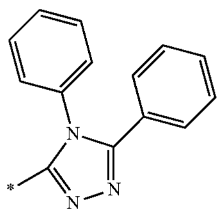
H42
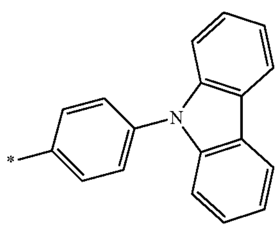
H43
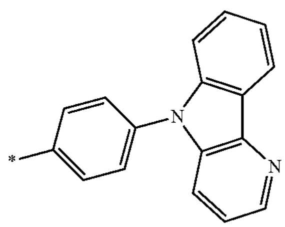
H44
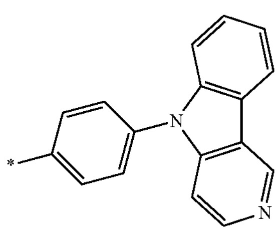
H45
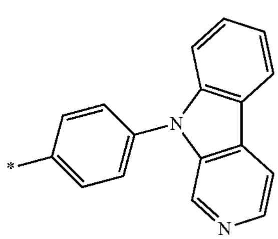
H46
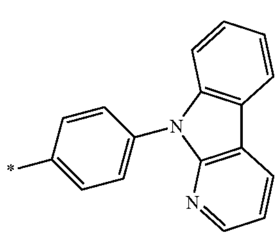
-continued
H47
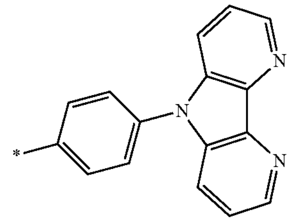
H48
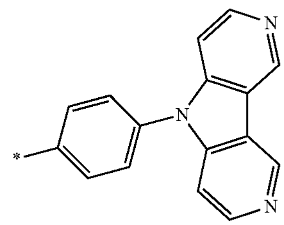
H49
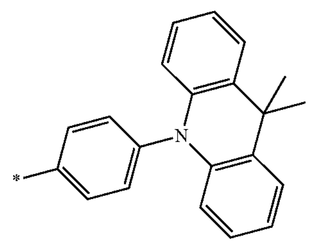
H50
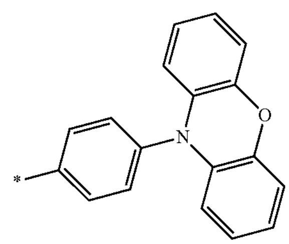
H51
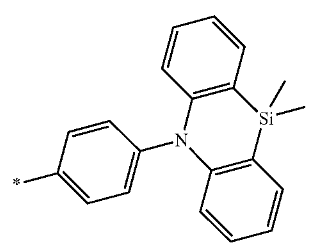
H52
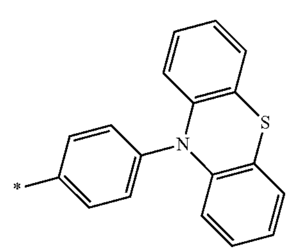

-continued
H53
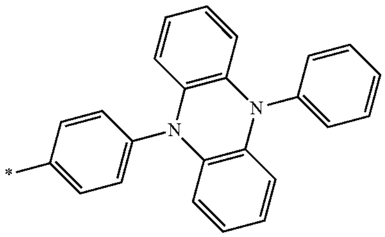
H54
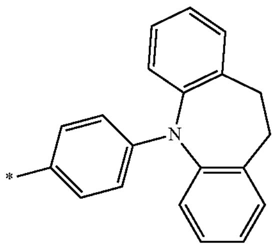
H55
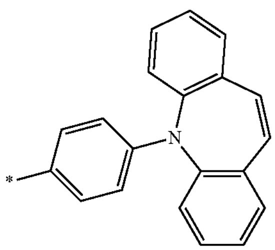
H56
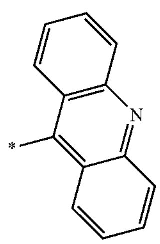
H57
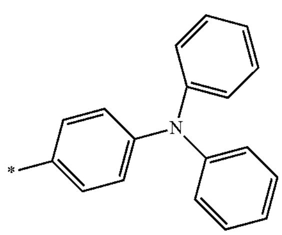
H58
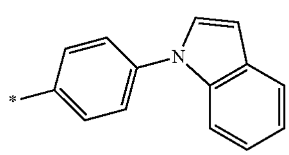
H59
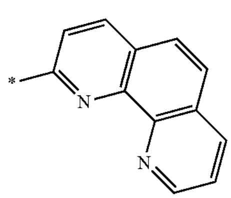
-continued
H60
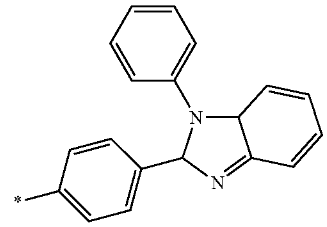
H61
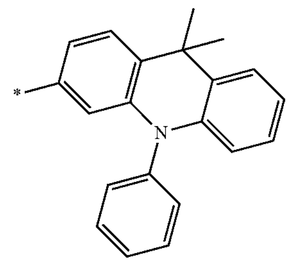
H62
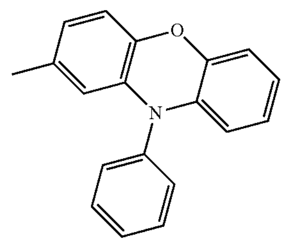
H63
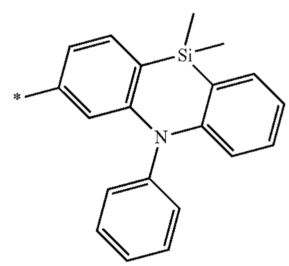
H64
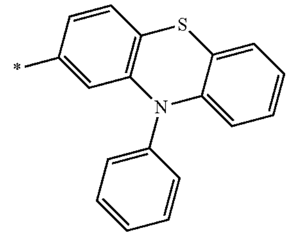
H65
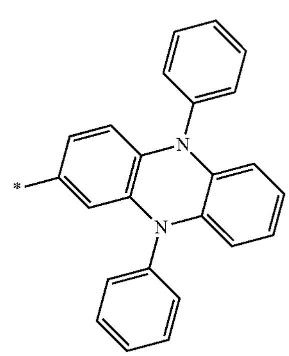

-continued

H66

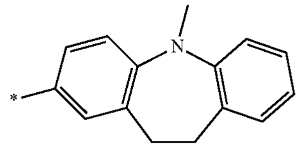

H67

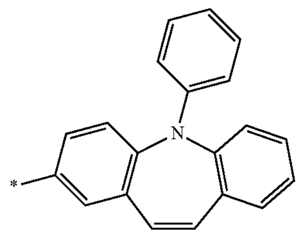

H68

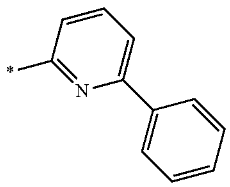

H69

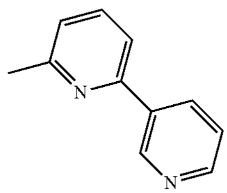

H70

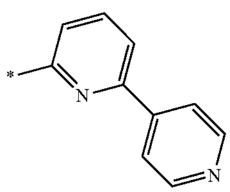

H71

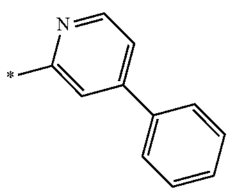

H72

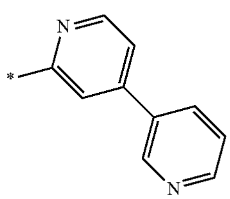

H73

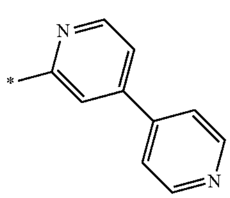

-continued

H74

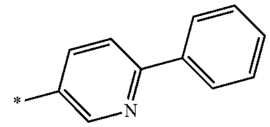

H75

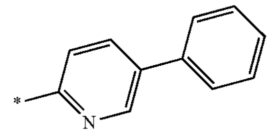

H76

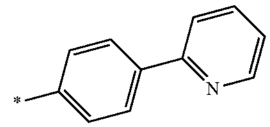

H77

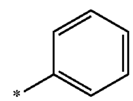

H78

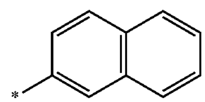

H79

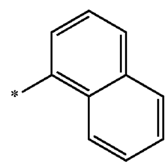

H80

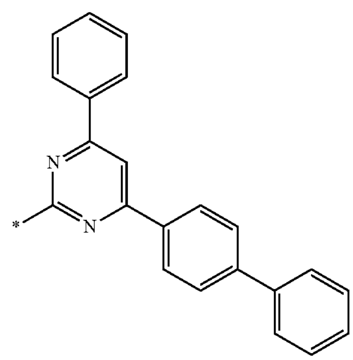

H81

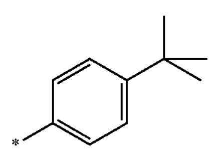

wherein, in Formulae H1 to H81, * is a bonding site to N, $L_1$, or $L_2$;

$R_{31}$ to $R_{34}$ are each independently selected from i) a $C_1$-$C_{60}$ alkyl group, a $C_2$-$C_{60}$ alkenyl group, a $C_2$-$C_{60}$ alkynyl group, and a $C_1$-$C_{60}$ alkoxy group;

ii) a $C_1$-$C_{60}$ alkyl group, a $C_2$-$C_{60}$ alkenyl group, a $C_2$-$C_{60}$ alkynyl group, and a $C_1$-$C_{60}$ alkoxy group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

The hole-transporting region includes at least one hole-transporting material represented by any one of Formulae 2a and 2b:

<Formula 2a>

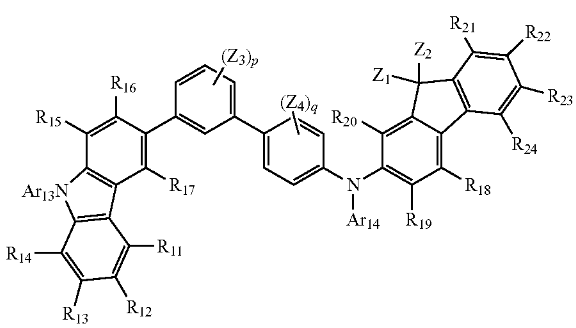

<Formula 2b>

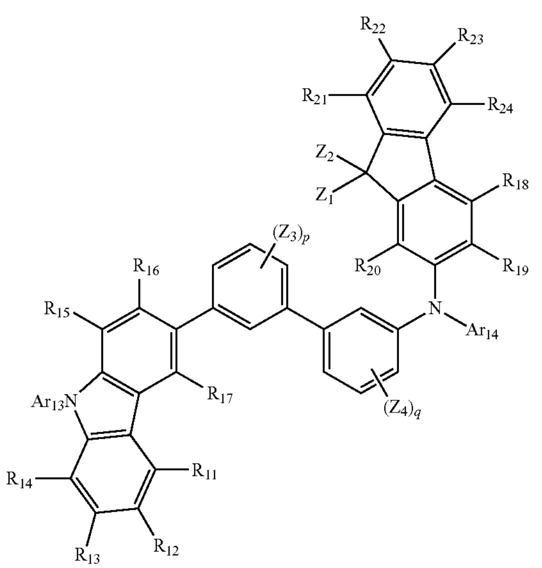

wherein, in Formula 2a or 2b, $Ar_{13}$ and $Ar_{14}$ are each independently represented by any one of Formulae 3-1 to 3-20:

3-1

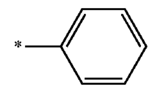

3-2

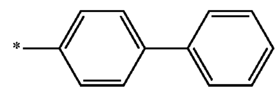

3-3

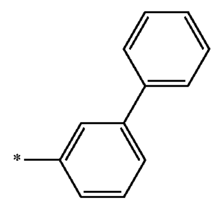

3-4

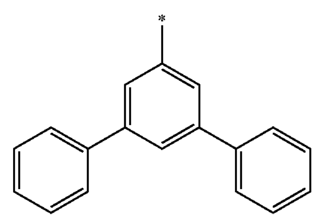

3-5

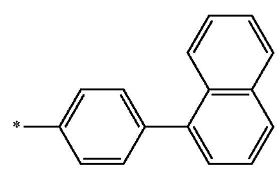

3-6

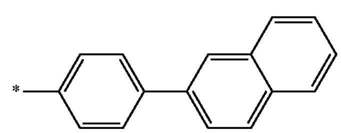

3-7

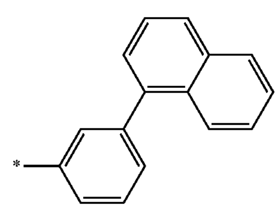

3-8

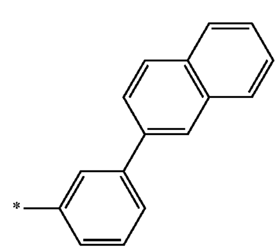

-continued 3-9

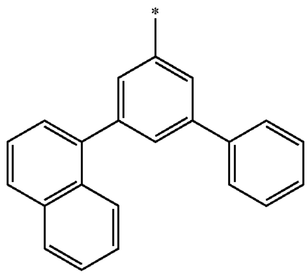

3-10

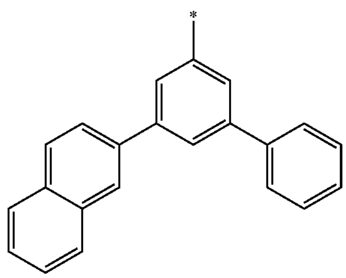

3-11

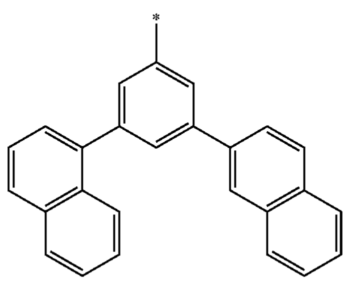

3-12

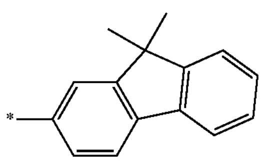

3-13

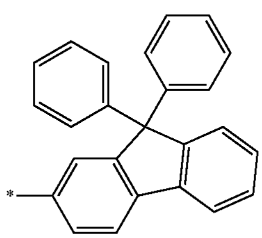

3-14

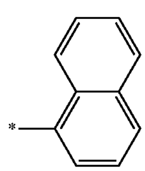

3-15

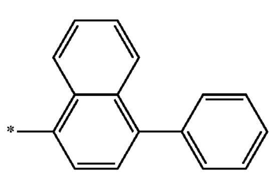

-continued 3-16

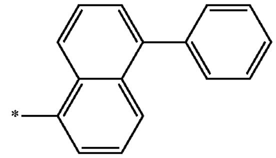

3-17

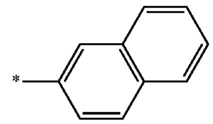

3-18

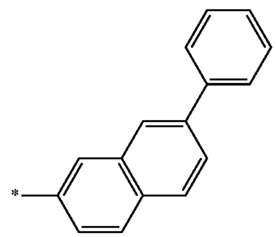

3-19

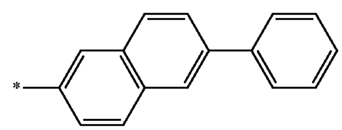

3-20

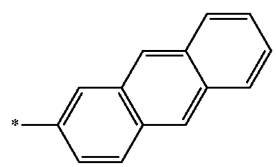

$Z_1$ and $Z_2$ are each independently selected from a $C_1$-$C_{20}$ alkyl group and a compound represented by any one of Formulae 3-1 to 3-20:

$Z_3$, $Z_4$, and $R_{11}$ to $R_{24}$ are each independently selected from hydrogen, deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{20}$ alkyl group, and a compound represented by any one of Formulae 3-1 to 3-20; and p and q are each independently an integer of 1 to 4.

Further provided is an organic light-emitting device including a first electrode; a second electrode disposed opposite to the first electrode; an emission layer disposed between the first electrode and the second electrode; and a hole-transporting region disposed between the first electrode and the emission layer. The emission layer includes at least one selected from Compounds 100 to 236:

100
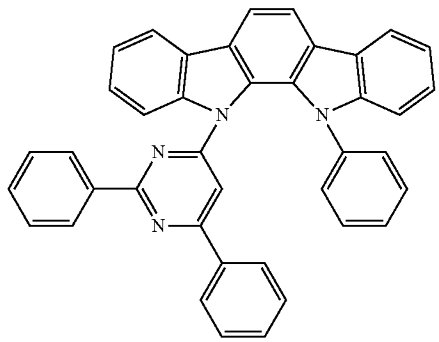
101
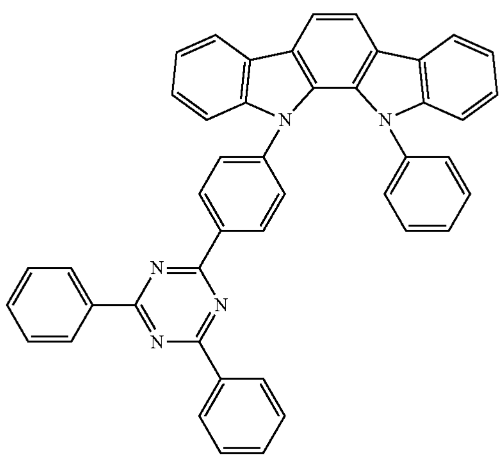
102
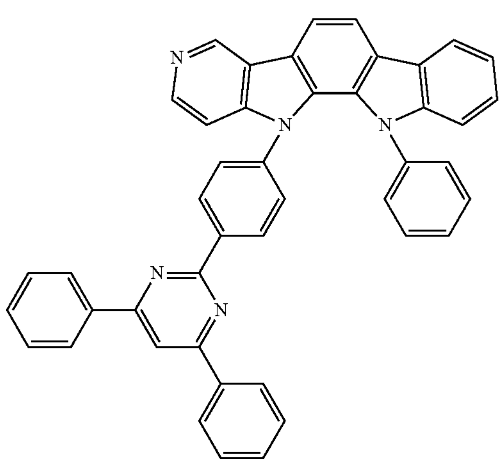
-continued
103
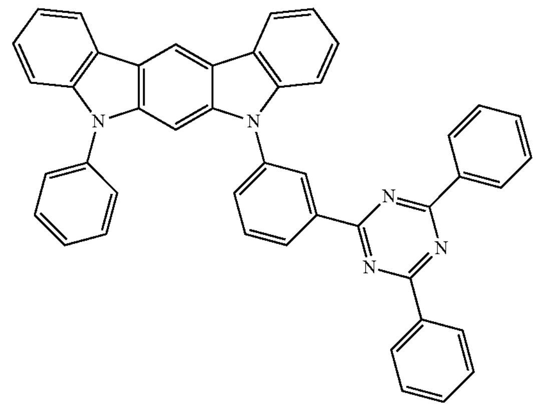
104
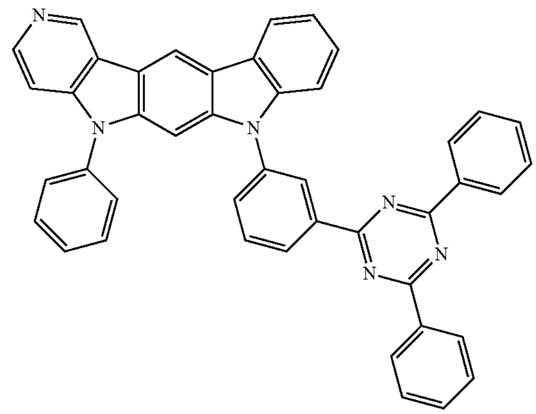
105
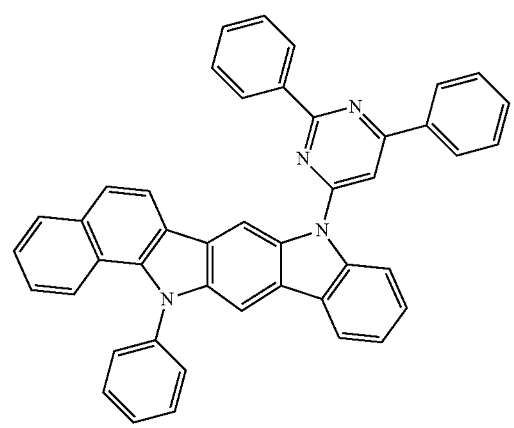
107
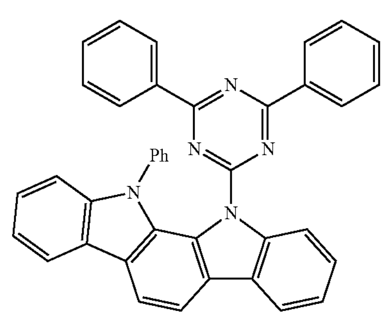

108
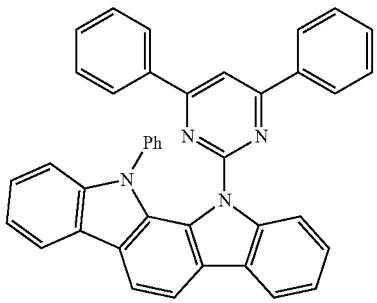
109
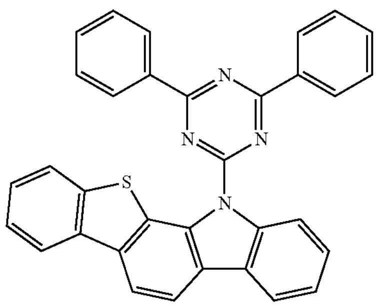
110
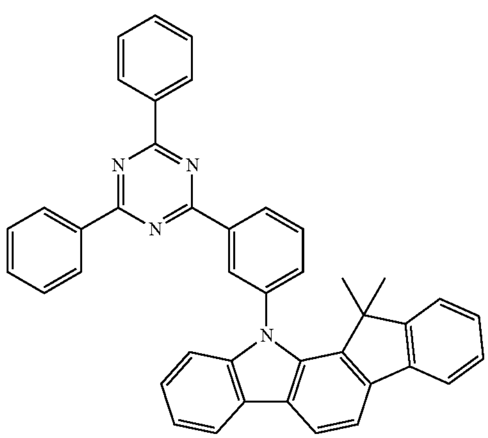
111
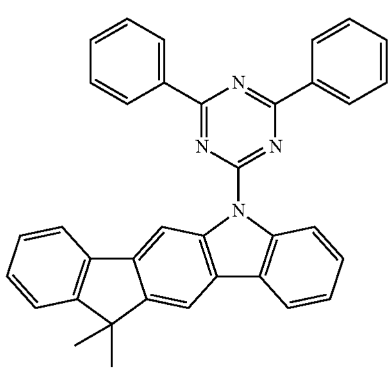
112
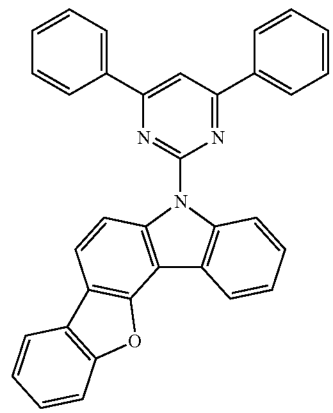
113
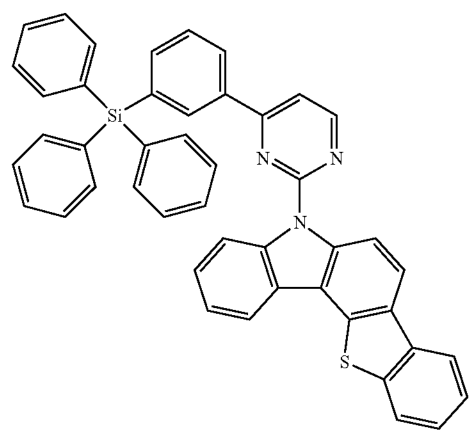
114
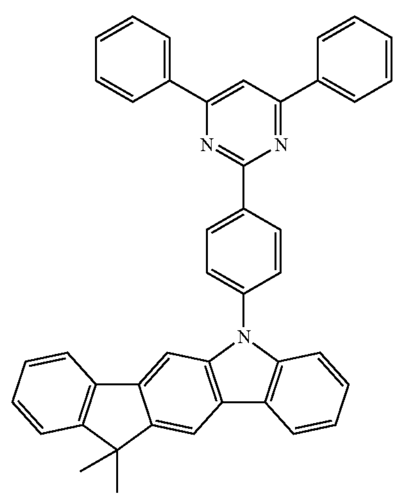

115
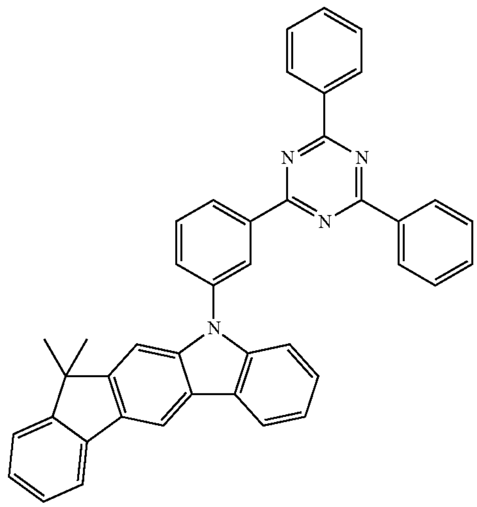
116
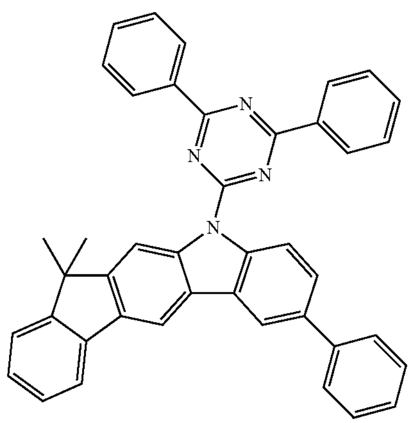
117
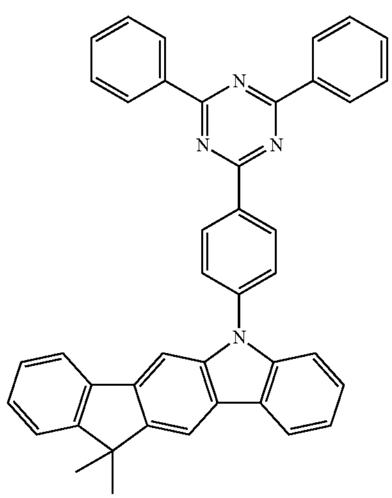
118
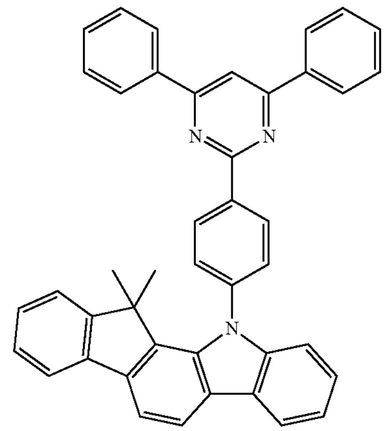
119
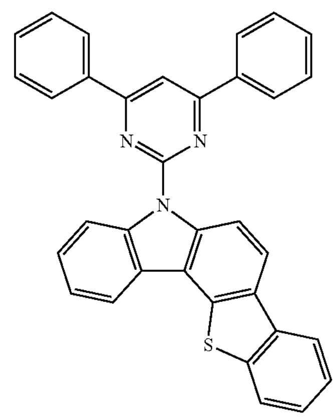
120
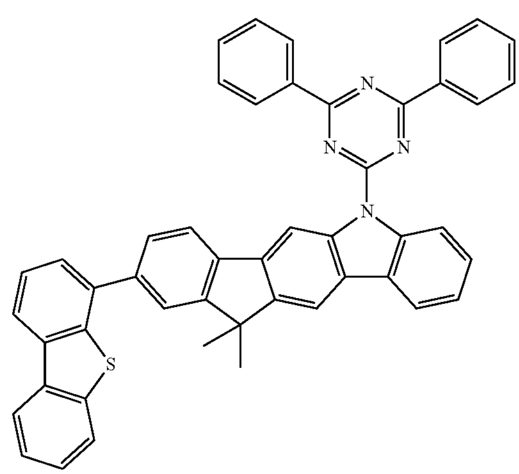

-continued
121
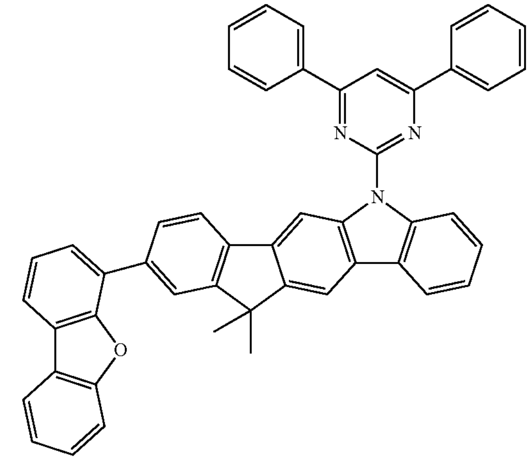
122
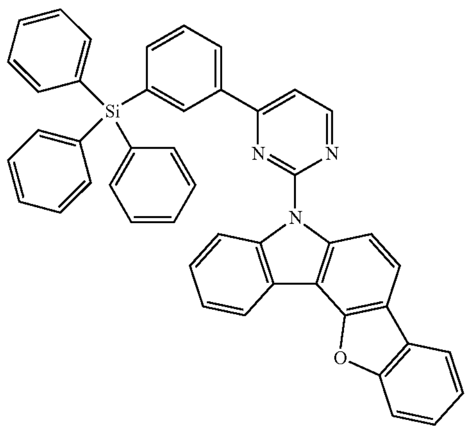
123
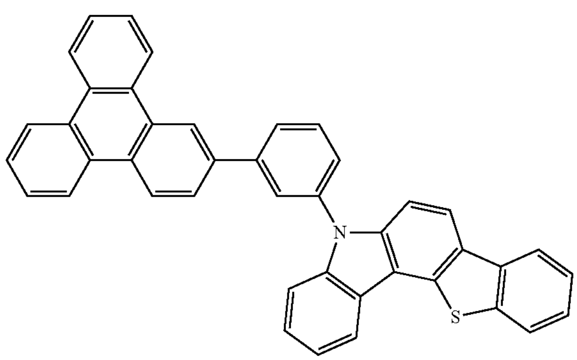
124
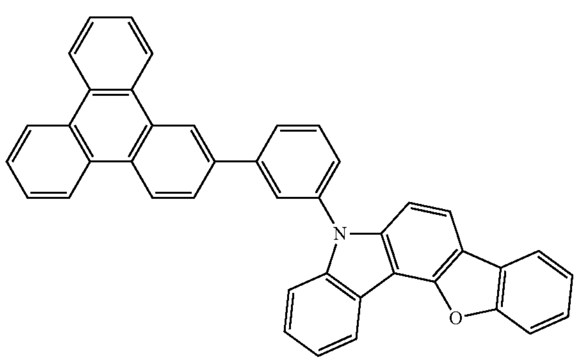
-continued
125
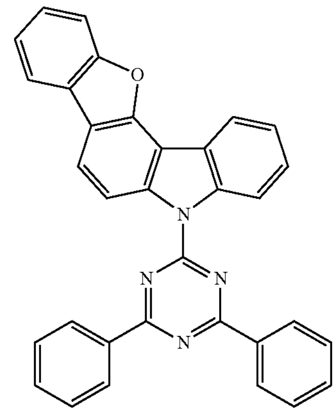
126
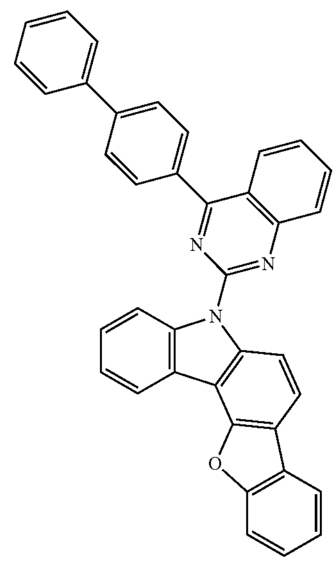
127
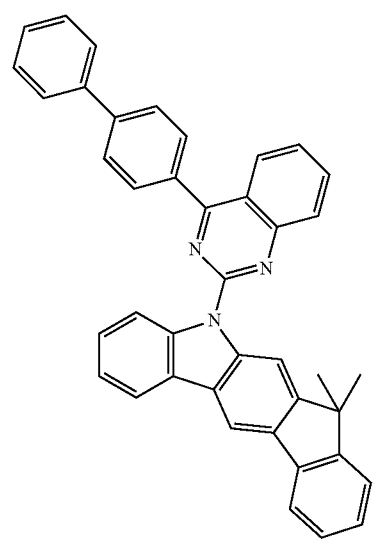

-continued
128
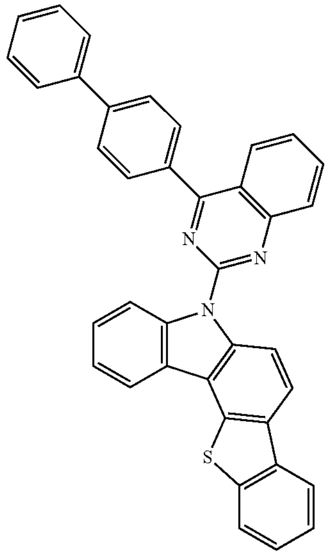
129
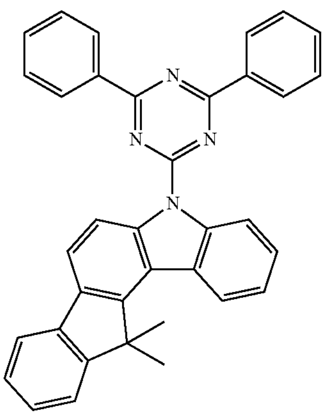
130
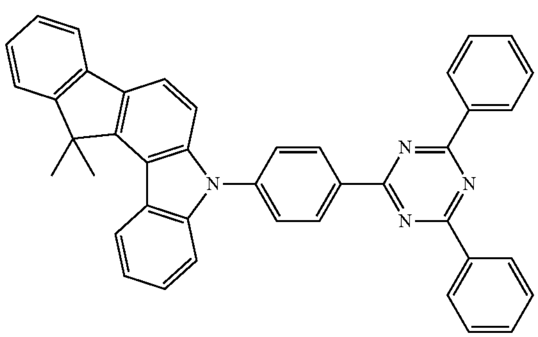
131
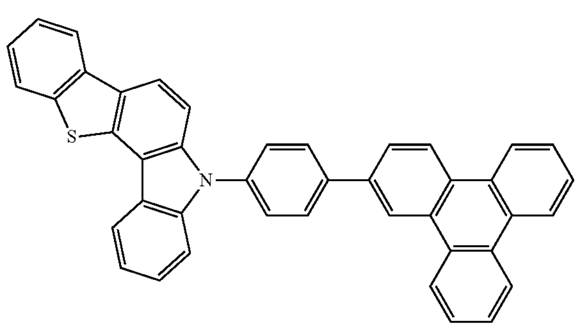
-continued
132
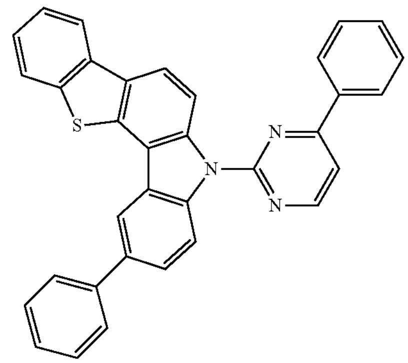
133
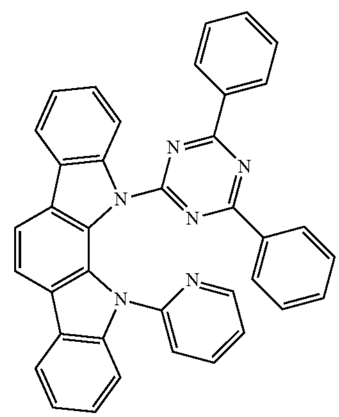
134
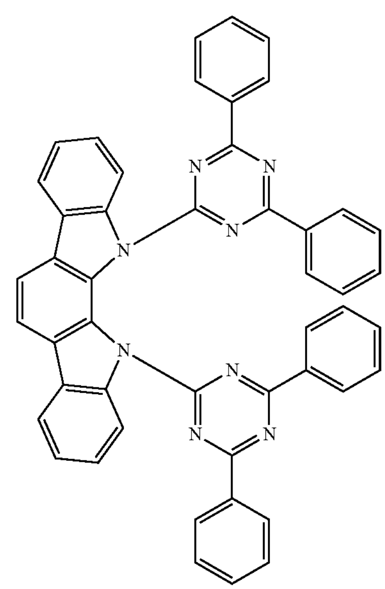

135
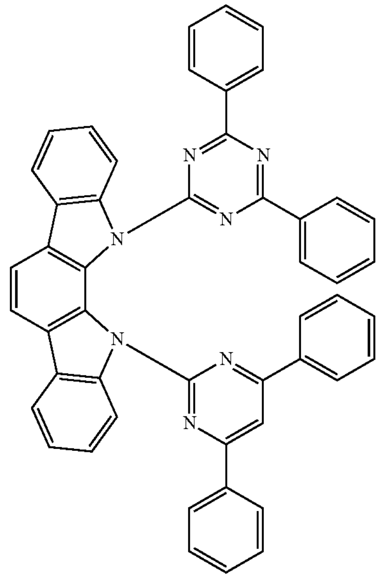
136
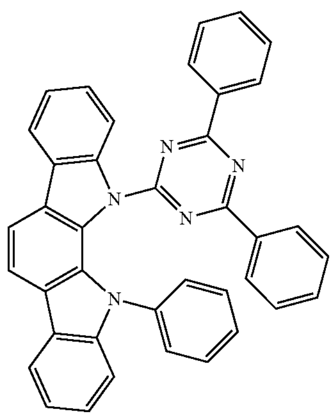
137
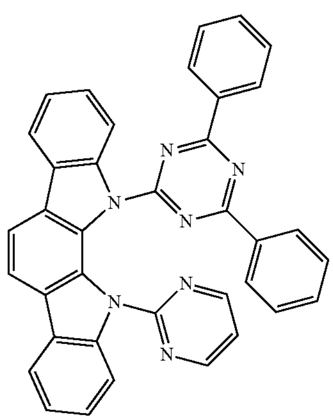
138
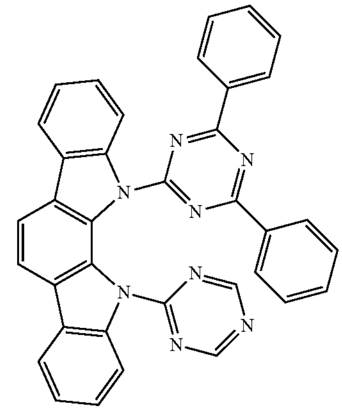
139
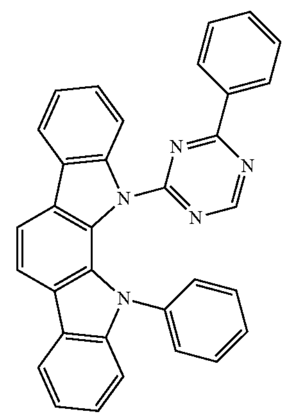
140
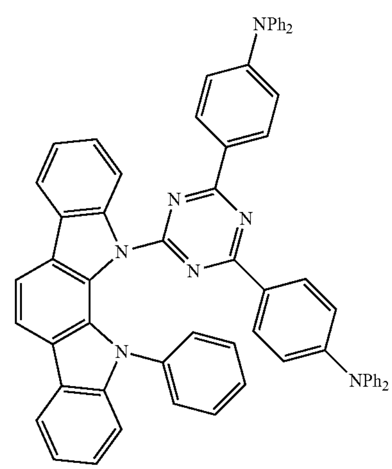

141
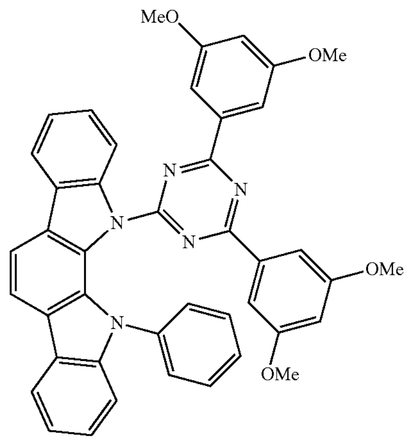
142
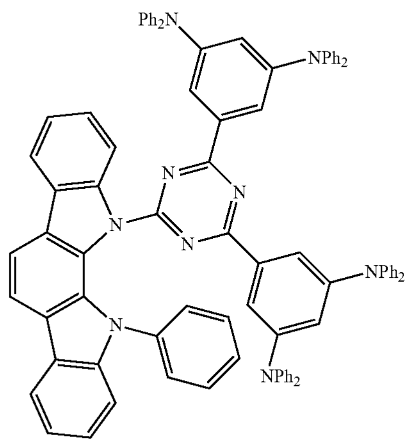
143
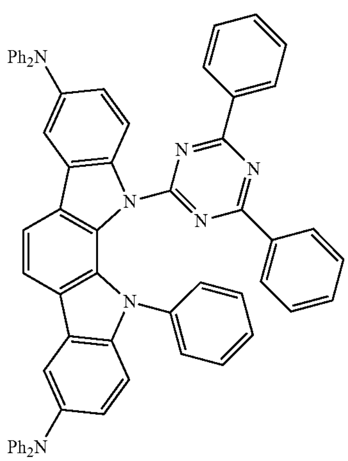
144
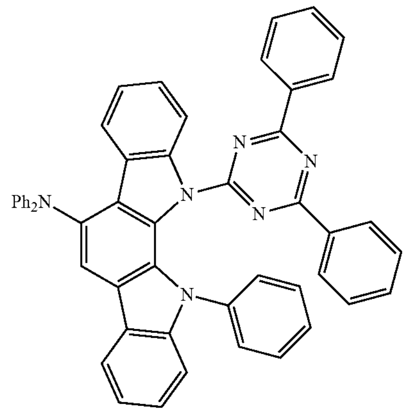
145
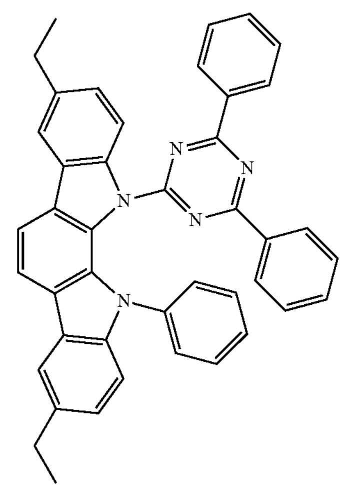
146
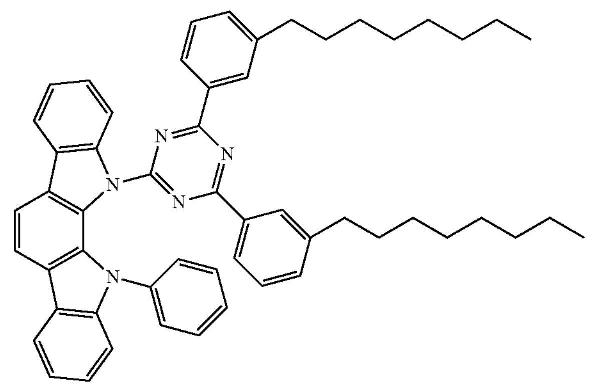

147
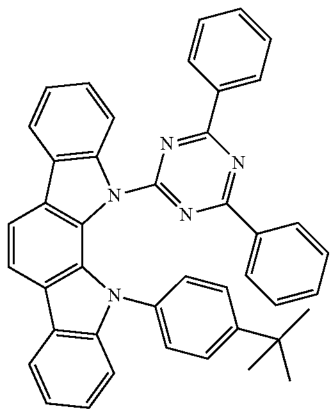
148
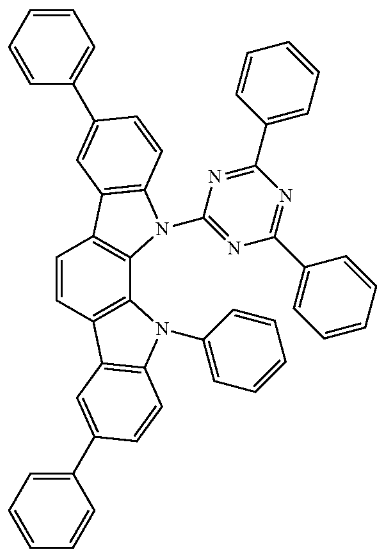
149
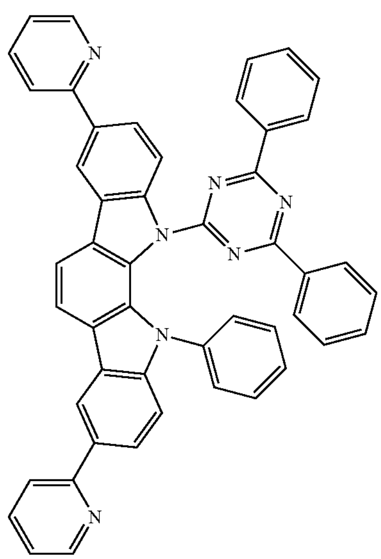
150
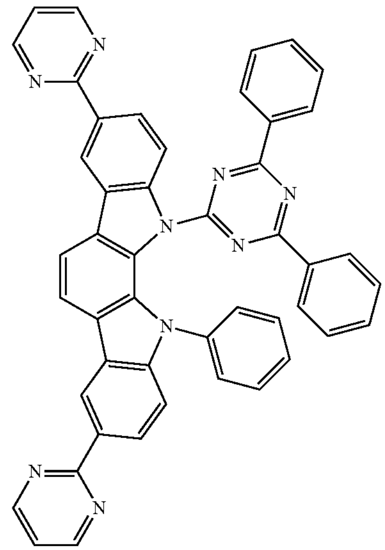
151
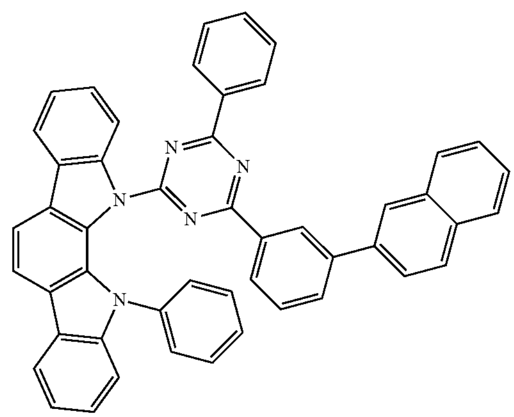
152
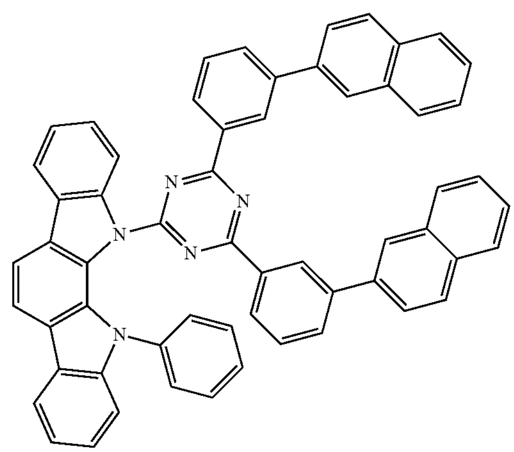

-continued
153
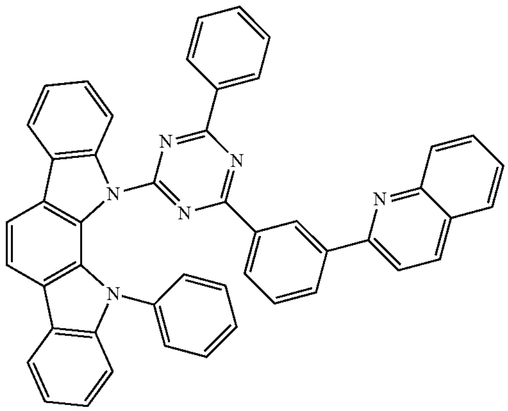
154
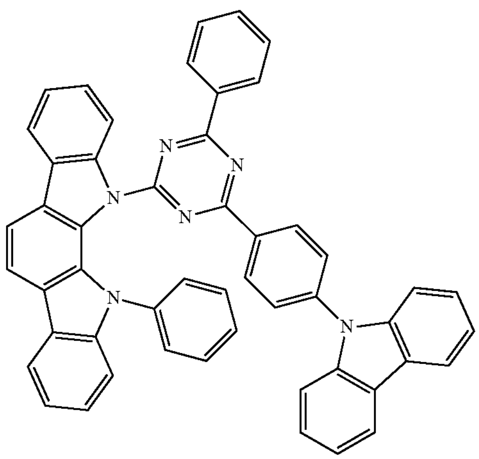
155
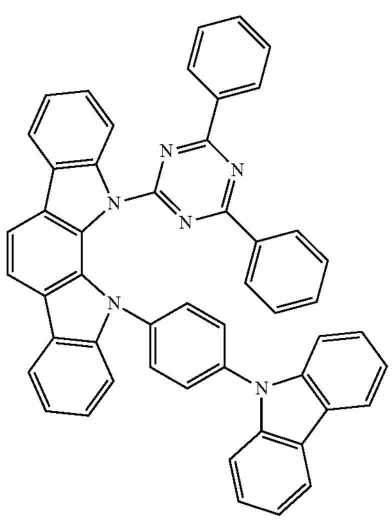
-continued
156
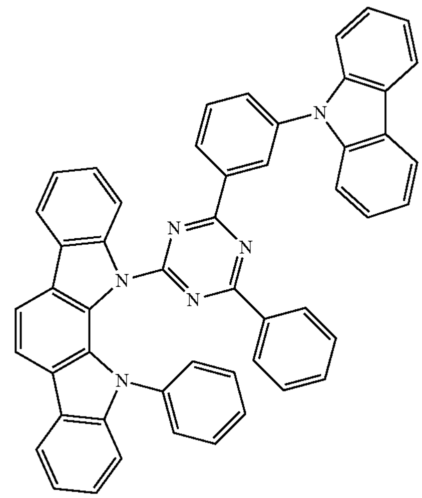
157
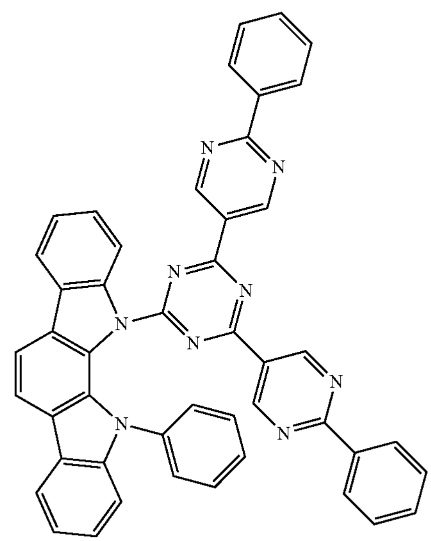
158
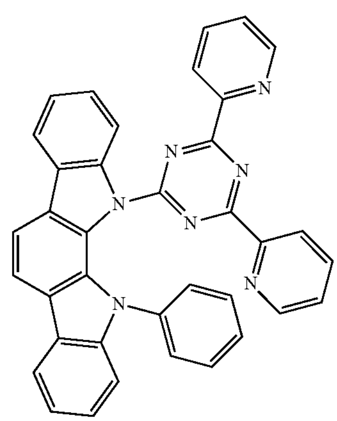

159
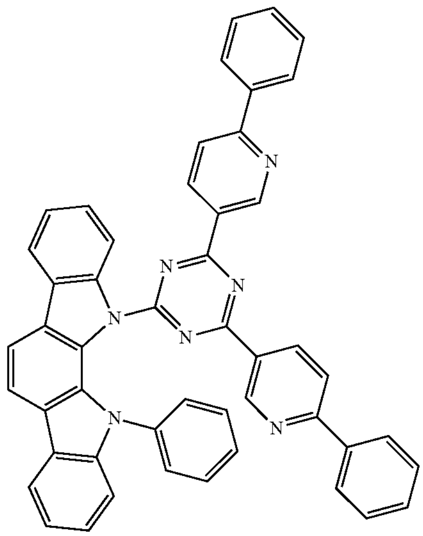
160
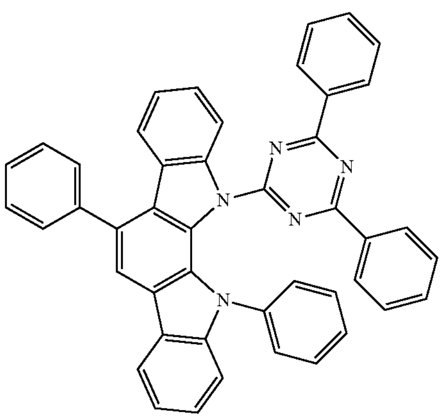
161
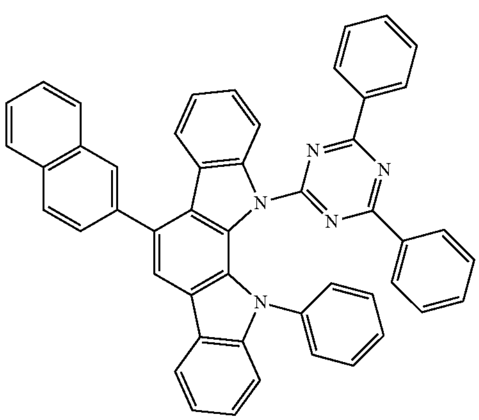
162
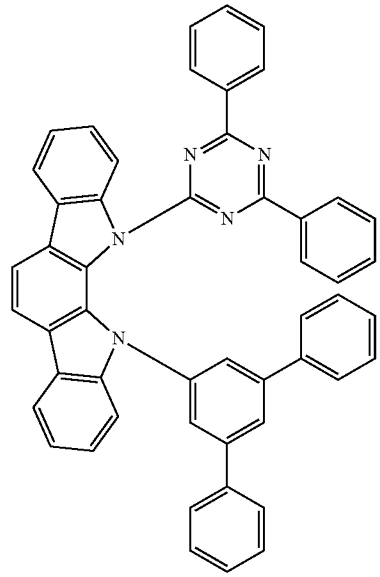
163
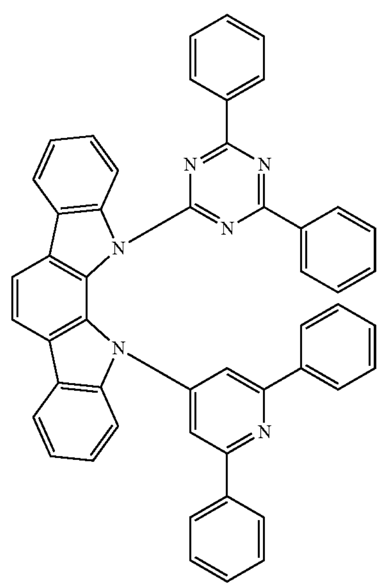

-continued
164
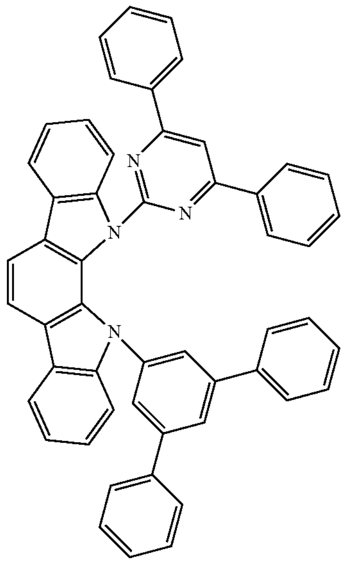
165
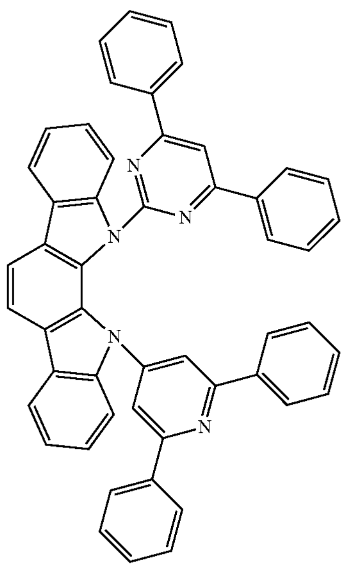
166
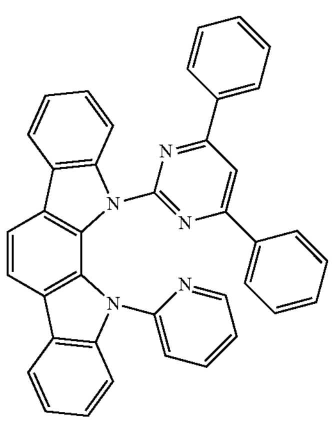
-continued
167
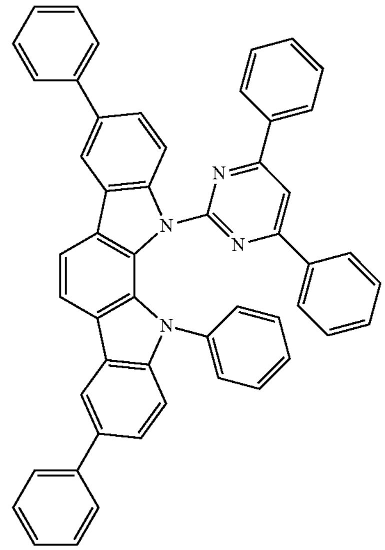
168
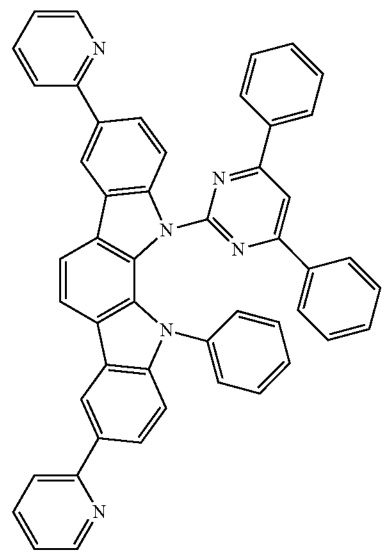
169
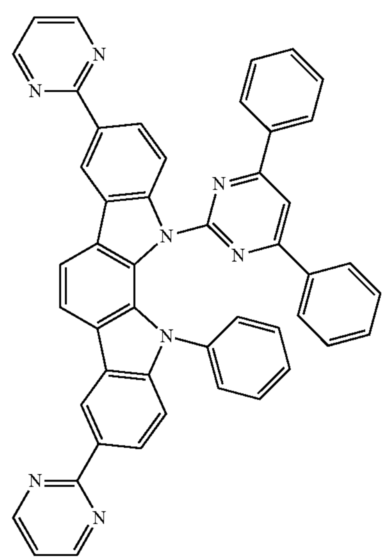

-continued
170
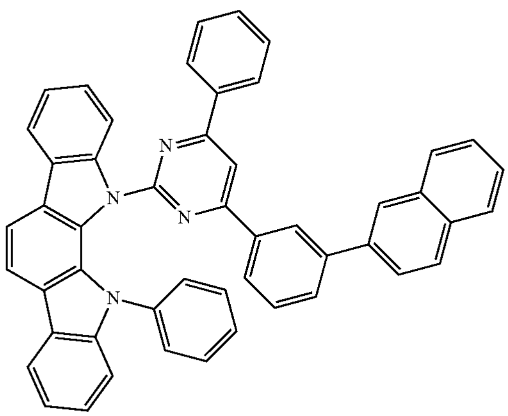
171
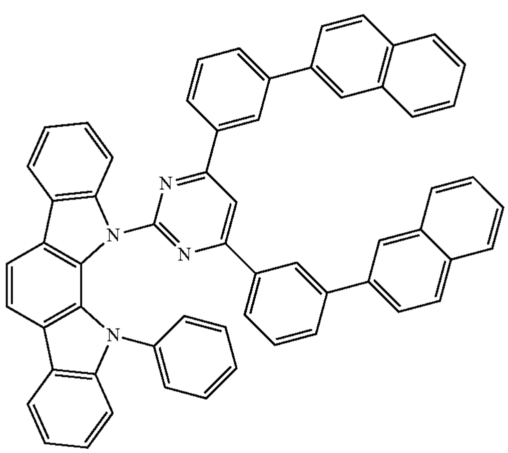
172
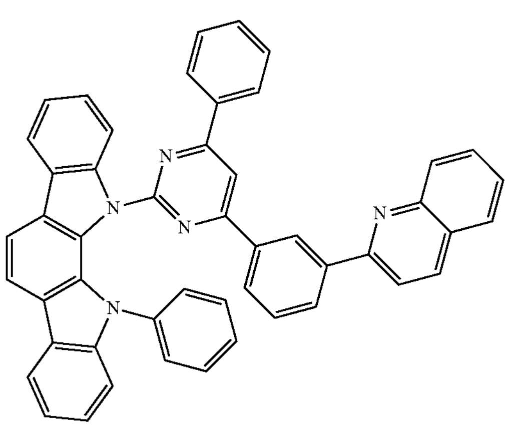
-continued
173
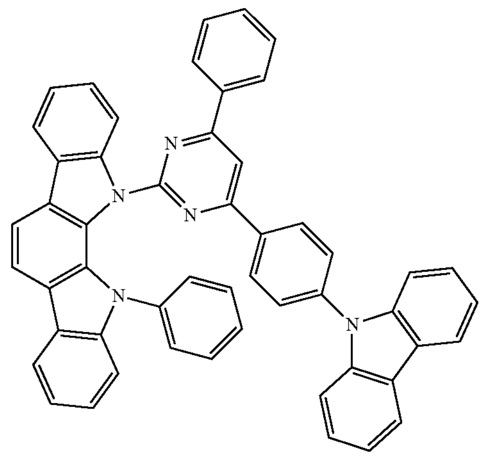
174
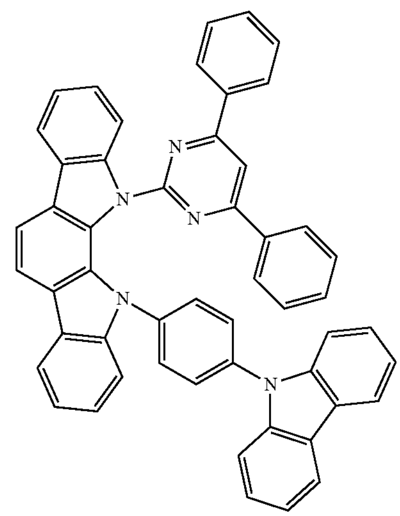
175
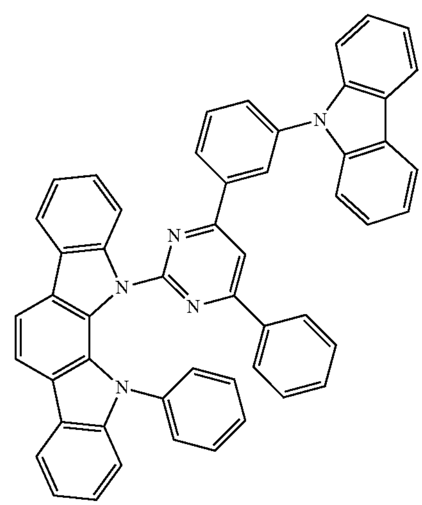

176
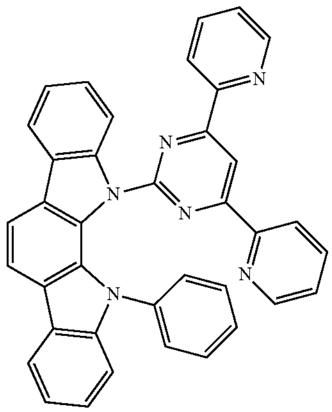
177
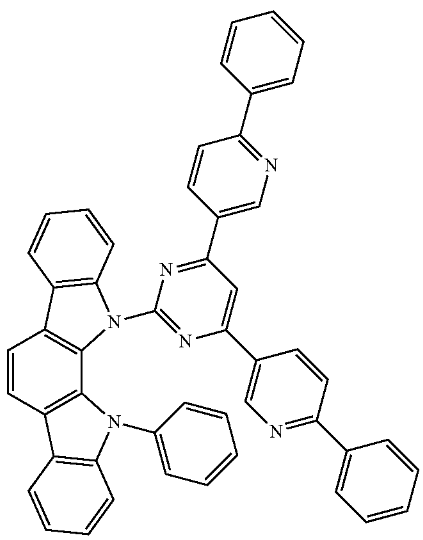
178
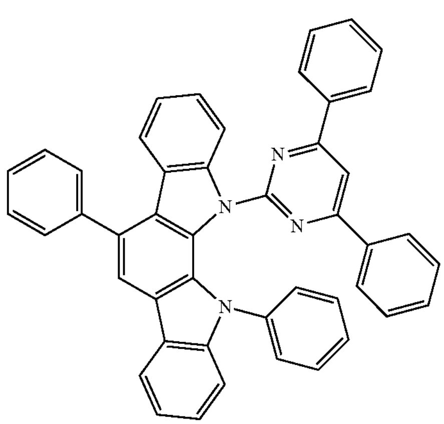
179
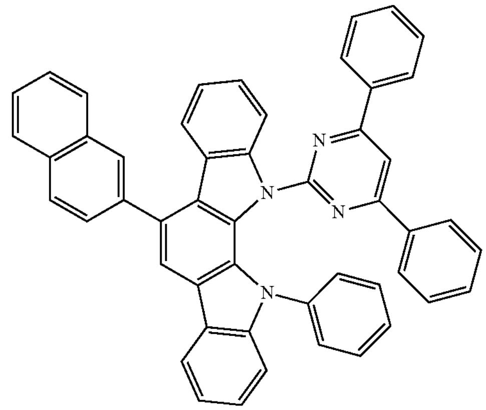
180
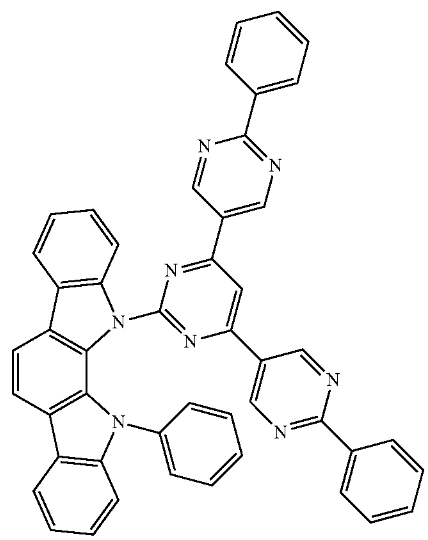
181
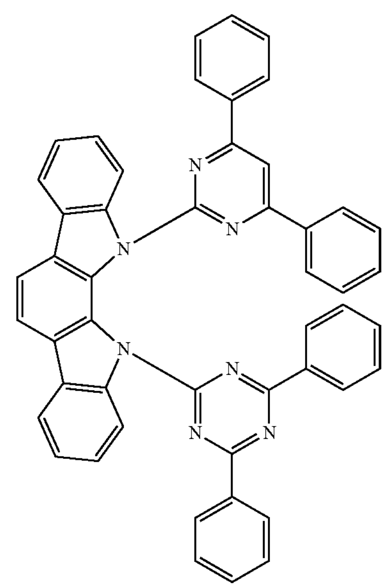

-continued
182
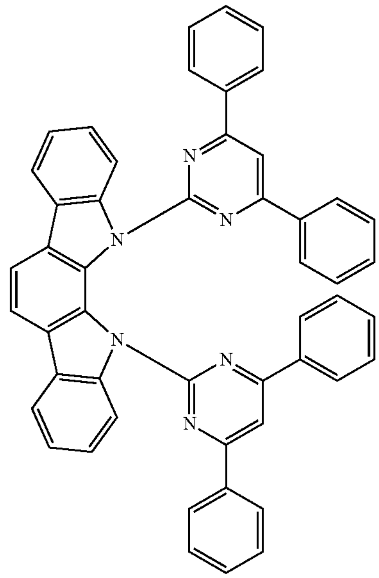
183
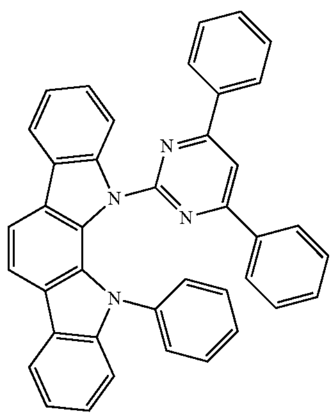
184
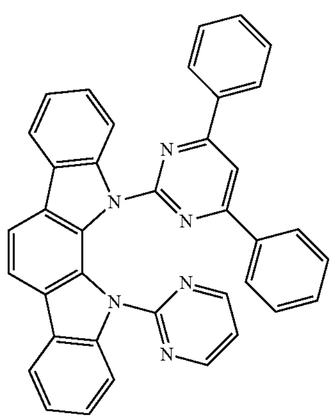
-continued
185
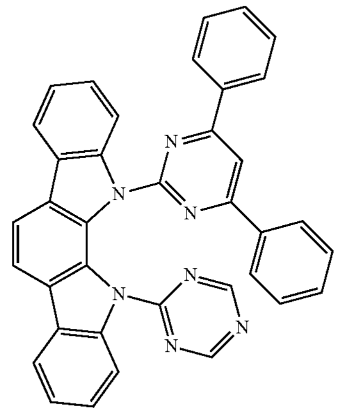
186
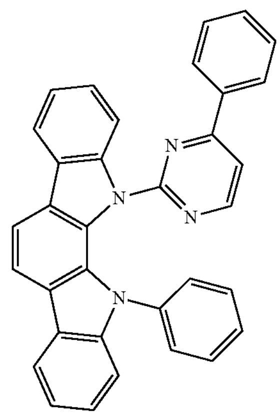
187
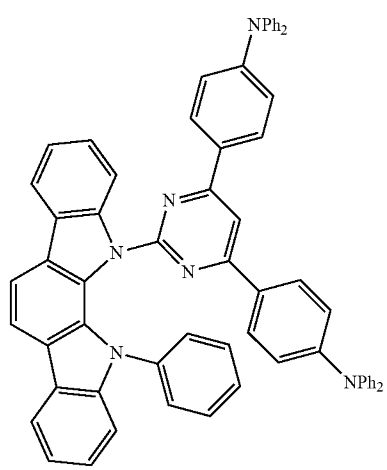

188
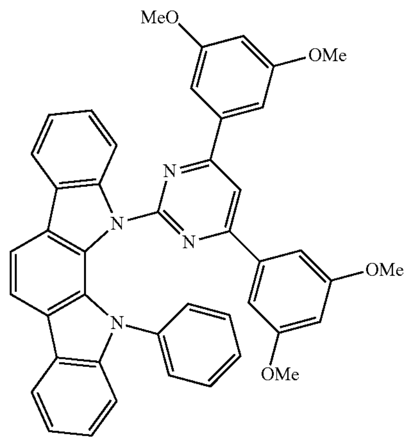
189
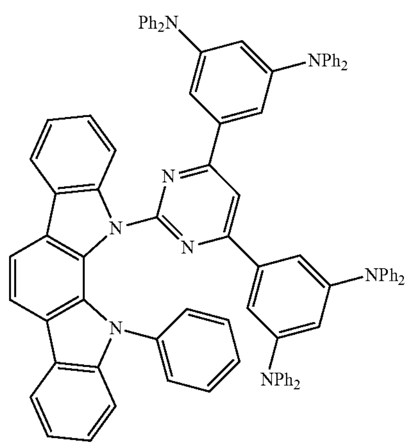
190
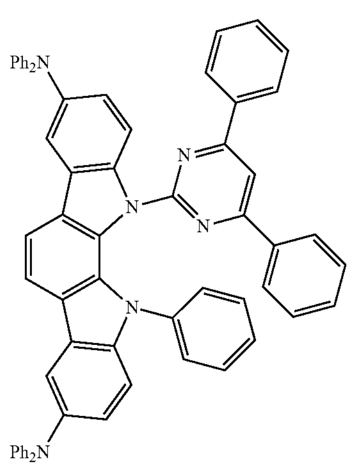
191
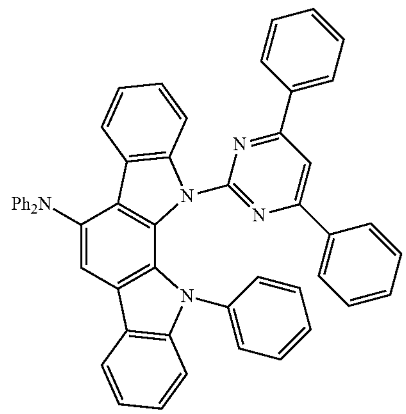
192
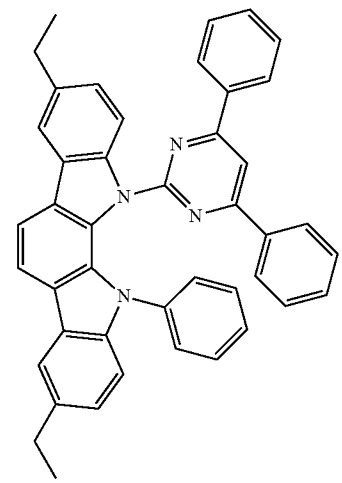
193
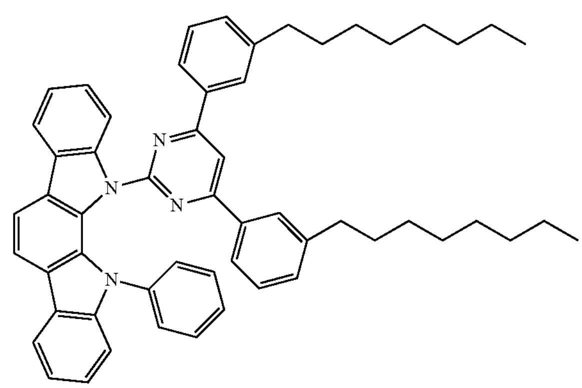

-continued
194
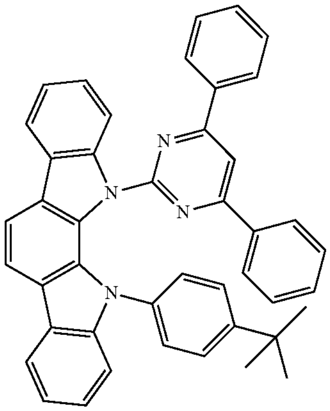
195
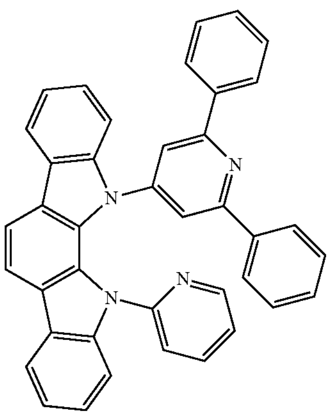
196
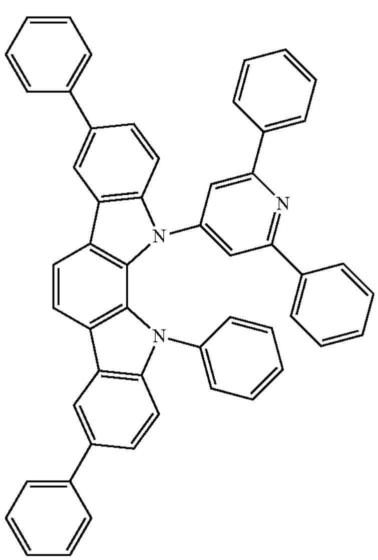
-continued
197
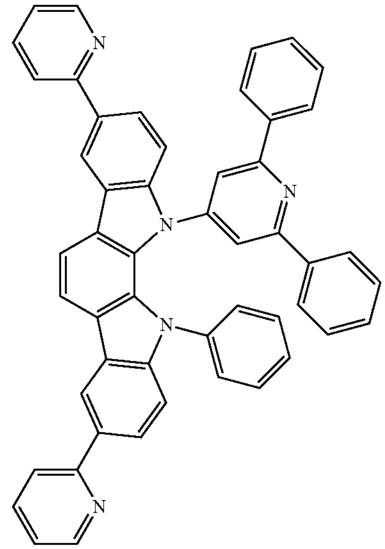
198
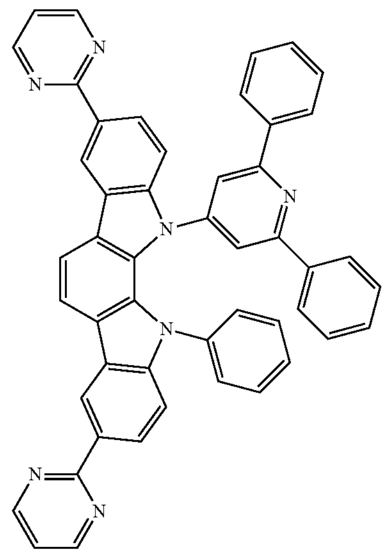
199
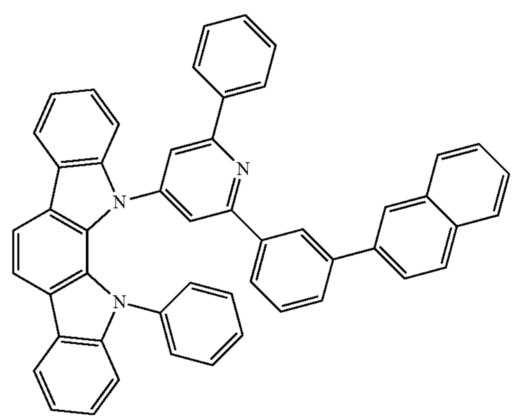

-continued
200
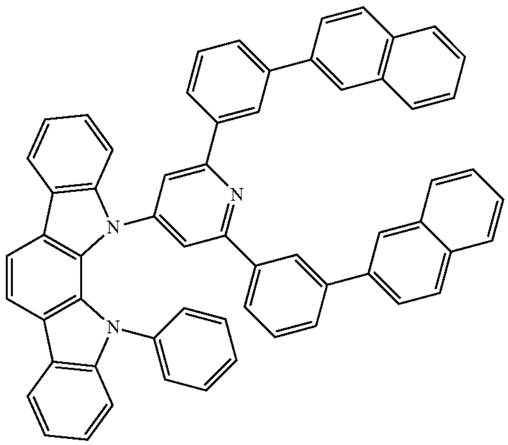
201
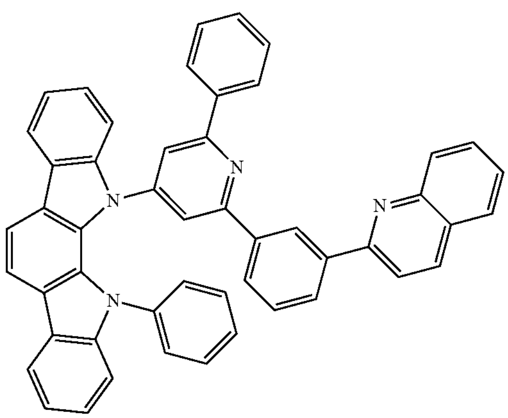
202
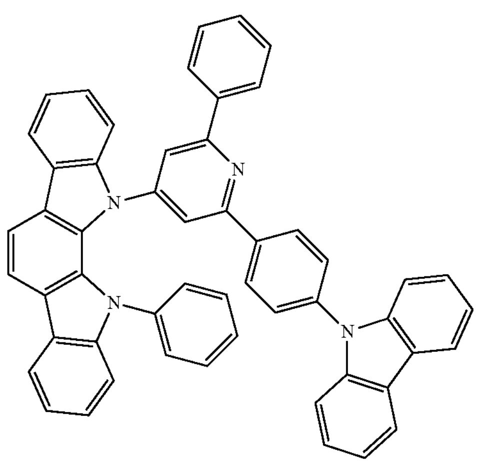
-continued
203
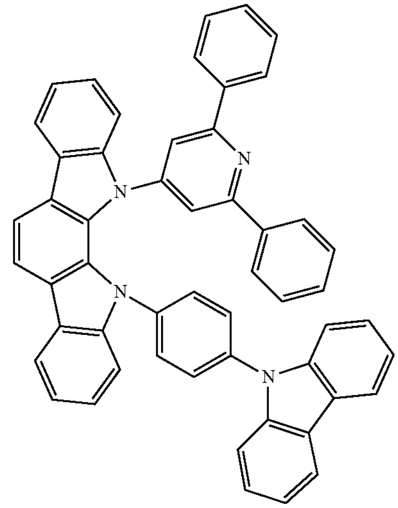
204
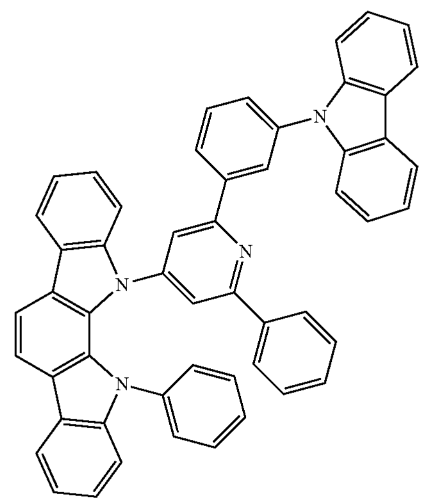
205
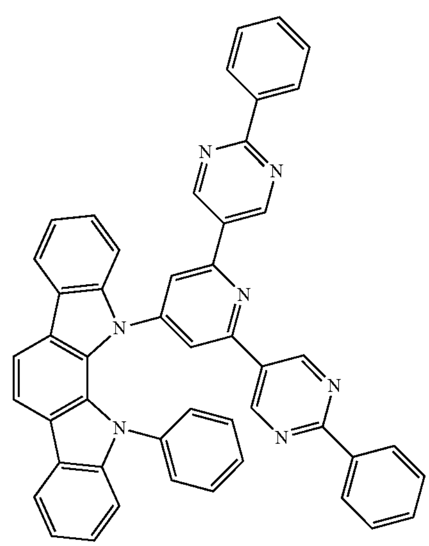

-continued
206
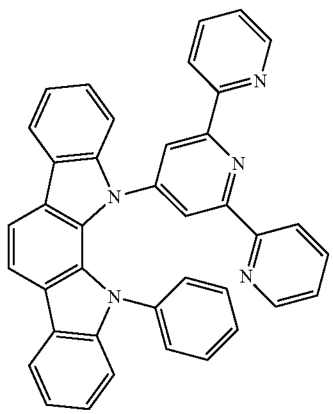
207
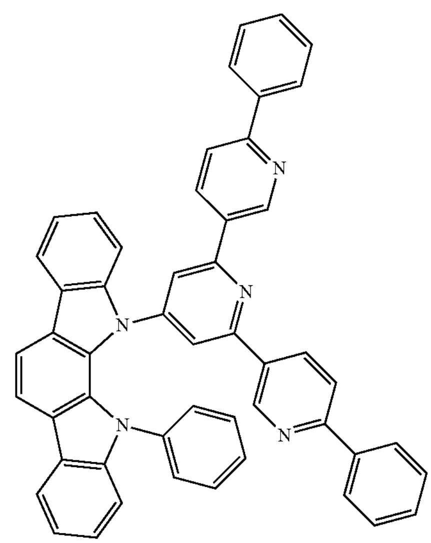
208
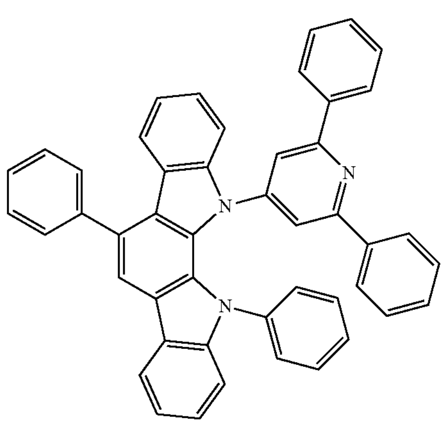
-continued
209
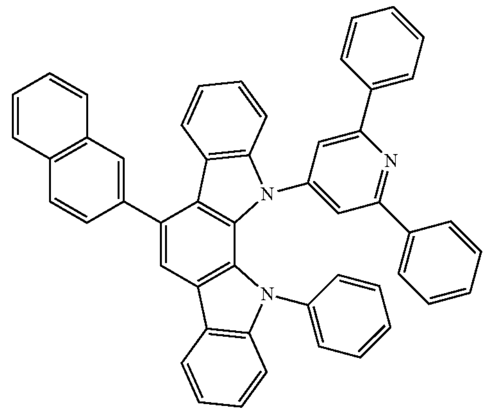
210
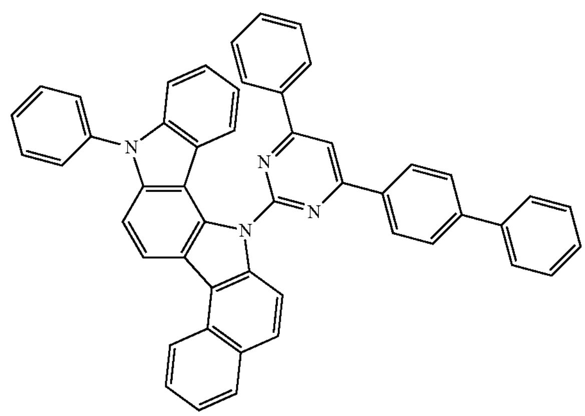
211
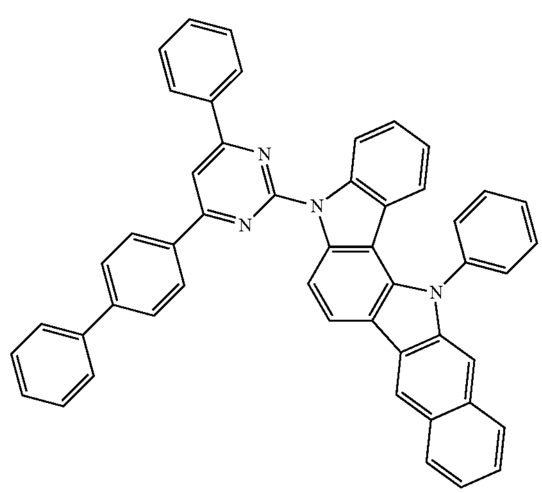

-continued
212
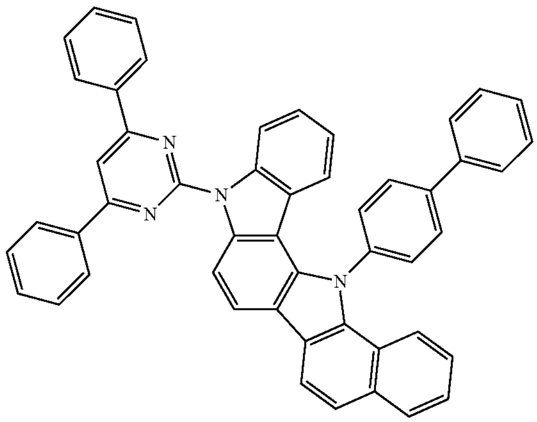
213
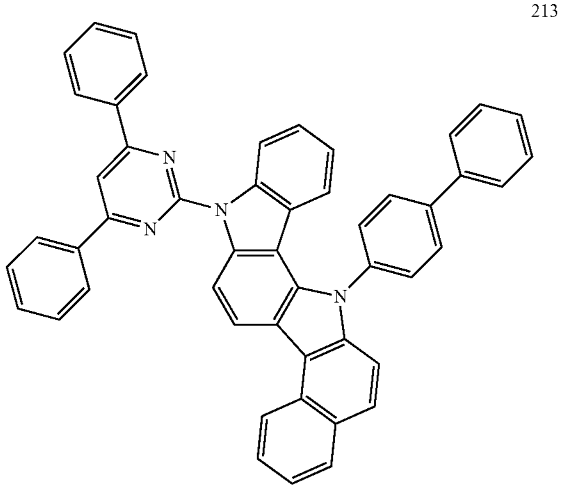
214
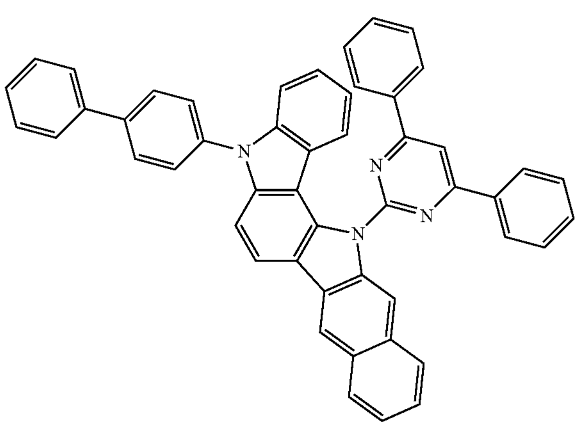
-continued
215
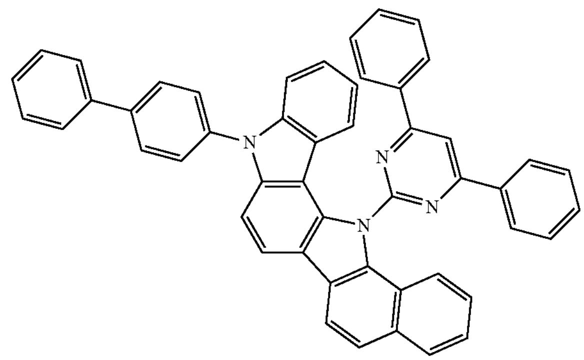
216
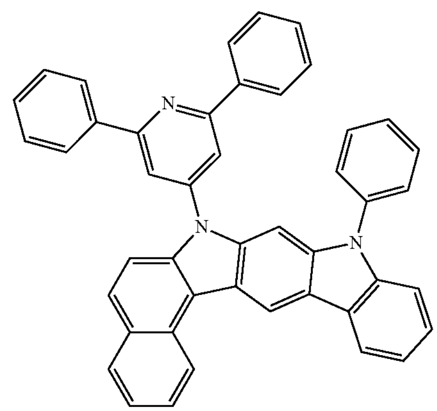
217
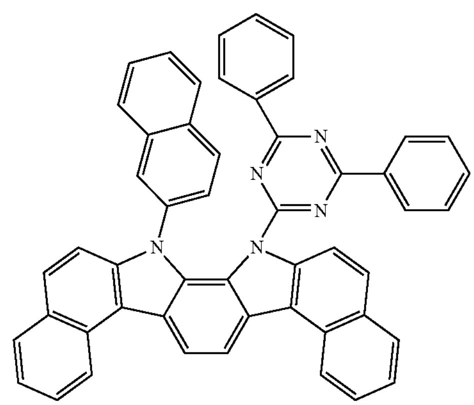
218
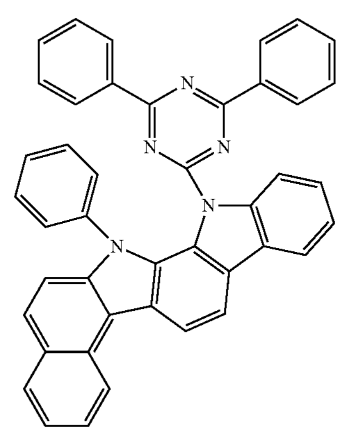

-continued
219
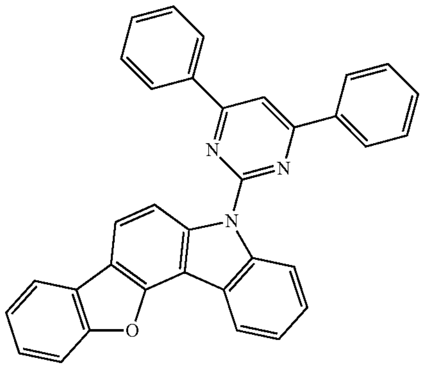
220
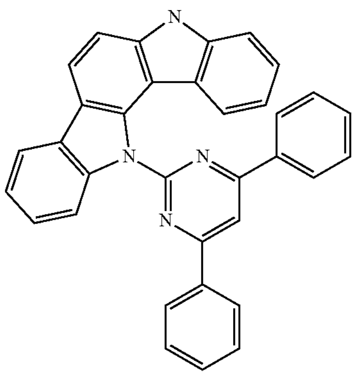
221
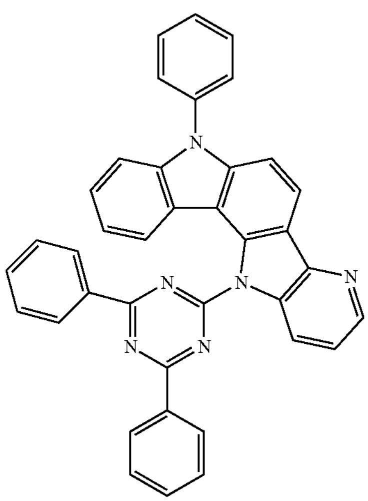
222
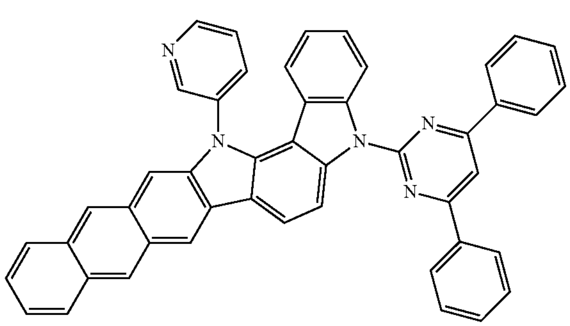
-continued
223
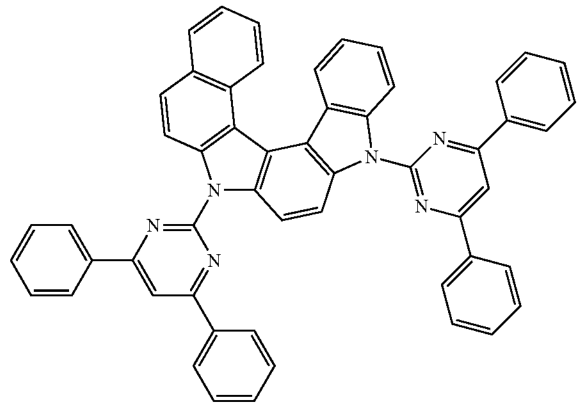
224
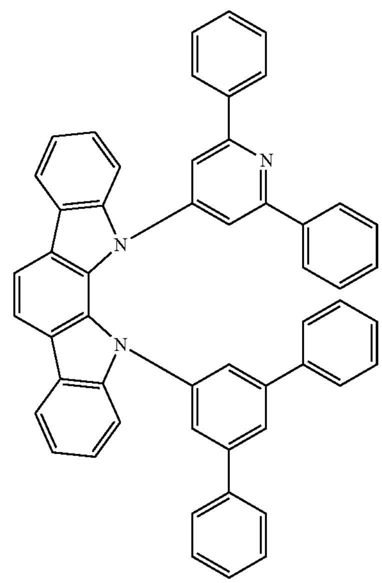
225
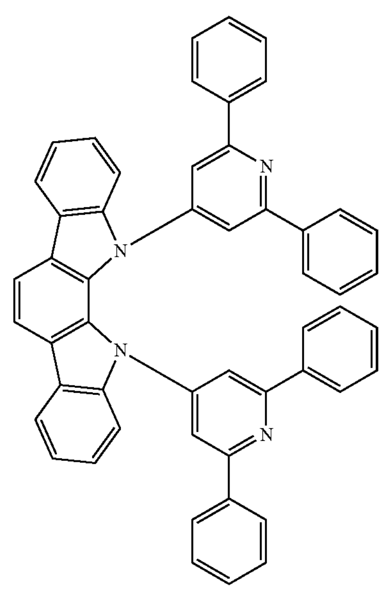

-continued
226
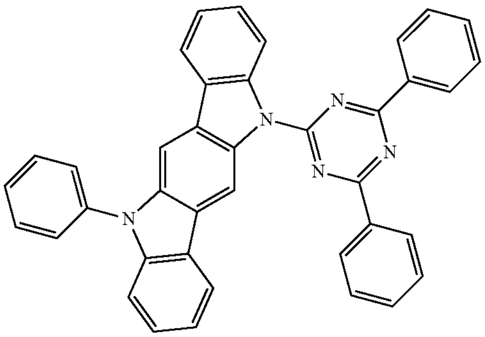
227
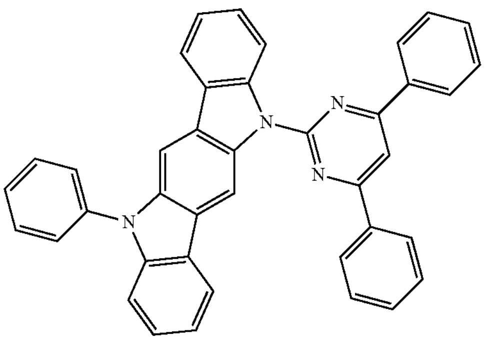
228
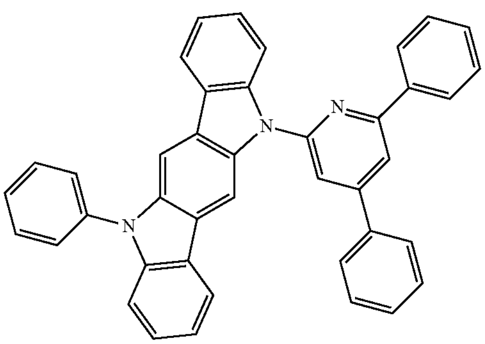
229
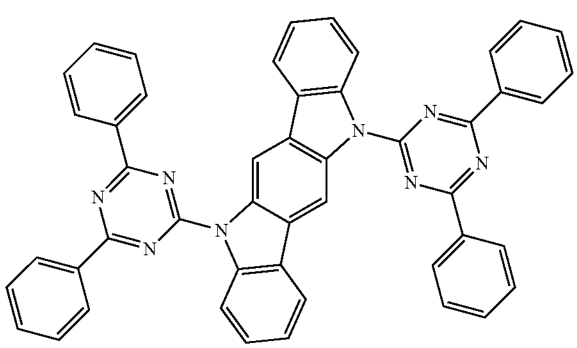
-continued
230
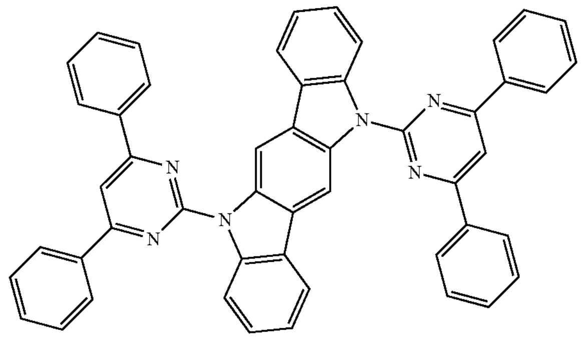
231
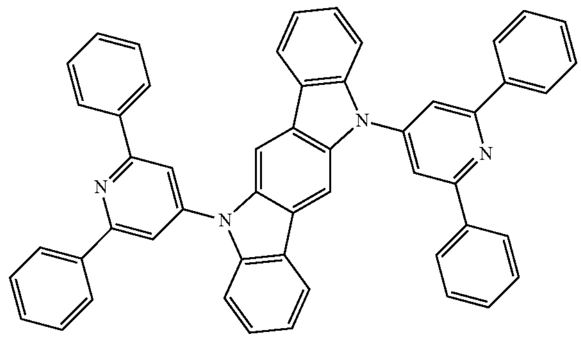
232
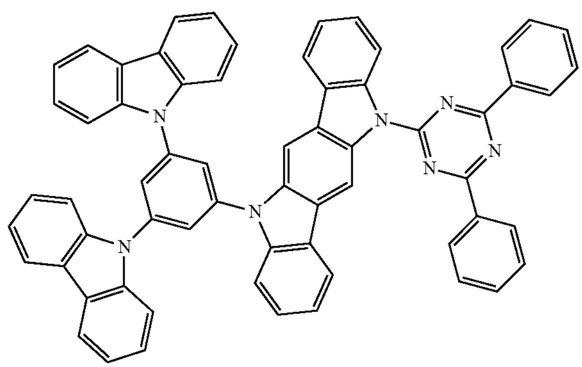
233
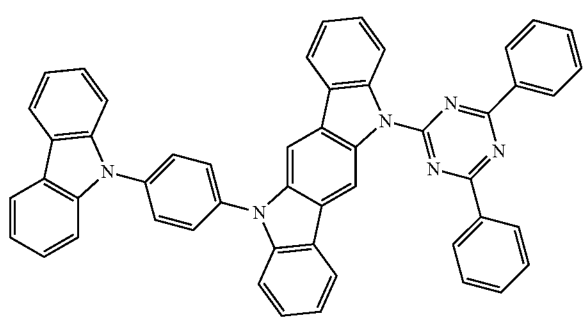

-continued
234
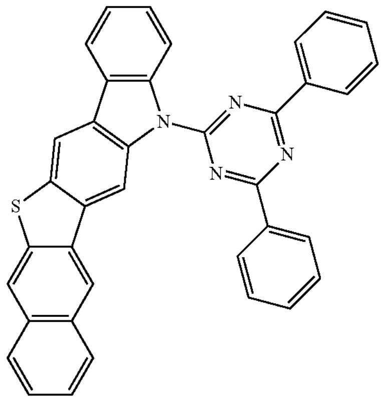
235
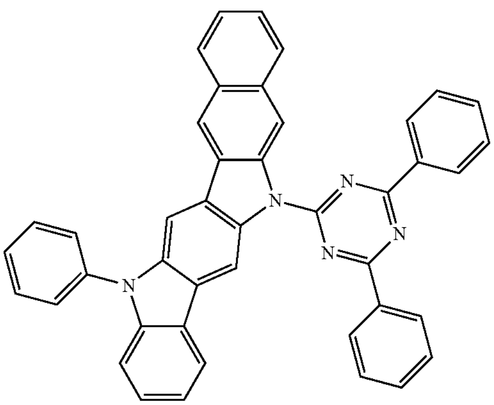
236
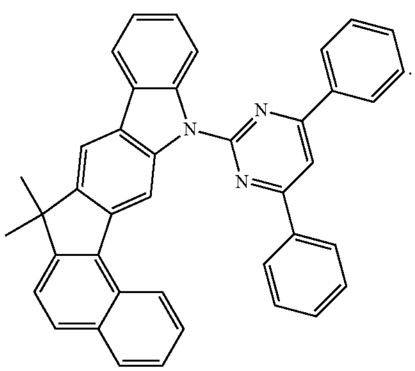
The hole-transporting region includes at least one selected from Compounds 6-1 to 6-144:
6-1
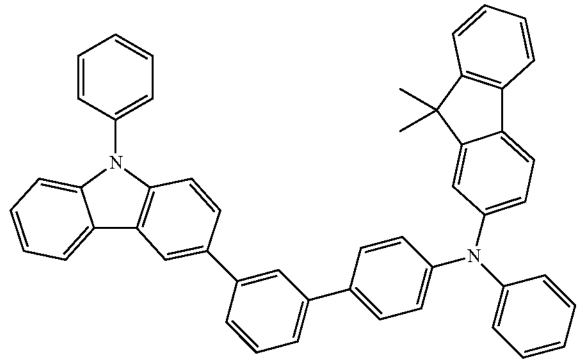
6-2
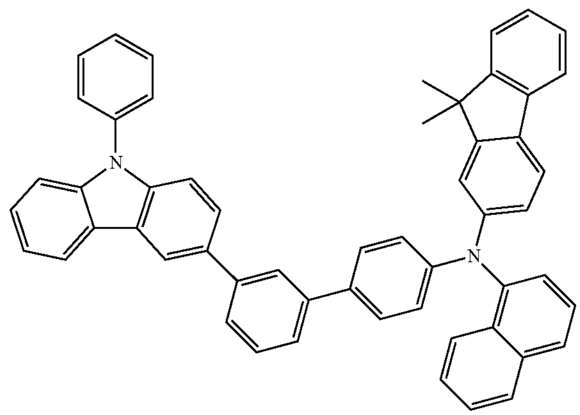
6-3
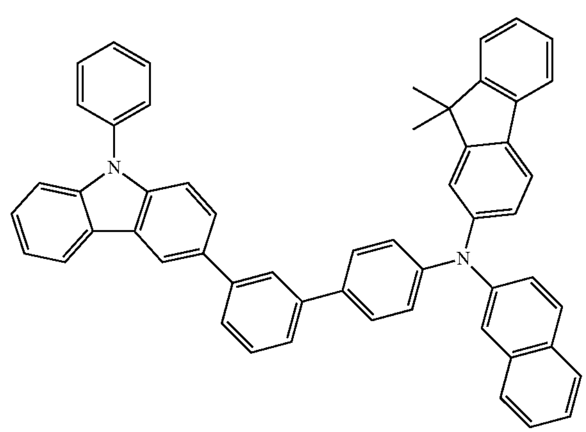

-continued
6-4
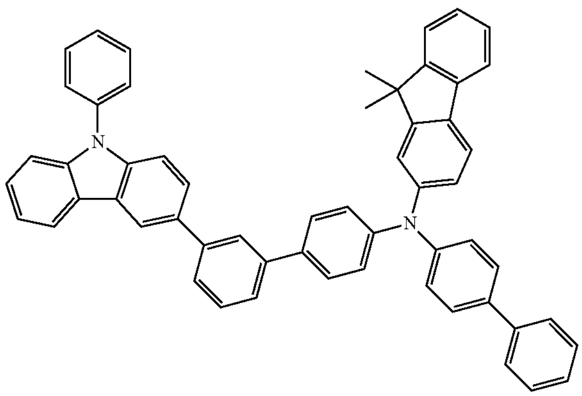
6-5
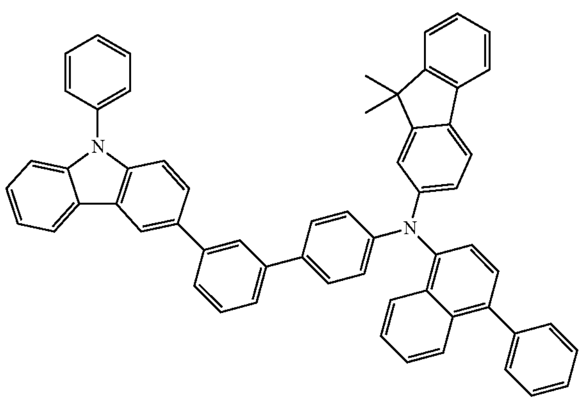
6-6
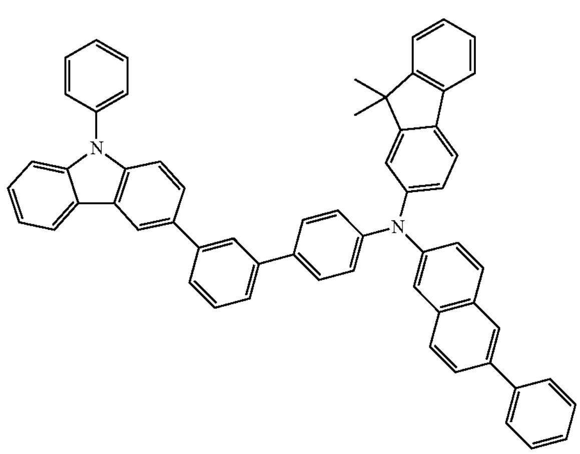
-continued
6-7
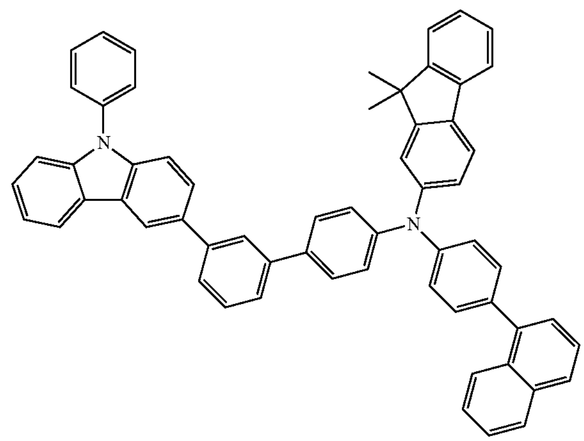
6-8
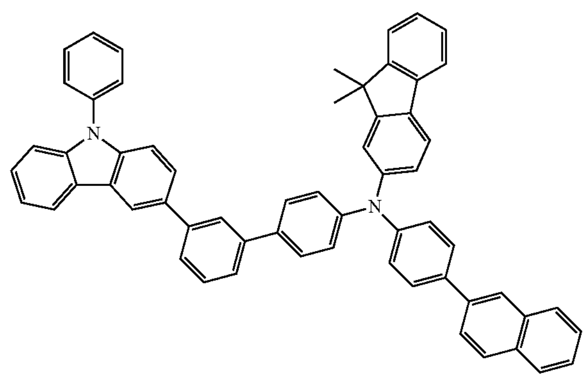
6-9
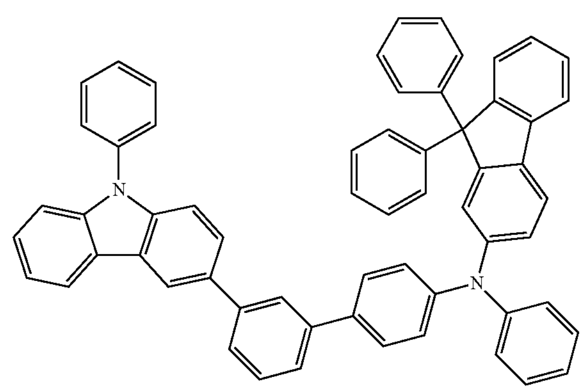

-continued
6-10
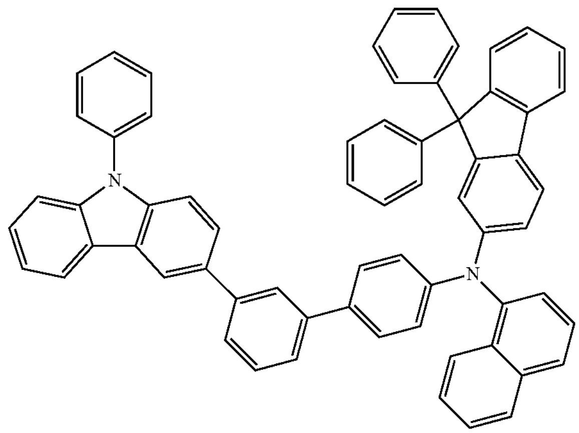
6-11
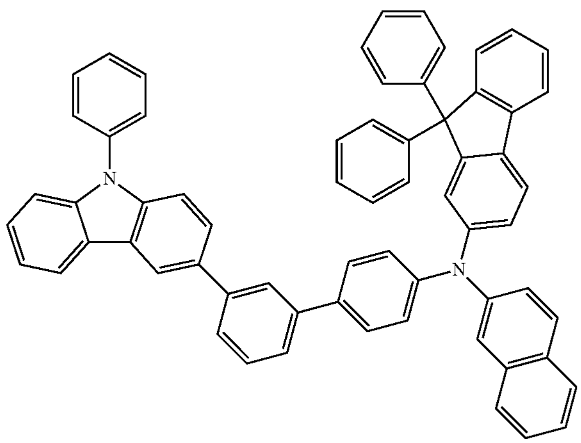
6-12
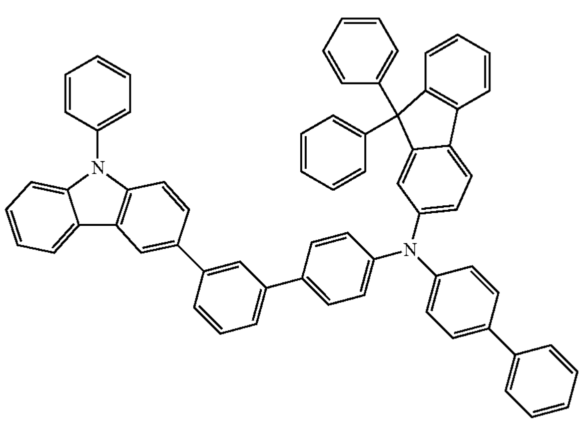
-continued
6-13
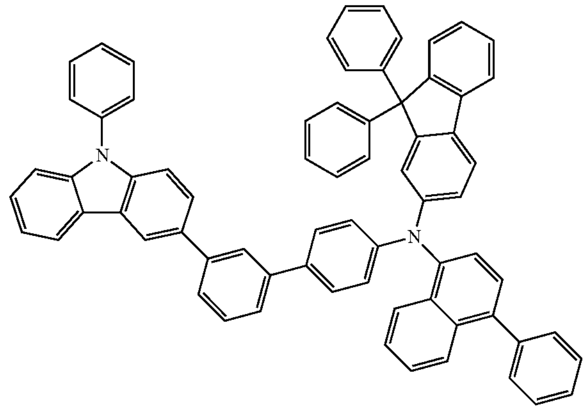
6-14
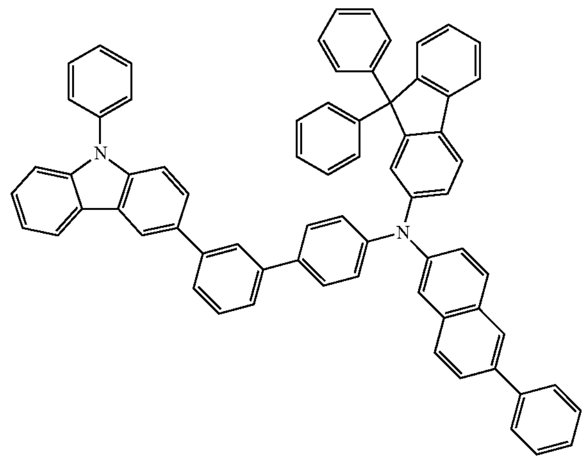
6-15
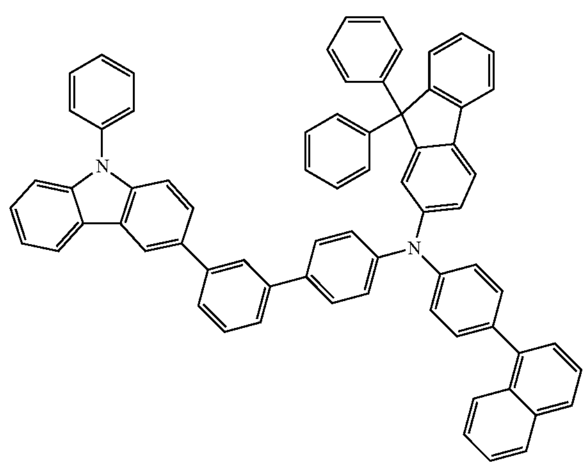

-continued
6-16
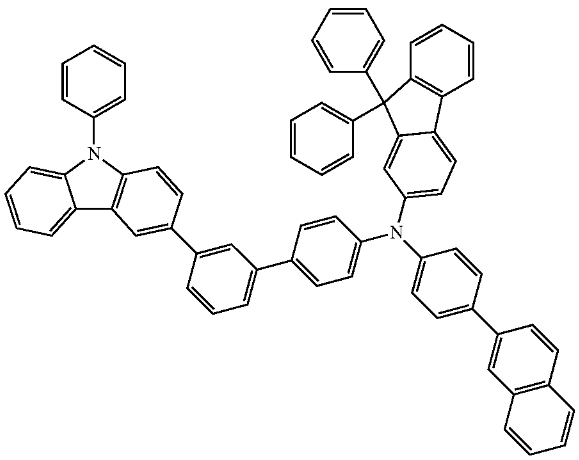
6-17
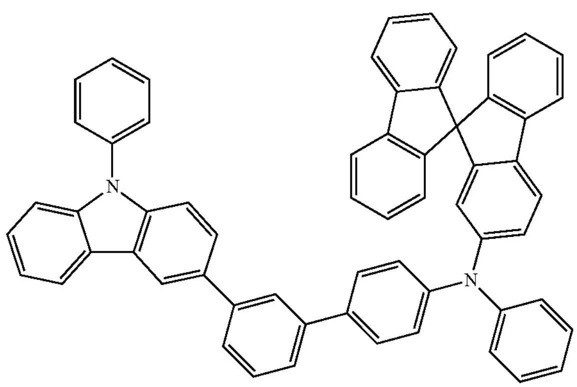
6-18
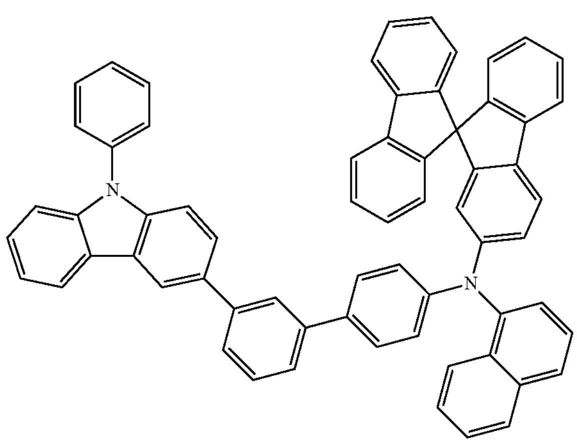
-continued
6-19
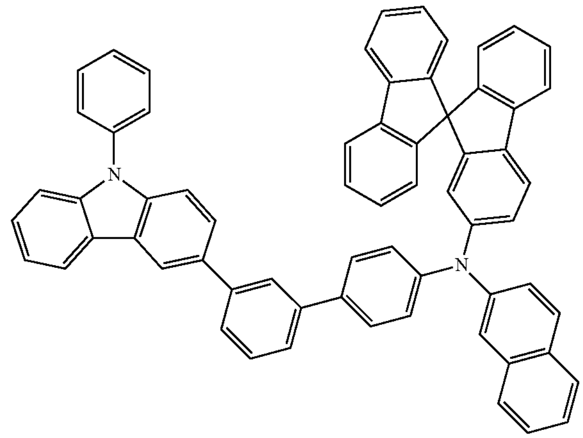
6-20
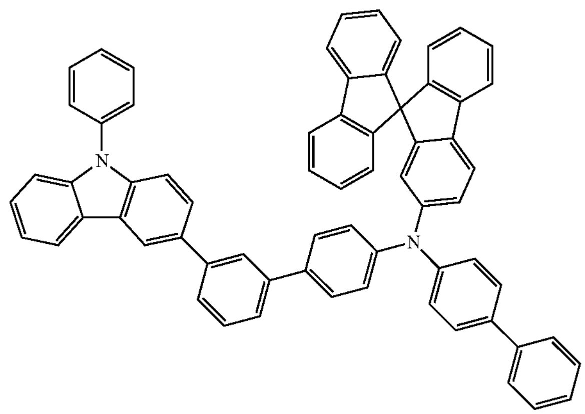
6-21
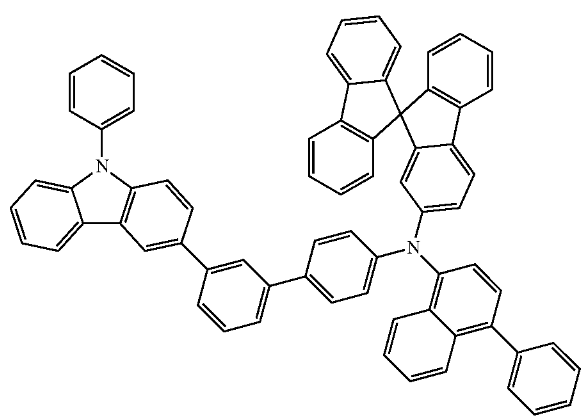

-continued
6-22
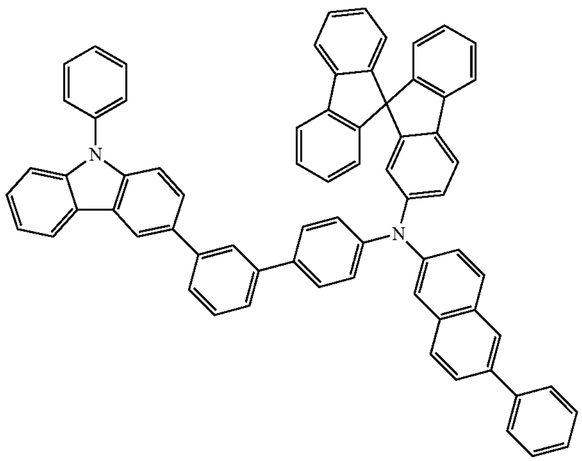
6-23
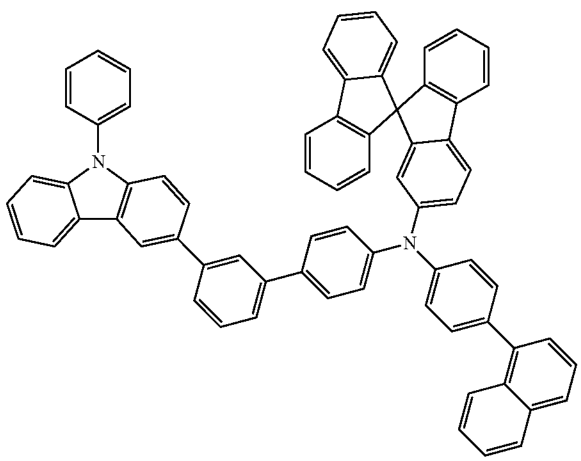
6-24
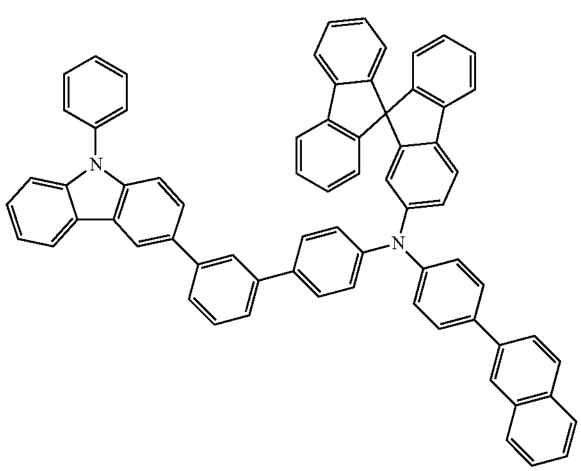
-continued
6-25
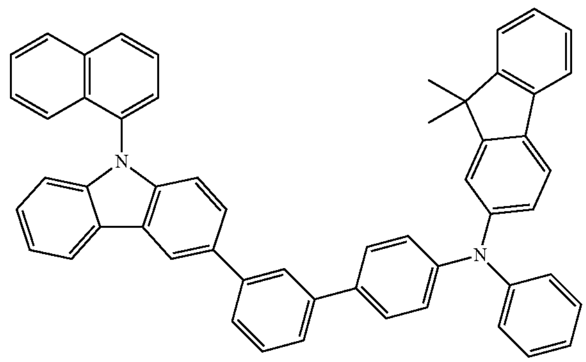
6-26
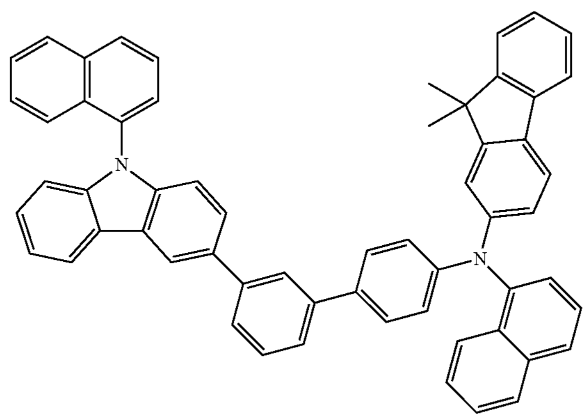
6-27
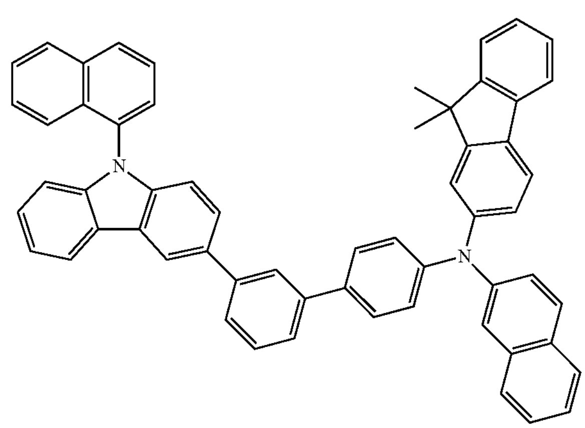

-continued
6-28
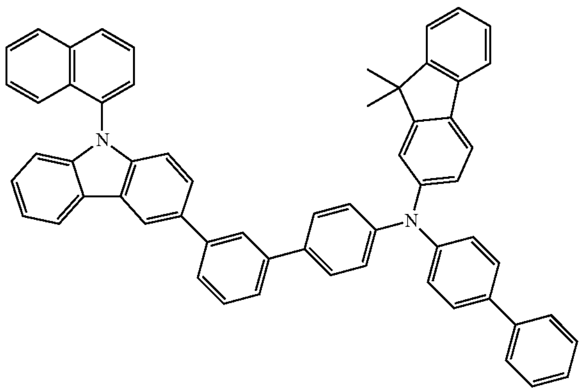
6-29
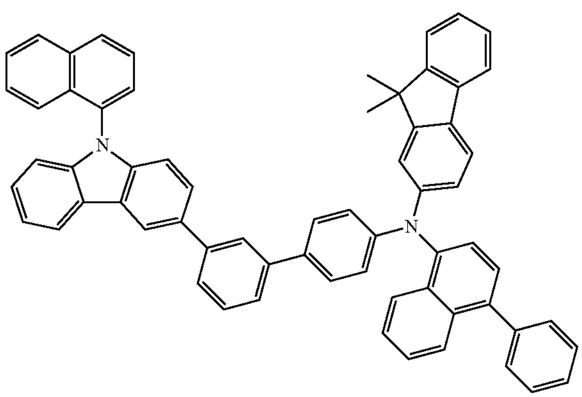
6-30
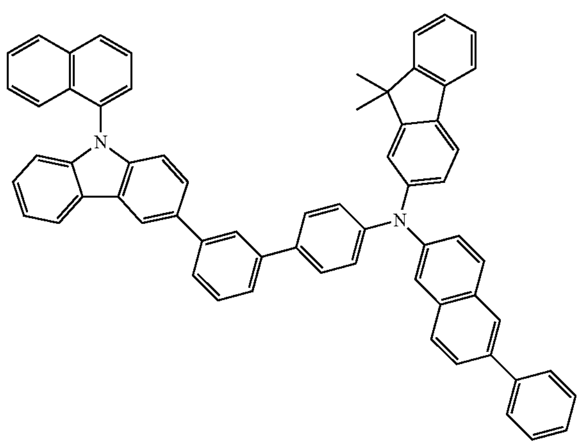
-continued
6-31
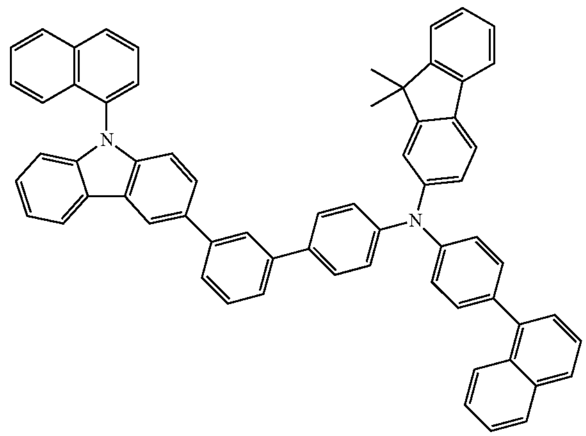
6-32
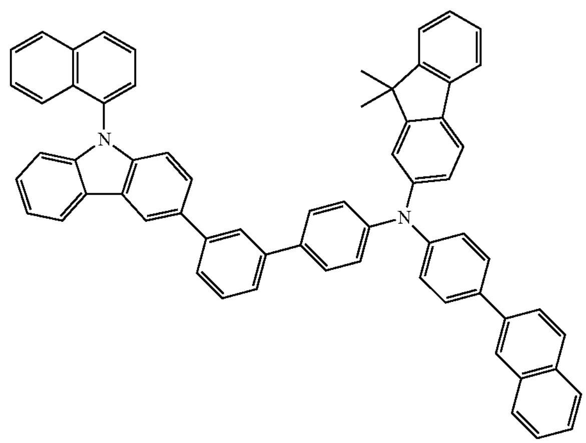
6-33
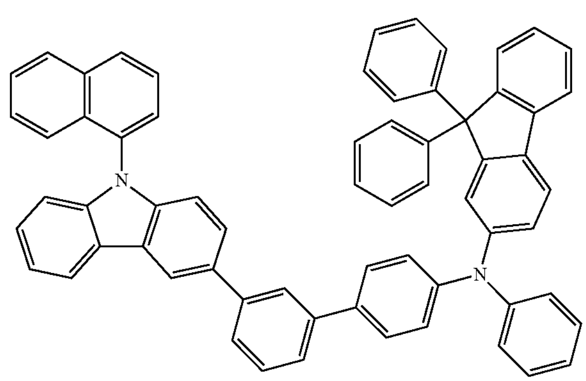

6-34
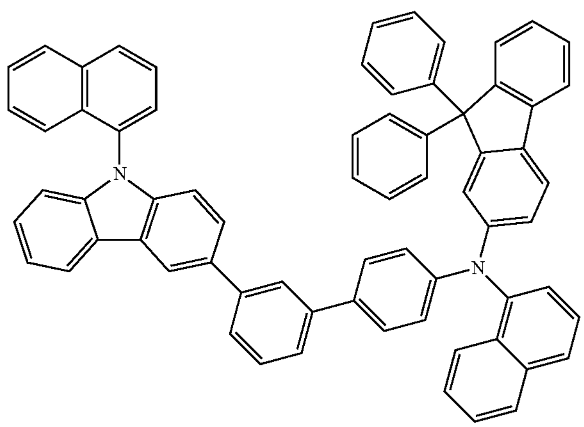
6-35
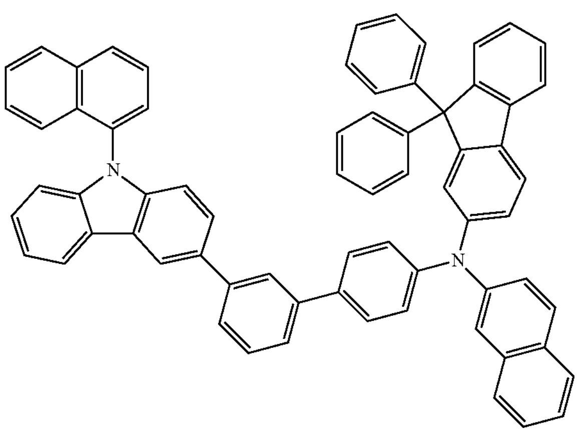
6-36
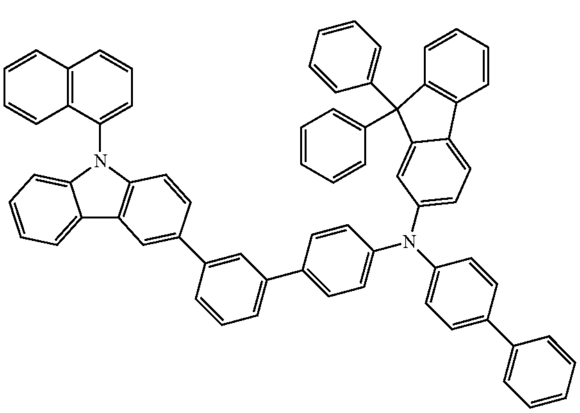
6-37
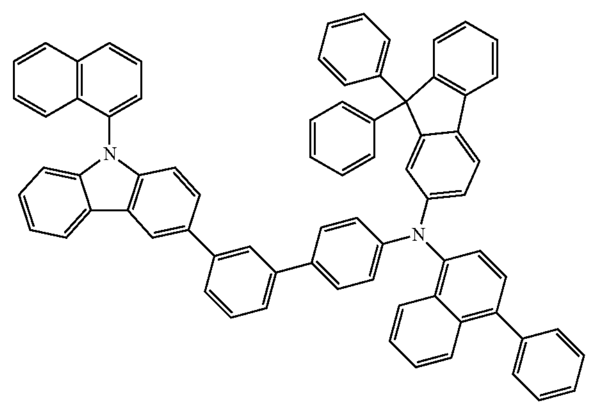
6-38
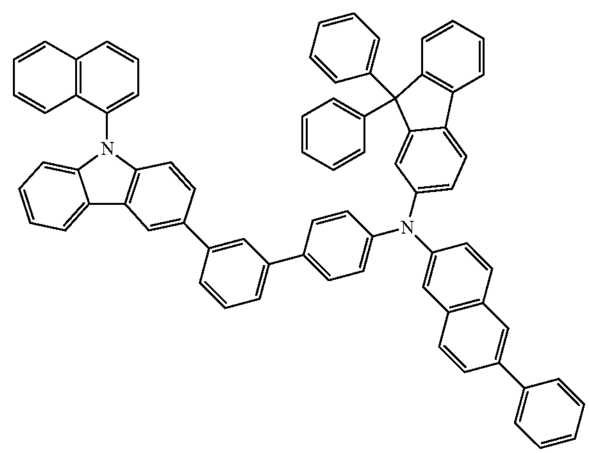
6-39
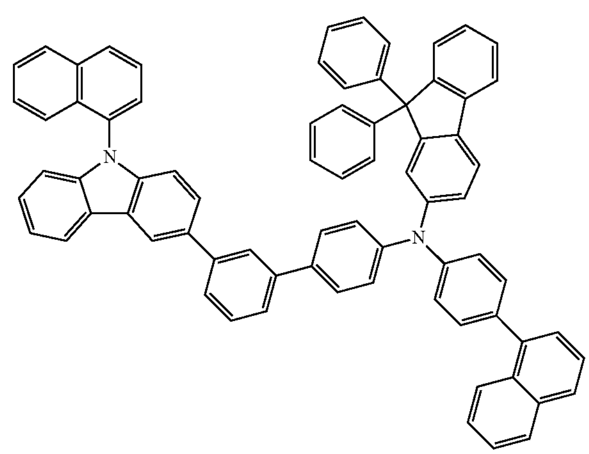

6-40
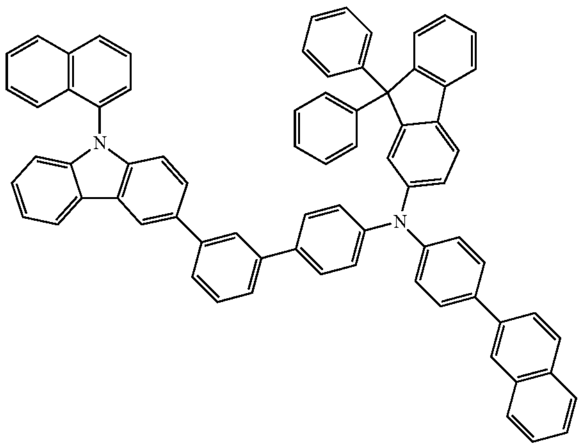
6-41
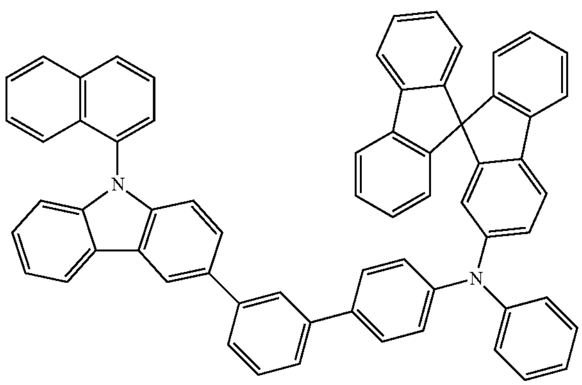
6-42
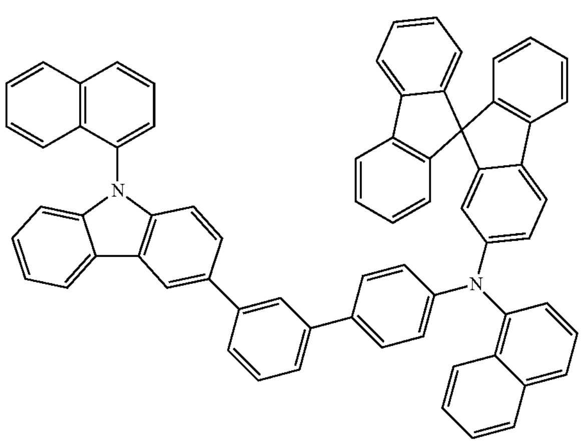
6-43
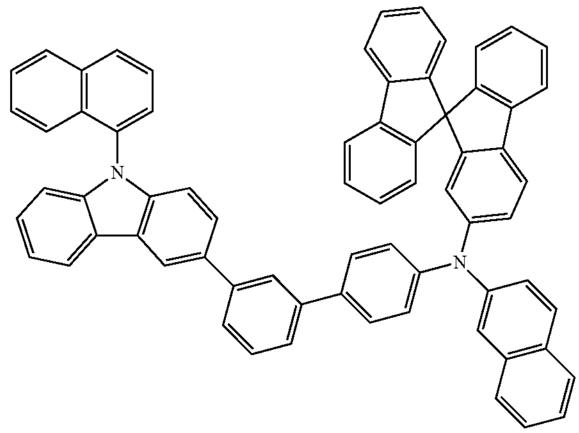
6-44
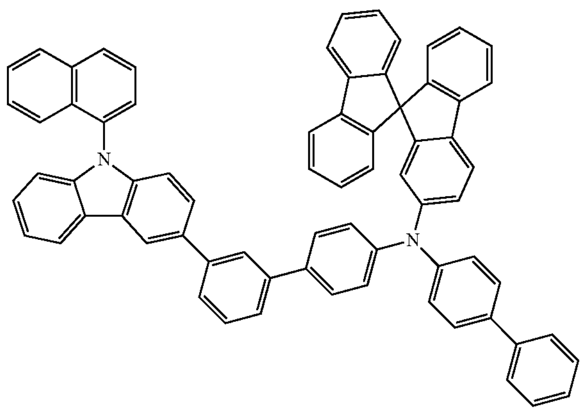
6-45
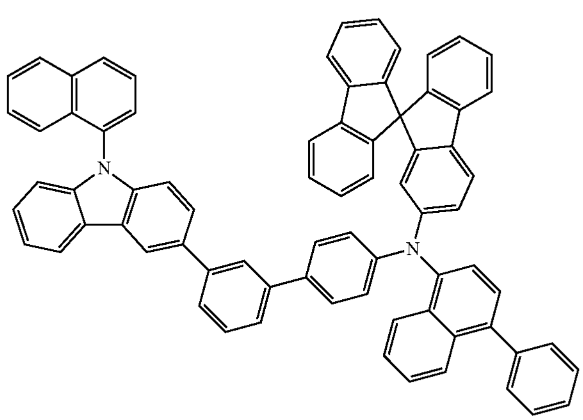

-continued
6-46
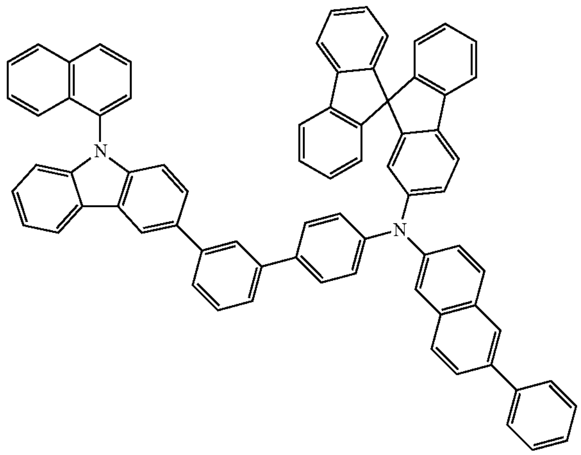
6-47
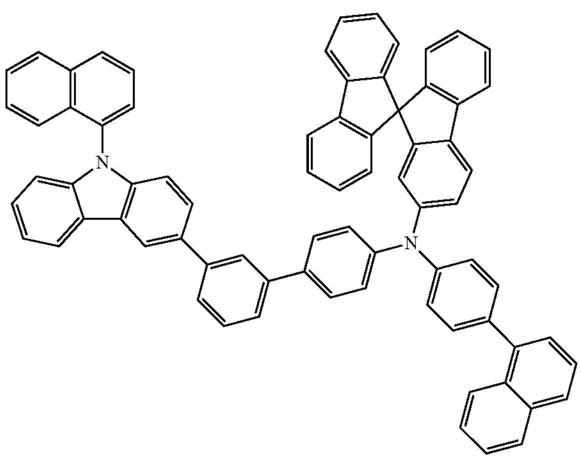
6-48
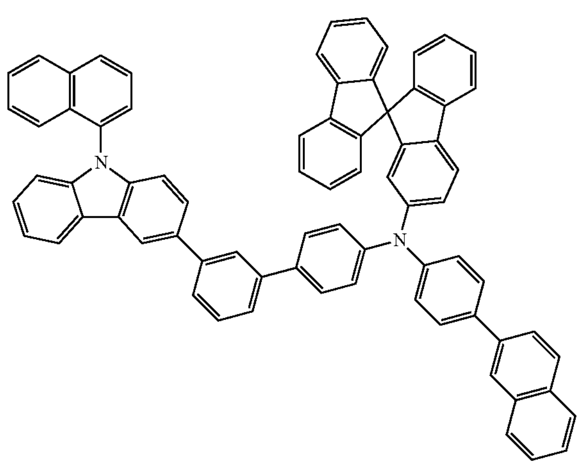
-continued
6-49
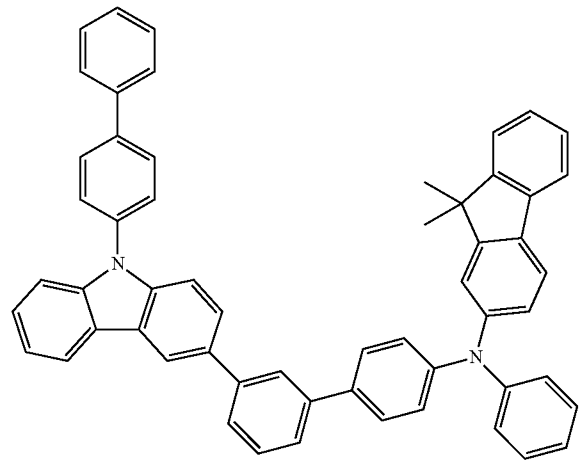
6-50
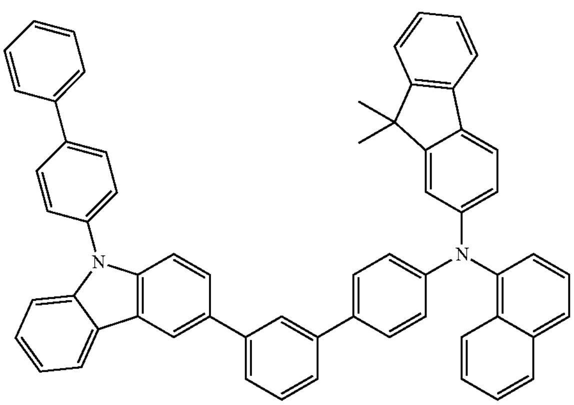
6-51
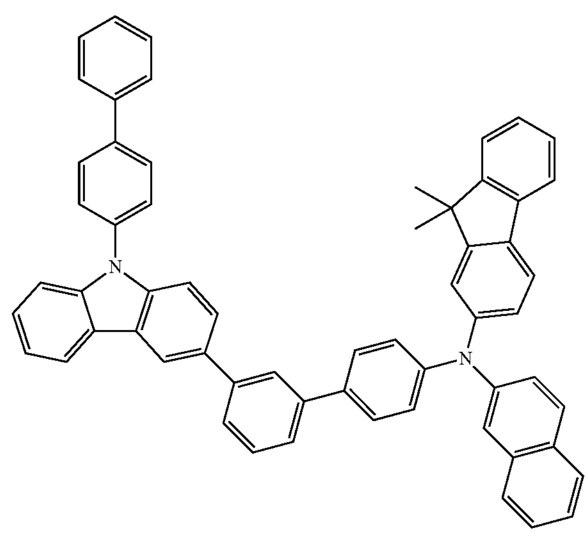

-continued
6-52
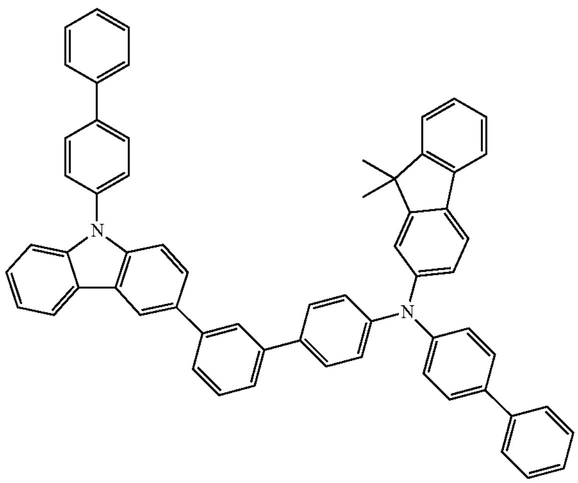
6-53
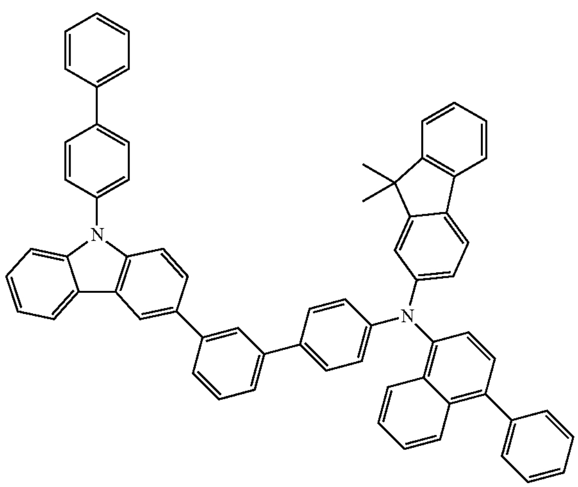
6-54
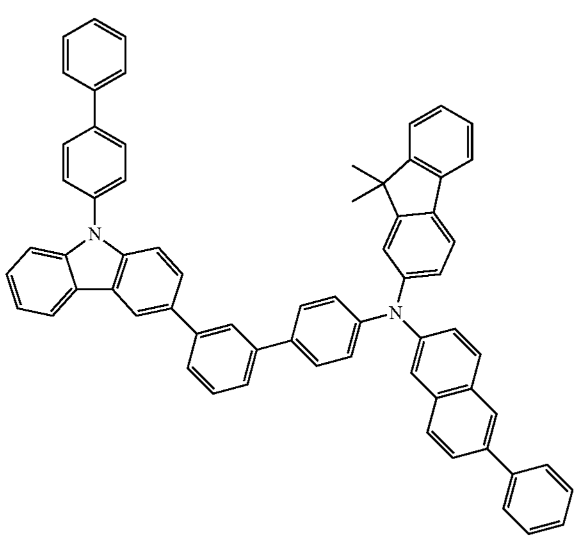
-continued
6-55
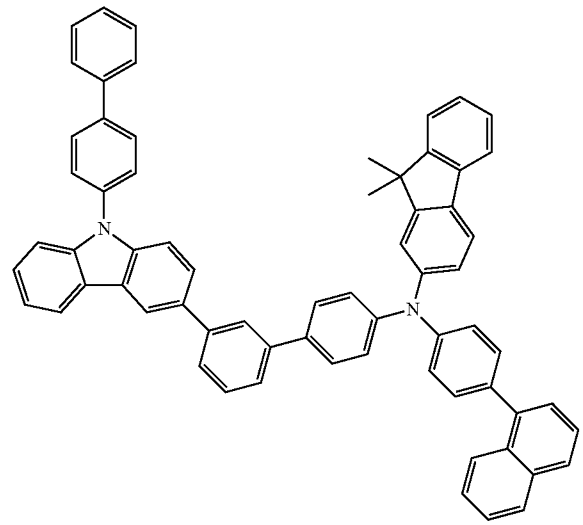
6-56
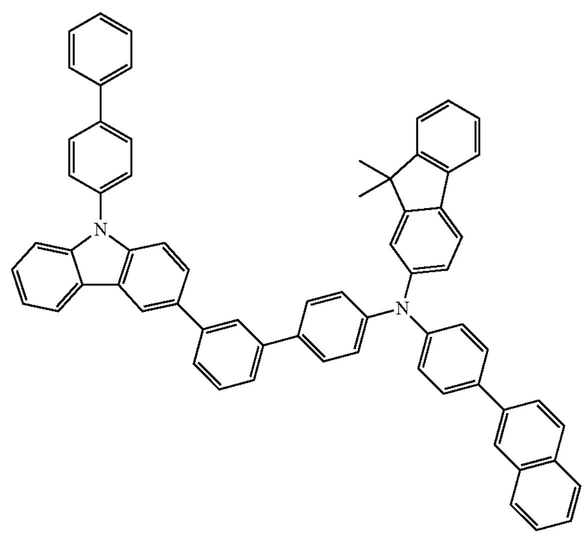
6-57
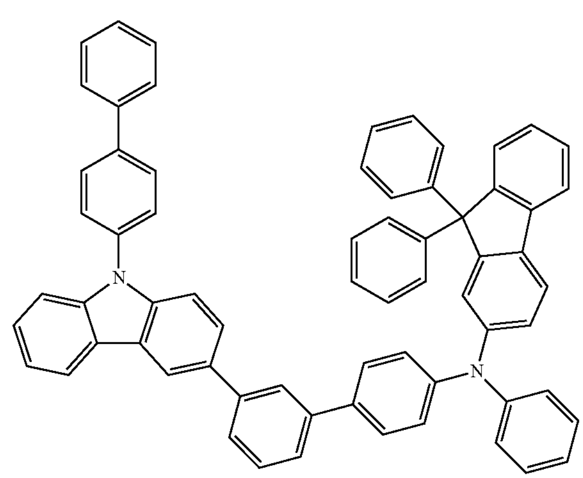

-continued
6-58
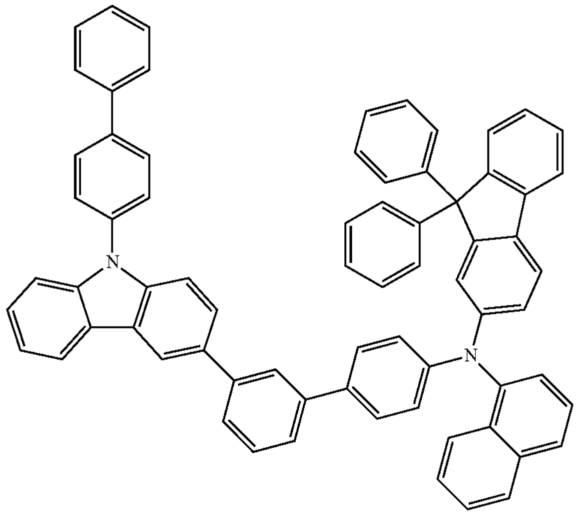
6-59
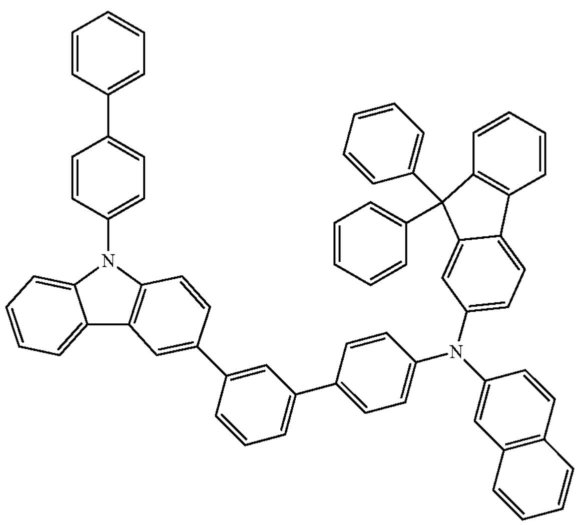
6-60
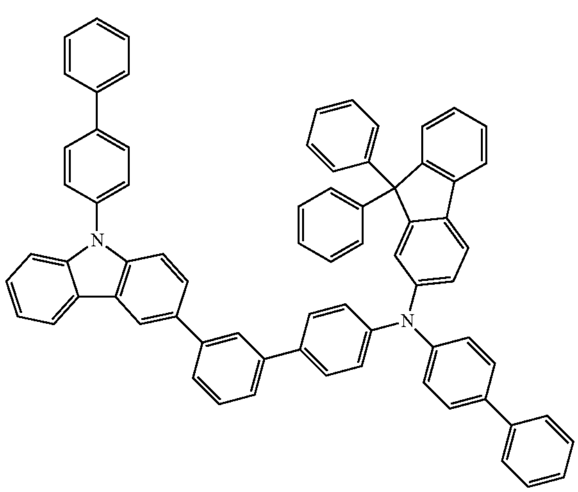
-continued
6-61
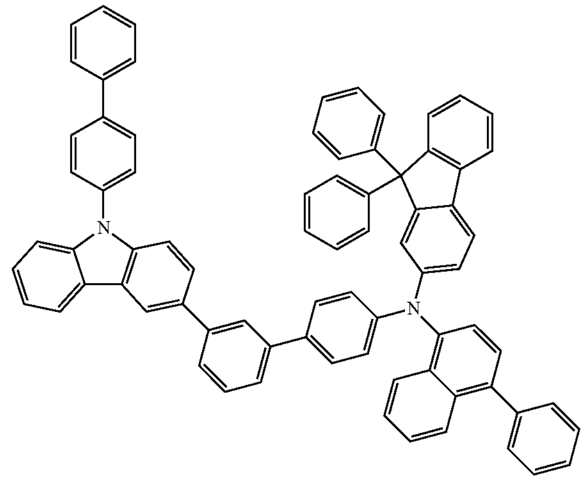
6-62
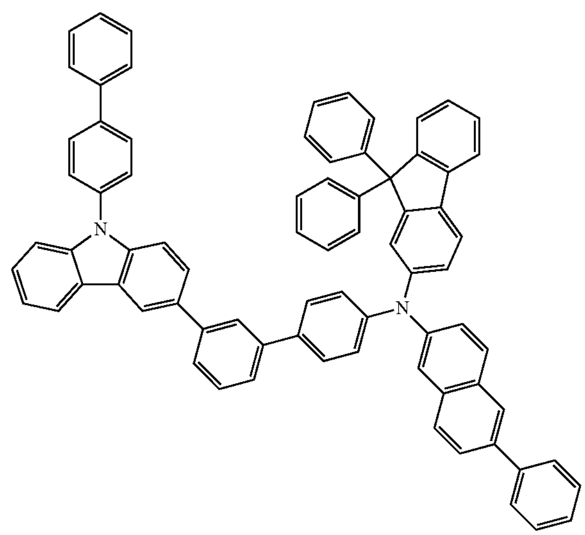
6-63
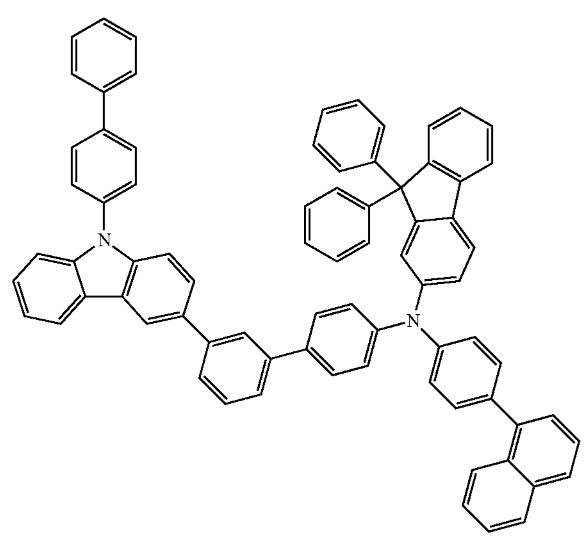

6-64
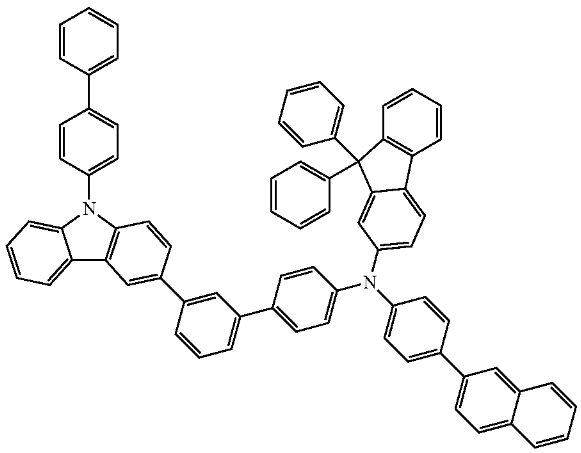
6-65
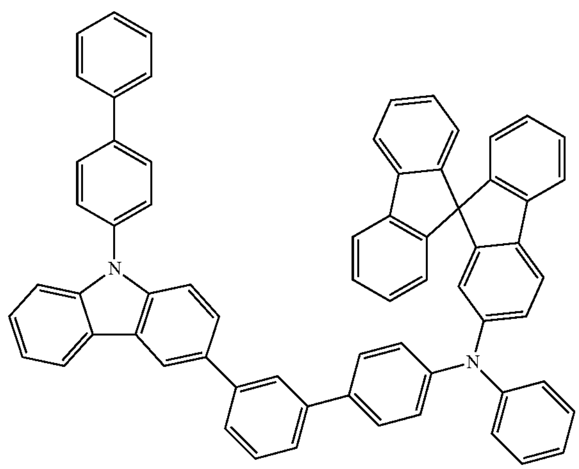
6-66
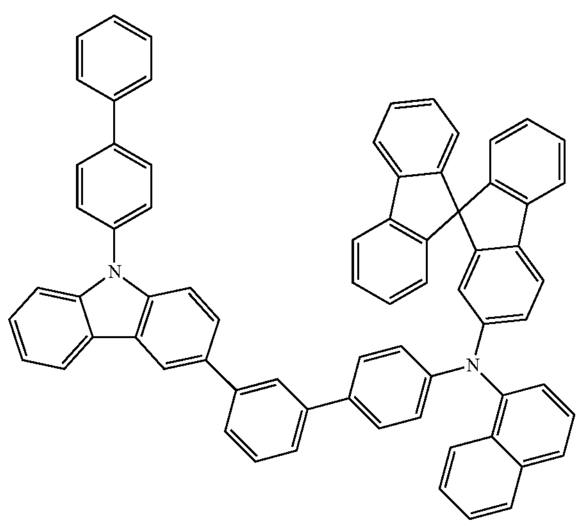
6-67
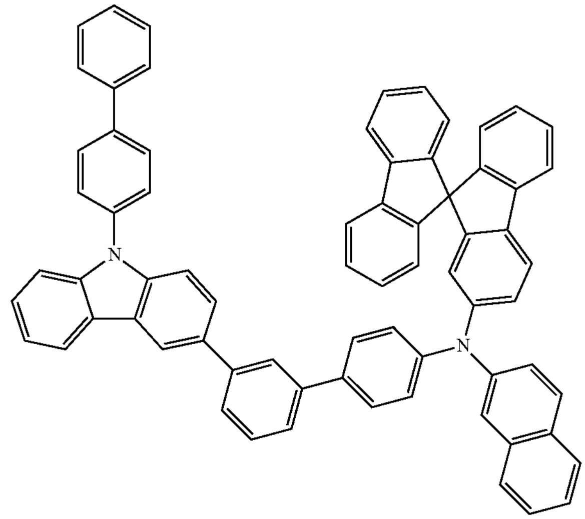
6-68
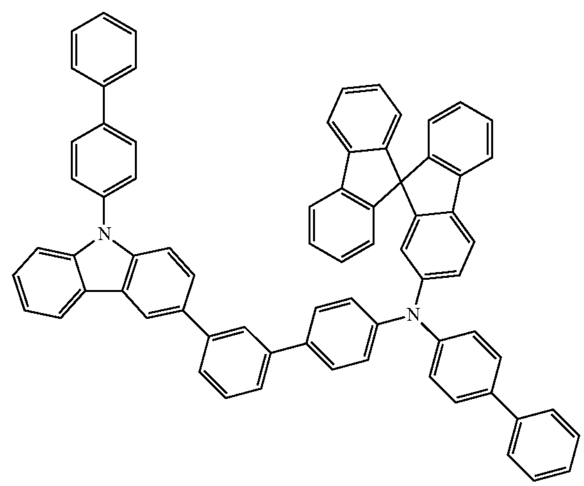
6-69
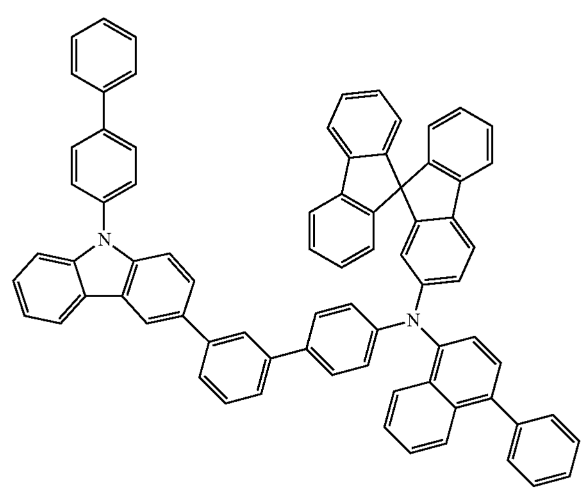

-continued
6-70
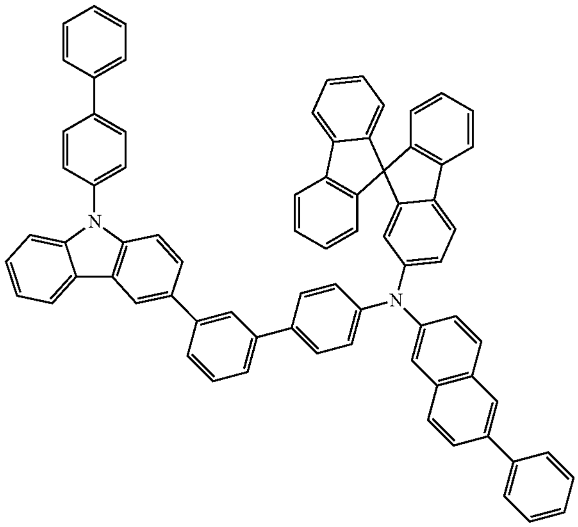
6-71
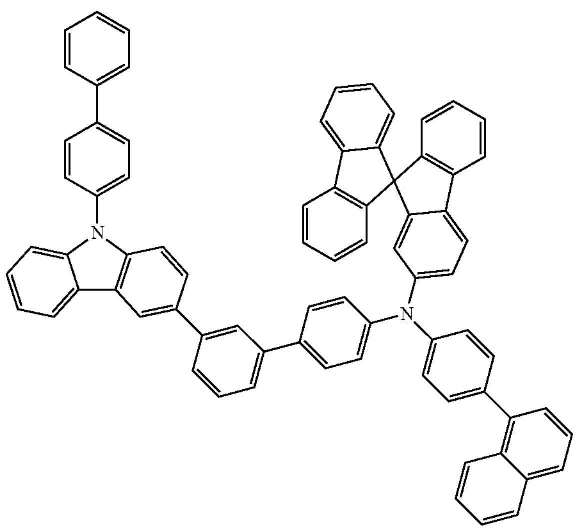
6-72
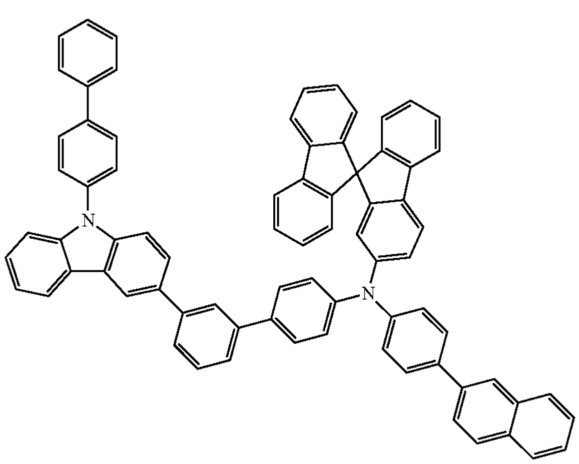
-continued
6-73
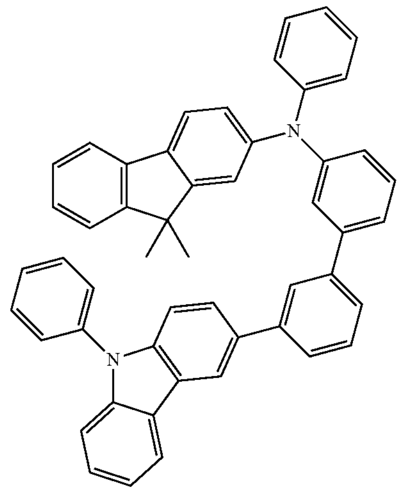
6-74
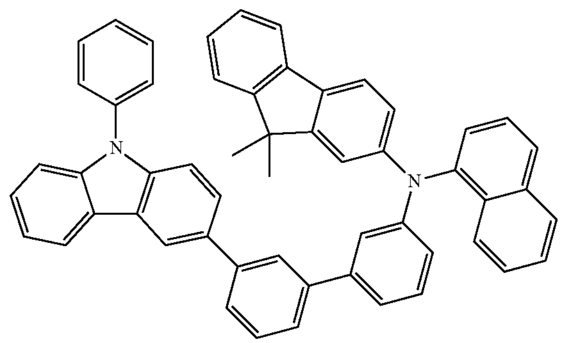
6-75
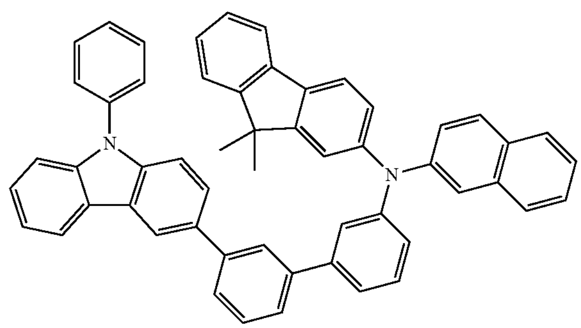
6-76
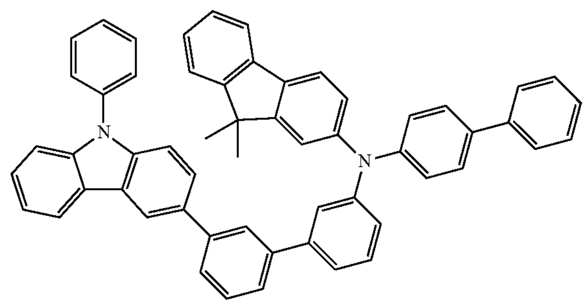

6-77
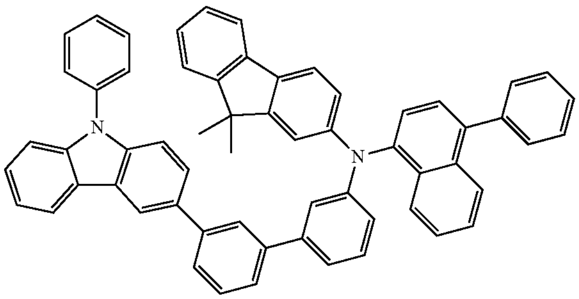
6-78
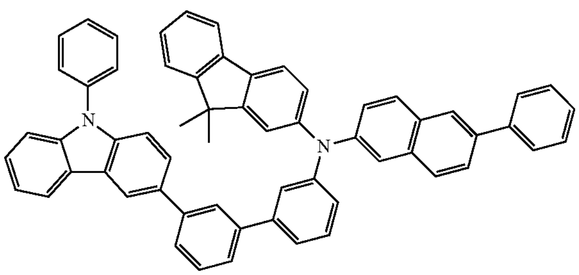
6-79
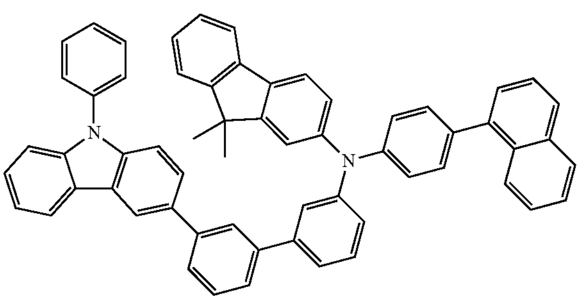
6-80
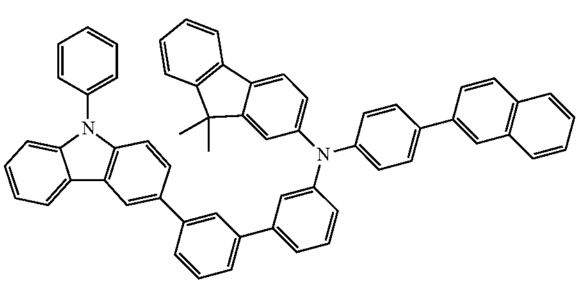
6-81
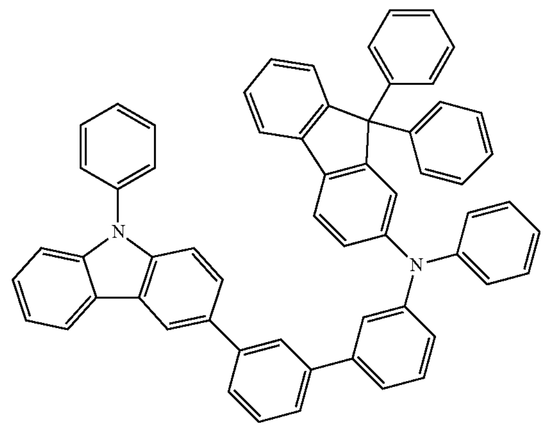
6-82
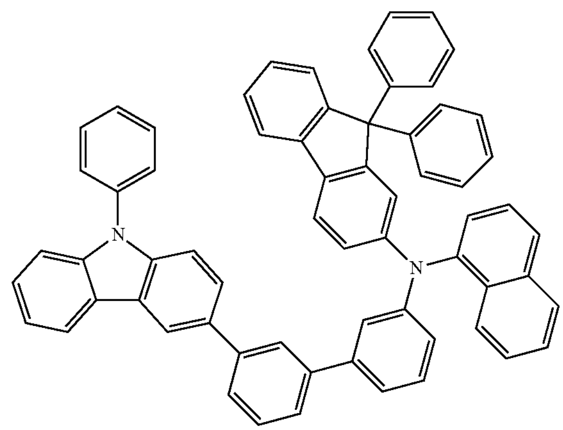
6-83
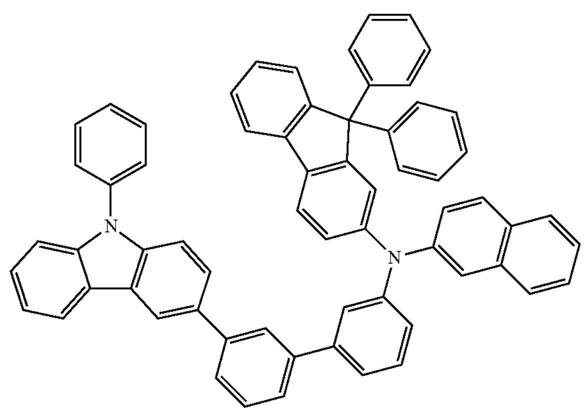

6-84
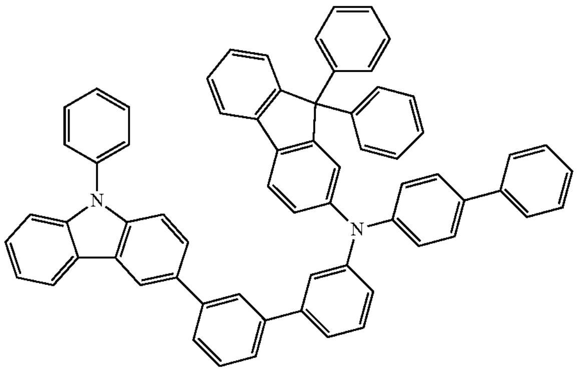
6-85
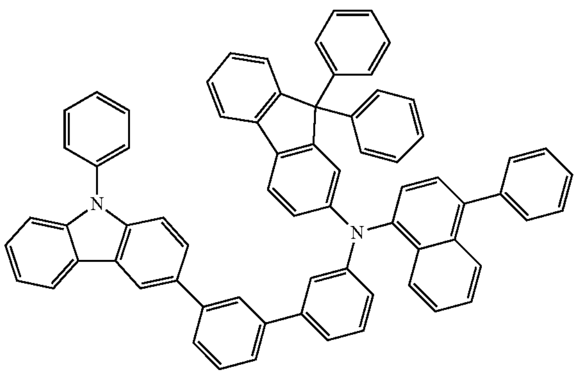
6-86
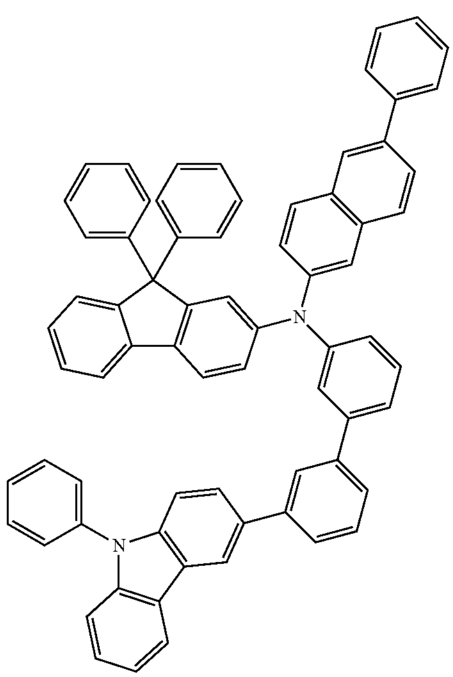
6-87
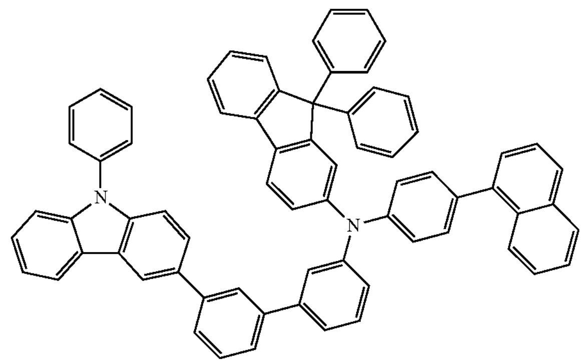
6-88
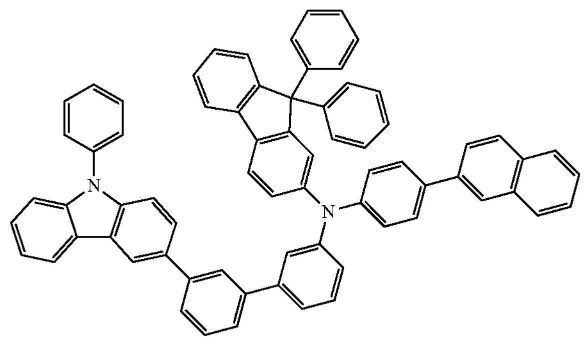
6-89
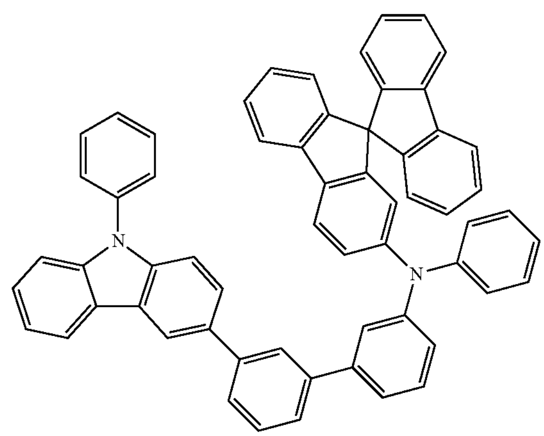
6-90
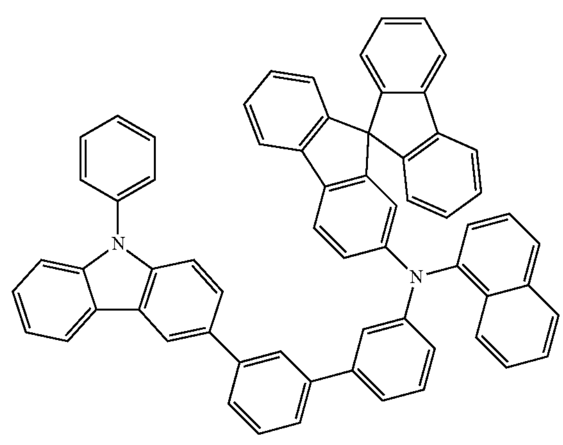

-continued
6-91
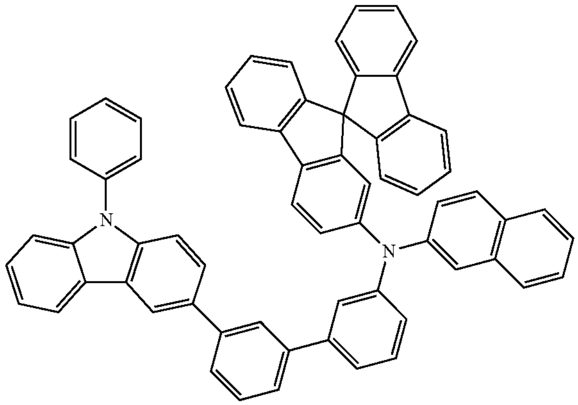
6-92
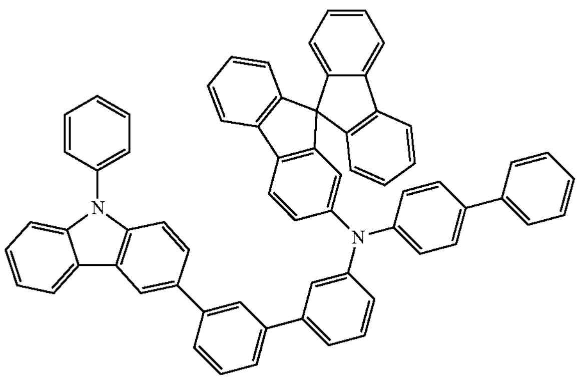
6-93
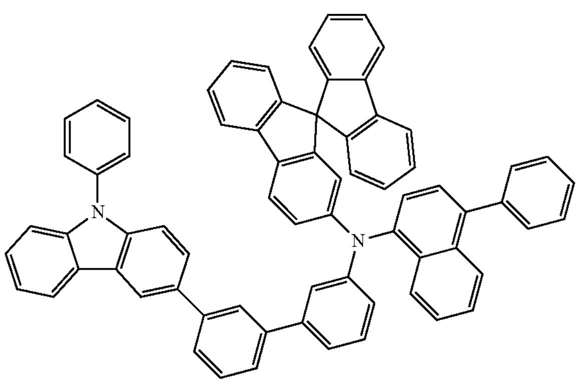
6-94
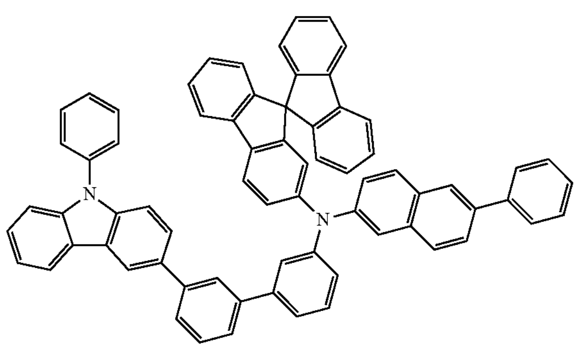
-continued
6-95
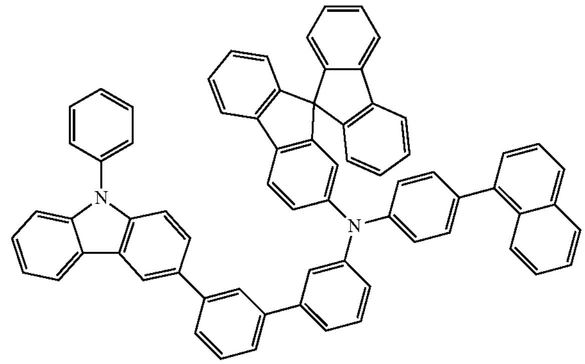
6-96
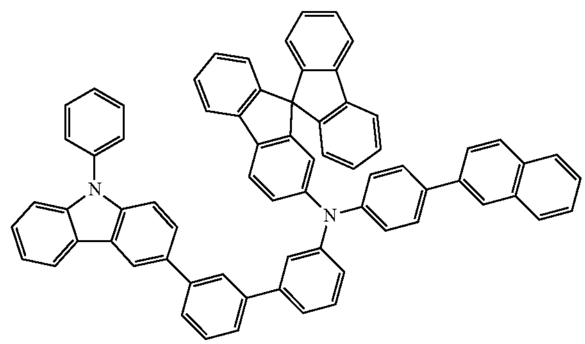
6-97
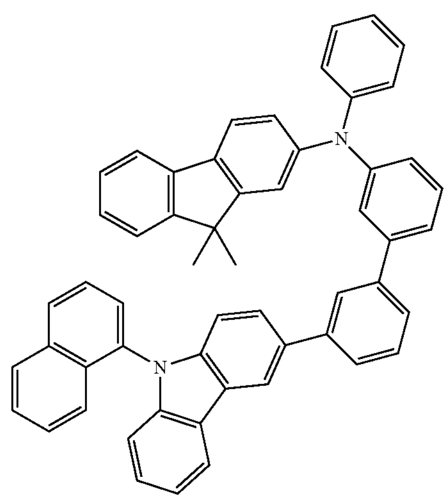

-continued
6-98
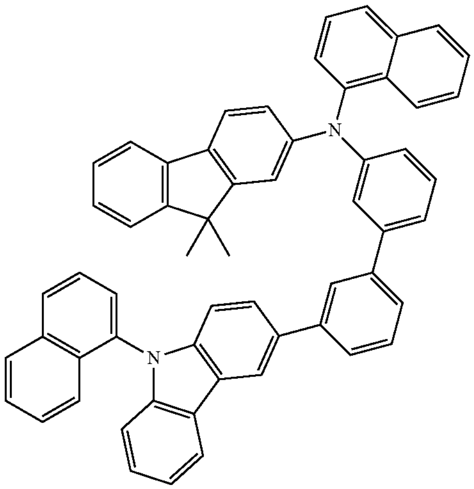
6-99
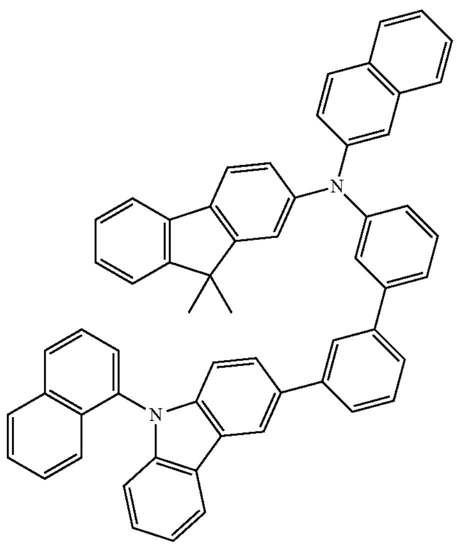
6-100
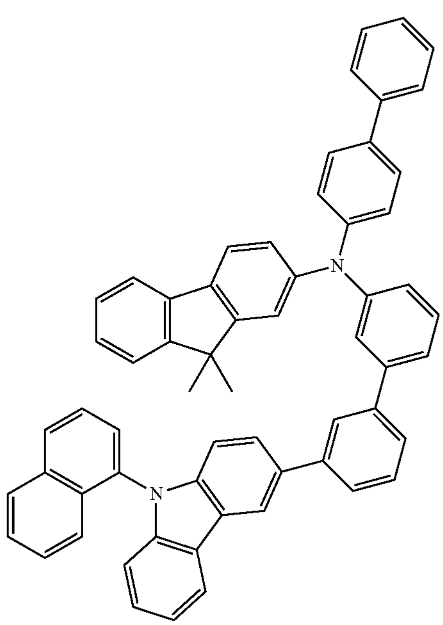
-continued
6-101
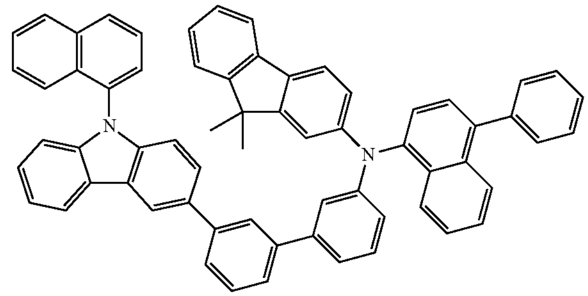
6-102
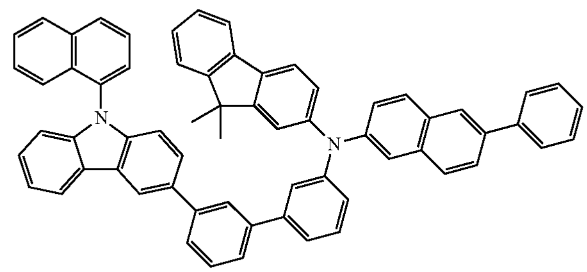
6-103
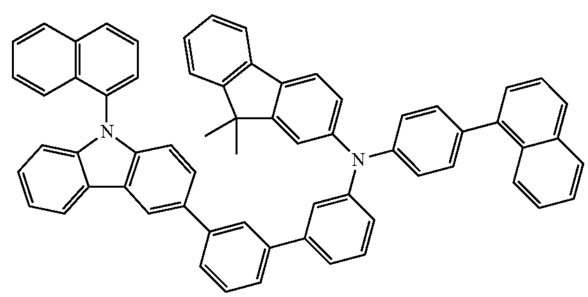
6-104
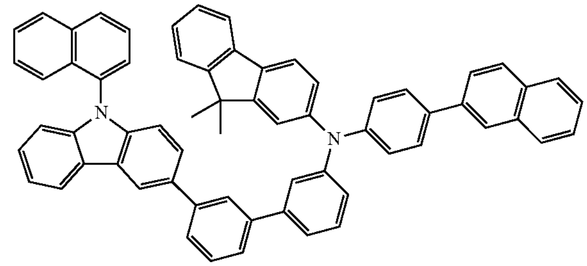

-continued
6-105
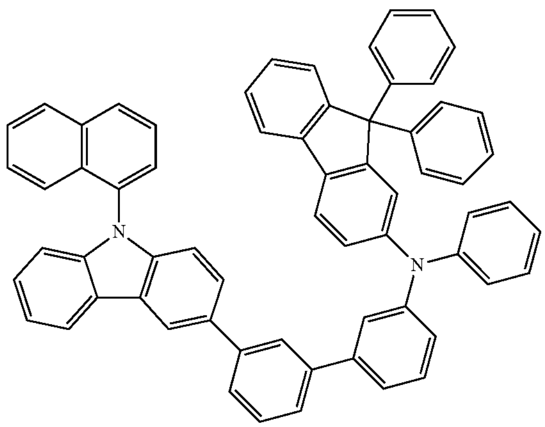
6-106
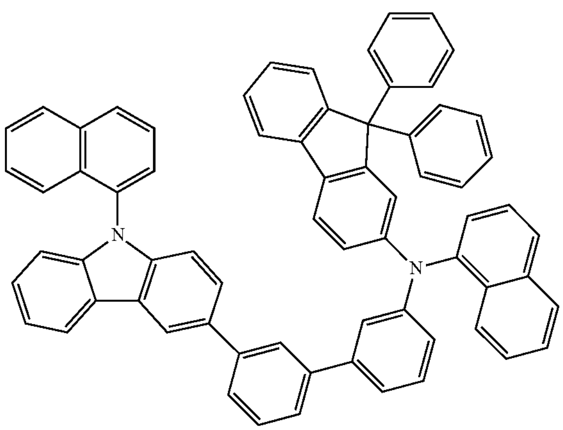
6-107
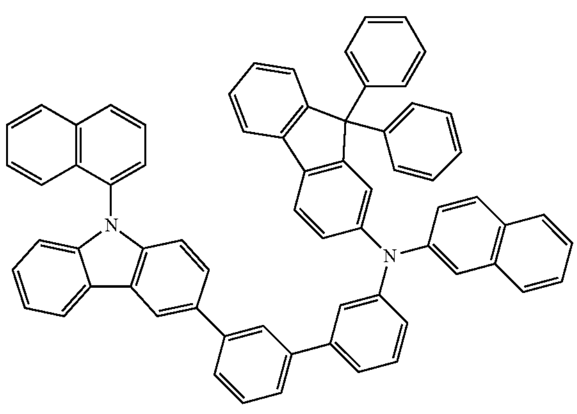
-continued
6-108
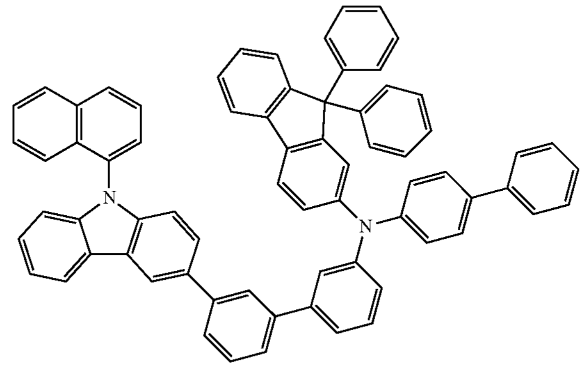
6-109
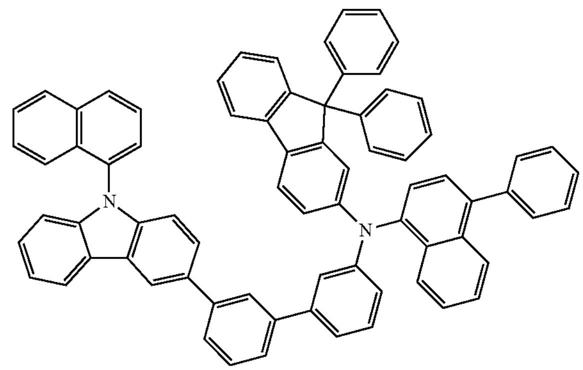
6-110
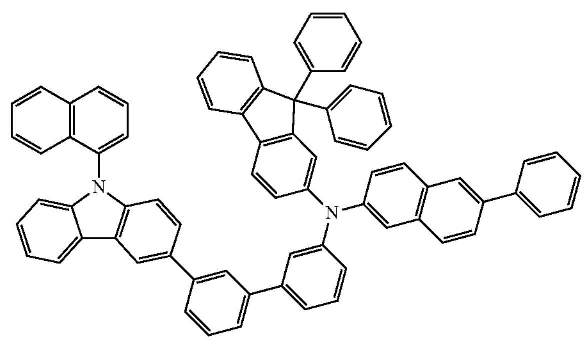
6-111
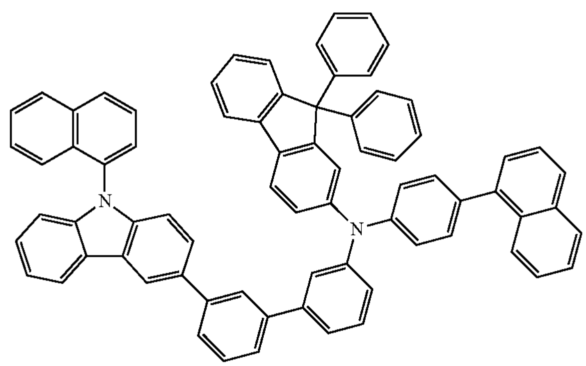

6-112
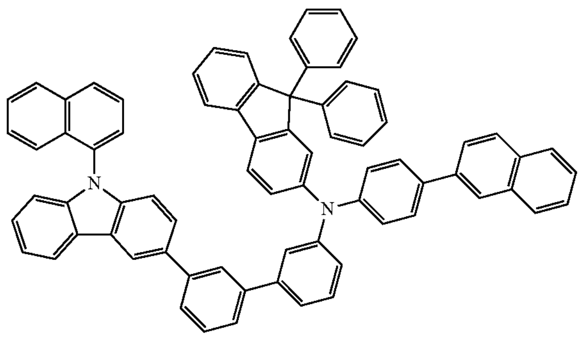
6-113
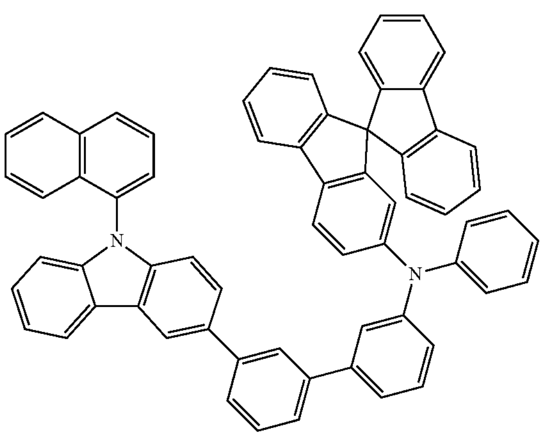
6-114
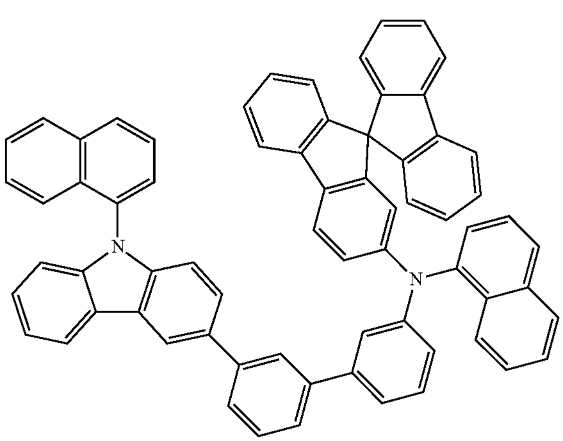
6-115
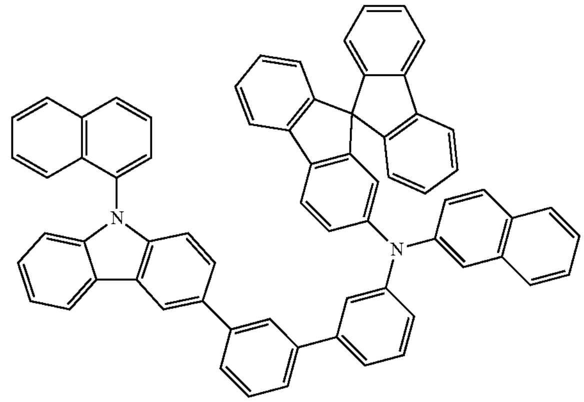
6-116
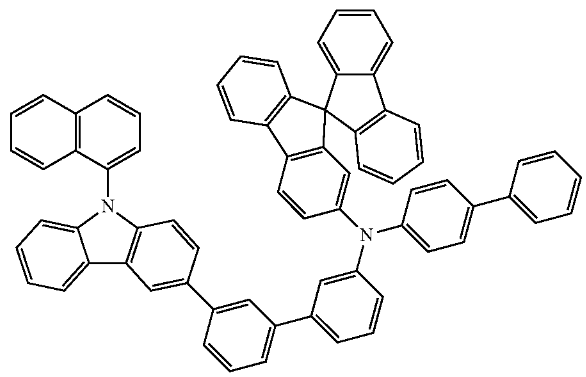
6-117
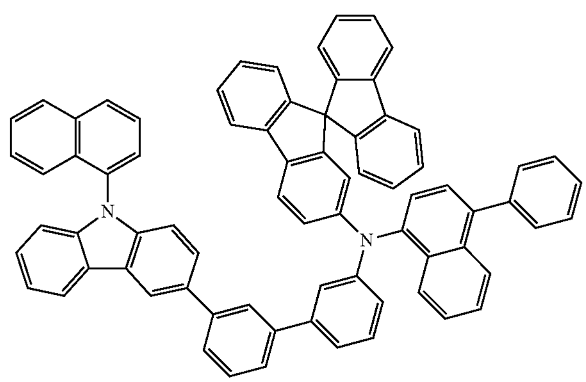
6-118
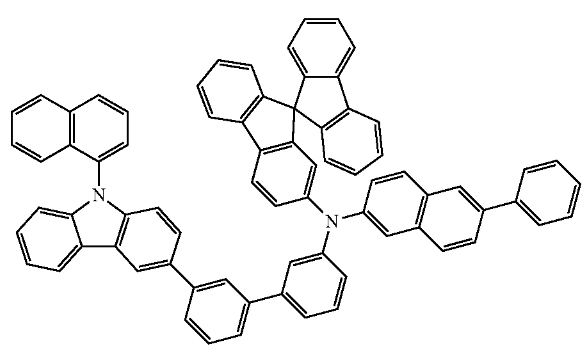

6-119
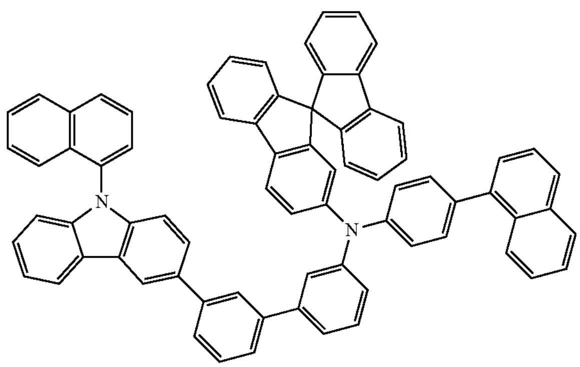
6-120
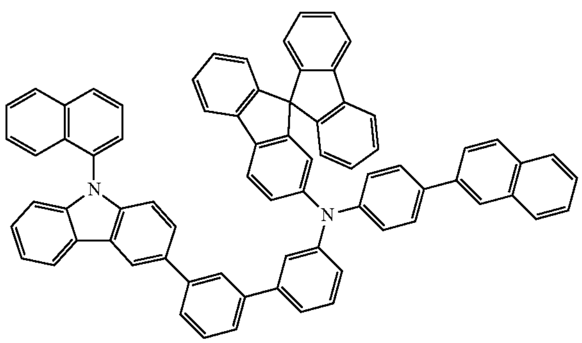
6-121
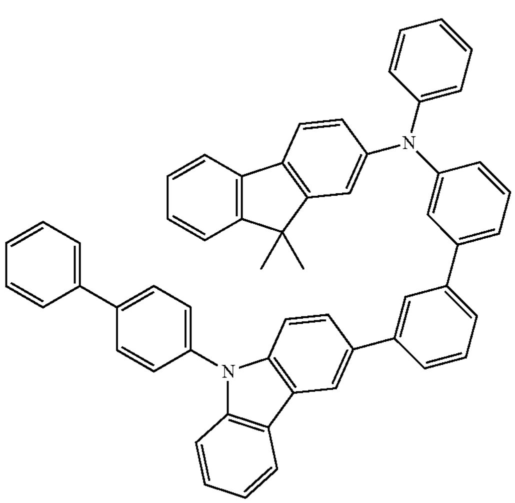
6-122
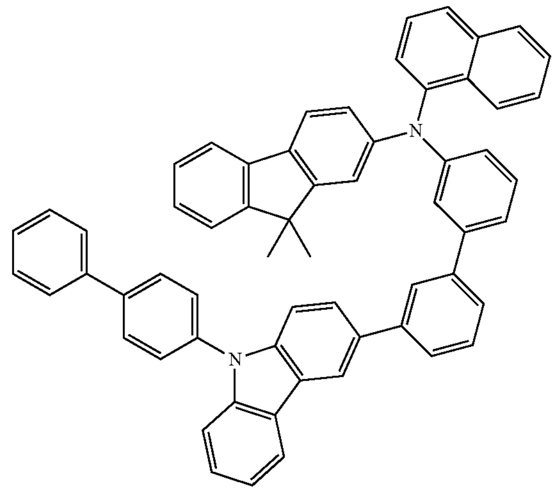
6-123
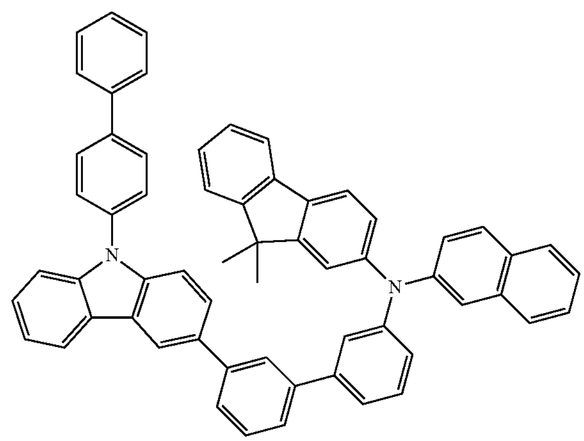
6-124
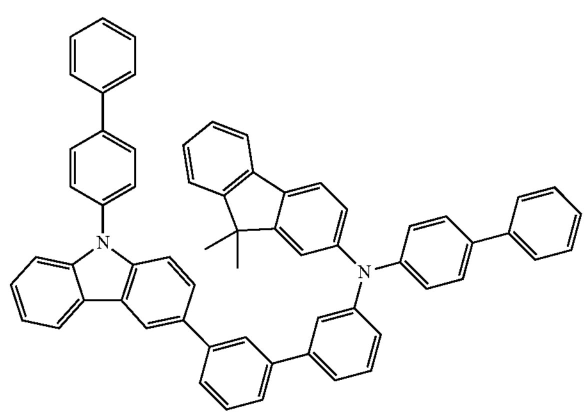

-continued
6-125
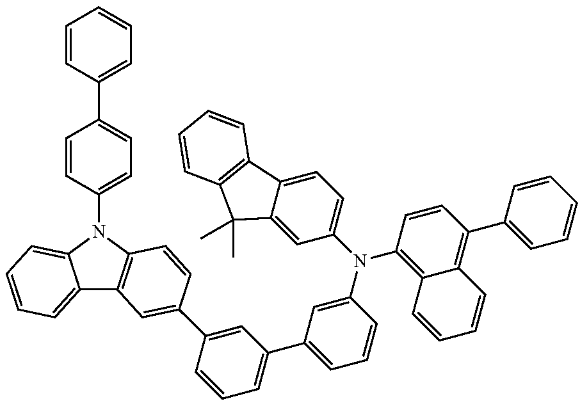
6-126
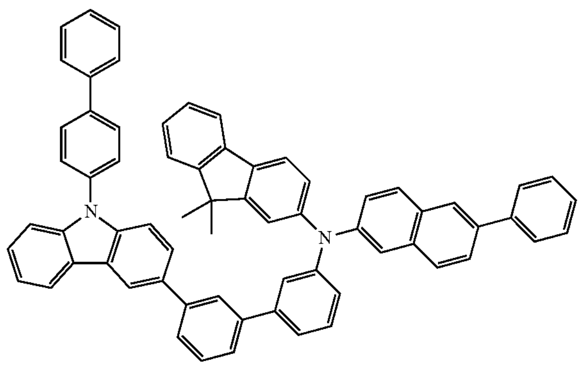
6-127
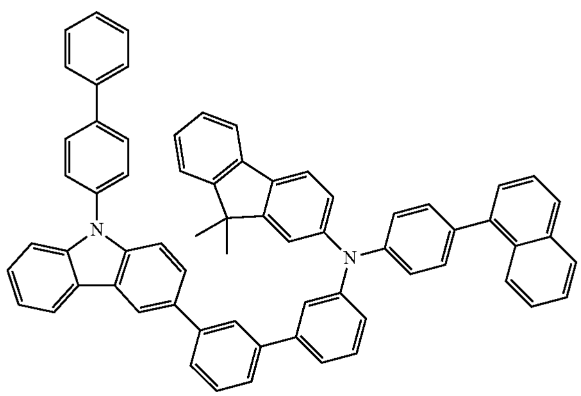
6-128
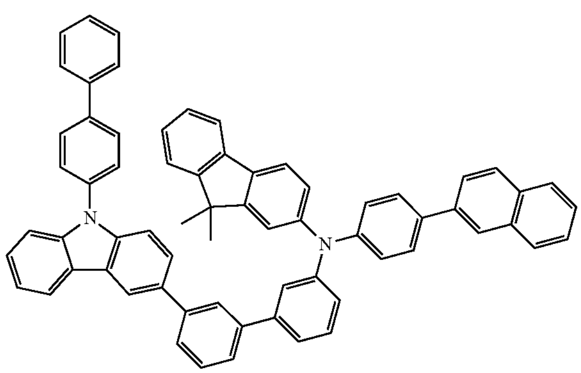
-continued
6-129
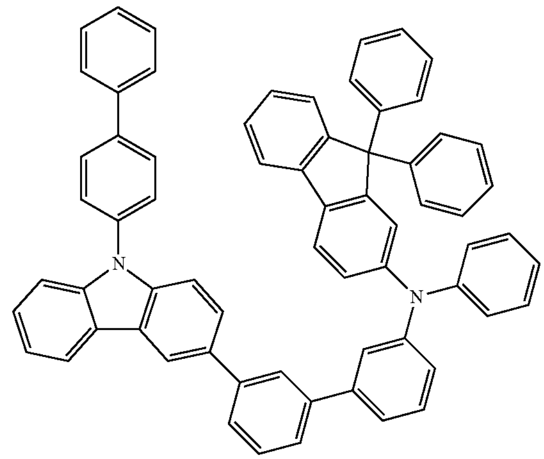
6-130
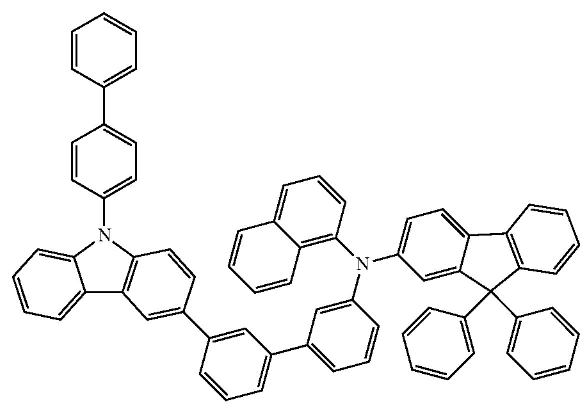
6-131
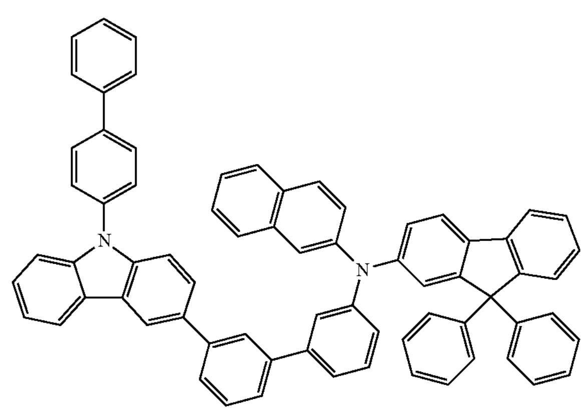

-continued
6-132
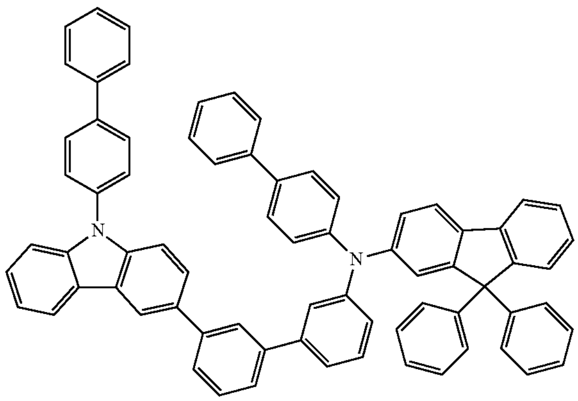
6-133
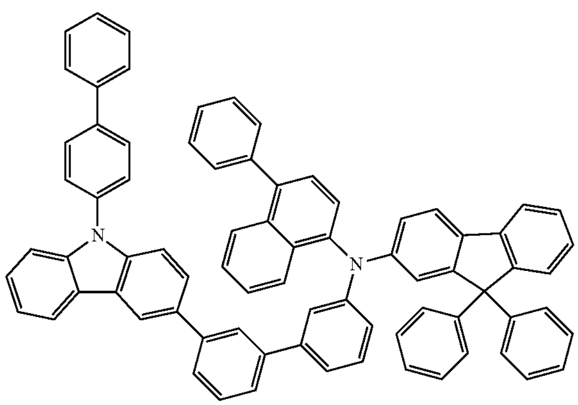
6-134
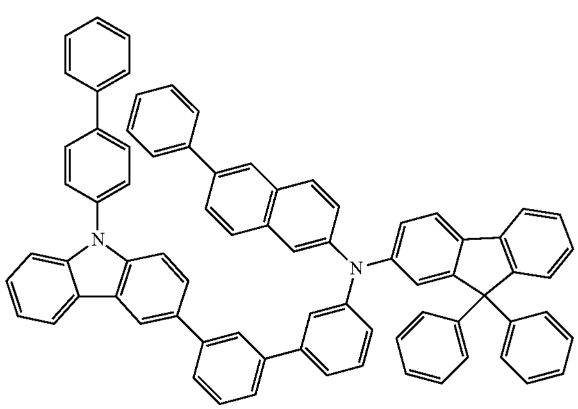
-continued
6-135
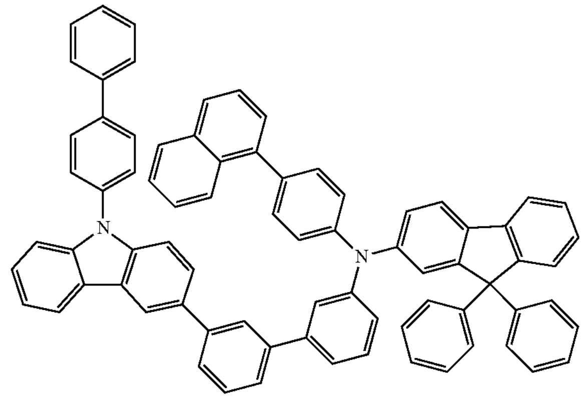
6-136
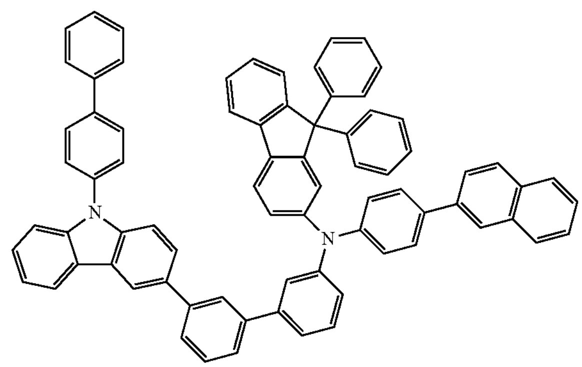
6-137
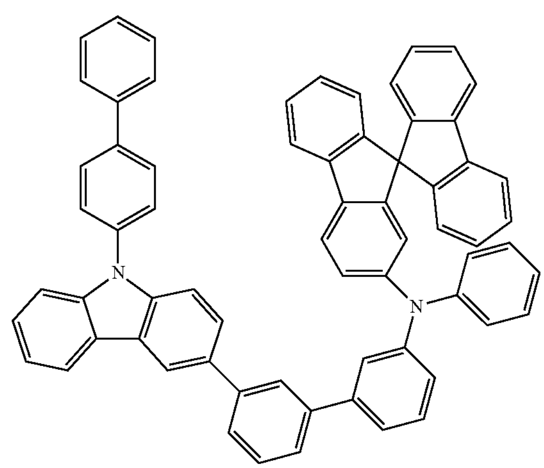

-continued
6-138
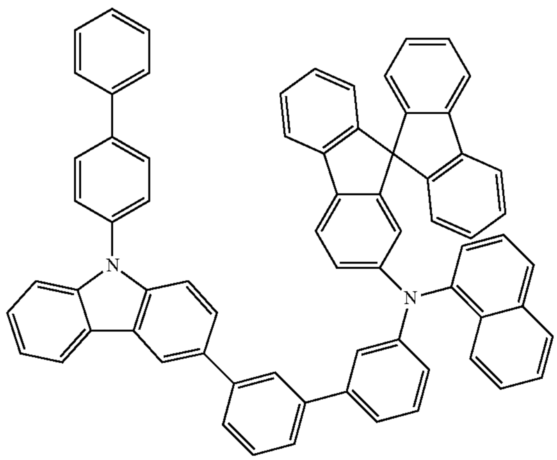
6-139
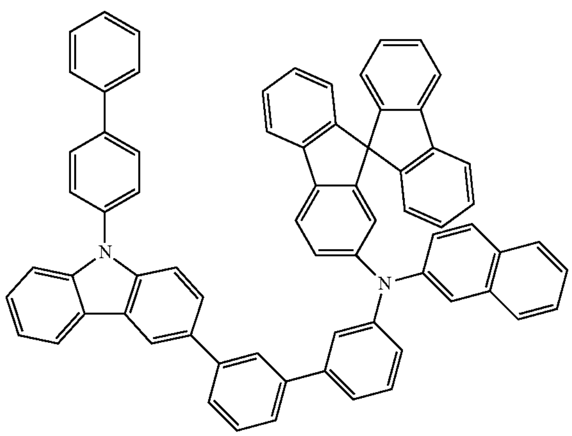
6-140
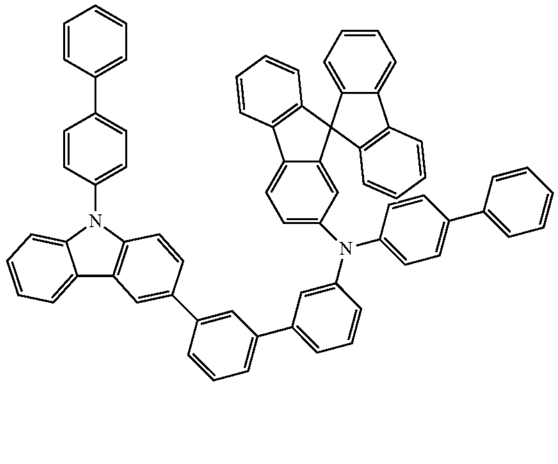
-continued
6-141
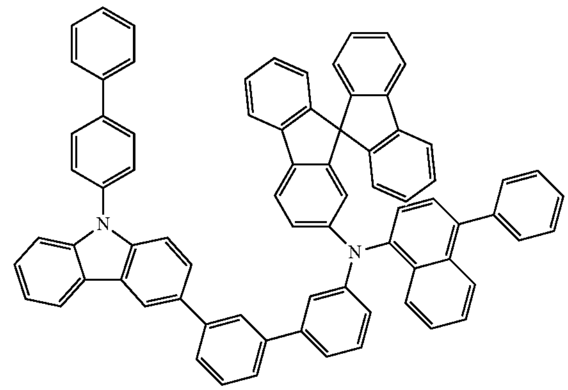
6-142
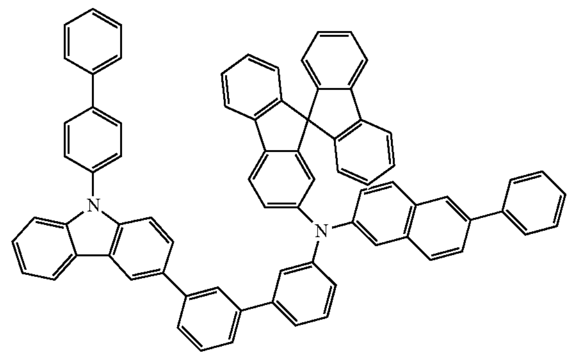
6-143
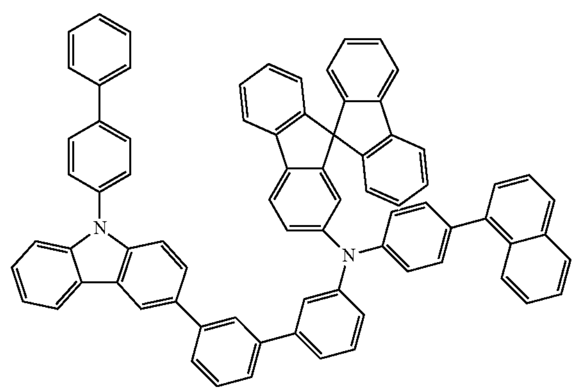
6-144
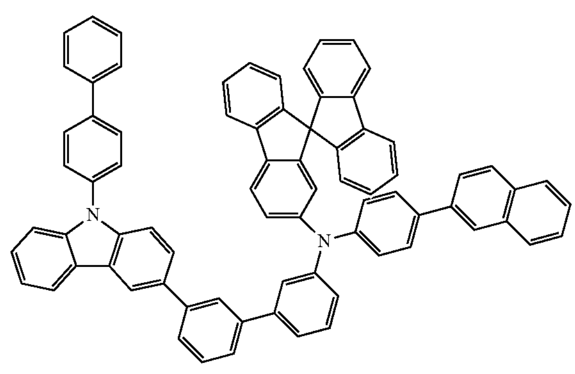

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
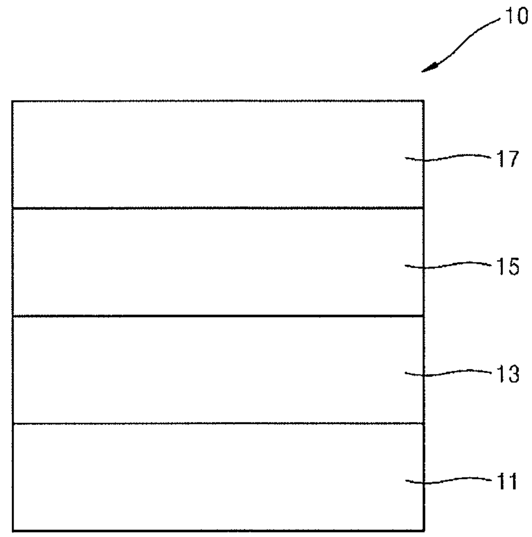
FIG. 1 illustrates a schematic view of a structure of an organic light-emitting device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration.

FIG. 1 illustrates a schematic view of a structure of an organic light-emitting device 10 according to an embodiment. The organic light-emitting device 10 includes a substrate 11, a first electrode 13, an organic layer 15, and a second electrode 17. Hereinafter, a structure and a method of manufacturing an organic light-emitting device, according to embodiments, is described with reference to FIG. 1.

The substrate 11 may be any substrate suitable for use in an organic light-emitting device, such as a glass substrate or a transparent plastic substrate having, for example, strong mechanical strength, thermal stability, transparency, surface smoothness, ease of handling, and water resistance, may be used.

The first electrode 13 may be formed on the substrate 11 by depositing or sputtering a first electrode-forming material onto a surface of the substrate 11. When the first electrode 13 is an anode, a material having a high work function may be used as the first electrode-forming material to facilitate hole injection. The first electrode 13 may be a reflective electrode or a transmission electrode. Materials having excellent transparent and conductive capabilities, such as indium tin oxide (ITO), indium zinc oxide (IZO), tin oxide ($SnO_2$), and zinc oxide (ZnO), may be used to form the first electrode 13. In other embodiments, magnesium (Mg), aluminum (Al), aluminum-lithium (Al—Li), calcium (Ca), magnesium-indium (Mg—In), or magnesium-silver (Mg—Ag) may be used to form the first electrode 13 as a reflective electrode.

The first electrode 13 may have a single layer or a multi-layer structure including two or more layers. For example, the first electrode 13 may have a three-layered structure of ITO/Ag/ITO.

The organic layer 15 is disposed on the first electrode 13.

The organic layer 15 refers to a plurality of layers disposed between the first electrode 13 and the second electrode 17 in the organic light-emitting device 10.

The organic layer 15 may include an emission layer.

The organic layer 15 may include a hole-transporting region disposed between the first electrode 13 and the emission layer. The hole-transporting region includes at least one of layer selected from a hole-injecting layer (HIL), a hole-transporting layer (HTL), a functional layer having both hole-injecting and hole-transporting capabilities (H-functional layer), a buffer layer and an electron-blocking layer (EBL).

The organic layer 15 may include an electron-transporting region disposed between the second electrode 17 and the emission layer. The electron transport region includes at least one of layer selected from a hole-blocking layer (HBL), an electron-transporting layer (ETL), an electron-injecting layer (EIL), and a functional layer having both electron-injecting and electron-transporting capabilities (E-functional layer).

According to an embodiment, the organic layer 15 may sequentially include the HIL, HTL, buffer layer, EML, ETL, and EIL.

The HIL may be formed on the first electrode 13 using various methods, such as vacuum deposition, spin coating, casting, or Langmuir-Blodgett (LB) deposition.

When the HIL is formed using vacuum deposition, vacuum deposition conditions may vary according to the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 Å/sec to about 100 Å/sec.

When the HIL is formed using spin coating, the coating conditions may vary according to the compound that is used to form the HIL, and the desired structure and thermal properties of the HIL to be formed. For example, the coating rate may be in a range of about 2000 rpm to about 5000 rpm, and a temperature at which heat treatment is performed to remove a solvent after coating may be in a range of about 80° C. to about 200° C.

The HIL may be formed of a hole-injecting material, examples of which include N,N'-diphenyl-N,N'-bis-[4-(phenyl-m-tolyl-amino)-phenyl]-biphenyl-4,4'-diamine (DNTPD); a phthalocyanine compound such as copper phthalocyanine; 4,4',4"-tris(3-methylphenylphenylamino) triphenylamine (m-MTDATA), N,N'-di(1-naphthyl group-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and (polyaniline)/poly(4-styrenesulfonate) (PANI/PSS):

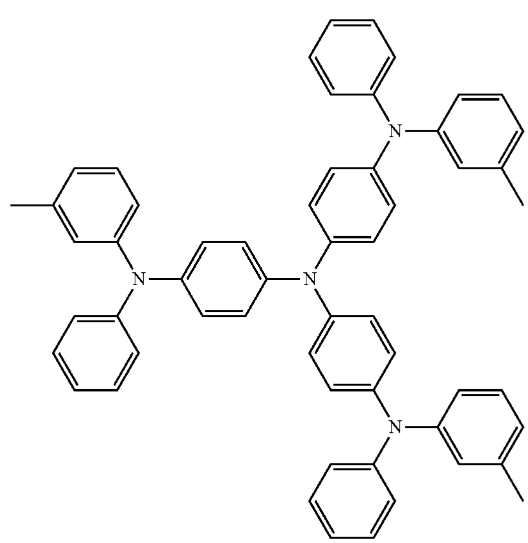

m-MTDATA

-continued

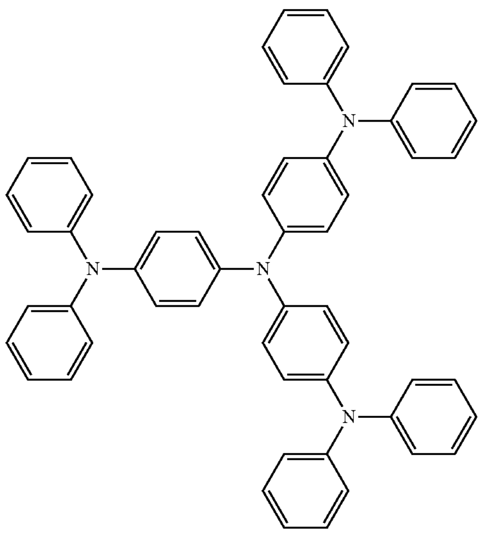

TDATA

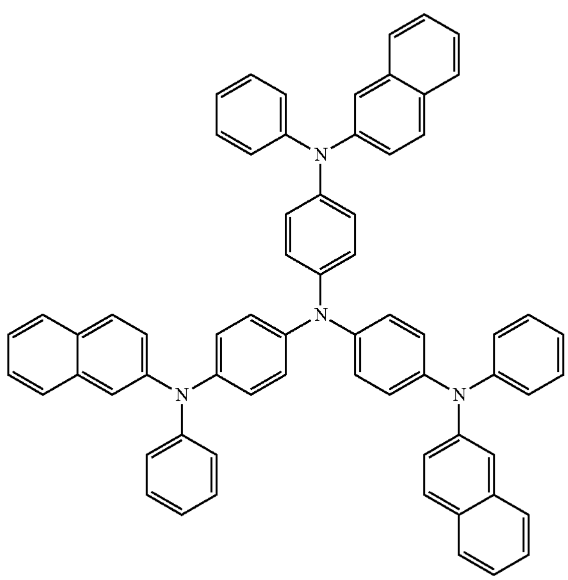

2-TNATA

A thickness of the HIL may be about 100 Å to about 10000 Å, and in some embodiments, may be from about 100 Å to about 1000 Å. Maintaining the thickness of the HIL within these ranges may help provide the HIL with good hole-injecting ability without a substantial increase in driving voltage.

Then, the HTL may be formed on the HIL by using various methods, such as vacuum deposition, spin coating, casting, and LB deposition. When the HTL is formed using vacuum deposition or spin coating, the deposition and coating conditions may be similar to those for the formation of the HIL, though the conditions for deposition and coating may vary according to the material that is used to form the HTL.

The HTL may include a hole-transporting material represented by any one of Formulae 2(1) and 2(2):

<Formula 2(1)>

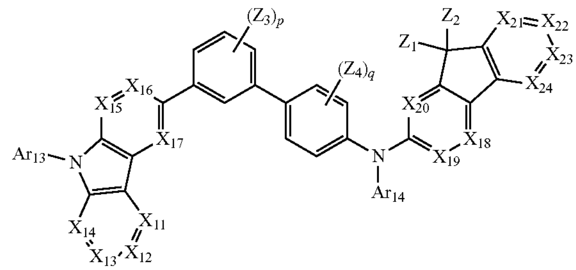

<Formula 2(2)>

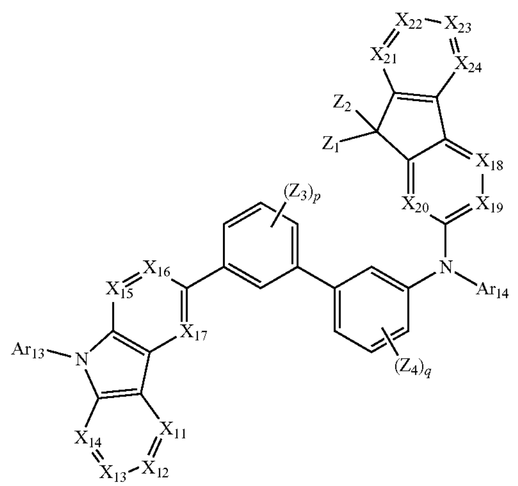

In Formula 2(1) or Formula 2(2), $X_{11}$ is $CR_{11}$ or N; $X_{12}$ is $CR_{12}$ or N; $X_{13}$ is $CR_{13}$ or N; $X_{14}$ is $CR_{14}$ or N; $X_{15}$ is $CR_{15}$ or N; $X_{16}$ is $CR_{16}$ or N; $X_{17}$ is $CR_{17}$ or N; $X_{18}$ is $CR_{18}$ or N; $X_{19}$ is $CR_{19}$ or N; $X_{20}$ is $CR_{20}$ or N; $X_{21}$ is $CR_{21}$ or N; $X_{22}$ is $CR_{22}$ or N; $X_{23}$ is $CR_{23}$ or N; $X_{24}$ is $CR_{24}$ or N.

For example, in Formula 2(1) or Formula 2(2), $X_{11}$ may be $C(R_{11})$, $X_{12}$ may be $C(R_{12})$, $X_{13}$ may be $C(R_{13})$, $X_{14}$ may be $C(R_{14})$, $X_{15}$ may be $C(R_{15})$, $X_{16}$ may be $C(R_{16})$, $X_{17}$ may be $C(R_{17})$, $X_{18}$ may be $C(R_{18})$, $X_{19}$ may be $C(R_{19})$, $X_{20}$ may be $C(R_{20})$, $X_{21}$ may be $C(R_{21})$, $X_{22}$ may be $C(R_{22})$, $X_{23}$ may be $C(R_{23})$, and $X_{24}$ may be $C(R_{24})$.

In Formula 2(1) or Formula 2(2), $Ar_{13}$ and $Ar_{14}$ are each independently selected from i) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and ii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

For example, in Formula 2(1) or Formula 2(2) above, $Ar_{13}$ and $Ar_{14}$ are each independently selected from i) a phenyl group, a pentalenyl group, an indenyl group, a naphthyl group, an azulenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group; and ii) a phenyl group, a pentalenyl group, an indenyl group, a naphthyl group, an azulenyl group, an indacenyl group, an acenaphthyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, and a $C_2$-$C_{20}$ heteroaryl group.

As another example, in Formula 2(1) or Formula 2(2), $Ar_{13}$ and $Ar_{14}$ are each independently selected from i) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and ii) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group.

As another example, in Formula 2(1) or Formula 2(2), $Ar_{13}$ and $Ar_{14}$ may each independently be represented by any one of Formulae 3-1 to 3-20 below:

3-1

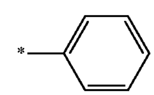

3-2

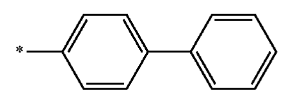

3-3

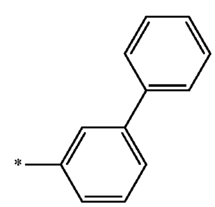

3-4

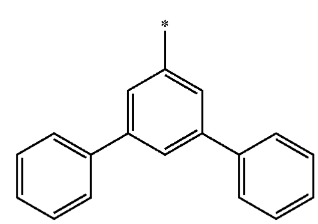

3-5

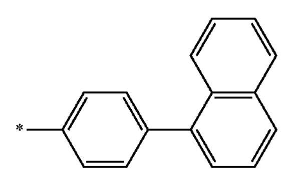

3-6

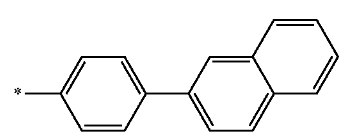

-continued 3-7

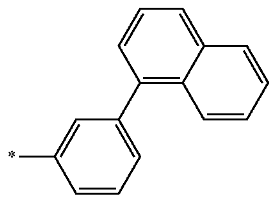

3-8

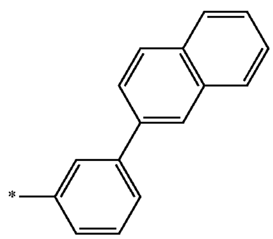

3-9

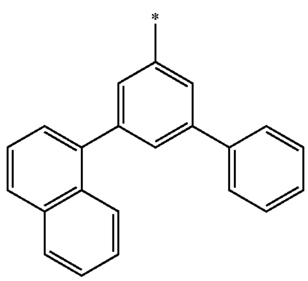

3-10

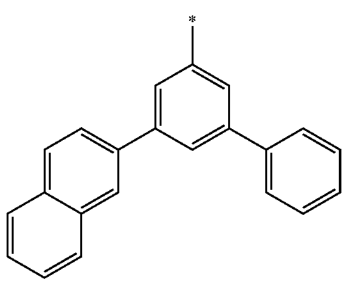

3-11

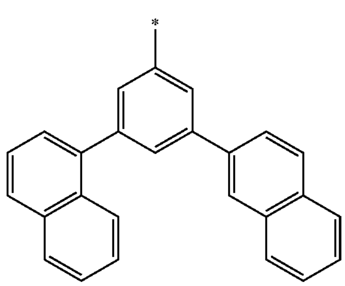

3-12

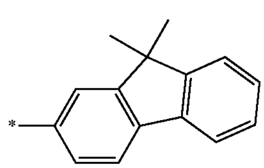

-continued 3-13

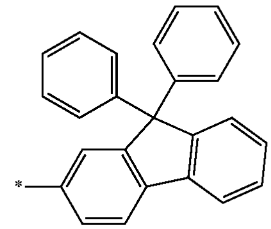

3-14

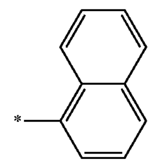

3-15

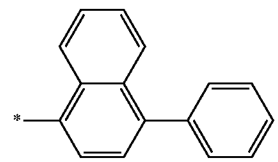

3-16

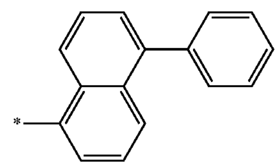

3-17

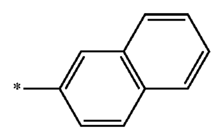

3-18

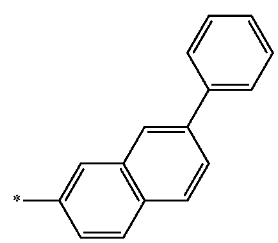

3-19

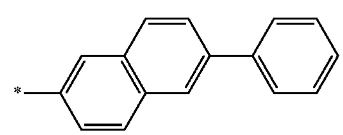

3-20

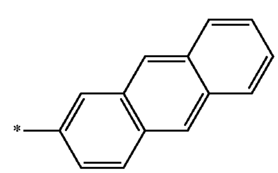

In Formulae 3-1 to 3-20, * represents a bonding site of Formula 2(1) or Formula 2(2) to N.

In Formula 2(1) or Formula 2(2), $Z_1$ and $Z_2$ are each independently selected from i) a $C_1$-$C_{60}$ alkyl group, a $C_2$-$C_{60}$ alkenyl group, a $C_2$-$C_{60}$ alkynyl group, and a $C_1$-$C_{60}$ alkoxy group;

ii) a $C_1$-$C_{60}$ alkyl group, a $C_2$-$C_{60}$ alkenyl group, a $C_2$-$C_{60}$ alkynyl group, and a $C_1$-$C_{60}$ alkoxy group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

For example, in Formula 2(1) or Formula 2(2) above, $Z_1$ and $Z_2$ may each independently be selected from i) a $C_1$-$C_{20}$ alkyl group;

ii) a $C_1$-$C_{20}$ alkyl group substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group;

iii) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group; and iv) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group.

As another example, in Formula 2(1) or Formula 2(2), $Z_1$ and $Z_2$ are each independently selected from a methyl group, an ethyl group, a propyl group, a butyl group, a pentyl group, a hexyl group, a heptyl group, and a compound represented by any one of Formulae 3-1 to 3-20 below:

3-1

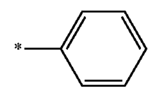

3-2

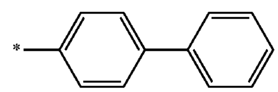

3-3

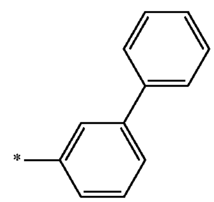

3-4

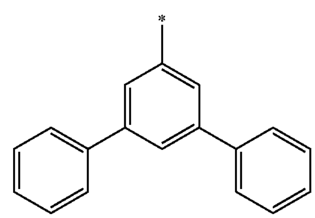

3-5

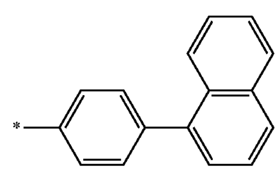

3-6

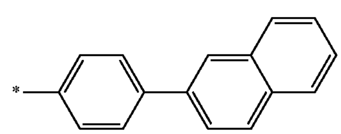

3-7

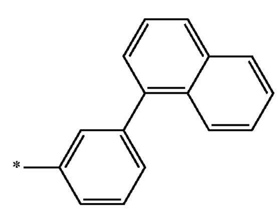

-continued 3-8

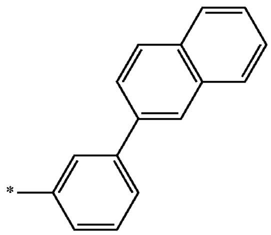

3-9

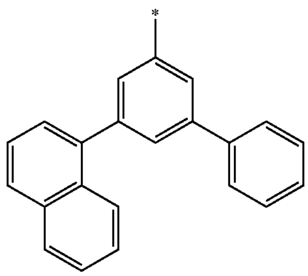

3-10

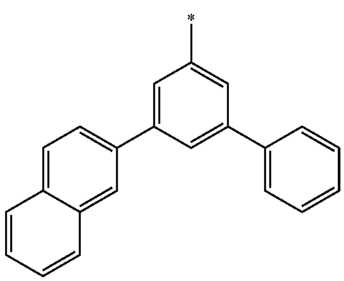

3-11

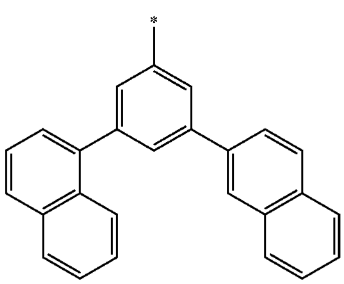

3-12

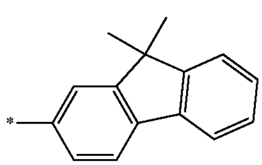

3-13

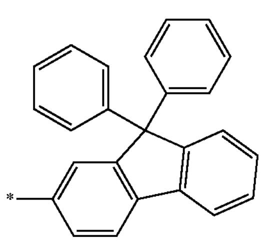

-continued 3-14

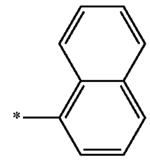

3-15

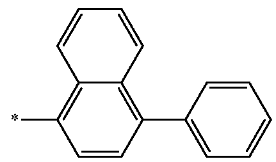

3-16

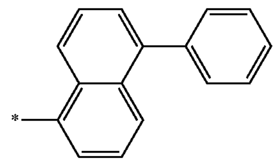

3-17

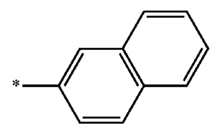

3-18

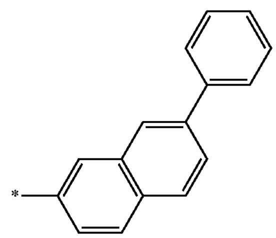

3-19

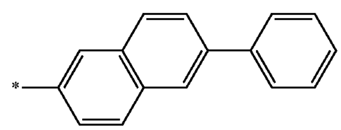

3-20

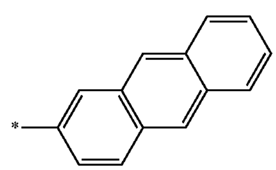

In Formulae 3-1 to 3-20, * represents carbon atoms of a fluorene ring in Formula 2(1) or Formula 2(2).

In Formula 2(1) or Formula 2(2), $Z_3$, $Z_4$, and $R_{11}$ to $R_{24}$ are each independently selected from i) hydrogen, deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

ii) a $C_1$-$C_{60}$ alkyl group, a $C_2$-$C_{60}$ alkenyl group, a $C_2$-$C_{60}$ alkynyl group, and a $C_1$-$C_{60}$ alkoxy group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group;

iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and v) —$N(Q_{11})(Q_{12})$, —$Si(Q_{13})(Q_{14})(Q_{15})$, and —$B(Q_{16})(Q_{17})$ (wherein $Q_{11}$ to $Q_{17}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group).

For example, in Formula 2(1) or Formula 2(2), $Z_3$, $Z_4$, and $R_{11}$ to $R_{24}$ are each independently selected from i) hydrogen, deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, and a $C_1$-$C_{20}$ alkyl group;

ii) a $C_1$-$C_{20}$ alkyl group substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group;

iii) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group; and iv) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group.

As another example, in Formula 2(1) or Formula 2(2) above, $Z_3$, $Z_4$, and $R_{11}$ to $R_{24}$ are each independently hydrogen, deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, or a $C_1$-$C_{20}$ alkyl group.

As another example, in Formula 2(1) or Formula 2(2) above, $Z_3$, $Z_4$, and $R_{11}$ to $R_{24}$ are each independently selected from hydrogen, deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a methyl group, an ethyl group, a propyl group, a butyl group, a pentyl group, a hexyl group, a heptyl group, and a compound represented by any one of Formulae 3-1 to 3-20 below:

3-1

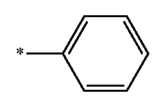

3-2

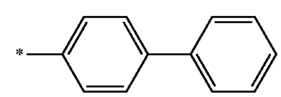

3-3

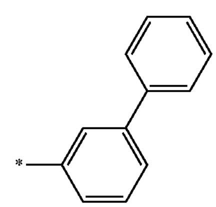

3-4

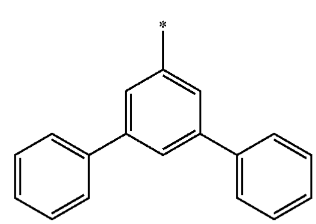

3-5

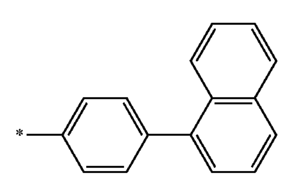

-continued 3-6

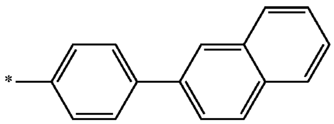

3-7

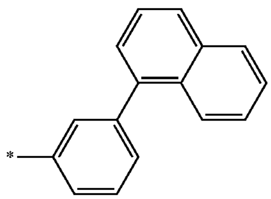

3-8

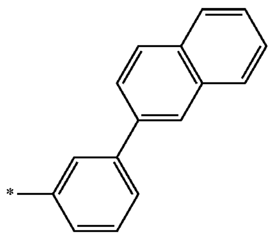

3-9

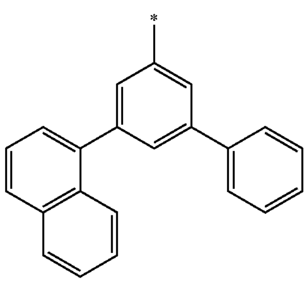

3-10

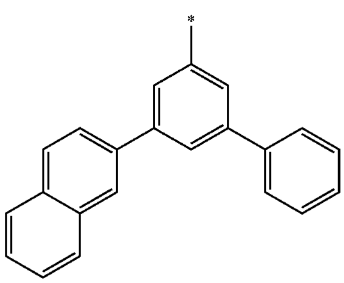

3-11

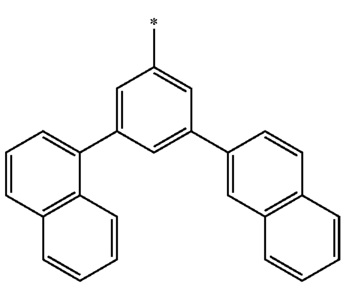

3-12

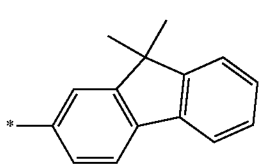

-continued 3-13

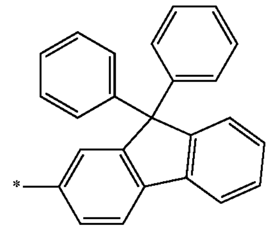

3-14

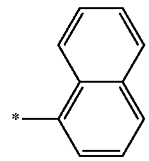

3-15

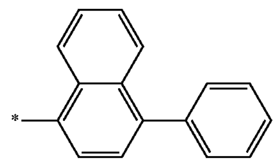

3-16

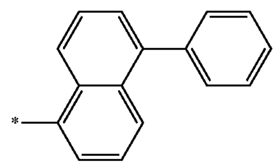

3-17

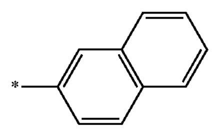

3-18

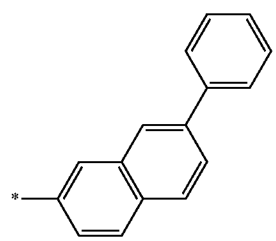

3-19

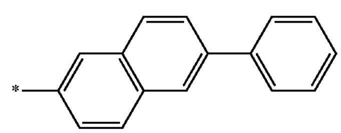

3-20

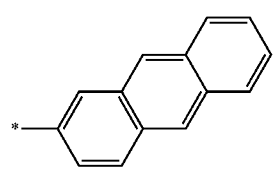

In Formula 2(1) or Formula 2(2), p is the number of $Z_3$s and p is an integer of 1 to 4. When p is 2 or greater, a p number of $Z_3$s may be the same or different. q is the number of $Z_4$s and is an integer of 1 to 4. When q is 2 or greater, a q number of $Z_4$s may be the same or different.

According to an embodiment, the hole-transporting material may be represented by any one of Formulae 2a and 2b:

<Formula 2a>
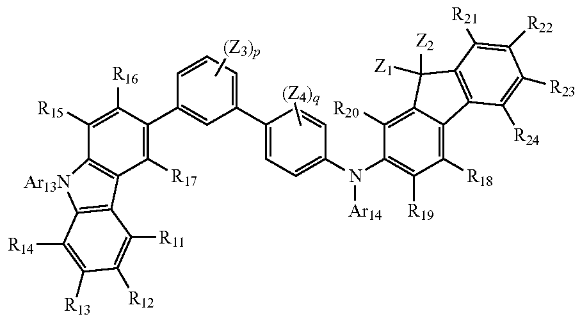
<Formula 2b>
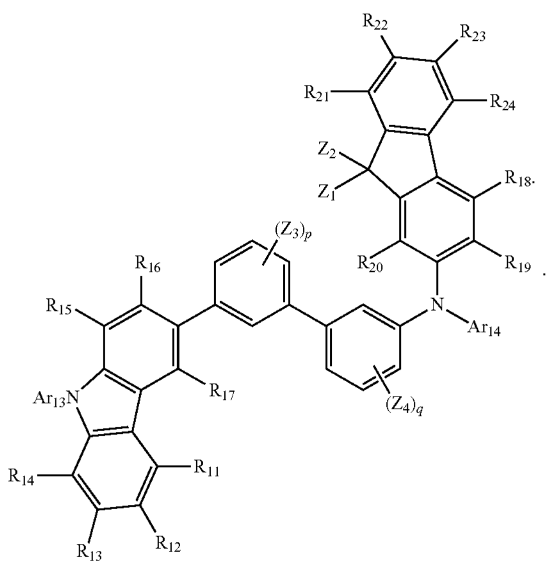
In Formula 2a or 2b,
$Ar_{13}$ and $Ar_{14}$ are each independently represented by any one of Formulae 3-1 to 3-20;
$Z_1$ and $Z_2$ are each independently a $C_1$-$C_{20}$ alkyl group or a compound represented by any one of Formulae 3-1 to 3-20 below:
3-1
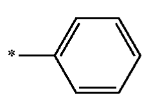
3-2
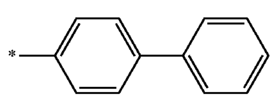
3-3
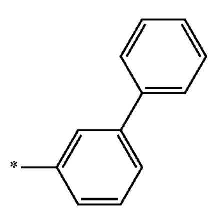
-continued
3-4
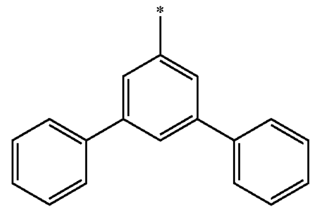
3-5
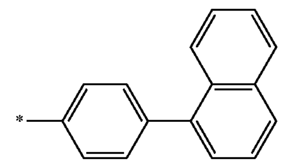
3-6
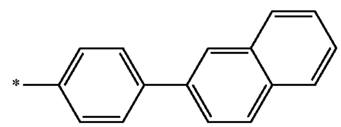
3-7
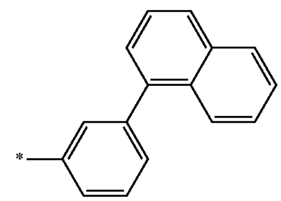
3-8
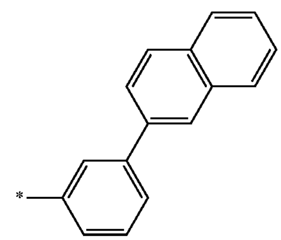
3-9
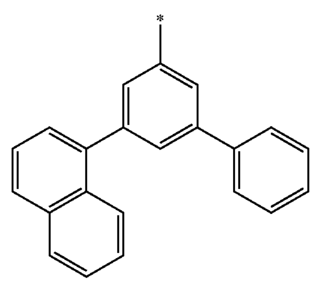
3-10
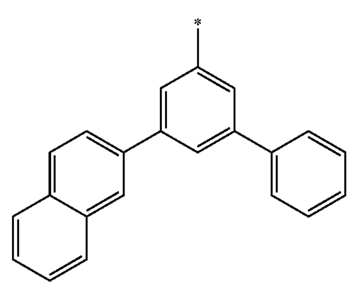

3-11

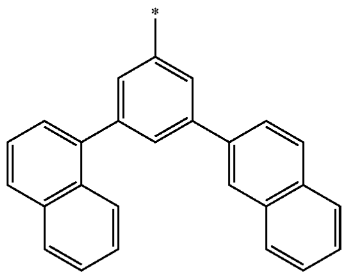

3-12

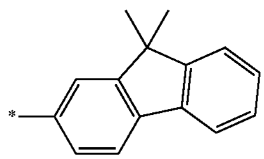

3-13

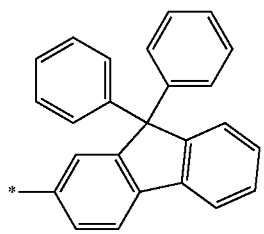

3-14

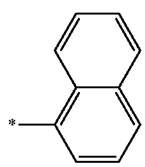

3-15

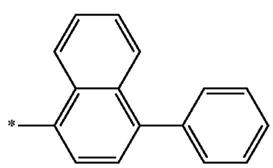

3-16

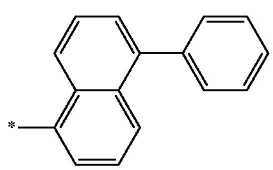

3-17

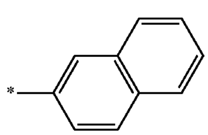

3-18

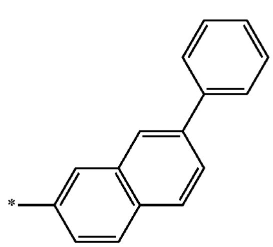

3-19

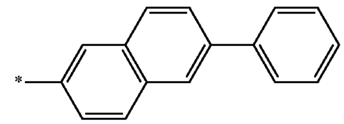

3-20

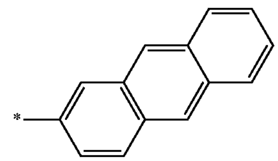

$Z_3$, $Z_4$, and $R_{11}$ to $R_{24}$ are each independently selected from hydrogen, deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{20}$ alkyl group, and a compound represented by any one of Formulae 3-1 to 3-20; and p and q are each independently an integer of 1 to 4.

In other embodiments, the hole-transporting material may be represented by any one of Compounds 6-1 to 6-144 below:

6-1

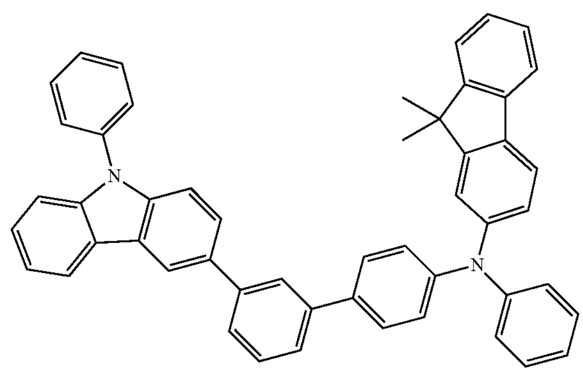

6-2

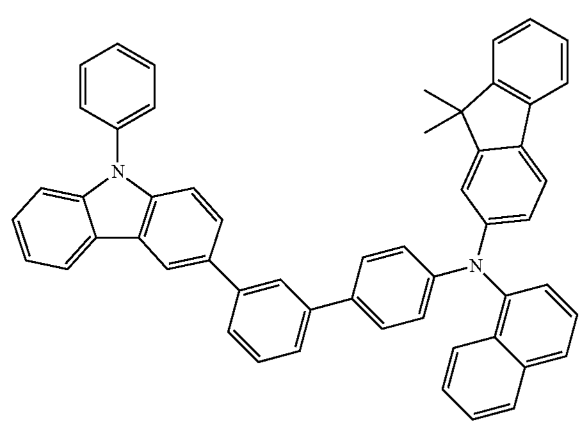

-continued
6-3
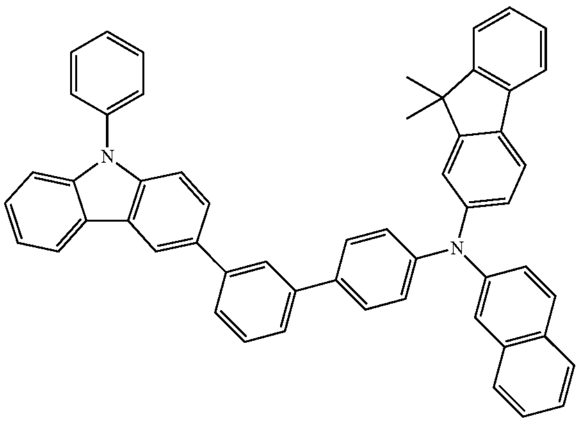
6-4
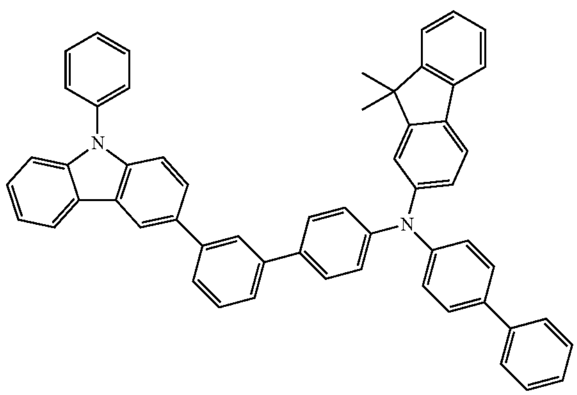
6-5
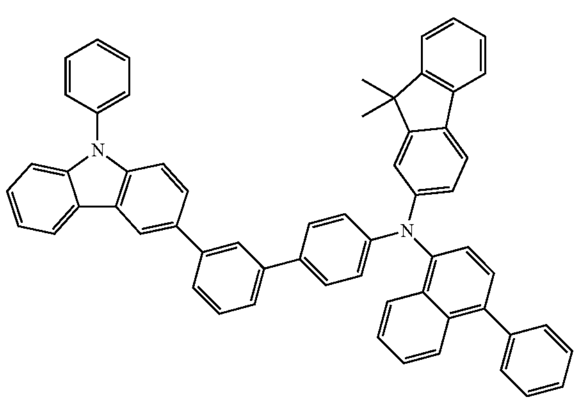
-continued
6-6
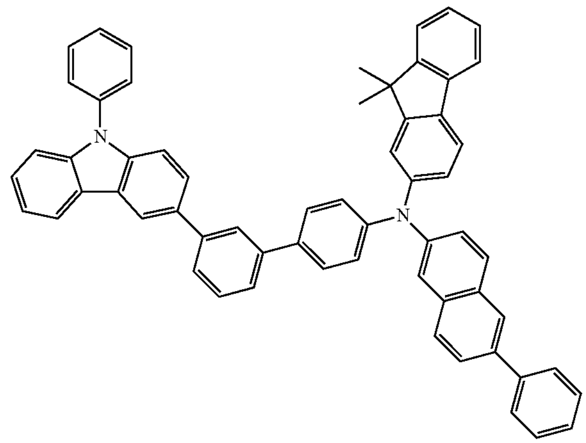
6-7
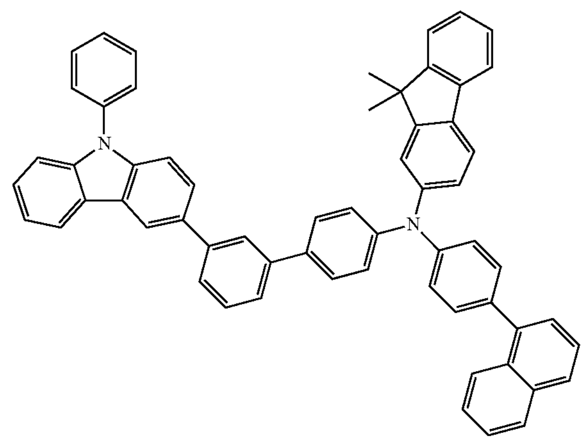
6-8
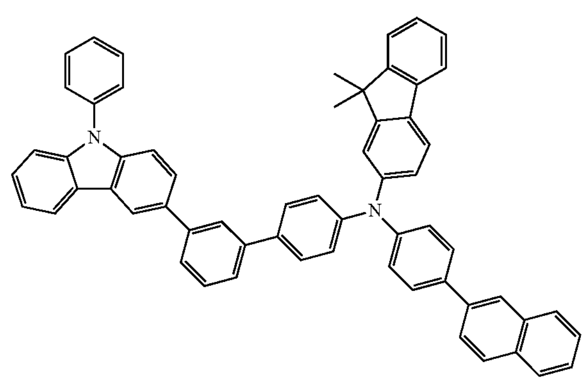

6-9
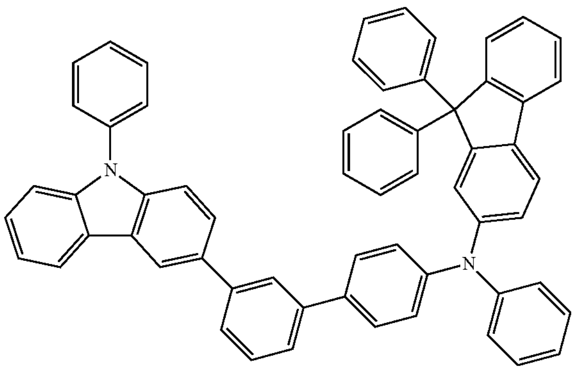
6-10
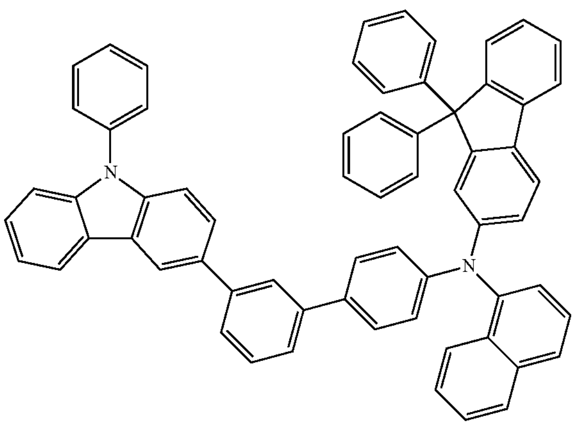
6-11
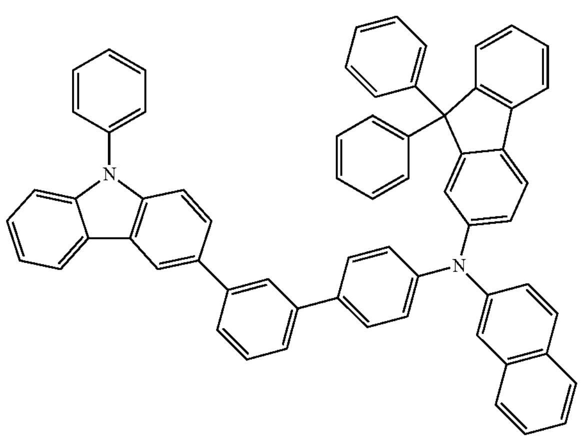
6-12
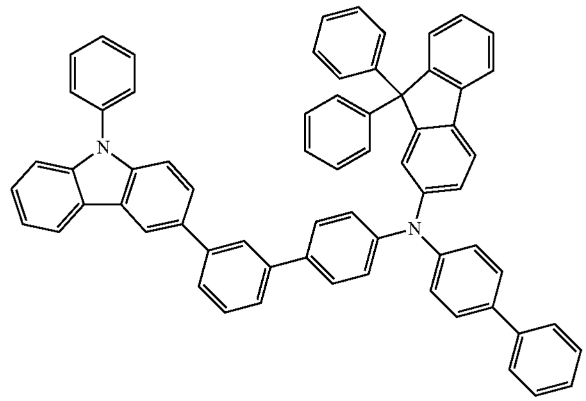
6-13
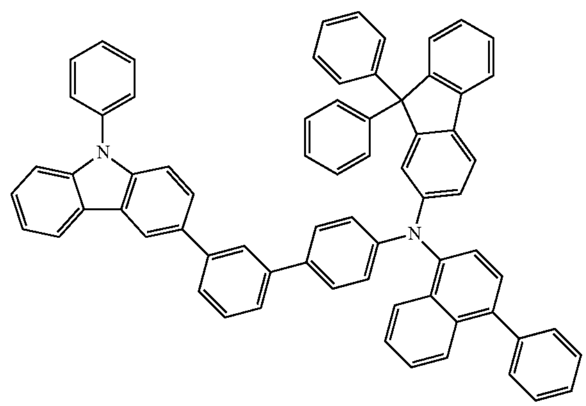
6-14
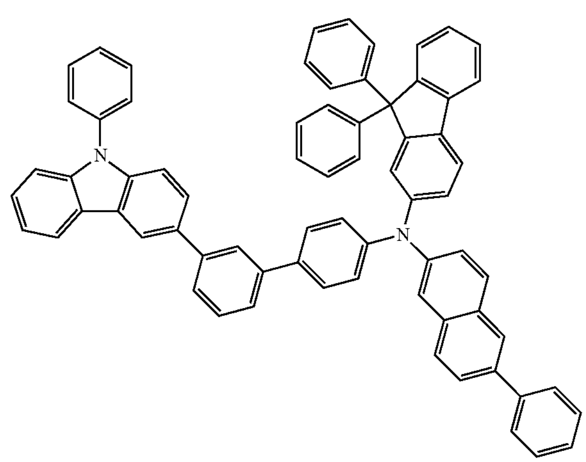

-continued
6-15
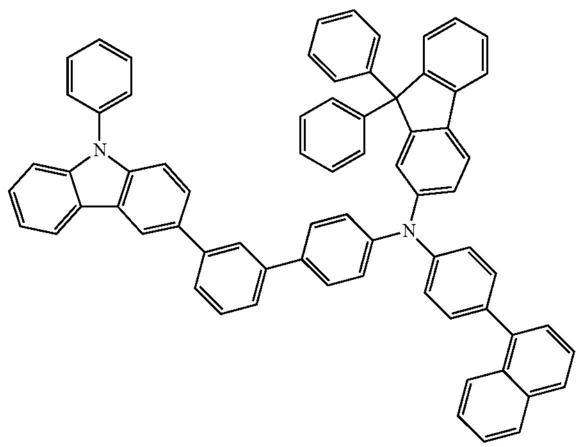
6-16
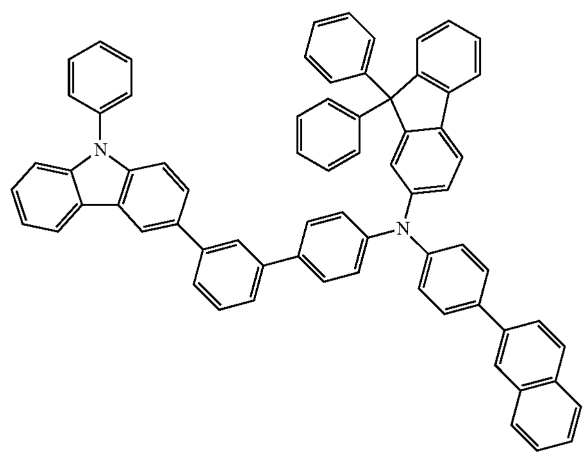
6-17
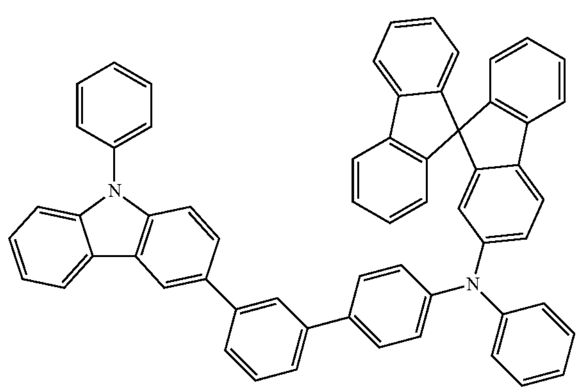
-continued
6-18
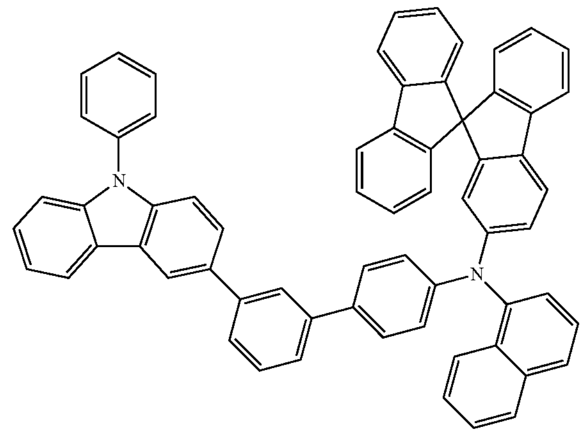
6-19
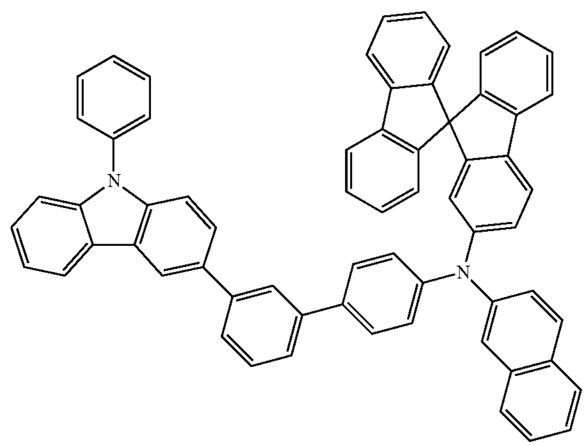
6-20
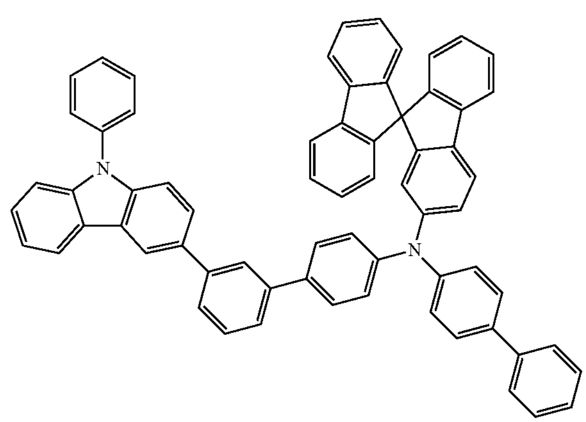

-continued
6-21
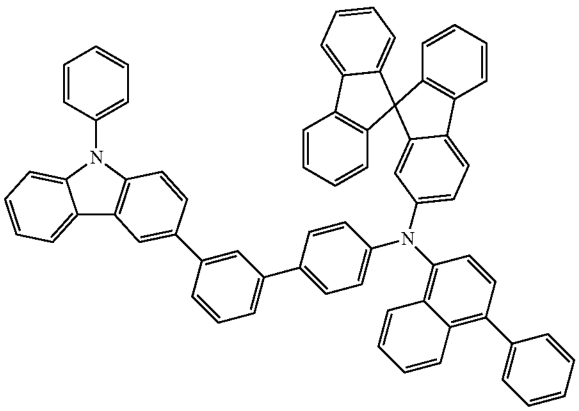
6-22
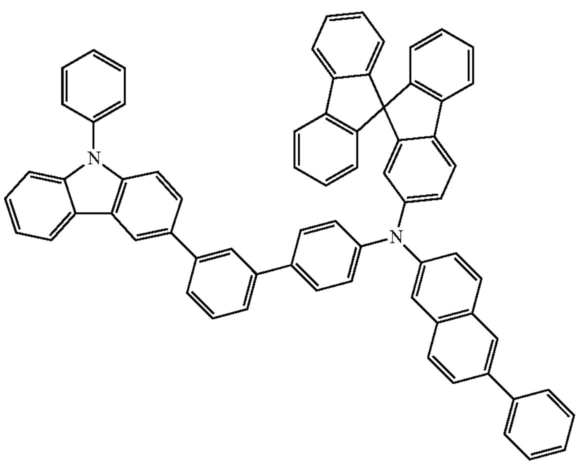
6-23
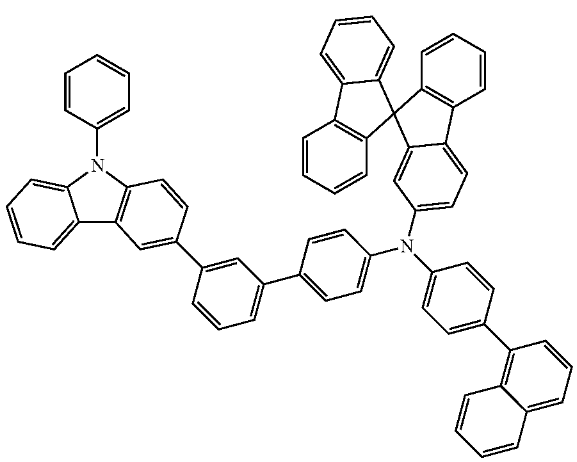
-continued
6-24
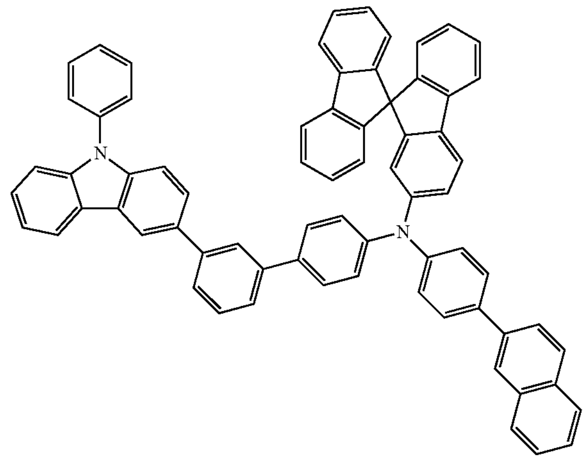
6-25
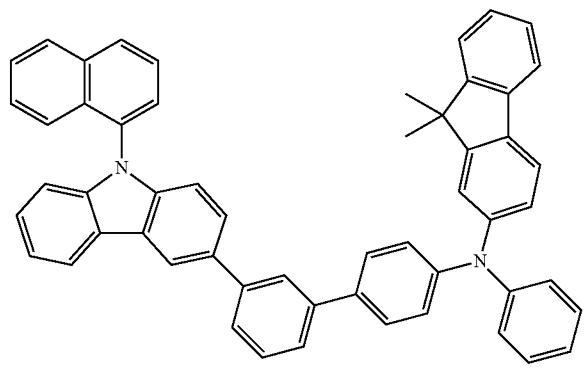
6-26
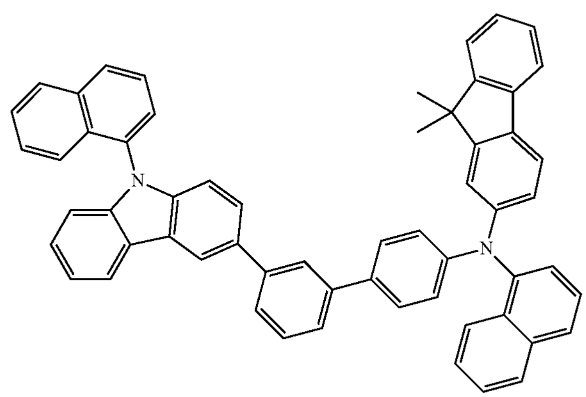

-continued
6-27
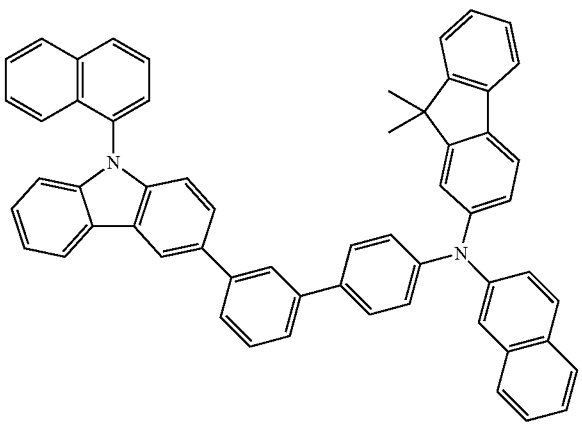
6-28
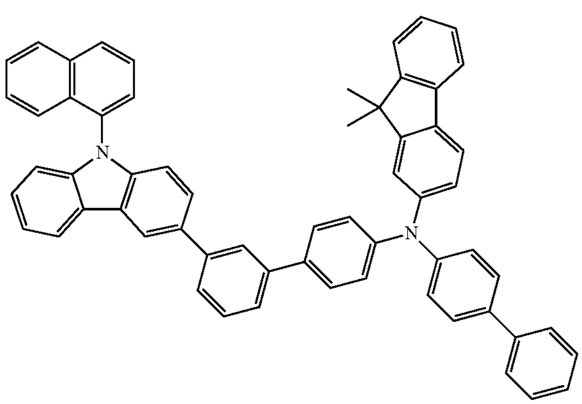
6-29
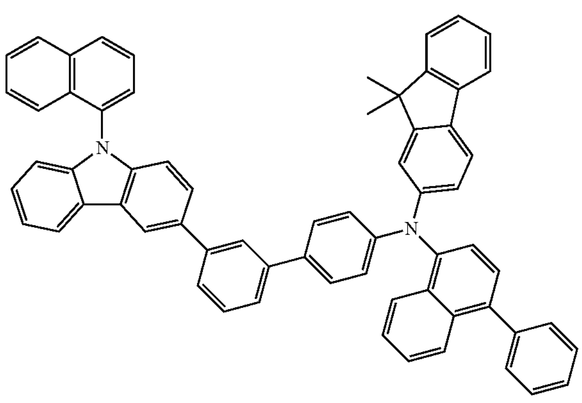
-continued
6-30
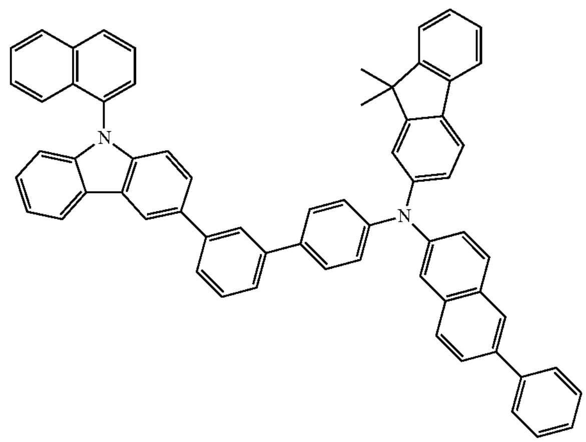
6-31
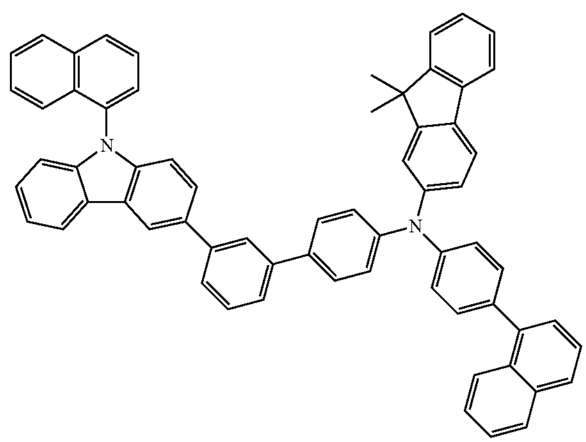
6-32
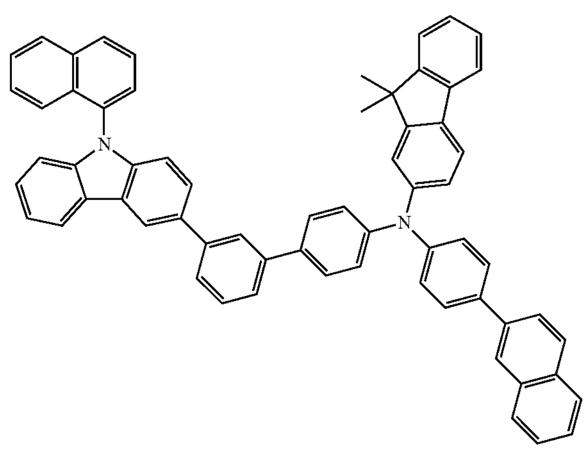

-continued
6-33
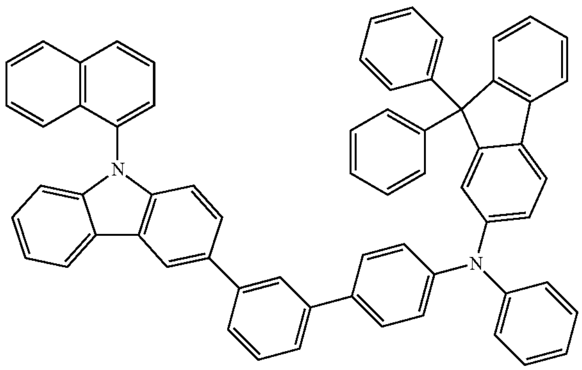
6-34
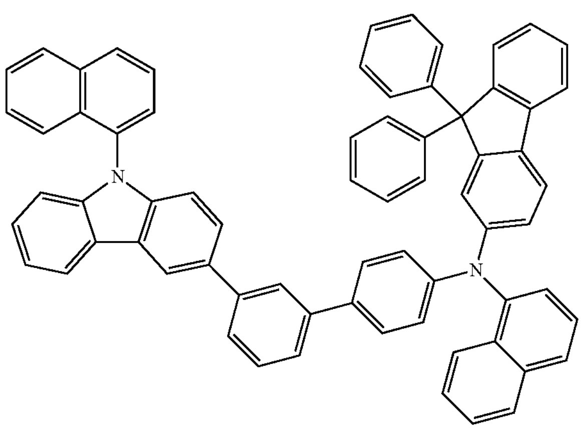
6-35
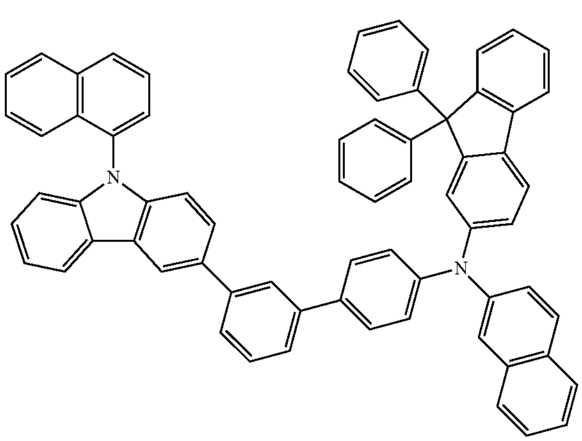
-continued
6-36
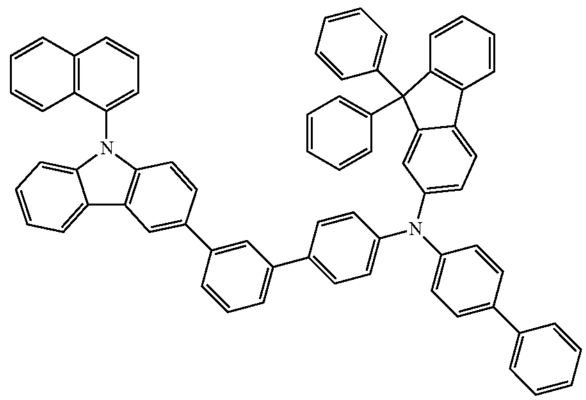
6-37
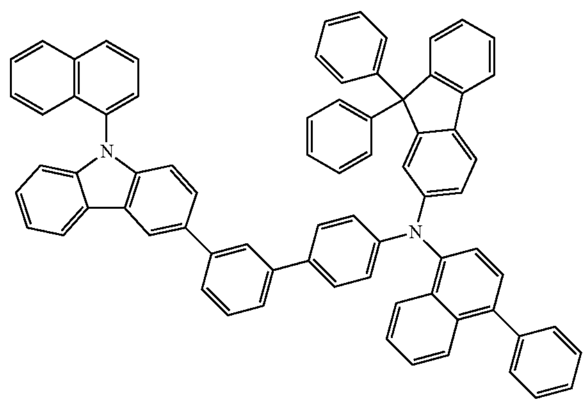
6-38
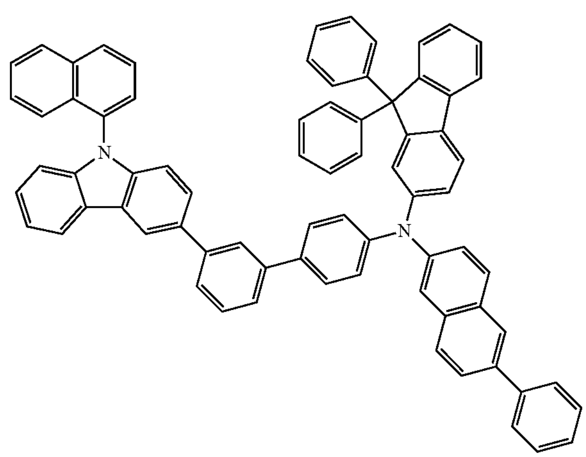

6-39
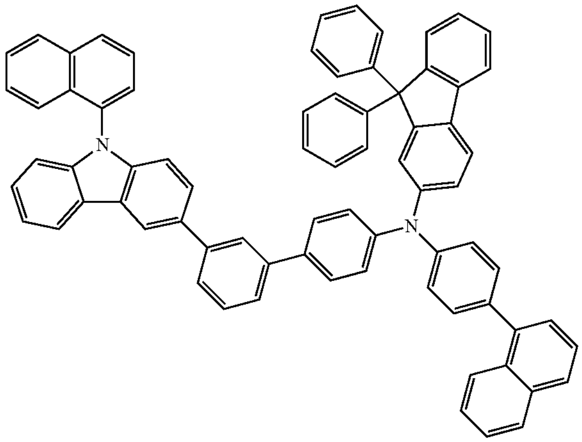
6-40
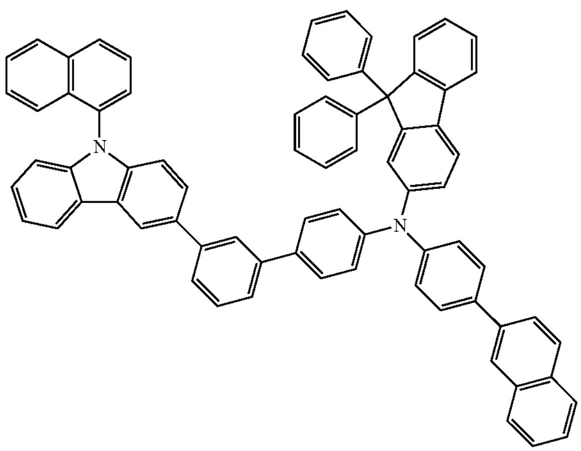
6-41
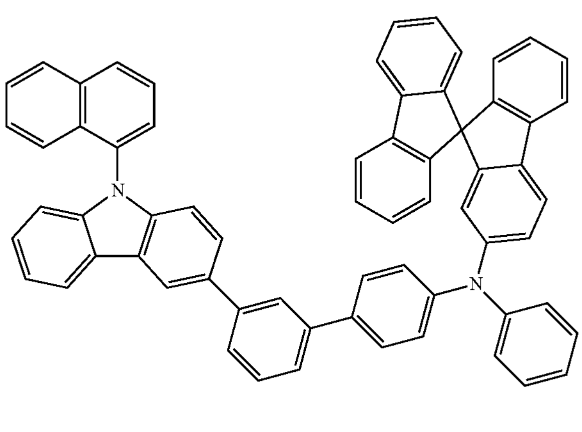
6-42
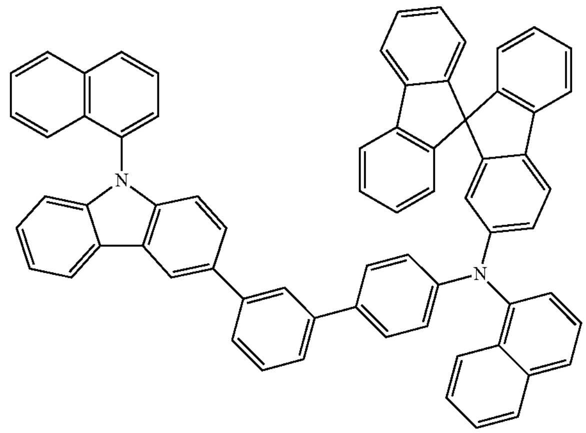
6-43
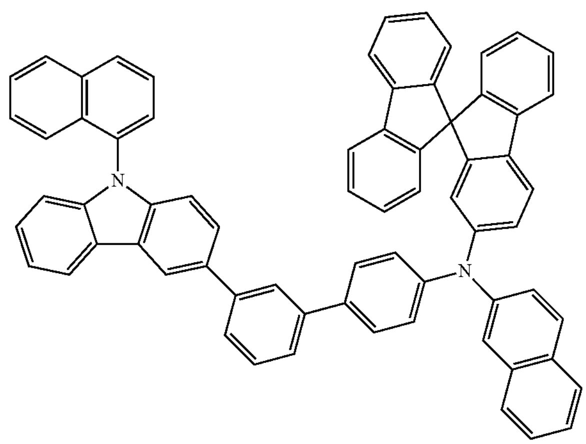
6-44
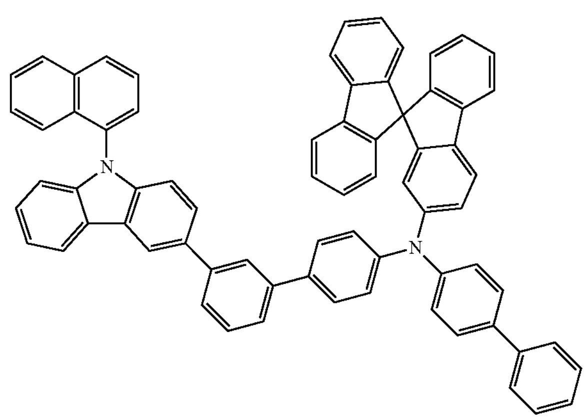

6-45
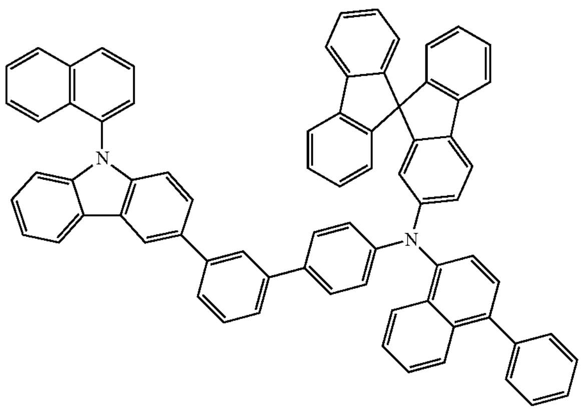
6-46
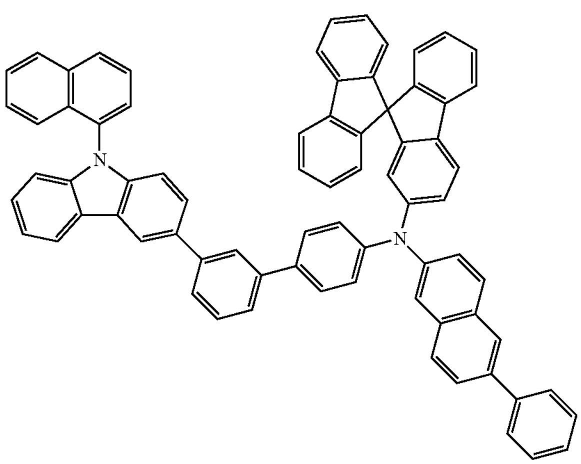
6-47
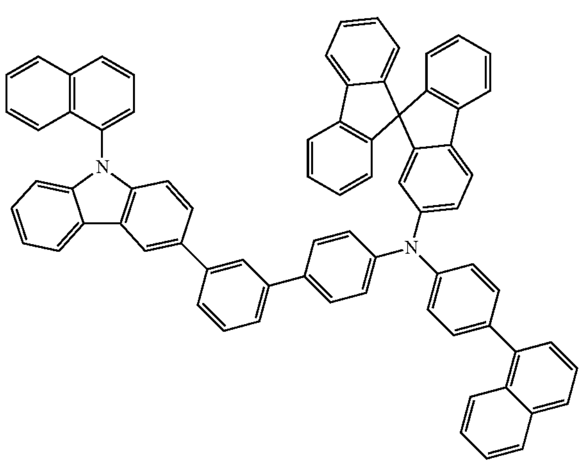
6-48
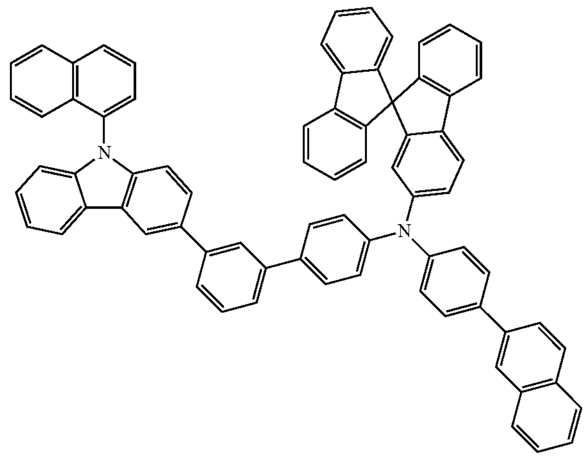
6-49
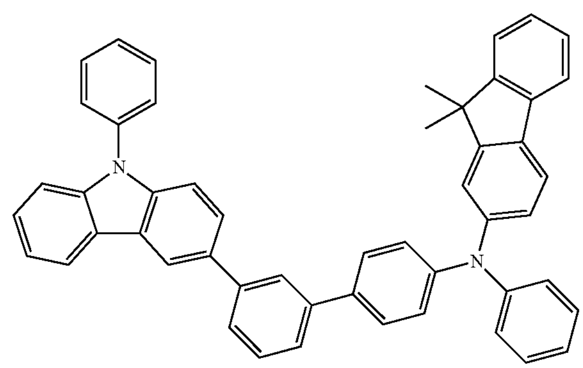
6-50
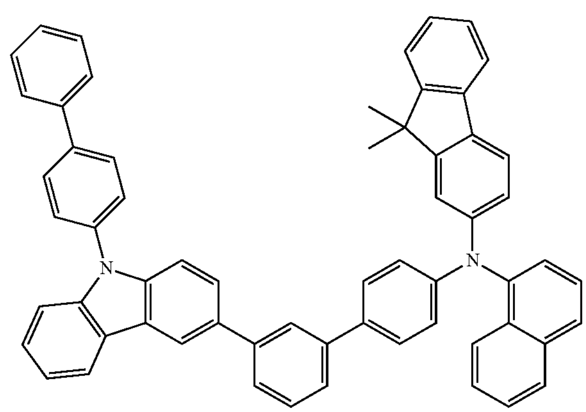

-continued
6-51
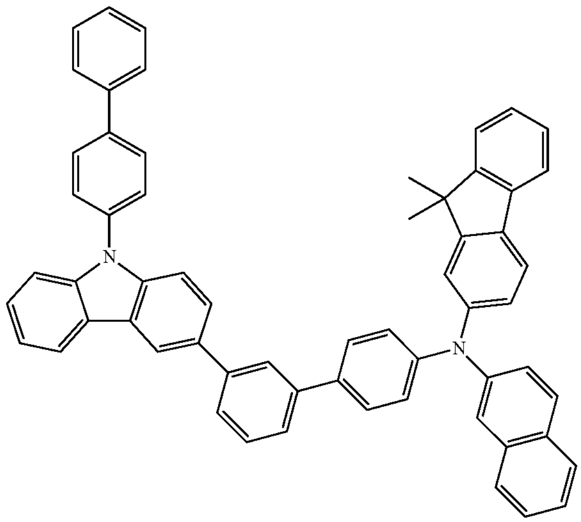
6-52
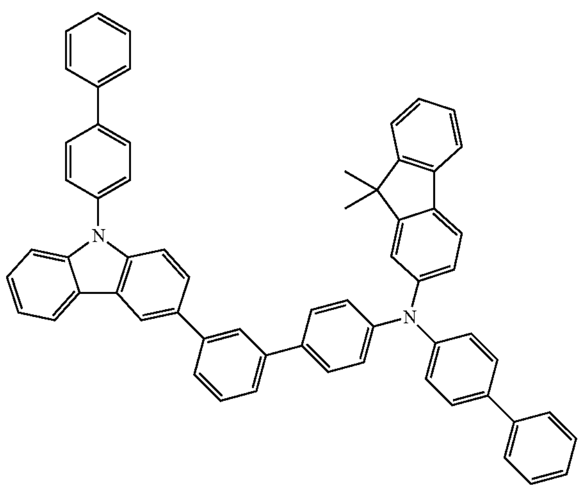
6-53
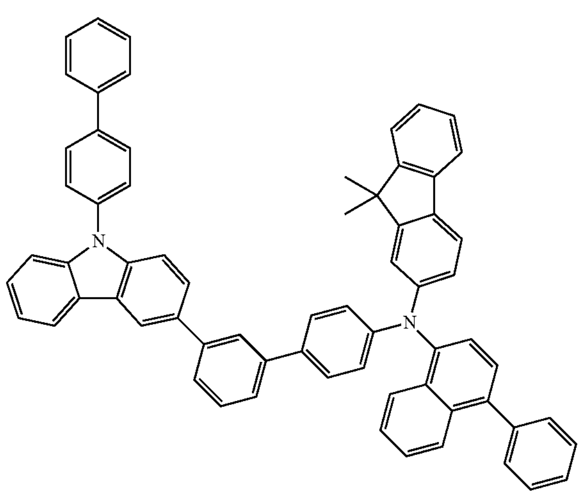
-continued
6-54
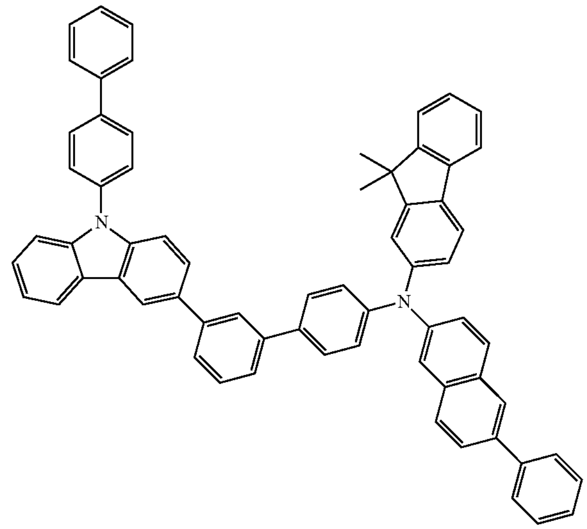
6-55
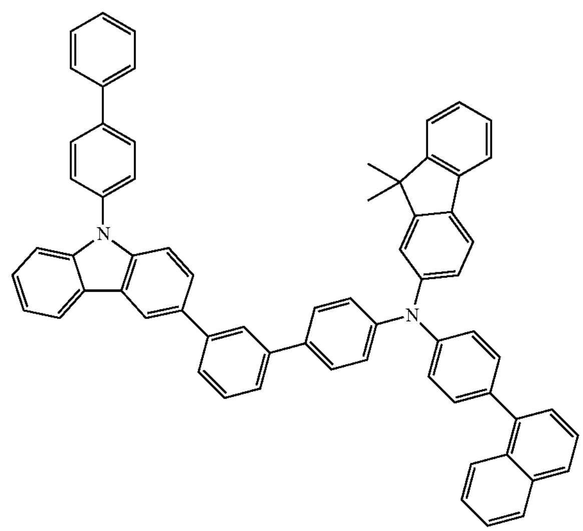
6-56
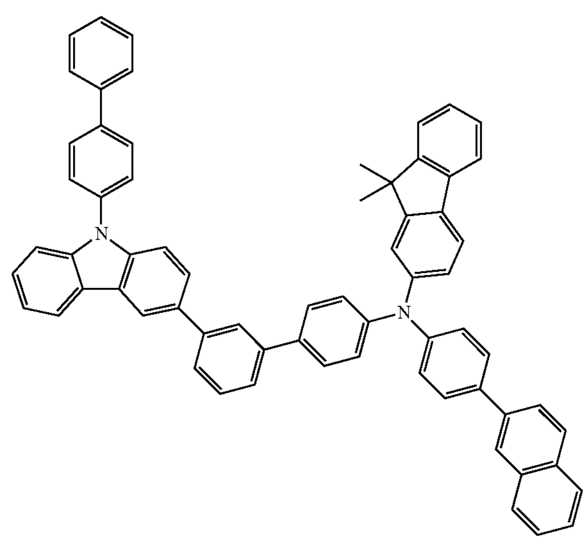

-continued
6-57
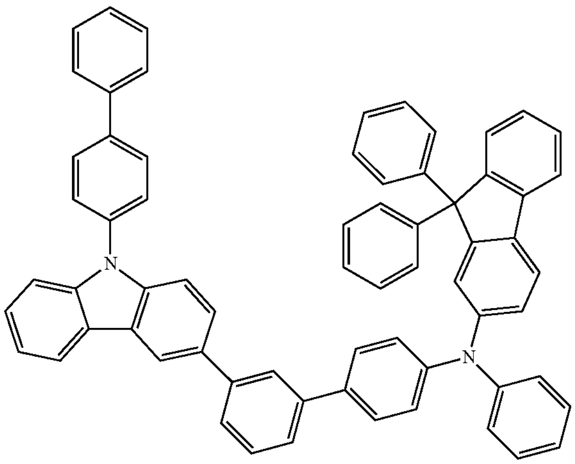
6-58
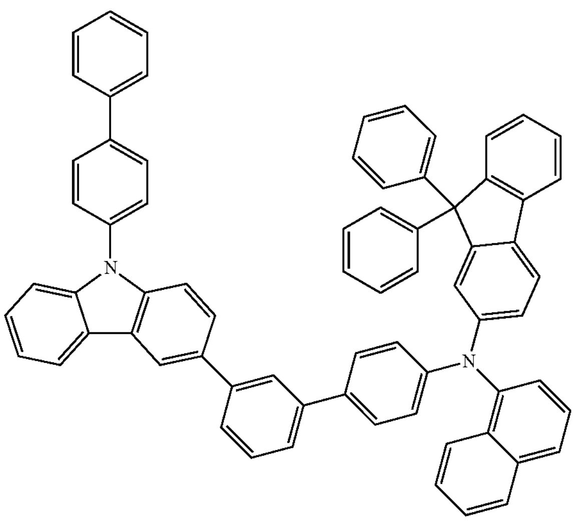
6-59
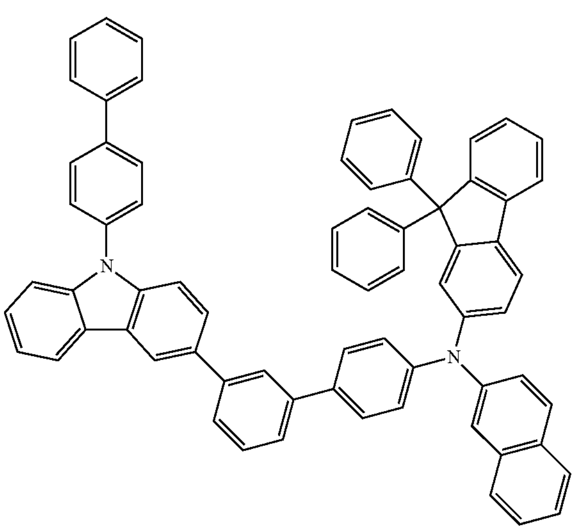
-continued
6-60
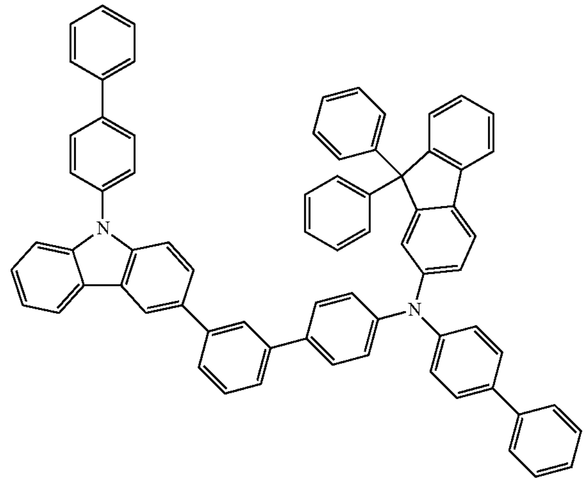
6-61
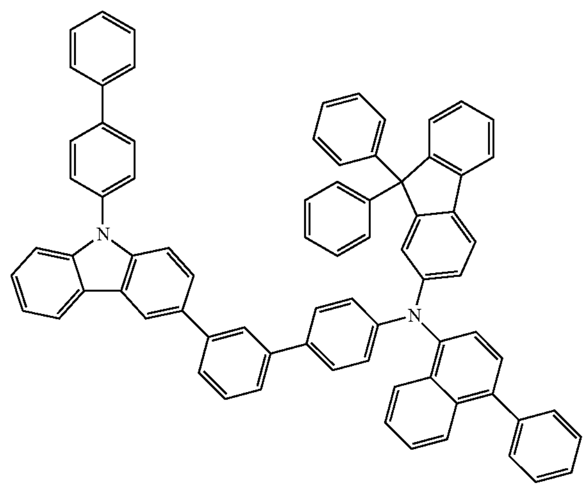
6-62
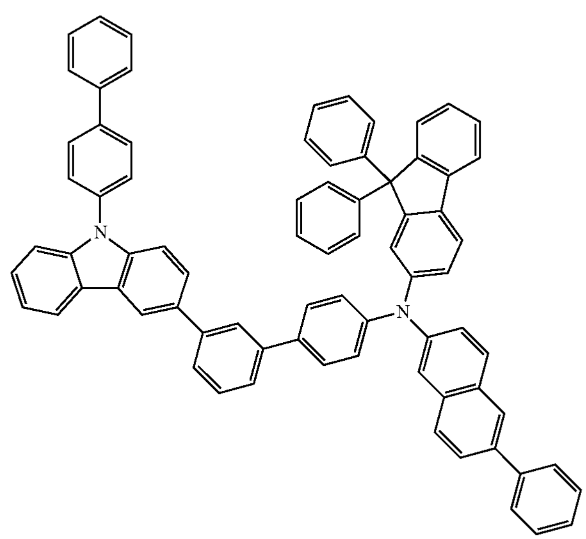

-continued
6-63
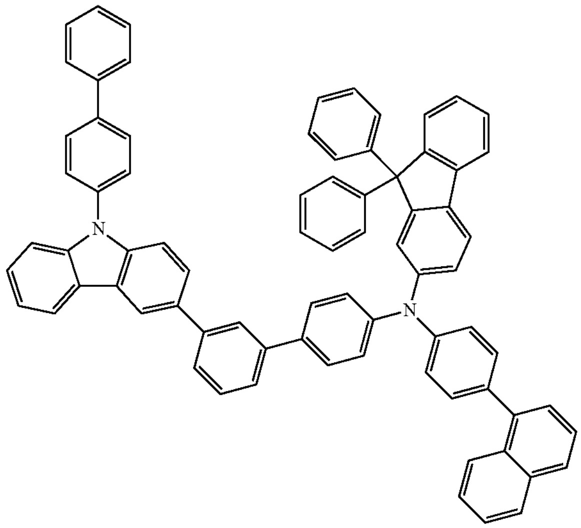
6-64
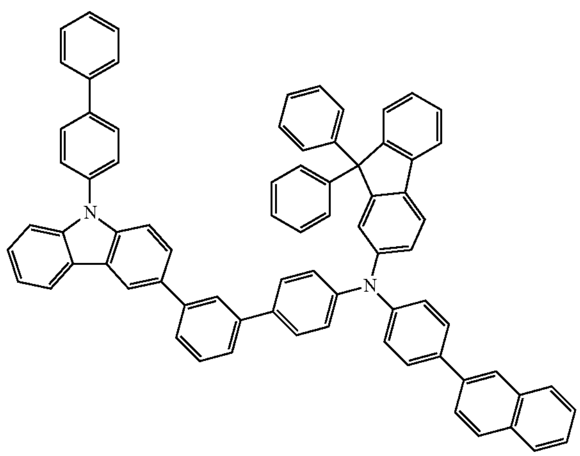
6-65
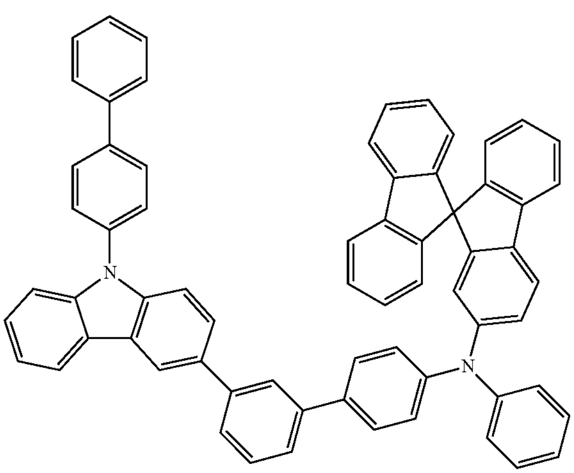
-continued
6-66
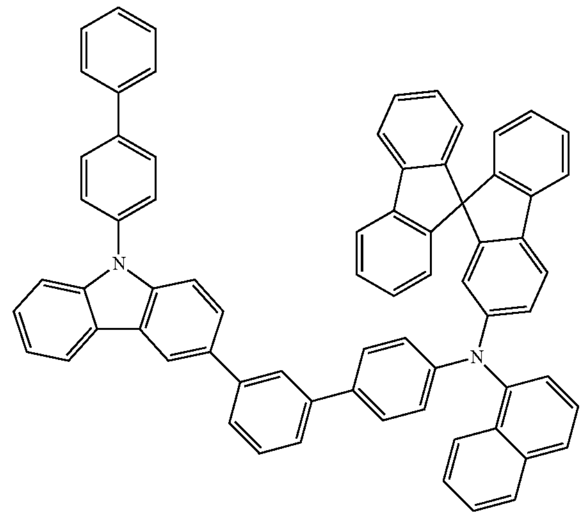
6-67
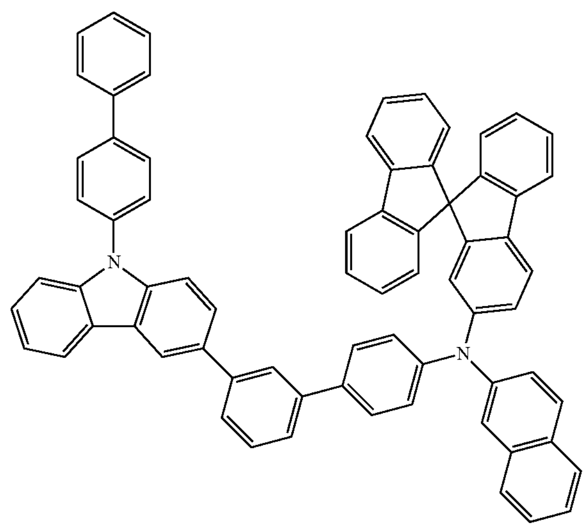
6-68
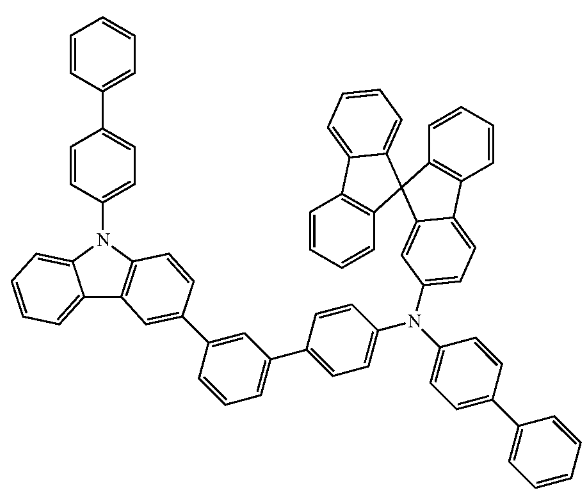

-continued
6-69
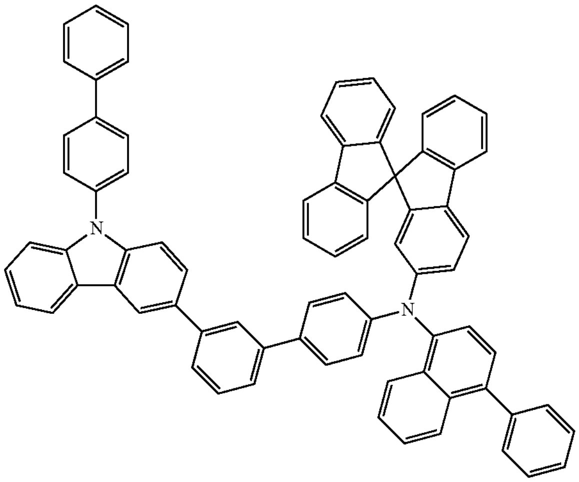
6-70
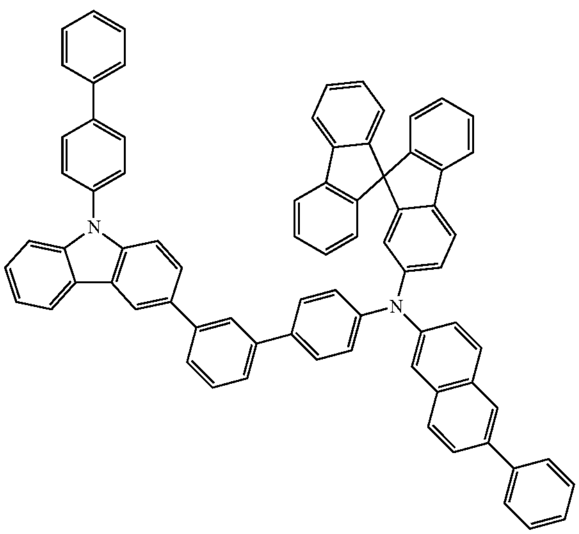
6-71
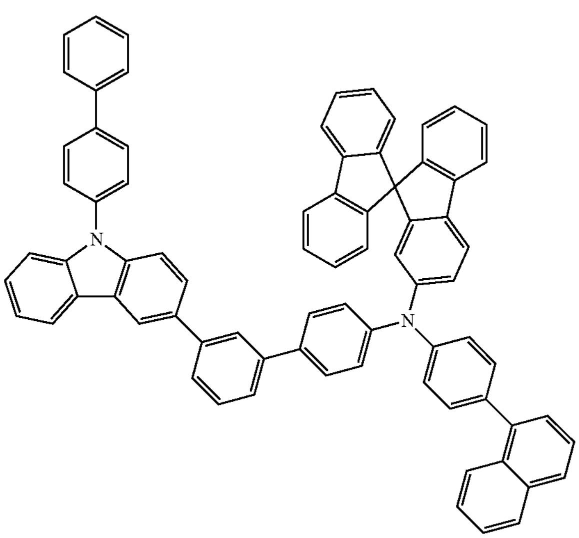
-continued
6-72
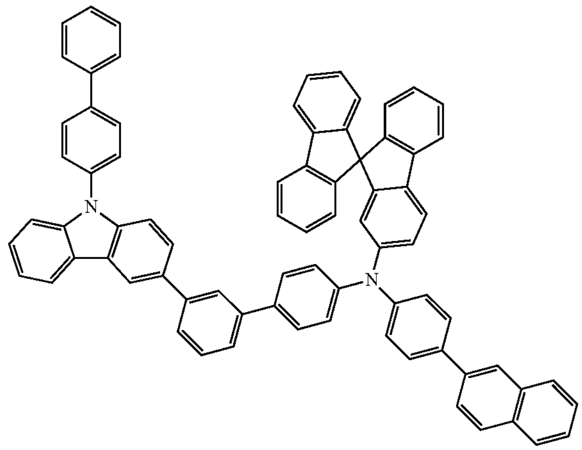
6-73
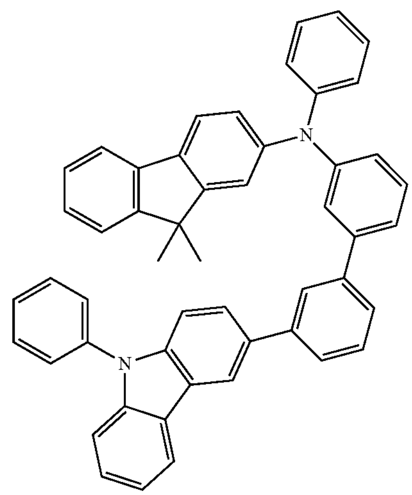
6-74
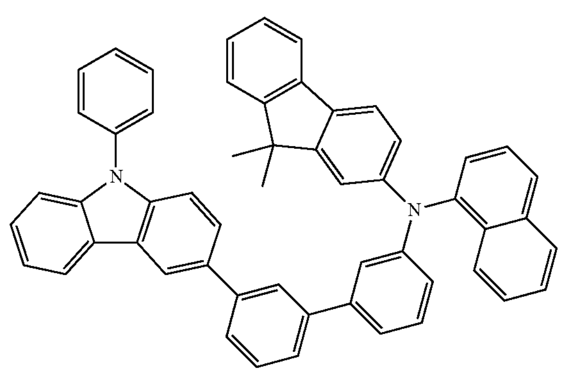

-continued
6-75
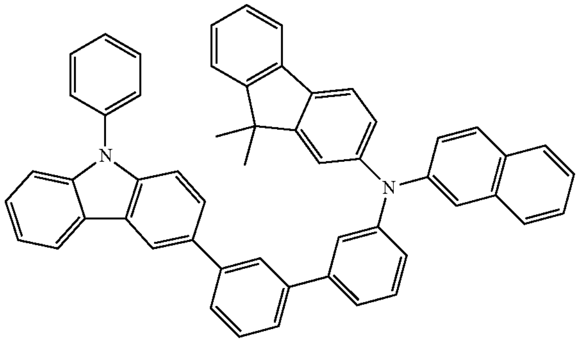
6-76
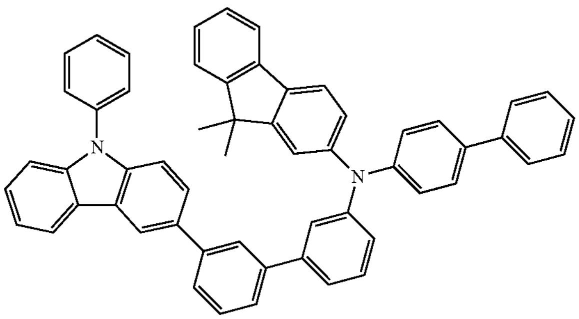
6-77
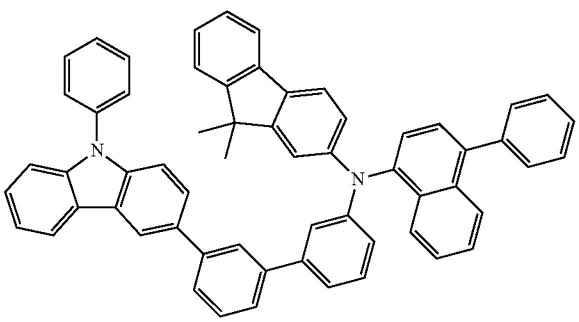
6-78
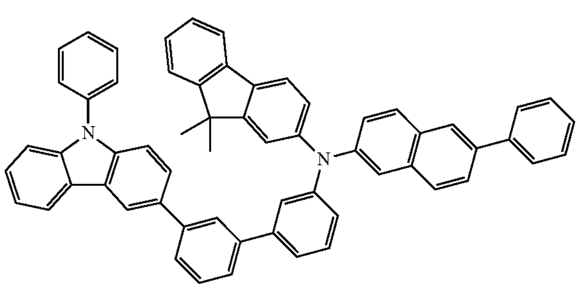
-continued
6-79
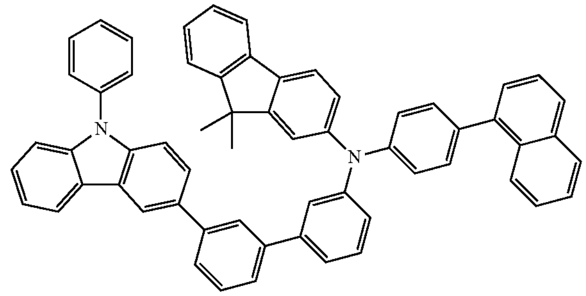
6-80
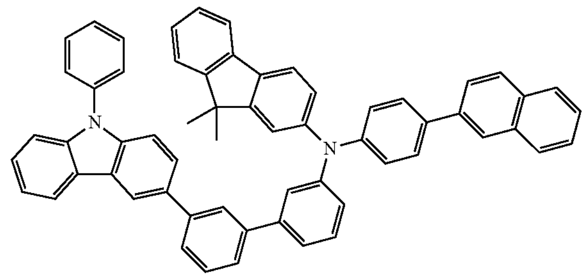
6-81
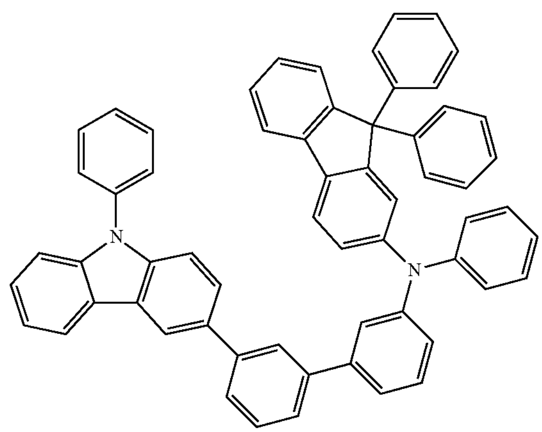
6-82
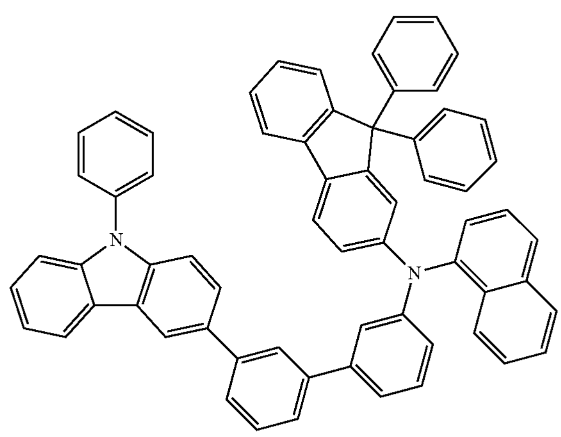

-continued
6-83
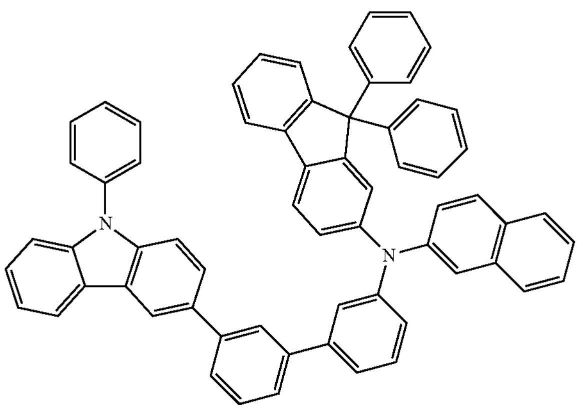
6-84
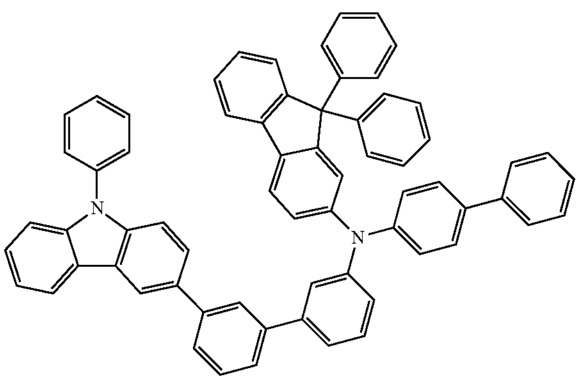
6-85
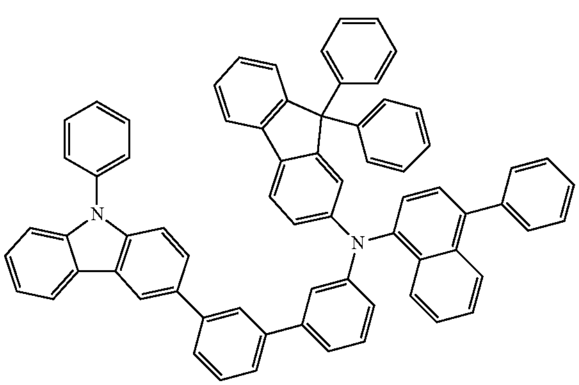
-continued
6-86
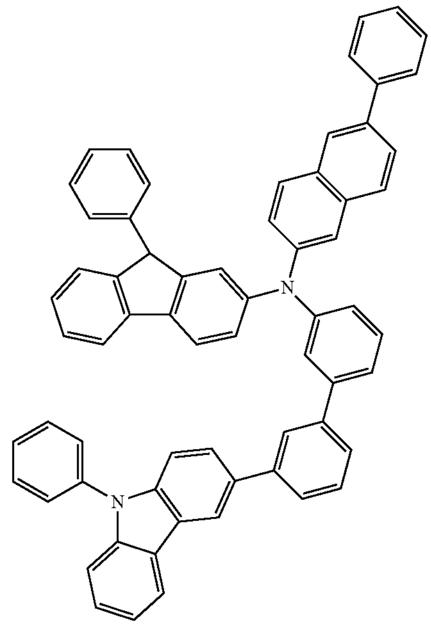
6-87
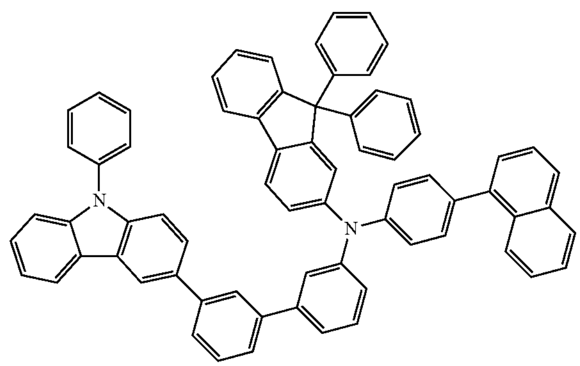
6-88
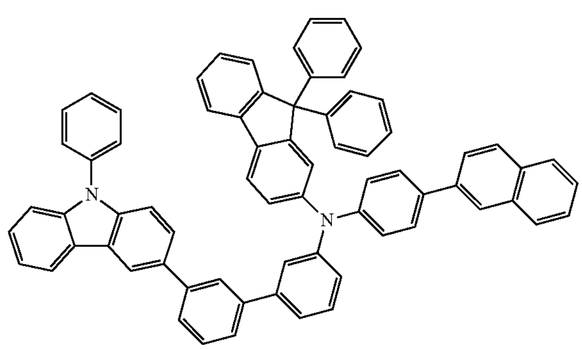

-continued
6-89
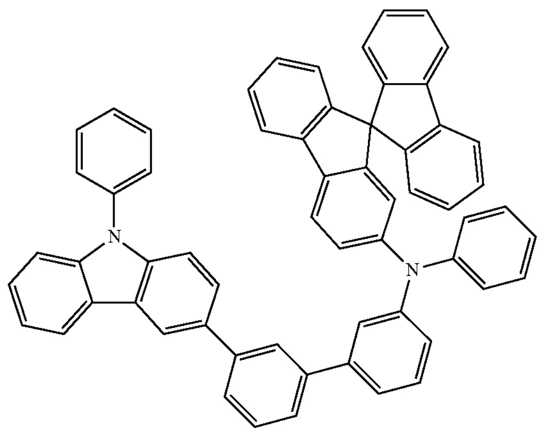
6-90
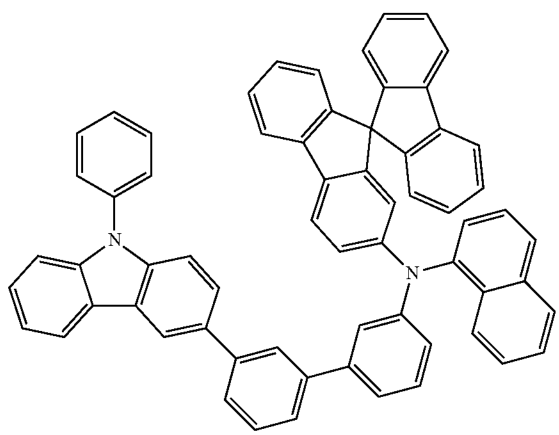
6-91
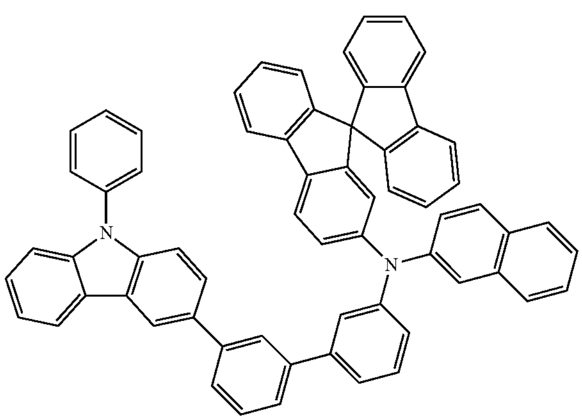
-continued
6-92
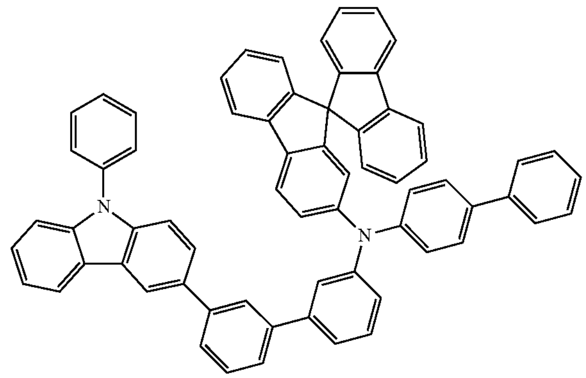
6-93
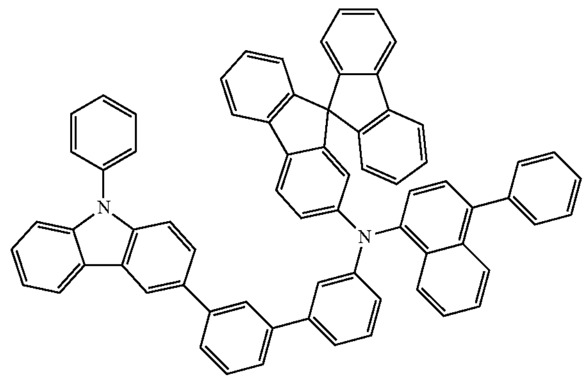
6-94
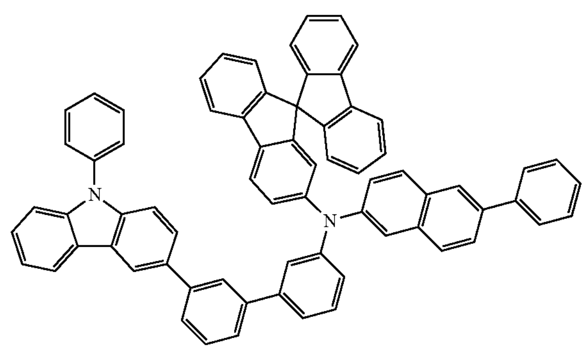
6-95
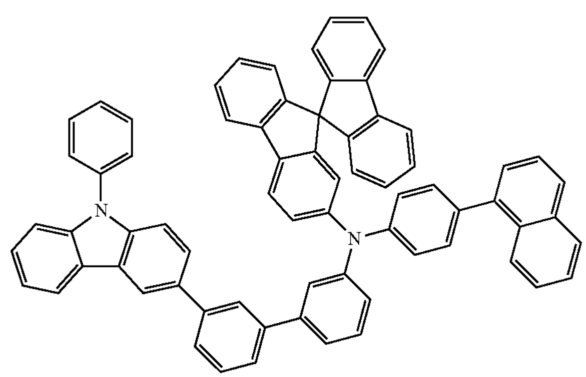

-continued
6-96
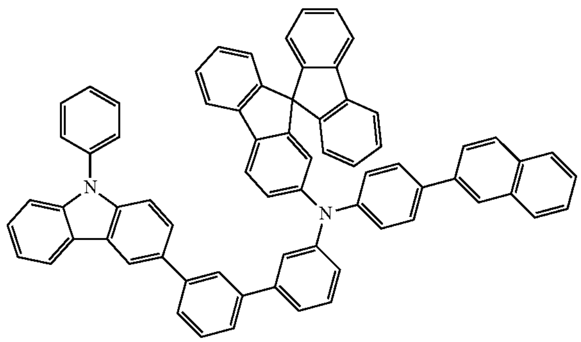
6-97
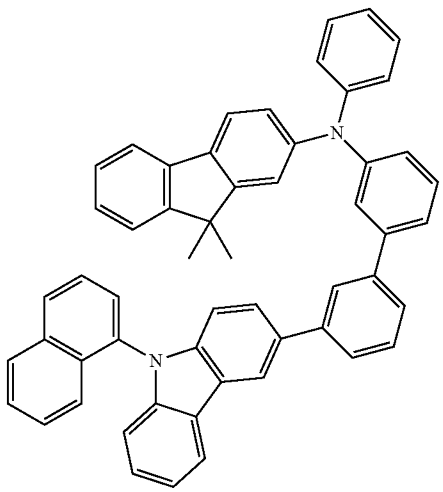
6-98
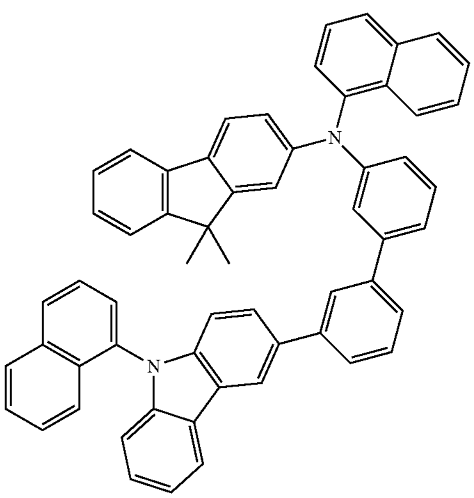
-continued
6-99
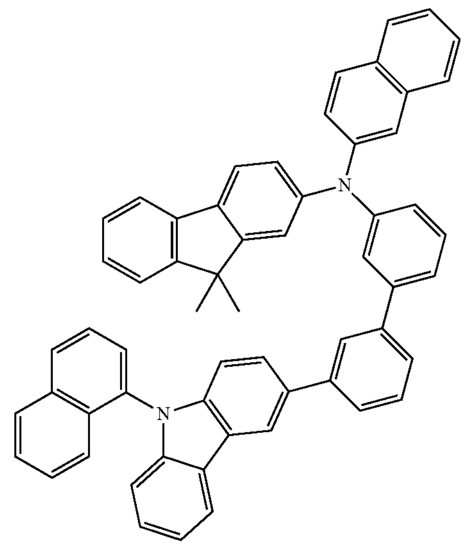
6-100
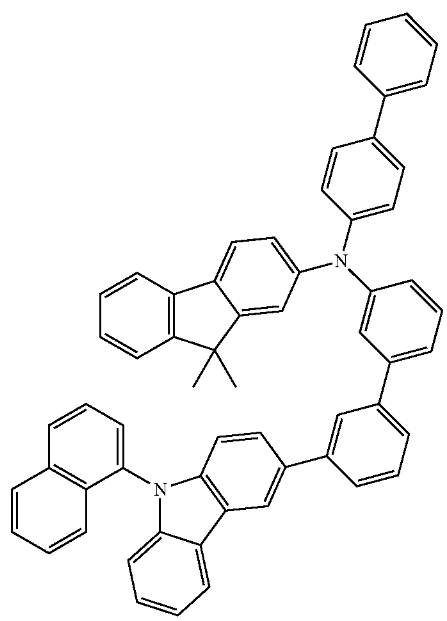
6-101
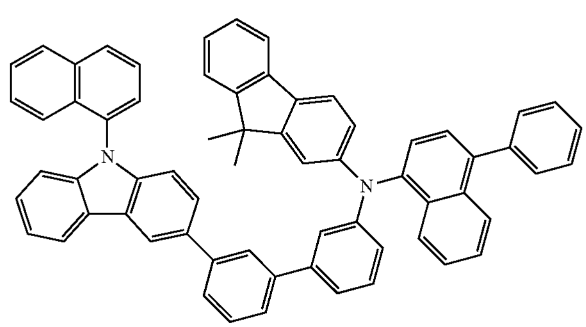

6-102
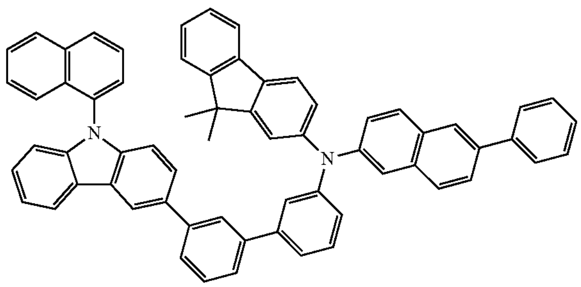
6-103
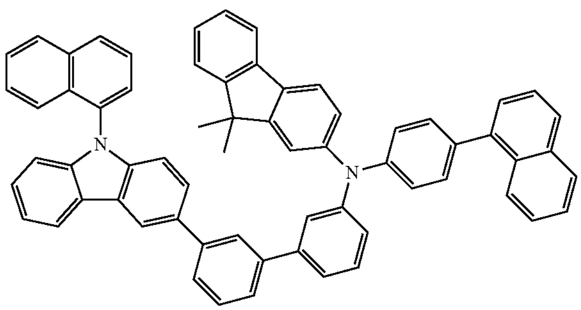
6-104
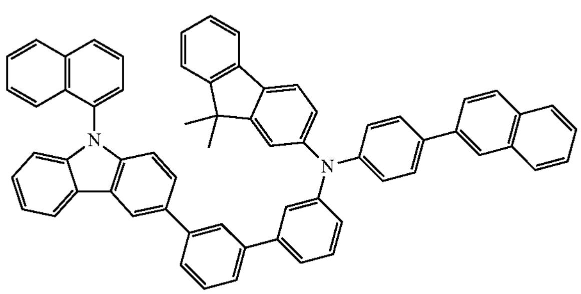
6-105
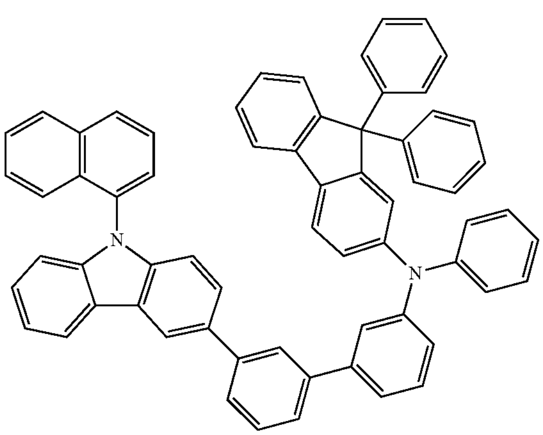
6-106
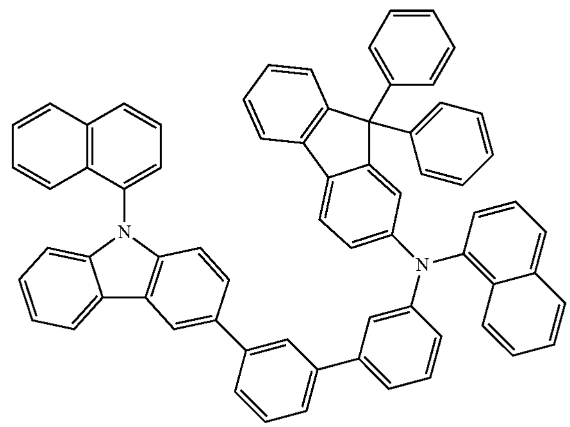
6-107
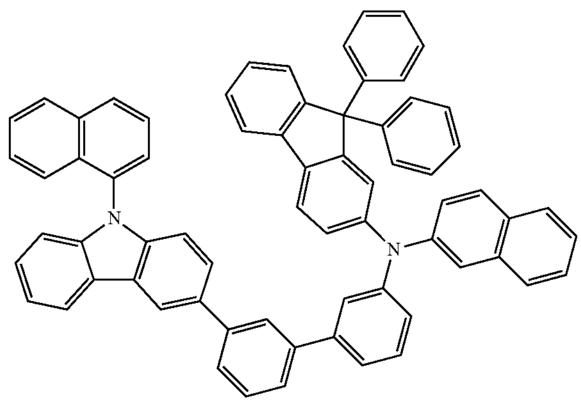
6-108
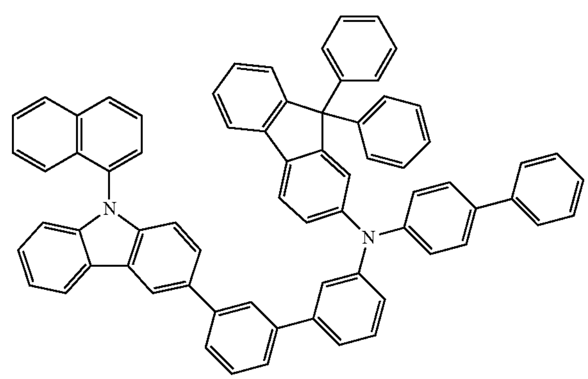
6-109
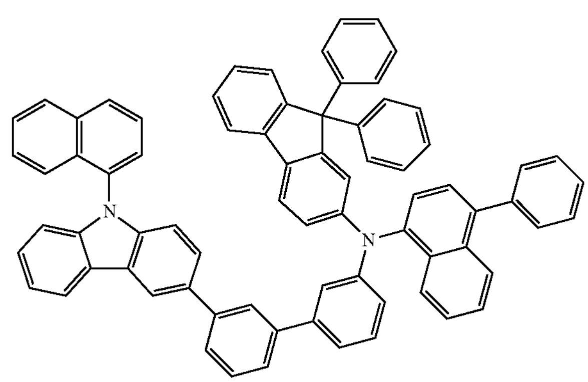

-continued
6-110
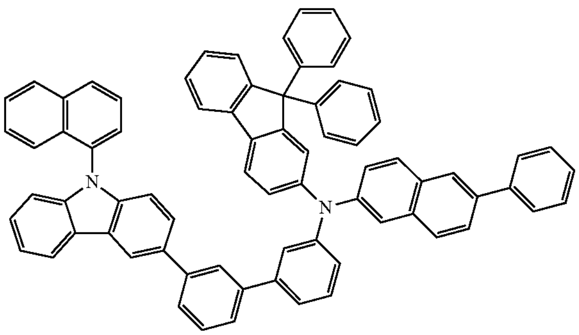
6-111
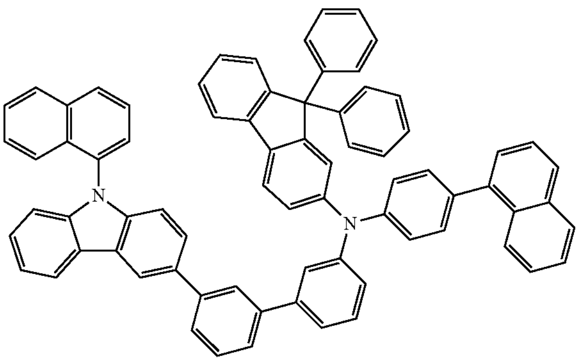
6-112
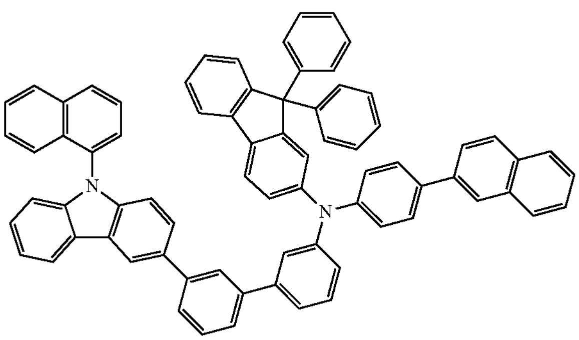
6-113
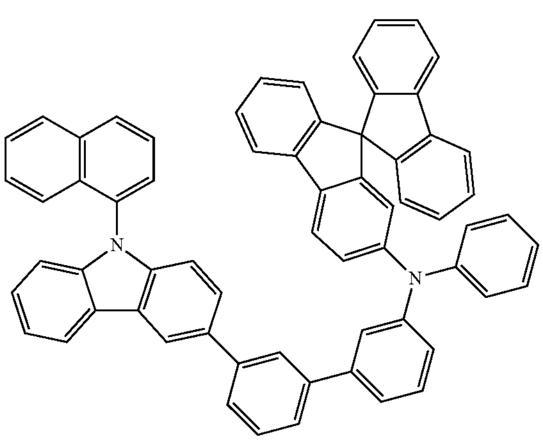
-continued
6-114
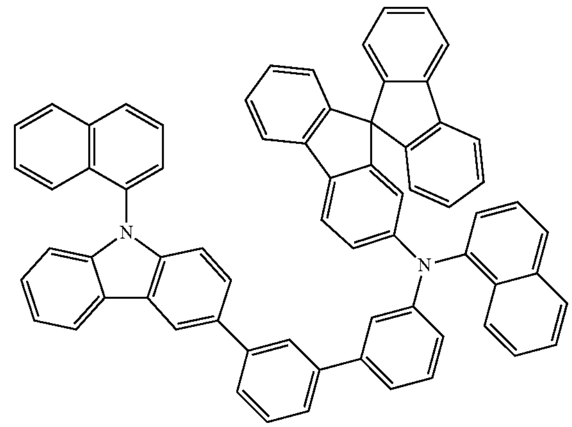
6-115
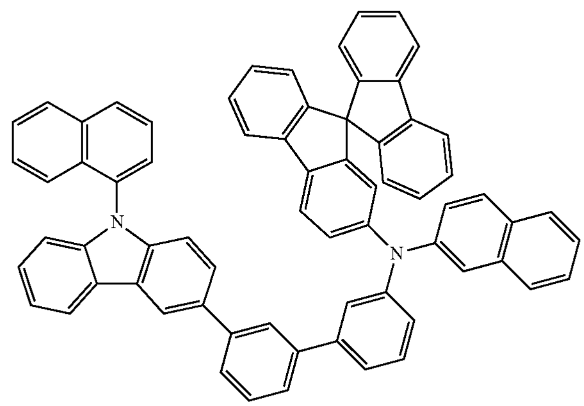
6-116
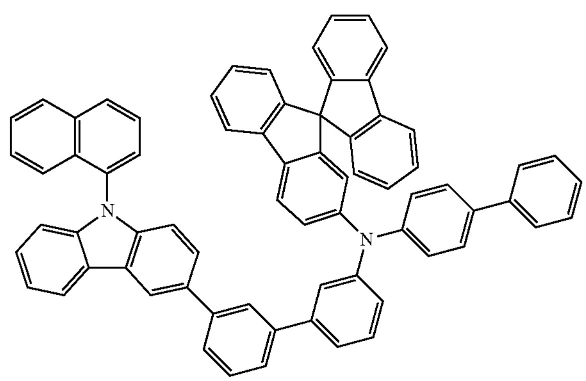
6-117
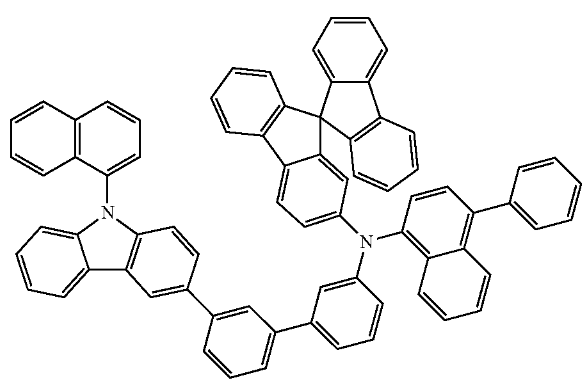

-continued
6-118
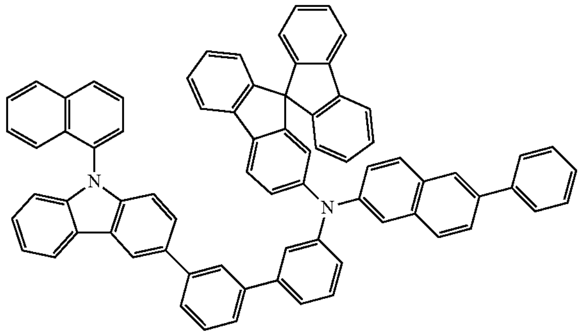
6-119
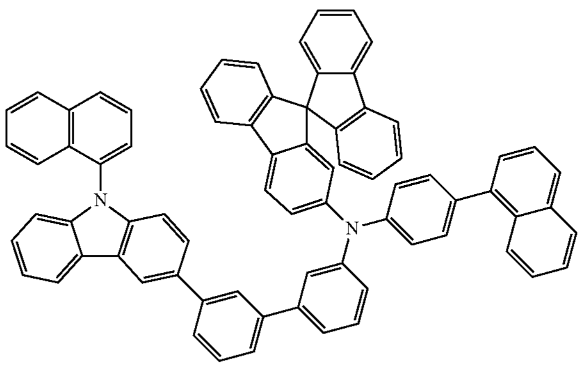
6-120
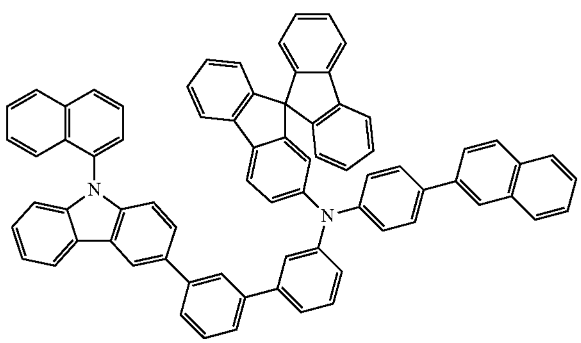
6-121
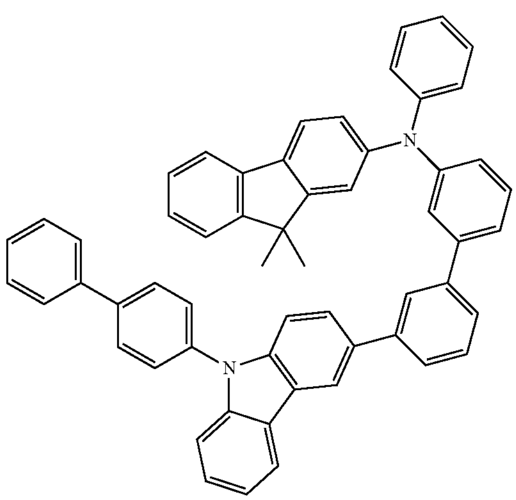
-continued
6-122
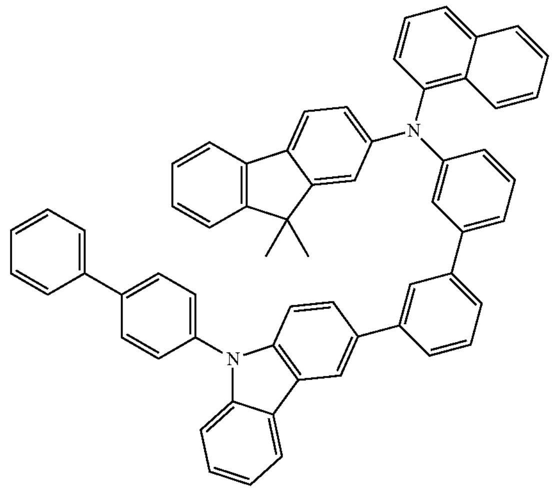
6-123
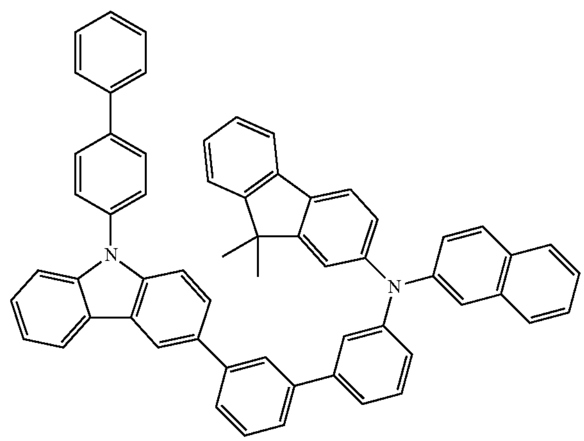
6-124
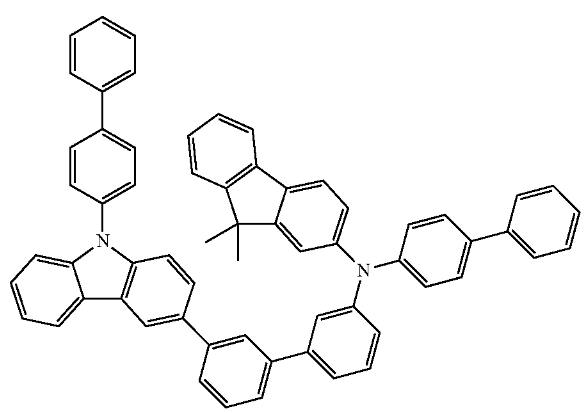

6-125
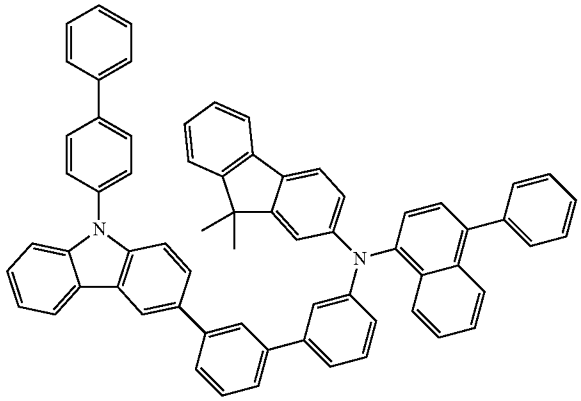
6-126
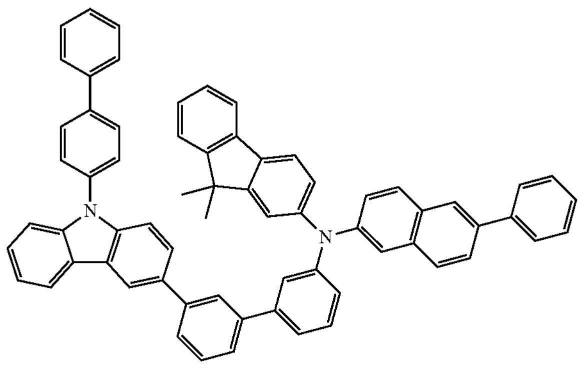
6-127
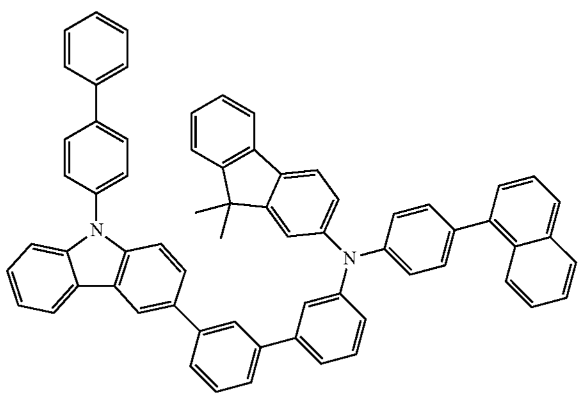
6-128
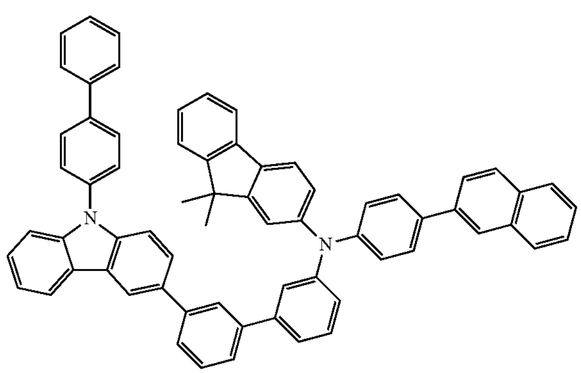
6-129
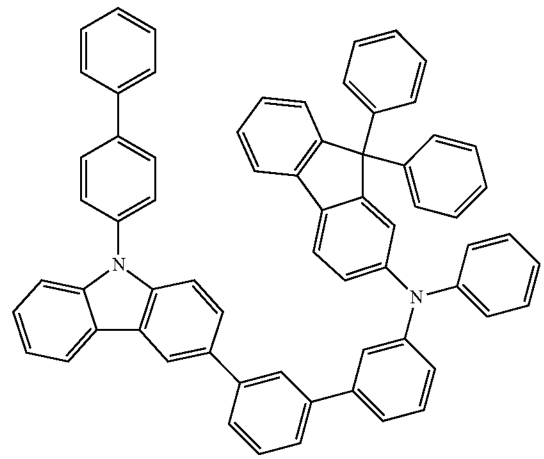
6-130
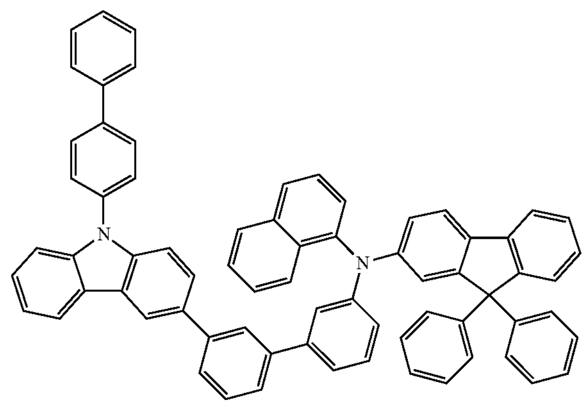
6-131
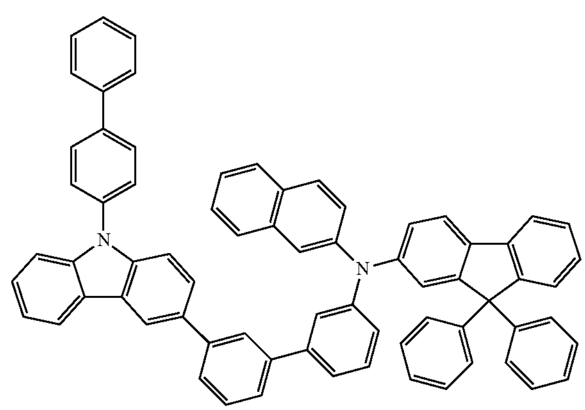

6-132
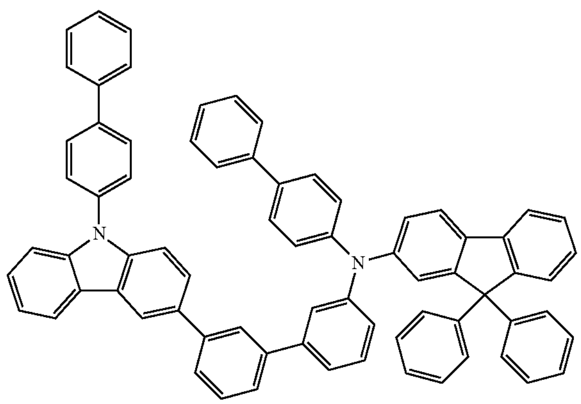
6-133
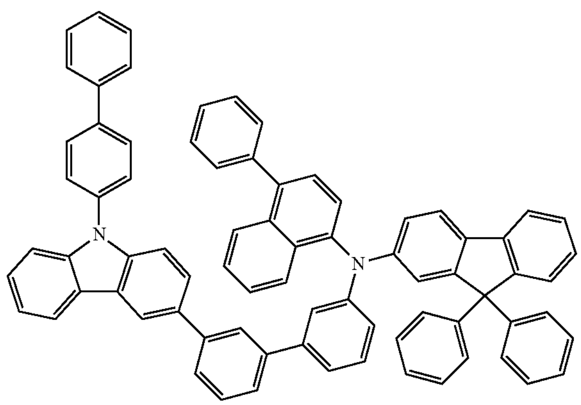
6-134
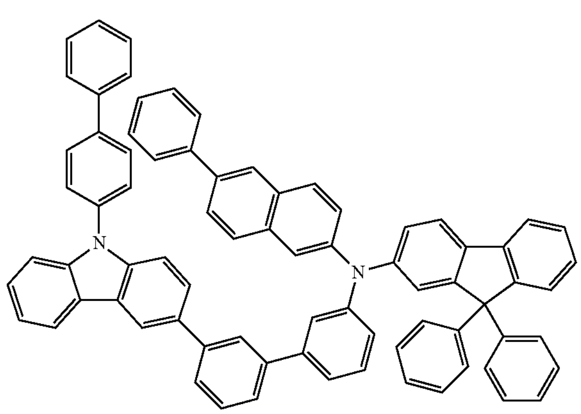
6-135
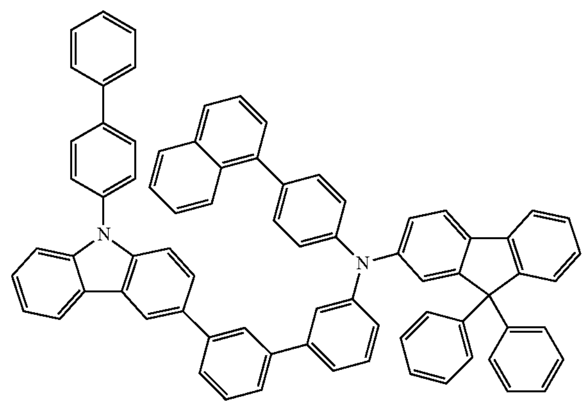
6-136
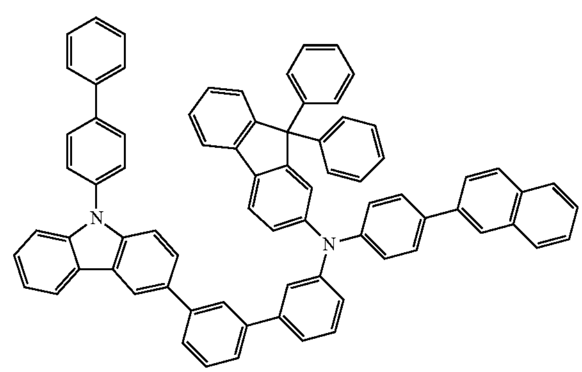
6-137
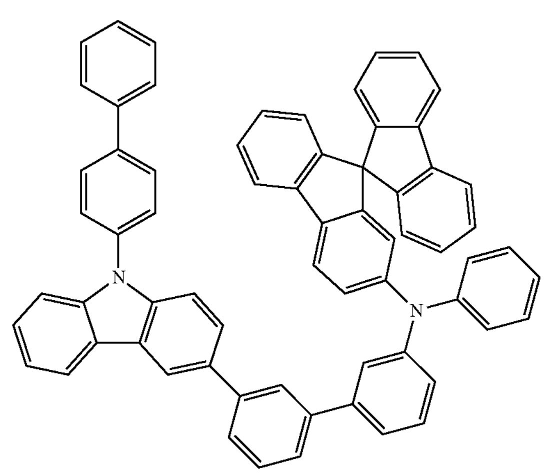

-continued
6-138
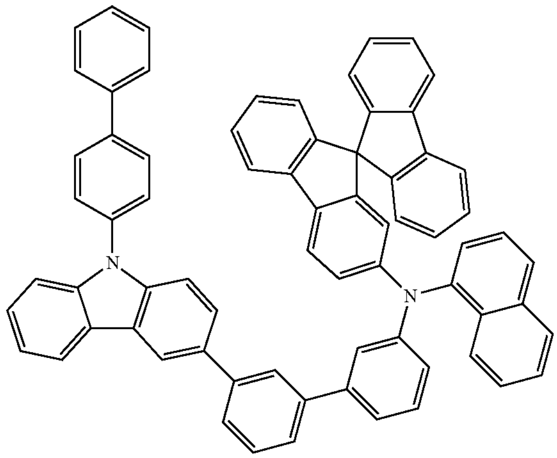
6-139
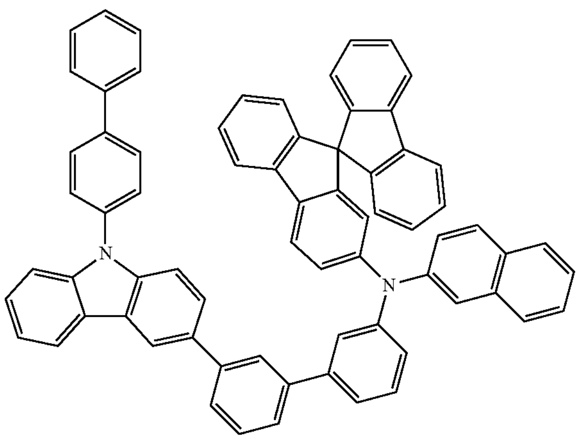
6-140
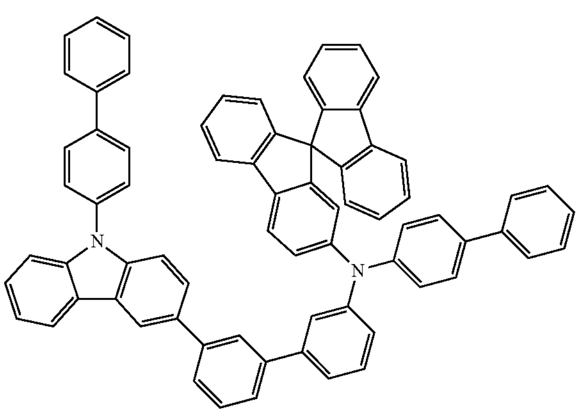
-continued
6-141
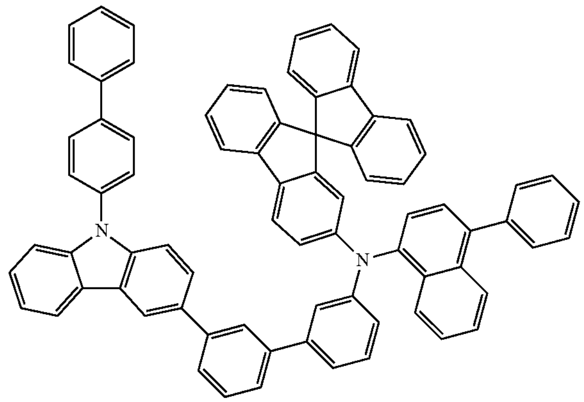
6-142
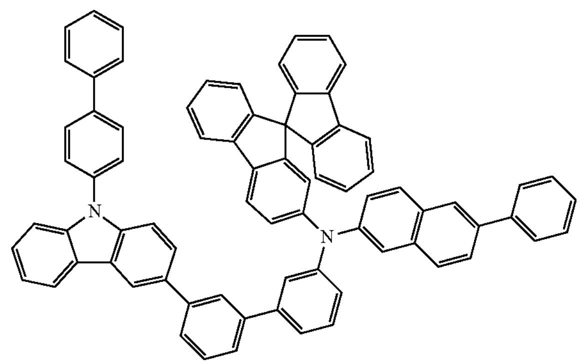
6-143
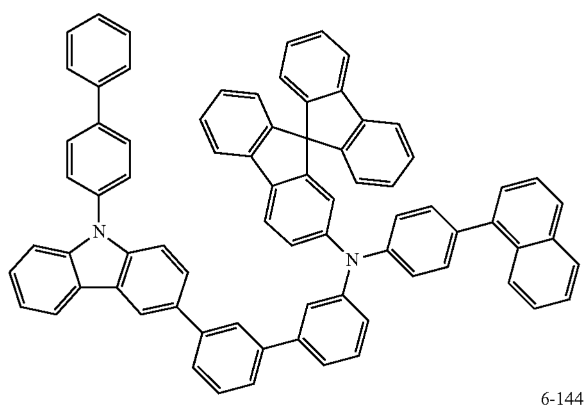
6-144
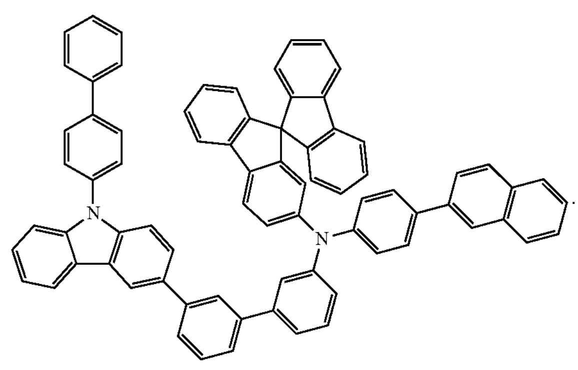
The HTL may further include a hole-transporting material, examples of which include carbazole derivatives, such as N-phenylcarbazole and polyvinylcarbazole, N,N'-bis(3- methyl phenyl)-N,N'-diphenyl-[1,1-biphenyl]-4,4'-diamine (TPD), 4,4',4"-tris(N-carbazolyl)triphenylamine (TCTA), and N,N'-di(1-naphthyl-N,N'-diphenylbenzidine) (NPB):

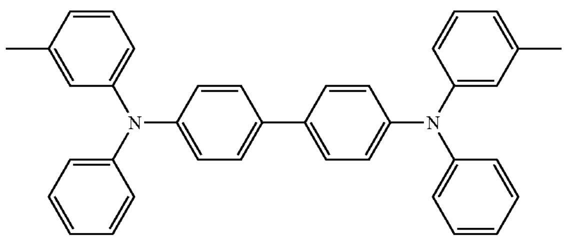

TPD

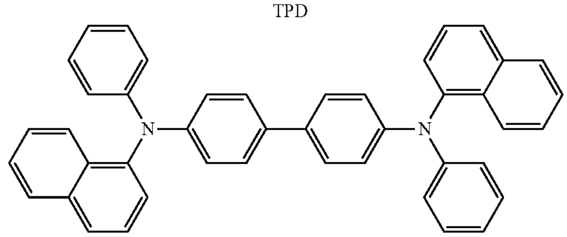

<NPB>

The thickness of the HTL may be from about 50 Å to about 2000 Å, and in some embodiments, may be from about 100 Å to about 1500 Å. Maintaining the thickness of the HTL within these ranges may help provide the HTL with good hole-transporting ability without a substantial increase in driving voltage.

The H-functional layer (having both hole-injecting and hole-transporting capabilities) may contain at least one material from each group of the HIL materials and HTL materials. The thickness of the H-functional layer may be from about 100 Å to about 10,000 Å, and in some embodiments, may be from about 100 Å to about 1,000 Å. Maintaining the thickness of the H-functional layer within these ranges may help provide the H-functional layer with good hole-injecting and transporting abilities without a substantial increase in driving voltage.

In some embodiments, at least one layer selected from the HIL, HTL, and H-functional layer may include at least one compound of Formula 300 below and a compound of Formula 301 below:

<Formula 300>

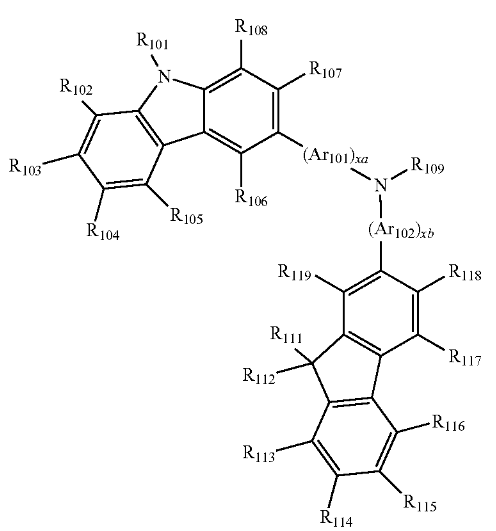

-continued

<Formula 301>

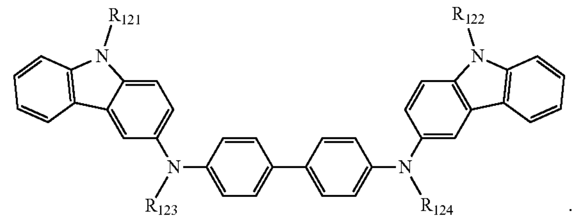

In Formula 300, $Ar_{101}$ and $Ar_{102}$ may each independently be a substituted or unsubstituted $C_6$-$C_{60}$ arylene group.

For example, $Ar_{101}$ and $Ar_{102}$ may each independently be selected from a phenylene group, a pentalenylene group, an indenylene group, a naphthylene group, an azulenylene group, a substituted or unsubstituted acenaphthylene group, a fluorenylene group, a phenalenylene group, a phenanthrenylene group, an anthrylene group, a fluoranthenylene group, a triphenylenylene group, a pyrenylene group, a chrysenylenylene group, a naphthacenylene group, a picenylene group, a phenylenylene group, and a pentacenylene group; and a phenylene group, a pentalenylene group, an indenylene group, a naphthylene group, an azulenylene group, a substituted or unsubstituted acenaphthylene group, a fluorenylene group, a phenalenylene group, a phenanthrenylene group, an anthrylene group, a fluoranthenylene group, a triphenylenylene group, a pyrenylene group, a chrysenylenylene group, a naphthacenylene group, a picenylene group, a phenylenylene group, and a pentacenylene group each substituted with deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

In Formula 300, xa and xb may each independently be an integer of 0 to 5, or 0, 1, or 2. For example, the xa may be 1 and the xb may be 0.

In Formula 300 and 301, $R_{101}$ to $R_{108}$, $R_{111}$ to $R_{119}$, and $R_{121}$ to $R_{124}$ may each independently be selected from hydrogen, deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group.

For example, the $R_{51}$ to $R_{58}$, $R_{61}$ to $R_{69}$, and $R_{71}$ and $R_{72}$ may each independently be selected from hydrogen; deuterium; a halogen atom; a hydroxyl group; a cyano group; a nitro group; an amino group; an amidino group; hydrazine; hydrazone; a carboxyl acid group or a salt thereof; a sulfonic acid group or a salt thereof; a phosphoric acid group or a salt thereof; a $C_1$-$C_{10}$ alkyl group (for example, a methyl group, an ethyl group, a propyl group, a butyl group, a pentyl group, and a hexyl group); a $C_1$-$C_{10}$ alkoxy group (for example, a methoxy group, an ethoxy group, a propoxy group, a butoxy group, and a pentoxy group);

a $C_1$-$C_{10}$ alkyl group and a $C_1$-$C_{10}$ alkoxy group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, and a phosphoric acid group or a salt thereof;

a phenyl group; a naphthyl group; an anthryl group; a fluorenyl group; a pyrenyl group; and a phenyl group, a naphthyl group, an anthryl group, a fluorenyl group, and a pyrenyl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{10}$ alkyl group, and a $C_1$-$C_{10}$ alkoxy group.

In Formula 300, $R_{109}$ may be a phenyl group; a naphthyl group; an anthryl group; a biphenyl group; a pyridyl group; and a phenyl group, a naphthyl group, an anthryl group, a biphenyl group, and a pyridyl group each independently substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

According to an embodiment, a compound represented by Formula 300 above may be represented by Formula 300A below:

<Formula 300A>

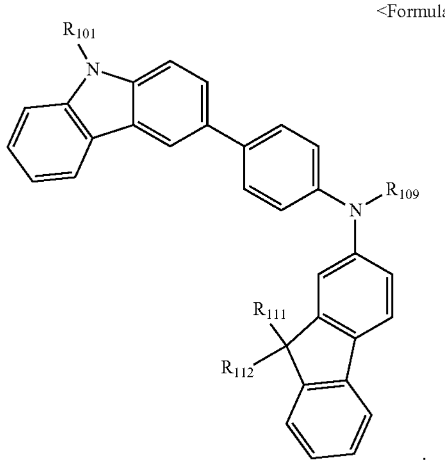

In Formula 300A, detailed descriptions of $R_{101}$, $R_{111}$, $R_{112}$, and $R_{109}$ are as described above.

For example, at least one of the HIL, HTL, and H-functional layer may include one or more of the Compounds 301 to 320 below:

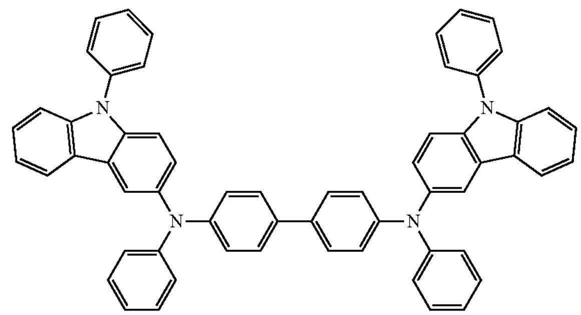

302

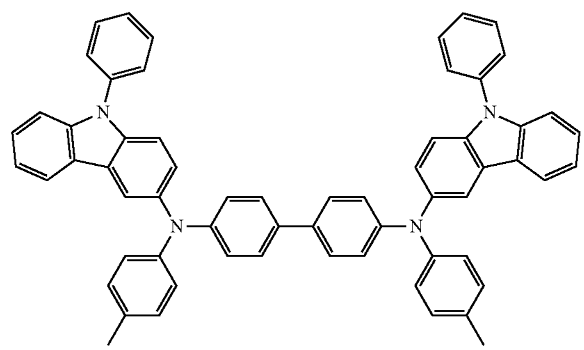

303

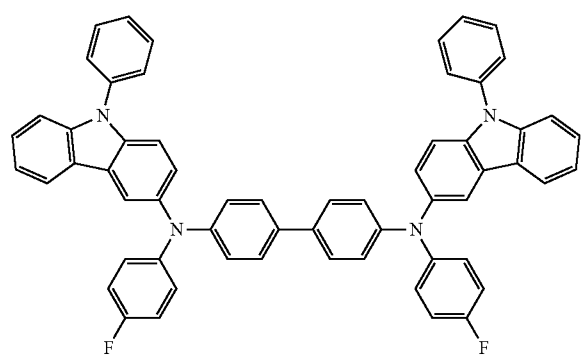

304

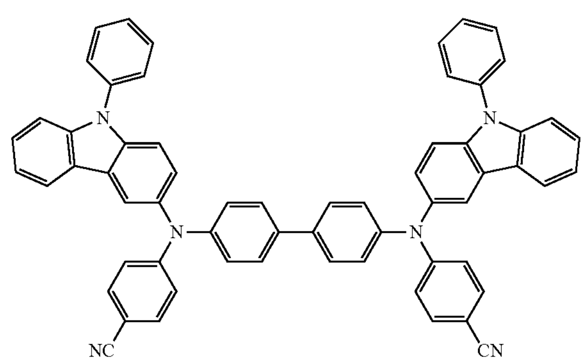

-continued
305
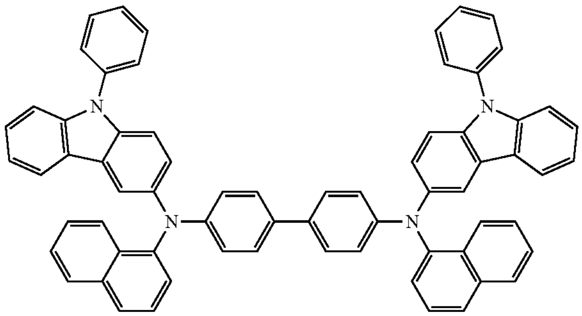
306
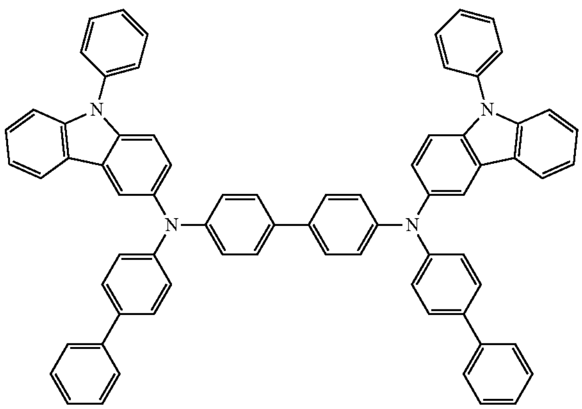
307
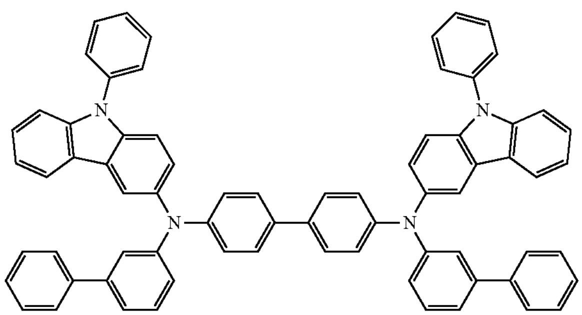
308
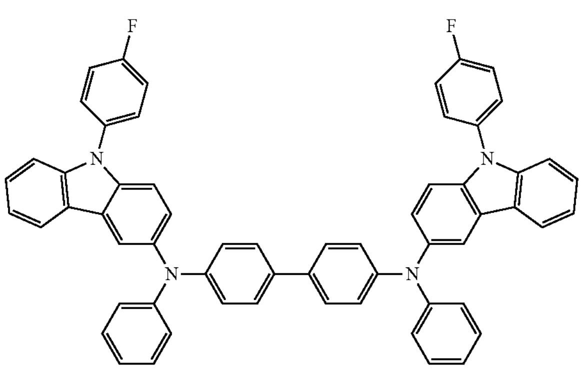
-continued
309
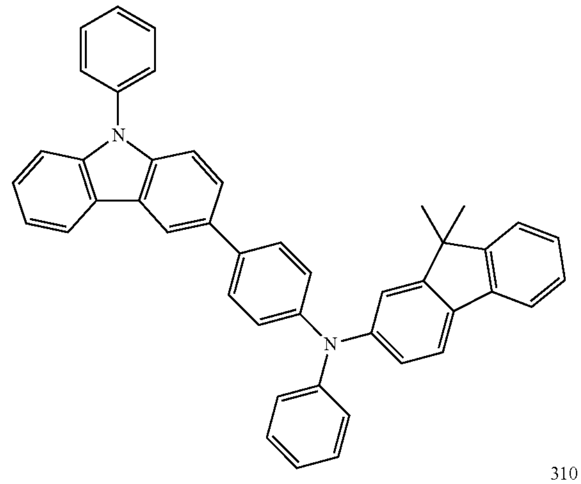
310
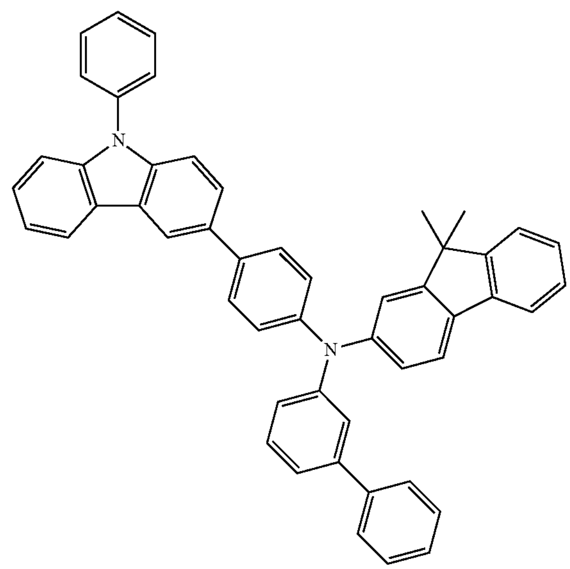
311
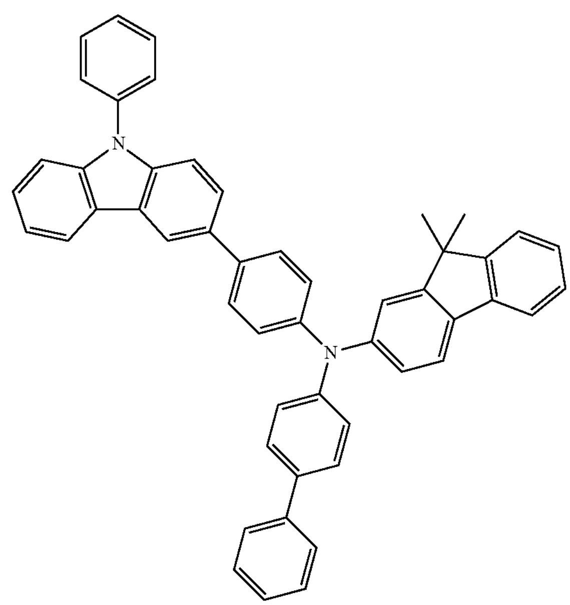

312
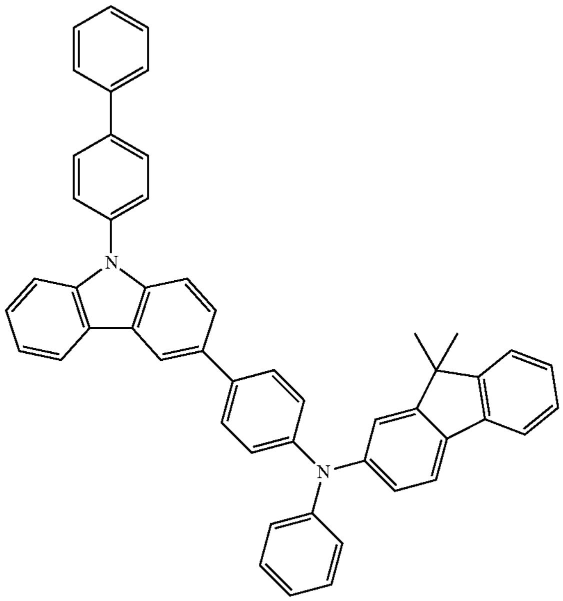
314
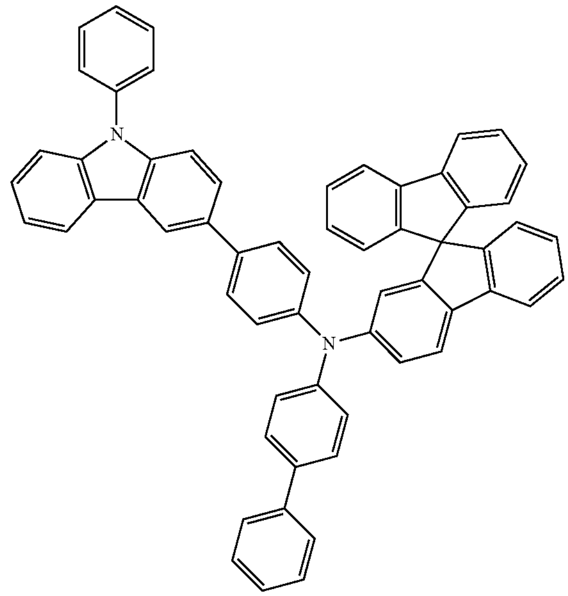
313
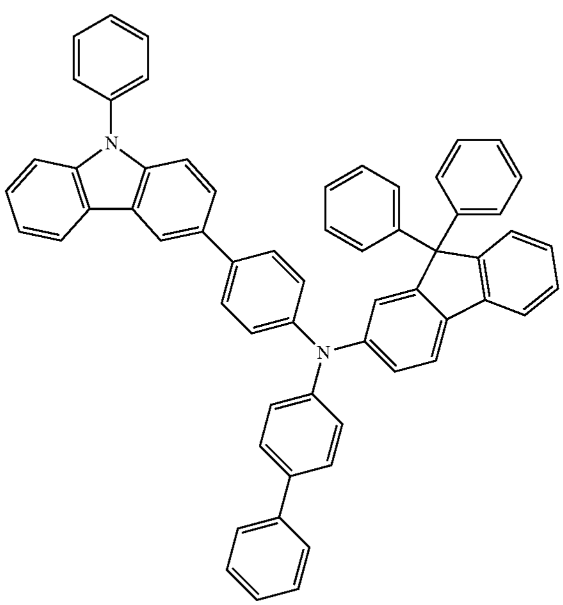
315
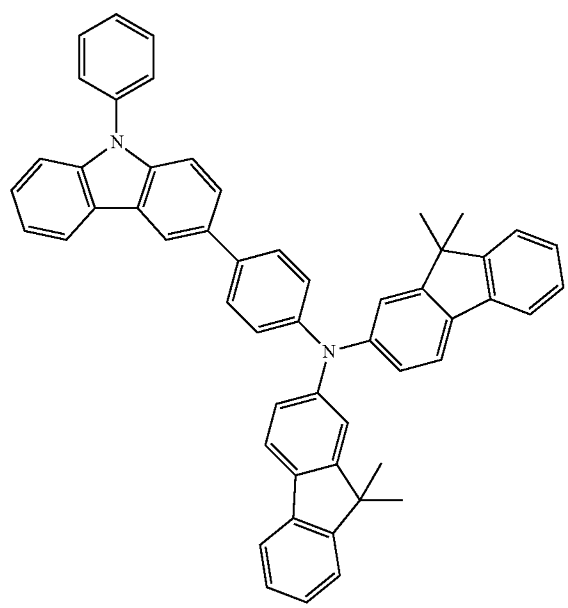

-continued
316
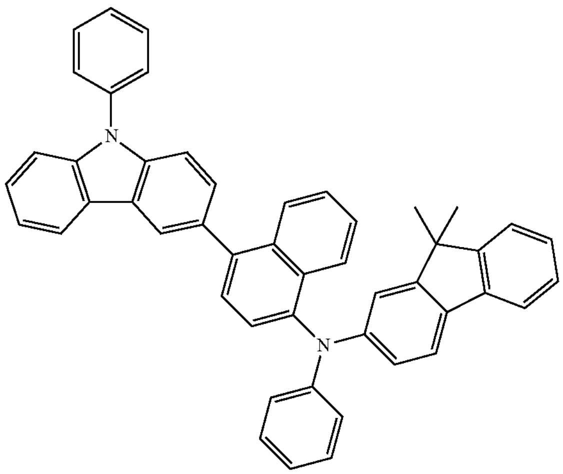
317
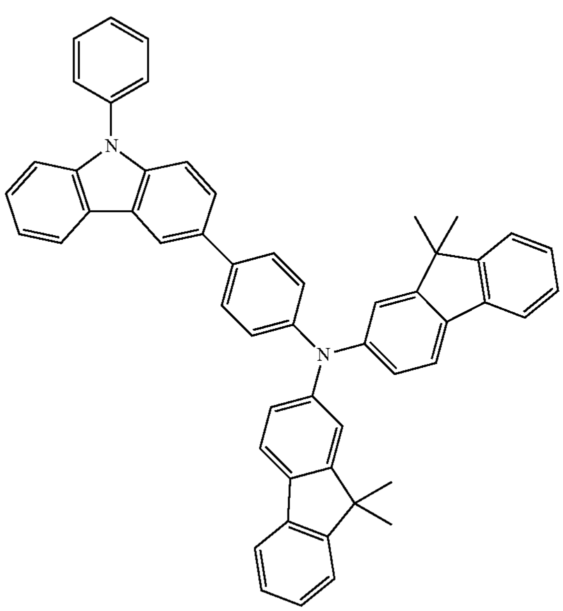
-continued
318
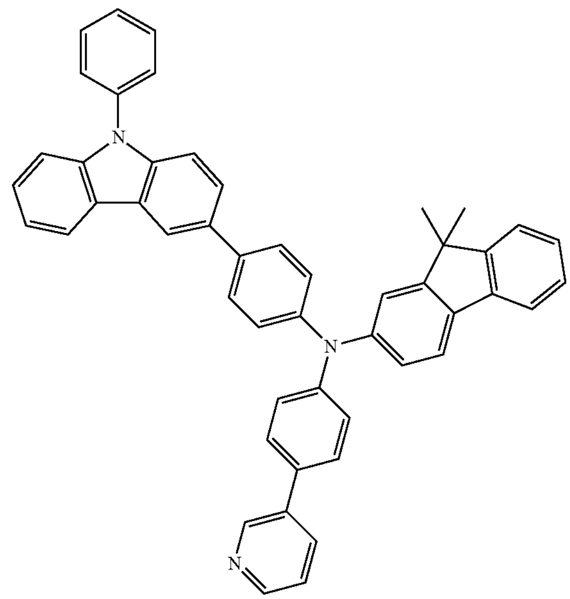
319
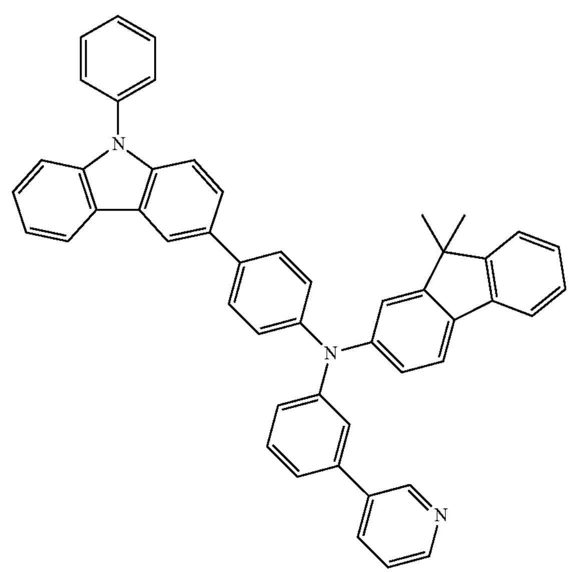

-continued

320

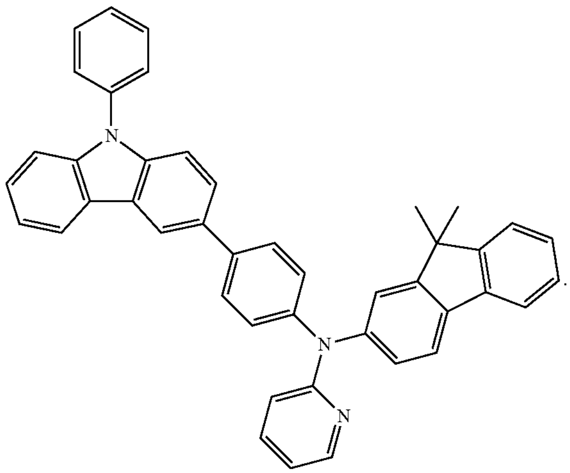

At least one of the HIL, HTL, and H-functional layer may further include a charge-generating material to, for example, improve conductivity of a film, in addition to a hole-injecting material, a hole-transporting material, and/or a material having both hole-injecting and hole-transporting capabilities.

The charge-generating material may be, for example, a p-dopant. The p-dopant may be one of a quinone derivative, a metal oxide, and a cyano group-containing compound. Examples of the p-dopant are quinone derivatives such as tetracyanoquinonedimethane (TCNQ) and 2,3,5,6-tetra-fluoro-tetracyano-1,4-benzoquinonedimethane (F4-TCNQ); metal oxides such as tungsten oxide and molybdenum oxide; and cyano group containing compounds such as Compound 200 below:

<Compound 200>

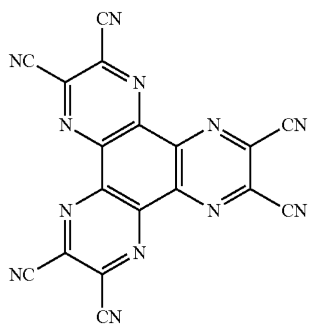

<F4-TCNQ>

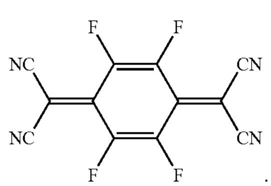

When the HIL, HTL, or the H-functional layer further includes the charge-generating material, the charge-generating material may be homogeneously dispersed or inhomogeneously distributed in the HIL, HTL, or H-functional layer.

The buffer layer may be disposed between the EML and at least one layer selected from the HIL, HTL, and H-functional layer. The buffer layer may compensate for an optical resonance distance of light according to a wavelength of the light emitted from the EML, and may increase efficiency. The buffer layer may include any hole-injecting material or hole-transporting material. In some other embodiments, the buffer layer may include the same material as one of the materials included in the HIL, HTL, and H-functional layer that underlies the buffer layer.

Then, the EML may be formed on the HTL, H-functional layer, or buffer layer by, for example, vacuum deposition, spin coating, casting, or LB deposition. When the EML is formed using vacuum deposition or spin coating, the deposition and coating conditions may be similar to those for the formation of the HIL, though the conditions for deposition and coating may vary according to the material that is used to form the EML.

The EML may include a light-emitting material represented by any one of Formulae 1A to 1E below:

<Formula 1A>

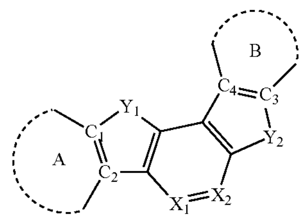

<Formula 1B>

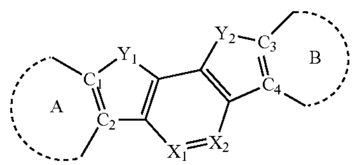

<Formula 1C>

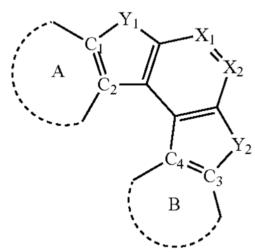

<Formula 1D>

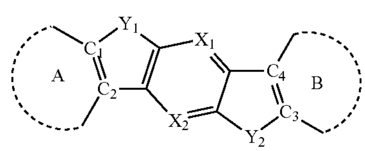

<Formula 1E>

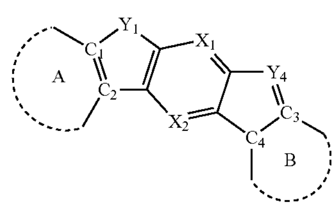

In Formulae 1A to 1E above, ring A and ring B are each independently selected from i) a $C_6$-$C_{20}$ aromatic ring and a $C_2$-$C_{20}$ heteroaromatic ring; and ii) a $C_6$-$C_{20}$ aromatic ring and a $C_2$-$C_{20}$ heteroaromatic ring each substituted with at least one selected from deuterium, a halogen atom, a $C_1$-$C_{60}$ alkyl group, a $C_6$-$C_{60}$ aryl group, a $C_2$-$C_{60}$ heteroaryl group, and —N($Q_1$)($Q_2$) (wherein, $Q_1$ and $Q_2$ are each independently a $C_1$-$C_{60}$ alkyl group, a $C_6$-$C_{60}$ aryl group, or a $C_2$-$C_{60}$ heteroaryl group), wherein, in Formulae 1A to 1E above, $C_1$ to $C_4$ each independently represent any one of carbon atoms forming each of the ring A and the ring B.

In some embodiments, in Formulae 1A to 1E above, the ring A and the ring B may each independently be selected from i) a $C_6$-$C_{20}$ aromatic ring and a $C_2$-$C_{20}$ heteroaromatic ring; and ii) a $C_6$-$C_{20}$ aromatic ring and a $C_2$-$C_{20}$ heteroaromatic ring each substituted with at least one selected from deuterium, a halogen atom, a $C_1$-$C_{10}$ alkyl group, a $C_6$-$C_{20}$ aryl group, a $C_2$-$C_{20}$ heteroaryl group, and —N($Q_1$)($Q_2$) (wherein, $Q_1$ and $Q_2$ are each independently a $C_6$-$C_{10}$ aryl group).

In other embodiments, in Formulae 1A to 1E above, the ring A and the ring B are each independently selected from i) benzene, naphthalene, anthracene, pyridine, pyrimidine, pyrazine, quinoline, and isoquinoline; and ii) benzene, naphthalene, anthracene, pyridine, pyrimidine, pyrazine, quinoline, and isoquinoline each substituted with at least one selected from deuterium, a methyl group, an ethyl group, a t-butyl group, an octyl group, a phenyl group, a naphthyl group, a pyridyl group, a pyrimidyl group, and —N(Ph)$_2$.

In other embodiments, in Formula 1A to 1E above, the ring A and the ring B may each independently be represented by any one of Formulae 1(1) to 1(11):

1(1)

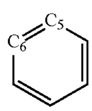

1(2)

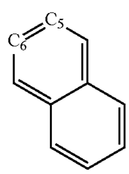

1(3)

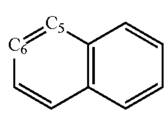

1(4)

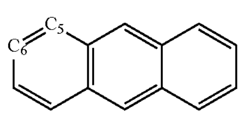

1(5)

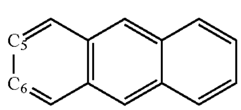

1(6)

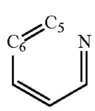

1(7)

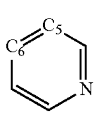

-continued

1(8)

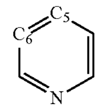

1(9)

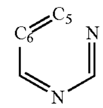

1(10)

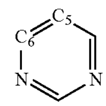

1(11)

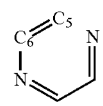

In Formulae 1(1) to 1(11), $C_5$ and $C_6$ are each independently carbon atoms of Formulae 1(1) to 1(11) and represent any one carbon atom of $C_1$ to $C_4$.

In Formulae 1A to 1E above, $X_1$ is $CR_1$ or N and; $X_2$ is $CR_2$ or N.

In some embodiments, in Formula 1A to 1E above, $X_1$ may be $CR_1$ and $X_2$ may be $CR_2$.

In Formulae 1A to 1E above, $R_1$ and $R_2$ are each independently selected from hydrogen, deuterium, a halogen atom, a $C_1$-$C_{60}$ alkyl group, a $C_6$-$C_{60}$ aryl group, a $C_2$-$C_{60}$ heteroaryl group, and —N($Q_1$)($Q_2$) (wherein, $Q_1$ and $Q_2$ are each independently a $C_1$-$C_{60}$ alkyl group, a $C_6$-$C_{60}$ aryl group, or a $C_2$-$C_{60}$ heteroaryl group); and $R_1$ and $R_2$ may be connected to each other to selectively form a $C_6$-$C_{20}$ saturated ring or a $C_6$-$C_{20}$ unsaturated ring.

For example, in Formulae 1A to 1E above, $R_1$ and $R_2$ may each independently be selected from hydrogen, deuterium, a halogen atom, a $C_1$-$C_{10}$ alkyl group, a $C_6$-$C_{20}$ aryl group, a $C_2$-$C_{20}$ heteroaryl group, and —N($Q_1$)($Q_2$) (wherein, $Q_1$ and $Q_2$ are each independently a $C_6$-$C_{10}$ aryl group).

As another example, in Formulae 1A to 1E above, $R_1$ and $R_2$ may each independently be selected from hydrogen, deuterium, a methyl group, an ethyl group, a t-butyl group, an octyl group, a phenyl group, a naphthyl group, a pyridyl group, a pyrimidyl group, and —N(Ph)$_2$.

As another example, in Formulae 1A to 1E above, $R_1$ and $R_2$ may each independently be hydrogen.

In Formula 1A to 1E above, $Y_1$ is N-($L_1$)$_{n1}$-$Ar_{11}$ and; $Y_2$ is N-($L_2$)$_{n2}$-$Ar_{12}$, O, S, C($R_{31}$)($R_{32}$), or Si($R_{33}$)($R_{34}$).

In Formula 1A to 1E above, $L_1$ and $L_2$ are each independently selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted $C_2$-$C_{10}$ heterocycloalkylene group, a substituted or unsubstituted $C_2$-$C_{10}$ heterocycloalkenylene group, and a substituted or unsubstituted $C_2$-$C_{60}$ heteroarylene group.

For example, in Formulae 1A to 1E above, $L_1$ and $L_2$ are each independently i) a $C_3$-$C_{10}$ cycloalkylene group, a $C_3$-$C_{10}$ cycloalkenylene group, a $C_6$-$C_{60}$ arylene group, a $C_2$-$C_{10}$ heterocycloalkylene group, a $C_2$-$C_{10}$ heterocycloalkenylene group, and a $C_2$-$C_{60}$ heteroarylene group;

ii) a $C_3$-$C_{10}$ cycloalkylene group, a $C_3$-$C_{10}$ cycloalkenylene group, a $C_6$-$C_{60}$ arylene group, a $C_2$-$C_{10}$ heterocycloalkylene group, a $C_2$-$C_{10}$ heterocycloalkenylene group, and a $C_2$-$C_{60}$ heteroarylene group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and iii) a $C_3$-$C_{10}$ cycloalkylene group, a $C_3$-$C_{10}$ cycloalkenylene group, a $C_6$-$C_{60}$ arylene group, a $C_2$-$C_{10}$ heterocycloalkylene group, a $C_2$-$C_{10}$ heterocycloalkenylene group, and a $C_2$-$C_{60}$ heteroarylene group each independently substituted with at least one selected from a $C_6$-$C_{60}$ arylene group and a $C_2$-$C_{60}$ heteroarylene group each independently substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

As another example, in Formulae 1A to 1E, $L_1$ and $L_2$ are each independently selected from i) a $C_6$-$C_{60}$ arylene group and a $C_2$-$C_{60}$ heteroarylene group;

ii) a $C_6$-$C_{60}$ arylene group and a $C_2$-$C_{60}$ heteroarylene group each substituted with at least one selected from a $C_6$-$C_{60}$ aryl group and a $C_2$-$C_{60}$ heteroaryl group; and iii) a $C_6$-$C_{60}$ arylene group and a $C_2$-$C_{60}$ heteroarylene group each substituted with at least one selected from a $C_6$-$C_{60}$ aryl group and a $C_2$-$C_{60}$ heteroaryl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_1$-$C_{60}$ alkoxy group, a $C_6$-$C_{60}$ aryl group, and a $C_2$-$C_{60}$ heteroaryl group.

As another example, in Formulae 1A to 1E, $L_1$ and $L_2$ may each independently be selected from i) a phenylene group, a pyridylene group, a pyrimidylene group, a triazinylene group, and a quinazolinylene group;

ii) a phenylene group, a pyridylene group, a pyrimidylene group, a triazinylene group, and a quinazolinylene group each substituted with at least one selected from a phenyl group, a naphthyl group, and a pyridyl group; and iii) a phenylene group, a pyridylene group, a pyrimidylene group, a triazinylene group, and a quinazolinylene group each substituted with at least one selected from deuterium, a methyl group, an ethyl group, an n-octyl group, a methoxy group, an ethoxy group, a phenyl group, a naphthyl group, a pyridyl group, and a carbazole group.

In Formulae 1A to 1E above, n1 represents the number of L1s and is an integer of 0 to 3. When n1 is an integer of 2 or greater, the n1 number of L1s may be the same or different. n2 represents the number of L2s, and is an integer of 0 to 3. When n2 is an integer of 2 or greater, the n2 number of L2s may be the same or different.

In Formula 1A to 1E, $Ar_{11}$ and $Ar_{12}$ are each independently selected from i) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and ii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

As another example, in Formulae 1A to 1E, $Ar_{11}$ and $Ar_{12}$ may each independently be selected from i) a $C_6$-$C_{60}$ aryl group and a $C_2$-$C_{60}$ heteroaryl group; and ii) a $C_6$-$C_{60}$ aryl group and a $C_2$-$C_{60}$ heteroaryl group each substituted with a $C_2$-$C_{60}$ alkyl group, a $C_6$-$C_{60}$ aryl group, and a $C_2$-$C_{60}$ heteroaryl group.

As another example, in Formula 1A to 1E above, $Ar_{11}$ and $Ar_{12}$ may each independently be represented by any one of Formulae H1 to H81 below:

H1

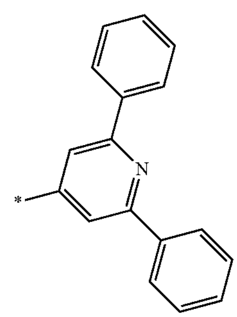

H2

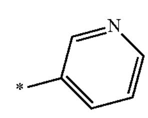

H3

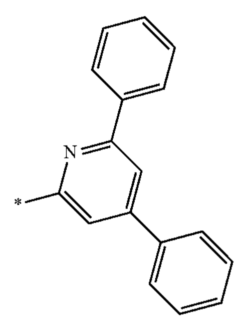

-continued
H4
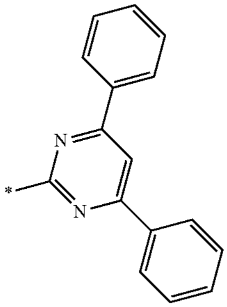
H5
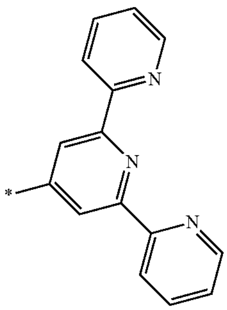
H6
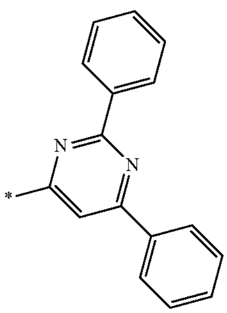
H7
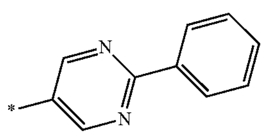
H8
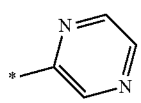
H9
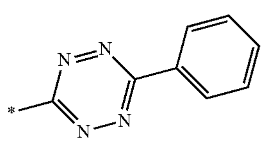
H10
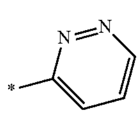
H11
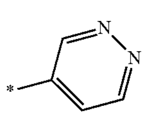
-continued
H12
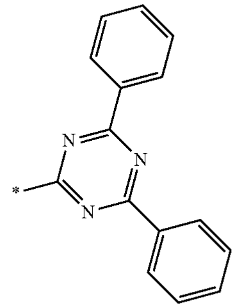
H13
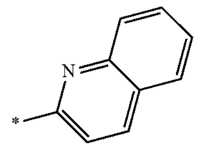
H14
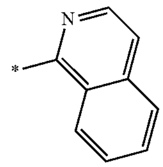
H15
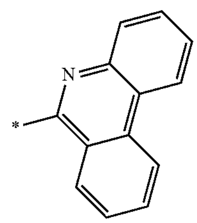
H16
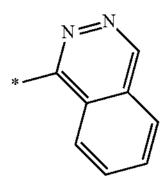
H17
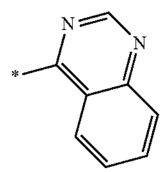
H18
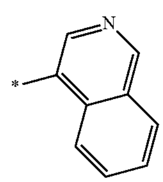
H19
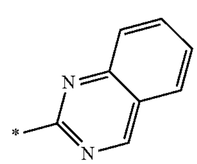

-continued
H20
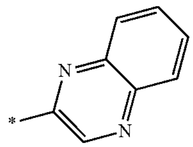
H21
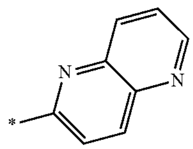
H22
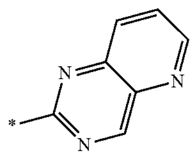
H23
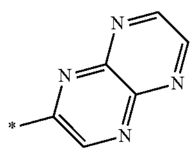
H24
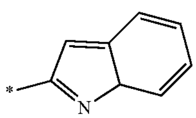
H25
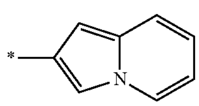
H26
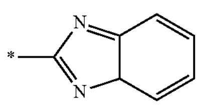
H27
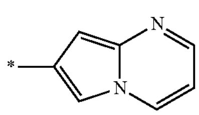
H28
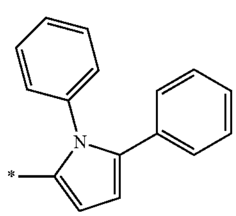
H29
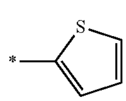
H30
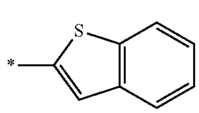
H31
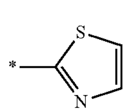
-continued
H32
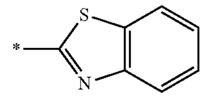
H33
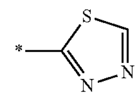
H34
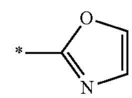
H35
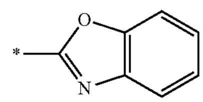
H36
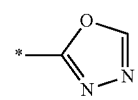
H37
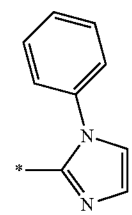
H38
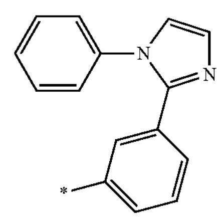
H39
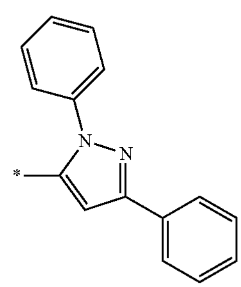
H40
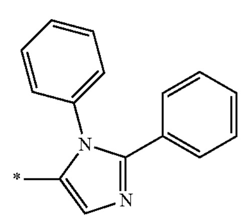

-continued
H41
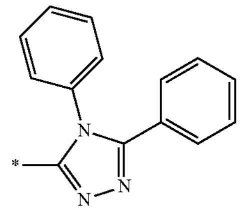
H42
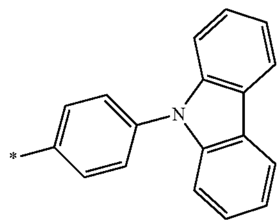
H43
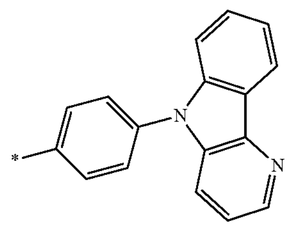
H44
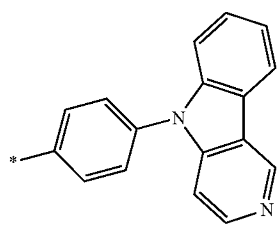
H45
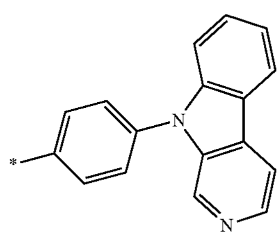
H46
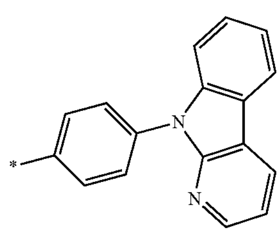
H47
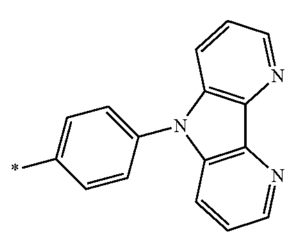
-continued
H48
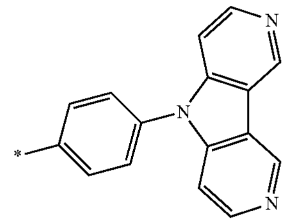
H49
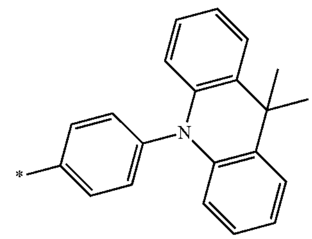
H50
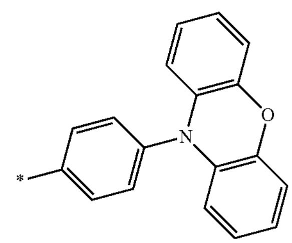
H51
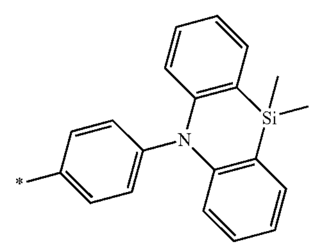
H52
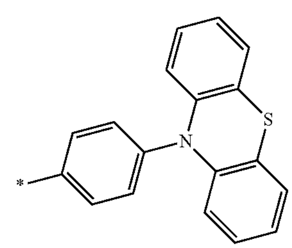
H53
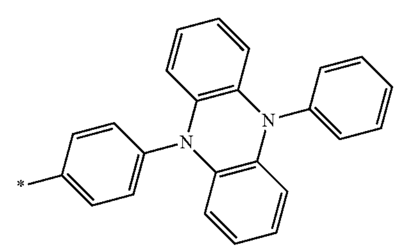

-continued
H54
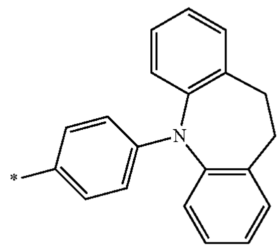
H55
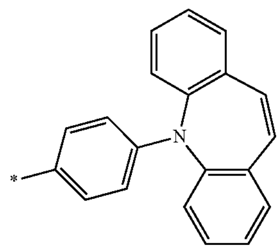
H56
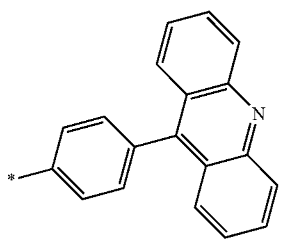
H57
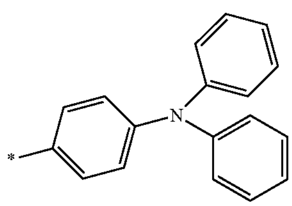
H58
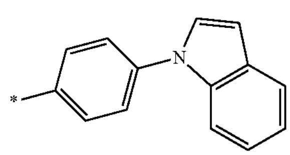
H59
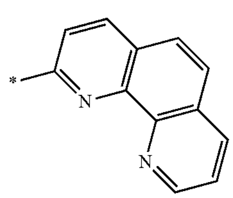
H60
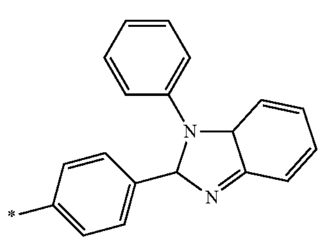
-continued
H61
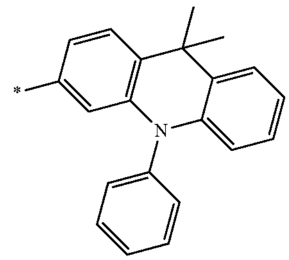
H62
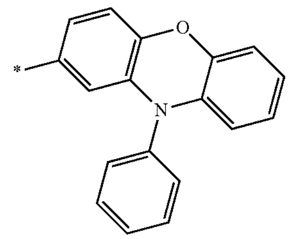
H63
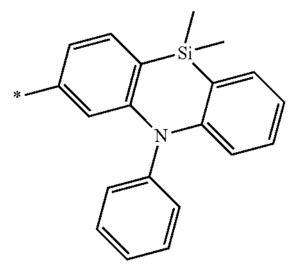
H64
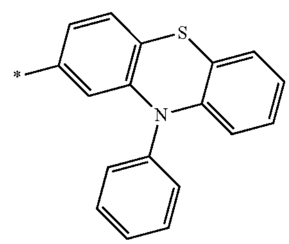
H65
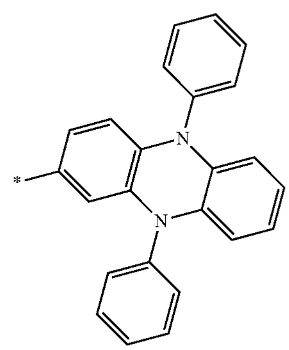
H66
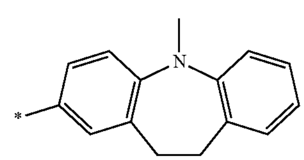

H67
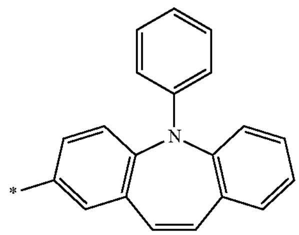
H68
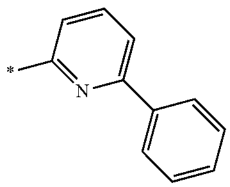
H69
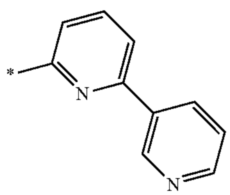
H70
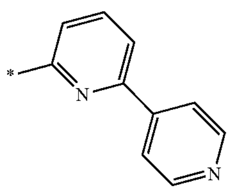
H71
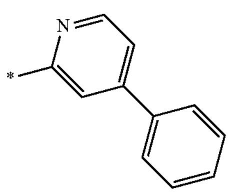
H72
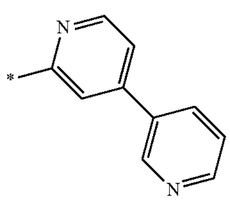
H73
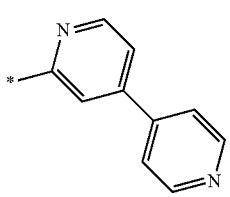
H74
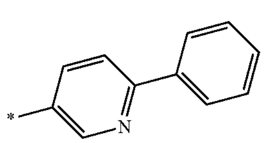
H75
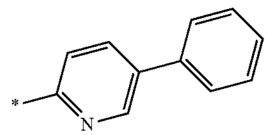
H76
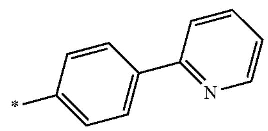
H77
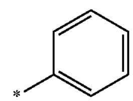
H78
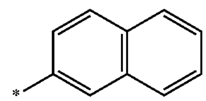
H79
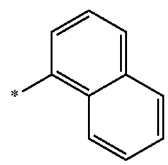
H80
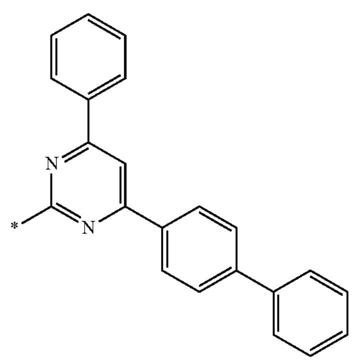
H81
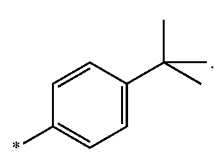
In Formulae H1 to H81 above, * is a bonding site to N, $L_1$, or $L_2$.
As another example, in Formulae 1A to 1E above, $Ar_{11}$ and $Ar_{12}$ may each independently be a compound represented by any one of Formulae H1, H3, H4, H6, H12, and H77 to H80:

H1

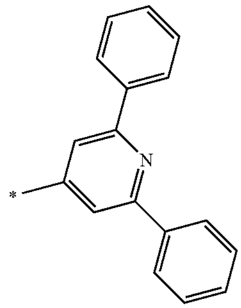

H3

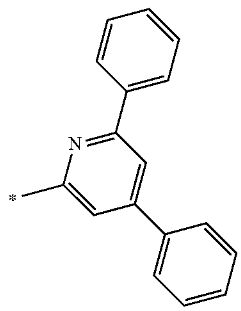

H4

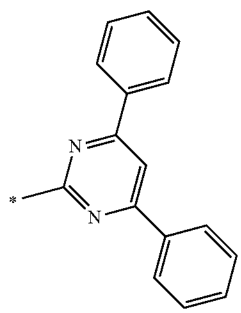

H6

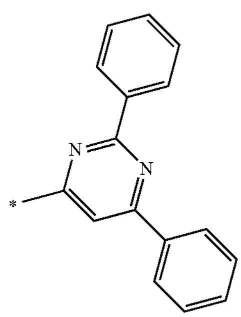

H12

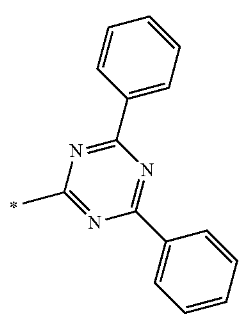

-continued

H77

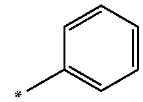

H78

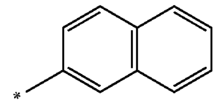

H79

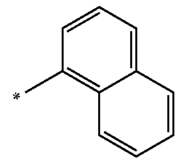

H80

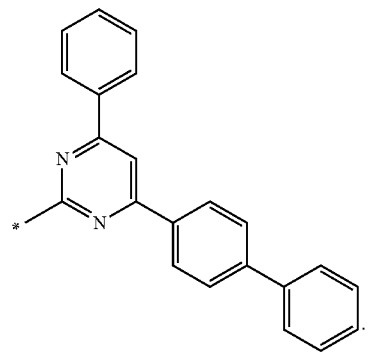

In other embodiments, in Formulae 1A to 1E above, $L_1$ and $L_2$ are each independently i) a phenylene group, a pyridylene group, a pyrimidylene group, a triazinylene group, and a quinazolinylene group;

ii) a phenylene group, a pyridylene group, a pyrimidylene group, a triazinylene group, and a quinazolinylene group each substituted with at least one selected from a phenyl group, a naphthyl group, and a pyridyl group;

iii) a phenylene group, a pyridylene group, a pyrimidylene group, a triazinylene group, and a quinazolinylene group each substituted with at least one selected from deuterium, a methyl group, an ethyl group, an n-octyl group, a methoxy group, an ethoxy group, a phenyl group, a naphthyl group, a pyridyl group, and a carbazole group;

n1 and n2 are each independently an integer of 0 or 1; and $Ar_{11}$ and $Ar_{12}$ may each independently be a compound represented by any one of Formula H1, H3, H4, H6, H12, and H77 to H8:

H1

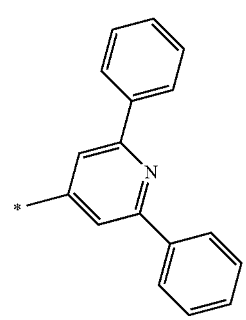

-continued

H3

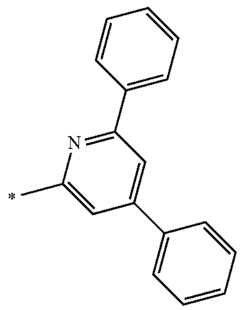

H4

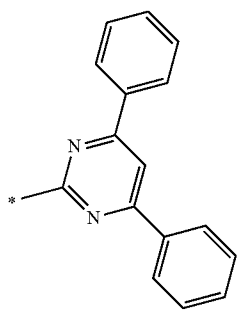

H6

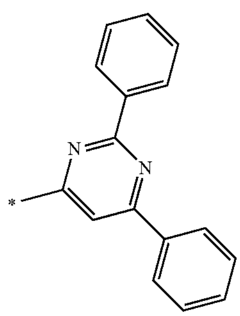

H12

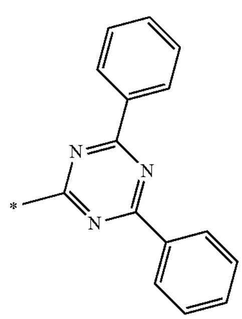

H77

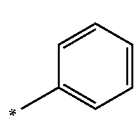

H78

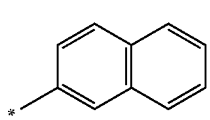

-continued

H79

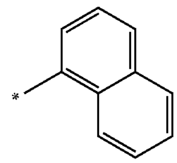

H80

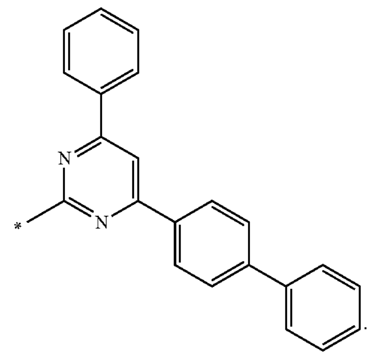

In Formulae 1A to 1E above, $R_{31}$ to $R_{34}$ are each independently selected from i) a $C_1$-$C_{60}$ alkyl group, a $C_2$-$C_{60}$ alkenyl group, a $C_2$-$C_{60}$ alkynyl group, and a $C_1$-$C_{60}$ alkoxy group;

ii) a $C_1$-$C_{60}$ alkyl group, a $C_2$-$C_{60}$ alkenyl group, a $C_2$-$C_{60}$ alkynyl group, and a $C_1$-$C_{60}$ alkoxy group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

For example, in Formulae 1A to 1E above, $R_{31}$ to $R_{34}$ are each independently selected from i) a $C_1$-$C_{60}$ alkyl group and a $C_1$-$C_{60}$ alkoxy group;

ii) a $C_1$-$C_{60}$ alkyl group and a $C_1$-$C_{60}$ alkoxy group each substituted with at least one selected from deuterium, a halogen atom, a $C_6$-$C_{60}$ aryl group, and a $C_2$-$C_{60}$ heteroaryl group;

iii) a $C_6$-$C_{60}$ aryl group and a $C_2$-$C_{60}$ heteroaryl group; and iv) a $C_6$-$C_{60}$ aryl group and a $C_2$-$C_{60}$ heteroaryl group each substituted with at least one selected from deuterium, a halogen atom, a $C_1$-$C_{60}$ alkyl group, a $C_6$-$C_{60}$ aryl group, and a $C_2$-$C_{60}$ heteroaryl group.

As another example, in Formulae 1A to 1E above, $R_{31}$ to $R_{34}$ are each independently selected from i) a methyl group, an ethyl group, an n-propyl group, an iso-propyl group, an n-butyl group, an iso-butyl group, a sec-butyl group, and a tert-butyl group;

ii) a phenyl group, a naphthyl group, and a pyridyl group; and iii) a phenyl group, a naphthyl group, and a pyridyl group each substituted with at least one selected from a methyl group, an ethyl group, an n-propyl group, an iso-propyl group, an n-butyl group, an iso-butyl group, a sec-butyl group, and a tert-butyl group.

In some embodiments, Formulae 1A to 1E above may be represented by any one of Formulae 1-1 to 1-28:

1-1

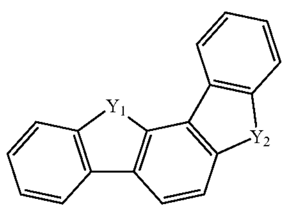

1-2

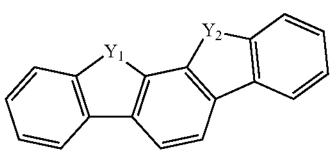

1-3

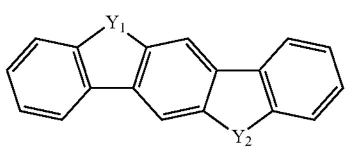

1-4

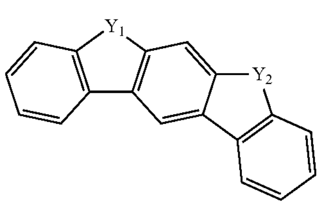

1-5

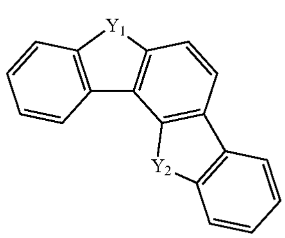

-continued 1-6

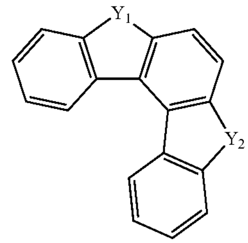

1-7

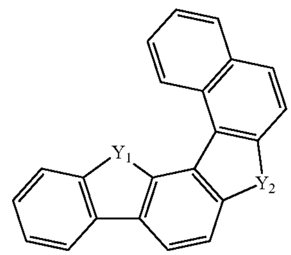

1-8

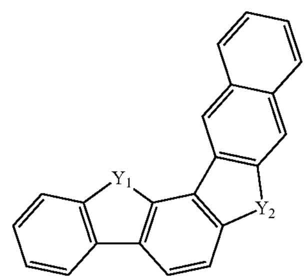

1-9

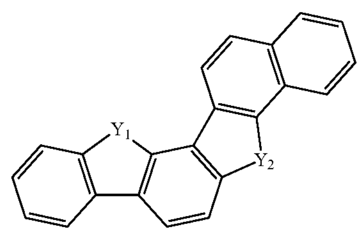

1-10

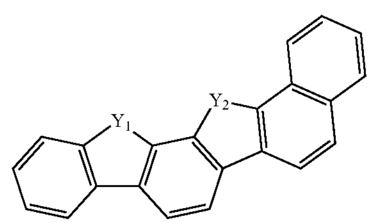

1-11

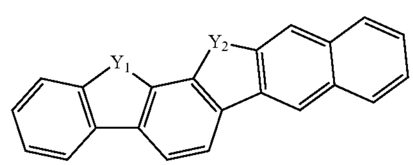

1-12

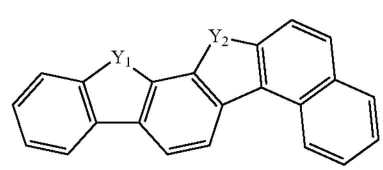

-continued
1-13
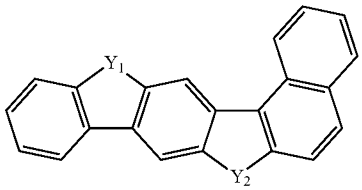
1-14
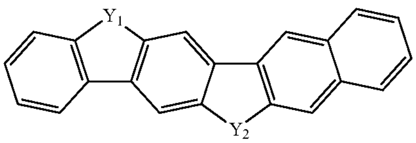
1-15
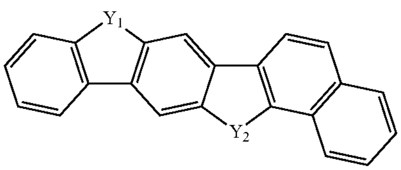
1-16
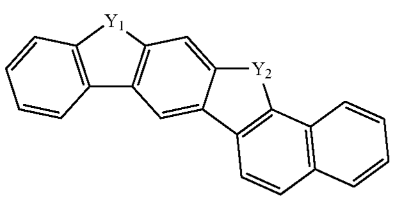
1-17
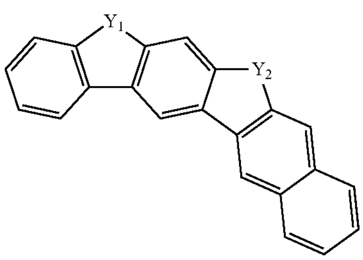
1-18
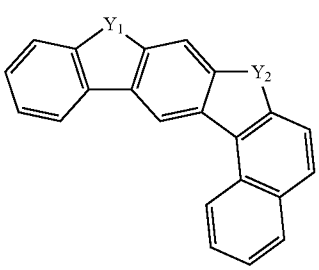
1-19
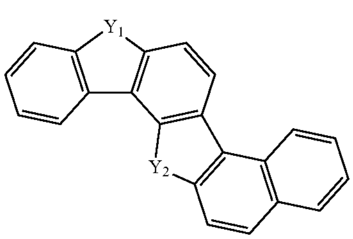
-continued
1-20
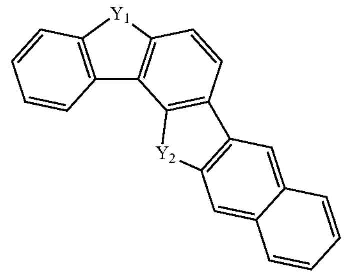
1-21
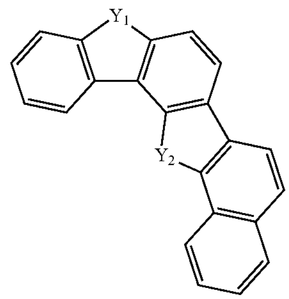
1-22
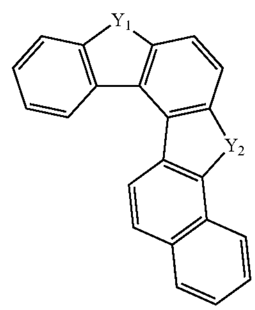
1-23
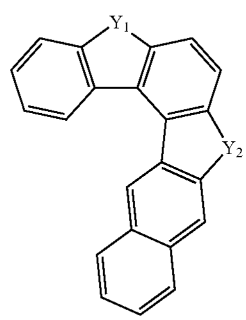
1-24
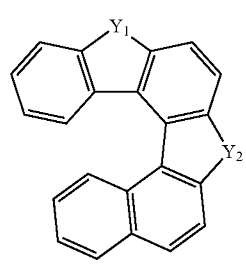

1-25
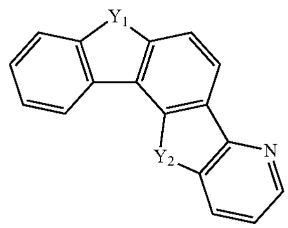
1-26
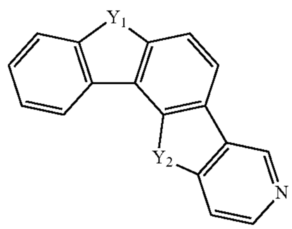
1-27
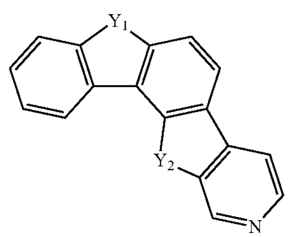
1-28
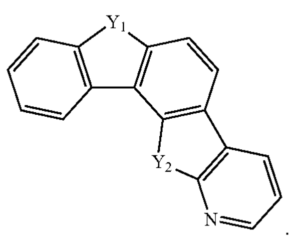
In Formulae 1-1 to 1-28, $Y_1$ and $Y_2$ are as described above.
In other embodiments, the light-emitting material may be represented by any one of Compounds 100 to 236 below:
100
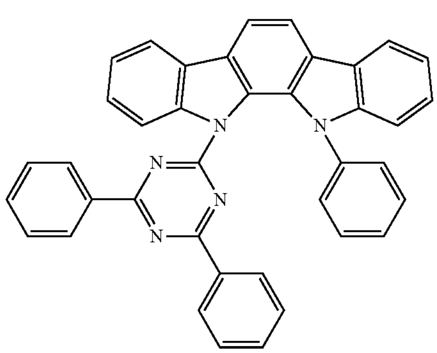
101
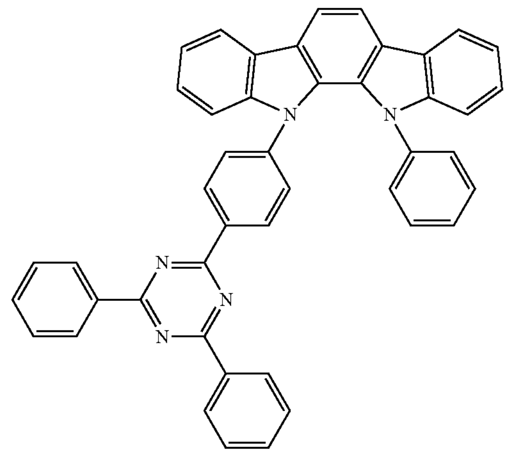
102
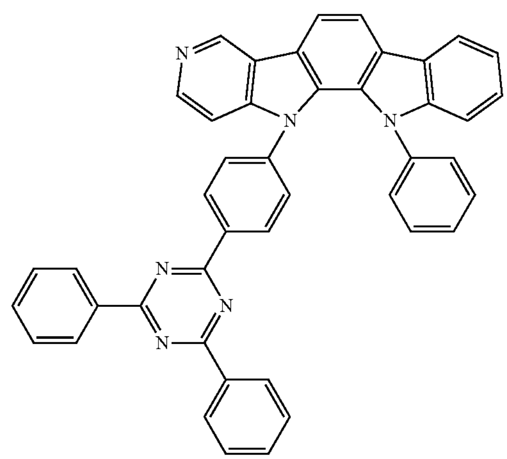
103
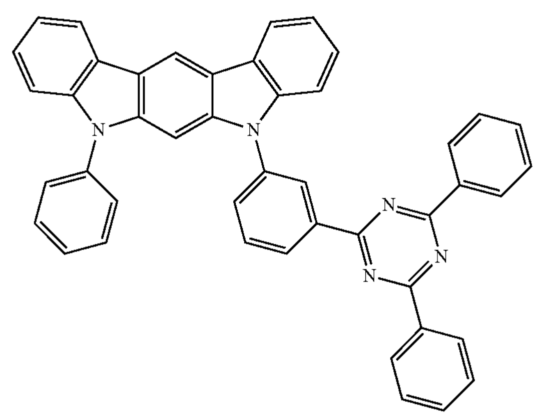

-continued
104
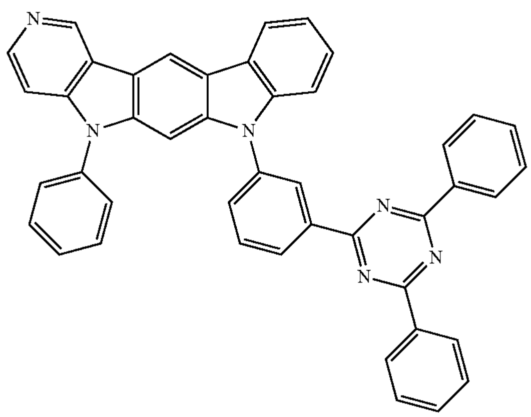
105
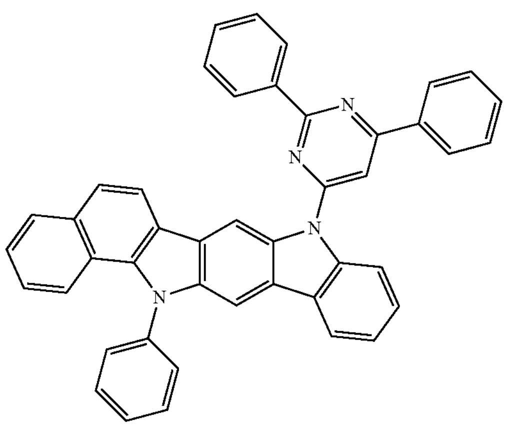
107
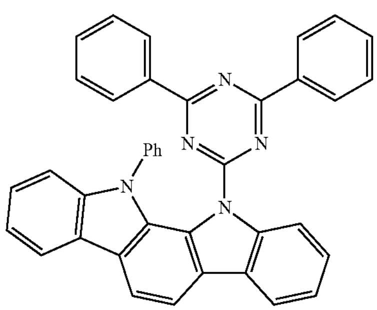
108
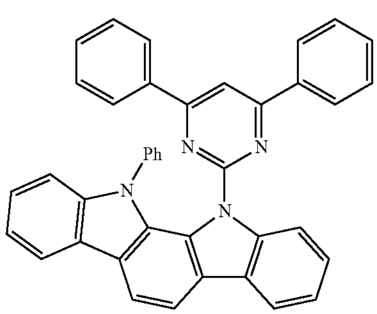
-continued
109
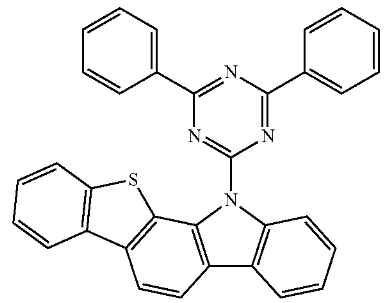
110
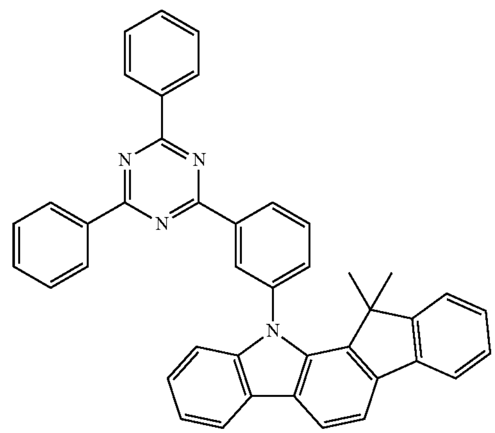
111
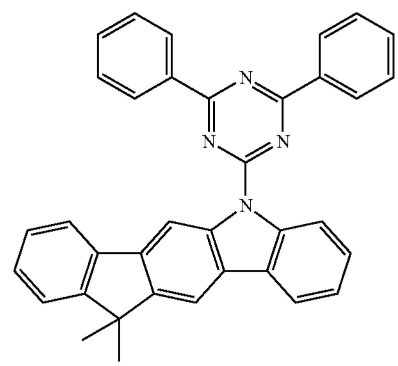
112
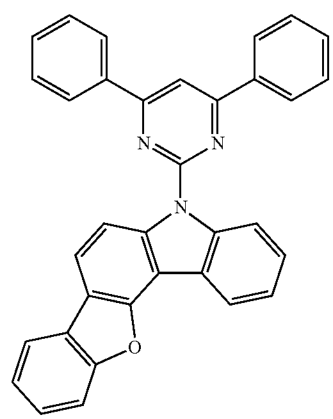

-continued
113
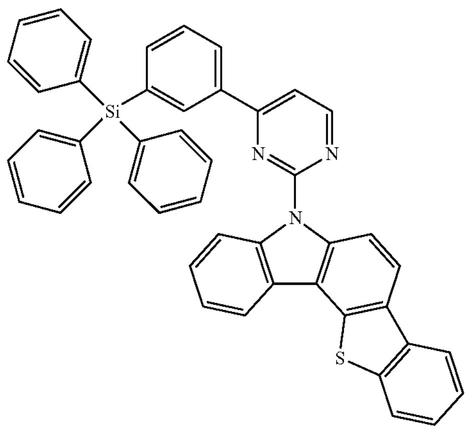
114
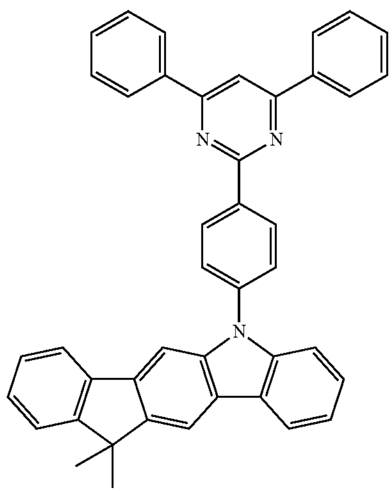
115
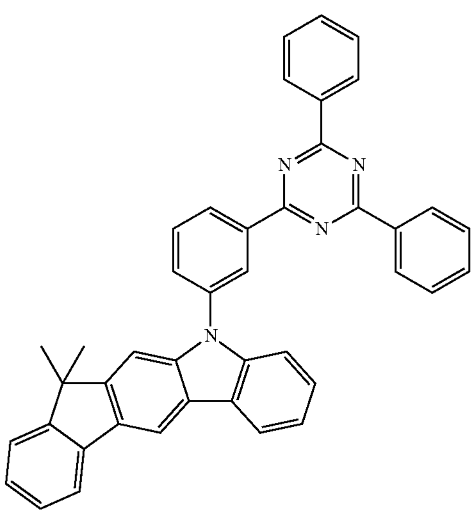
-continued
116
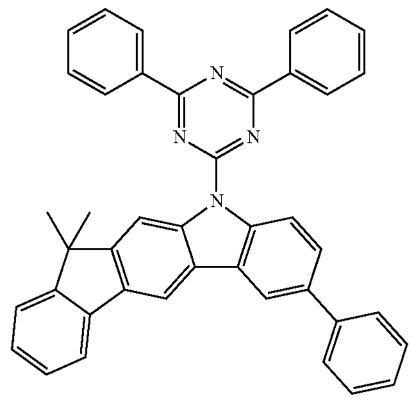
117
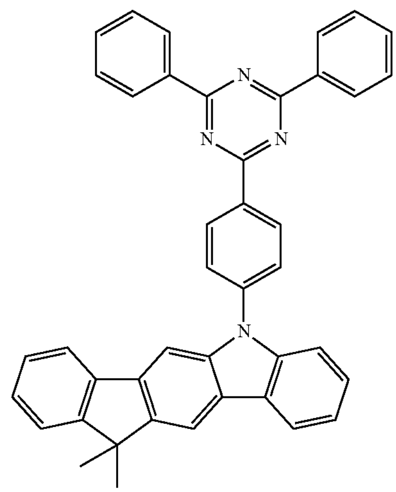
118
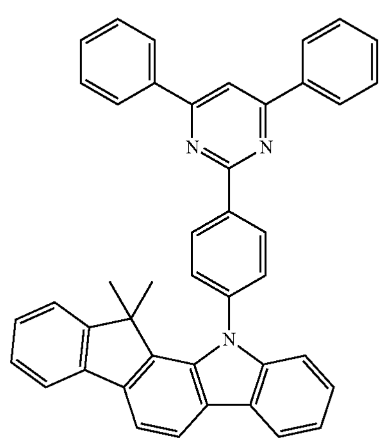

119
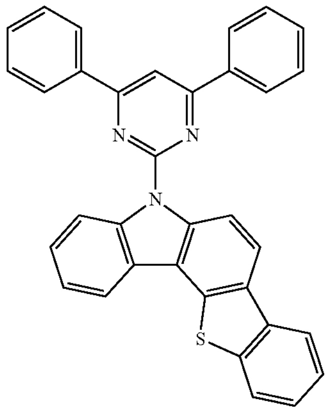
120
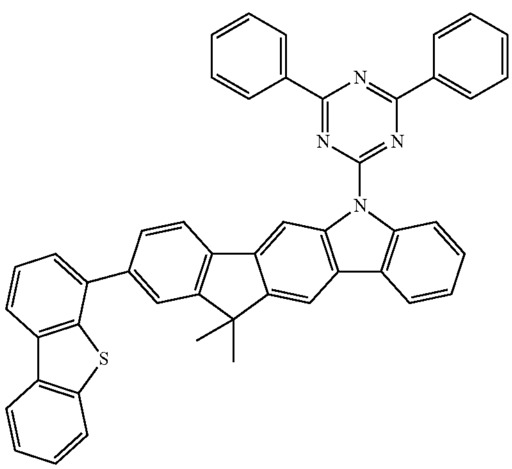
121
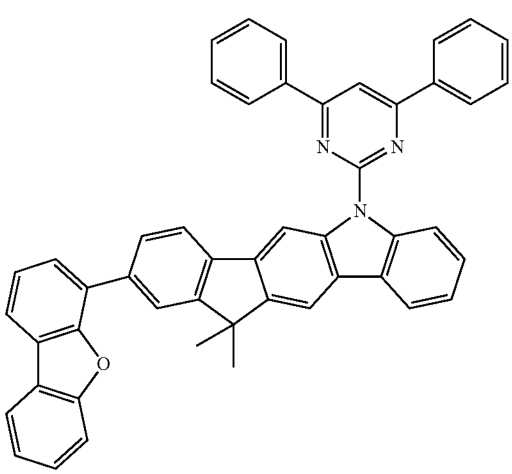
122
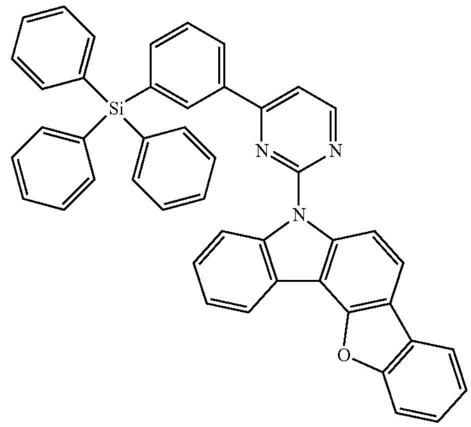
123
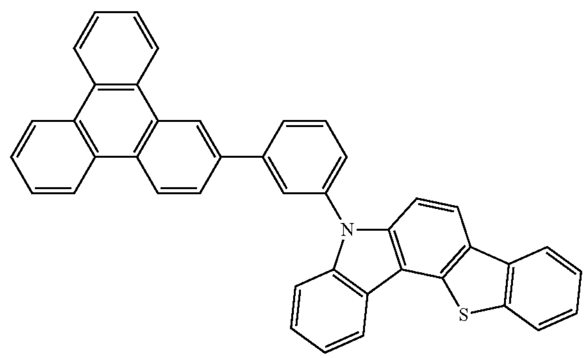
124
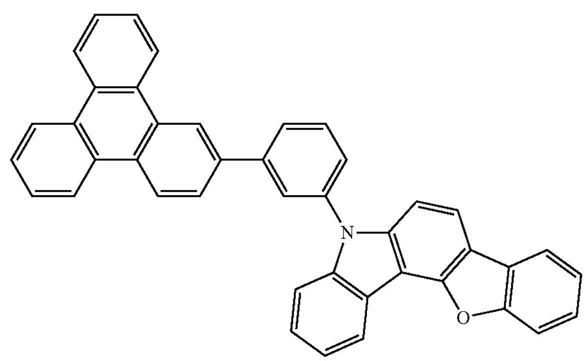
125
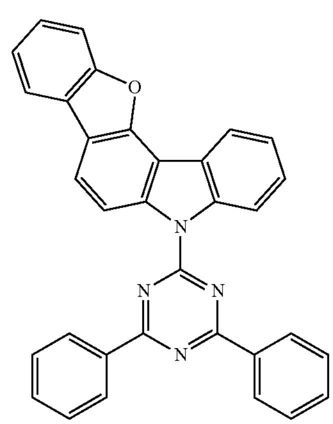

126
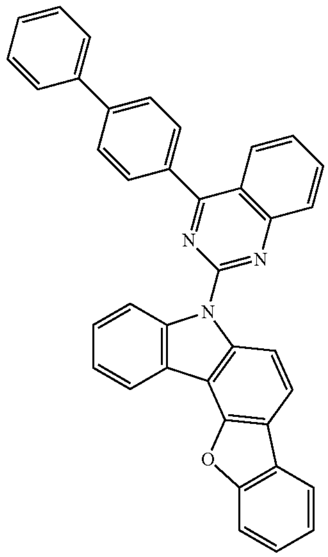
127
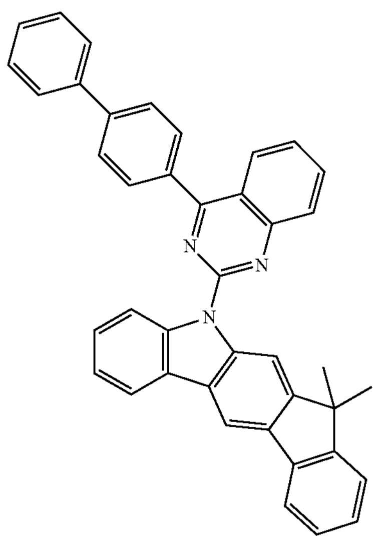
128
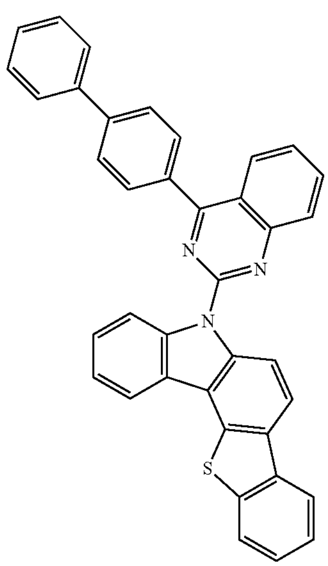
129
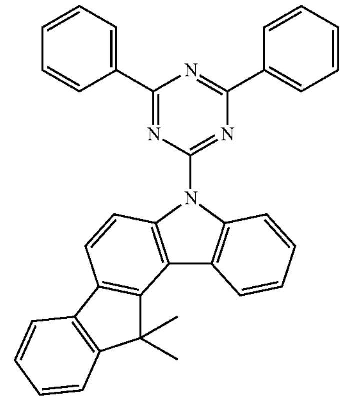
130
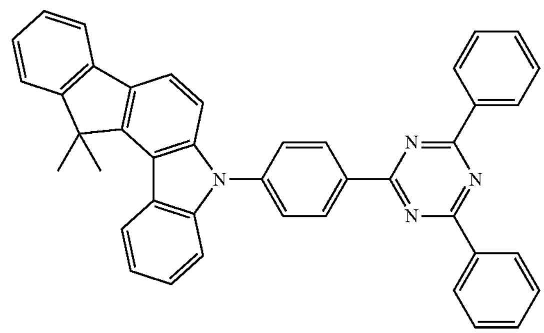
131
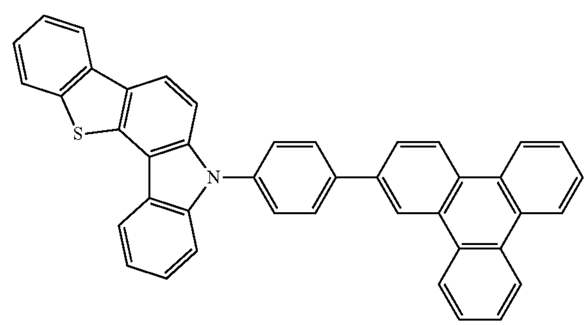
132
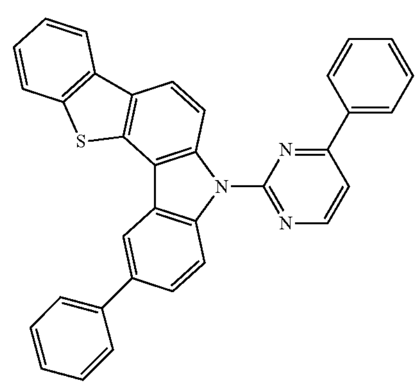

-continued
133
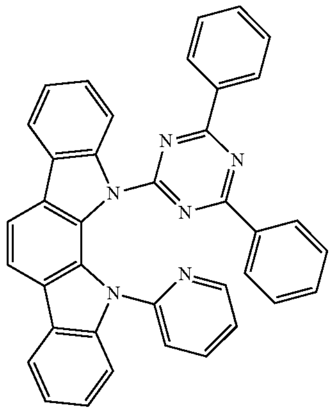
134
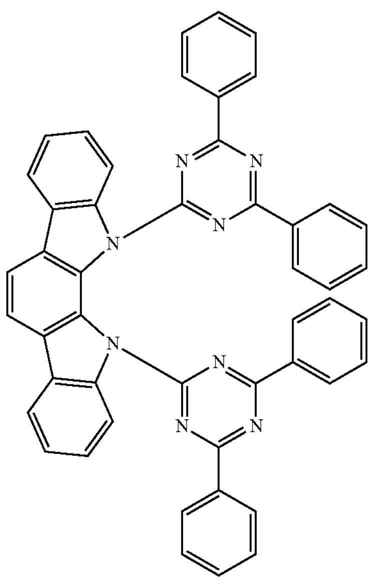
135
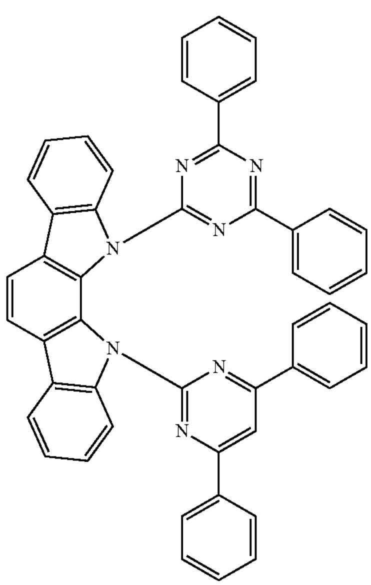
-continued
136
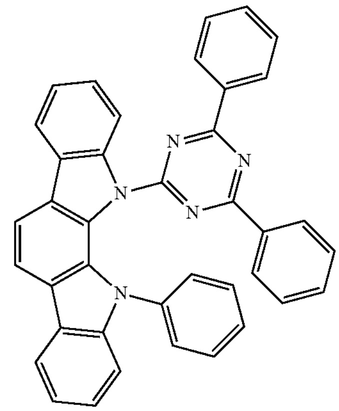
137
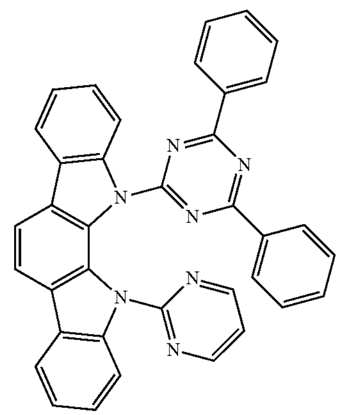
138
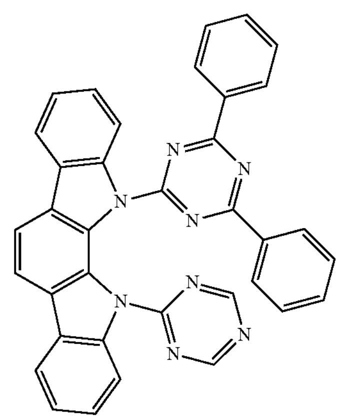
139
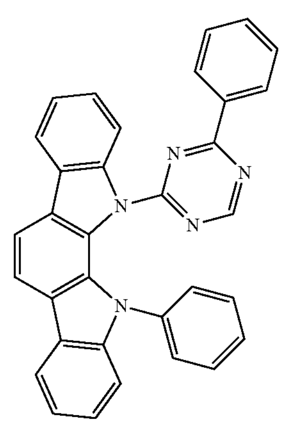

140
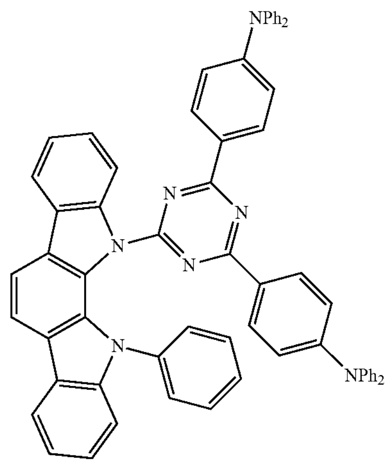
143
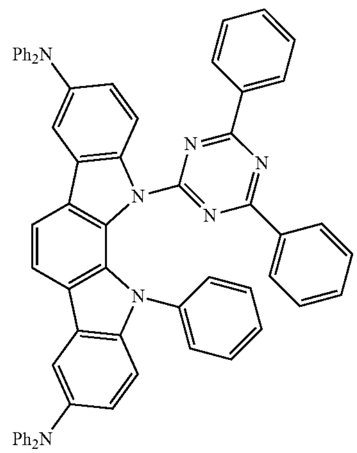
141
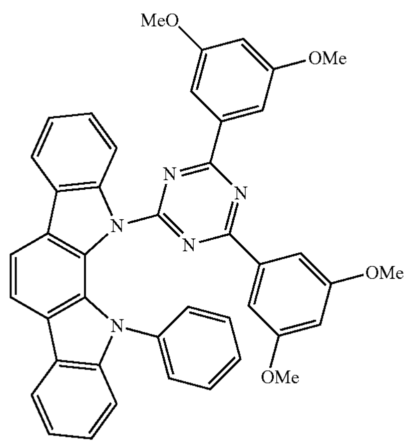
144
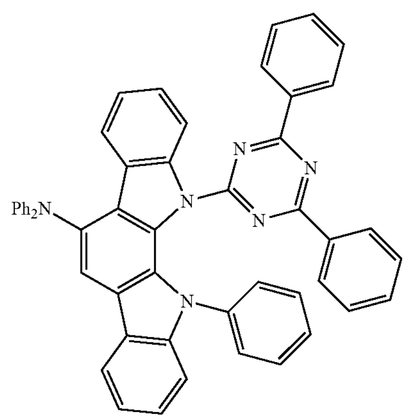
142
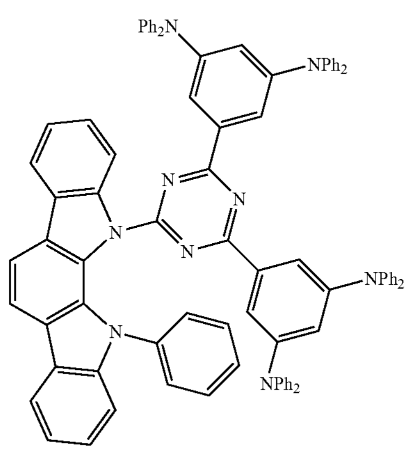
145
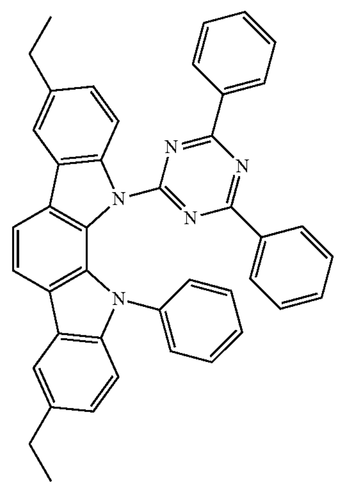

146
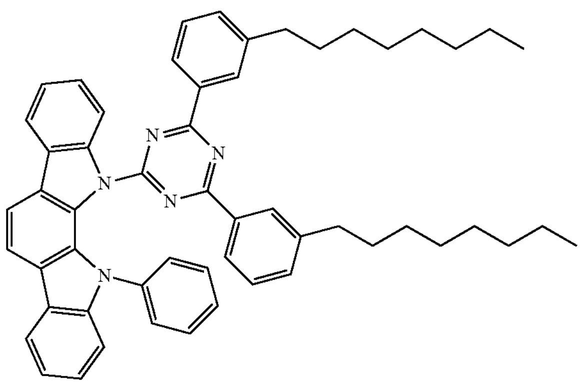
147
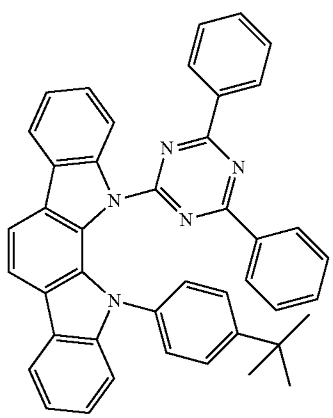
148
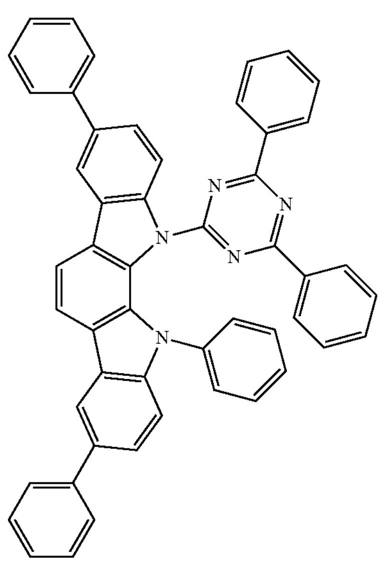
149
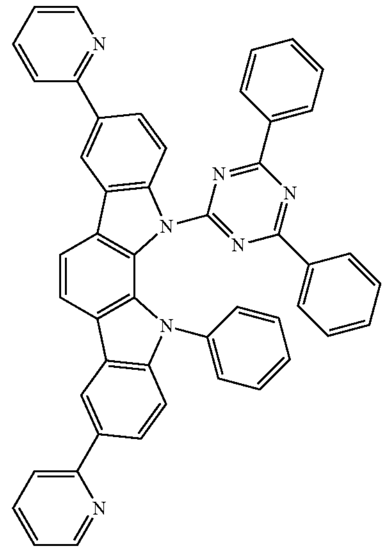
150
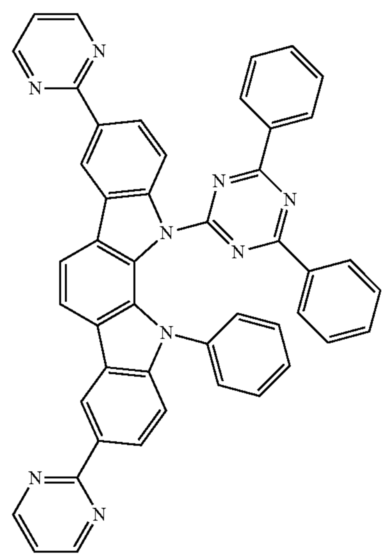
151
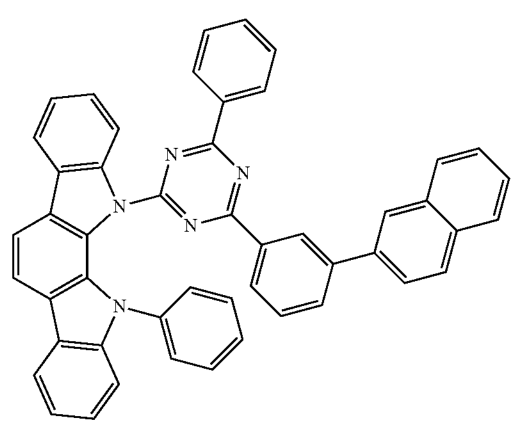

152
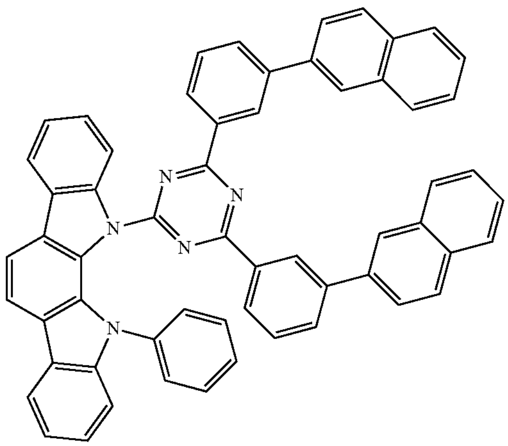
153
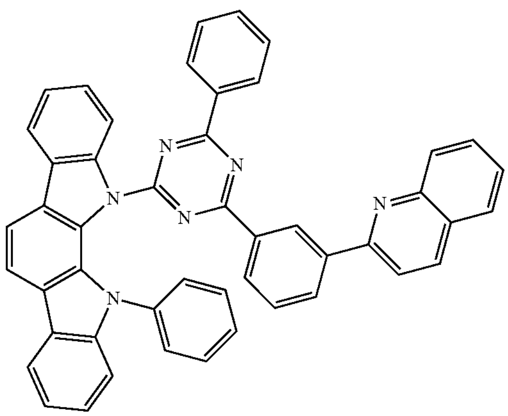
154
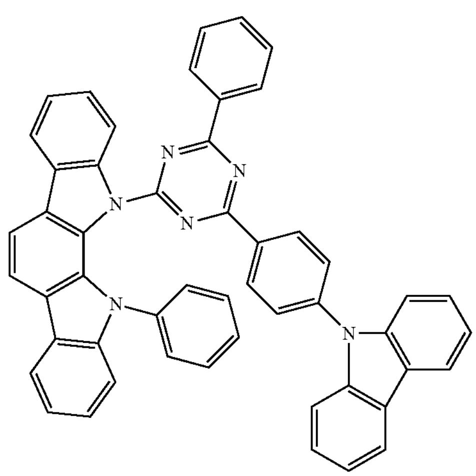
155
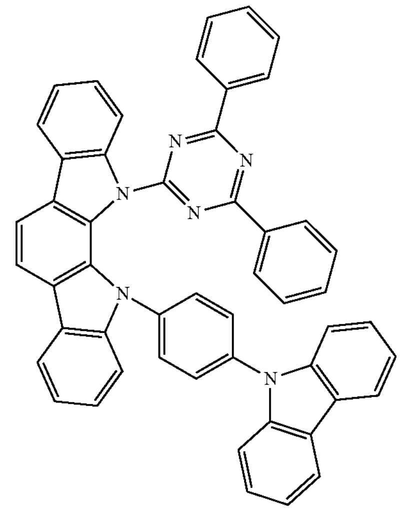
156
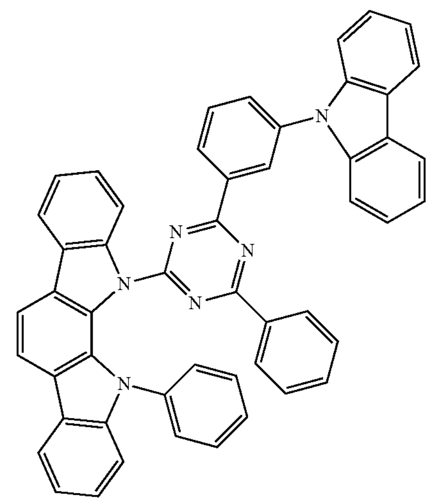
157
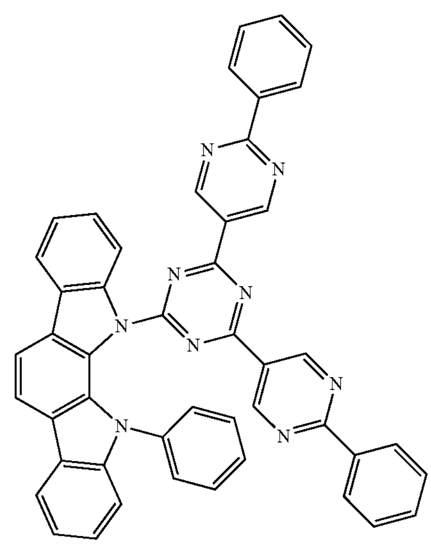

-continued
158
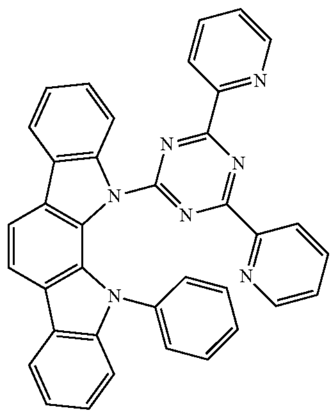
159
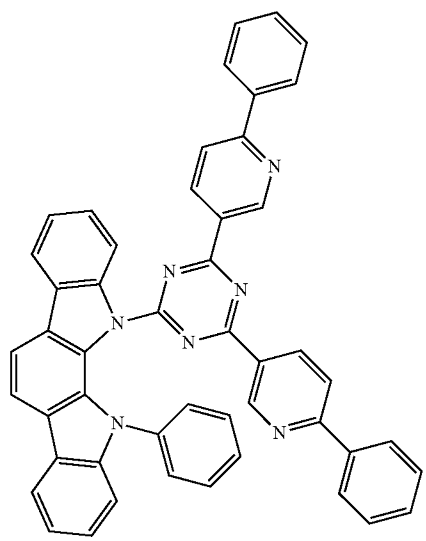
160
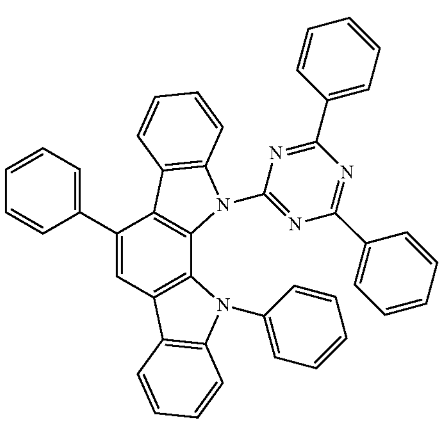
-continued
161
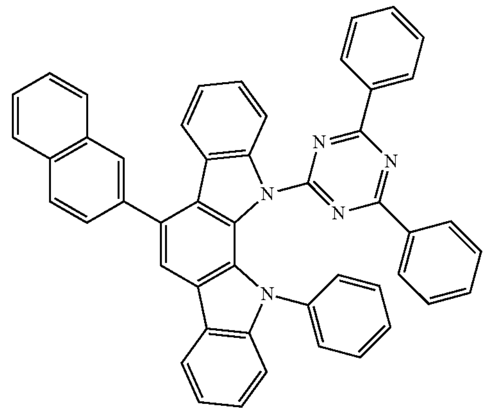
162
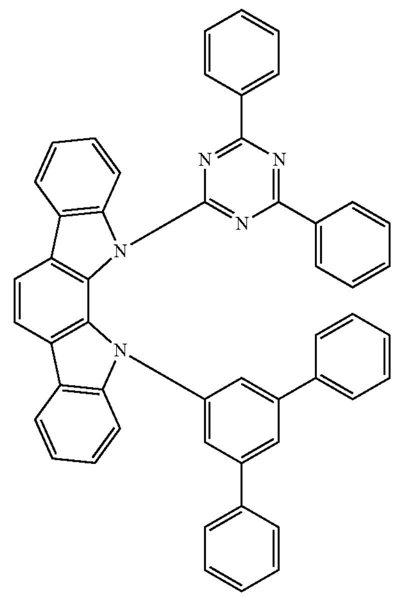
163
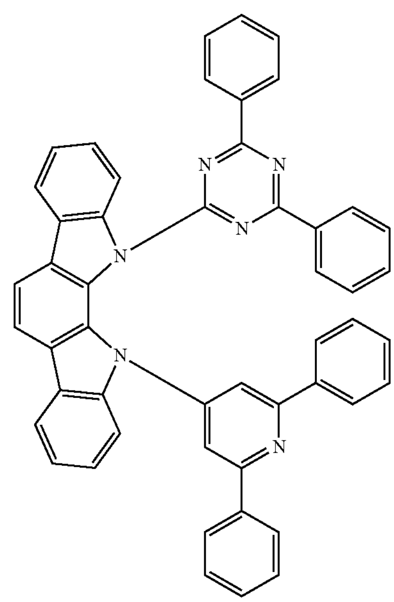

-continued
164
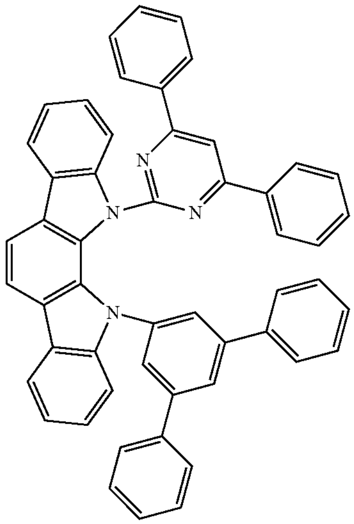
165
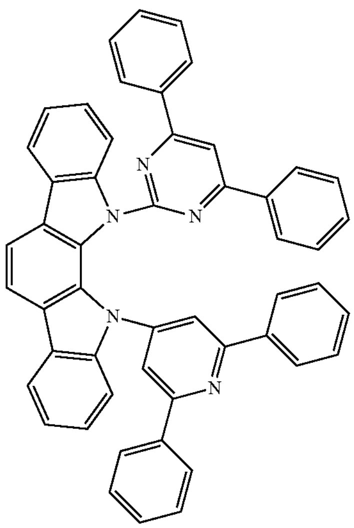
166
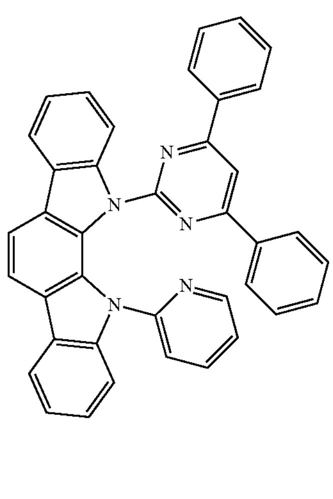
-continued
167
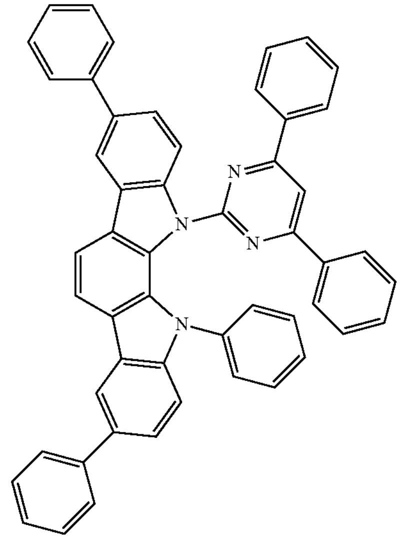
168
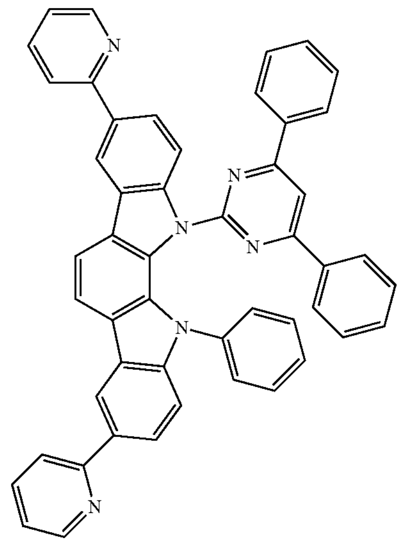
169
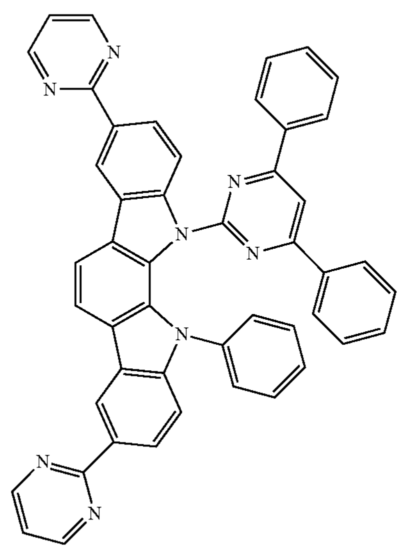

-continued
170
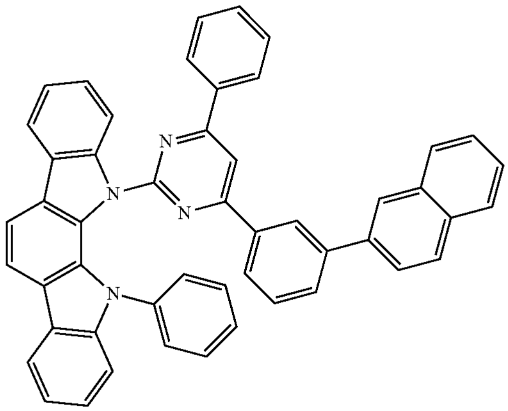
171
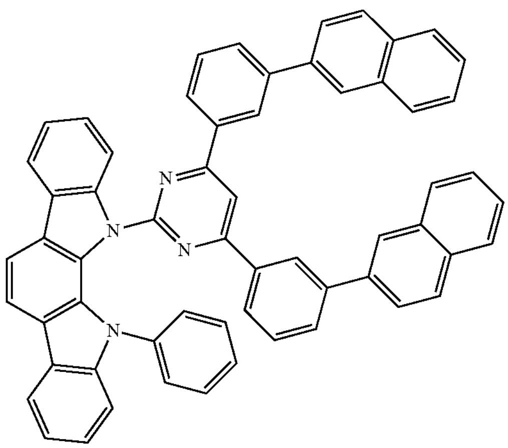
172
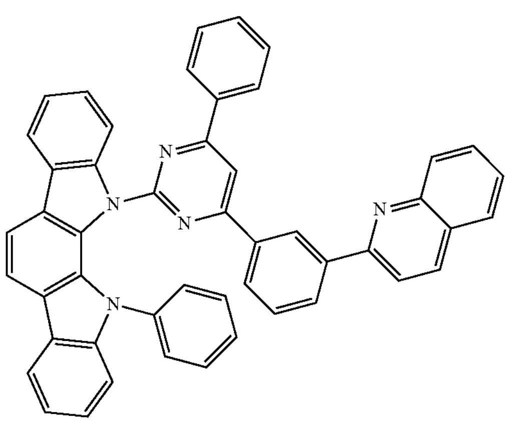
-continued
173
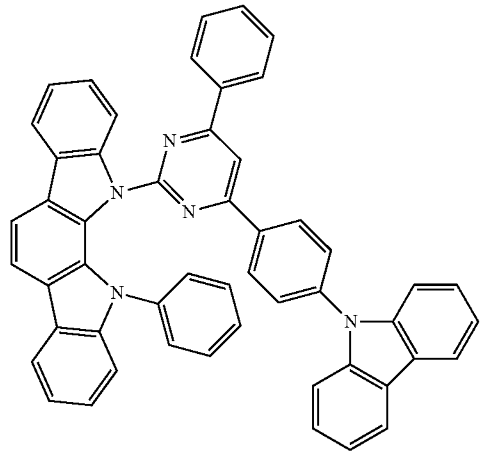
174
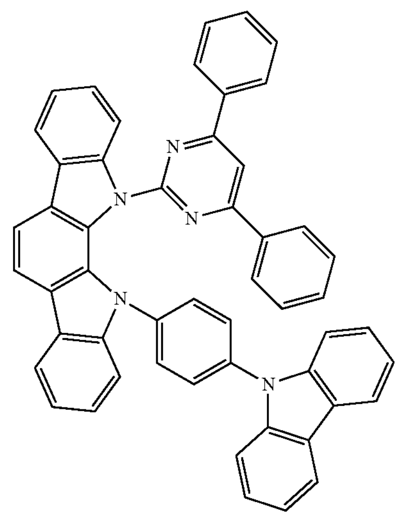
175
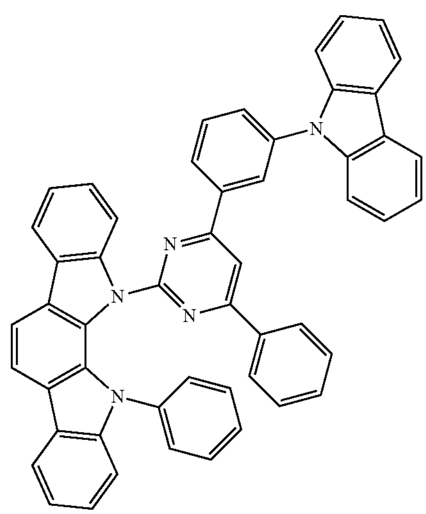

176
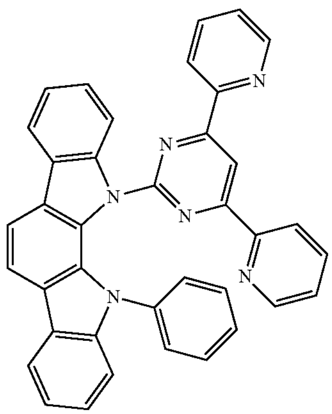
177
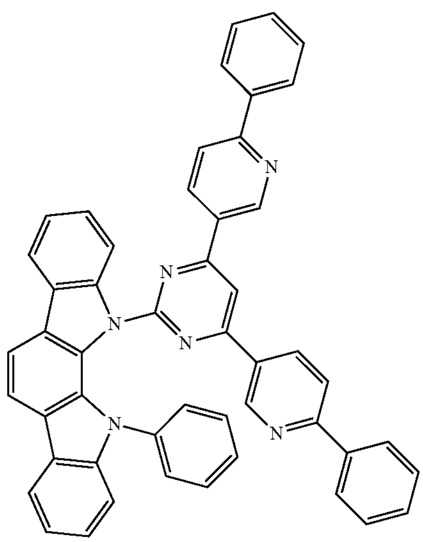
178
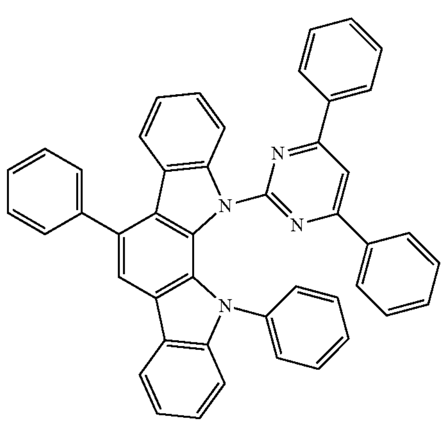
179
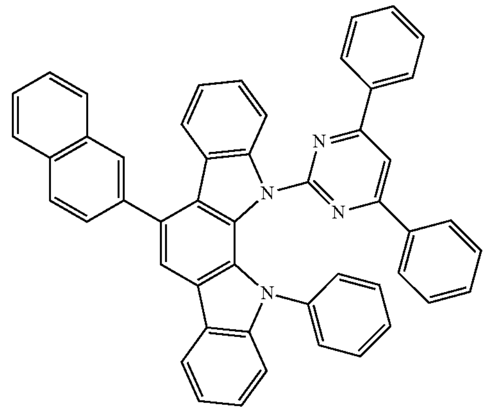
180
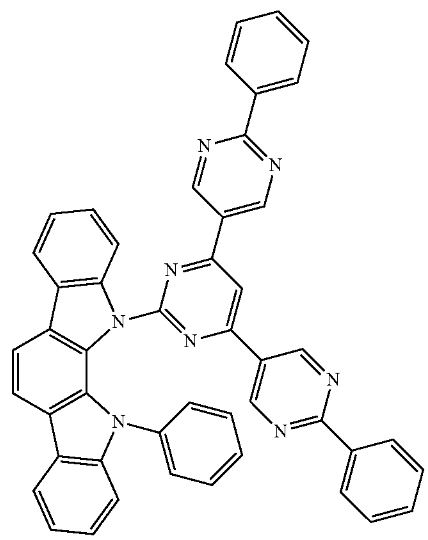
181
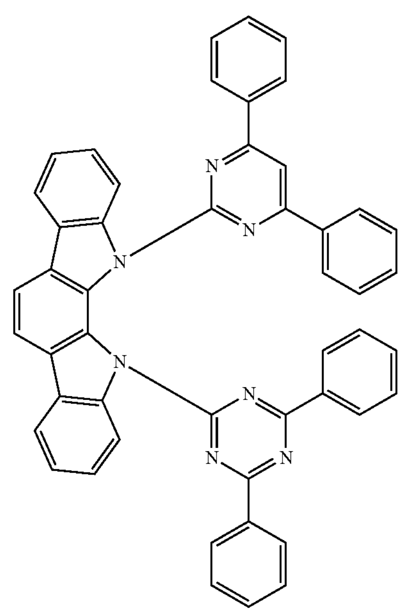

-continued
182
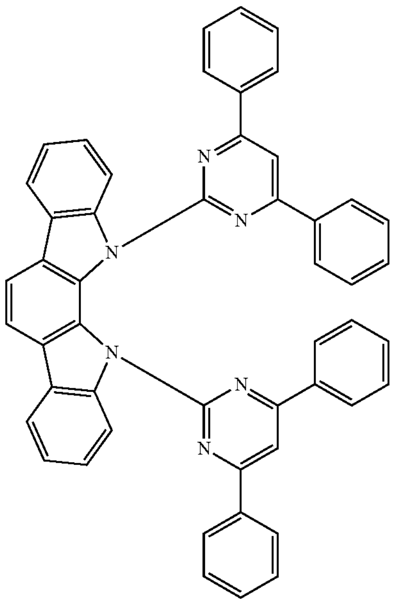
183
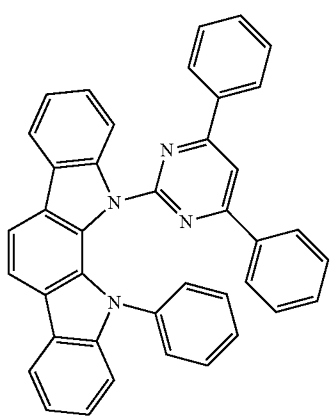
184
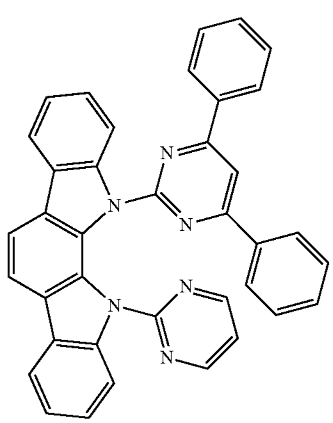
-continued
185
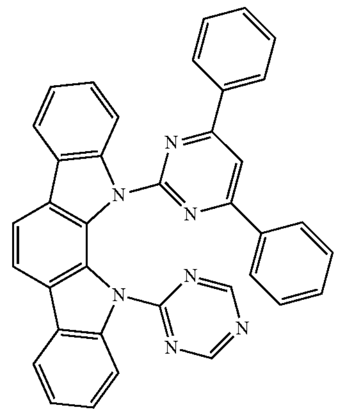
186
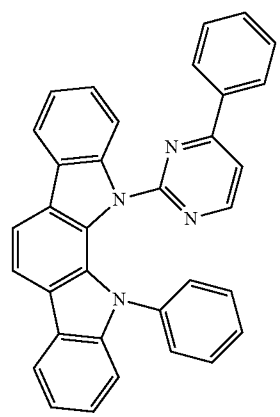
187
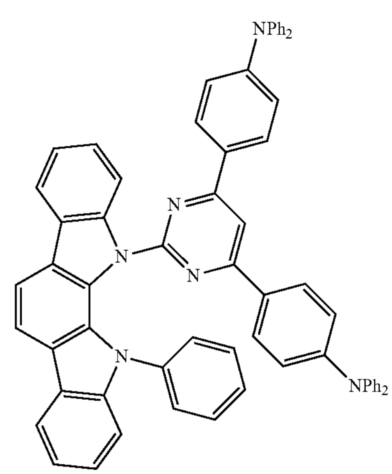

188
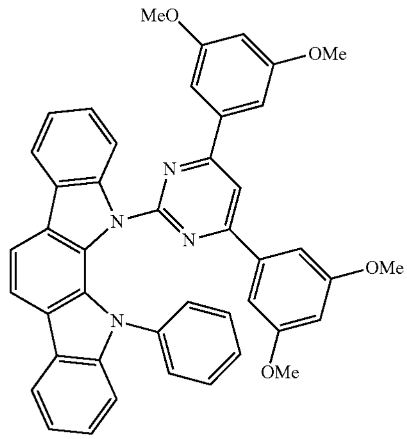
189
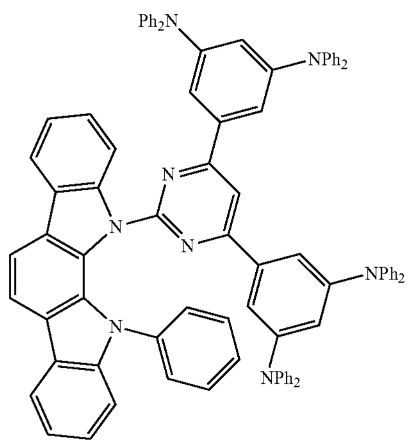
190
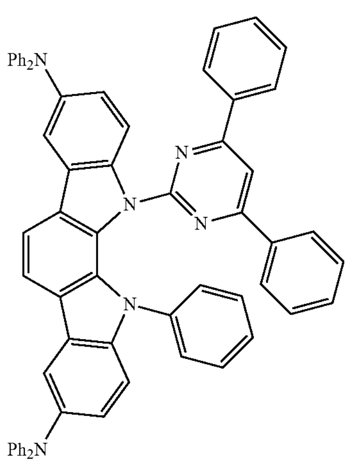
191
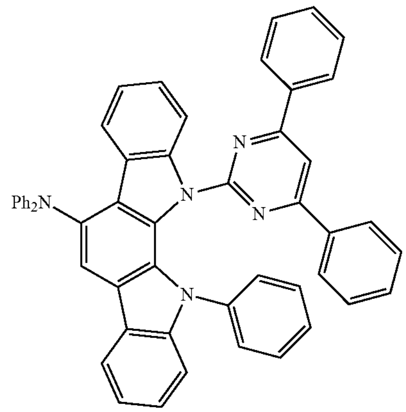
192
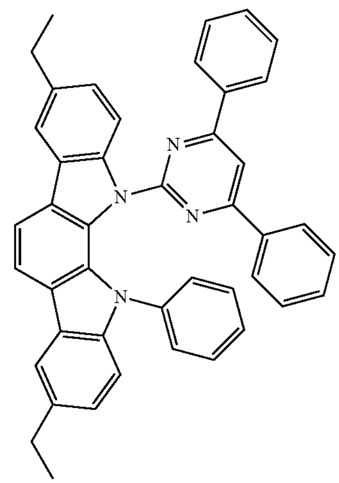
193
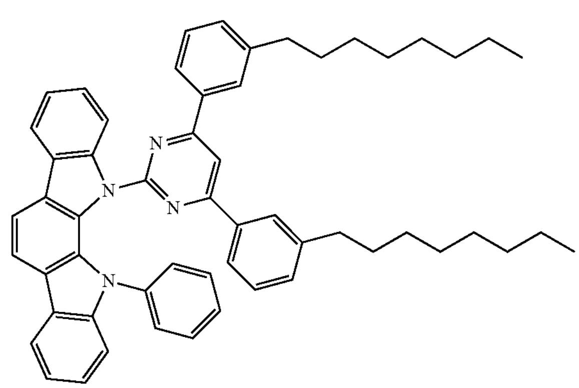

194
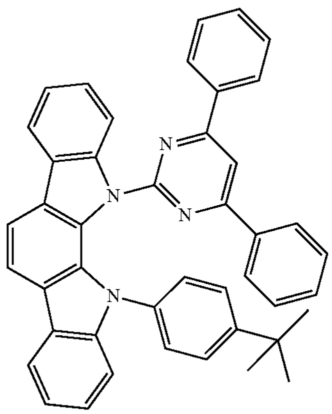
195
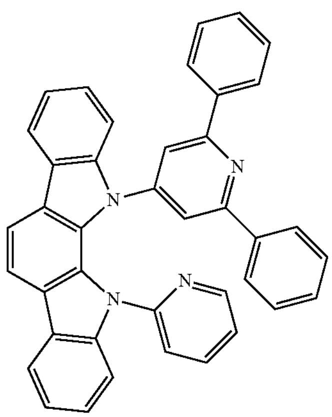
196
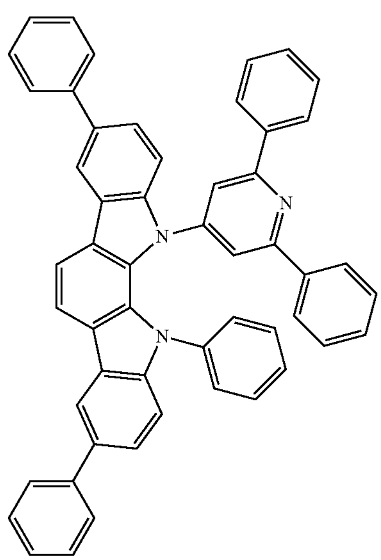
197
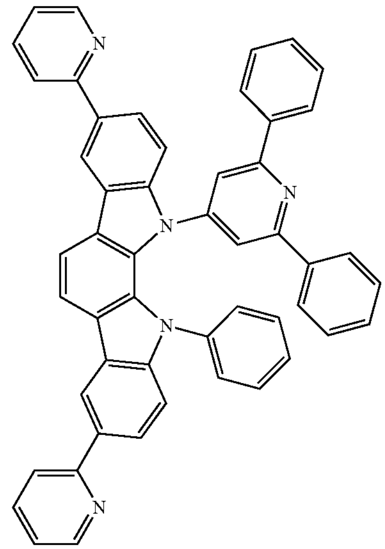
198
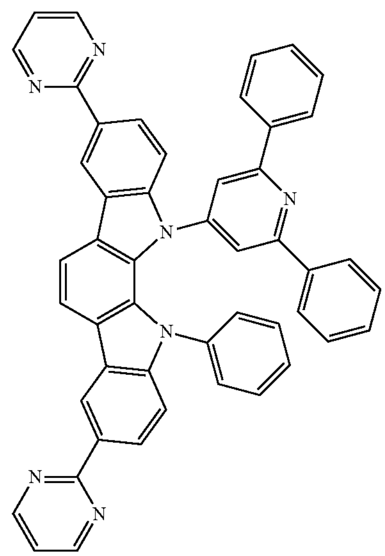
199
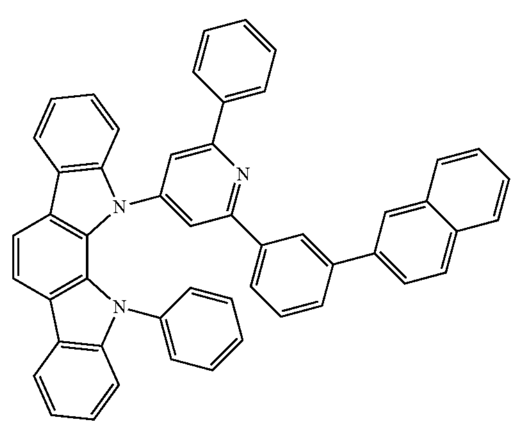

200
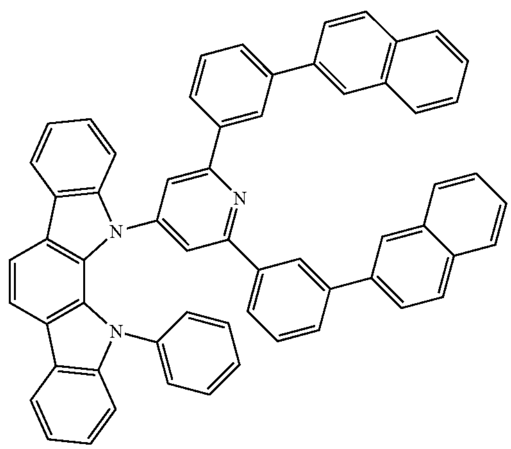
201
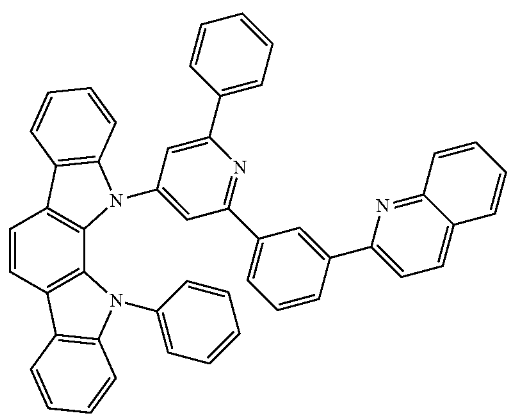
202
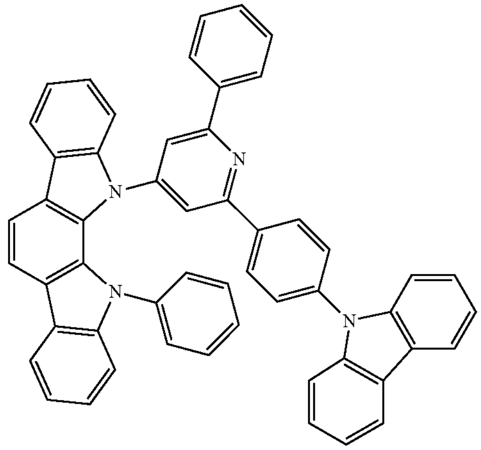
203
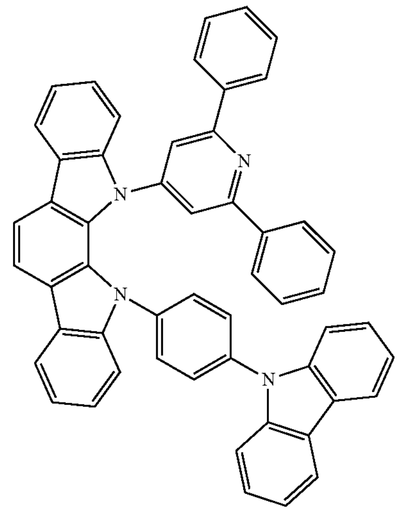
204
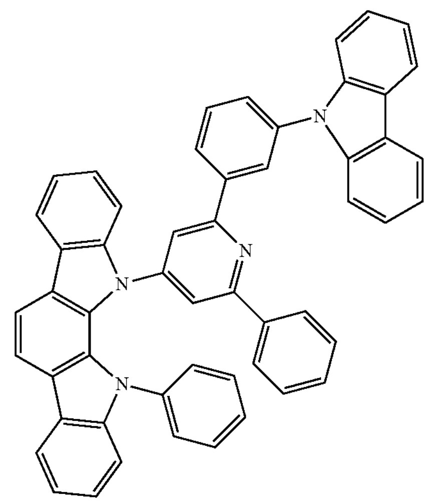
205
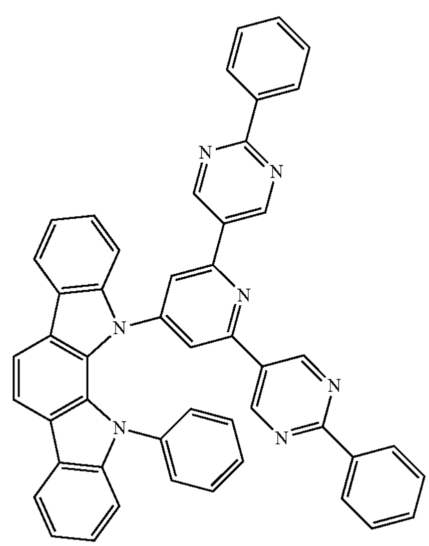

-continued
206
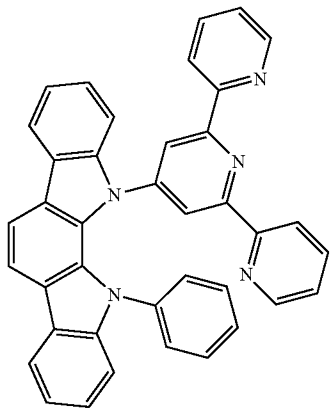
207
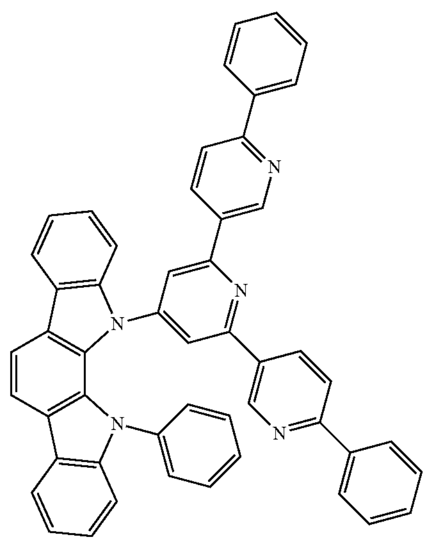
208
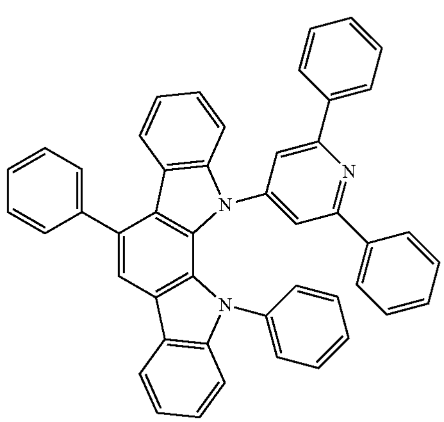
-continued
209
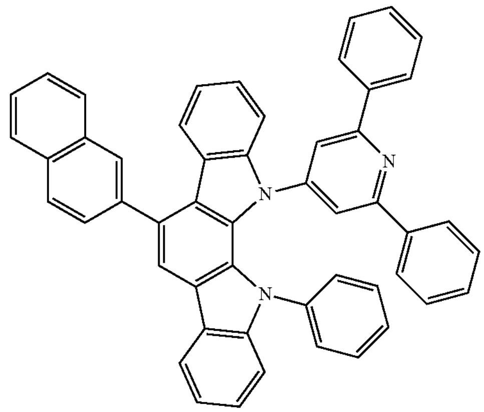
210
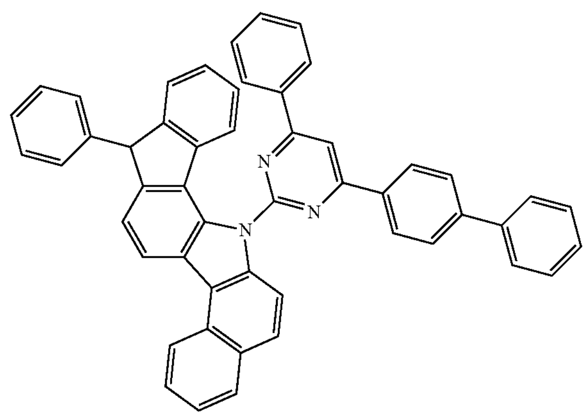
211
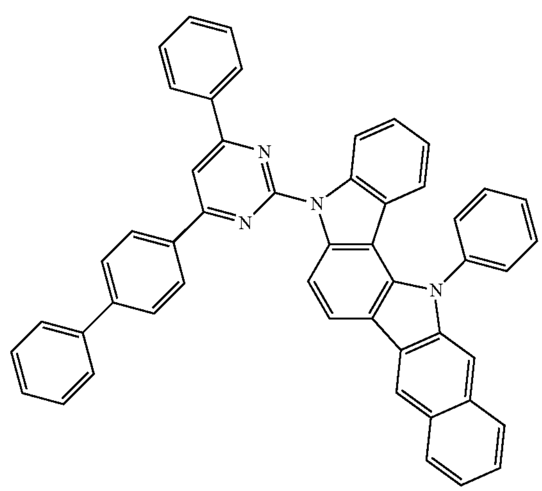

-continued
212
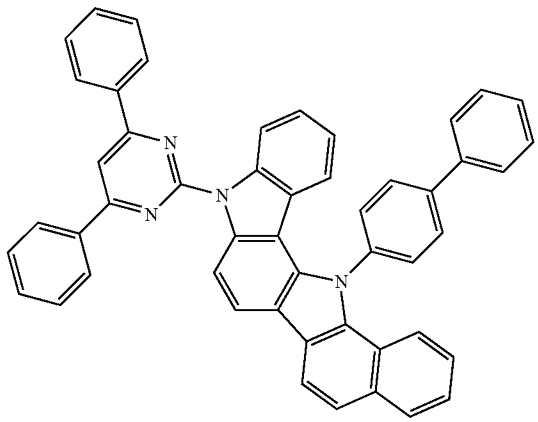
213
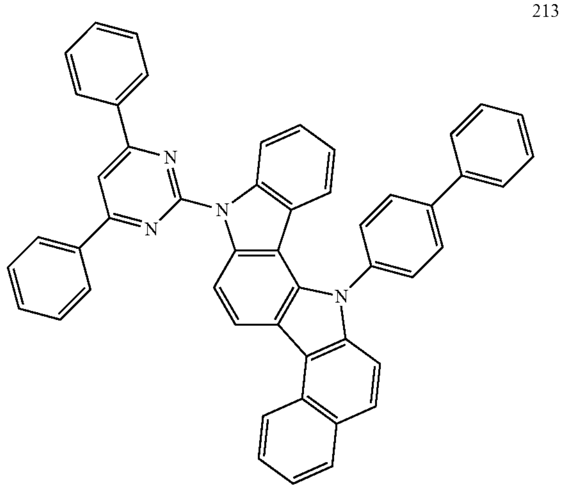
214
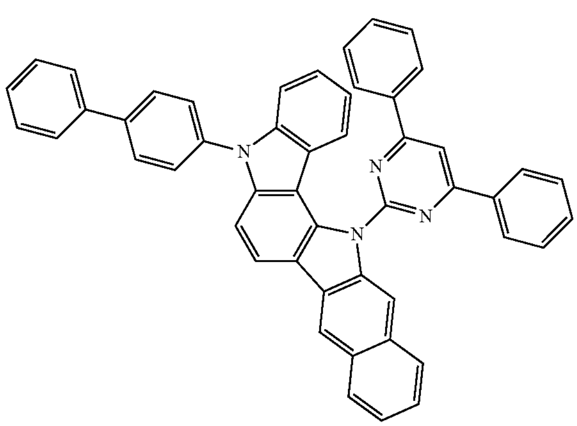
-continued
215
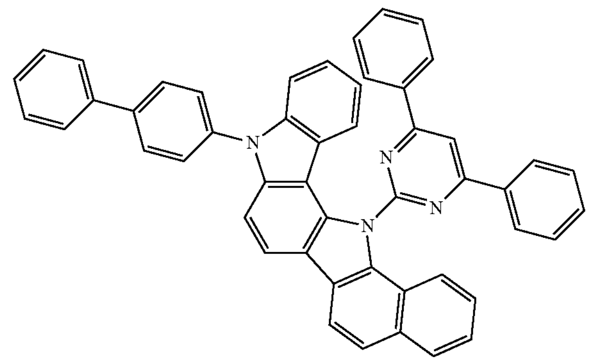
216
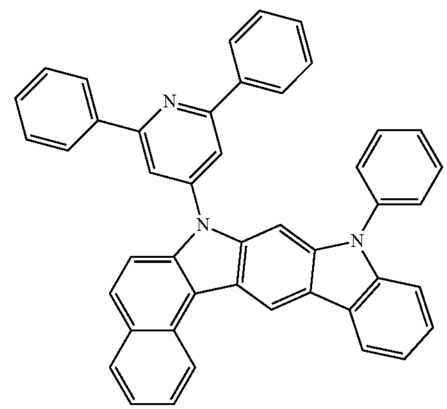
217
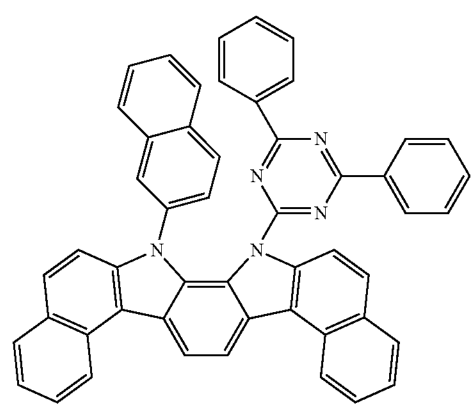
218
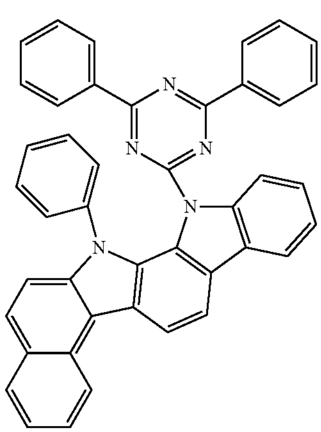

-continued
219
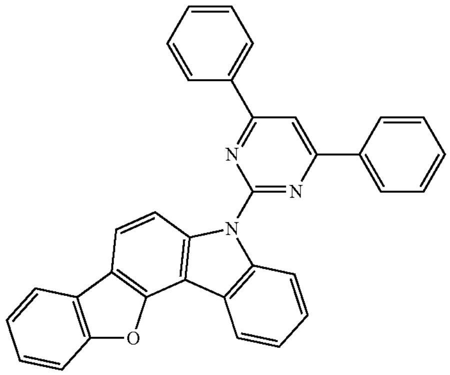
220
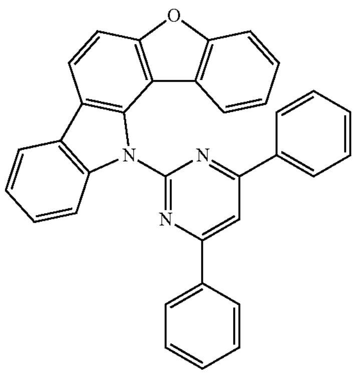
221
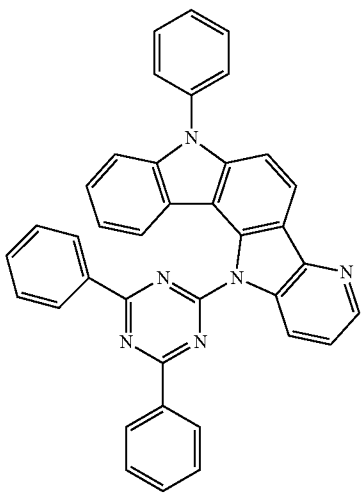
222
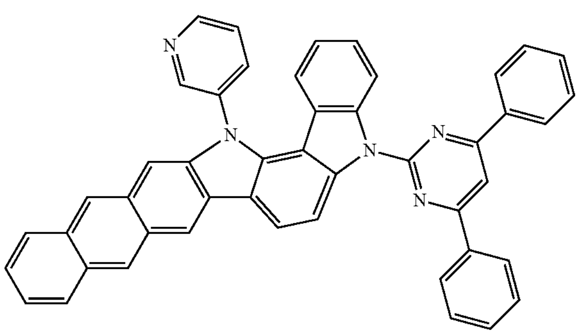
-continued
223
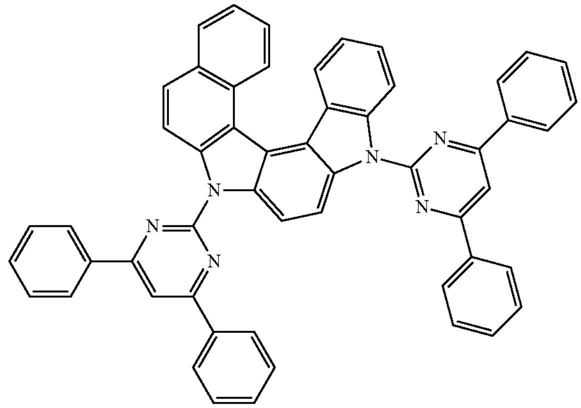
224
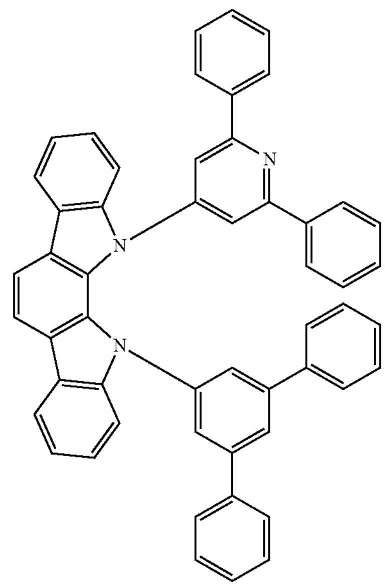
225
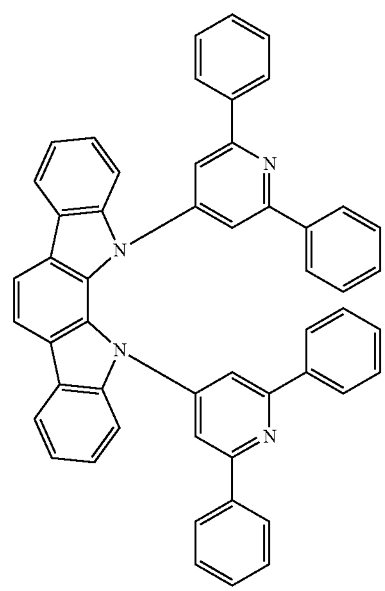

-continued
226
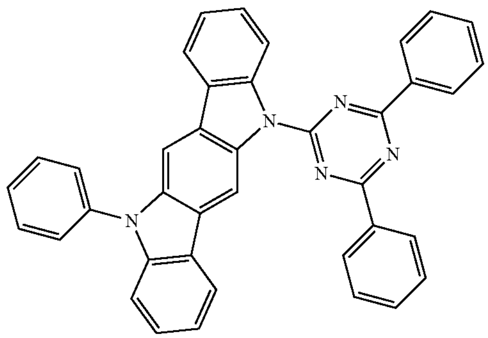
227
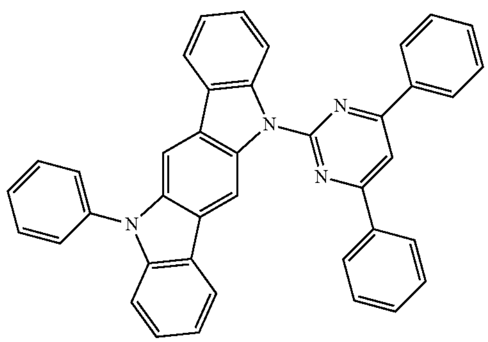
228
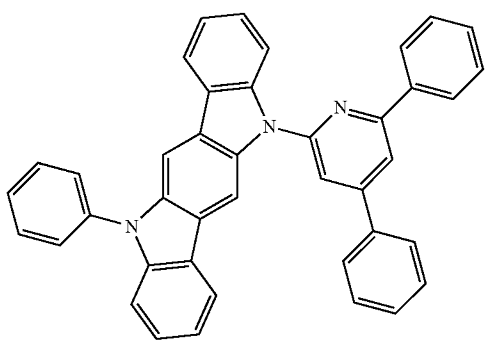
229
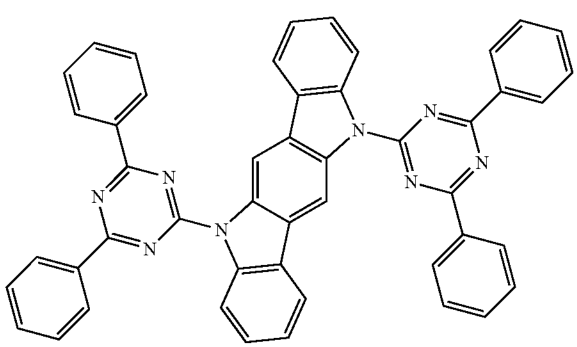
-continued
230
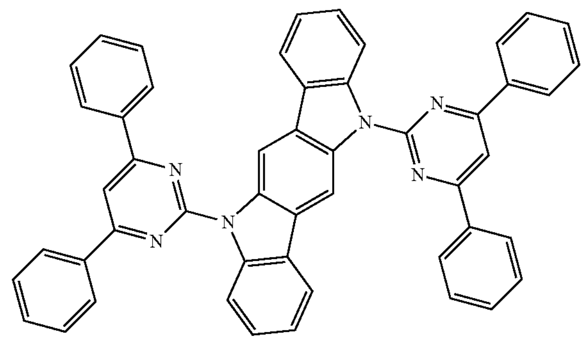
231
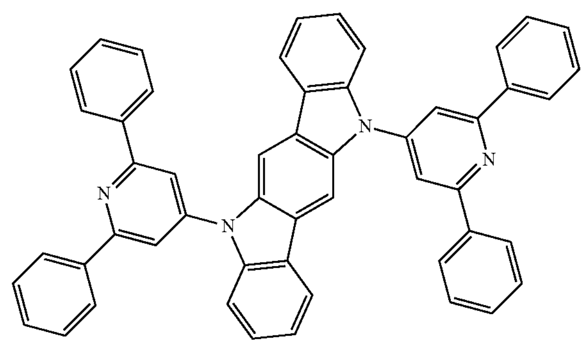
232
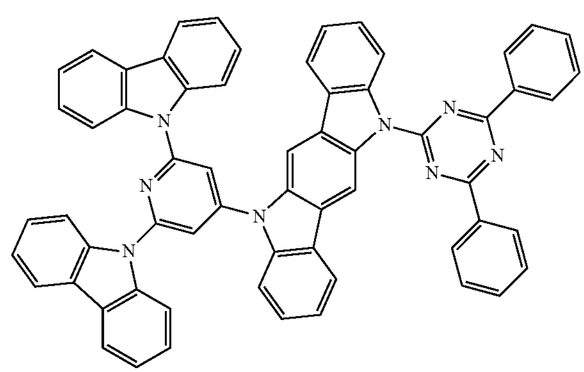
233
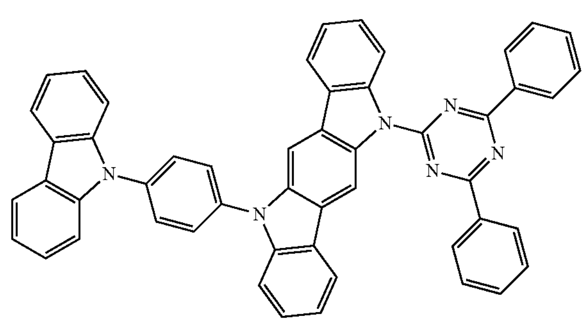

-continued

234

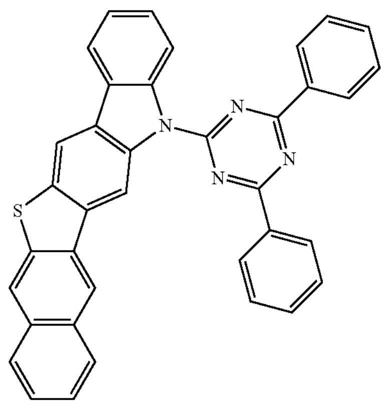

235

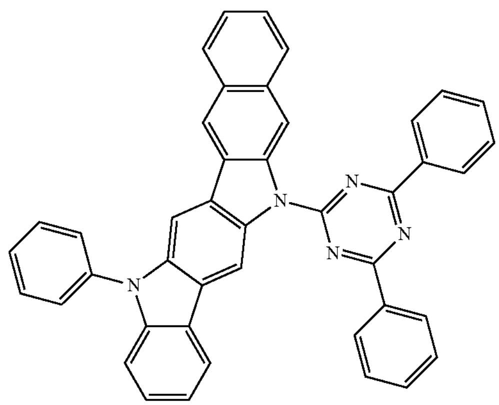

236

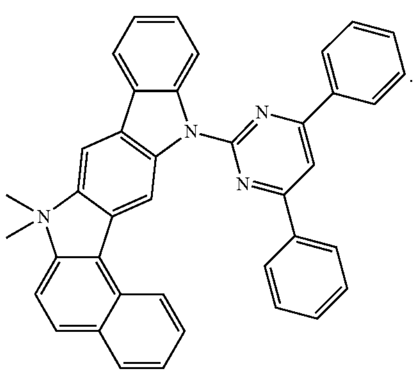

When the organic light-emitting device 10 is a full color organic light-emitting device, the EML may be patterned into a red EML, a green EML, and a blue EML. In some embodiments, the EML may include, for example, at least two of the red EML, the green EML, and the blue EML that are stacked upon one another to emit white light.

The EML may further include a light-emitting material. For example, the EML may further include a host and/or a dopant.

Exemplary hosts including tris(8-quinolinato)aluminum ($Alq_3$), 4,4'-N,N'-dicarbazole-biphenyl (CBP), poly(n-vinylcarbazole) (PVK), 9,10-di(naphthalene-2-yl)anthracene (ADN), 4,4',4"-tris(carbazole-9-yl)triphenylamine (TCTA), 1,3,5-tris(N-phenylbenzimidazole-2-yl)benzene (TPBI), 3-tert-butyl-9,10-di(napth-2-yl)anthracene (TBADN), 9,9'-(1,3-phenylene)bis-9H-carbazole (mCP), E3, 1,3-bis[2-(4-tert-butyphenyl)-1,3,4-oxadiazo-5-yl] (OXD-7), distyryl arylene (DSA), dmCBP (see Formula below), and Compounds 501 to 509 below:

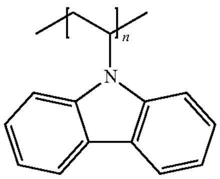

PVK

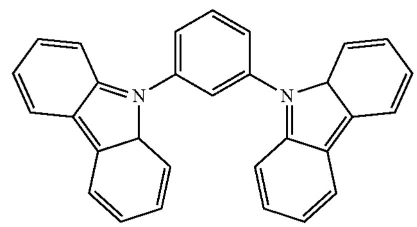

mCP

OXD-7

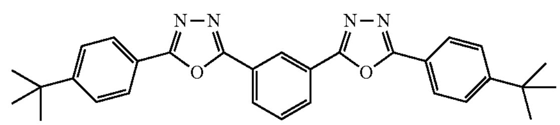

E3

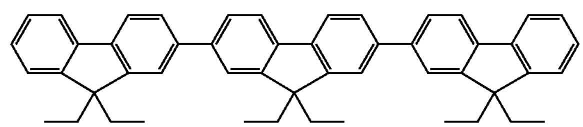

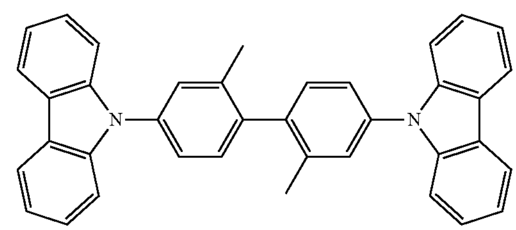

dmCBP

501

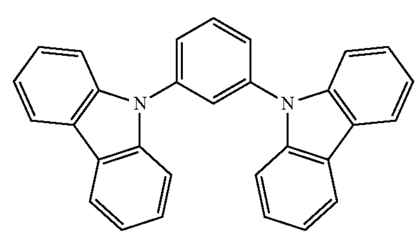

502

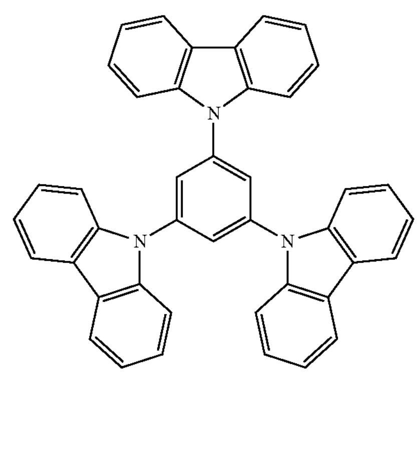

-continued
503
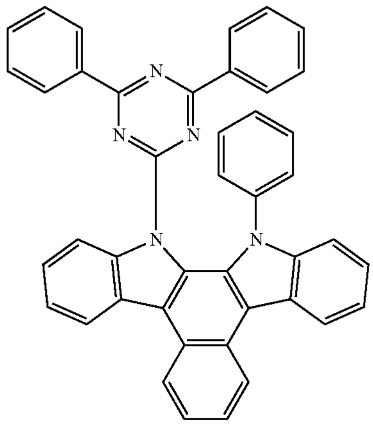
504
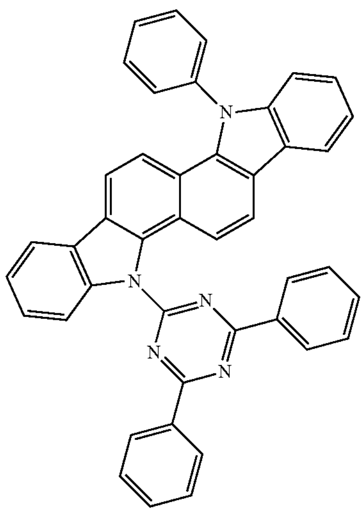
505
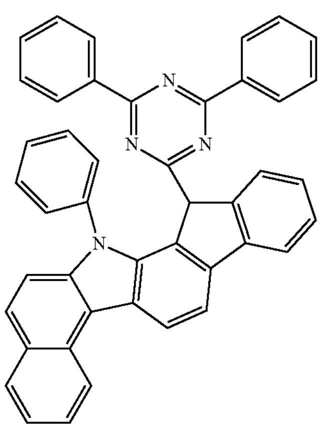
-continued
506
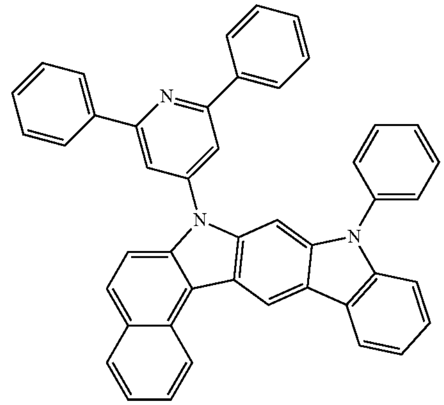
507
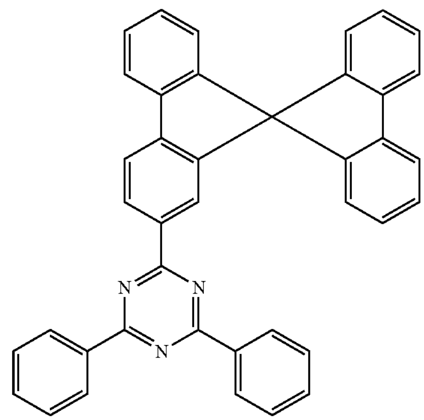
508
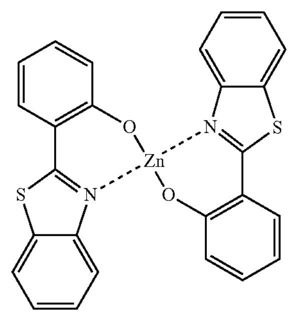
509
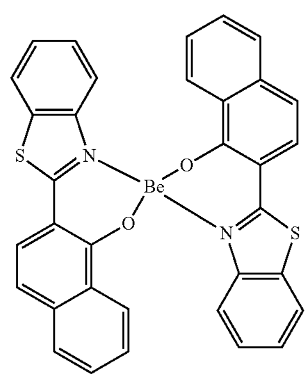
In some embodiments, as the host, an anthracene-based compound represented by Formula 400 below may be used:

<Formula 400>

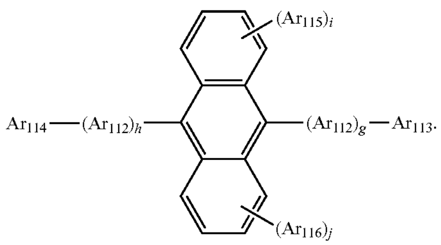

In Formula 400, $Ar_{111}$ and $Ar_{112}$ are each independently a substituted or unsubstituted $C_5$-$C_{60}$ arylene group; $Ar_{113}$ to $Ar_{119}$ are each independently a substituted or unsubstituted $C_1$-$C_{10}$ alkyl group or a substituted or unsubstituted $C_5$-$C_{60}$ aryl group; and g, h, i, and j may each independently be an integer of 0 to 4.

In some embodiments, in Formula 60 above, $Ar_{111}$ and $Ar_{112}$ may each independently be a phenylene group, a naphthylene group, a phenanthrenylene group, or a pyrenylene group; or a phenylene group, a naphthylene group, a phenanthrenylene group, a fluorenyl group, or a pyrenylene group each substituted with at least one selected from a phenyl group, a naphthyl group, and an anthryl group.

In Formula 60 above, g, h, i, and j may each independently be an integer of 0, 1, or 2.

In Formula 400 above, $Ar_{113}$ to $Ar_{116}$ are each independently a $C_1$-$C_{10}$ alkyl group each substituted with at least one of a phenyl group, a naphthyl group, and an anthryl group; a phenyl group; a naphthyl group; an anthryl group; a pyrenyl group; a phenanthrenyl group; a fluorenyl group;

a phenyl group, a naphthyl group, an anthryl group, a pyrenyl group, a phenanthrenyl group, and a fluorenyl group each substituted with at least one of deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group; and

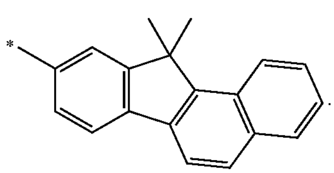 [SMILES: Cc1ccc2c(c1)C(C)(C)c1c-2ccc2ccccc12]

In some embodiments, an anthracene-based compound represented by Formula 400 above may be one of the compounds below:

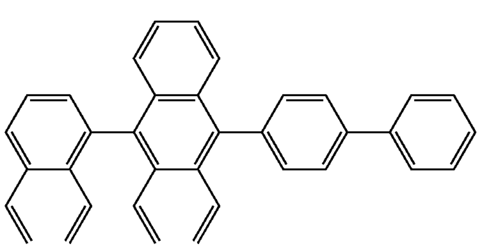

-continued

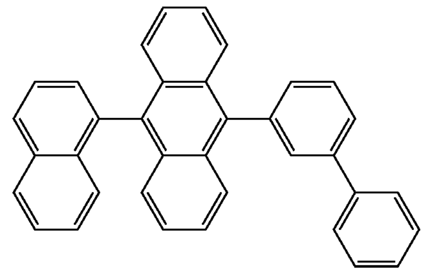

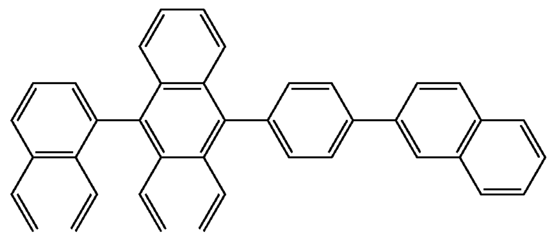

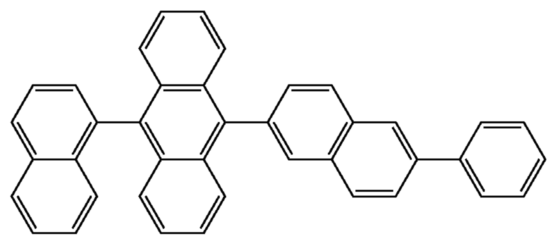

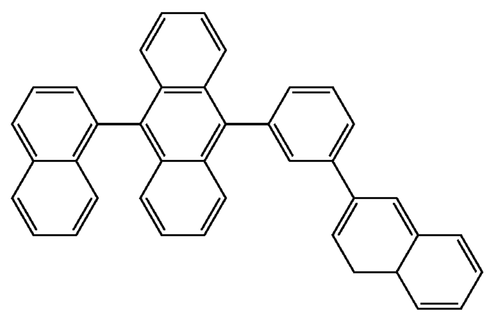

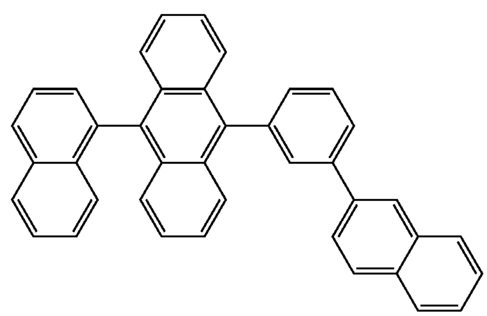

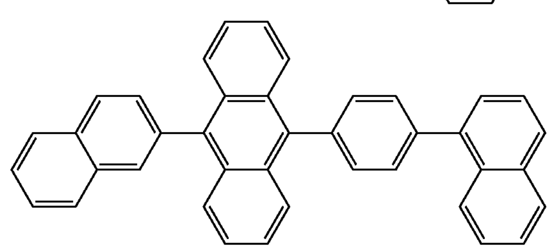

-continued
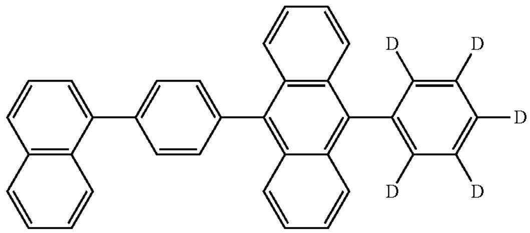
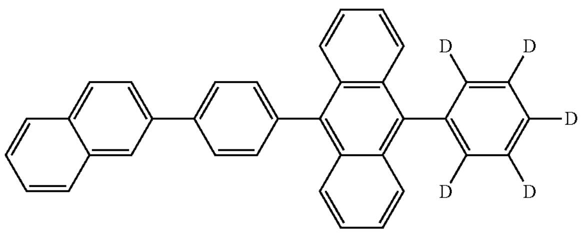
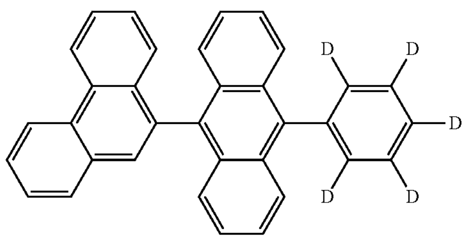
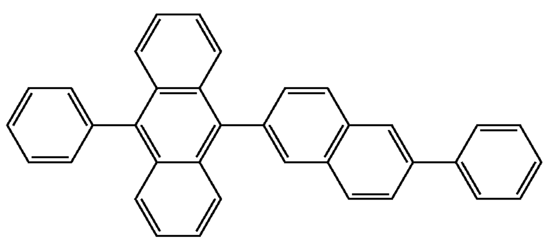
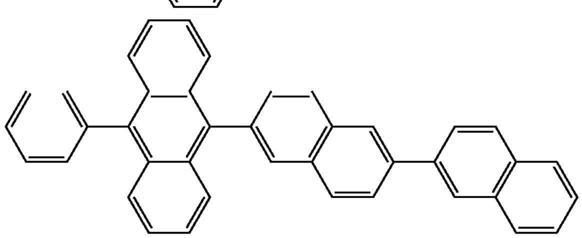
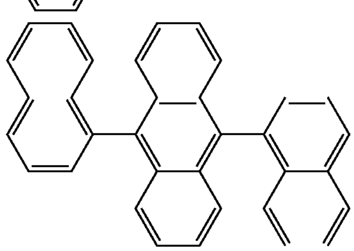
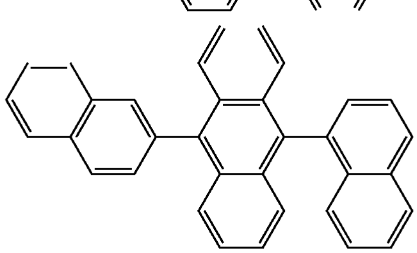
-continued
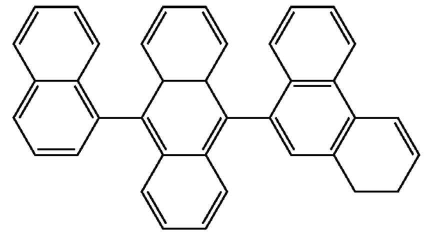
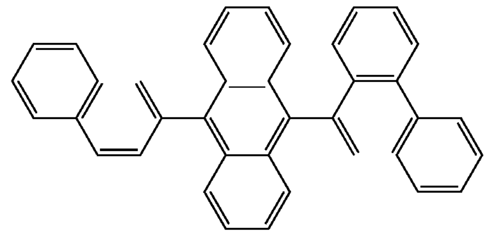
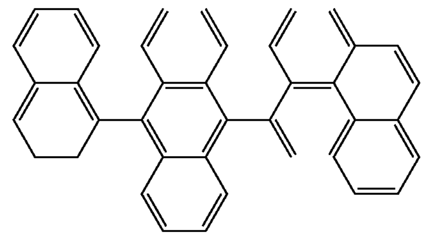
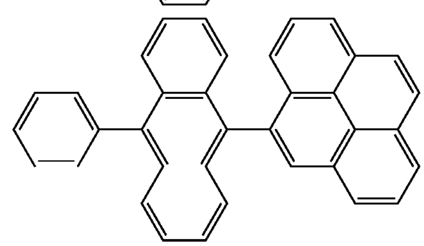
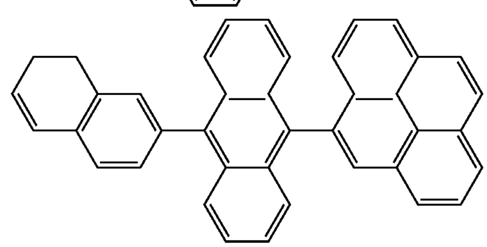
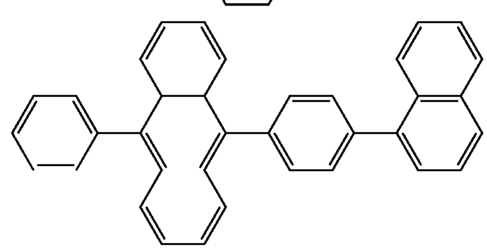
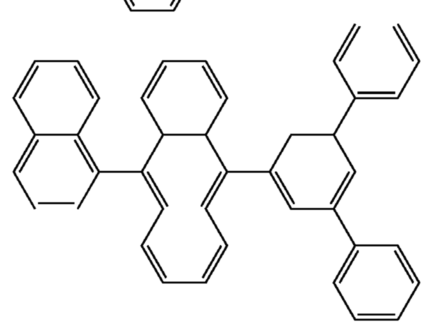

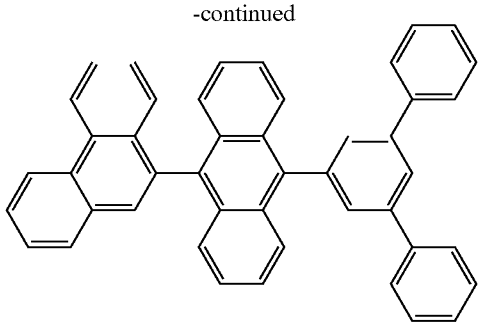
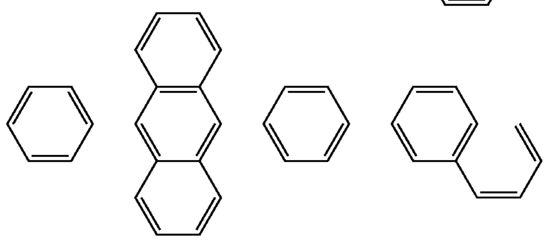
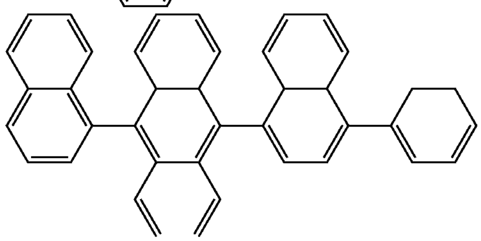
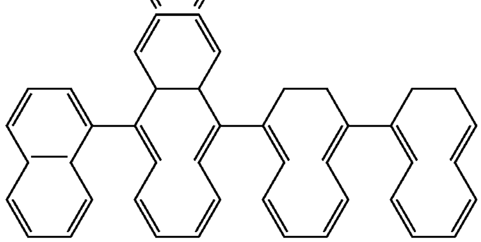
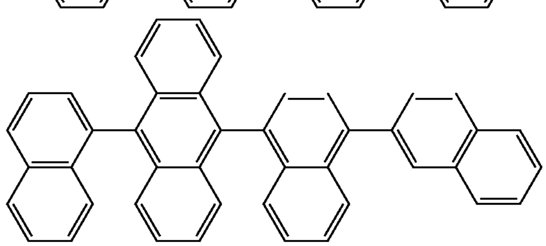
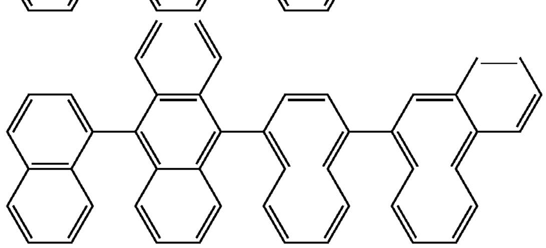
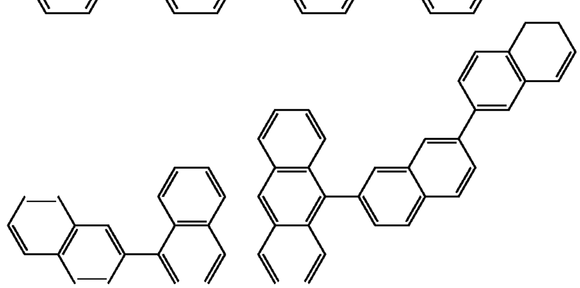
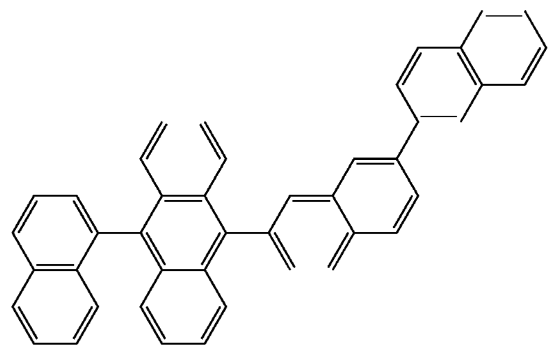
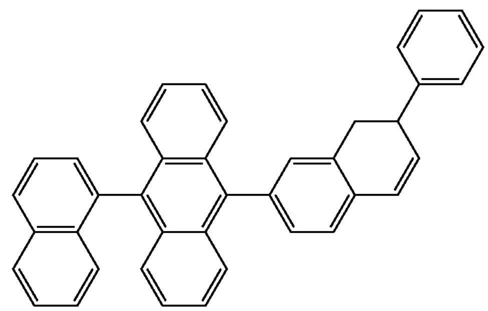
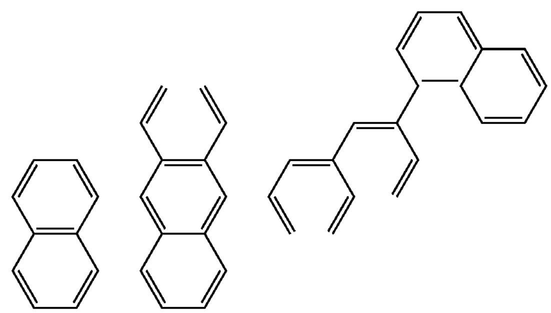
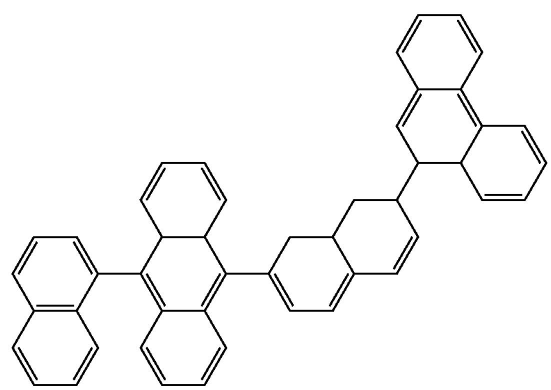
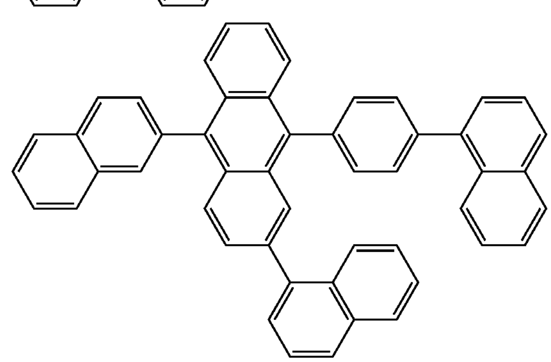

-continued

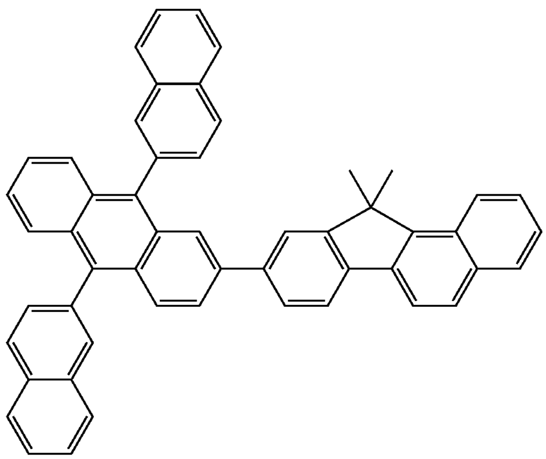

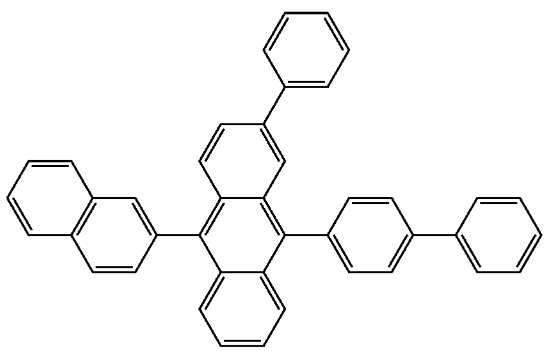

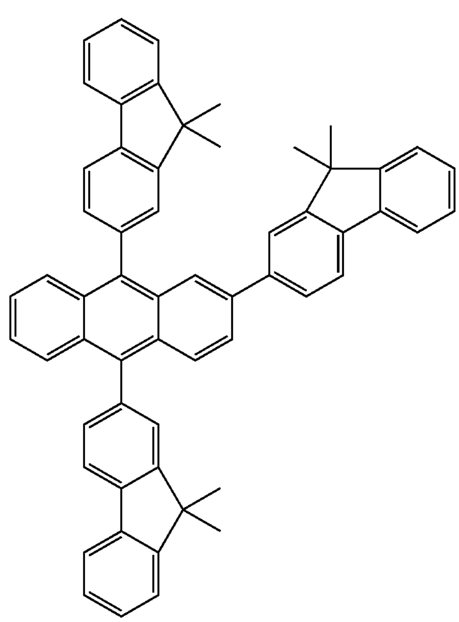

-continued

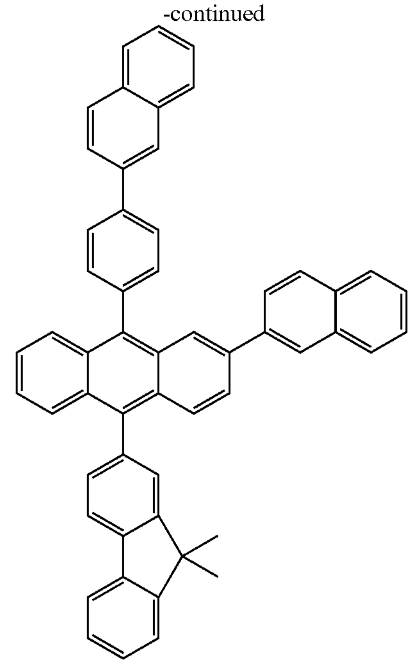

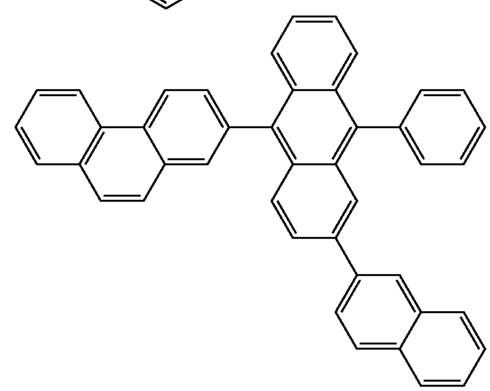

In some embodiments, as the host, an anthracene-based compound represented by Formula 401 below may be used:

<Formula 401>

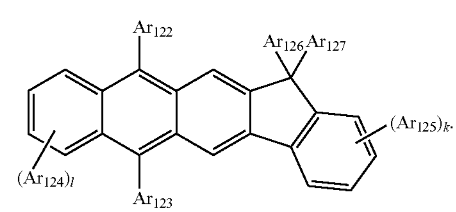

In Formula 401 above, detailed descriptions of $Ar_{122}$ to $Ar_{125}$ are as referred to in the description of $Ar_{113}$ of Formula 400 above.

In Formula 401 above, $Ar_{126}$ and $Ar_{127}$ may each independently be a $C_1$-$C_{10}$ alkyl group (for example, a methyl group, an ethyl group, or a propyl group).

In Formula 401, k and l may each independently be an integer of 0 to 4. For example, the k and l may be 0, 1, or 2.

For example, the anthracene-based compound represented by Formula 401 may be one of the compounds below:

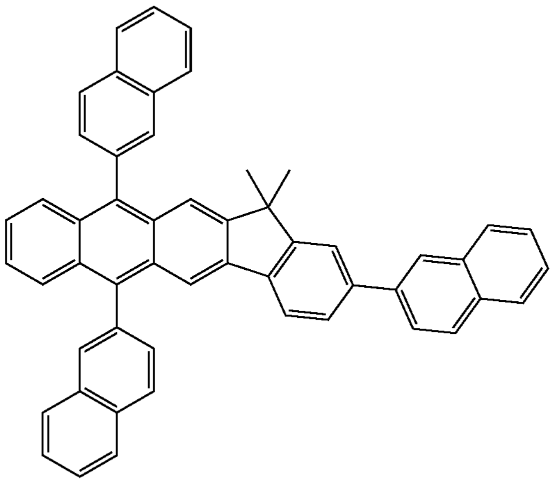

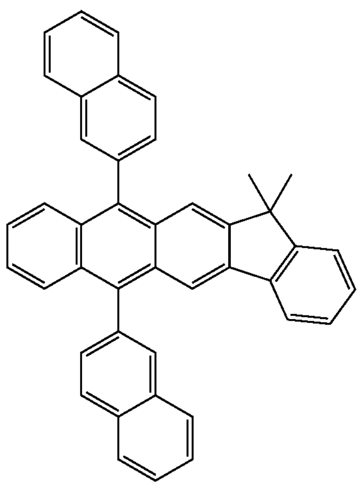

-continued

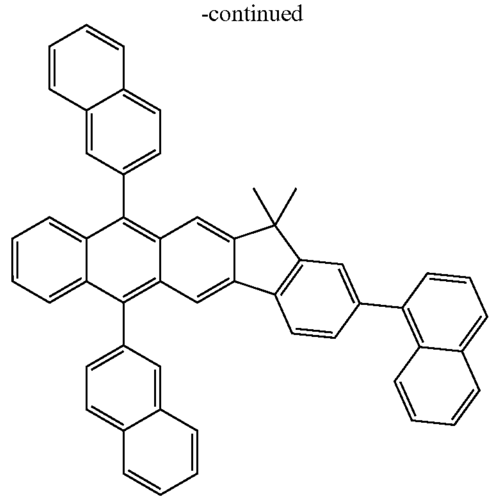

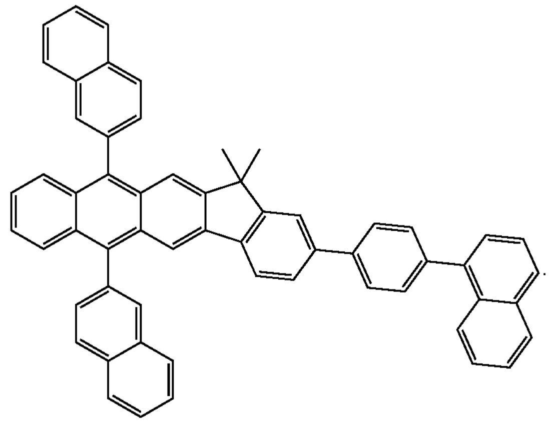 [SMILES: CC1(C)c2cc(-c3ccc(-c4cccc5ccccc45)cc3)ccc2-c2cc3c(-c4ccc5ccccc5c4)c4ccccc4c(-c4ccc5ccccc5c4)c3cc21]

The dopant may be at least one dopant selected from a fluorescent dopant and a phosphorescent dopant. The phosphorescent dopant may be an organic metal complex including Ir, Pt, Os, Re, Ti, Zr, Hf, or a combination of two or more of these.

Examples of blue dopants are $F_2$Irpic, $(F_2ppy)_2$Ir(tmd), Ir$(dfppz)_3$, ter-fluorene (fluorene), 4,4'-bis(4-diphenyl aminostyryl)biphenyl (DPAVBi), 2,5,8,11-tetra-tert-butyl perylene (TBPe), and 4,4'-bis(2,2-diphenyl vinyl)-1,1'-biphenyl (DPVBi):

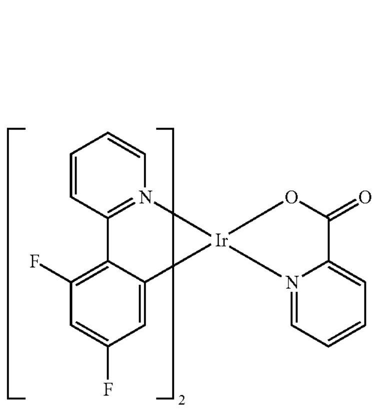

$F_2$Irpic

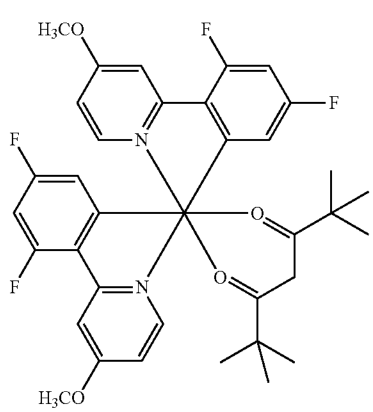

$(F_2ppy)_2$Ir(tmd)

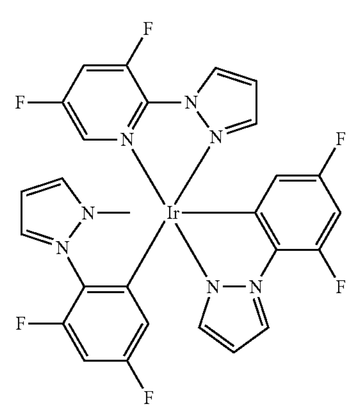

Ir$(dfppz)_3$

-continued
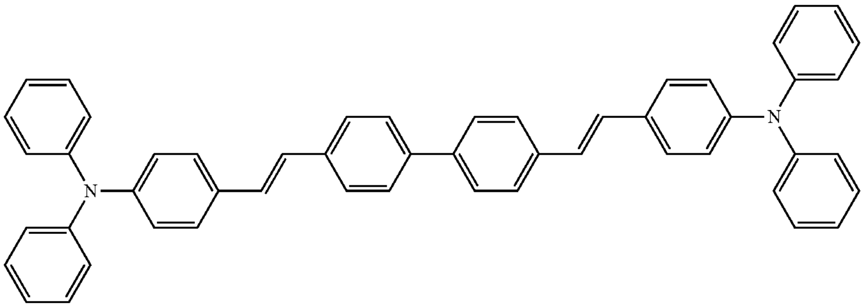
DPAVBi
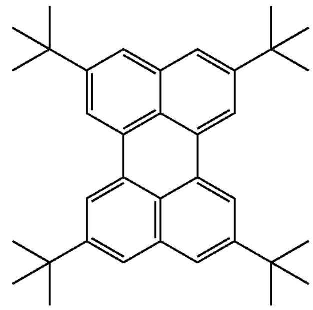
TBPe
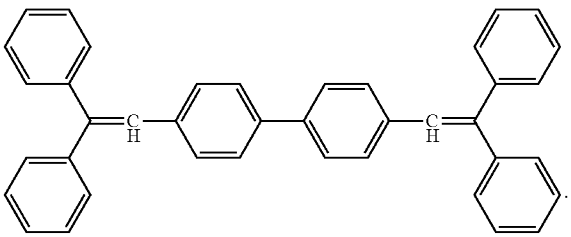
DPVBi
For example, the compounds below may be used as the red dopant. In some embodiments, DCM or DCJTB shown below may be used as the red dopant:
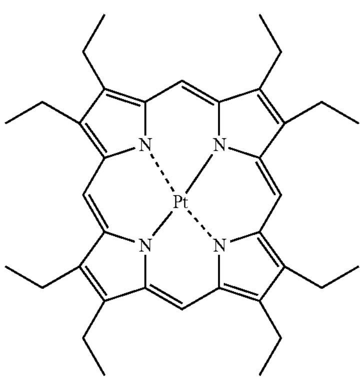
PtOEP
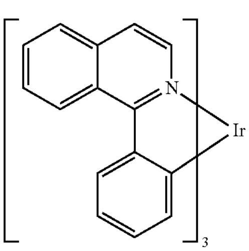
Ir(piq)$_3$
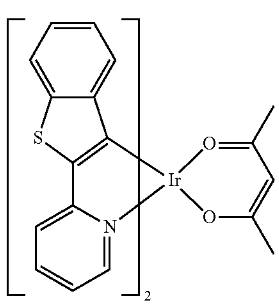
Btp$_2$Ir(acac)
-continued
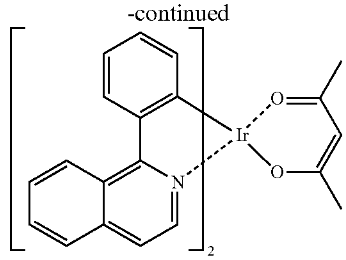
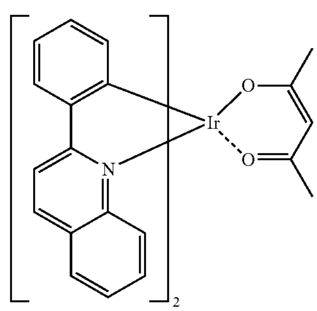
Ir(pq)$_2$(acac)
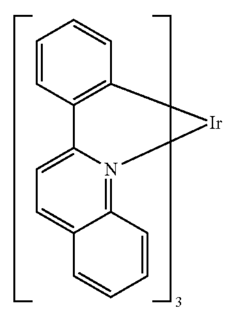
Ir(2-phq)$_3$
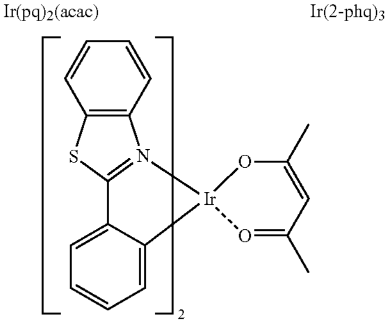
Ir(BT)$_2$(acac)

-continued
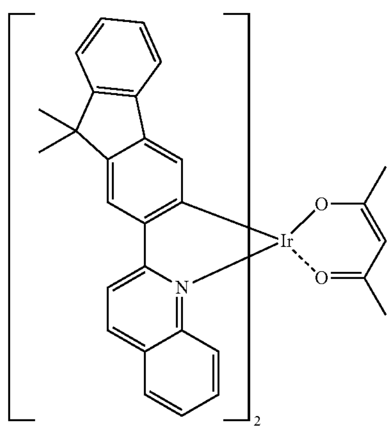
Ir(flq)$_2$(acac)
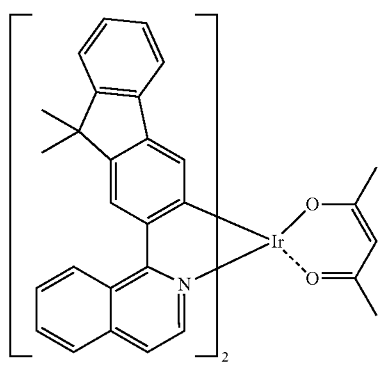
Ir(fliq)$_2$(acac)
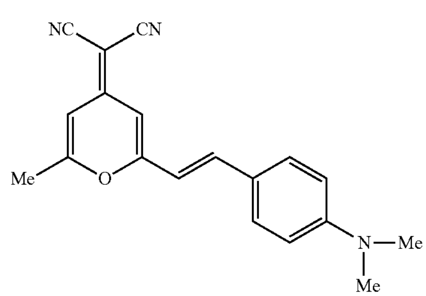
DCM
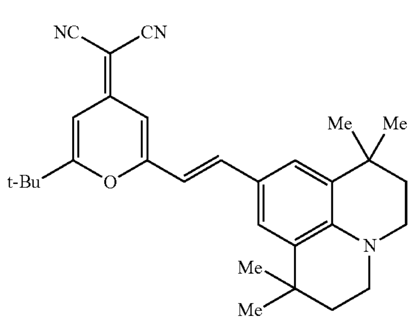
DCJTB
-continued
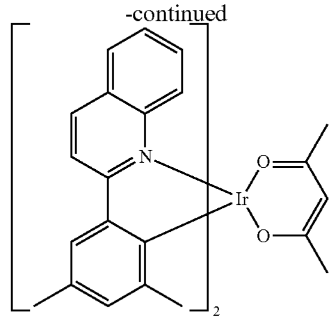
For example, the compounds below may be used as the green dopant. In some embodiments, C545T below may be used:
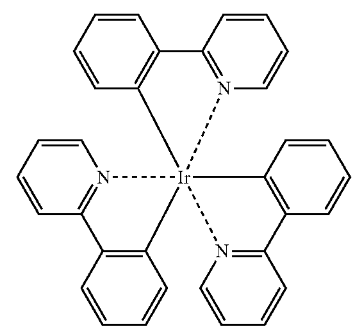
Ir(ppy)$_3$
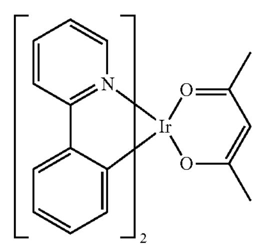
Ir(ppy)$_2$(acac)
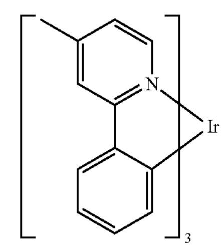
Ir(mppy)$_3$
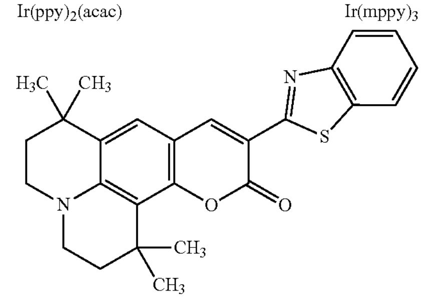
C545T
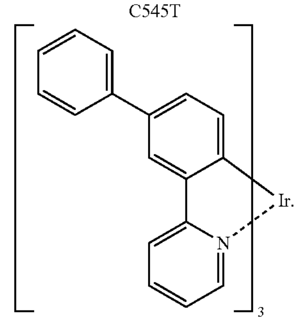

A thickness of the EML may be about 100 Å to about 1000 Å, for example, about 200 Å to about 600 Å. Maintaining the thickness of the EML within these ranges may help provide the EML with good light-emitting ability without a substantial increase in driving voltage.

Then, the ETL may be formed on the EML by any of a variety of methods, for example, vacuum deposition, spin coating, or casting. When the ETL is formed using vacuum deposition or spin coating, the deposition and coating conditions may be similar to those for the formation of the HIL, though the deposition and coating conditions may vary according to a material that is used to form the ETL. The material of the ETL may be the compound according to an embodiment or any material that can stably transport electrons injected from an electron-injecting electrode (cathode). Exemplary of materials for forming the ETL include quinoline derivatives, such as tris(8-quinolinorate)aluminum ($Alq_3$), TAZ, BAlq, beryllium bis(benzoquinolin-10-olate) ($Bebq_2$), 9,10-di(naphthalene-2-yl)anthracene (ADN), Compound 201, and Compound 202:

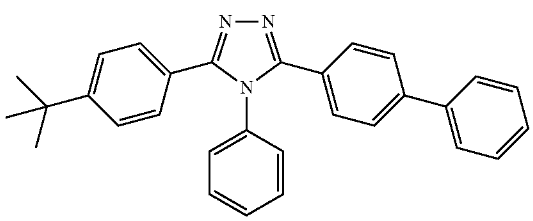

TAZ

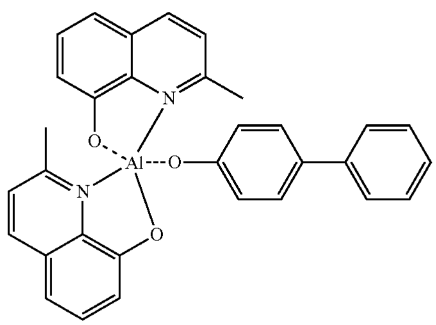

BAlq

<Compound 201>

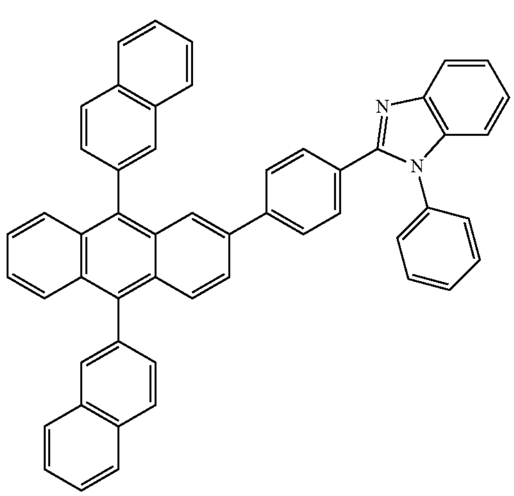

-continued

<Compound 202>

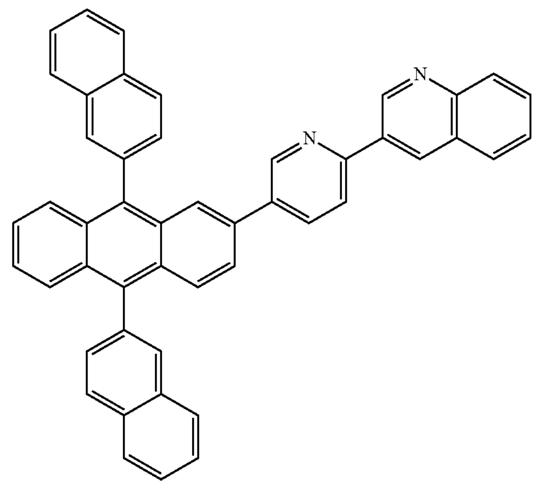

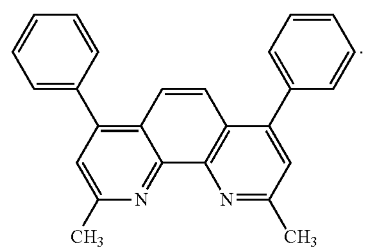

BCP

A thickness of the ETL may be from about 100 Å to about 1,000 ÅÅ and in some embodiments, may be from about 150 Å to about 500 Å. Maintaining the thickness of the ETL within these ranges may help provide the ETL with satisfactory electron-transporting ability without a substantial increase in driving voltage.

In some embodiments, the ETL may further include a metal-containing material in addition to an electron-transporting organic compound.

The metal-containing material may include a Li complex. Examples of the Li complex are lithium quinolate (LiQ) and Compound 203 below:

<Compound 203>

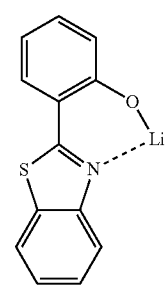

<LiQ>

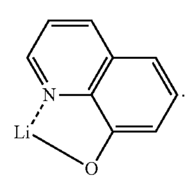

Also, the EIL, which has a function of facilitating an injection of electrons from the cathode, may be layered on the ETL. Any suitable electron-injecting material may be used to form the EIL.

EIL-forming materials such as, for example, LiF, NaCl, CsF, $Li_2O$, and BaO may be used. The deposition and coating conditions for forming the EIL may be similar to those for the formation of the HIL, though the deposition and coating conditions may vary according to the compound that is used to form the EIL.

A thickness of the EIL may be from about 1 Å to about 100 Å, and in some embodiments, may be from about 3 Å to about 90 Å. Maintaining the thickness of the EIL within these ranges may help provide the EIL with satisfactory electron-injecting ability without a substantial increase in driving voltage.

The second electrode 17 is disposed on the organic layer 15. The second electrode 17 may be a cathode, for example, an electron-injecting electrode, wherein a material for forming the second electrode 17 may be a metal, an alloy, and an electro-conductive compound, which may have a low work function, or a mixture thereof. In this regard, the second electrode 17 may be formed of lithium (Li), magnesium (Mg), aluminum (Al), aluminum lithium (Al—Li), calcium (Ca), magnesium-indium (Mg—In), or magnesium-silver (Mg—Ag), and may be formed as a thin film type transmission electrode. In some embodiments, to manufacture a top-emission light-emitting device, the transmission electrode may be formed of indium tin oxide (ITO) or indium zinc oxide (IZO).

When a phosphorescent dopant is used in the EML, a hole-blocking layer (HBL) may be formed between the HTL and EML or the H-functional layer and EML by using, for example, vacuum deposition, spin coating, casting, or LB deposition, in order to prevent diffusion of triplet excitons or holes into the ETL. When the HBL is formed using vacuum deposition or spin coating, the conditions for deposition and coating may be similar to those for the formation of the HIL, although the conditions for deposition and coating may vary according to the material that is used to form the HBL. A hole-blocking material may be used. Exemplary hole-blocking materials include oxadiazole derivatives, triazole derivatives, and phenanthroline derivatives. In some embodiments, BCP shown below may be used as a hole-blocking material:

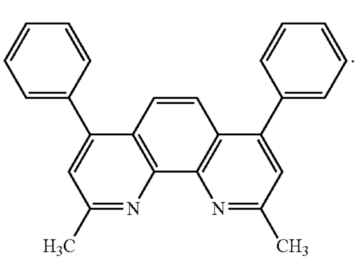

BCP

A thickness of the HBL may be about 20 Å to about 1000 Å, and in some embodiments, may be about 30 Å to about 300 Å. Maintaining the thickness of the HBL within these ranges may help provide the HBL with improved hole blocking ability without a substantial increase in driving voltage.

A light-emitting material represented by any one of Formulae 1A to 1E may have a wide energy gap, and the triplet energy of the light-emitting material may be suitable for phosphorescent light emission. Furthermore, an organic light-emitting device including the light-emitting material may show a high efficiency characteristic. The hole-transporting material represented by any one of Formulae 2(1) and 2(2) has a structure in which a second benzene is bonded to a meta position of a first benzene that is bonded to the carbazole-based ring, based on a first carbon bonded to the carbazole-based ring (see Formulae 2(1)' and 2(2)').

<Formula 2(1)'>

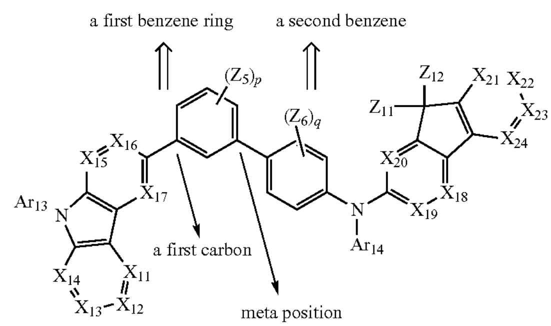

<Formula 2(2)'>

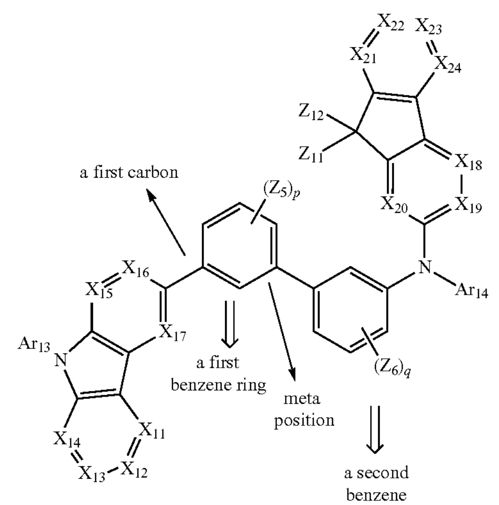

Figure 2:
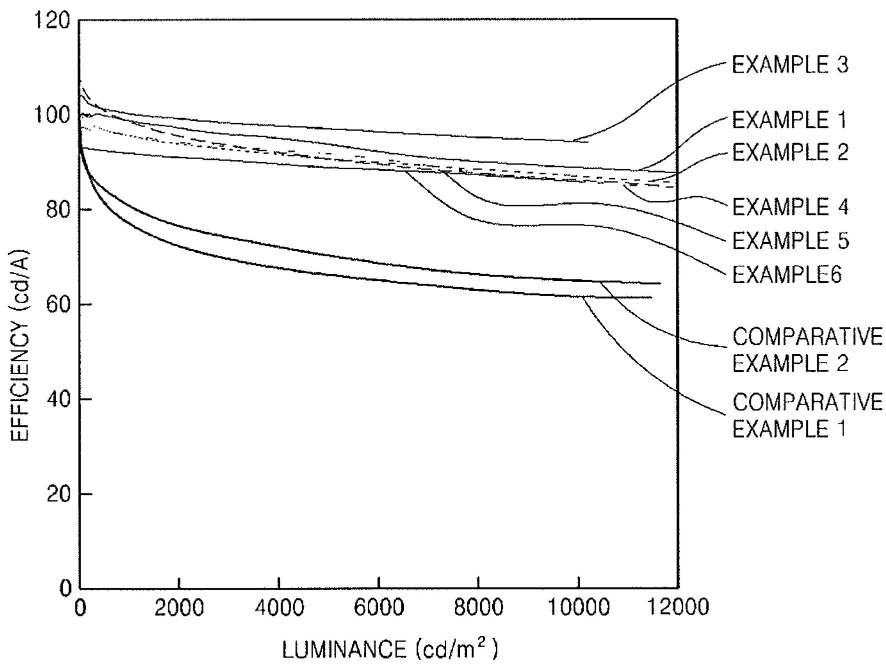
FIGS. 2 and 3 illustrate graphs of efficiency versus brightness of organic light-emitting devices according to the embodiments of Examples 1 to 12 as well as Comparative Examples 1 to 4.
Figure 3:
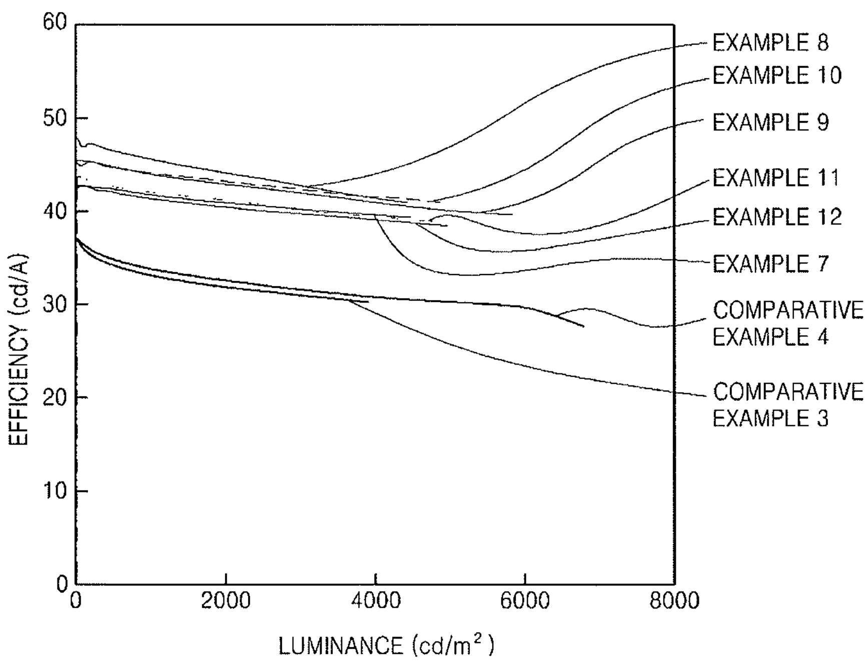

Compared to a structure in which the second benzene is bonded to a para position of the first benzene that is bonded to the carbazole-based ring, based on the first carbon bonded to the carbazole-based ring, a hole-transporting material represented by any one of Formulae 2(1) and 2(2) may have lower highest occupied molecular orbital (HOMO) energy level (based on the measured value) and slower hole mobility. Accordingly, hole mobility may generally be faster than electron mobility, and a balance between hole mobility and electron mobility may be achieved in an EML of an organic light-emitting device including a compound represented by any one of Formulae 2(1) and 2(2) in a hole-transporting region between the anode and the EML. Also, the compound represented by any one of Formulae 2(1) and 2(2) may block the leakage of electrons injected from the second electrode (cathode) from the EML to the HTL. Accordingly, including a compound represented by any one of Formulae 2(1) and 2(2) in the hole-transporting region may help provide the organic light-emitting device with high efficiency and a long lifespan An organic light-emitting device including a light-emitting material represented by any one of Formulae 1A to 1E above and a hole-transporting material represented by any one of Formulae 2(1) and 2(2) above includes a suitable material for a phosphorescent light emission as a host to form excitons in the EML, which may show a high efficiency characteristic, and electrons leaked from the EML to the HTL may be reduced such that most excitons formed in the EML may contribute to light emission. Accordingly, even if the driving voltage of the organic light-emitting device increases, a decrease in efficiency is relative small (because a roll-off, i.e., an efficiency decrease at high brightness levels, does not occur) and the organic light-emitting device may exhibit an efficiency versus brightness similar to those of Examples 1 to 12 as shown in the graphs of FIGS. 2 and 3.

Accordingly, the organic light-emitting device including the light-emitting material represented by any one of Formulae 1 and 2 above and the hole-transporting material represented by any one of Formulae 2(1) and 2(2) may show low driving voltage, high efficiency, and high color purity.

In an embodiment, the EML including the light-emitting material represented by any one of Formulae 1 and 2 and the HTL including the hole-transporting material represented by any one of Formulae 2(1) and 2(2) may contact each other.

As used herein, specific examples of an unsubstituted $C_1$-$C_{60}$ alkyl group (or the $C_1$-$C_{60}$ alkyl group) include a linear or a branched $C_1$-$C_{60}$ alkyl group such as methyl, ethyl, propyl, iso-butyl, sec-butyl, pentyl, iso-amyl, and hexyl, and a substituted $C_1$-$C_{60}$ alkyl group is the unsubstituted $C_1$-$C_{60}$ alkyl group, wherein one or more of hydrogen atoms of the unsubstituted $C_1$-$C_{60}$ alkyl group are substituted with deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_1$-$C_{60}$ fluoroalkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, —N($Q_{11}$)($Q_{12}$), and —Si($Q_{13}$)($Q_{14}$)($Q_{15}$) (wherein, $Q_{11}$ to $Q_{15}$ are each independently selected from the group consisting of hydrogen, a $C_1$-$C_{60}$ alkyl group, a $C_2$-$C_{60}$ alkenyl group, a $C_2$-$C_{60}$ alkynyl group, a $C_6$-$C_{60}$ aryl group, and a $C_2$-$C_{60}$ heteroaryl group).

As used herein, an unsubstituted $C_1$-$C_{60}$ alkoxy group (or the $C_1$-$C_{60}$ alkoxy group) has a formula of —OA (wherein, A is the unsubstituted $C_1$-$C_{60}$ alkyl group as described above), and specific examples of the unsubstituted $C_1$-$C_{60}$ alkoxy group include methoxy, ethoxy, and isopropyloxy, and at least one hydrogen atom of the alkoxy groups may be substituted with the substituents described above in conjunction with the substituted $C_1$-$C_{60}$ alkyl group.

As used herein, an unsubstituted $C_2$-$C_{60}$ alkenyl group (or the $C_2$-$C_{60}$ alkenyl group) is a hydrocarbon chain having a carbon-carbon double bond in the center or at a terminal of the unsubstituted $C_2$-$C_{60}$ alkyl group. Examples of the unsubstituted $C_2$-$C_{60}$ alkenyl group are ethenyl, propenyl, and butenyl. At least one hydrogen atom in the unsubstituted $C_2$-$C_{60}$ alkenyl group may be substituted with the substituents described above in conjunction with the substituted $C_1$-$C_{60}$ alkyl group.

As used herein, an unsubstituted $C_2$-$C_{60}$ alkynyl group (or a $C_2$-$C_{60}$ alkynyl group) is a $C_2$-$C_{60}$ alkyl group having at least one carbon-carbon triple bond in the center or at a terminal thereof. Examples of the unsubstituted $C_2$-$C_{60}$ alkynyl group are an ethynyl group and a propynyl group. At least one hydrogen atom in the unsubstituted $C_2$-$C_{60}$ alkynyl group may be substituted with those substituents described above in conjunction with the substituted $C_1$-$C_{60}$ alkyl group.

As used herein, an unsubstituted $C_6$-$C_{60}$ aryl group is a monovalent group having a carbocyclic aromatic system having 6 to 60 carbon atoms including at least one aromatic ring, and an unsubstituted $C_6$-$C_{60}$ arylene group is a divalent group having a carbocyclic aromatic system having 6 to 60 carbon atoms including at least one aromatic ring. When the unsubstituted $C_6$-$C_{60}$ aryl group and the unsubstituted $C_6$-$C_{60}$ arylene group include at least two rings, two or more rings may be fused to each other. At least one hydrogen atom of the unsubstituted $C_6$-$C_{60}$ aryl group and the unsubstituted $C_6$-$C_{60}$ arylene group may be substituted with those substituents described above in conjunction with the substituted $C_1$-$C_{60}$ alkyl group.

Examples of a substituted or unsubstituted $C_6$-$C_{60}$ aryl group include a phenyl group, a $C_1$-$C_{10}$ alkyl phenyl group (for example, an ethyl phenyl group), a $C_1$-$C_{10}$ alkyl biphenyl group (for example, an ethyl biphenyl group), a halophenyl group (for example, an o-, m-, and p-fluorophenyl group and a dichlorophenyl group), a dicyanophenyl group, a trifluoromethoxy phenyl group, an o-, m-, and p-tolyl group, an o-, m-, and p-cumenyl group, a mesityl group, a phenoxy phenyl group, an (α,α-dimethyl benzene)phenyl group, an (N,N'-dimethyl)aminophenyl group, an (N,N'-diphenyl)aminophenyl group, a pentalenyl group, an indenyl group, a naphthyl group, a halonaphthyl group (for example, a fluoronaphthyl group), a $C_1$-$C_{10}$ alkyl naphthyl group (for example, a methyl naphthyl group), a $C_1$-$C_{10}$ alkoxy naphthyl group (for example, a methoxy naphthyl group), an anthracenyl group, an azulenyl group, an acenaphthylenyl group, a phenalenyl group, a fluorenyl group, an anthraquinolyl group, a methyl anthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coroneryl group, a trinaphthylenyl group, a heptaphenyl group, a heptacenyl group, a pyranthrenyl group, an ovalenyl group, and a spiro-fluorenyl group, and examples of the substituted $C_6$-$C_{60}$ aryl group may be inferred based on the examples of the unsubstituted $C_6$-$C_{60}$ aryl group and the substituents described above in conjunction with the substituted $C_1$-$C_{60}$ alkyl group. Examples of the substituted or unsubstituted $C_6$-$C_{60}$ arylene group may be inferred based on the examples of the substituted or unsubstituted $C_6$-$C_{60}$ aryl group.

As used herein, an unsubstituted $C_2$-$C_{60}$ heteroaryl group is a monovalent group having a system formed of at least one aromatic ring that includes at least one heteroatom selected from N, O, P, and S as ring-forming atoms and carbon atoms as other ring atoms, and an unsubstituted $C_2$-$C_{60}$ heteroarylene group is a divalent group having a system formed of at least one aromatic ring that includes at least one heteroatom selected from N, O, P, and S as ring-forming atoms and carbon atoms as other ring atoms. Here, when the unsubstituted $C_2$-$C_{60}$ heteroaryl group and the unsubstituted $C_2$-$C_{60}$ heteroarylene group include two or more rings, the two or more rings may be fused to each other. At least one hydrogen atom of the unsubstituted $C_2$-$C_{60}$ heteroaryl group and the unsubstituted $C_2$-$C_{60}$ heteroarylene group may be substituted with those substituents described above in conjunction with the substituted $C_1$-$C_{60}$ alkyl group.

Examples of the unsubstituted $C_2$-$C_{60}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, an imidazopyrimidinyl group, a furanyl group, a thiophenyl group, a benzofuranyl group, a benzothiophenyl group, a dibenzofuranyl group, and a dibenzothiophenyl group. Examples of the unsubstituted $C_2$-$C_{60}$ heteroarylene group may be inferred based on the examples of a substituted or unsubstituted $C_2$-$C_{60}$ arylene group.

A substituted or unsubstituted $C_6$-$C_{60}$ aryloxy group represents —$OA_2$ (where, $A_2$ is a substituted or unsubstituted $C_6$-$C_{60}$ aryl group), and a substituted or unsubstituted $C_6$-$C_{60}$ arylthio group represents —$SA_3$ (where, $A_3$ is a substituted or unsubstituted $C_6$-$C_{60}$ aryl group).

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Example 1

As a substrate and an anode, a ITO (7 nm)/Ag (100 nm)/ITO (7 nm) glass substrate was cut into a size of 50 mm×50 mm×0.7 mm, and then ultrasonically washed using isopropyl alcohol and ultrapure water for 5 minutes, followed by irradiation of UV and exposure to ozone for cleaning for about 30 minutes. The glass substrate was then loaded onto a vacuum deposition device.

On an ITO layer, which is an anode, Compound B below was vacuum deposited to form an HIL having a thickness of 1200 Å, and Compound 6-12 was deposited on the HIL having a thickness of 350 Å to form an HTL. Compound 226 (host) and Compound D(1) (dopant) below were vacuum deposited in a weight ratio of 10:1 to form an EML having a thickness of 400 Å.

Then, Compound 201 and LiQ were vacuum deposited on the EML in a weight ratio of 1:1 to form an ETL having a thickness of 360 Å, then LiQ was deposited on the ETL to form an EIL having a thickness of 5 Å, and then Mg—Al was deposited on the EIL to form a second electrode (cathode) having a thickness of 130 Å to manufacture an organic light-emitting device.

<Compound D(1)>

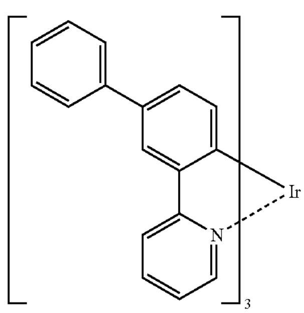

-continued

<Compound B>

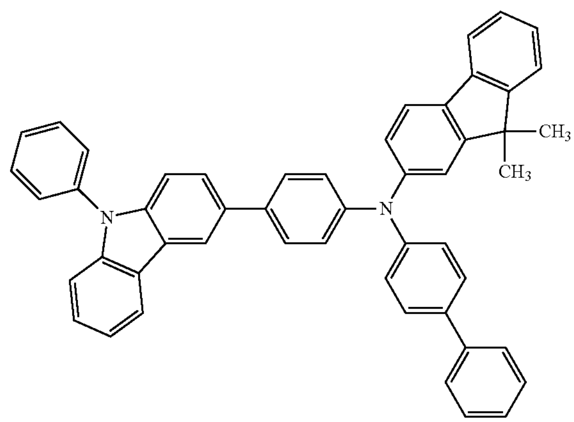

Example 2

An organic light-emitting device was manufactured in the same manner as in Example 1 above, except for using Compound 6-132 instead of Compound 6-12 when forming an HTL, and using Compound 119 instead of Compound 226 when forming an EML.

Example 3

An organic light-emitting device was manufactured in the same manner as in Example 1 above, except for using Compound 6-84 instead of Compound 6-12 when forming an HTL, and using Compound 103 instead of Compound 226 when forming an EML.

Example 4

An organic light-emitting device was manufactured in the same manner as in Example 1 above, except for using Compound 6-36 instead of Compound 6-12 when forming an HTL, and using Compound 112 instead of Compound 226 when forming an EML.

Example 5

An organic light-emitting device was manufactured in the same manner as in Example 1 above, except for using Compound 6-4 instead of Compound 6-12 when forming an HTL, and using Compound 110 instead of Compound 226 when forming an EML.

Example 6

An organic light-emitting device was manufactured in the same manner as in Example 1 above, except for using Compound 6-10 instead of Compound 6-12 when forming an HTL, and using Compound 221 instead of Compound 226 when forming an EML.

Example 7

The same substrate as in Example 1 was used and the Compound B was deposited on the ITO layer, which is an anode, to form an HIL having a thickness of 1200 Å, and then Compound 6-12 was deposited on the HIL having a thickness of 750 Å to form an HTL.

Compound 222 (host) and Compound D(2)(dopant) below were vacuum deposited on the HTL in a weight ratio of 10:0.02 to form an EML having a thickness of 400 Å.

Then, Compound 201 and LiQ were vacuum deposited on the EML in a weight ratio of 1:1 to form an ETL having a thickness of 360 Å, then LiQ was deposited on the ETL to form an EIL having a thickness of 5 Å, and then Mg—Al was deposited on the EIL to form a second electrode (cathode) having a thickness of 130 Å, thereby manufacturing an organic light-emitting device.

<Compound D(2)>

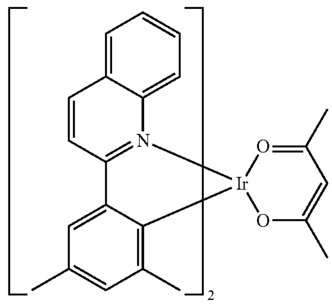

Example 8

An organic light-emitting device was manufactured in the same manner as in Example 7 above, except for using Compound 6-132 instead of Compound 6-12 when forming an HTL, and using Compound 214 instead of Compound 222 when forming an EML.

Example 9

An organic light-emitting device was manufactured in the same manner as in Example 7 above, except for using Compound 6-84 instead of Compound 6-12 when forming an HTL, and using Compound 235 instead of Compound 222 when forming an EML.

Example 10

An organic light-emitting device was manufactured in the same manner as in Example 7 above, except for using Compound 6-36 instead of Compound 6-12 when forming an HTL, and using Compound 218 instead of Compound 222 when forming an EML.

Example 11

An organic light-emitting device was manufactured in the same manner as in Example 7 above, except for using Compound 6-4 instead of Compound 6-12 when forming an HTL, and using Compound 234 instead of Compound 222 when forming an EML.

Example 12

An organic light-emitting device was manufactured in the same manner as in Example 7 above, except for using Compound 6-10 instead of Compound 6-12 when forming an HTL, and using Compound 236 instead of Compound 222 when forming an EML.

Comparative Example 1

An organic light-emitting device was manufactured in the same manner as in Example 1, except for using Compound A instead of Compound 6-12 when forming an HTL.

<Compound A>

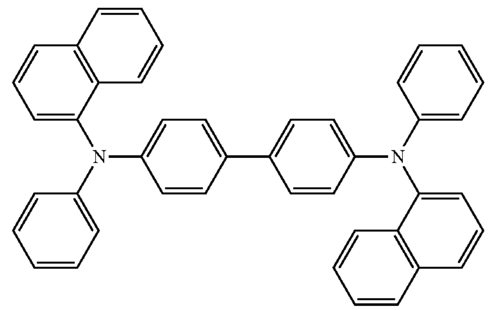

Comparative Example 2

An organic light-emitting device was manufactured in the same manner as in Example 1, except for using Compound B instead of Compound 6-12 when forming an HTL.

<Compound B>

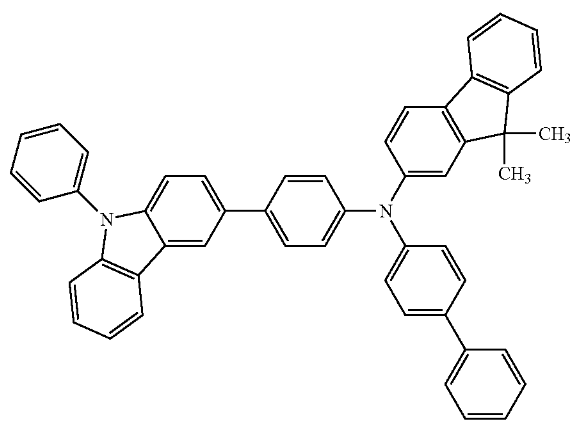

Comparative Example 3

An organic light-emitting device was manufactured in the same manner as in Example 7, except for using Compound A instead of Compound 6-12 when forming an HTL.

Comparative Example 4

An organic light-emitting device was manufactured in the same manner as in Example 7, except for using Compound B instead of Compound 6-12 when forming an HTL.

Evaluation Example

Driving voltage, current density, efficiency, and color purity of the organic light-emitting devices of Examples 1 to 12 and Comparative Examples 1 to 4 were evaluated by supplying power from a voltage and current meter (Kethley SMU 236) and using a luminance meter (PR650 Spectroscan Source Measurement Unit, available from PhotoResearch). The organic light-emitting devices of Examples 1 to 6 and Comparative Examples 1 and 2 were evaluated at 9000 cd/m$^2$, and the organic light-emitting devices of Examples 7 to 12 and Comparative Examples 3 and 4 were evaluated at 3000 cd/m$^2$. The results are shown in Table 1 below.

TABLE 1

| | Driving voltage (V) | Current density (mA/cm$^2$) | Efficiency (cd/A) | Power (lm/W) | Color coordinates CIE_x | Color coordinates CIE_y |
|---|---|---|---|---|---|---|
| Example 1 | 3.8 | 10.1 | 89.3 | 74.2 | 0.282 | 0.686 |
| Example 2 | 4.3 | 10.3 | 87.6 | 63.9 | 0.272 | 0.698 |
| Example 3 | 3.7 | 9.5 | 94.8 | 80.6 | 0.263 | 0.704 |
| Example 4 | 4.3 | 10.4 | 86.9 | 63.6 | 0.230 | 0.724 |
| Example 5 | 4.1 | 10.4 | 86.9 | 65.9 | 0.256 | 0.711 |
| Example 6 | 3.9 | 10.4 | 86.7 | 70.0 | 0.276 | 0.693 |
| Example 7 | 4.6 | 7.4 | 40.4 | 27.5 | 0.659 | 0.338 |
| Example 8 | 4.7 | 7.0 | 43.0 | 29.1 | 0.656 | 0.343 |
| Example 9 | 4.8 | 7.2 | 42.0 | 27.2 | 0.652 | 0.347 |
| Example 10 | 4.7 | 7.1 | 42.4 | 28.2 | 0.651 | 0.347 |
| Example 11 | 4.7 | 7.5 | 40.2 | 26.6 | 0.656 | 0.342 |
| Example 12 | 4.7 | 7.6 | 39.7 | 26.6 | 0.653 | 0.346 |
| Comparative Example 1 | 3.8 | 14.4 | 62.4 | 51.7 | 0.233 | 0.732 |
| Comparative Example 2 | 3.6 | 13.7 | 65.6 | 57.2 | 0.245 | 0.713 |
| Comparative Example 3 | 4.5 | 9.7 | 30.9 | 21.5 | 0.662 | 0.337 |
| Comparative Example 4 | 4.4 | 9.5 | 31.6 | 22.4 | 0.652 | 0.346 |

Referring to Table 1 above, the organic light-emitting devices of Examples 1 to 12 have higher efficiency and excellent color purity characteristics than the organic light-emitting devices of Comparative Examples 1 to 4. Graphs of efficiency versus brightness for the organic light-emitting devices of Examples 1 to 12 and Comparative Examples 1 to 4 are shown in FIGS. 2 and 3.

By way of summation and review, an OLED may have a structure including an anode, a hole-transporting layer (HTL), an emission layer (EML), an electron-transporting layer (ETL), and a cathode, which may be sequentially stacked on a substrate. The HTL, the EML, and the ETL are organic thin films formed of organic compounds.

An operating principle of an OLED having the above-described structure may be described as follows. When a voltage is applied between the anode and the cathode, holes injected from the anode may move to the EML via the HTL, and electrons injected from the cathode may move to the EML via the ETL. Carriers such as the holes and the electrons may recombine in the EML to generate excitons. When the excitons drop from an excited state to a ground state, light may be emitted.

Provided is an organic light-emitting device including the presently disclosed light-emitting material in an emission layer, and the presently disclosed hole-transporting material in a hole-transporting region. The organic light-emitting device may have low driving voltage, high efficiency, high color purity, and a long lifespan.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device, comprising:

a first electrode;

a second electrode disposed opposite to the first electrode;

an emission layer disposed between the first electrode and the second electrode, the emission layer including at least one light-emitting material represented by any one of Formulae 1A to 1E:

<Formula 1A>

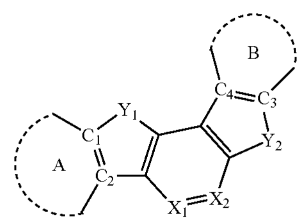

<Formula 1B>

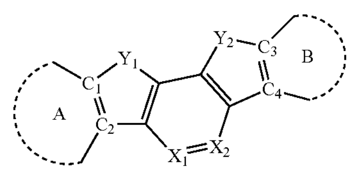

<Formula 1C>

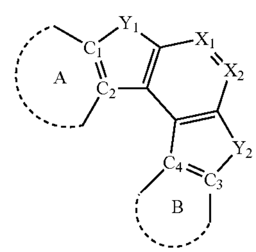

<Formula 1D>

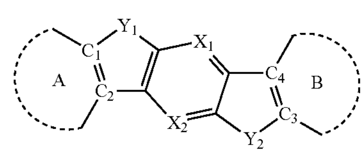

<Formula 1E>

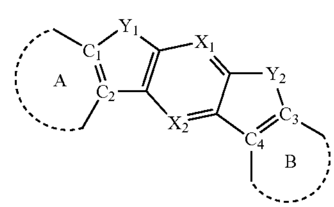

wherein, in Formulae 1A to 1E, ring A and ring B are each independently selected from i) a $C_6$-$C_{20}$ aromatic ring and a $C_2$-$C_{20}$ heteroaromatic ring; and ii) a $C_6$-$C_{20}$ aromatic ring and a $C_2$-$C_{20}$ heteroaromatic ring each substituted with at least one selected from deuterium, a halogen atom, a $C_1$-$C_{60}$ alkyl group, a $C_6$-$C_{60}$ aryl group, a $C_2$-$C_{60}$ heteroaryl group, and —N($Q_1$)($Q_2$) (wherein, $Q_1$ and $Q_2$ are each independently a $C_1$-$C_{60}$ alkyl group, a $C_6$-$C_{60}$ aryl group, or a $C_2$-$C_{60}$ heteroaryl group);

$C_1$ to $C_4$ each independently represent carbon atoms forming the ring A or the ring B;

$X_1$ is $CR_1$ or N; $X_2$ is $CR_2$ or N;

$R_1$ and $R_2$ are each independently selected from hydrogen, deuterium, a halogen atom, a $C_1$-$C_{60}$ alkyl group, a $C_6$-$C_{60}$ aryl group, a $C_2$-$C_{60}$ heteroaryl group, and —N($Q_1$)($Q_2$) (wherein, $Q_1$ and $Q_2$ are each independently a $C_1$-$C_{60}$ alkyl group, a $C_6$-$C_{60}$ aryl group, or a $C_2$-$C_{60}$ heteroaryl group), wherein $R_1$ and $R_2$ may connect to each other to selectively form a $C_6$-$C_{20}$ saturated ring or a $C_6$-$C_{20}$ unsaturated ring;

$Y_1$ is N-$(L_1)_{n1}$-$Ar_{11}$;

$Y_2$ is N-$(L_2)_{n2}$-$Ar_{12}$, O, S, C($R_{31}$)($R_{32}$), or Si($R_{33}$)($R_{34}$);

$L_1$ and $L_2$ are each independently selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted $C_2$-$C_{10}$ heterocycloalkylene group, a substituted or unsubstituted $C_2$-$C_{10}$ heterocycloalkenylene group, and a substituted or unsubstituted $C_2$-$C_{60}$ heteroarylene group;

n1 and n2 are each independently an integer of 0 to 3;

$Ar_{11}$ and $Ar_{12}$ are each independently selected from i) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and ii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

$R_{31}$ to $R_{34}$ are each independently selected from i) a $C_1$-$C_{60}$ alkyl group, a $C_2$-$C_{60}$ alkenyl group, a $C_2$-$C_{60}$ alkynyl group, and a $C_1$-$C_{60}$ alkoxy group;

ii) a $C_1$-$C_{60}$ alkyl group, a $C_2$-$C_{60}$ alkenyl group, a $C_2$-$C_{60}$ alkynyl group, and a $C_1$-$C_{60}$ alkoxy group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group each substituted with at least selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and a hole-transporting region disposed between the first electrode and the emission layer, the hole-transporting region including at least one hole-transporting material represented by Formula 2(2):

<Formula 2(2)>

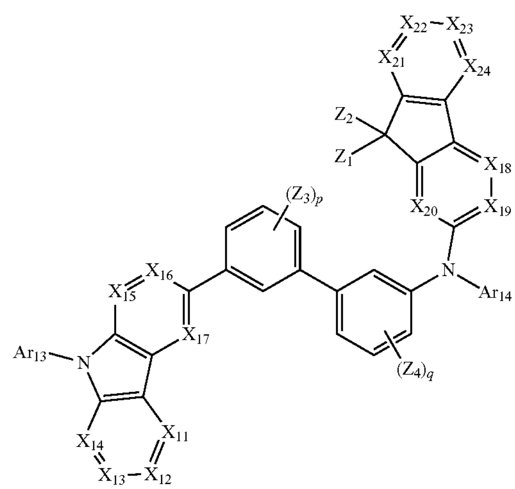

wherein, in Formula 2(2), $X_{11}$ is $CR_{11}$ or N; $X_{12}$ is $CR_{12}$ or N; $X_{13}$ is $CR_{13}$ or N; $X_{14}$ is $CR_{14}$ or N; $X_{15}$ is $CR_{15}$ or N; $X_{16}$ is $CR_{16}$ or N; $X_{17}$ is $CR_{17}$ or N; $X_{18}$ is $CR_{18}$ or N; $X_{19}$ is $CR_{19}$ or N; $X_{20}$ is $CR_{20}$ or N; $X_{21}$ is $CR_{21}$ or N; $X_{22}$ is $CR_{22}$ or N; $X_{23}$ is $CR_{23}$ or N; $X_{24}$ is $CR_{24}$ or N;

$Z_3$, $Z_4$, and $R_{11}$ to $R_{24}$ are each independently selected from i) hydrogen, deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

ii) a $C_1$-$C_{60}$ alkyl group, a $C_2$-$C_{60}$ alkenyl group, a $C_2$-$C_{60}$ alkynyl group, and a $C_1$-$C_{60}$ alkoxy group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group;

iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and v) —$N(Q_{11})(Q_{12})$, —$Si(Q_{13})(Q_{14})(Q_{15})$, and —$B(Q_{16})(Q_{17})$ (wherein, $Q_{11}$ to $Q_{17}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group);

provided that $Z_3$ is not an amino group, an amidino group, or —$N(Q_{11})(Q_{12})$, $Ar_{13}$ and $Ar_{14}$ are each independently selected from i) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and ii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

$Z_1$ and $Z_2$ are each independently selected from i) a $C_1$-$C_{60}$ alkyl group, a $C_2$-$C_{60}$ alkenyl group, a $C_2$-$C_{60}$ alkynyl group, and a $C_1$-$C_{60}$ alkoxy group;

ii) a $C_1$-$C_{60}$ alkyl group, a $C_2$-$C_{60}$ alkenyl group, a $C_2$-$C_{60}$ alkynyl group and a $C_1$-$C_{60}$ alkoxy group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and p and q are each independently an integer of 1 to 4, and wherein emission layer is a green phosphorescent emission layer or a red phosphorescent emission layer.

2. The organic light-emitting device as claimed in claim 1, wherein the ring A and the ring B are each independently selected from i) a $C_6$-$C_{20}$ aromatic ring and a $C_2$-$C_{20}$ heteroaromatic ring; and ii) a $C_6$-$C_{20}$ aromatic ring and a $C_2$-$C_{20}$ heteroaromatic ring each substituted with at least one selected from deuterium, a halogen atom, a $C_1$-$C_{10}$ alkyl group, a $C_6$-$C_{20}$ aryl group, a $C_2$-$C_{20}$ heteroaryl group, and —$N(Q_1)(Q_2)$ (wherein, $Q_1$ and $Q_2$ are each independently a $C_6$-$C_{10}$ aryl group).

3. The organic light-emitting device as claimed in claim 1, wherein the ring A and the ring B are each independently selected from i) benzene, naphthalene, anthracene, pyridine, pyrimidine, pyrazine, quinoline, and isoquinoline; and ii) benzene, naphthalene, anthracene, pyridine, pyrimidine, pyrazine, quinoline, and isoquinoline each substituted with at least one selected from deuterium, a methyl group, an ethyl group, a t-butyl group, an octyl group, a phenyl group, a naphthyl group, a pyridyl group, a pyrimidyl group, and —$N(Ph)_2$.

4. The organic light-emitting device as claimed in claim 1, wherein at least one of n1 and n2 is nonzero, and $L_1$ and $L_2$ are each independently selected from i) a phenylene group, a pyridylene group, a pyrimidylene group, a triazinylene group, and a quinazolinylene group;

ii) a phenylene group, a pyridylene group, a pyrimidylene group, a triazinylene group, and a quinazolinylene group each substituted with at least one selected from a phenyl group, a naphthyl group, and a pyridyl group;

iii) a phenylene group, a pyridylene group, a pyrimidylene group, a triazinylene group, and a quinazolinylene group each substituted with at least one selected from deuterium, a methyl group, an ethyl group, an n-octyl group, a methoxy group, an ethoxy group, a phenyl group, a naphthyl group, a pyridyl group, and a carbazole group.

5. The organic light-emitting device as claimed in claim 1, wherein $Ar_{11}$ and $Ar_{12}$ are each independently selected from i) a $C_6$-$C_{60}$ aryl group and a $C_2$-$C_{60}$ heteroaryl group; and ii) a $C_6$-$C_{60}$ aryl group and a $C_2$-$C_{60}$ heteroaryl group each substituted with at least one selected from a $C_1$-$C_{60}$ alkyl group, a $C_6$-$C_{60}$ aryl group, and a $C_2$-$C_{60}$ heteroaryl group.

6. The organic light-emitting device as claimed in claim 1, wherein $Ar_{11}$ and $Ar_{12}$ are each independently a compound represented by any one of Formulae H1 to H81:

H1

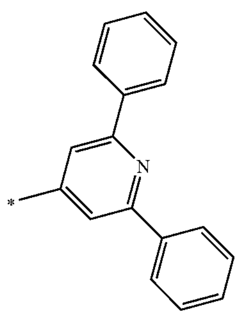

H2

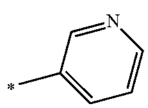

H3

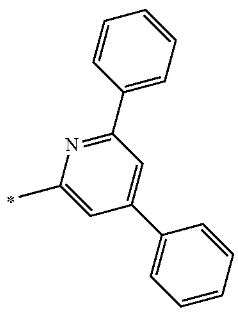

H4

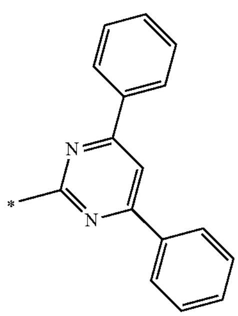

-continued

H5

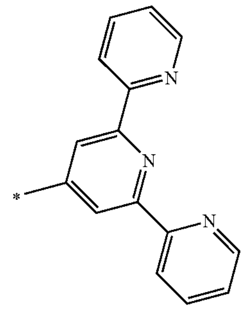

H6

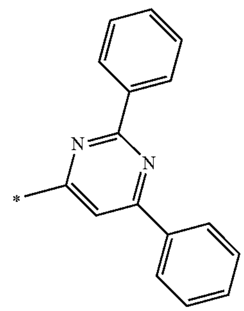

H7

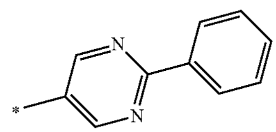

H8

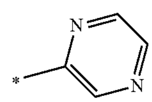

H9

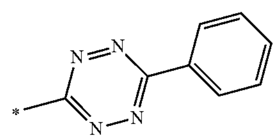

H10

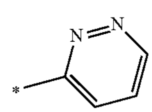

H11

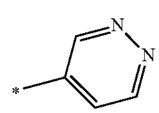

H12

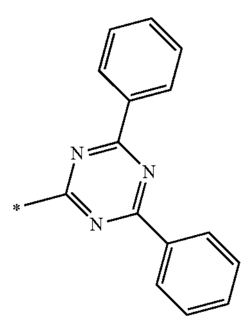

-continued
H13
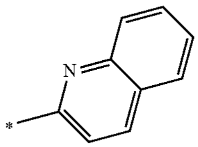
H14
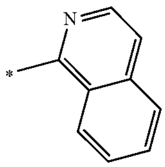
H15
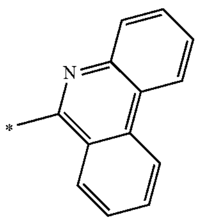
H16
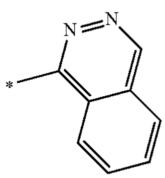
H17
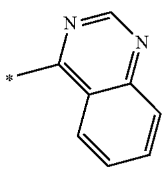
H18
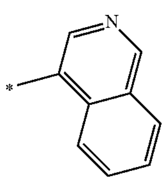
H19
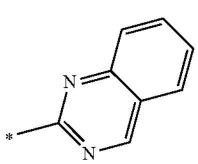
H20
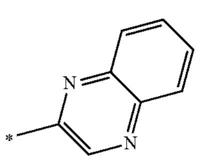
H21
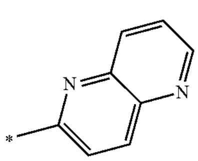
-continued
H22
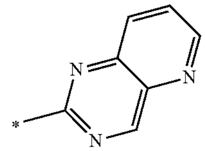
H23
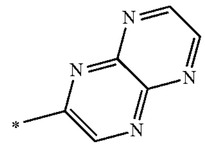
H24
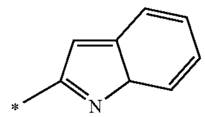
H25
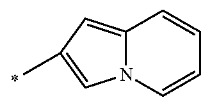
H26
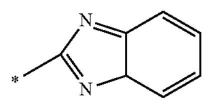
H27
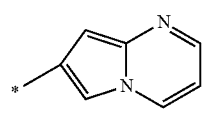
H28
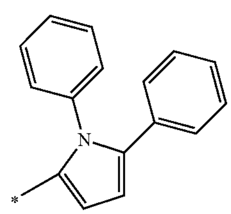
H29
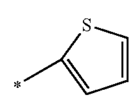
H30
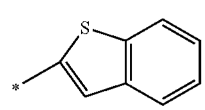
H31
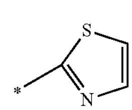
H32
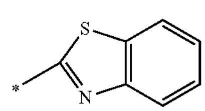
H33
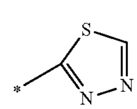

-continued
H34
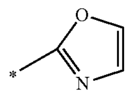
H35
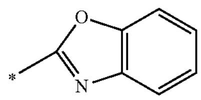
H36
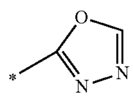
H37
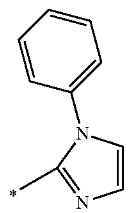
H38
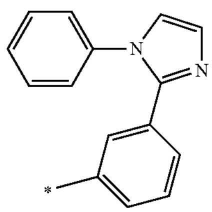
H39
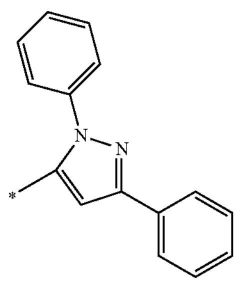
H40
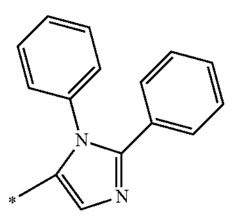
H41
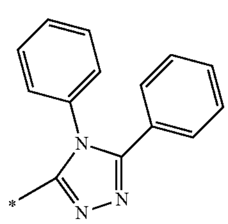
-continued
H42
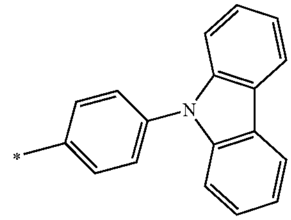
H43
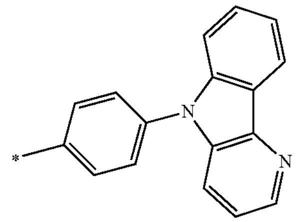
H44
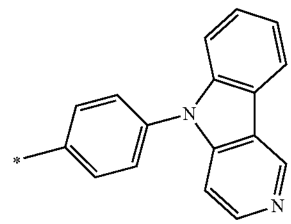
H45
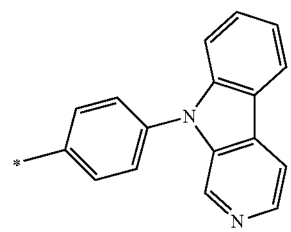
H46
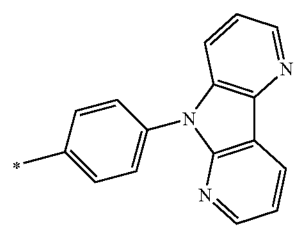
H47
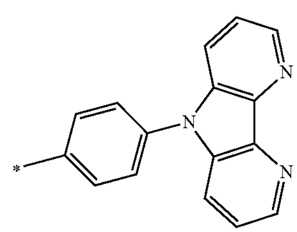
H48
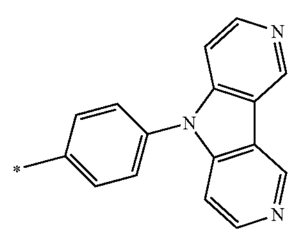

-continued
H49
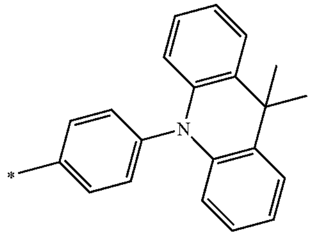
H50
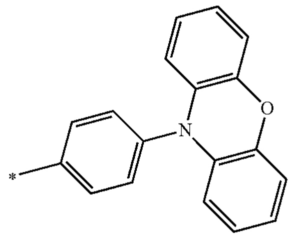
H51
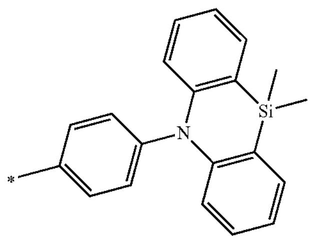
H52
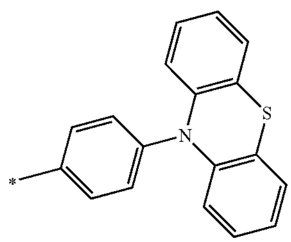
H53
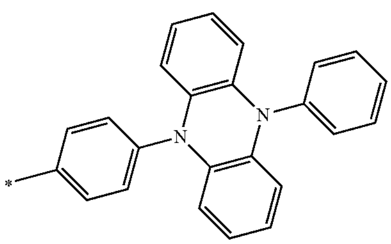
H54
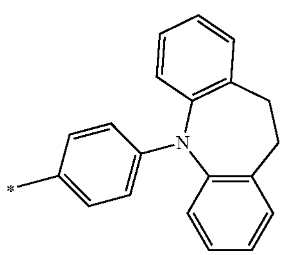
-continued
H55
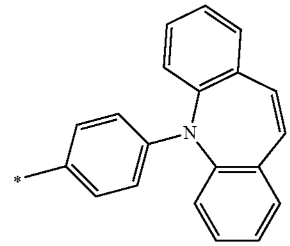
H56
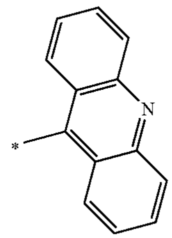
H57
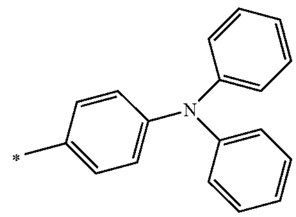
H58
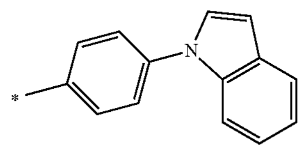
H59
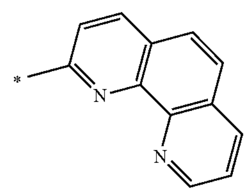
H60
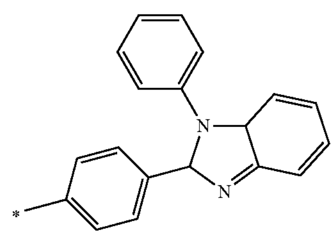
H61
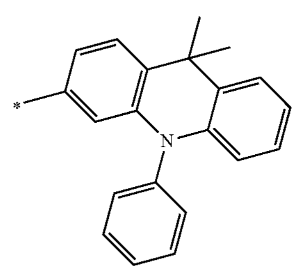

-continued
H62
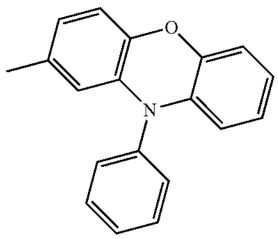
H63
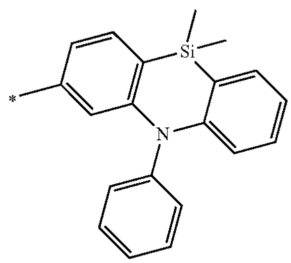
H64
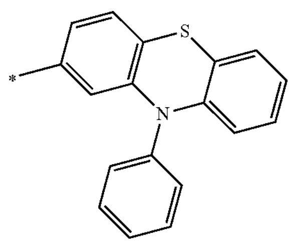
H65
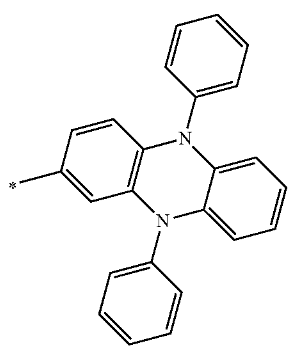
H66
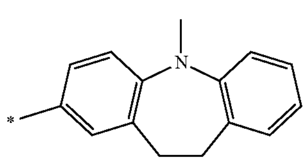
H67
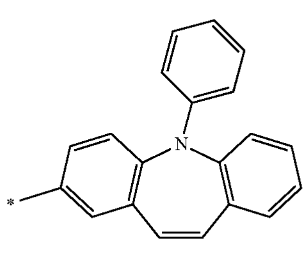
-continued
H68
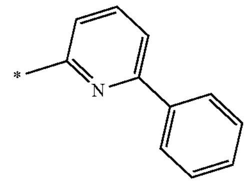
H69
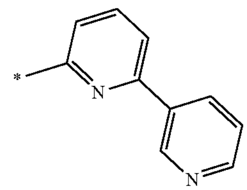
H70
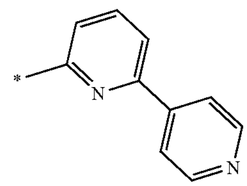
H71
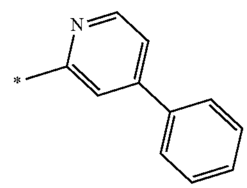
H72
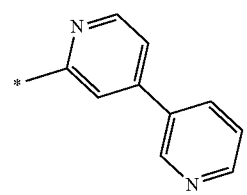
H73
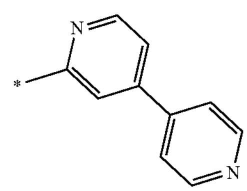
H74
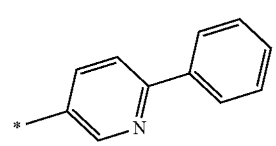
H75
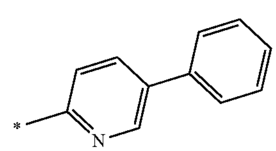
H76
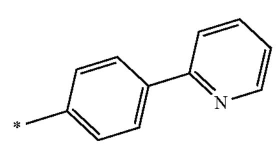

-continued

H77

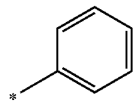

H78

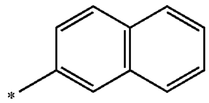

H79

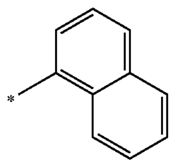

H80

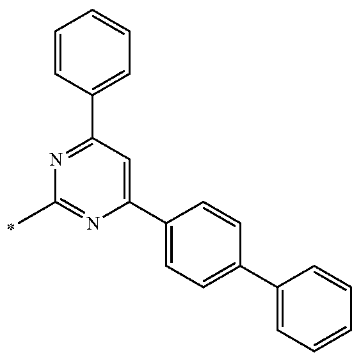

H81

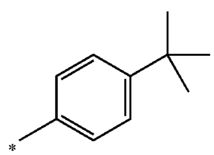

wherein, in Formulae H1 to H81, * is a bonding site to N, $L_1$, or $L_2$.

7. The organic light-emitting device as claimed in claim 1, wherein:

$L_1$ and $L_2$ are each independently selected from i) a phenylene group, a pyridylene group, a pyrimidylene group, a triazinylene group, and a quinazolinylene group;

ii) a phenylene group, a pyridylene group, a pyrimidylene group, a triazinylene group, and a quinazolinylene group each substituted with at least one selected from a phenyl group, a naphthyl group, and a pyridyl group; and iii) a phenylene group, a pyridylene group, a pyrimidylene group, a triazinylene group, and a quinazolinylene group each substituted with at least one selected from deuterium, a methyl group, an ethyl group, an n-octyl group, a methoxy group, an ethoxy group, a phenyl group, a naphthyl group, a pyridyl group, and a carbazole group;

n1 and n2 are each independently an integer of 0 or 1;

$Ar_{11}$ and $Ar_{12}$ are each independently a compound represented by any one of Formulae H1, H3, H4, H6, H12, and H77 to H80:

H1

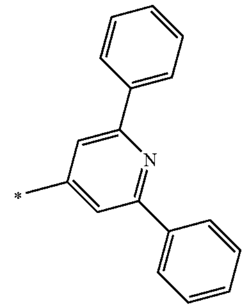

H3

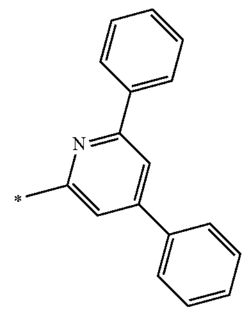

H4

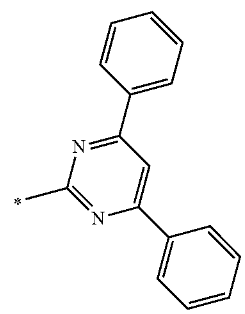

H6

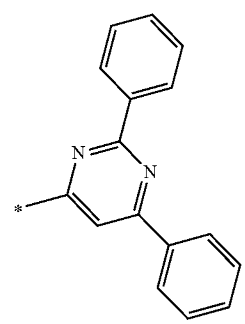

H12

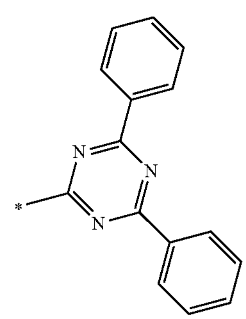

-continued
H77
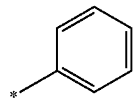
H78
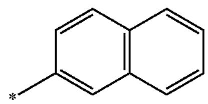
H79
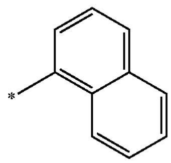
H80
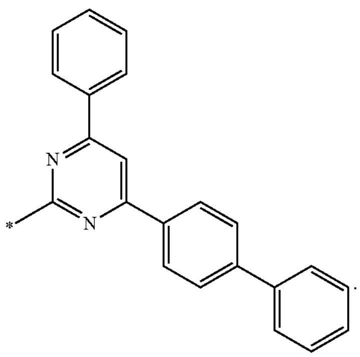
8. The organic light-emitting device as claimed in claim 1, wherein the light-emitting material is represented by any one of Formulae 1-1 to 1-28:
1-1
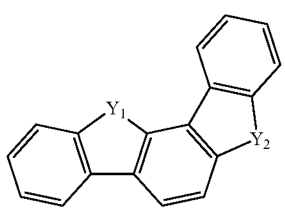
1-2
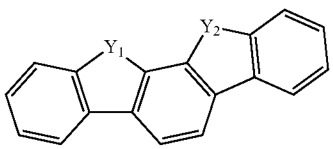
1-3
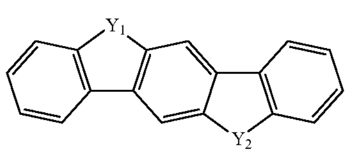
-continued
1-4
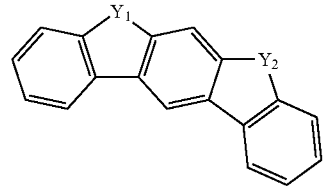
1-5
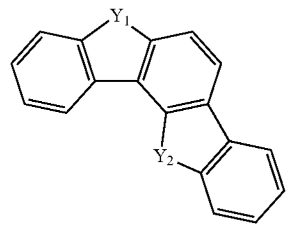
1-6
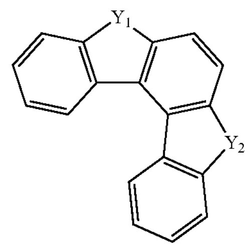
1-7
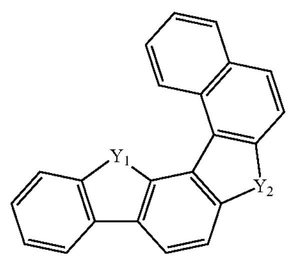
1-8
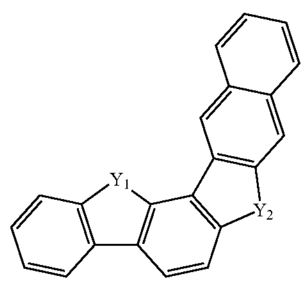
1-9
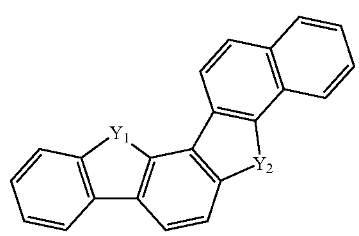

-continued
1-10
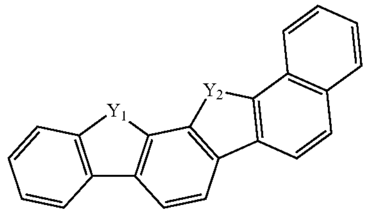
1-11
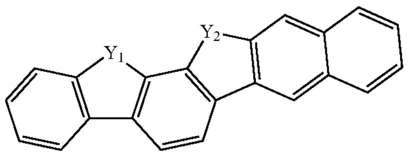
1-12
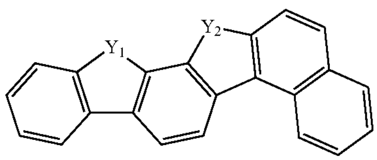
1-13
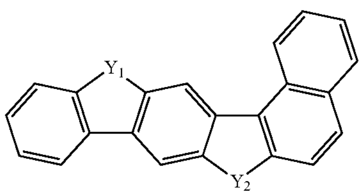
1-14
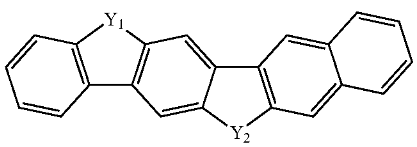
1-15
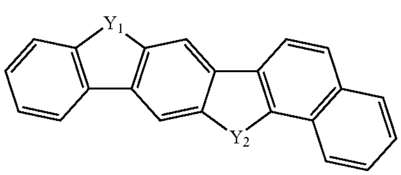
1-16
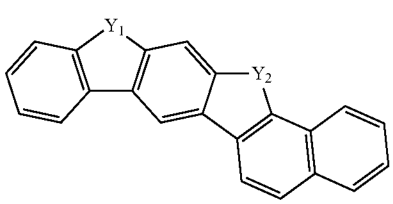
1-17
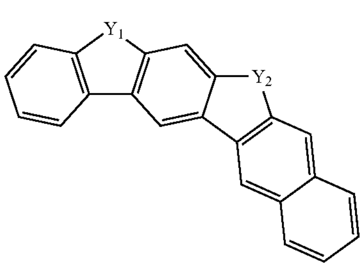
-continued
1-18
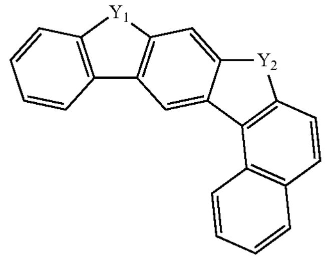
1-19
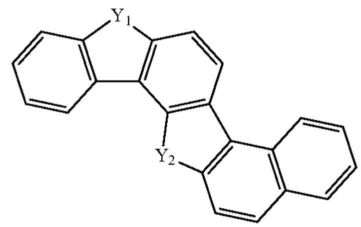
1-20
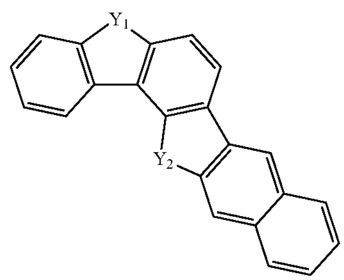
1-21
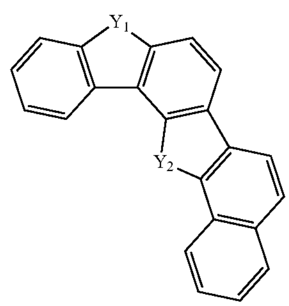
1-22
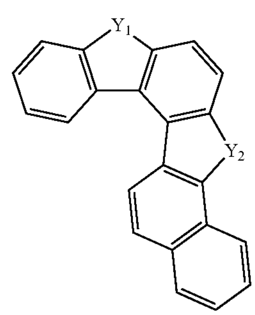

-continued 1-23

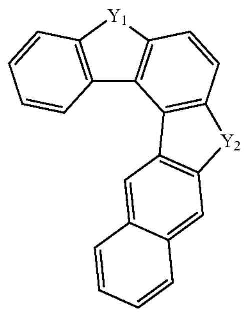

1-24

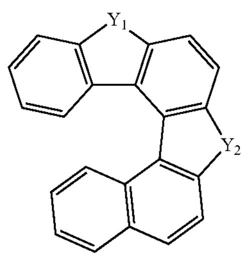

1-25

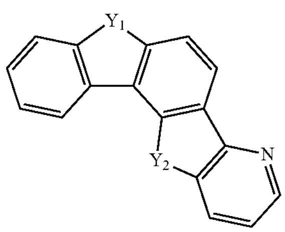

1-26

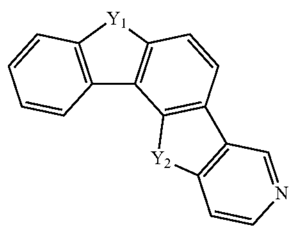

1-27

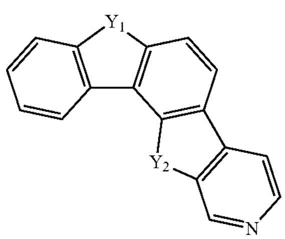

1-28

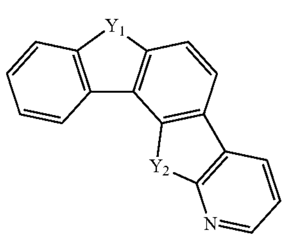

wherein, in Formulae 1-1 to 1-28, $Y_1$ is N-$(L_1)_{n1}$-$Ar_{11}$;

$Y_2$ is N-$(L_2)_{n2}$-$Ar_{12}$, O, S, $C(R_{31})(R_{32})$, or $Si(R_{33})(R_{34})$;

$L_1$ and $L_2$ are each independently selected from a substituted or unsubstituted $C_3$-$C_{10}$ cycloalkylene group, a substituted or unsubstituted $C_3$-$C_{10}$ cycloalkenylene group, a substituted or unsubstituted $C_6$-$C_{60}$ arylene group, a substituted or unsubstituted $C_2$-$C_{10}$ heterocycloalkylene group, a substituted or unsubstituted $C_2$-$C_{10}$ heterocycloalkenylene group, and a substituted or unsubstituted $C_2$-$C_{60}$ heteroarylene group;

n1 and n2 are each independently an integer of 0 to 3;

$Ar_{11}$ and $Ar_{12}$ are each independently selected from i) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and ii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

$R_{31}$ to $R_{34}$ are each independently selected from i) a $C_1$-$C_{60}$ alkyl group, a $C_2$-$C_{60}$ alkenyl group, a $C_2$-$C_{60}$ alkynyl group, and a $C_1$-$C_{60}$ alkoxy group;

ii) a $C_1$-$C_{60}$ alkyl group, a $C_2$-$C_{60}$ alkenyl group, a $C_2$-$C_{60}$ alkynyl group, and a $C_1$-$C_{60}$ alkoxy group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_0$-$C_{60}$ aryl group, a $C_6$-$C_{60}$ aryloxy group, a $C_6$-$C_{60}$ arylthio group, and a $C_2$-$C_{60}$ heteroaryl group;

iii) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and iv) a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

9. The organic light-emitting device as claimed in claim 1, wherein the light-emitting material is represented by any one of Compounds 100 to 236:
100
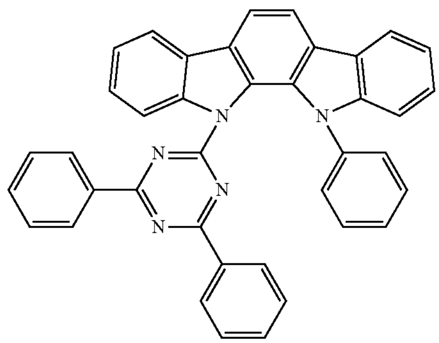
101
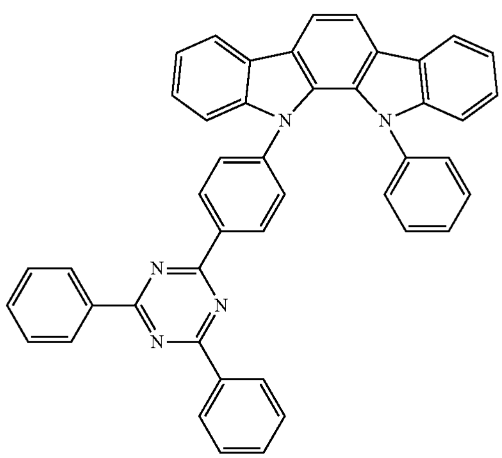
102
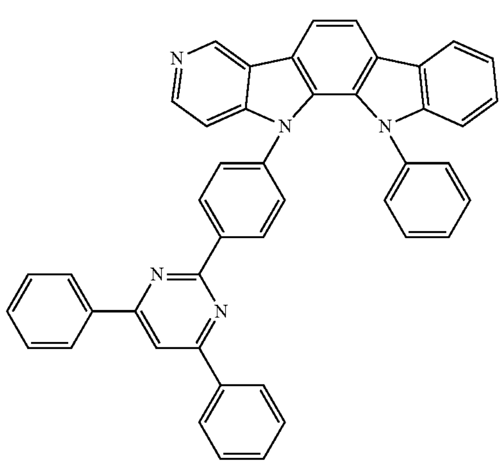
-continued
103
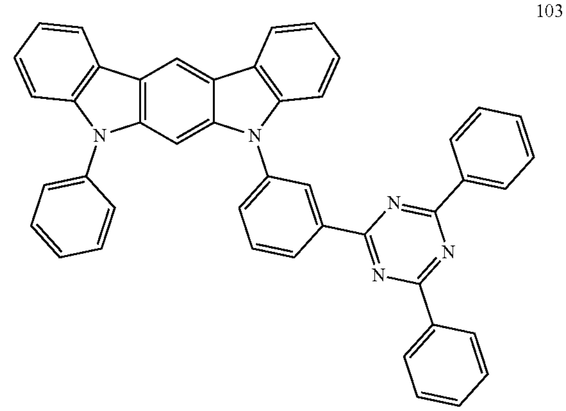
104
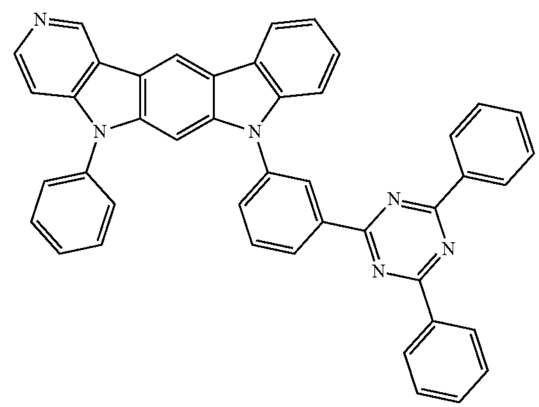
105
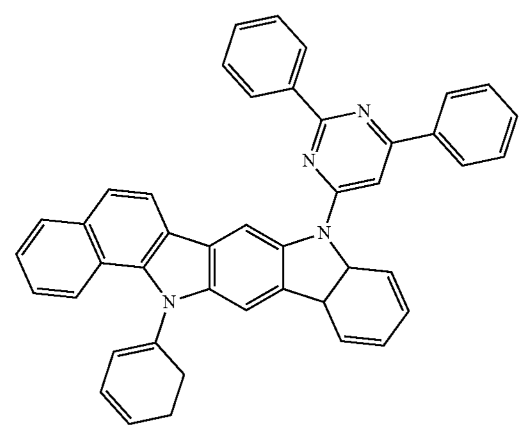
107
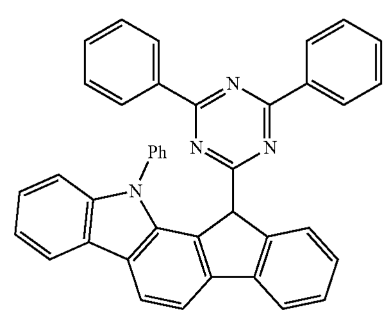

108
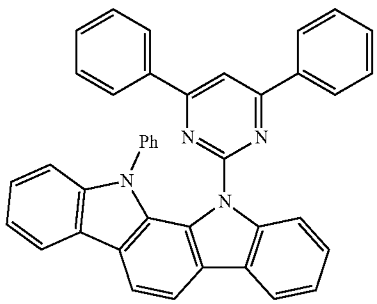
109
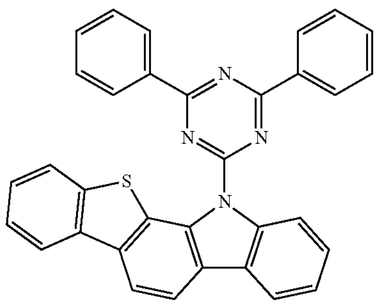
110
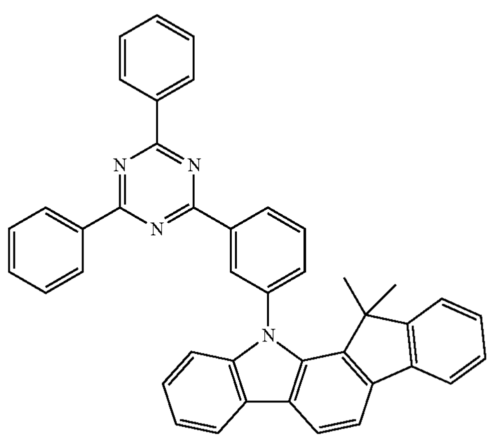
111
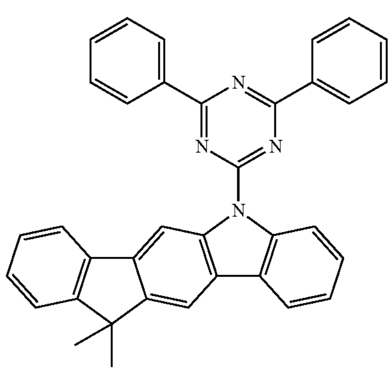
112
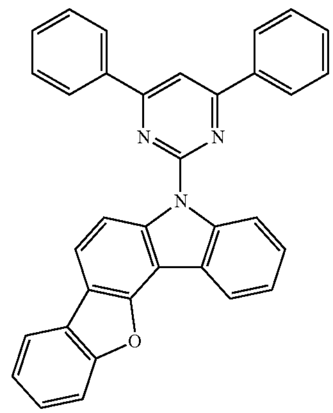
113
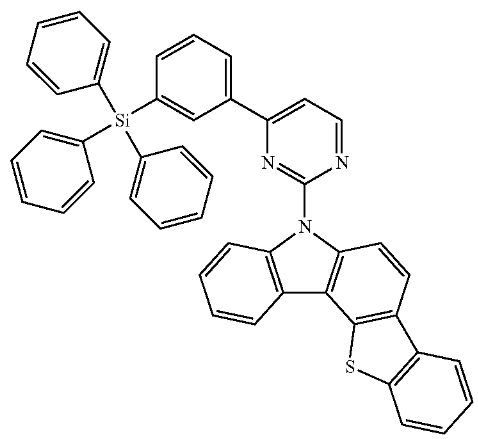
114
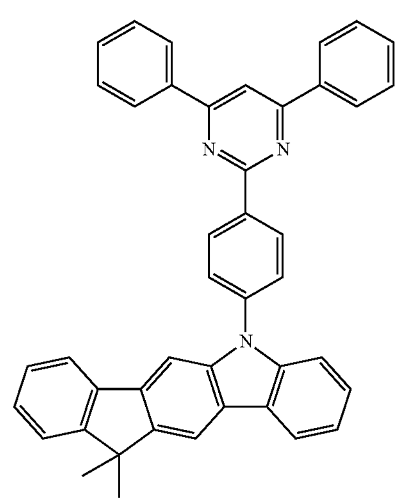

-continued
115
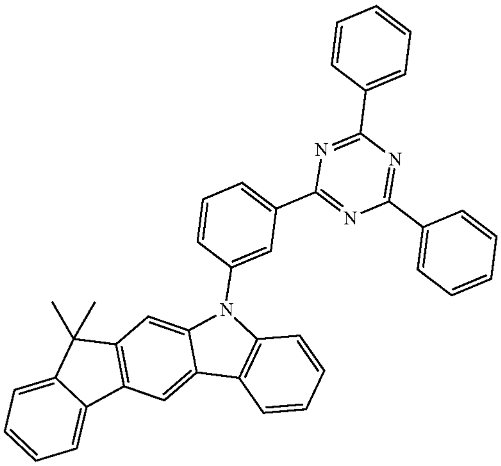
116
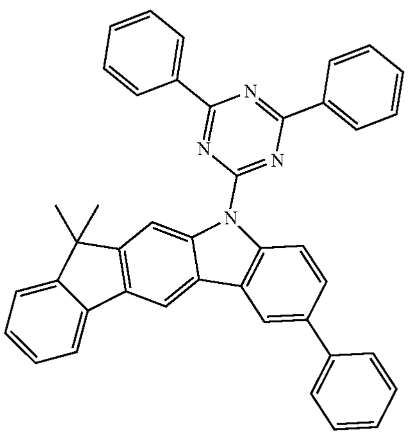
117
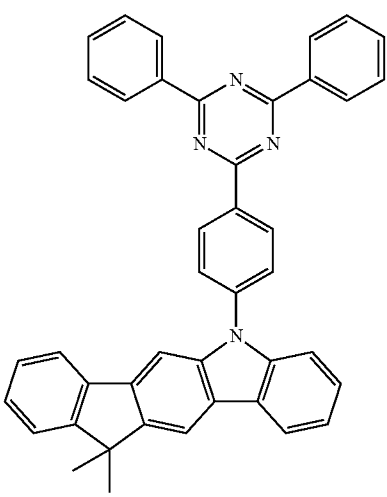
-continued
118
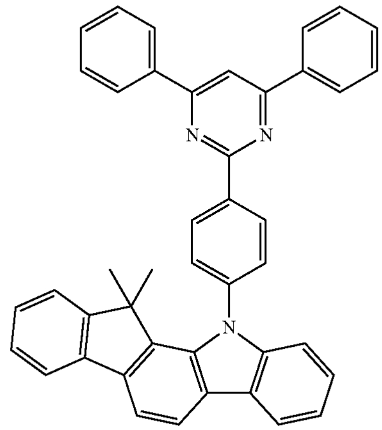
119
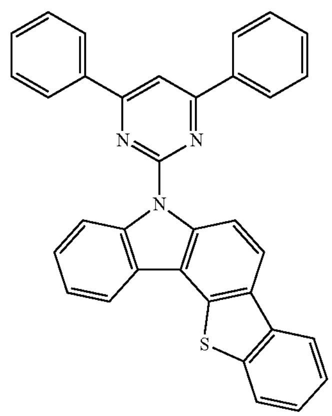
120
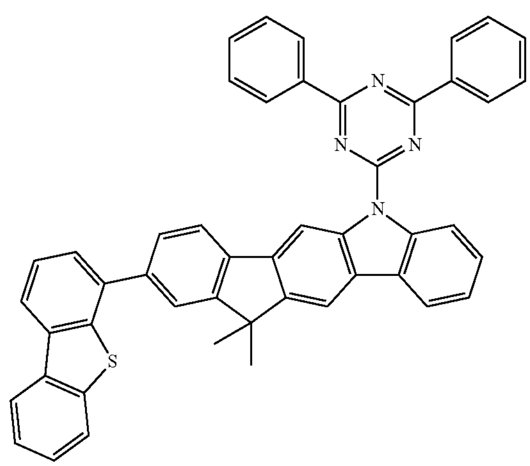

-continued
121
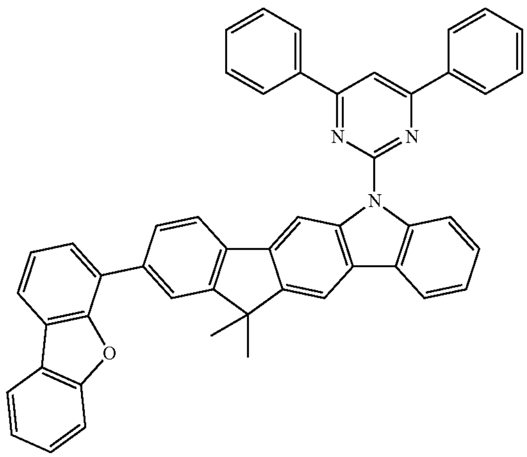
122
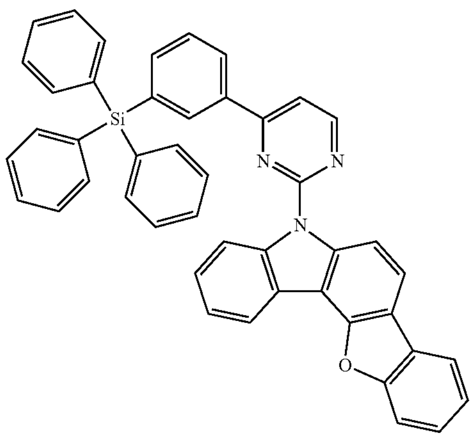
123
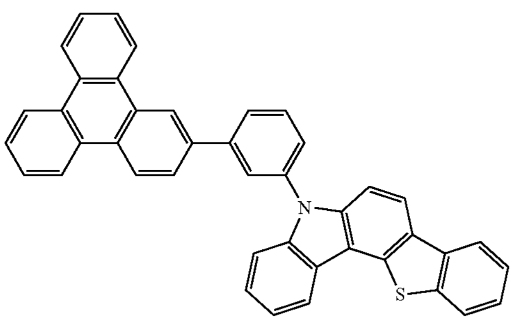
124
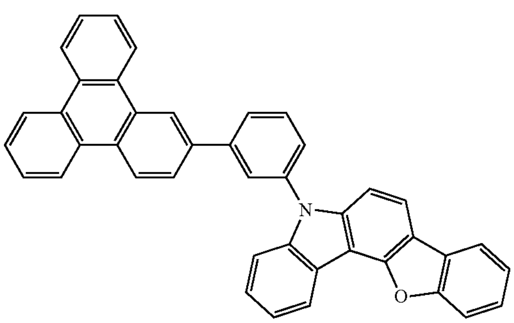
-continued
125
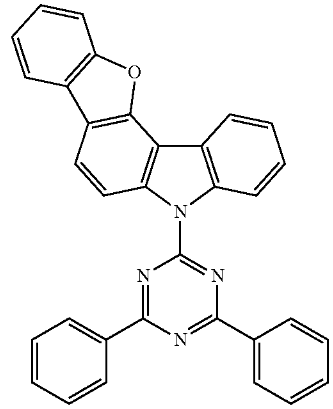
126
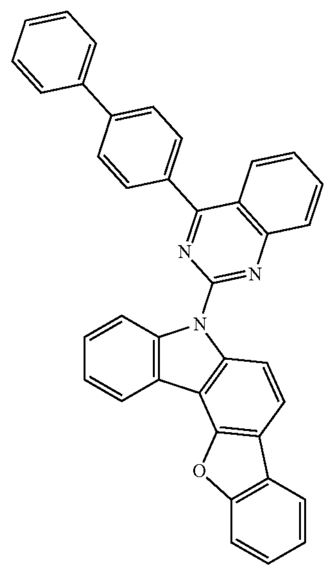
127
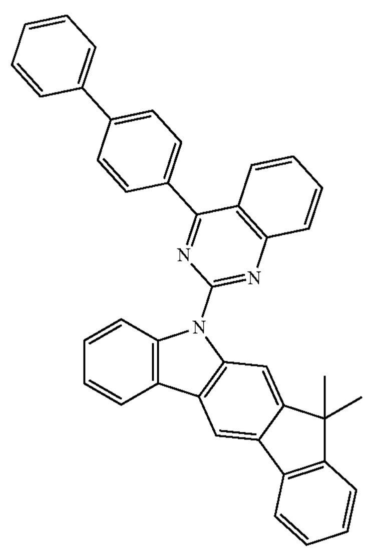

-continued
128
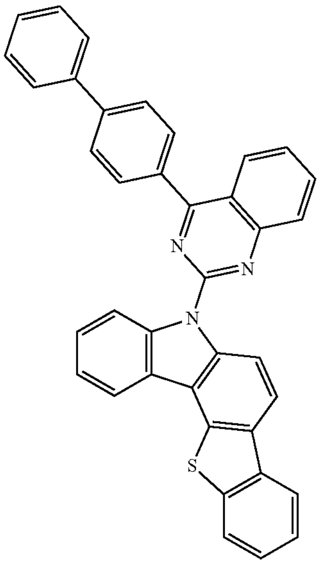
129
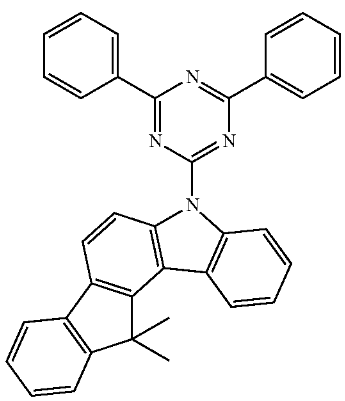
130
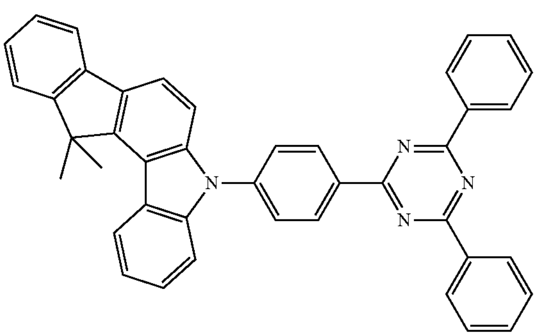
131
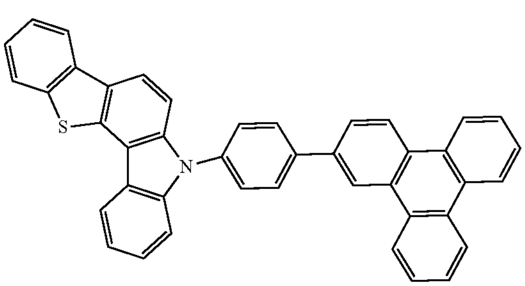
-continued
132
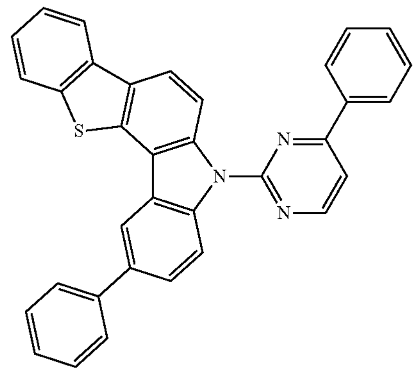
133
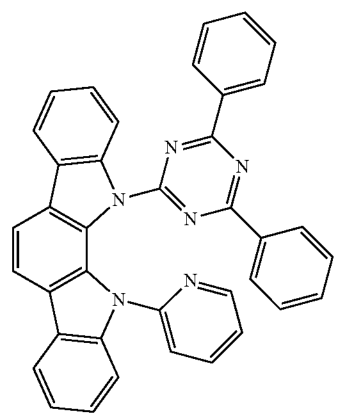
134
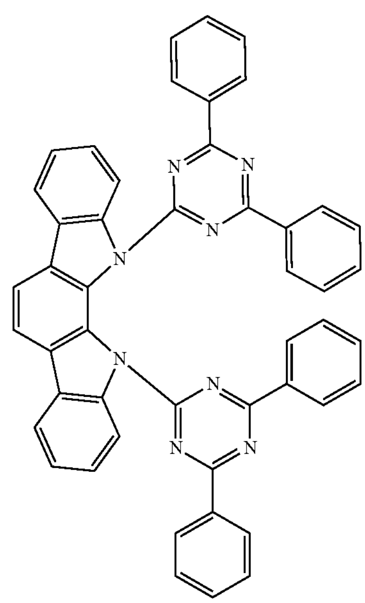

-continued
135
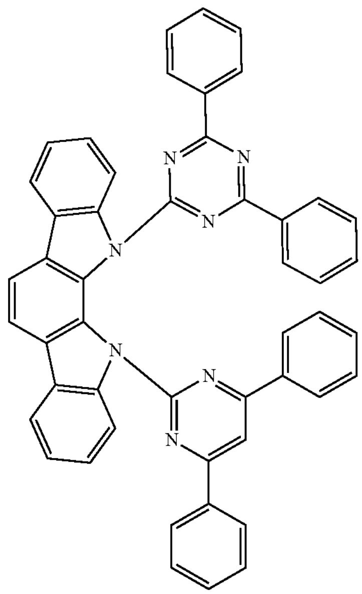
136
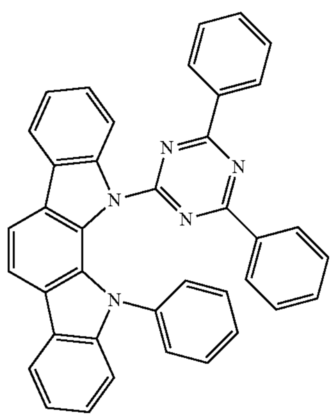
137
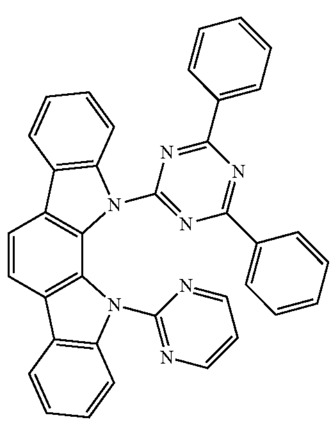
-continued
138
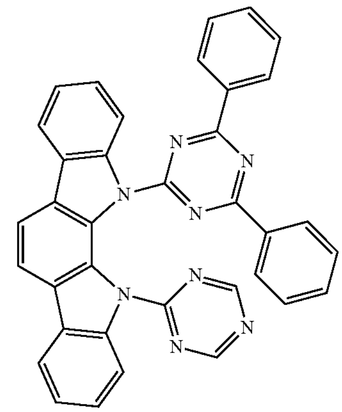
139
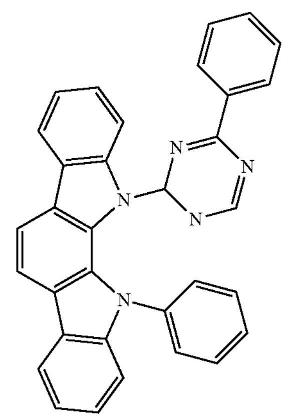
140
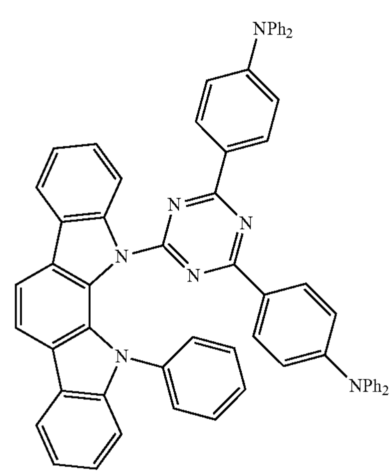

141
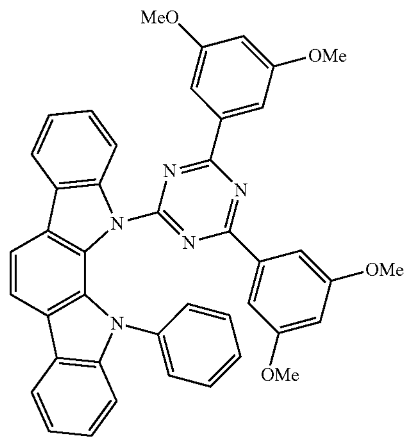
142
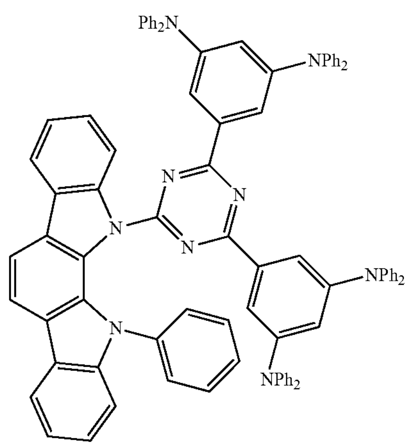
143
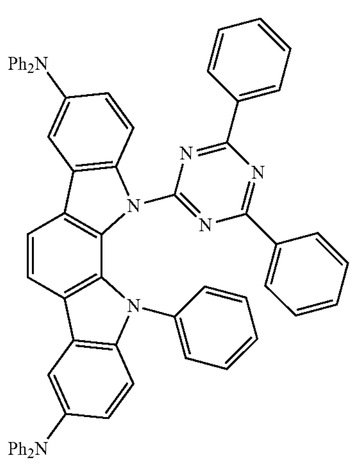
144
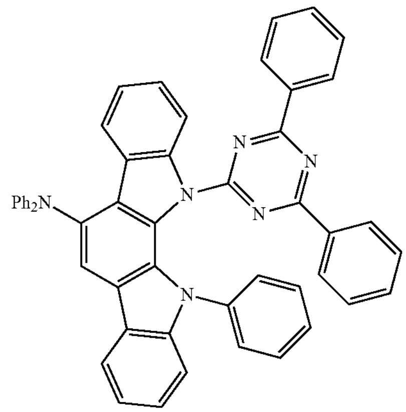
145
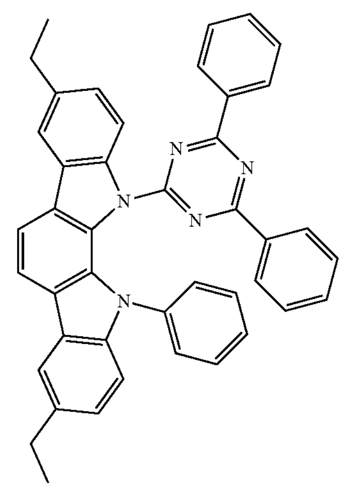
146
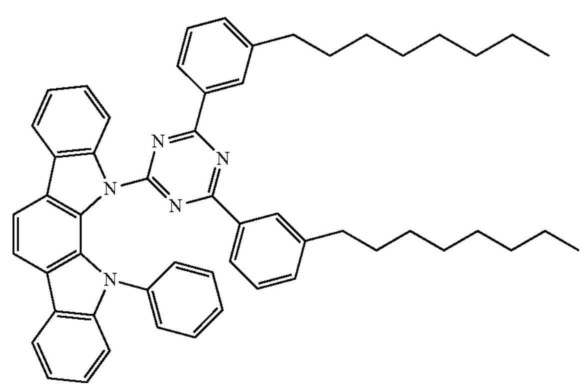

-continued
147
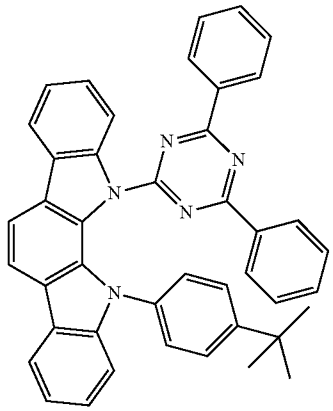
148
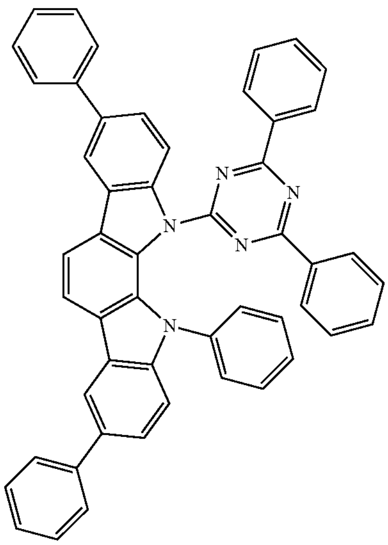
149
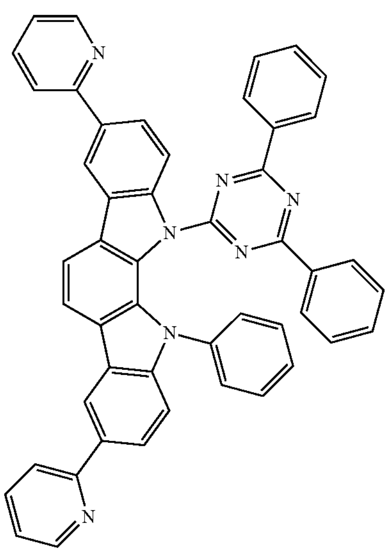
-continued
150
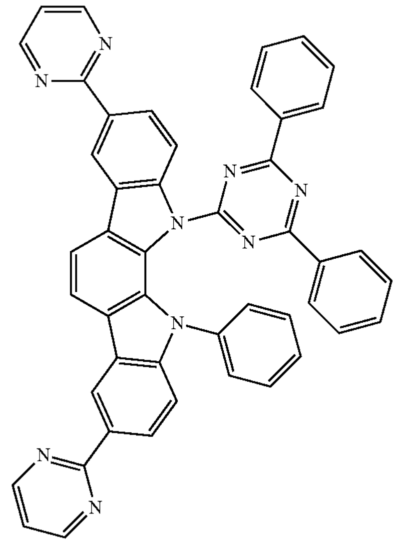
151
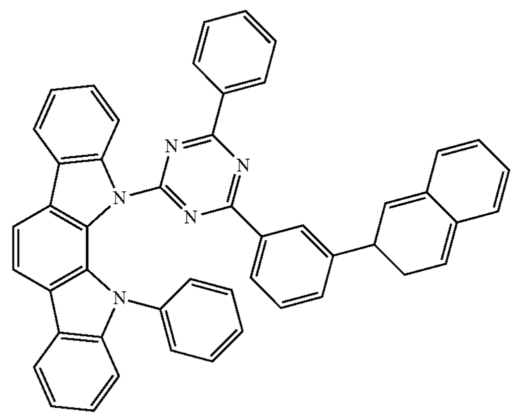
152
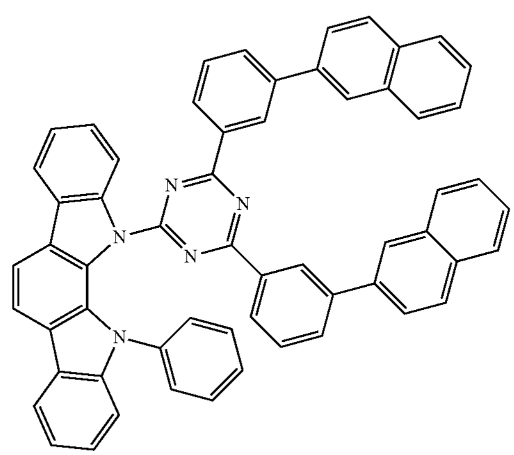

-continued
153
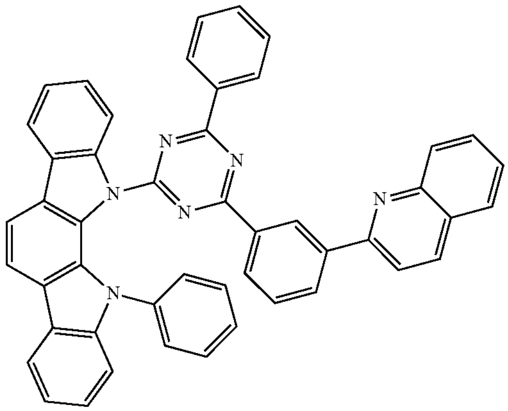
154
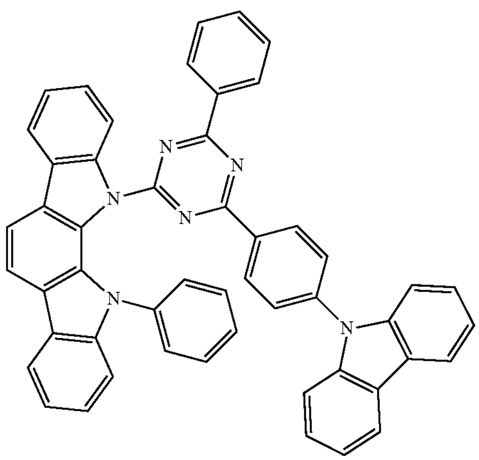
155
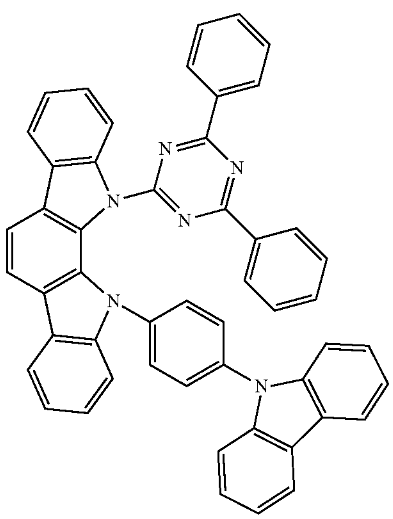
-continued
156
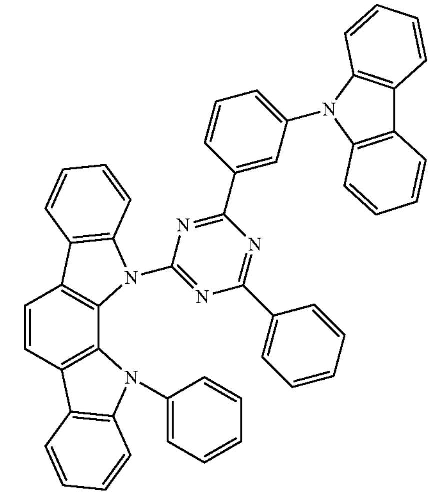
157
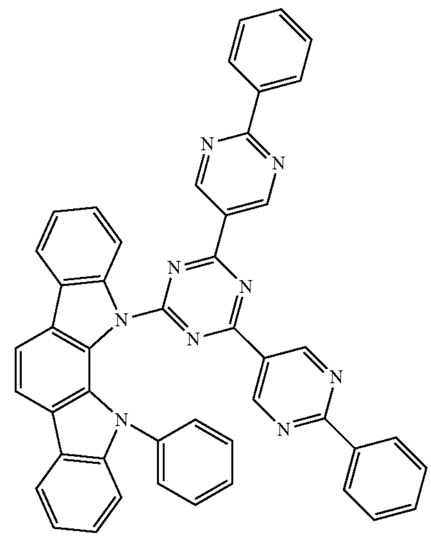
158
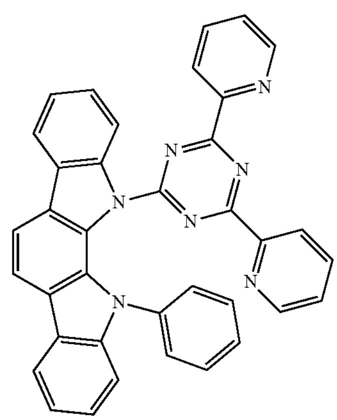

-continued
159
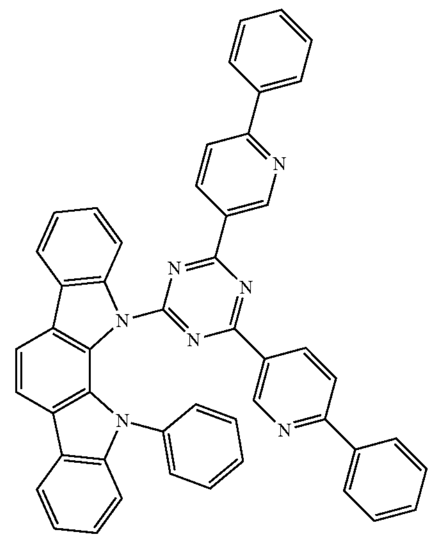
160
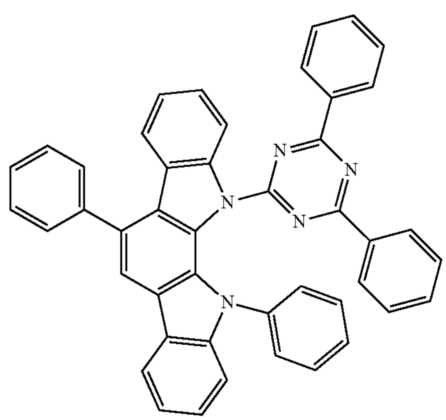
161
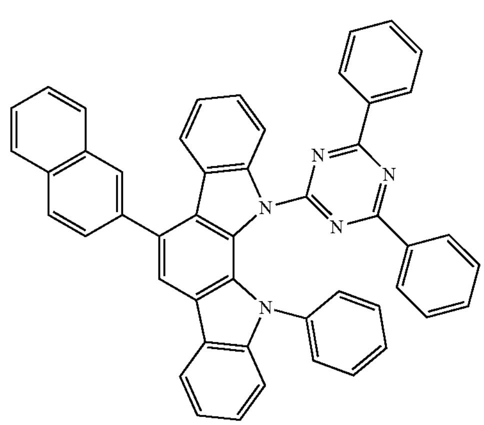
-continued
162
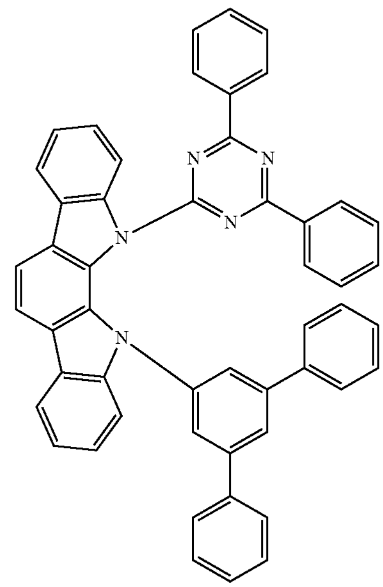
163
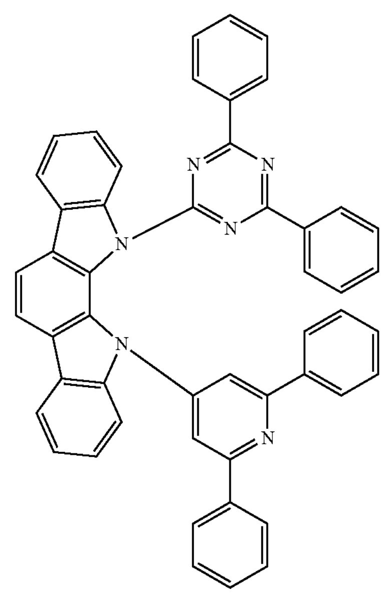

-continued
164
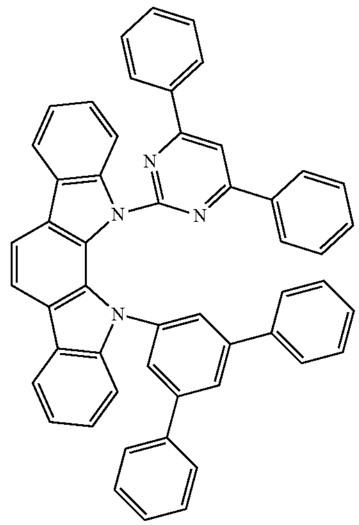
165
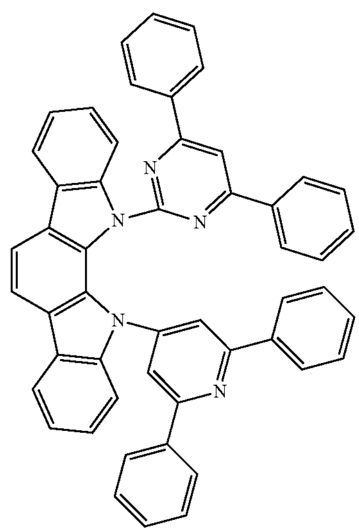
166
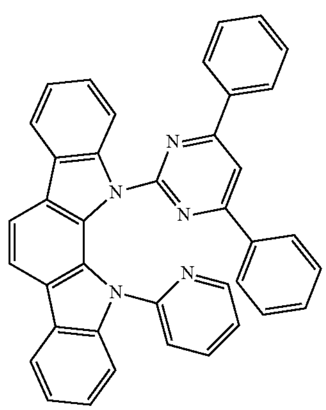
-continued
167
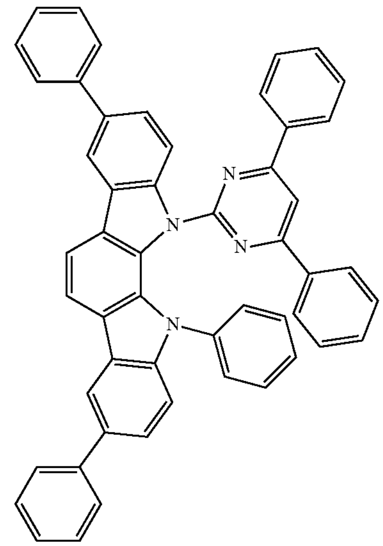
168
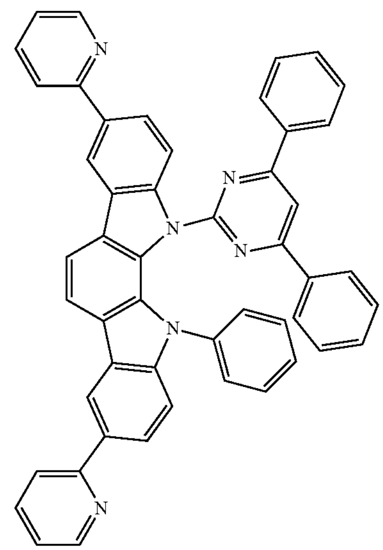
169
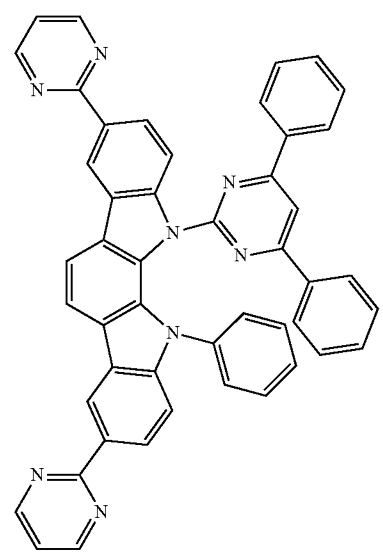

170
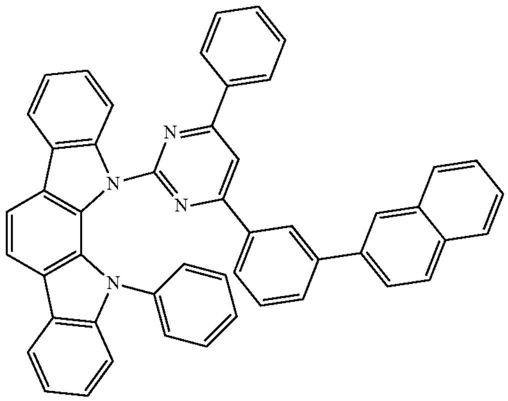
171
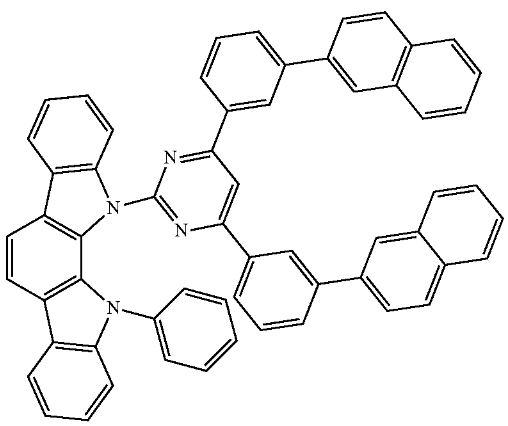
172
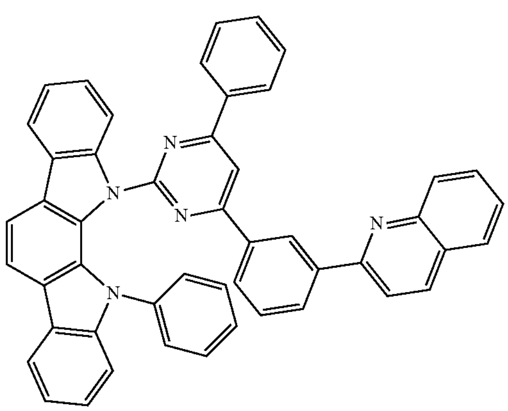
173
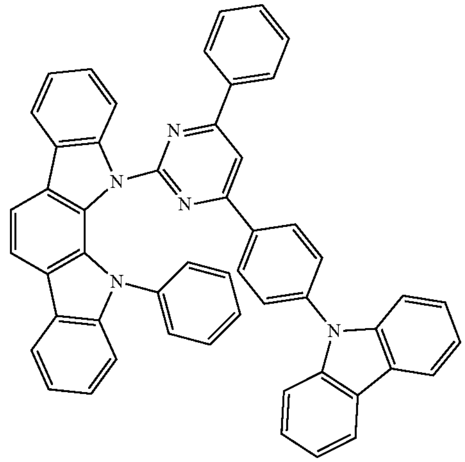
174
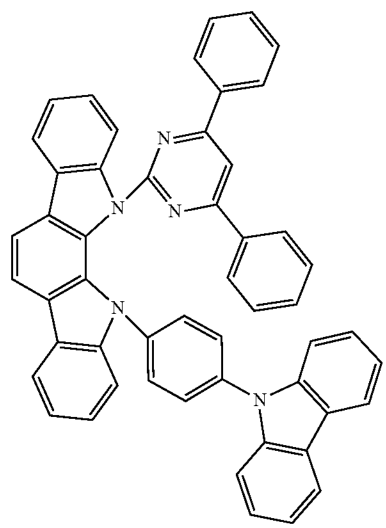
175
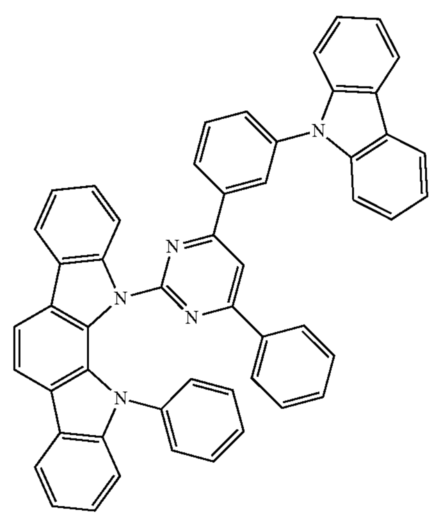

-continued
176
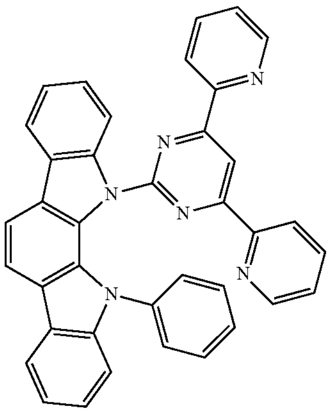
177
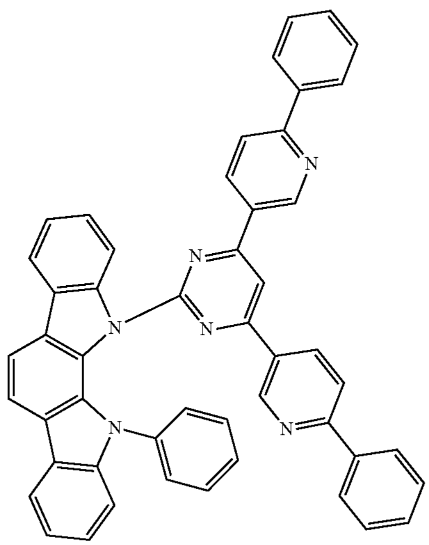
178
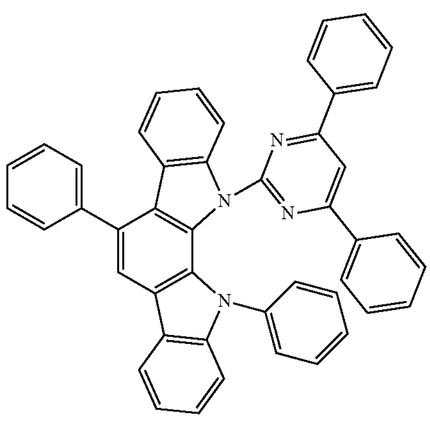
-continued
179
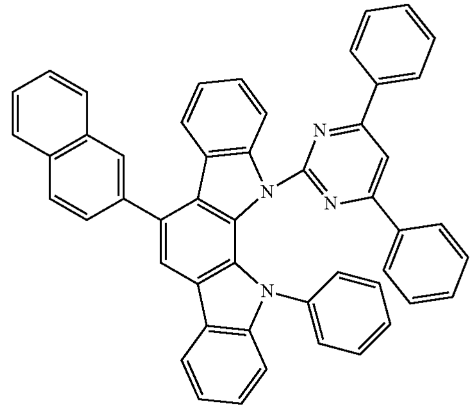
180
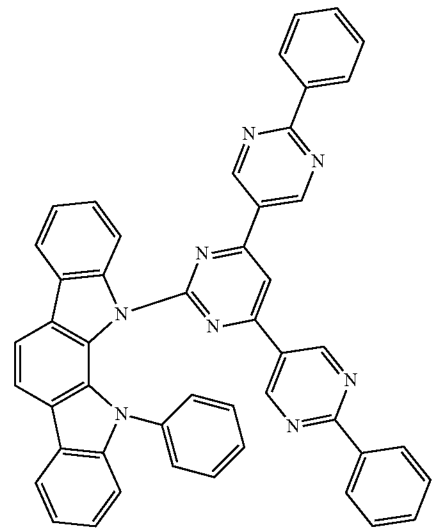
181
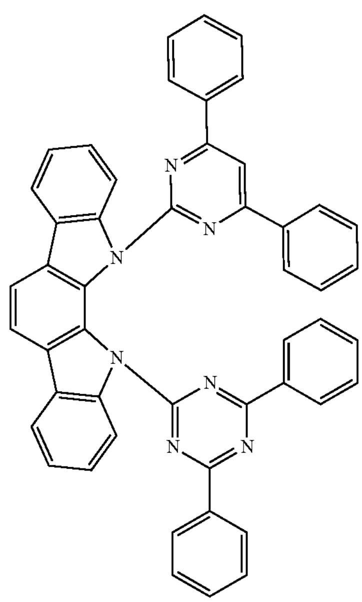

-continued
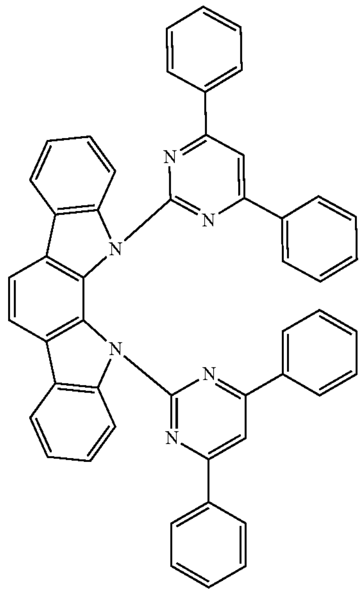
182
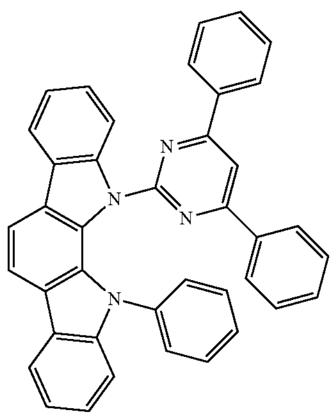
183
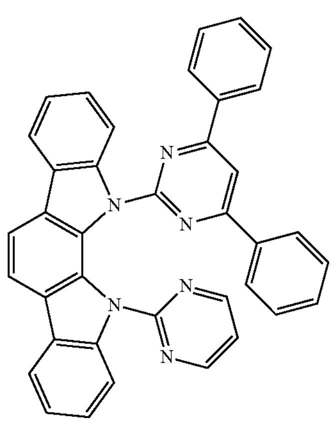
184
-continued
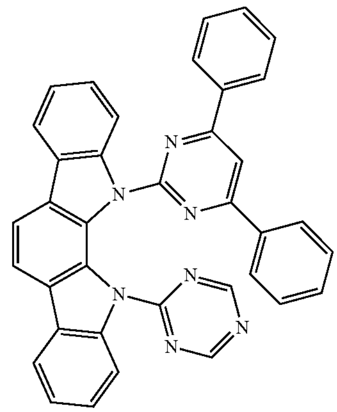
185
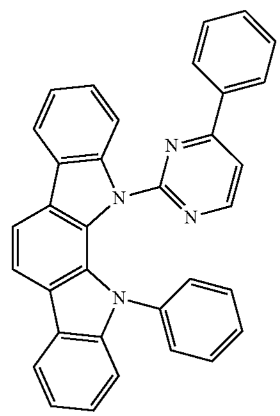
186
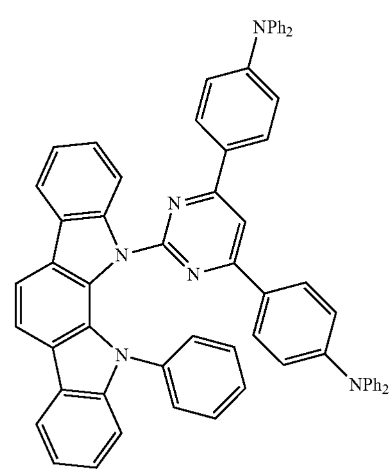
187

-continued
188
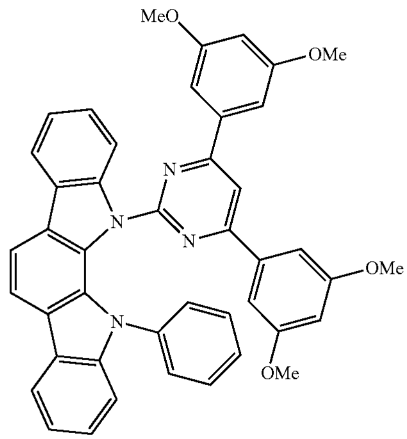
189
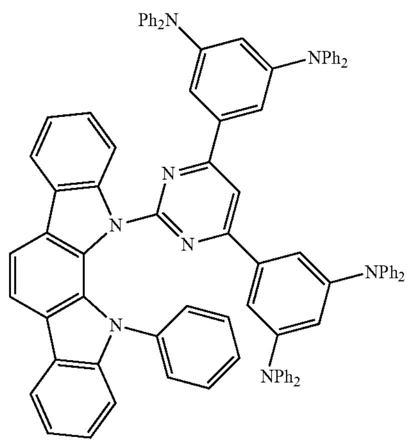
190
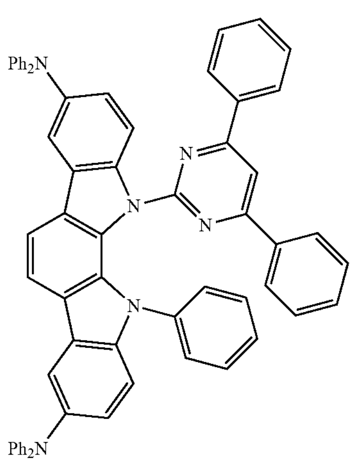
-continued
191
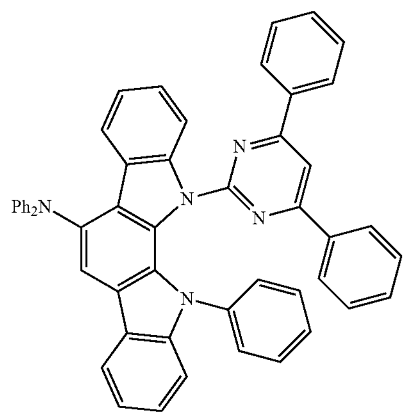
192
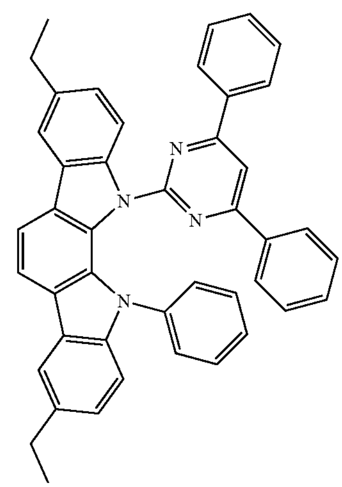
193
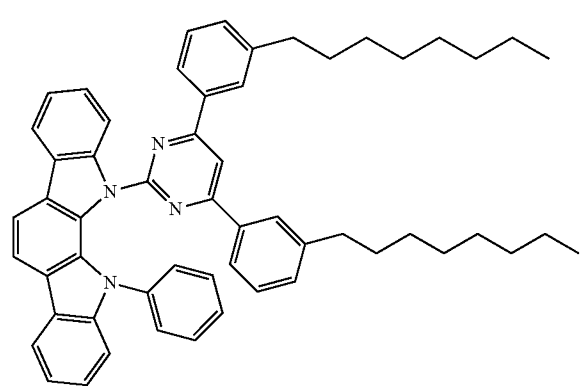

194
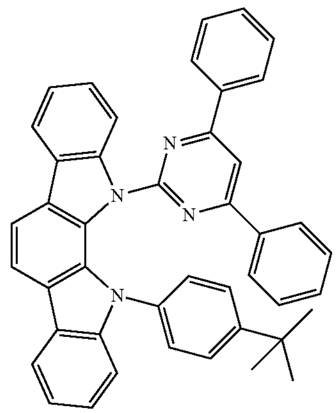
195
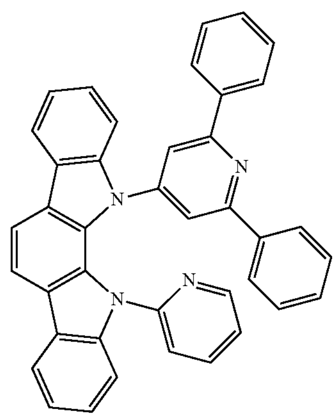
196
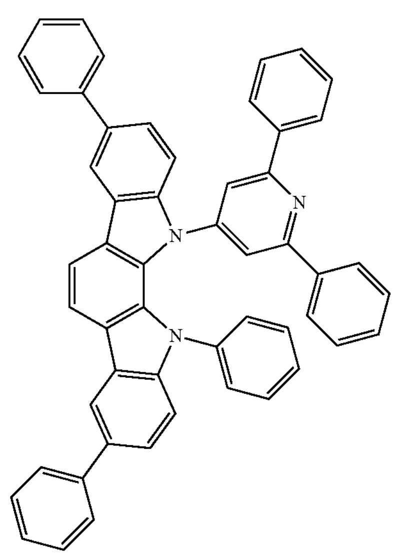
197
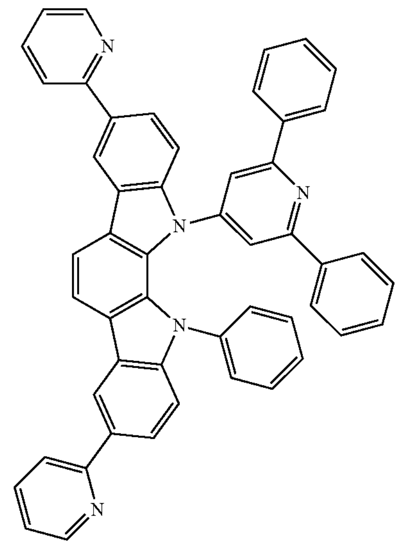
198
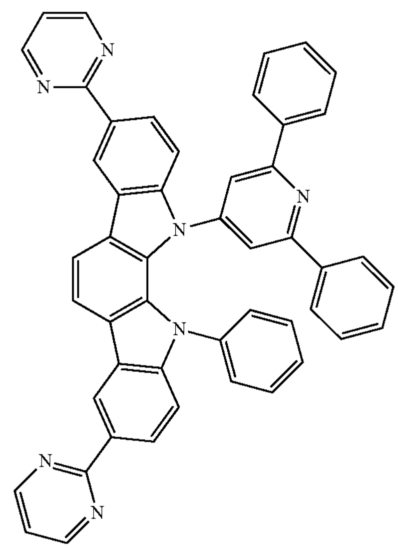
199
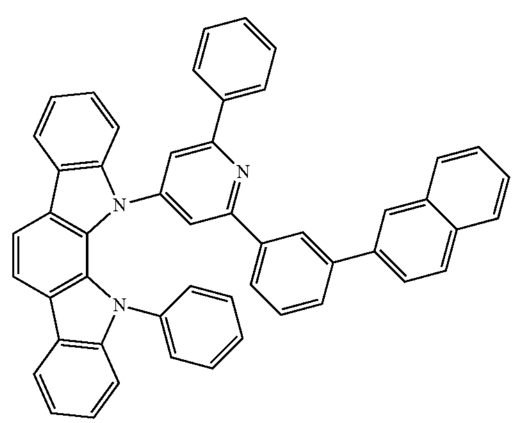

200
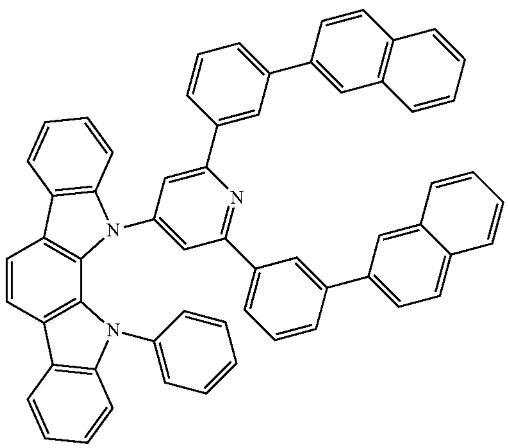
201
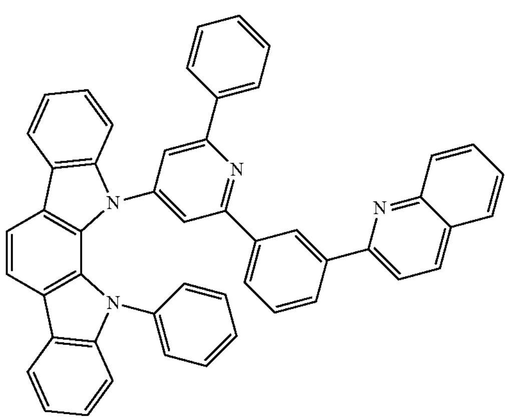
202
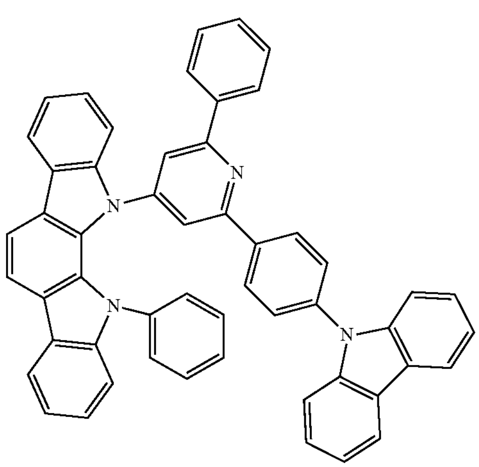
203
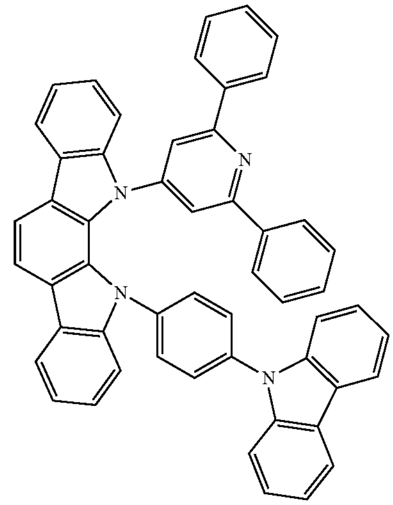
204
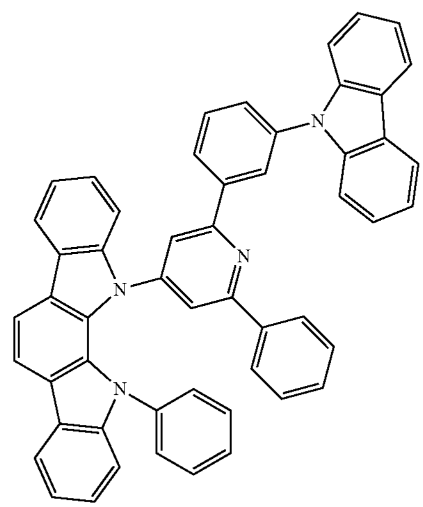
205
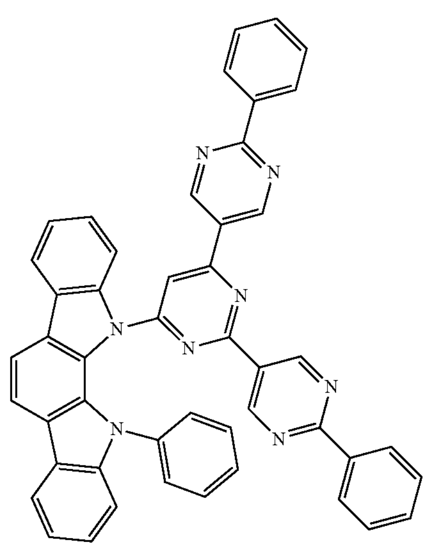

-continued
206
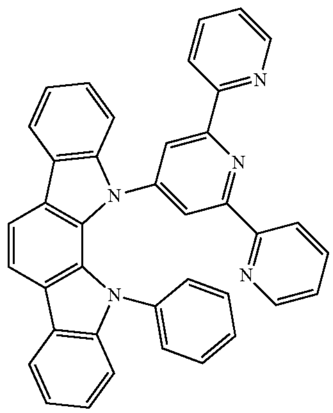
207
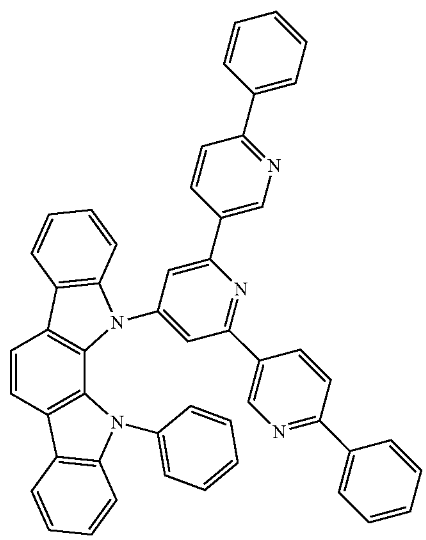
208
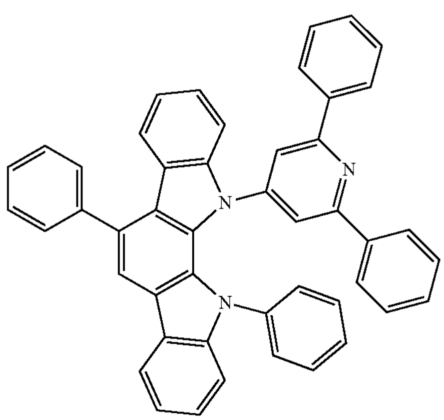
-continued
209
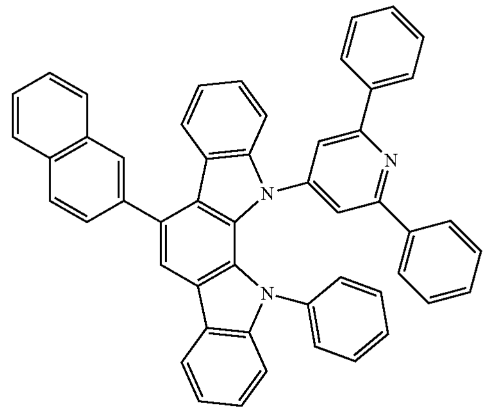
210
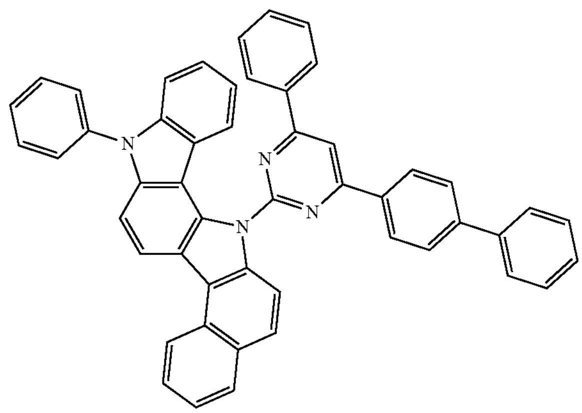
211
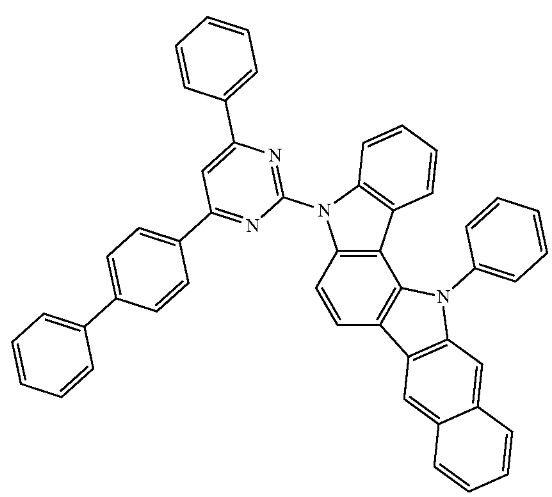

-continued
212
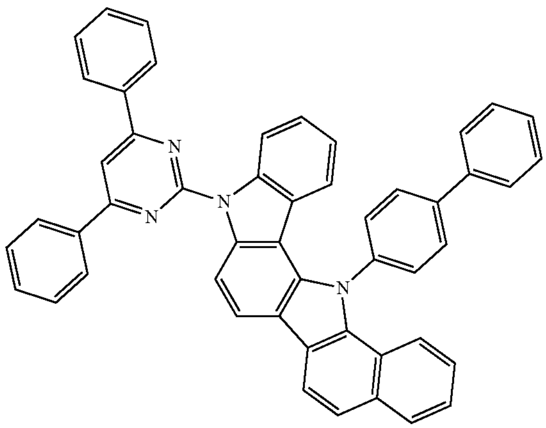
213
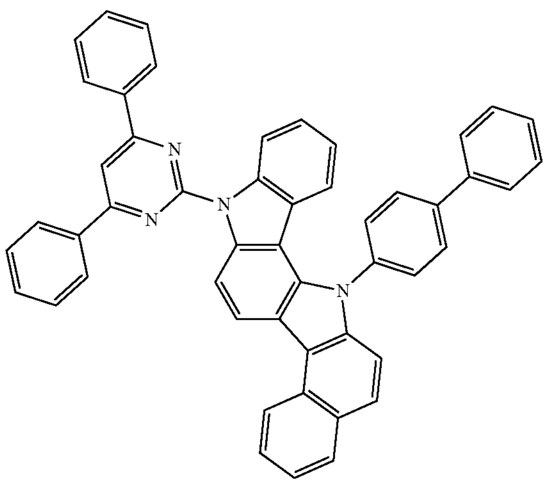
214
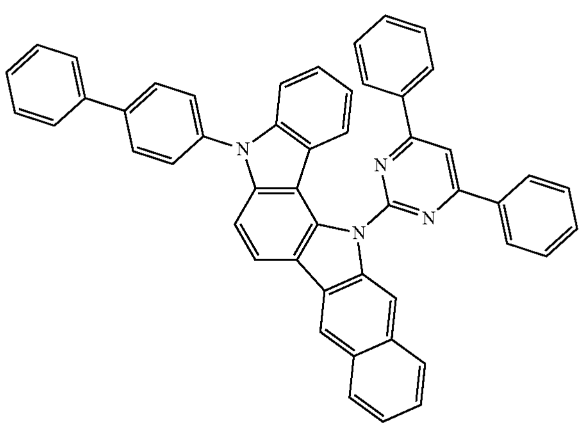
-continued
215
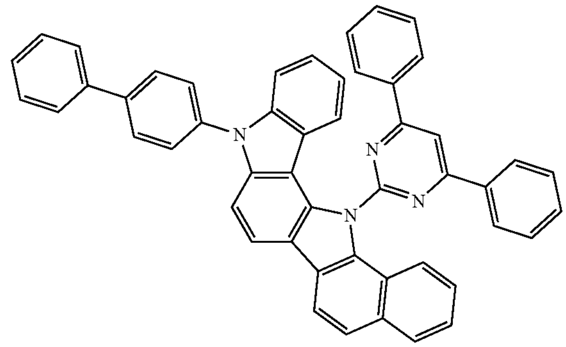
216
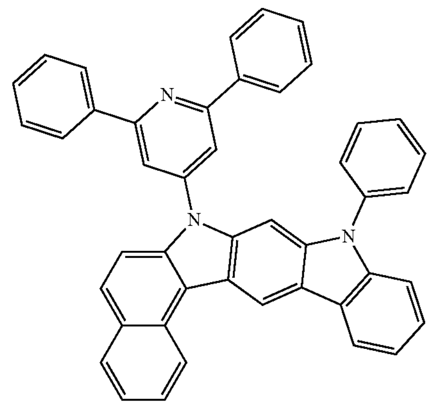
217
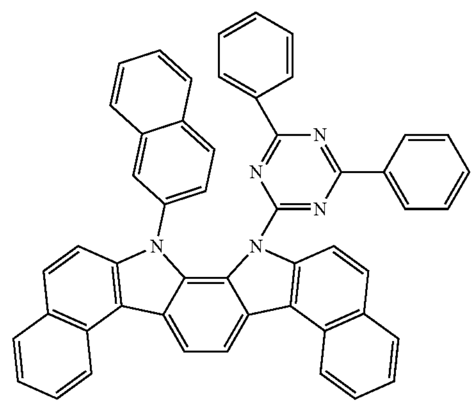
218
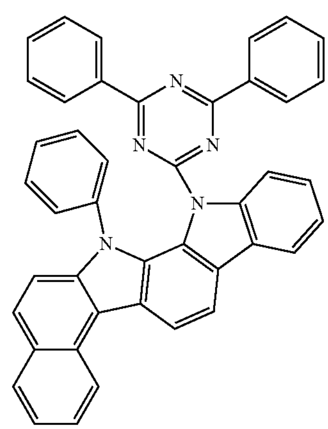

-continued
219
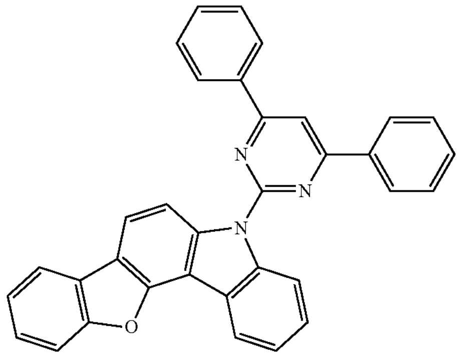
220
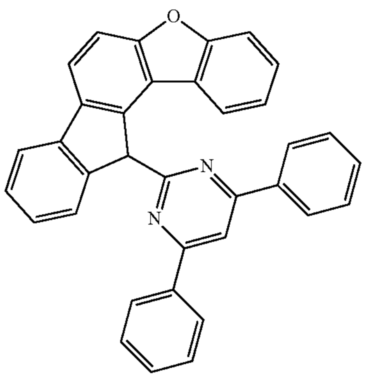
221
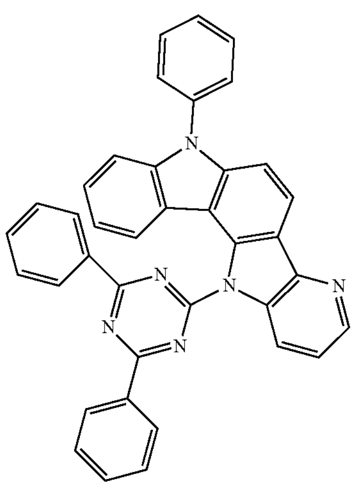
222
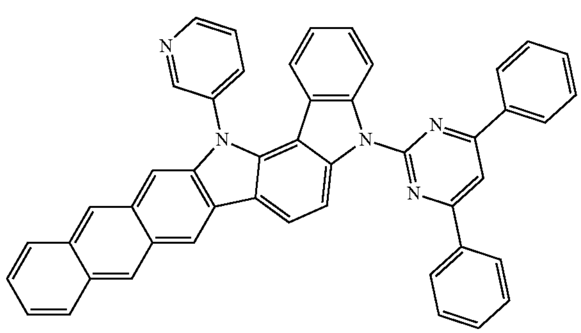
-continued
223
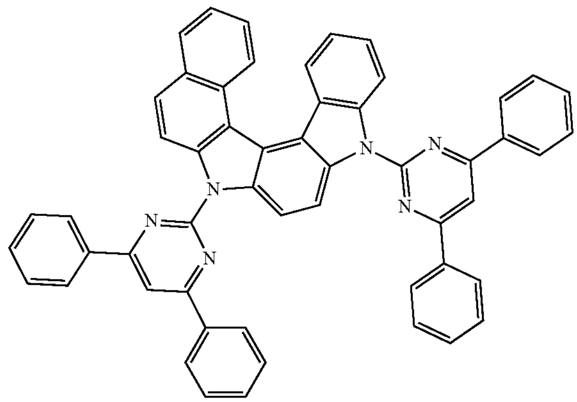
224
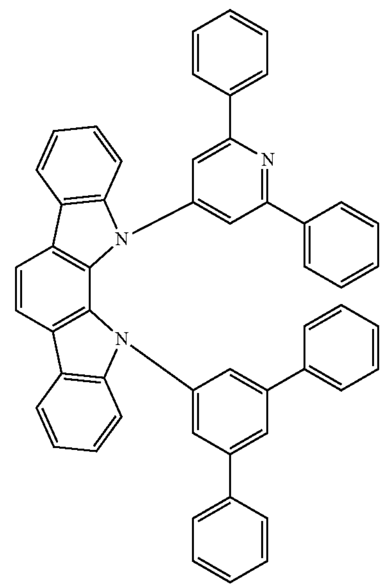
225
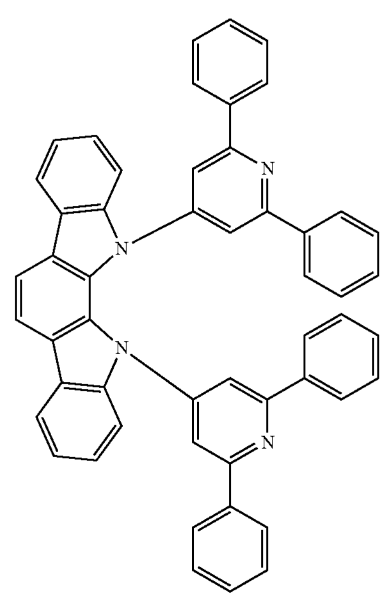

-continued
226
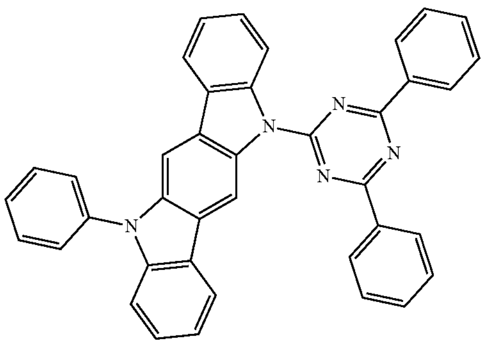
227
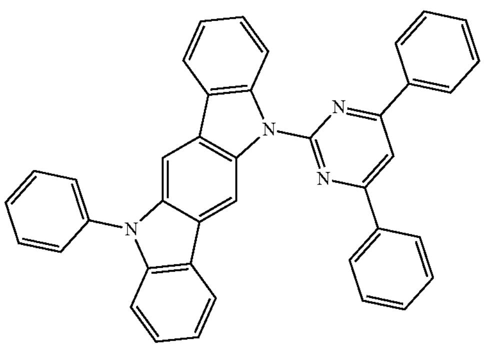
228
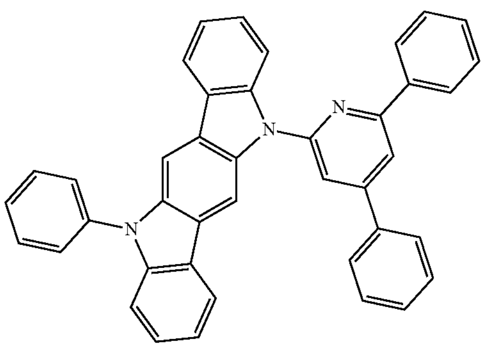
229
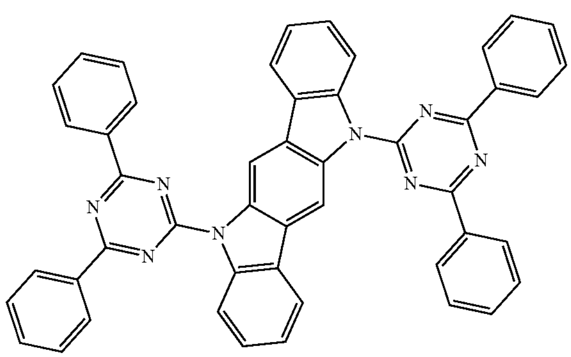
-continued
230
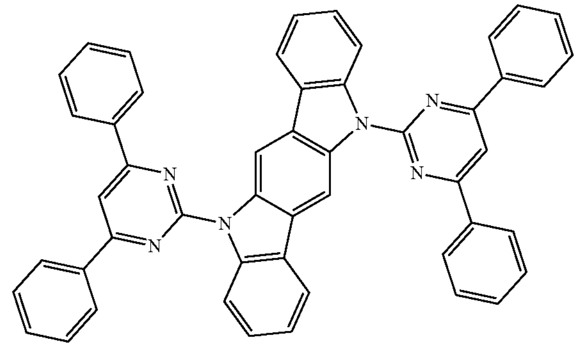
231
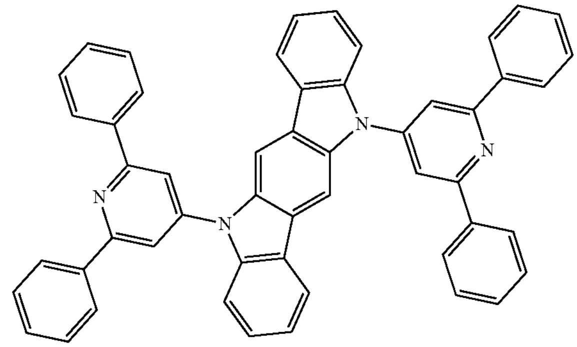
232
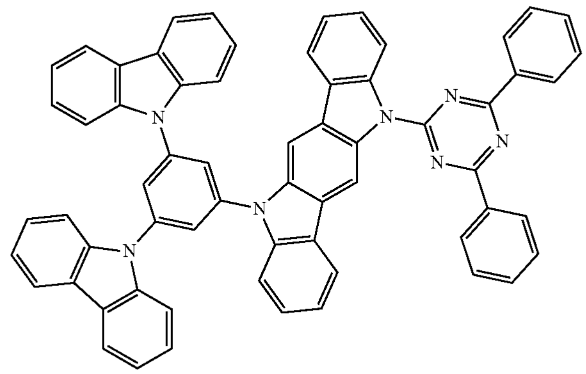
233
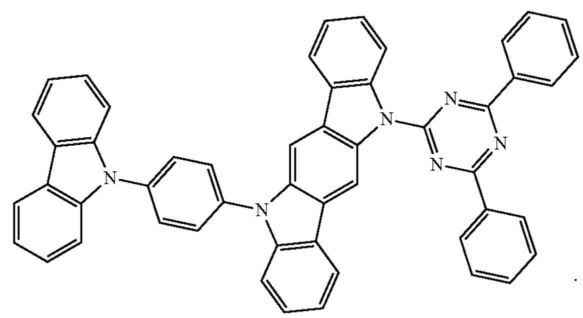
.
10. The organic light-emitting device as claimed in claim 1, wherein $X_{11}$ is $C(R_{11})$, $X_{12}$ is $C(R_{12})$, $X_{13}$ is $C(R_{13})$, $X_{14}$ is $C(R_{14})$, $X_{15}$ is $C(R_{15})$, $X_{16}$ is $C(R_{16})$, $X_{17}$ is $C(R_{17})$, $X_{18}$ is $C(R_{18})$, $X_{19}$ is $C(R_{19})$, $X_{20}$ is $C(R_{20})$, $X_{21}$ is $C(R_{21})$, $X_{22}$ is $C(R_{22})$, $X_{23}$ is $C(R_{23})$, and $X_{24}$ is $C(R_{24})$.

11. The organic light-emitting device as claimed in claim 1, wherein $Ar_{13}$ and $Ar_{14}$ are each independently selected from i) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group; and ii) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group.

12. The organic light-emitting device as claimed in claim 1, wherein $Ar_{13}$ and $Ar_{14}$ are each independently represented by any one of Formulae 3-1 to 3-20:

3-1

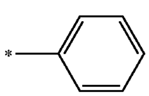

3-2

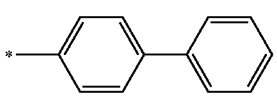

3-3

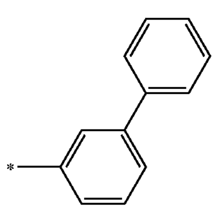

3-4

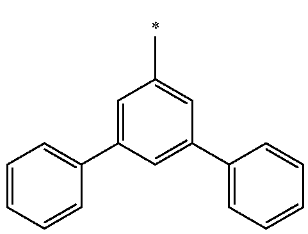

-continued 3-5

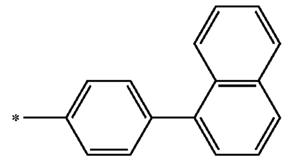

3-6

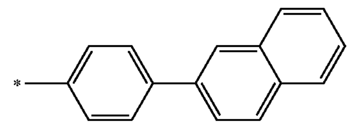

3-7

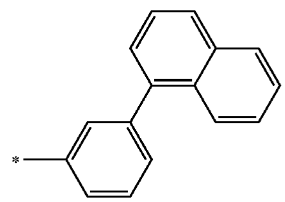

3-8

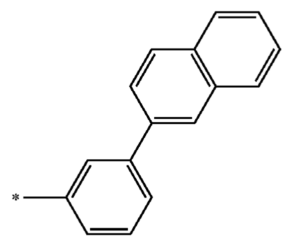

3-9

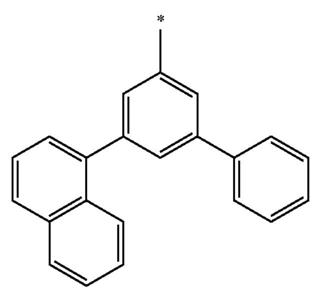

3-10

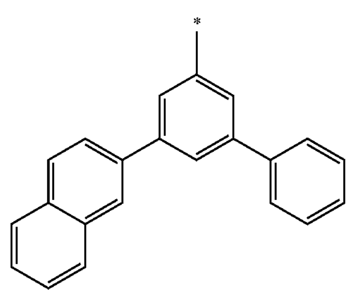

3-11

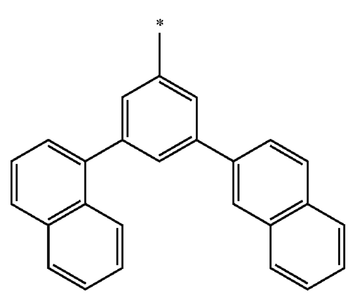

-continued 3-12

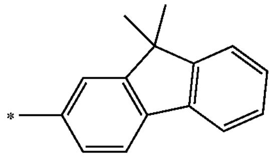

3-13

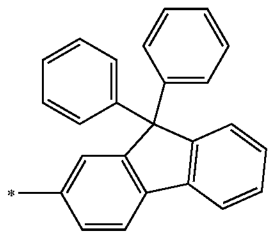

3-14

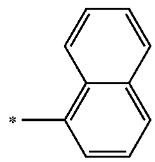

3-15

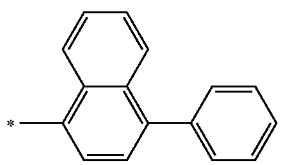

3-16

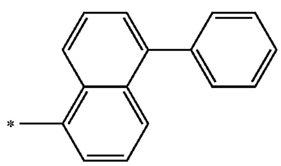

3-17

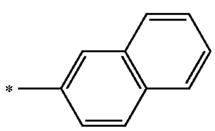

3-18

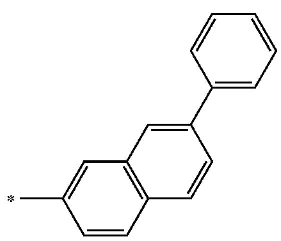

3-19

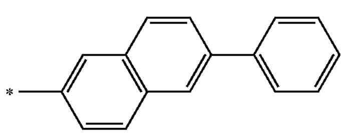

3-20

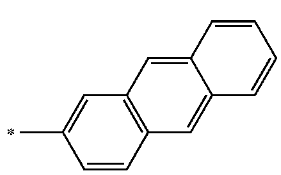

wherein, in Formulae 3-1 to 3-20, * represents a bonding site to N of Formula 2(2).

13. The organic light-emitting device as claimed in claim 1, wherein $Z_1$ and $Z_2$ are each independently selected from i) a $C_1$-$C_{20}$ alkyl group;

ii) a $C_1$-$C_{20}$ alkyl group substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group;

iii) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group; and iv) a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group each substituted with at least one selected from deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenanthrenyl group, an anthryl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinylene group, a carbazolyl group, and a triazinyl group.

14. The organic light-emitting device as claimed in claim 1, wherein $Z_1$ and $Z_2$ are each independently selected from a methyl group, an ethyl group, a propyl group, a butyl group, a pentyl group, a hexyl group, a heptyl group, and a compound represented by any one of Formulae 3-1 to 3-20:

3-1

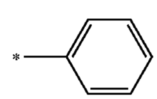

-continued
3-2
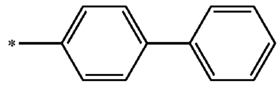
3-3
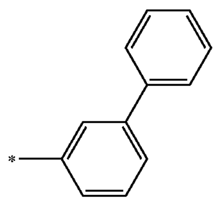
3-4
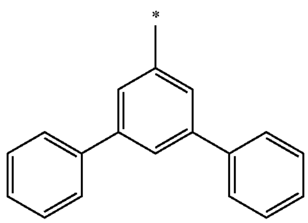
3-5
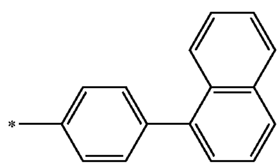
3-6
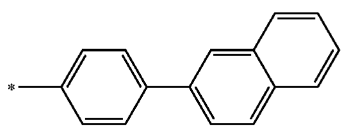
3-7
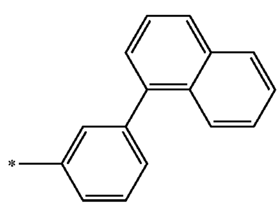
3-8
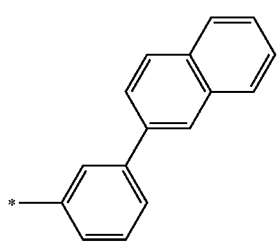
3-9
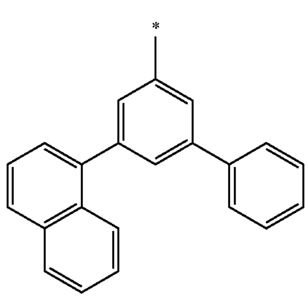
-continued
3-10
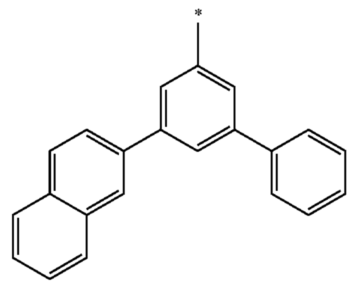
3-11
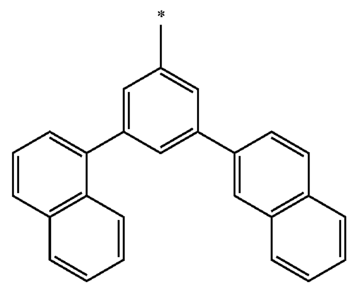
3-12
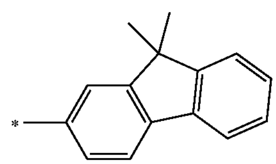
3-13
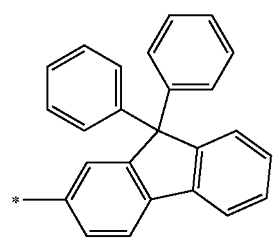
3-14
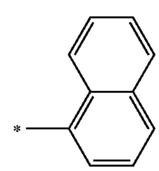
3-15
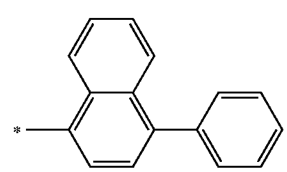
3-16
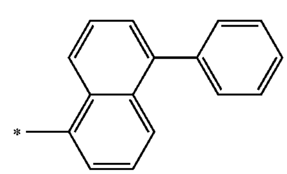
3-17
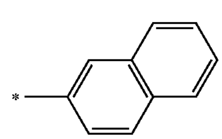

-continued 3-18

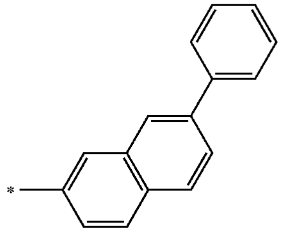

3-19

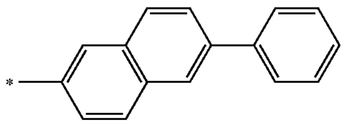

3-20

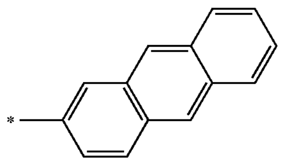

wherein, in Formulae 3-1 to 3-20, * represents a carbon atom of a fluorene ring in Formula 2(2).

15. The organic light-emitting device as claimed in claim 1, wherein $Z_3$, $Z_4$, and $R_{11}$ to $R_{24}$ are each independently selected from hydrogen, deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, and a $C_1$-$C_{20}$ alkyl group, provided that $Z_3$ is not an amino group or an amidino group.

16. The organic light-emitting device as claimed in claim 1, wherein $Z_3$, $Z_4$, and $R_{11}$ to $R_{24}$ are each independently selected from hydrogen, deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a methyl group, an ethyl group, a propyl group, a butyl group, a pentyl group, a hexyl group, a heptyl group, and a compound represented by any one of Formulae 3-1 to 3-20, provided that $Z_3$ is not an amino group or an amidino group:

3-1

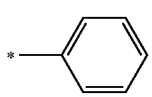

3-2

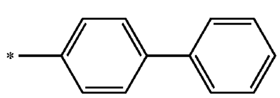

3-3

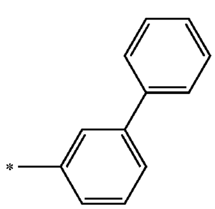

-continued 3-4

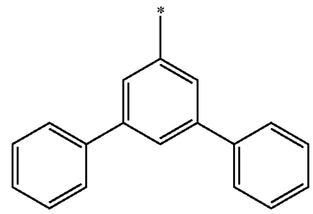

3-5

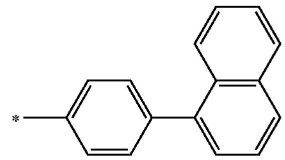

3-6

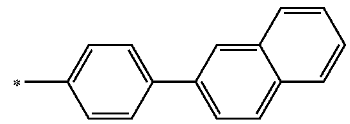

3-7

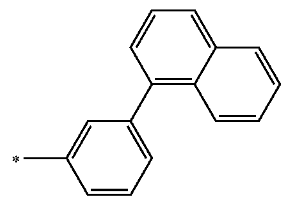

3-8

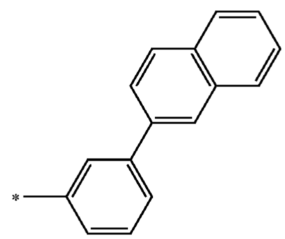

3-9

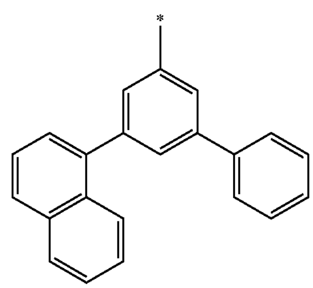

3-10

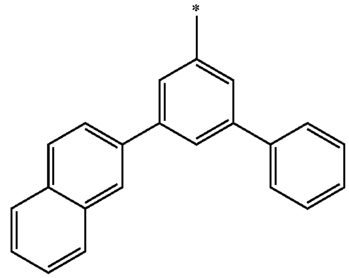

-continued
3-11
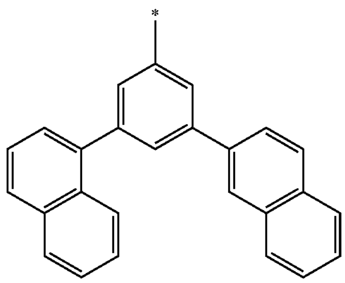
3-12
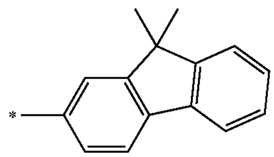
3-13
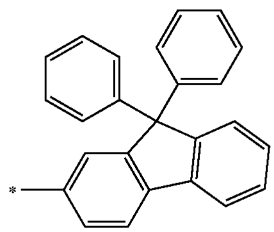
3-14
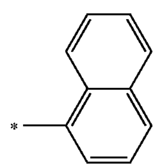
3-15
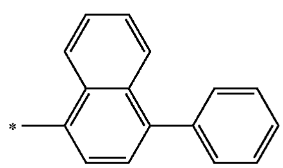
3-16
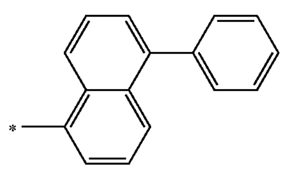
3-17
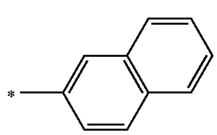
3-18
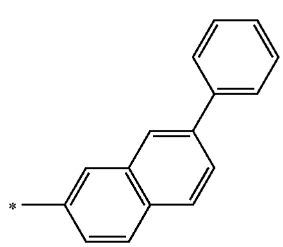
-continued
3-19
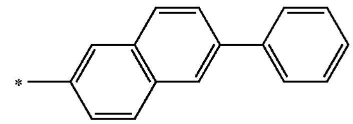
3-20
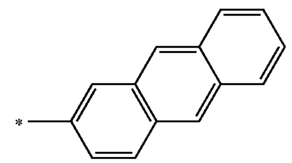
17. The organic light-emitting device as claimed in claim 1, wherein the hole-transporting material is represented by Formula 2b:
<Formula 2b>
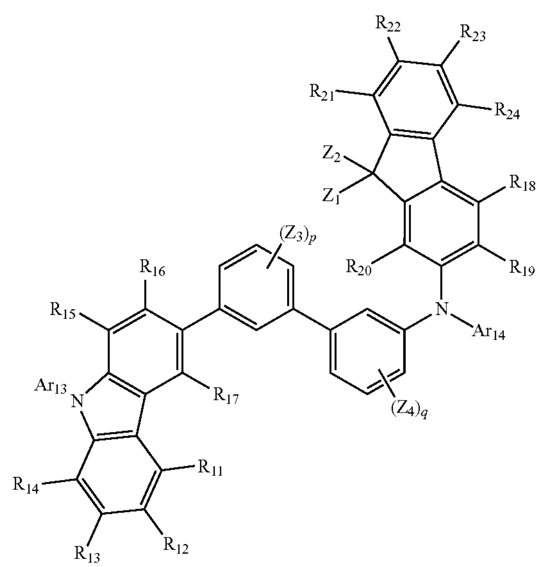
wherein, in Formula 2b,
$Ar_{13}$ and $Ar_{14}$ are each independently represented by any one of Formulae 3-1 to 3-20:
3-1
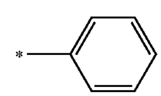
3-2
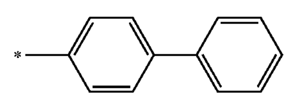
3-3
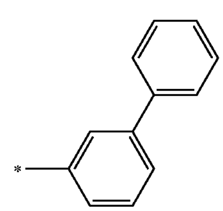

-continued
3-4
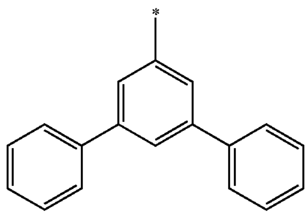
3-5
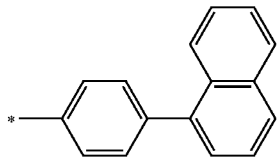
3-6
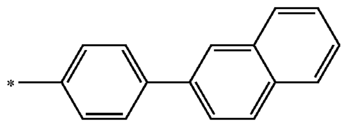
3-7
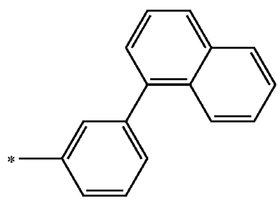
3-8
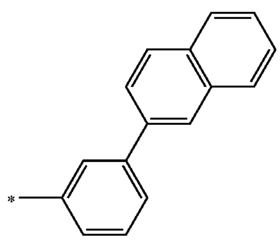
3-9
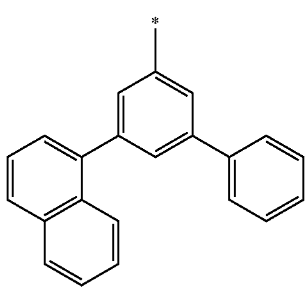
3-10
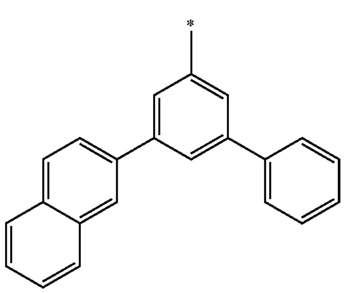
-continued
3-11
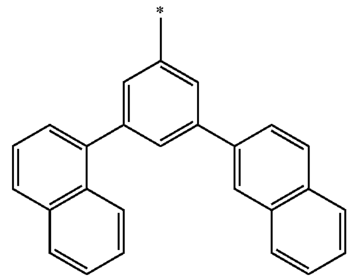
3-12
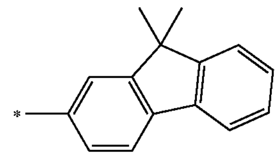
3-13
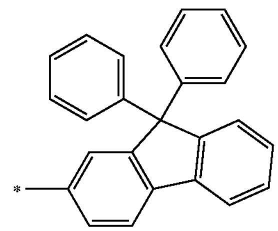
3-14
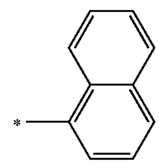
3-15
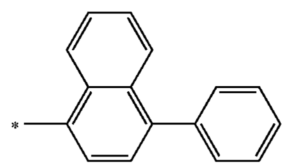
3-16
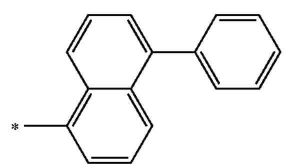
3-17
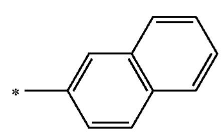
3-18
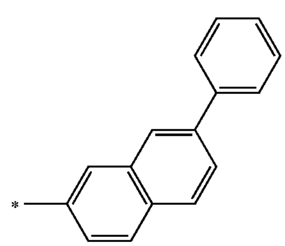

-continued 3-19

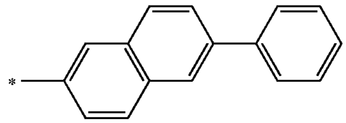

3-20

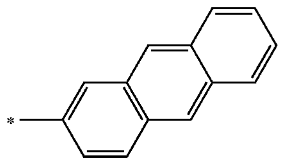

$Z_1$ and $Z_2$ are each independently represented by any one of a $C_1$-$C_{20}$ alkyl group and Formulae 3-1 to 3-20;

$Z_3$, $Z_4$, and $R_{11}$ to $R_{24}$ are each independently selected from hydrogen, deuterium, a halogen atom, a hydroxyl group, a cyano group, a nitro group, an amino group, an amidino group, hydrazine, hydrazone, a carboxyl acid group or a salt thereof, a sulfonic acid group or a salt thereof, a phosphoric acid group or a salt thereof, a $C_1$-$C_{20}$ alkyl group, and compounds represented by any one of Formulae 3-1 to 3-20, provided that Z3 is not an amino group or an amidino group; and p and q are each independently an integer of 1 to 4.

18. The organic light-emitting device as claimed in claim 1, wherein the hole-transporting material is represented by any one of Compounds 6-73 to 6-144:

6-73

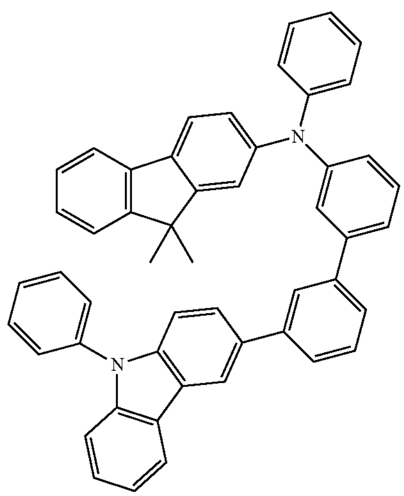

6-74

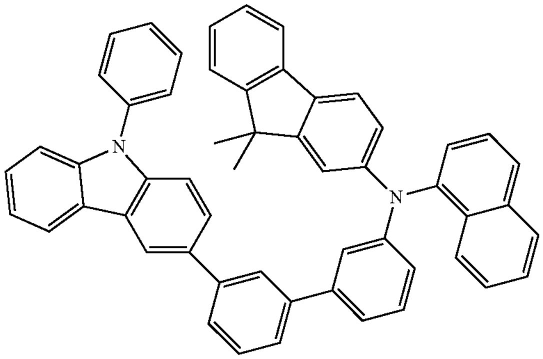

-continued 6-75

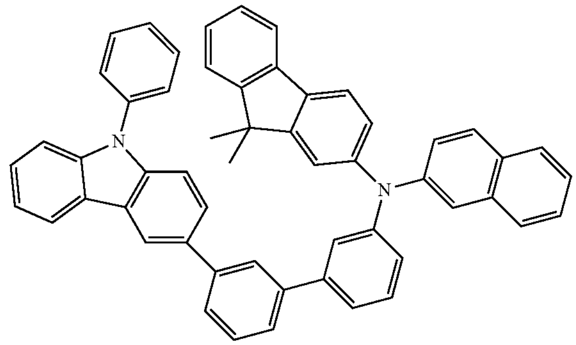

6-76

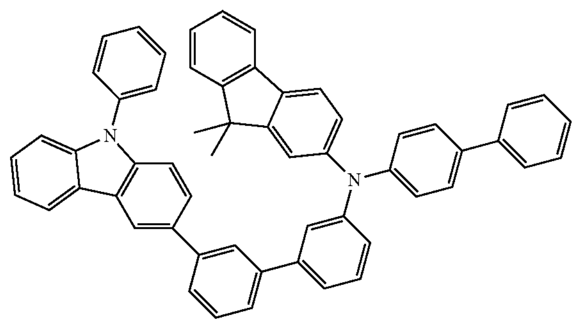

6-77

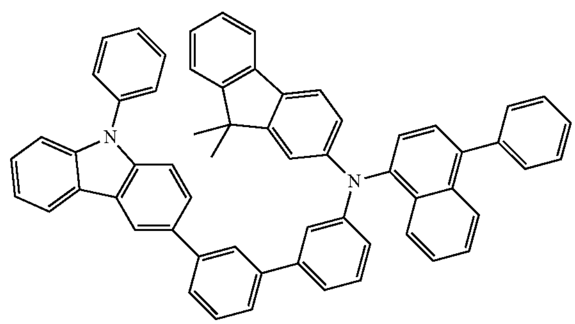

6-78

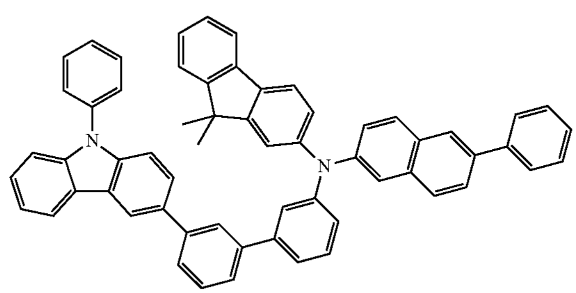

-continued
6-79
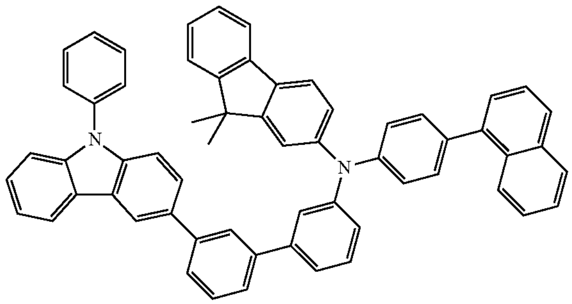
6-80
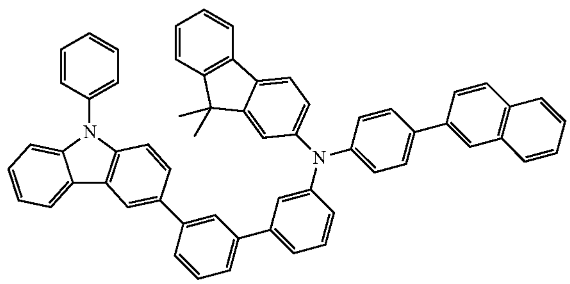
6-81
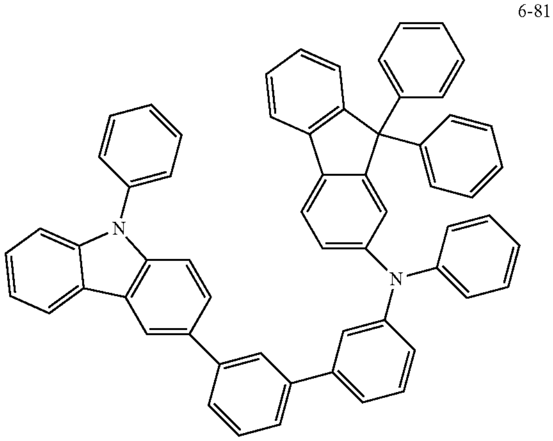
6-82
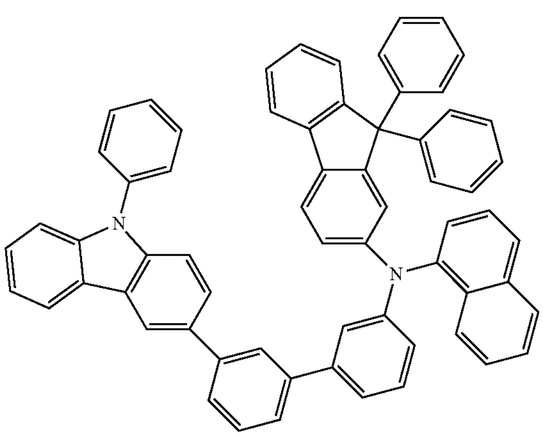
-continued
6-83
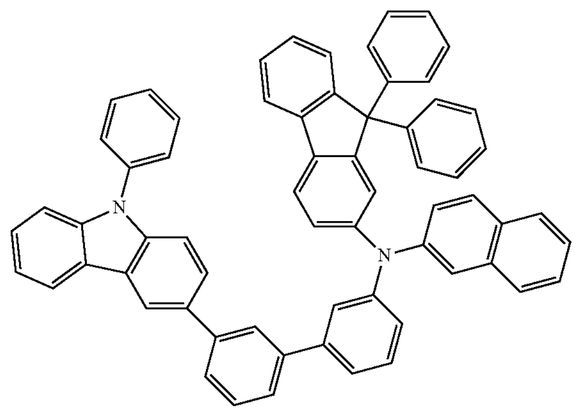
6-84
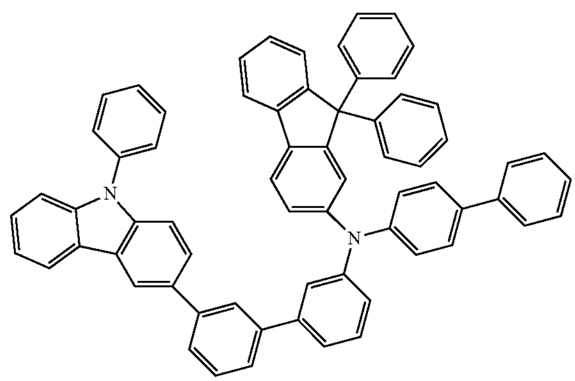
6-85
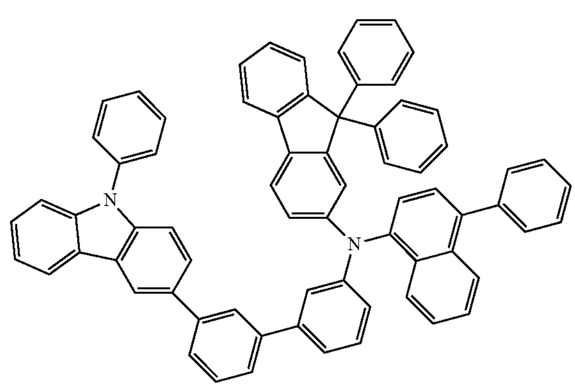

-continued
6-86
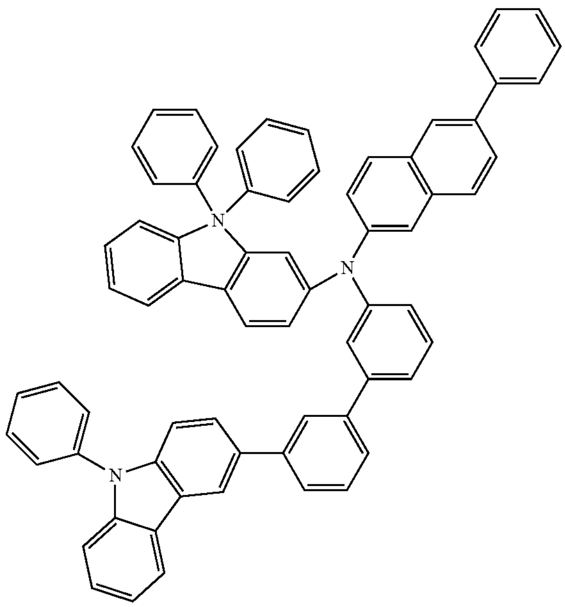
6-87
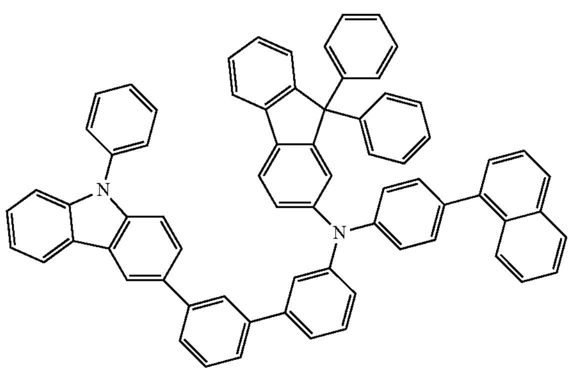
6-88
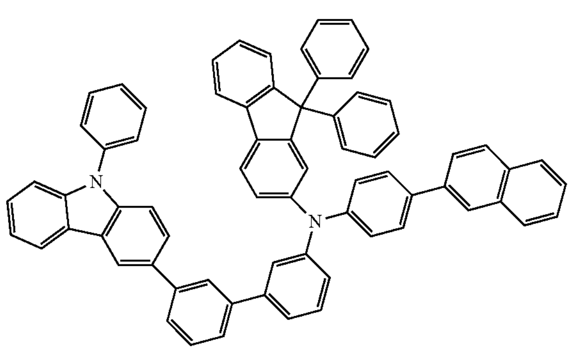
-continued
6-89
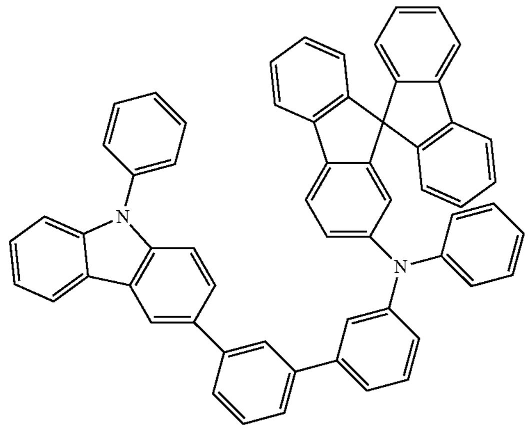
6-90
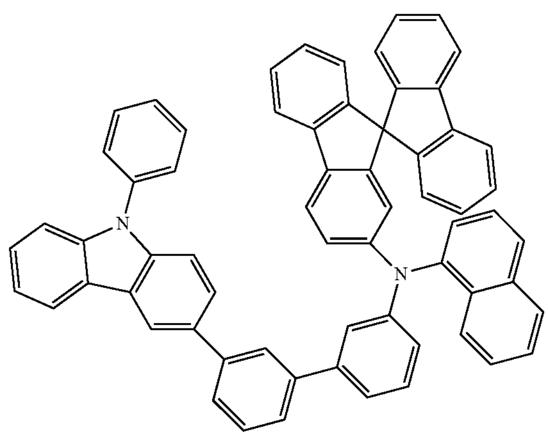
6-91
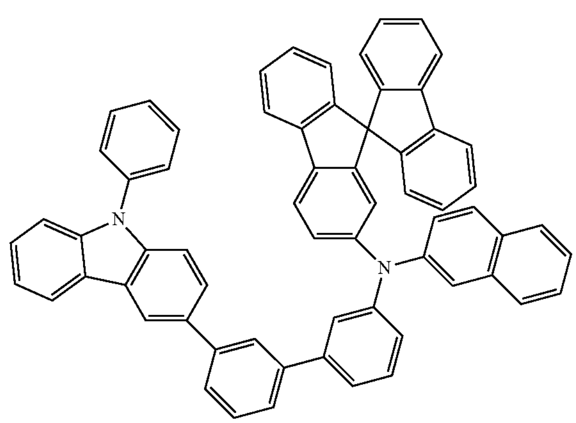

6-92
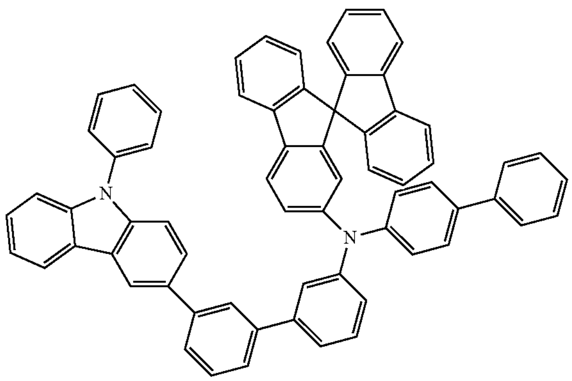
6-93
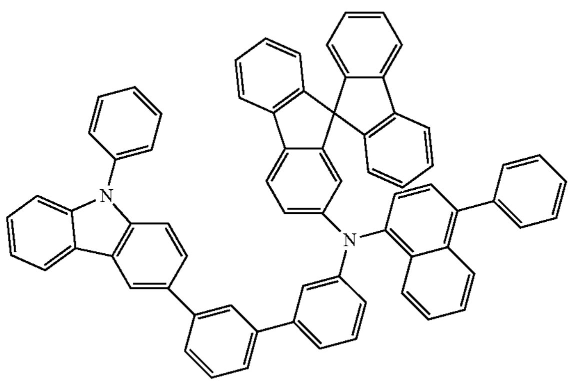
6-94
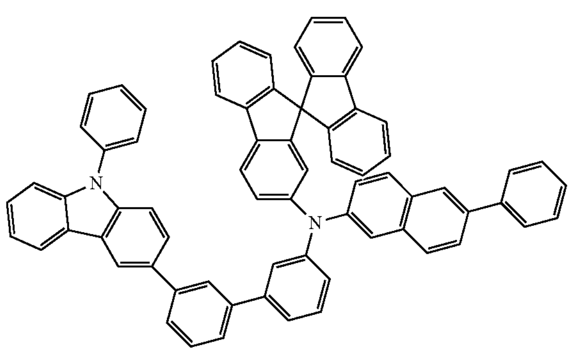
6-95
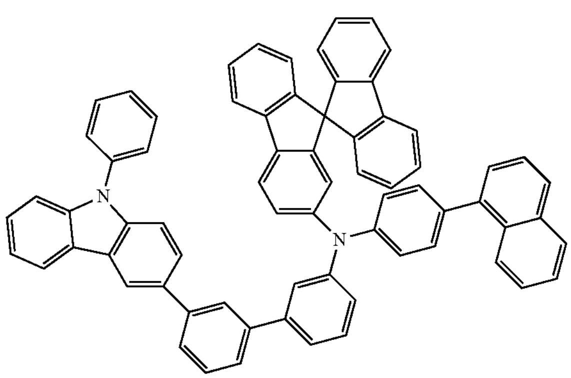
6-96
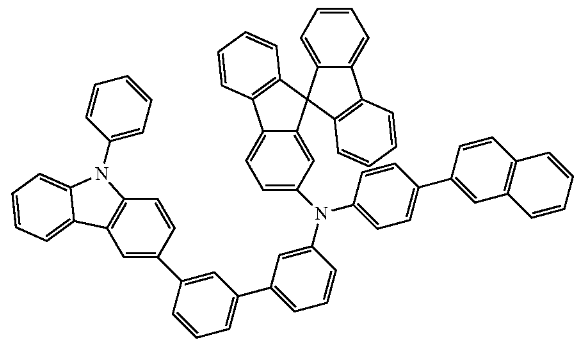
6-97
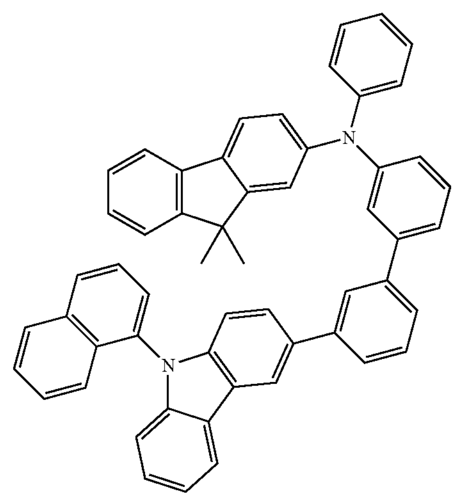
6-98
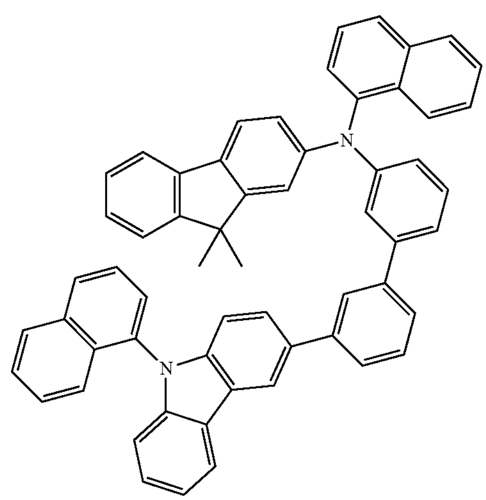

-continued
6-99
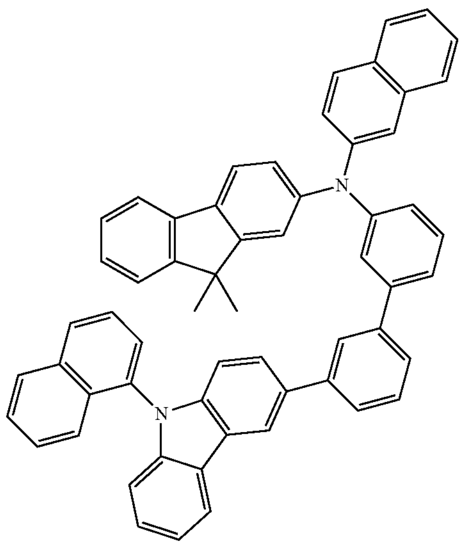
6-100
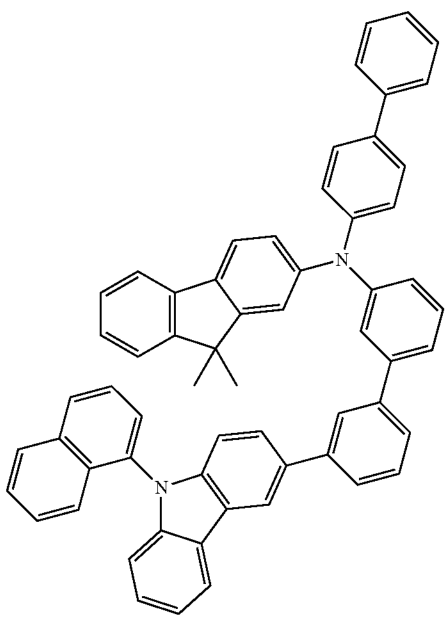
6-101
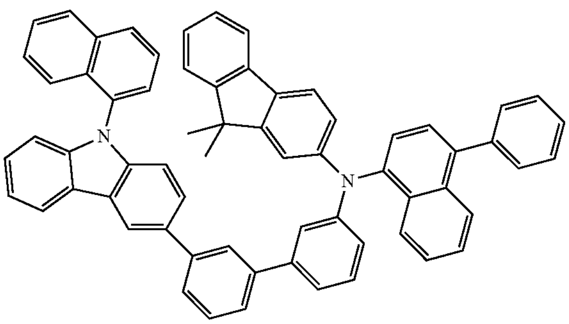
-continued
6-102
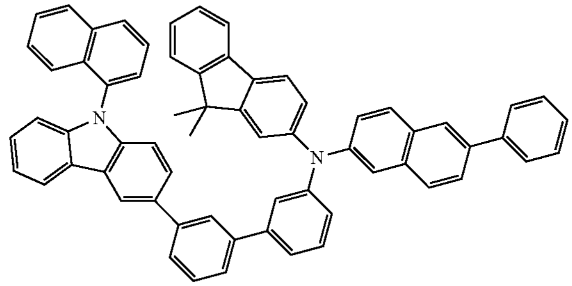
6-103
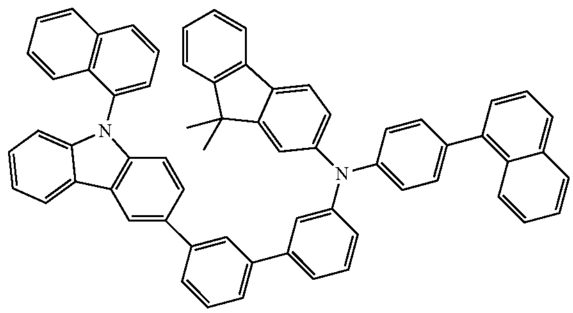
104
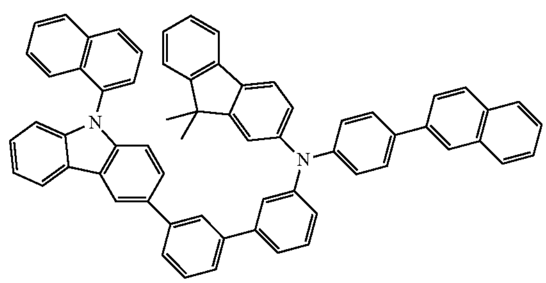
6-105
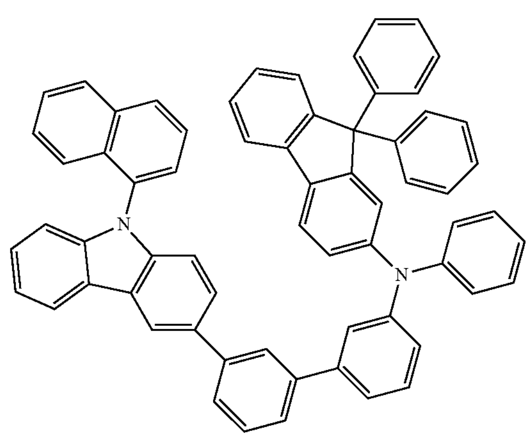

-continued
6-106
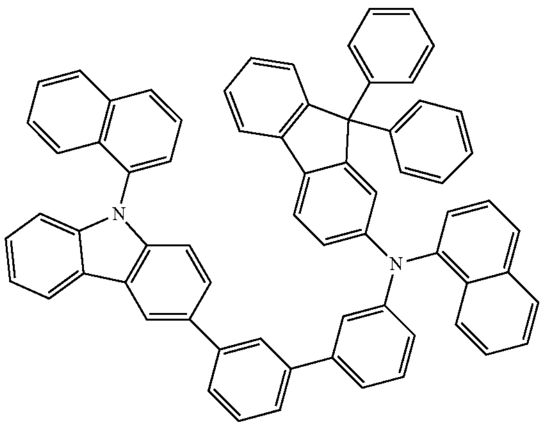
6-107
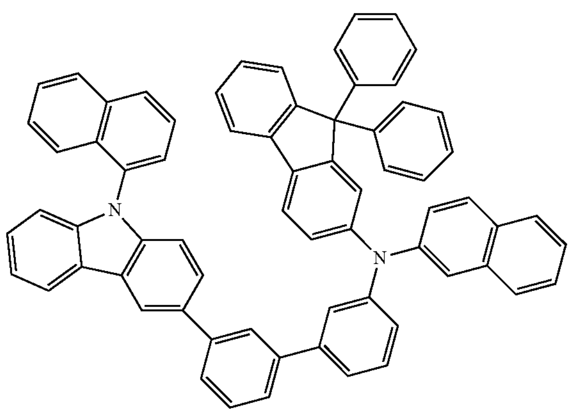
6-108
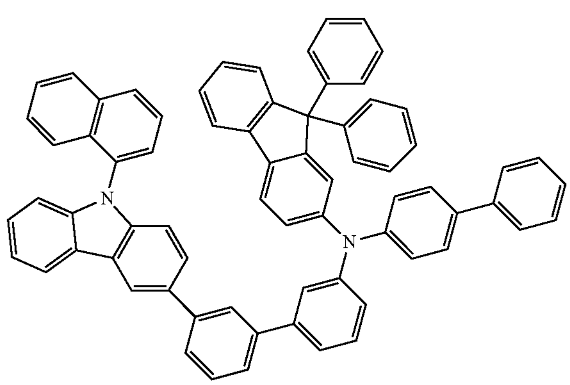
-continued
6-109
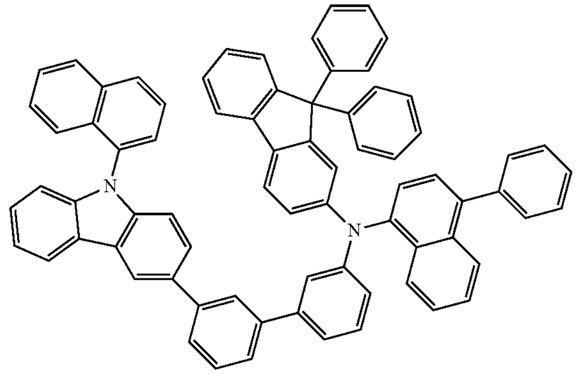
6-110
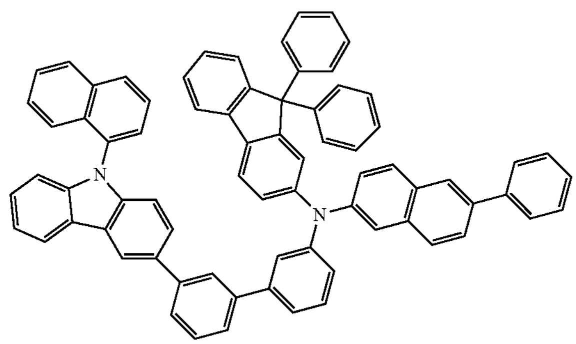
6-111
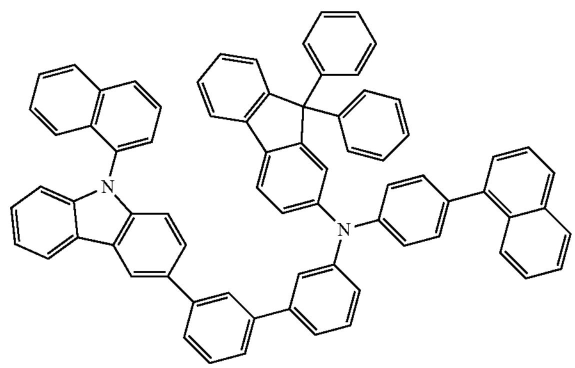
6-112
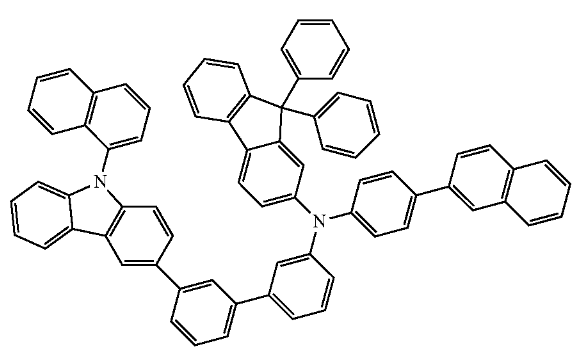

-continued
6-113
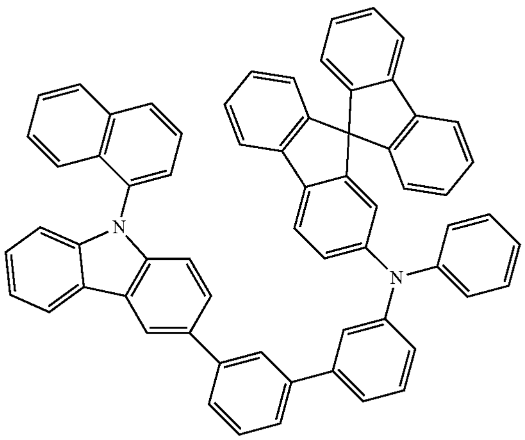
6-114
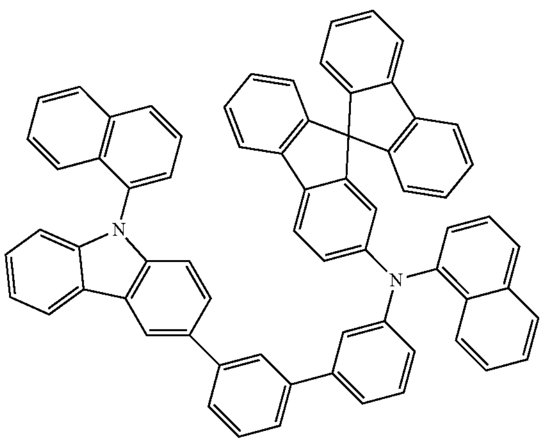
6-115
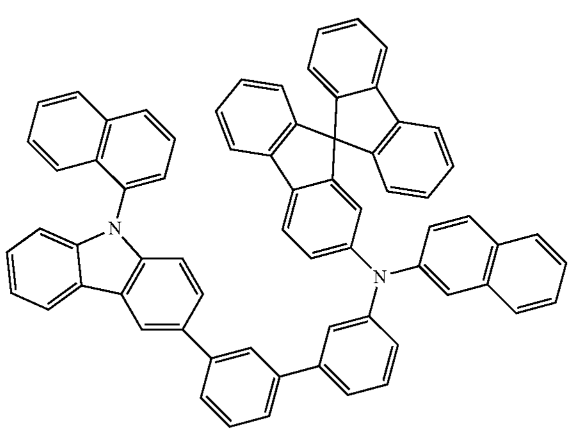
-continued
6-116
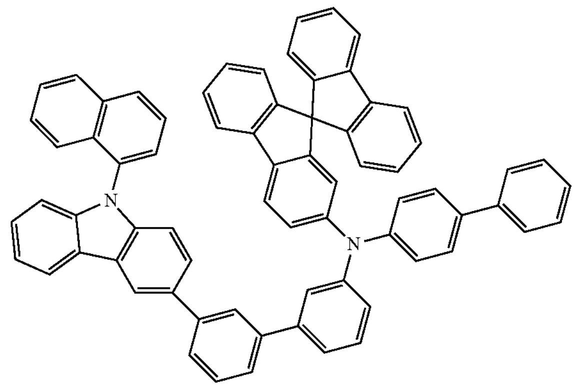
6-117
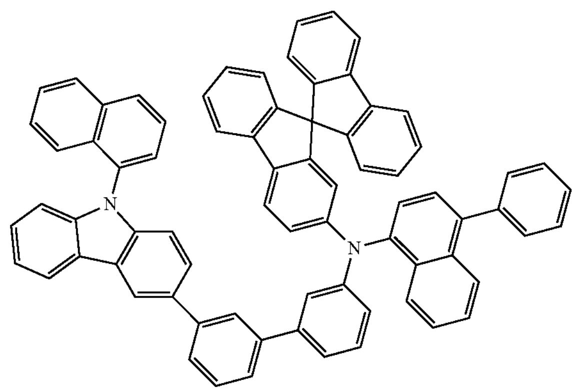
6-118
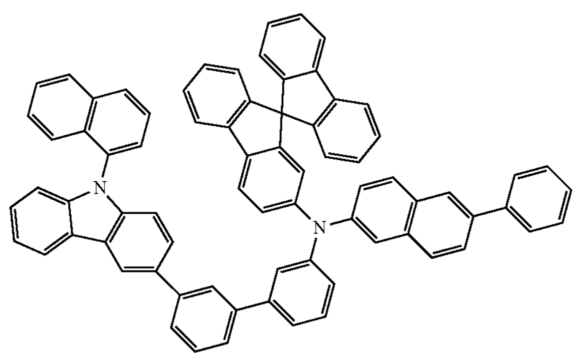
6-119
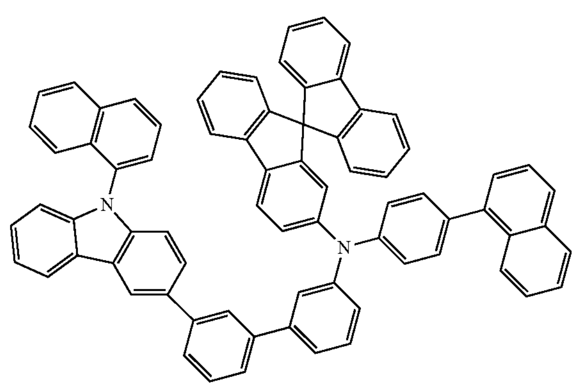

-continued
6-120
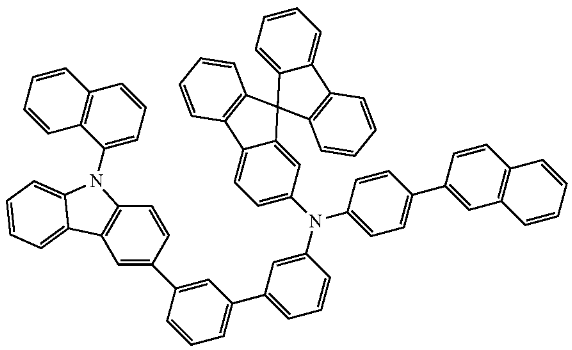
6-121
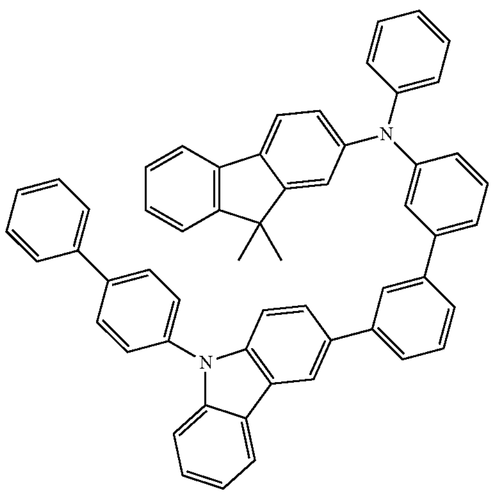
6-122
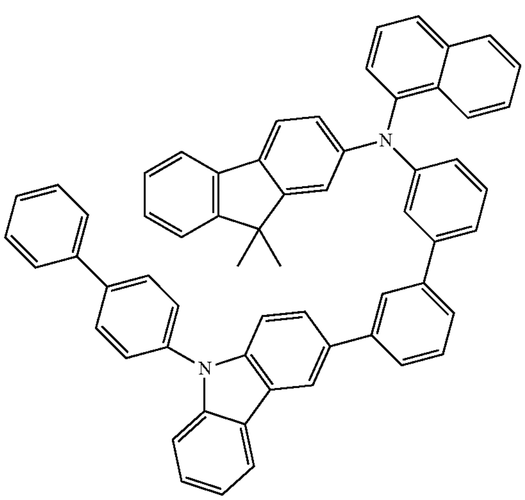
-continued
6-123
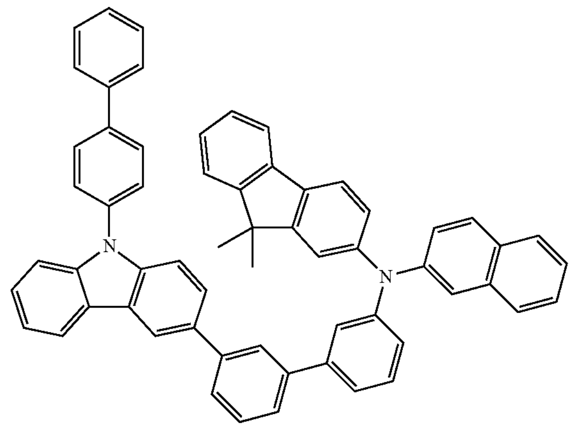
6-124
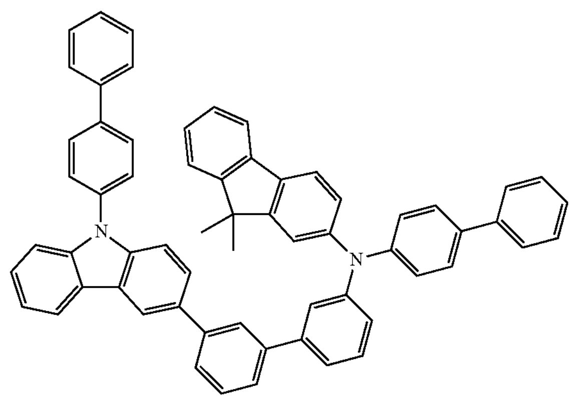
6-125
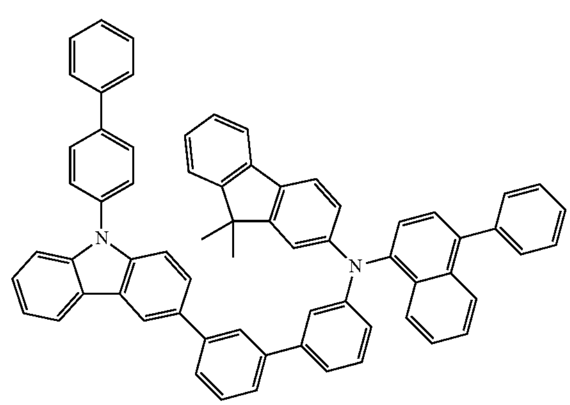

6-126
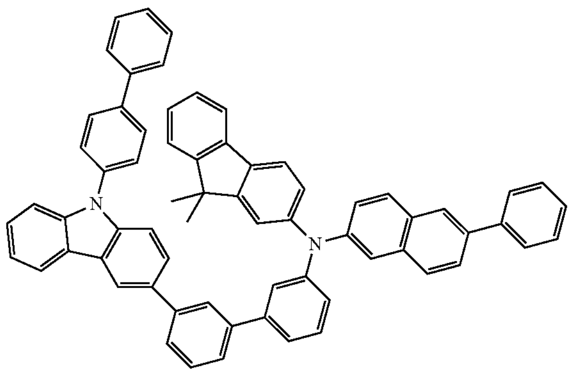
6-127
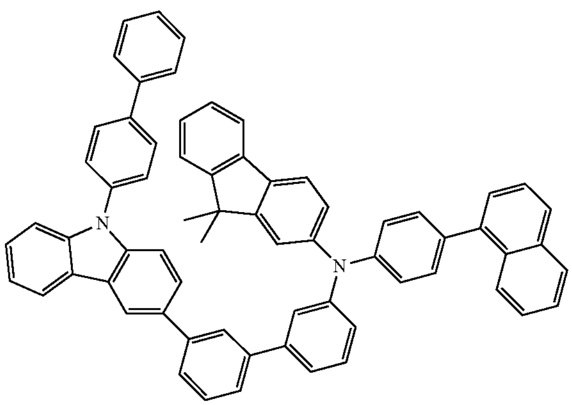
6-128
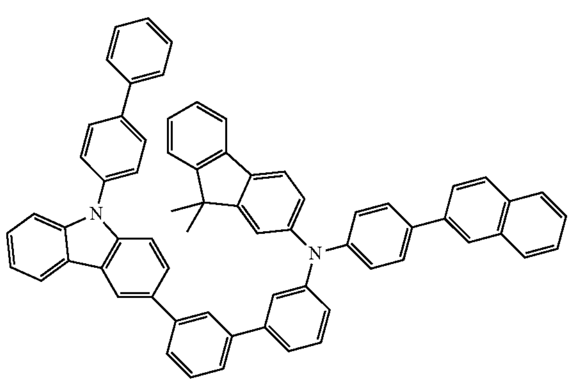
6-129
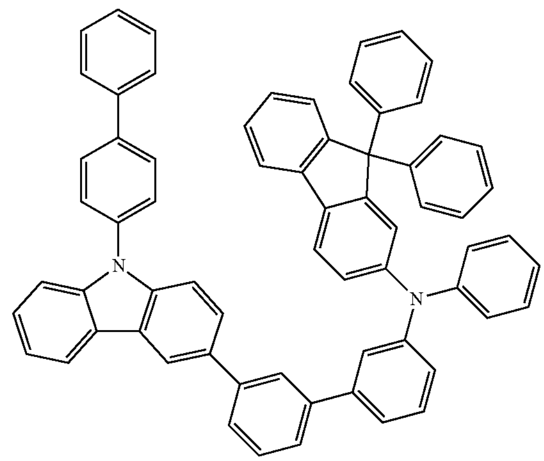
6-130
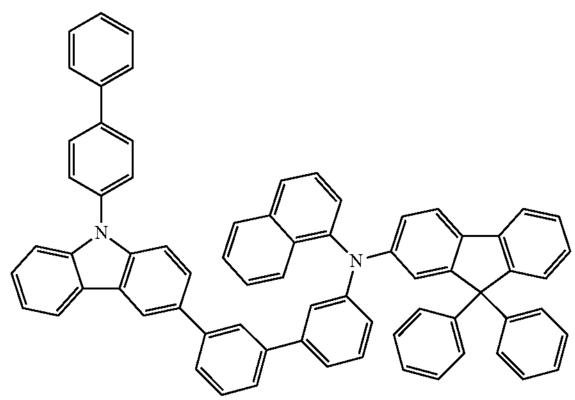
6-131
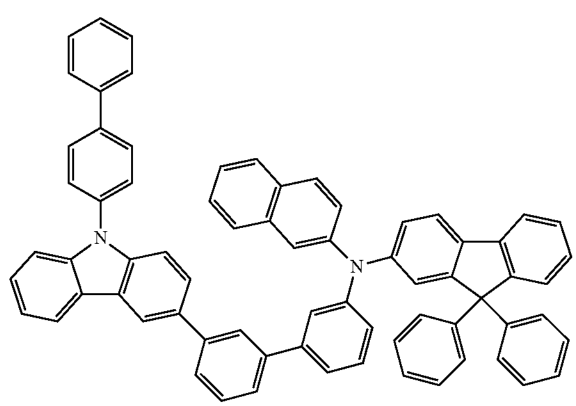

6-132
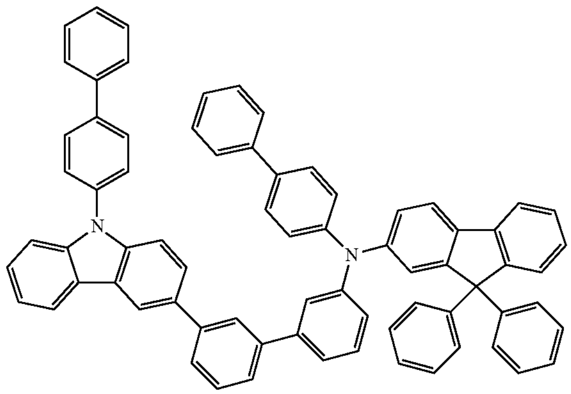
6-133
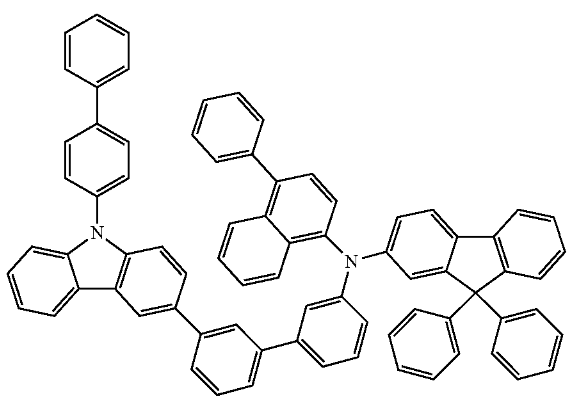
6-134
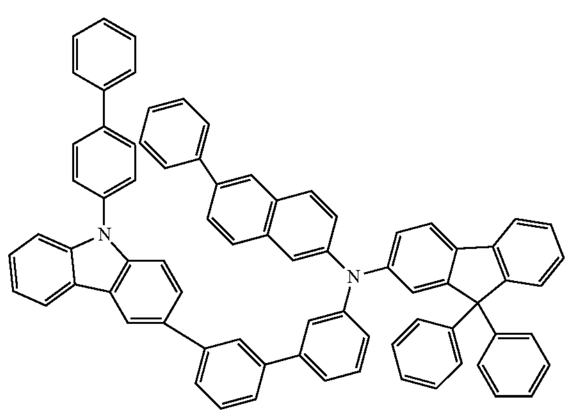
6-135
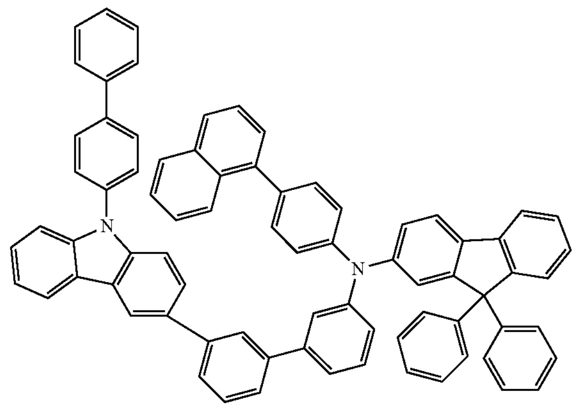
6-136
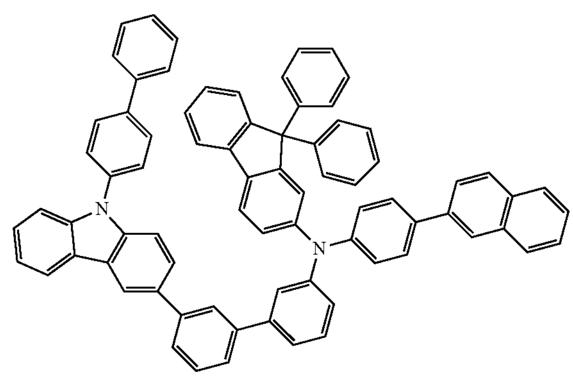
6-137
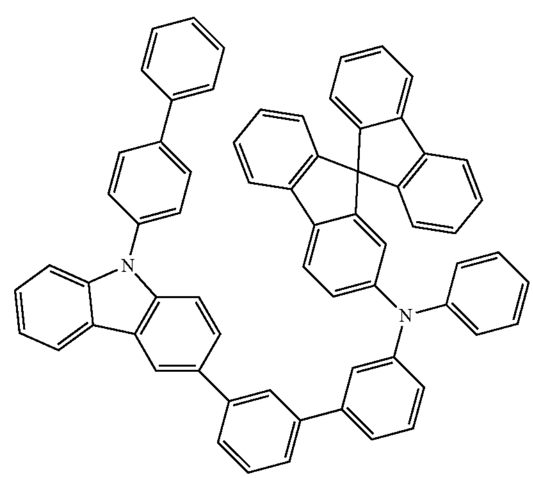

-continued
6-138
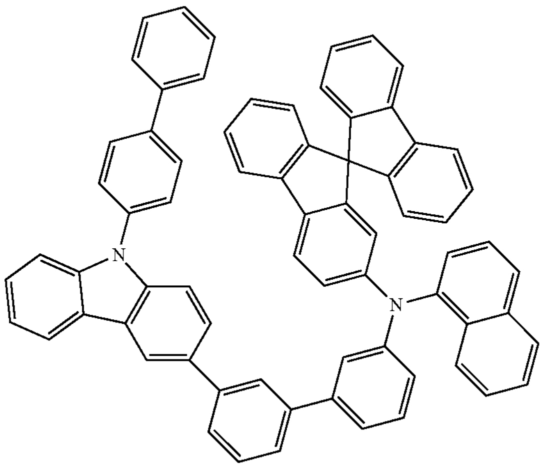
6-139
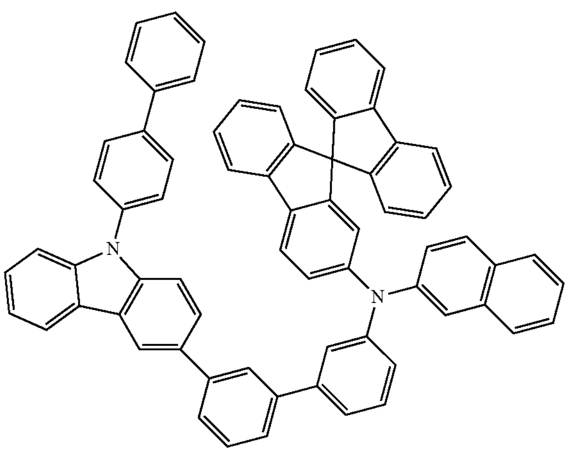
6-140
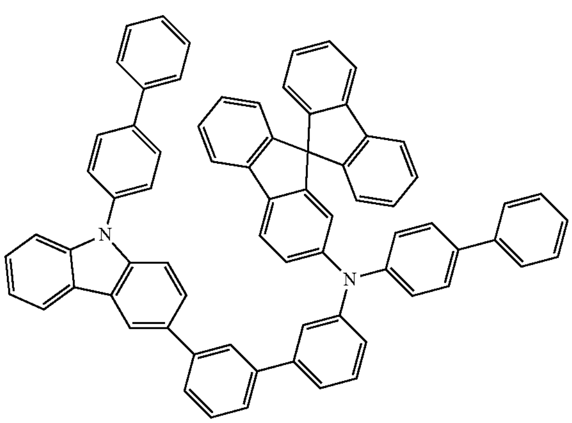
-continued
6-141
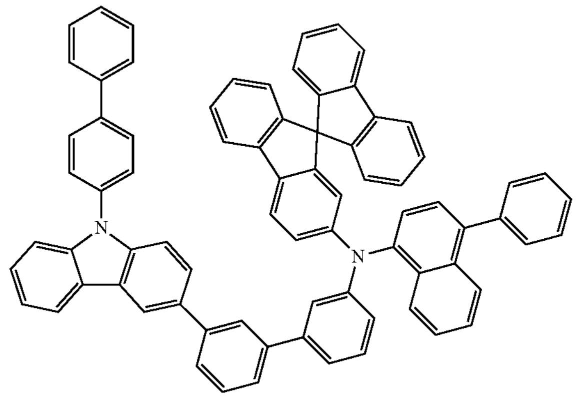
6-142
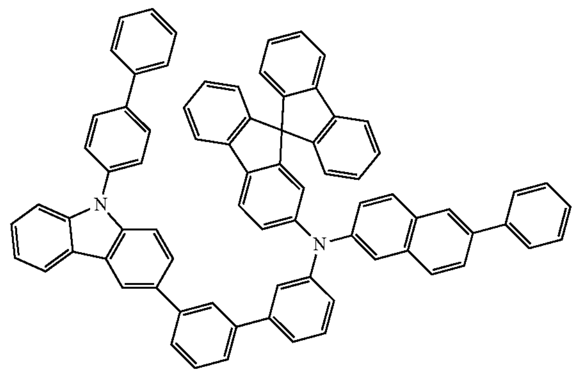
6-143
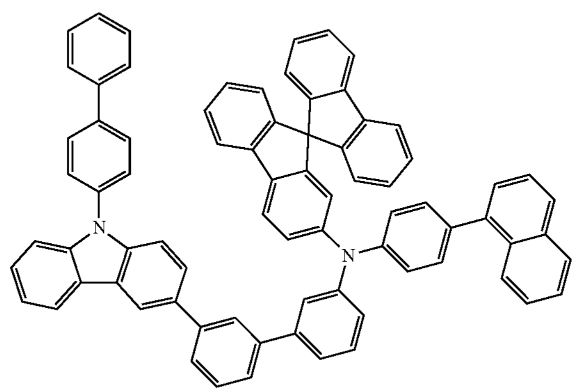
6-144
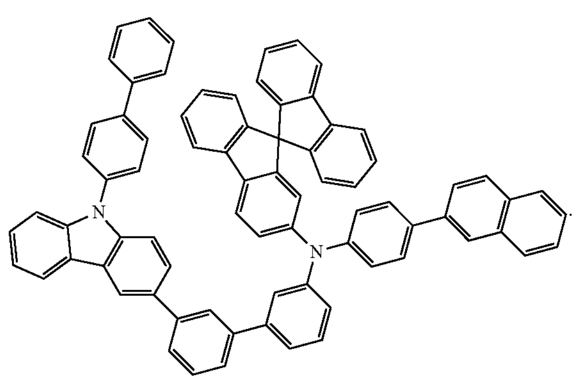
* * * * *